US011988874B2

(12) United States Patent
Winzer et al.

(10) Patent No.: US 11,988,874 B2
(45) Date of Patent: May 21, 2024

(54) DATA PROCESSING SYSTEMS INCLUDING OPTICAL COMMUNICATION MODULES

(71) Applicant: Nubis Communications, Inc., Aberdeen, NJ (US)

(72) Inventors: Peter Johannes Winzer, Aberdeen, NJ (US); Clinton Randy Giles, Watchung, NJ (US); Guilhem de Valicourt, Jersey City, NJ (US); Peter James Pupalaikis, Ramsey, NJ (US)

(73) Assignee: Nubis Communications, Inc., New Providence, NJ (US)

( * ) Notice: Subject to any disclaimer, the term of this patent is extended or adjusted under 35 U.S.C. 154(b) by 0 days.

(21) Appl. No.: 17/495,338

(22) Filed: Oct. 6, 2021

(65) Prior Publication Data

US 2022/0244465 A1 Aug. 4, 2022

Related U.S. Application Data

(60) Provisional application No. 63/088,914, filed on Oct. 7, 2020, provisional application No. 63/210,437, filed (Continued)

(51) Int. Cl.

*G02B 6/36* (2006.01)
*G02B 6/38* (2006.01)

(Continued)

(52) U.S. Cl.

CPC ......... *G02B 6/3608* (2013.01); *G02B 6/3825* (2013.01); *G02B 6/3869* (2013.01);

(Continued)

(58) Field of Classification Search

CPC .... H05K 1/0274; H05K 1/141; H05K 1/0206; H05K 1/181; H05K 1/0243;

(Continued)

(56) References Cited

U.S. PATENT DOCUMENTS

| | | | |
|---|---|---|---|
| 5,136,410 | A | 8/1992 | Heiling et al. |
| 5,229,925 | A | 7/1993 | Spencer et al. |

(Continued)

FOREIGN PATENT DOCUMENTS

| | | |
|---|---|---|
| JP | 2010176010 | 8/2010 |
| WO | WO 2020/083845 | 4/2020 |

(Continued)

OTHER PUBLICATIONS

[No Author Listed], [online], “Intel’s Plan to 1000x Performance with Raja Koduri,” Nov. 2021, retrieved on Sep. 22, 2022, URL<https://www.youtube.com/watch?v=7CpDQ5WZiSU&t=7s>, 18 pages [Video Submission].

(Continued)

*Primary Examiner* — Jasmine J Clark
(74) *Attorney, Agent, or Firm* — Fish & Richardson P.C.

(57) ABSTRACT

An apparatus includes: at least one of a circuit board or a substrate; and a first structure attached to the at least one of a circuit board or a substrate. The first structure is configured to enable an optical module with connector to be removably coupled to the first structure, and the optical module with connector is configured to enable an optical fiber connector to be removably coupled to the optical module with connector. For example, the circuit board or the substrate includes first electrical contacts, the first structure includes walls that define a first opening, the walls also define one or more retaining mechanisms such that when the optical module with connector is inserted into the first opening, the one or more retaining mechanisms on the walls of the first structure engage one or more latch mechanisms on the optical module with connector to secure the optical module with connector to the first structure, and second electrical contacts on the optical module with connector are electri- (Continued)

cally coupled to the first electrical contacts on the circuit board or the substrate.

92 Claims, 168 Drawing Sheets

Related U.S. Application Data on Jun. 14, 2021, provisional application No. 63/245,005, filed on Sep. 16, 2021, provisional application No. 63/116,660, filed on Nov. 20, 2020, provisional application No. 63/146,421, filed on Feb. 5, 2021, provisional application No. 63/145,368, filed on Feb. 3, 2021, provisional application No. 63/159,768, filed on Mar. 11, 2021, provisional application No. 63/225,779, filed on Jul. 26, 2021, provisional application No. 63/175,021, filed on Apr. 14, 2021, provisional application No. 63/208,759, filed on Jun. 9, 2021, provisional application No. 63/173,253, filed on Apr. 9, 2021, provisional application No. 63/245,011, filed on Sep. 16, 2021, provisional application No. 63/178,501, filed on Apr. 22, 2021, provisional application No. 63/192,852, filed on May 25, 2021, provisional application No. 63/223,685, filed on Jul. 20, 2021.

(51) Int. Cl.
*G02B 6/42* (2006.01)
*H05K 1/02* (2006.01)
*H05K 1/14* (2006.01)

(52) U.S. Cl.
CPC ........... *H05K 1/0274* (2013.01); *H05K 1/141* (2013.01); *G02B 6/42* (2013.01); *H05K 1/0206* (2013.01)

(58) Field of Classification Search
CPC ............ H05K 2201/10121; G02B 6/42; G02B 6/4249; G02B 6/4284; G02B 6/4294; G02B 6/43
USPC ........................................................... 438/42
See application file for complete search history.

(56) References Cited

U.S. PATENT DOCUMENTS 6,396,990 B1 5/2002 Ehn et al.
6,411,520 B1 6/2002 Hauke et al.
6,563,696 B1 5/2003 Harris et al.
6,769,812 B1 8/2004 Handforth
6,822,874 B1 11/2004 Marler
7,170,749 B2 1/2007 Hoshino et al.
7,180,751 B1 2/2007 Geschke et al.
7,239,523 B1 7/2007 Collins et al.
7,643,292 B1 1/2010 Chen
7,787,772 B2 8/2010 Ota
7,813,143 B2 10/2010 Dorenkamp et al.
8,047,856 B2 11/2011 Mccolloch
8,090,230 B1 1/2012 Hasharoni et al.
8,116,095 B2 2/2012 Dorenkamp et al.
8,208,253 B1 6/2012 Goergen et al.
8,482,917 B2 7/2013 Rose
8,488,921 B2 7/2013 Doany et al.
8,780,551 B2 7/2014 Farnholtz
8,992,099 B2 * 3/2015 Blackwell, Jr. .......... H05K 7/00 385/88
9,250,649 B2 2/2016 Shabbir et al.
9,301,025 B2 3/2016 Kioski et al.
9,366,832 B2 6/2016 Arao et al.
9,461,768 B2 10/2016 Kipp
9,557,478 B2 1/2017 Doerr et al.
9,622,388 B1 4/2017 Gaal
9,645,316 B1 5/2017 Hasharoni et al.
9,768,881 B2 9/2017 Georgas et al.
9,781,546 B2 10/2017 Barrett et al.
9,786,641 B2 10/2017 Budd et al.
9,874,688 B2 1/2018 Doerr et al.
9,927,575 B2 3/2018 Goodwill et al.
10,018,787 B1 7/2018 Wang
10,025,043 B2 7/2018 Vallance et al.
10,054,749 B1 8/2018 Wang et al.
10,082,633 B2 9/2018 Schaevitz et al.
10,135,218 B2 11/2018 Popovic et al.
10,135,539 B2 11/2018 Moss et al.
10,209,464 B2 2/2019 Pfnuer et al.
10,215,944 B2 * 2/2019 Sedor .................. G02B 6/4452
10,234,646 B2 3/2019 Mack et al.
10,271,461 B2 4/2019 Schmidtke
10,330,875 B2 6/2019 Fini et al.
10,365,436 B2 7/2019 Byrd et al.
10,514,509 B2 12/2019 Popovic et al.
10,568,238 B1 2/2020 Leung
10,582,639 B1 3/2020 Chopra
10,615,903 B2 4/2020 Welch
10,725,245 B2 7/2020 Leigh et al.
10,866,376 B1 12/2020 Ghiasi
11,005,572 B1 5/2021 Chiang et al.
11,058,034 B2 7/2021 Leung
11,107,770 B1 8/2021 Ramalingam et al.
11,121,776 B2 9/2021 Aboagye
11,153,670 B1 10/2021 Winzer
11,165,509 B1 11/2021 Nagarajan et al.
11,190,172 B1 11/2021 Raj et al.
11,194,109 B2 12/2021 Winzer
11,287,585 B2 3/2022 Winzer
11,381,891 B2 7/2022 Leigh
11,411,643 B1 8/2022 Chaouch
11,483,943 B2 10/2022 Leigh et al.
11,509,399 B2 * 11/2022 Paraiso .............. H01L 31/0203
11,510,329 B2 11/2022 Leigh
11,557,875 B2 1/2023 Kovsh
11,621,795 B2 4/2023 Winzer
2002/0003232 A1 1/2002 Ahn et al.
2003/0030977 A1 2/2003 Garnett et al.
2003/0081287 A1 5/2003 Jannson et al.
2004/0027462 A1 2/2004 Hing
2004/0033016 A1 2/2004 Kropp
2004/0264838 A1 12/2004 Uchida et al.
2005/0025409 A1 2/2005 Welch et al.
2005/0083653 A1 4/2005 Chen
2005/0111810 A1 5/2005 Giraud et al.
2005/0124224 A1 6/2005 Schunk
2005/0147117 A1 7/2005 Pettey et al.
2005/0224946 A1 10/2005 Dutta
2006/0062526 A1 * 3/2006 Ikeuchi .................. H05K 1/189 385/88
2006/0239605 A1 10/2006 Palen et al.
2007/0223865 A1 9/2007 Lu et al.
2007/0258683 A1 11/2007 Rolston et al.
2008/0055847 A1 3/2008 Belady et al.
2008/0259566 A1 10/2008 Fried
2009/0093073 A1 4/2009 Chan et al.
2010/0008038 A1 1/2010 Coglitore
2010/0054681 A1 3/2010 Biribuze
2010/0097752 A1 4/2010 Doll et al.
2010/0262285 A1 10/2010 Teranaka
2010/0265658 A1 10/2010 Sawai et al.
2010/0284698 A1 11/2010 Mccolloch
2011/0188815 A1 * 8/2011 Blackwell, Jr. .......... H05K 1/11 361/748
2011/0261427 A1 10/2011 Hart et al.
2012/0014639 A1 1/2012 Doany et al.
2012/0120596 A1 5/2012 Bechtolsheim et al.
2012/0257355 A1 10/2012 Yi et al.
2013/0089293 A1 4/2013 Howard et al.
2013/0094827 A1 4/2013 Haataja
2013/0102237 A1 4/2013 Zhou et al.
2013/0193304 A1 * 8/2013 Yu ........................ G02B 6/4245 250/206
2013/0342993 A1 12/2013 Singleton
2014/0049931 A1 2/2014 Wellbrock et al.

(56) References Cited

U.S. PATENT DOCUMENTS

| | | | |
|---|---|---|---|
| 2014/0064659 | A1 | 3/2014 | Doerr et al. |
| 2014/0098492 | A1 | 4/2014 | Lam |
| 2014/0133101 | A1 | 5/2014 | Sunaga et al. |
| 2014/0306131 | A1 | 10/2014 | Mack et al. |
| 2014/0321803 | A1 | 10/2014 | Thacker et al. |
| 2014/0321804 | A1 | 10/2014 | Thacker |
| 2014/0327902 | A1 | 11/2014 | Giger et al. |
| 2015/0037044 | A1 | 2/2015 | Peterson et al. |
| 2015/0094896 | A1 | 4/2015 | Cuddihy et al. |
| 2015/0107101 | A1 | 4/2015 | DeCusatis et al. |
| 2015/0125110 | A1 | 5/2015 | Anderson et al. |
| 2015/0139223 | A1 | 5/2015 | Mayenburg |
| 2015/0261269 | A1 | 9/2015 | Bruscoe |
| 2015/0293305 | A1 | 10/2015 | Nakagawa et al. |
| 2016/0062068 | A1 | 3/2016 | Giraud et al. |
| 2016/0073544 | A1 | 3/2016 | Heyd et al. |
| 2016/0116693 | A1 | 4/2016 | Oki et al. |
| 2016/0125706 | A1 | 5/2016 | Butterbaugh et al. |
| 2016/0209610 | A1 | 7/2016 | Kurtz et al. |
| 2016/0216445 | A1 | 7/2016 | Thacker et al. |
| 2016/0291273 | A1 | 10/2016 | Nguyen |
| 2016/0377821 | A1 | 12/2016 | Vallance et al. |
| 2017/0123164 | A1 | 5/2017 | Suematsu et al. |
| 2017/0131469 | A1 | 5/2017 | Kobrinsky et al. |
| 2017/0139145 | A1 | 5/2017 | Heanue et al. |
| 2017/0168253 | A1 | 6/2017 | Wilcox et al. |
| 2017/0332519 | A1 | 11/2017 | Schmidtke |
| 2017/0364295 | A1 | 12/2017 | Sardinha et al. |
| 2018/0131056 | A1 | 5/2018 | Sato |
| 2018/0188459 | A1 | 7/2018 | Mekis et al. |
| 2018/0196196 | A1 | 7/2018 | Byrd et al. |
| 2018/0231727 | A1 | 8/2018 | Kurtz et al. |
| 2018/0278332 | A1 | 9/2018 | Leigh et al. |
| 2018/0306990 | A1 | 10/2018 | Badihi |
| 2018/0329159 | A1 | 11/2018 | Mathai et al. |
| 2018/0335558 | A1 | 11/2018 | Fini et al. |
| 2019/0027898 | A1 | 1/2019 | Bovington et al. |
| 2019/0027899 | A1 | 1/2019 | Krishnamoorthy et al. |
| 2019/0027901 | A1 | 1/2019 | Zheng et al. |
| 2019/0028207 | A1 | 1/2019 | Saeedi et al. |
| 2019/0033528 | A1 | 1/2019 | Ootorii |
| 2019/0086618 | A1 | 3/2019 | Shastri et al. |
| 2019/0116689 | A1 | 4/2019 | Chen et al. |
| 2019/0207342 | A1 | 7/2019 | Aden et al. |
| 2019/0208290 | A1 | 7/2019 | Olson |
| 2019/0258175 | A1 | 8/2019 | Dietrich et al. |
| 2019/0285815 | A1 | 9/2019 | Sugiyama |
| 2019/0293971 | A1 | 9/2019 | Yu et al. |
| 2019/0307014 | A1 | 10/2019 | Adiletta |
| 2019/0312642 | A1 | 10/2019 | Neilson et al. |
| 2019/0317287 | A1 | 10/2019 | Raghunathan et al. |
| 2020/0015386 | A1 | 1/2020 | Gupta |
| 2020/0033544 | A1 | 1/2020 | Costello |
| 2020/0073061 | A1 | 3/2020 | Leigh et al. |
| 2020/0077544 | A1 | 3/2020 | Leung et al. |
| 2020/0132930 | A1 | 4/2020 | Bchir |
| 2020/0158964 | A1 | 5/2020 | Winzer et al. |
| 2020/0158967 | A1 | 5/2020 | Winzer et al. |
| 2020/0161243 | A1 | 5/2020 | Lee et al. |
| 2020/0219865 | A1 | 7/2020 | Nelson et al. |
| 2021/0044356 | A1 | 2/2021 | Aboagye |
| 2021/0072473 | A1 | 3/2021 | Wall, Jr. |
| 2021/0074677 | A1 | 3/2021 | Kwon et al. |
| 2021/0084749 | A1 | 3/2021 | Devalla et al. |
| 2021/0211785 | A1 | 7/2021 | Rose et al. |
| 2021/0247580 | A1 | 8/2021 | Reagan |
| 2021/0263247 | A1 | 8/2021 | Bechtolsheim et al. |
| 2021/0281323 | A1 | 9/2021 | Williams et al. |
| 2021/0286140 | A1 | 9/2021 | Winzer |
| 2021/0294052 | A1 | 9/2021 | Winzer |
| 2021/0305127 | A1 | 9/2021 | Refai-Ahmed et al. |
| 2021/0345024 | A1 | 11/2021 | Leigh |
| 2021/0376950 | A1 | 12/2021 | Winzer |
| 2021/0384989 | A1 | 12/2021 | Nagarajan et al. |
| 2021/0389536 | A1 | 12/2021 | Dietrich et al. |
| 2022/0003946 | A1 | 1/2022 | Edwards, Jr. et al. |
| 2022/0029379 | A1 | 1/2022 | Kovsh |
| 2022/0029380 | A1 | 1/2022 | Kovsh |
| 2022/0109501 | A1 | 4/2022 | Latchman |
| 2022/0141949 | A1 | 5/2022 | Devalla et al. |
| 2022/0141990 | A1 | 5/2022 | Gupta |
| 2022/0159860 | A1 | 5/2022 | Winzer |
| 2022/0159878 | A1 | 5/2022 | Dillman et al. |
| 2022/0187559 | A1 | 6/2022 | Lin et al. |
| 2022/0263586 | A1 | 8/2022 | Winzer |
| 2022/0264759 | A1 | 8/2022 | Sawyer et al. |
| 2022/0279256 | A1 | 9/2022 | Chaouch et al. |
| 2022/0291461 | A1 | 9/2022 | Elsinger et al. |
| 2022/0329020 | A1 | 10/2022 | Narayanan et al. |
| 2023/0003958 | A1 | 1/2023 | Shimazu et al. |
| 2023/0018654 | A1 | 1/2023 | Winzer |
| 2023/0043794 | A1 | 2/2023 | Winzer |
| 2023/0064740 | A1 | 3/2023 | Rathinasamy |
| 2023/0077979 | A1 | 3/2023 | Winzer |
| 2023/0161109 | A1 | 5/2023 | Pupalaikis et al. |
| 2023/0176304 | A1 | 6/2023 | Winzer |
| 2023/0209761 | A1 | 6/2023 | Winzer |
| 2023/0305247 | A1 | 9/2023 | Hemp et al. |
| 2023/0305249 | A1 | 9/2023 | Hemp et al. |
| 2023/0380095 | A1 | 11/2023 | Winzer et al. |

FOREIGN PATENT DOCUMENTS

| | | |
|---|---|---|
| WO | WO 2021/183792 | 9/2021 |
| WO | WO 2021/188648 | 9/2021 |
| WO | WO 2021/211725 | 10/2021 |
| WO | WO 2021/247521 | 12/2021 |
| WO | WO 2022/061160 | 3/2022 |
| WO | WO 2022/076539 | 4/2022 |
| WO | WO 2022/109349 | 5/2022 |

OTHER PUBLICATIONS

Amazon.com [online], "IBM Midplane Board-8852Refurbished, 25R5780Refurbished)," Jun. 30, 2014, retrieved on Nov. 22, 2022, retrieved from URL<https://www.amazon.com/IBM-MIDPLANE-BOARD-8852-Refurbished-25R5780/dp/B00LEQ2URK>, 2 pages.

[No Author Listed], "MTP/MPO Breakout Cable Datasheet," FS Technical Documents, Apr. 26, 2020, 9 pages.

[No Author Listed], "MTP/MPO Fiber Cables, Quick Start Guide V1.0," FS Technical Documents, Mar. 24, 2020, 5 pages.

Akhter et al., "WaveLight: A Monolithic Low Latency Silicon-Photonics Communication Platform for the Next-Generation Disaggregated Cloud Data Centers," 2017 IEEE 25th Annual Symposium on High-Performance Interconnects, Aug. 28-30, 2017, pp. 25-28.

Blum, "Integrated silicon photonics for high vol. data center applications," Proc. SPIE 11286, Optical Interconnects, Feb. 28, 2020, 10 pages.

Chen et al., "A 25Gb/s Hybrid Integrated Silicon Photonic Transceiver in 28nm CMOS and SOI," ISSSCC 2015, Session 22, High-Speed Optical Links, 22.2, 2:00PM, Feb. 25, 2015, 402-404.

Chuang et al., "Theoretical and empirical qualification of a mechanical-optical interface for parallel optics links," Optical Interconnects XV, Apr. 2015, 9368: 11 pages.

CoPackagedOptics.com [online], "3.2 Tb/s copackaged optics optical module product requirements document," Feb. 2021, retrieved in Jan. 2022 from <http://www.copackagedoptics.com/wp-content/uploads/2021/02/JDF-3.2-Tb_s-Copackaged-Optics-Module-PRD-1.0.pdf>, 28 pages.

CoPackagedOptics.com [online], "Co-Packaged Optic Assembly Guidance Document," May 1, 2020, retrieved on Jan. 26, 2021 from URL <http://www.copackagedoptics.com/wp-content/uploads/2020/05/CPO-Assembly-Guidance-Doc-V1.0-FINAL.pdf>, 22 pages.

CoPackagedOptics.com [online], "Co-Packaged Optical Module Discussion Document," Sep. 17, 2019, retrieved on Jan. 26, 2021 from URL <http://www.copackagedoptics.com/wp-content/uploads/2019/11/CPO-Module-Discussion-Doc-V1.0Final.pdf>, 18 pages.

CoPackagedOptics.com [online], "Co-Packaged Optics Collaboration FAQ," upon information and belief, available no later than Sep.

(56) References Cited

OTHER PUBLICATIONS 18, 2020, retrieved on Jan. 26, 2021 from URL <http://www.copackagedoptics.com/wpcontent/uploads/2019/11/CoPackagedOpticsCollaboration-FAQ-Final-051319.pdf>, 3 pages.
CoPackagedOptics.com [online], "Co-packaged Optics External Laser Source Guidance Document," upon information and belief, available no later than Sep. 18, 2020, retrieved on Jan. 26, 2021 from URL <http://www.copackagedoptics.com/wp-content/uploads/2020/01/ELS-Guidance-Doc-v1.0-FINAL.pdf>, 23 pages.
De Heyn et al., "Ultra-dense 16x56Gb/s NRZ GeSi EAM-PD arrays coupled to multicore fiber for short-reach 896Gb/s optical links," Optical Fiber Communication Conference, Mar. 2017, 3 pages.
Doany et al., "Multichannel High-Bandwidth Coupling of Ultradense Silicon Photonic Waveguide Array to Standard-Pitch Fiber Array," Journal of Lightwave Technology, Feb. 15, 2021, 29: 475-482.
Doany et al., Terabit/Sec VCSEL-Based 48-Channel Optical Module Based on Holey CMOS Transceiver IC, Journal of Lightwave Technology, Feb. 15, 2013, 31:672-680.
Dobbelaere, "Advanced Silicon Photonics Technology Platform Leveraging a Semiconductor Supply Chain," 2017 IEEE International Electron Devices Meeting, Dec. 2-6, 2017, 4 pages.
Fathololoumi et al., "1.6Tbps Silicon Photonics Integrated Circuit and 800 Gbps Photonic Engine for Switch Co-Packaging Demonstration, " Journal of Lightwave Technology, Feb. 15, 2021, 39:1155-1161.
Fathololoumi et al., "1.6Tbps Silicon Photonics Integrated Circuit for Co-Packaged Optical-IO Switch Applications," 2020 Optical Fiber Communications Conference and Exhibition (OFC), Mar. 8-12, 2020, 3 pages.
Fathololoumi et al., "1.6Tbps Silicon Photonics Integrated Circuit for Co-Packaged Optical-IO Switch Applications," 2020 Optical Fiber Communications Conference and Exhibition (OFC), Mar. 8-12, 2020, 4 pages.
Fuse.wikichip.org [online], "Ayar Labs Realizes Co-Packaged Silicon Photonics," Jan. 19, 2020, retrieved on Feb. 15, 2022 from URL <https://fuse.wikichip.org/news/3233/ayar-labs-realizes-co-packaged-silicon-photonics/2/, 9 pages.
Fuse.wikichip.org [online], "Ayar Labs Realizes Co-Packaged Silicon Photonics," Jan. 19, 2020, retrieved on Mar. 23, 2022 from URL <https://fuse.wikichip.org/news/3233/ayar-labs-realizes-co-packaged-silicon-photonics/>, 6 pages.
Fuse.wikichip.org [online], "Ranovus Odin: Co-Packaging Next-Gen DC Switches and Accelerators With Silicon Photonics," Apr. 11, 2020, retrieved on or before Mar. 23, 2022 from URL <https://fuse.wikichip.org/news/3420/ranovus-odin-co-packaging-next-gen-dc-switches-and-accelerators-with-silicon-photonics/>, 8 pages.
Gazettabyte.com [online], "Ayar Labs prepares for the era of co-packaged optics," Feb. 21, 2019, retrieved on or before Mar. 23, 2022 from URL<http://www.gazettabyte.com/home/2019/2/21/ayar-labs-prepares-for-the-era-of-co-packaged-optics.html>, 7 pages.
Gazettabyte.com [online], "Inphi unveils first 800-gigabit PAM-4 signal processing chip," Apr. 8, 2020, retrieved on Feb. 15, 2022 from URL <http://www.gazettabyte.com/home/2020/4/8/inphi-unveils-first-800-gigabit-pam-4-signal-processing-chip.html>, 5 pages.
Gazettabyte.com [online], "Intel combines optics to its Tofino 2 switch chip," Mar. 19, 2020, retrieved on Jan. 26, 2022 from URL <http://www.gazettabyte.com/home/2020/3/19/intel-combines-optics-to-its-tofino-2-switch-chip.html>, 10 pages.
Gazettabyte.com [online], "Ranovus outlines its co-packaged optics plans," Apr. 20, 2020, retrieved on Feb. 15, 2022 from URL <http://www.gazettabyte.com/home/2020/4/30/ranovus-outlines-its-co-packaged-optics-plans.html>, 10 pages.
Gunn, "CMOS Photonics for High-Speed Interconnects," IEEE Micro, Mar.-Apr. 2006, 26:58-66.
Hayashi et al., "End-to-End Multi-Core Fiber Transition Link Enabled by Silicon Photonics Transceiver with Grating Couple Array," 2017 European Conference on Optical Communication (ECOC), Sep. 17-21, 2017, 3 pages.
Hosseini et al., "8 Tbps Co-Packaged FPGA and Silicon Photonics Optical IO," 2021 Optical Fiber Communications Conference and Exhibition (OFC), Jun. 1, 2021, 3 pages.
Hughes et al., "A single-mode expanded beam separable fiber optic interconnect for silicon photonics," Optical Fiber Communications Conference and Exhibition, Mar. 2019, 3 pages.
International Search Report and Written Opinion in International Appln. No. PCT/US2021/050945, dated Dec. 27, 2021, 15 pages.
Invitation to Pay Additional Fees in International Appln. No. PCT/US2021/53745, dated Dec. 8, 2021, 2 pages.
Itpeernetwork.com [online], "Industry-First Co-Packaged Optics Ethernet Switch Solution with Intel Silicon Photonics," Hou, IT Peer Network, Mar. 9, 2020, retrieved on or before Mar. 23, 2022 from URL <https://itpeernetwork.intel.com/optics-ethernet-solution/]>, 5 pages.
LaserFocusWorld.com [online], "Integrated optics permeate datacenter networks," Laser Focus World Online Magazine, Oct. 1, 2018, retrieved on or before Mar. 23, 2022 from www.laserfocusworld.com, 4 pages.
LaserFocusWorld.com [online], "Photonics for datacenters: integrated optics permeate datacenter networks," Oct. 2018, retrieved on Jan. 26, 2022 from URL <https://www.laserfocusworld.com/optics/article/16555340/photonics-for-datacenters-integrated-optics-permeate-datacenter-networks>, 16 pages.
Lee et al., "End-to-End Multicore Multimode Fiber Optic Link Operating up to 120 GB/s," Journal of Lightwave Technology, Mar. 15, 2012, 30:886-892.
Li et al., "A 112 GB/s PAM4 Linear TIA with 0.96 pJ/bit Energy Efficiency in 28 nm CMOS," ESSCIRC 2018—IEEE 44th European Solid State Circuits Conference (ESSCIRC), Sep. 2-6, 2018, pp. 238-241.
Liang et al., "Fully-Integrated Heterogeneous DML Transmitters for High-Performance Computing," Journal of Lightwave Technology, Jul. 1, 2020, 38:3322-3337.
Logan et al., "800Gb/s Silicon Photonic Transmitter for Co-Packaged Optics," 2020 IEEE Photonics Conference (IPC), Sep. 28-Oct. 2020, 2 pages.
Mahajan et al., "Co-Packaged Photonics for High Performance Computing: Status, Challenges and Opportunities," Journal of Lightwave Technology, Jan. 15, 2022, 40:379-398.
Mangal et al., "Through-substrate coupling elements for silicon-photonics based short-reach optical interconnects," Proceedings of the SPIE, Optical Interconnects XIX, Mar. 2019, 10924: 14 pages.
Marchetti et al., "Coupling strategies for silicon photonics integrated chips," Photonics Research, Feb. 2019, 7(2):201-239.
Meade et al., "TeraPHY: A High-density Electronic-Photonic Chiplet for Optical I/O from a Multi-Chip Module," 2019 Optical Fiber Communications Conference and Exhibition (OFC), Mar. 3-7, 2019, 3 pages.
Minkenberg et al., "Reimagining datacenter topologies with integrated silicon photonics," Journal of Optical Communications and Networking, Jul. 2018, 10(7):B126-B139.
Missinne et al., "Alignment-tolerant interfacing of a photonic integrated circuit using back side etched silicon microlenses," Proceedings of the SPIE, Oct. 2019, 10923: 8 pages.
Moazeni et al., "A 40-GB/s PAM-4 Transmitter Based on a Ring-Resonator Optical DAC in 45-nm SOI CMOS," IEEE Journal of Solid-State Circuits, Dec. 2017, 52:3503-3516.
Nambiar et al., "Grating-assisted fiber to chip coupling for SOI photonic circuits," Applied Sciences. Jul. 2018, 8(7): 22 pages.
Notaros et al., "Ultra-Efficient CMOS Fiber-to-Chip Grating Couplers," Optical Fiber Communication Conference, Mar. 20-22, 2016, 3 pages.
Nowell et al., "Progress in 100G Lambda MSA Based on 100G PAM4 Technology," 2020 Optical Fiber Communications Conference and Exhibition (OFC), Mar. 8-12, 2020, 3 pages.
Patterson et al., "The future of packaging with silicon photonics," Chip Scale Review, Jan. & Feb. 2017, 10 pages.
Raj et al., "50Gb/s Hybrid Integrated Si-Photonic Optical Link in 16nm FinFET," 2020 European Conference on Optical Communications (ECOC), Dec. 6-10, 2020, 4 pages.

(56) References Cited

OTHER PUBLICATIONS

Raj et al., "Design of a 50-GB/s Hybrid Integrated Si-Photonic Optical Link in 16-nm FinFET," IEEE Journal of Solid-State Circuits, Apr. 2020, 55: 1086-1095.
Rockleyphotonics.com [online], "25.6T Switch Co-Packages with LightDriver and Copper Cable Attached 400G Modules," Rockley Photonics, 2020, retrieved on Mar. 24, 2022, retrieved from <https://rockleyphotonics.com/?s=25.6+T+switch+co-package>, 1 page.
Rockleyphotonics.com [online], "Rockley Photonics collaborates with Accton, TE and Molex to demonstrate a 25.6Tbps OptoASIC Switch system," Rockley Photonics, Mar. 10, 2020, retrieved on or before Mar. 23, 2022, retrieved from <https://rockleyphotonics.com/rockley-photonics-collaborates-with-accton-te-and-molex-to-demonstrate-a-25-6tbps-optoasic-switch-system/>, 6 pages.
Rockleyphotonics.com [online], "Sailing through the data deluge with pervasive optical connectivity," Rockley Photonics, Feb. 2019, retrieved on or before Mar. 23, 2022, retrieved from <https://rockleyphotonics.com/wp-content/uploads/2019/02/Rockley-Photonics-Sailing-through-the-Data-Deluge.pdf>, 9 pages.
Romagnoli et al., "High Bandwidth density optically interconnected Terabit/s Boards," SPIE OPTO, Jan. 30, 2018, 15 pages.
Saeedi et al., "A 25 GB/s 3D-Integrated CMOS/Silicon-Photonic Receiver for Low-Power High-Sensitivity Optical Communication," Journal of Lightwave Technology, Jun. 15, 2016, 34(12):2924-2933.
Sakib et al., "A high-speed micro-ring modulator for next generation energy-efficient optical networks beyond 100 Gbaud," CLEO: Science and Innovations 2021, San Jose, California United States, May 9-14, 2021, 3 pages.
Scarcella et al., "Pluggable single-mode fiber-array-to-PIC coupling using micro-lenses," IEEE Photonics Technology Letters, Oct. 2017, 29(22):1943-1946.
Servethehome.com [online], "Hands-on with the Intel Co-Packaged Optics and Silicon Photonics Switch," Mar. 18, 2020, retrieved on Mar. 24, 2022, retrieved from <https://www.servethehome.com/hands-on-with-the-intel-co-packaged-optics-and-silicon-photonics-switch/>, 16 pages.
Shang et al., "High-temperature reliable quantum-dot lasers on Si with misfit and threading dislocation filters," Optics, May 2021, 8:749-754.
Shen et al., "Silicon Photonics for Extreme Scale Systems," Journal of Lightwave Technology, Jan. 15, 2019, vol. 37:245-258.
Stojanovic et al., "Monolithic silicon-photonic platforms in state-of-the-art CMOS SOI processes [Invited]," Optics Express, May 7, 2018, 26: 1-16.
Sun et al., "A 45 nm CMOS-SOI Monolithic Photonics Platform With Bit-Statistics-Based Resonant Microring Thermal Tuning, " IEEE Journal of Solid-State Circuits, Apr. 2016, 51:893-907.
Sun et al., "A Monolithically-Integrated Chip-to-Chip Optical Link in Bulk CMOS," 2014 Symposium on VLSI Circuits Digest of Technical Papers, Apr. 2015, 2 pages.
Sun et al., "Single-chip microprocessor that communicates directly using light," Nature, Dec. 2015, 528; 534-544.
Sun et al., "TeraPHY: An O-band WDM Electro-optic Platform for Low Power, Terabit/s Optical I/O," 2020 IEEE Symposium on VLSI Technology, Dec. 2, 2020, 2 pages.
Timurdogan et al., "400G Silicon Photonics Integrated Circuit Transceiver Chipsets for CPO, OBO, and Pluggable Modules," 2020 Optical Fiber Communications Conference and Exhibition (OFC), Mar. 12-8, 2020, 3 pages.
Timurdogan et al., "An Ultra Low Power 3D Integrated Intra-Chip Silicon Electronic-Photonic Link," 2015 Optical Fiber Communications Conference and Exhibition (OFC), Mar. 22-26, 2015, 3 pages.
Wade et al., "75% Efficient Wide Bandwidth Grating Couplers in a 45 nm Microelectronics CMOS Process," 2015 IEEE Optical Interconnects Conference (OI), Apr. 20-22, 2015, 46-47.
Wade et al., "A Bandwidth-Dense, Low Power Electronic-Photonic Platform and Architecture for Multi-Tbps Optical I/O," 2018 European Conference on Optical Communication (ECOC), Sep. 23-27, 2018, 3 pages.
Wade et al., "An Error-free 1 Tbps WDM Optical I/O Chiplet and Multi wavelength Multi-port Laser," 2021 Optical Fiber Communications Conference and Exhibition (OFC), Jun. 6-10, 2021, 3 pages.
Wade et al., "TeraPHY: A Chiplet Technology for Low-Power, High-Bandwidth In-Package Optical I/O," IEEE Computer Society, Mar. & Apr. 2020, 9 pages.
Wang et al., "4×112 Gbps/Fiber CWDM VCSEL Arrays for Co-Packaged Interconnects," Journal of Lightwave Technology, Jul. 1, 2020, 38:3439-3444.
Wang et al., "Bidirectional Tuning of Microring-Based Silicon Photonic Transceivers for Optimal Energy Efficiency," Proceedings of the 24th Asia and South Pacific Design Automation Conference, Jan. 21, 2019, pp. 370-375.
Wang et al., "Energy-Efficient Channel Alignment of DWDM Silicon Photonic Transceivers," 2018 Design, Automation & Test in Europe Conference & Exhibition, Mar. 19-23, 2018, 4 pages.
Yu et al., "400Gbps Fully Integrated DR4 Silicon Photonics Transmitter for Data Center Applications," 2020 Optical Fiber Communications Conference and Exhibition (OFC), Mar. 8-12, 2020, 3 pages.
Zhang et al., "3D and 2.5D Heterogeneous Integration Platforms with Interconnect stitching and microfluidic cooling," Georgia Institute of Technology, Doctor of Philosophy in the School of Electrical and Computer Engineering Aug. 2017, 151 pages.
Zhao et al., "Ultra-dense silicon photonics coupling solution for optical chip scale package transceiver," In Asia Communications and Photonics Conference, Nov. 2016, 3 pages.
Zheng et al., Ultra-efficient 10 GB/s hybrid integrated silicon photonic transmitter and receiver, Optics Express, Mar. 2011, 19(6):5172-5186.
Zilkie et al., "Multi-micron silicon photonics platform for highly manufactural and versatile photonic integrated circuits," (2019) 'Multi-Micron Silicon Photonics Platform for Highly Manufactural and Versatile Photonic Integrated Circuits', IEEE Journal of Selected Topics in Quantum Electronics, Apr. 15, 2019, 15 pages.
Semianalysis.com [online], "Intel's Trojan Horse into the Foundry Business | Co-packaged Silicon Photonics is Intel's Path Forward for IDM 2.0," Jun. 11, 2021, retrieved on Aug. 15, 2022, retrieved from URL<https://semianalysis.com/intels-trojan-horse-into-the-foundry-business-co-packaged-silicon-photonics-is-intels-path-forward-for-idm-2-0/>, 22 pages.
Servethehome.com [online], "Important Silicon Photonics Future at Intel Vision 2022," May 16, 2022, retrieved on Aug. 15, 2022, retrieved from URL<https://www.servethehome.com/important-silicon-photonics-future-at-intel-vision-2022-lightbender-light-bender/>, 6 pages.
International Search Report and Written Opinion in International Appln. No. PCT/US2021/053745, dated Feb. 3, 2022, 15 pages.
[No Author Listed] [online], "The Promise of Co-Packaged Optics: Paving the Way for Improved Power Efficiency, Size, and Cost," The Institute for Energy Efficiency, Oct. 2, 2020, retrieved on Jan. 11, 2023, <https://www.youtube.com/watch?v=OzNGZJHKiE8>, 19 pages [Video Submission].
[No Author Listed], "2020 Optical Fiber Communication Conference and Exhibition: Conference Schedule," OFC 2020 tutorial M1H.4, Mar. 8-12, 2020, 152 pages.
[No Author Listed], "Hands-on with Intel Co-Packaged Optics and Silicon Photonics Switch," Serve the Home, Mar. 18, 2020, retrieved on Feb. 15, 2022, <https://www.youtube.com/watch?v=Esgyj26vdxs>, 31 pages.
[No Author Listed], "Paradigm Change: Reinventing HPC Architectures with In-Package Optical I/O," Ayar Labs, Solution Brief, Jul. 2, 2020, 9 pages.
[No Author Listed], "Rockley Photonics Silicon Photonics Platform for Next Generation Transceivers," Rockley Photonics, Mar. 2020, 1 page.

(56) References Cited

OTHER PUBLICATIONS

[No Author Listed], "Technical Brief: Optical I/O Chiplets Eliminate Bottlenecks to Unleash Innovation," Ayar Labs, Technical Brief, Dec. 6, 2021, 9 pages.
Analui et al., "A Fully Integrated 20-GB/s Optoelectronic Transceiver Implemented in a Standard 0.13-um CMOS SOI Technology, " IEEE Journal of Solid-State Circuits, Dec. 2006, 41(12):2945-2955.
Bower et al., "Heterogeneous Integration of Microscale Semiconductor Devices By Micro-Transfer-Printing," Electronic Components & Technology Conference, 2015, 963-967.
Bower et al., "Heterogeneous Integration of Microscale Semiconductor Devices By Micro-Transfer-Printing," IEEE 65th ECTC, San Diego, CA, USA, May 26-29, 2015, 30 pages.
Chopra, "Looking Beyond 400G: A System Vendor Perspective, Beyond 400 GB/s Ethernet Study Group," Cisco Fellow, Feb. 8, 2020, 23 pages.
Dobbelaere, "Silicon Photonics Technology Platform for Integration of Optical IOs with ASICs," 2013 IEEE Hot Chips 25 Symposium (HCS)—Silicon Photonics Technology Platform for integration of optical IOS with ASICs, Aug. 25-Aug. 27, 2013, 18 pages.
Extended European Search Report in European Appln. No. 22195981, dated Feb. 14, 2023, 9 pages.
Kutchta, "Co-Packaging on Organic Laminates: MOTION Phase 2 ARPA-E Enlitened Kickoff Meeting," IBM Research, Jan. 13, 2021, 16 pages.
IBM, "Silicon Photonics Co-Packaging Webcast," COBO, Sep. 16, 2020, 31 pages.
Keeler et al., "Heterogeneous Integration of III-V Photonics and Silicon Electronics for Advanced Optical Microsystems," Sandia National Laboratories, Mar. 1, 2016, 23 pages.
Kuchta et al., "Multi-wavelength Optical Transceivers Integrated On Node (Motion)," ARPA, IBM, Apr. 22, 2019, 28 pages.
Kuchta et al., "Multi-wavelength Optical Transceivers Integrated On Node (Motion)," ARPA, IBM, Apr. 22, 2019, 40 pages.
Lee et al., "OnRamps: Optical Networks Using Rapid Amplified Multi-wavelength Photonic Switches, " PowerPoint, ARPA, IBM Research, Apr. 22, 2019, 27 pages.
Lee, "OnRamps: Optical Networks Using Rapid Amplified Multi-wavelength Photonic Switches," PowerPoint, ARPA, IBM Research, Apr. 22, 2019, 17 pages.
Liang et al., "Integrated energy efficient WDM photonic solution for Data Centers and Supercomputers," ARPA-E Enlightened Review Meeting, Seattle, WA, Oct. 23-24, 2018, 24 pages.
Liang, "Integrated DWDM Photonics 2.0 for Green Exascale Supercomputing in HPE," ARPA-Enlightened Annual Review Meeting, Coronado, CA, USA, Oct. 30-Nov. 1, 2019, 19 pages.
Marvell Technology, [online], "Post Moore Data Center Networks for 800GbE/1.6TbE with Radha Nagarajan | Marvell Technology," https://www.marvell.com, Sep. 14, 2021, retrieved on Nov. 30, 2021, <https://www.youtube.com/watch?v=ruo_WNqEBP8>, 13 pages [Video Submission].
Nagarajan, "2.5D Heterogeneous Silicon Photonics Light Engine with Integrated DFB Lasers and Electronics," Poster, Presented at OCP Future Technologies Symposium, Inphi Corp, 2020 OCP Global Summit, Mar. 4-5, 2020, 1 page.
Nagarajan, "2.5D Heterogeneous Silicon Photonics Light Engine with Integrated DFB Lasers and Electronics," Presentation, Presented at OCP Future Technologies Symposium, Inphi Corp, 2020 OCP Global Summit, Mar. 4-5, 2020, 13 pages.
Rakowski, "Silicon photonics platform for 50G optical interconnects," Cadence Photonics Summit and Workshop, San Jose, CA, Sep. 6-7, 2017, 45 pages.
Roberts et al., "High Speed Optics—The road to 44G and Beyond," CiscoLive!, Jan. 28-Feb. 1, 2019, 102 pages.
Wade et al., "TeraPHY: A Chiplet Technology for Low-Power, High-Bandwidth In-Package Optical I/O," Presentation Ayar Labs and Intel, Hot Chips 2019, Aug. 20, 2019, 48 pages.
International Preliminary Report on Patentability Chapter II in International Appln. No. PCT/US2021/053745, mailed Jun. 14, 2023, 14 pages.
[No Author Listed], "QSFP-DD MSA QSFP-DD/QSFP-DD800/QSFP112 Hardware Specification for QSFP Double Density 8X and QSFP 4X Pluggable Transceivers, " Revision 6.2, Mar. 11, 2022, 169 pages.
[No Author Listed], "IEEE P802.3 Electrical I/O Specifications, " LAN/MAN Standards Committee of the IEEE Computer Society, May 13, 2022, 235 pages.
[No Author Listed], "Implementation Agreement for a 3.2Tb/s Co-Packaged (CPO) Module," OIF-Co-Packaging-3.2T-Module-01.0, Mar. 29, 2023, 38 pages.
Alexoudi et al., "Optics in Computing: From Photonic Network-on-Chip to Chip-to-Chip Interconnects and Disintegrated Architectures," Journal of Lightwave Technology, Jan. 15, 2019, 37(2):363-379.
Allaboutcircuits.com [online], "Innovative Interconnects: The Future of Chiplet-based Processors?" Apr. 18, 2022, retrieved on Oct. 26, 2023, retrieved from URL<https://www.allaboutcircuits.com/news/innovative-interconnects-the-future-of-chiplet-based-processors/>, 6 pages.
Ase.aseglobal.com [online], "Fan-Out Packaging, "2022, retrieved on Jul. 8, 2022, retrieved from URL<https://ase.aseglobal.com/en/technology/fan out>, 8 pages.
Awavesemi [online], "1G to 224G SerDes," Jan. 28, 2023, retrieved on Oct. 24, 2023, retrieved from URL<http://web.archive.org/web/20230701000000*/https://awavesemi.com/silicon-ip/phy-ip/1g-224g-serdes/>, 4 pages.
Broadcom.com [online], "Broadcom's persistent cadence of co-packaged optics innovation," Mar. 1, 2023, retrieved on Oct. 24, 2023, retrieved from URL<https://www.broadcom.com/blog/broadcoms-persistent-cadence-copackaged-optics-innovation>, 5 pages.
Cadence.com [online], "112Gbps XSR SerDes IP for TSMC 7nm FinFET," 2022, retrieved on Oct. 24, 2023, retrieved from URL<https://www.cadence.com/content/dam/cadence-www/global/en_US/documents/tools/ip/design-ip/112g-xsr-pamp4-ip-br.pdf>, 2 pages.
Ethernetalliance.org [online], "CEI-28G: Paving the Way for 100 Gigabit," Jun. 2010, retrieved on Sep. 26, 2023, retrieved from URL<https://www.ethernetalliance.org/wp-content/uploads/2011/10/document_files_CEI-28G_rev8.pdf>, 10 pages.
Harrisburg.psu.edu [online], "112 Gbps Electrical Interfaces: Does rate drive architecture or does architecture enable rate?" Apr. 12, 2019, retrieved on Sep. 26, 2023, retrieved from URL<https://harrisburg.psu.edu/files/pdf/16546/2019/04/24/te_connectivity_at_psu hburg si_symposium.pdf>, 34 pages.
I3electronics.com [online], "Advanced Semiconductor Packaging," 2022, retrieved on Jul. 8, 2022, retrieved from URL<https://i3electronics.com/micro_semiconductor/>, 8 pages.
Imec-int.com [online], "A new approach to fan-out wafer-level packaging," Jun. 6, 2019, retrieved on Jul. 8, 2022, retrieved from URL<https://www.imec-int.com/en/imec-magazine/imec-magazine-june-2019/a-new-approach-to-fan-out-wafer-level-packaging>, 30 pages.
Intel.com [online], "Accelerating Innovation Through A Standard Chiplet Interface: The Advanced Interface Bus (AIB)," Sep. 19, 2020, retrieved on Sep. 26, 2023, retrieved from URL<https://www.intel.com/content/dam/www/public/US/en/documents/white-papers/accelerating-innovation-through-aib-whitepaper.pdf>, 9 pages.
Intel.com [online], "CEI 28 Very Short Reach (VSR) Specifications for CFP2/CFP4/QSFP+/QSFP28/zQSFP/SMA 2.4 mm," available on or before Dec. 9, 2022, retrieved on Oct. 24, 2023, retrieved from URL<https://www.intel.com/content/www/us/en/docs/programmable/683132/current/cei-28-very-short-reach-vsr-specifications.html>, 7 pages.
International Preliminary Report on Patentability in International Appln. No. PCT/US2022/071857, mailed on Nov. 2, 2023, 23 pages.
International Search Report and Written Opinion in International Appln. No. PCT/US2023/020730, mailed Jul. 31, 2023, 10 pages.
International Search Report and Written Opinion in International Appln. No. PCT/US2023/16573, mailed Aug. 11, 2023, 18 pages.
Invitation to Pay Additional Fees in International Appln. No. PCT/US2023/16573, mailed Jun. 6, 2023, 2 pages.

(56) References Cited

OTHER PUBLICATIONS

Janta-Polczynski et al., "Towards co-packaging of photonics and microelectronics in existing manufacturing facilities," Proc. SPIE 10538, Optical Interconnects XVIII, 105380B, Feb. 22, 2018, 11 pages.
Kehlet, "Chiplets On the Rise," 2020 Heterogeneous Integration Roadmap Symposium, Feb. 21, 2020, 27 pages.
Lau et al., "Fan-Out Wafer-Level Packaging for Heterogeneous Integration," Electronic Components and Technology Conference, May 1, 2018, 4 pages (abstract only).
Lau et al., "Redistribution-Layers for Fan-Out Wafer-Level Packaging and Heterogeneous Integrations," China Semiconductor Technology International Conference, Mar. 1, 2019, 3 pages (abstract only).
Lightcounting.com [online], "High Speed Cables, Embedded and Co-Packaged Optics," Dec. 2022, retrieved on Jun. 8, 2023, retrieved from URL<www.lightcounting.com>, 100 pages.
Lightwaveonline.com [online], "OIF launches CEI-112G-Extra Short Reach (XSR)+ project," Sep. 2, 2021, retrieved on Oct. 24, 2023, retrieved from URL<https://www.lightwaveonline.com/optical-tech/electronics/article/14209722/oif-launches-cei112gextra-short-reach-xsr-project>, 3 pages.
Lin et al., "Organic Interposer CoWoS-R+ (plus) Technology," 2022 IEEE 72nd Electronic Components and Technology Conference (ECTC), Jul. 12, 2022, 6 pages.
Lusted et al. "Motions and Straw Polls, " IEEE P802.3df Task Force, Intel, Sep. 2022, 6 pages.
Mahajan et al., "Embedded Multi-Die Interconnect Bridge (EMIB)—A High Density, High Bandwidth Packaging Interconnect," 2016 IEEE 66th Electronic Components and Technology Conference, May 31, 2016-Jun. 3, 2016, 557-565.
Michelogiannakis et al., "Efficient Intra-Rack Resource Disaggregation for HPC Using Co-Packaged DWDM Photonics," CoRR, submitted Jul. 17, 2023, arXiv:2301.03592v3, 15 pages.
Nextplatform.com [online], "Nvidia Shows What Optically Linked GPU Systems Might Look Like," Aug. 17, 2022, retrieved on Oct. 24, 2023, retrieved from URL<https://www.nextplatform.com/2022/08/17/nvidia-shows-what-optically-linked-gpu-systems-might-look-like/?utm_content=218412429&utm_medium=social&utm_source=linkedin&hss_channel=lcp-6627049>, 8 pages.
Oiforum.com [online], "Alphawave IP, ZeusCORE™ MSS IP, " ECOC 2022, retrieved on Oct. 24, 2023, retrieved from URL<https://www.oiforum.com/wp-content/uploads/OIF_PLL_Demo_Alphawave_ECOC22.pdf> 2 pages.
Oiforum.com [online], "Common Electrical I/O (CEI)-112G," Dec. 10, 2019, retrieved on Oct. 24, 2023, retrieved from URL<http://web.archive.org/web/20191201000000*/https://www.oiforum.com/technical-work/hot-topics/common-electrical-interface-cei-112g-2/>, 8 pages.
Oiforum.com [online], "IA Title: Common Electrical I/O (CEI)—Electrical and Jitter Interoperability agreements for 6G+ bps, 11G+ bps, 5G+ bps I/O and 56G+ bps," Dec. 29, 2017, retrieved on Oct. 24, 2023, retrieved from URL<https://www.oiforum.com/wp-content/uploads/2019/01/OIF-CEI-04.0.pdf>, 464 pages.
Oiforum.com [online], "OIF's CEI 56G Interfaces—Key Building Blocks for Optics in the 400G Data Center," Sep. 28, 2015, retrieved on Sep. 26, 2023, retrieved from URL<https://www.oiforum.com/wp-content/uploads/2019/01/150928_Mkt-Focus-ECOC-Panel-OIF.pdf>, 23 pages.
Opencompute.org [online], "Bunch of Wires (BoW) PHY Specification, The Open Domain-Specific Architecture BoW Workstream, DRAFT Version 2.0," Mar. 1, 2023, retrieved on Sep. 26, 2023, retrieved from URL<https://www.opencompute.org/documents/bow-specification-v2-0d-1-pdf>, 51 pages.
Overclock3d.net [online], "Intel discusses EMIB technology—Multi-die CPUs incoming?" Aug. 28, 2017, retrieved on Oct. 26, 2023, retrieved from URL<https://overclock3d.net/news/gpu-displays/intel-discusses-emib-technology-multi-die-cpus-incoming/>, 10 pages.
Pcmag.com [online], "To 'Meteor Lake' and Beyond: How Intel Plans a New Era of 'Chiplet'-Based CPUs," Aug. 24, 2022, retrieved on Oct. 26, 2023, retrieved from URL<https://www.pcmag.com/news/to-meteor-lake-and-beyond-how-intel-plans-a-new-era-of-chiplet-based-cpus>, 13 pages.
Schaevitz et al., "Solving the Escape Density Problem: Making connections count with SCIP," Optica Publishing Group, Mar. 2023, 3 pages.
Semi.org [online], "As Chiplets Go Mainstream, Chip Industry Players Collaborate to Overcome New Development Challenges," Feb. 14, 2023, retrieved on Oct. 26, 2023, retrieved from URL<https://www.semi.org/en/blogs/technology-and-trends/as-chiplets-go-mainstream-chip-industry-players-collaborate-to-overcome-new-development-challenges>, 9 pages.
Semiengineering.com [online], "Improving Redistribution Layers For Fan-Out Packages And SiPs," Sep. 15, 2022, retrieved on Oct. 24, 2023, retrieved from URL<https://semiengineering.com/improving-redistribution-layers-for-fan-out-packages-and-sips/>, 11 pages.
Sharma, "Universal Chiplet Interconnect Express (UCIe)®: An open standard for developing a successful chiplet ecosystem," IEEE Electronics Packaging Society, Mar. 2, 2022, 3 pages.
Shen et al., "Silicon photonic integrated circuits and its application in data center," Proc. SPIE 11763, Seventh Symposium on Novel Photoelectronic Detection Technology and Applications, Mar. 12, 2021, 15 pages.
Synopsys.com [online], "Synopsys UCIe IP Solutions," Jul. 5, 2022, retrieved on Oct. 24, 2023, retrieved from URL<https://www.synopsys.com/dw/ipdir.php?ds-dwc_ucie_ip>, 2 pages.
Synopsys.com [online], "Synopsys XSR PHY IP," May 28, 2020, retrieved on Oct. 24, 2023, retrieved from URL<https://www.synopsys.com/dw/ipdir.php?ds-dwc_usr-xsr_phy>, 2 pages.
Uciexpress.org [online], "Universal Chiplet Interconnect Express (UCIe) Specification," retrieved on Feb. 24, 2020, retrieved on Sep. 26, 2023, retrieved from URL<https://www.uciexpress.org/specifications>, 2 pages.
Uciexpress.org [online], "Universal Chiplet Interconnect Express (UCIe)®: Building an open chiplet ecosystem," Mar. 2, 2022, retrieved on Jul. 8, 2022, retrieved from URL<https://www.uciexpress.org/_files/ugd/0c1418_c5970a68ab214ffc97fab16d11581449.pdf>, 7 pages.
Yoshida et al. "56-GB/s PAM4 x 8-Channel VCSEL-Based Optical Transceiver for Co-Packaged Optics," 2022 IEEE CPMT Symposium Japan (ICSJ), 2022, 4 pages.
Zdnet.com [online], "AMD, Intel, TSMC, Microsoft and others establish universal chiplet standard," Mar. 2, 2022, retrieved on Oct. 26, 2023, retrieved from URL<https://www.zdnet.com/article/amd-intel-tsmc-microsoft-and-others-establish-universal-chiplet-standard/>, 8 pages.
[No Author Listed], "QSFP-DD/QSFP-DD800/QSFP112 Hardware Specification for QSFP Double Density 8X and QSFP 4X Pluggable Transceivers," QSFP-DD, Revision 6.01, May 28, 2021, 167 pages.
[No Author Listed], "Support Tomorrow's Speeds Inside Today's Footprint; Molex Solutions for 112 Gbps Architecture, " Molex, 2019, 7 pages.
[No Author Listed], "Specification for OSFP OCTAL Small Form Factor Pluggable Module," OSFP MSA, Rev 4.0, May 28, 2021, 109 pages.
Dogruoz et al., "Optimizing QSFP-DD Systems to Achieve at Least 25Watt Thermal Port Performance," QSFP-DD, Jan. 2021, 30 pages.
Ieee802.org [online], "Broadened Consensus for a 200GEL Copper Cable Objective," Aug. 26, 2021, retrieved Oct. 17, 2022, retrieved from URL<https://www.ieee802.org/3/B400G/public/21_08/kocsis_b400g_01a_210826.pdf>, 17 pages.
Ieeee802.org [online], "Multi-200Gbps/lane Package Model Considerations, " Jul. 12, 2022, retrieved Oct. 17, 2022, retrieved from URL<https://www.ieee802.org/3/df/public/22_07/benartsi_3df_01a_2207.pdf>, 13 pages.
International Preliminary Report on Patentability in International Appln. No. PCT/US2021/060215, mailed Jun. 1, 2023, 41 pages.
International Search Report and Written Opinion in International Appln. No. PCT/US2021/060215, dated Mar. 22, 2022, 46 pages.
International Search Report and Written Opinion in International Appln. No. PCT/US2022/033870, mailed Sep. 28, 2022, 15 pages.

(56) References Cited

OTHER PUBLICATIONS

International Search Report and Written Opinion in International Appln. No. PCT/US2022/071857, mailed Jun. 29, 2022, 25 pages.
Invitation to Pay Additional Fees in International Appln. No. PCT/US2021/060215, dated Jan. 26, 2022, 3 pages.
Kocsis et al., "OSFP MDI Proposal," Amphenol, High Speed Interconnects, Mar. 6, 2016, 13 pages.
Samtec.com [online], "Flyover® QSFP Cable Systems, Cages, and Heat Sinks," 2022, retrieved on Dec. 22, 2022, retrieved from URL<https://www.samtec.com/cables/high-speed/assemblies/qsfp-flyover>, 7 pages.
Samtec.com [online], "Novaray® I/O 112 Gbps PAM4 Panel Mount Cable System," May 18, 2022, retrieved on Mar. 29, 2023, retrieved from URL<https://www.samtec.com/cables/high-speed/io-assemblies/novaray-io>, 12 pages.
Tracy, "Supporting Data to Demonstrate 100Gbps Capability of Proposed MDIs," TW Connectivity, Sep. 13, 2018, 9 pages.

* cited by examiner

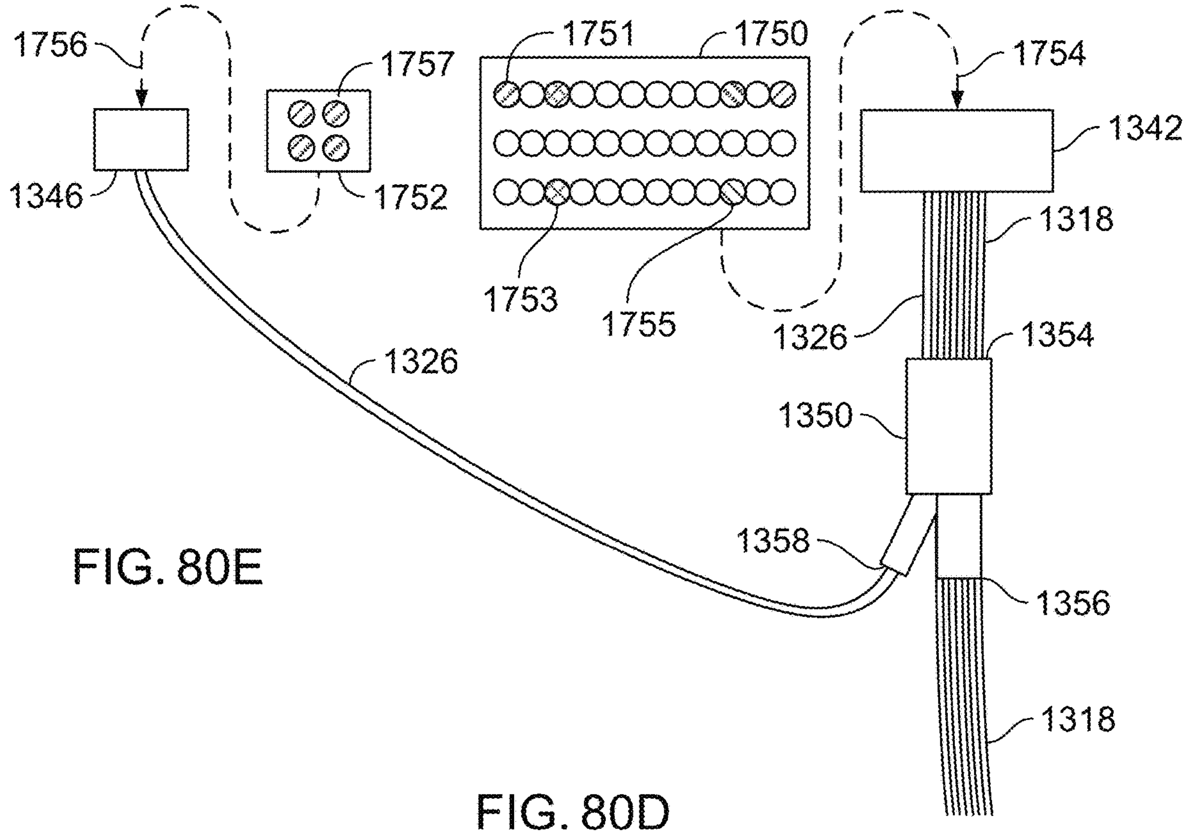
FIG. 80E
FIG. 80D
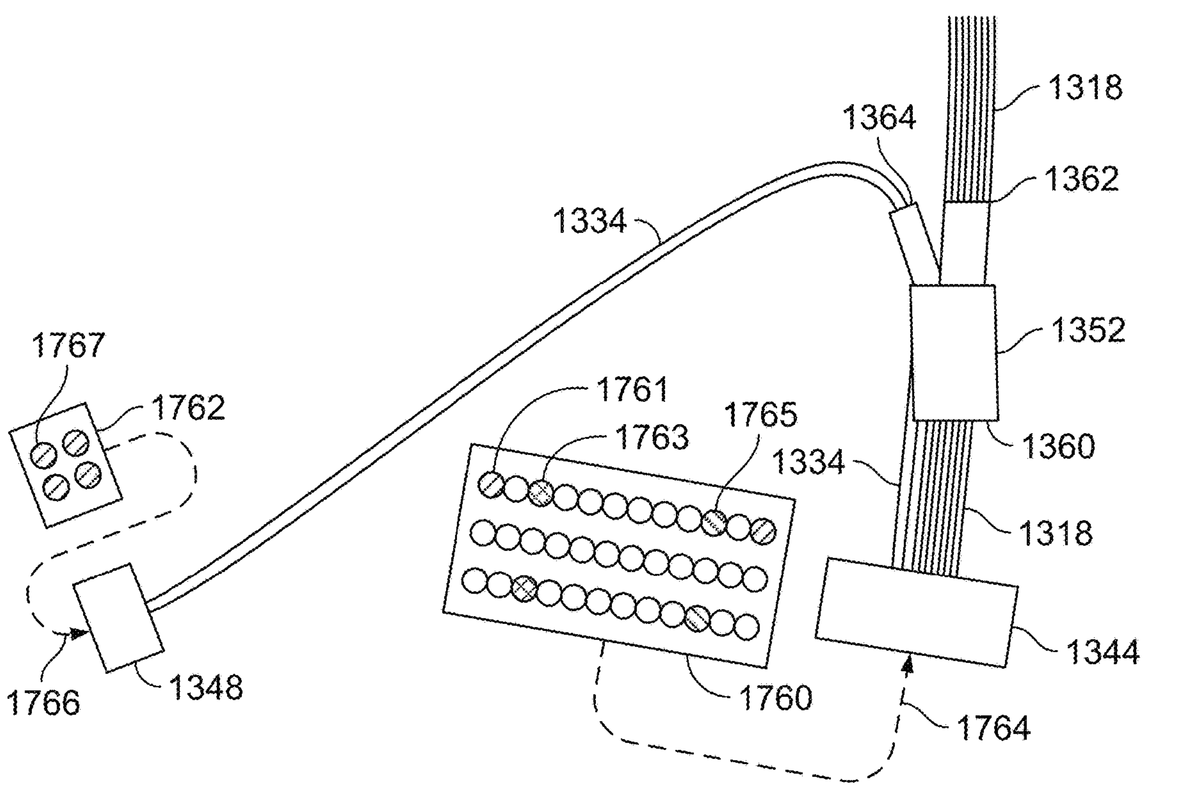

1940

1990

| | |
|---|---|
| Switch capacity | 51.2 Tbps |
| CPO module capacity | 1.6 Tbps |
| CPO modules | 32 |
| RLS fibers/module | 2-4 |
| RLS fibers total | 64 – 128 |
| RLS power per 100 Gbps | 14 – 18 dBm |
| RLS power per CPO module | 400mW – 1 W |
| Available power per laser | up to 500 mW |
| Wallplugefficiency | 10 – 20% |
| Electrical power per laser | 2.5 – 5W |
| Remote lasers per CPO module | 1 – 2 |
| Remote lasers per box | 32 – 64 |
| RLS packaging | e.g., QSFP, OSFP |

2000

| | |
|---|---|
| Switch capacity | 51.2 Tbps |
| CPO module capacity | 1.6 Tbps |
| CPO modules | 32 |
| RLS fibers/module | 2 – 4 |
| RLS fibers total | 64 – 128 |
| RLS power per 100 Gbps | 14 – 18 dBm |
| RLS power per CPO module | 400 mW – 1 W |
| Available power per laser | up to 500 mW |
| Wallplug efficiency | 10 – 20% |
| Electrical power per laser | 2.5 – 5 W |
| Remote lasers per CPO module | 1 – 2 |
| Remote lasers per box | 32 – 64 |
| RLS packaging | e.g., QSFP, OSFP |

- Junction temperatures are below 105C, proving vertical ASIC mount cooling feasibility;
- Results are for a first non-optimized concept design. Ample opportunities exist to optimize heat sink design, fan positioning, fan duct geometry, heat pipes, etc.

Rack system with vertically mounted blades

Remote Laser Source Blind-Mating

Safety shut-off options:
- Mechanical shutter on disconnect
- Electrical contact sensing and laser shutoff on disconnect U-shaped Bolt

- Insert through holes in lattice sidewall to lock compress plate in place;
- One-piece design Wave Spring

- Placed between compression plate and lid to distribute compression load to module;
- Groove can be cut on the bottom side of compression plate to prevent it from sliding around on lid surface during assembly Example having electronics on the PIC at North/South/East/West

DATA PROCESSING SYSTEMS INCLUDING OPTICAL COMMUNICATION MODULES

CROSS-REFERENCE TO RELATED APPLICATIONS

This application claims priority to U.S. Provisional Application 63/210,437, filed on Jun. 14, 2021, U.S. provisional patent application 63/088,914, filed on Oct. 7, 2020, U.S. provisional patent application 63/245,005, filed on Sep. 16, 2021, U.S. provisional patent application 63/116,660, filed on Nov. 20, 2020, U.S. provisional patent application 63/146,421, filed on Feb. 5, 2021, U.S. provisional patent application 63/145,368, filed on Feb. 3, 2021, U.S. provisional patent application 63/159,768, filed on Mar. 11, 2021, U.S. provisional patent application 63/225,779, filed on Jul. 26, 2021, U.S. provisional patent application 63/175,021, filed on Apr. 14, 2021, U.S. provisional patent application 63/208,759, filed on Jun. 9, 2021, U.S. provisional patent application 63/173,253, filed on Apr. 9, 2021, U.S. provisional patent application 63/245,011, filed on Sep. 16, 2021, U.S. provisional patent application 63/178,501, filed on Apr. 22, 2021, U.S. provisional patent application 63/192,852, filed on May 25, 2021, and U.S. provisional patent application 63/223,685, filed on Jul. 20, 2021. The entire disclosures of the above applications are hereby incorporated by reference.

TECHNICAL FIELD

This document describes data processing systems that include optical communication modules.

BACKGROUND

This section introduces aspects that can help facilitate a better understanding of the disclosure. Accordingly, the statements of this section are to be read in this light and are not to be understood as admissions about what is in the prior art or what is not in the prior art.

As the input/output (I/O) capacities of electronic processing chips increase, electrical signals may not provide sufficient input/output capacity across the limited size of a practically viable electronic chip package. For example, some data centers include racks of data processing servers (e.g., switch servers) and use optical fibers to transmit optical signals between the data processing servers. Each data processing server receives first optical signals from optical fiber cables, converts the first optical signals to first electrical signals, perform operations (e.g., switching operations) on the first electrical signals to generate second electrical signals, convert the second electrical signals to second optical signals, and outputs the second optical signals through the optical fiber cables.

SUMMARY OF THE INVENTION

In a general aspect, an apparatus includes: at least one of a circuit board or a substrate; a data processor unit mounted on a first side of the circuit board or the substrate; and a first structure attached to a second side of the circuit board or the substrate. The second side of the circuit board or the substrate includes a two-dimensional arrangement of second electrical contacts. The first structure is configured to enable an optical module with a two-dimensional arrangement of first electrical contacts to be removably coupled to the first structure and enable the optical module to be electrically coupled to the circuit board or the substrate through the two-dimensional arrangement of first electrical contacts and the two-dimensional arrangement of second electrical contacts.

Implementations can include one or more of the following features. The optical module can include a connector configured to enable an optical fiber connector to be removably coupled to the optical module.

The data processor unit can include at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is configured to process electrical signals received from or transmitted to the optical module.

The data processor unit can include at least one of (i) a bare die processor that is mounted on the first side of the circuit board or the substrate, or (ii) a packaged processor that includes a package substrate that is mounted on the first side of the circuit board or the substrate.

The first structure can include walls that define a first opening. The walls can also define one or more retaining mechanisms such that when the optical module is inserted into the first opening, the one or more retaining mechanisms on the walls of the first structure engage one or more latch mechanisms on the optical module to secure the optical module to the first structure, and the first electrical contacts on the optical module are electrically coupled to the second electrical contacts on the circuit board or the substrate.

The apparatus can include at least one optical module. The optical module can include a mechanical connector structure configured to removably couple the optical module to the circuit board or the substrate to enable electrical signals to be transmitted between the optical module and the second electrical contacts of the circuit board or the substrate.

The optical module can include a connector configured to enable an optical fiber connector to be removably coupled to the optical module. The mechanical connector structure can be configured to receive the optical fiber connector to enable light signals from the optical fiber connector to be transmitted to the optical module.

The apparatus can include the optical fiber connector. The optical fiber connector can be optically coupled to a fiber cable that includes a plurality of optical fibers. The optical fiber connector can be configured to transmit optical signals carried in the optical fibers to the optical module.

The optical module can include a photonic integrated circuit that includes a two-dimensional array of optical coupling elements. The optical fiber connector can be configured to couple a two-dimensional array of optical fibers to the two-dimensional array of optical coupling elements on the photonic integrated circuit.

The two-dimension array of optical fibers can include at least a 3×12 array of optical fibers.

The arrangement of second electrical contacts of the circuit board or the substrate can include at least four rows and four columns of second electrical contacts. The arrangement of first electrical contacts of the optical module can include at least four rows and four columns of first electrical contacts. The first structure can be configured to enable the at least four rows and four columns of first electrical contacts of the optical module to be electrically coupled to the at least four rows and four columns of second electrical contacts of the circuit board or the substrate when the optical module is coupled to the first structure.

The first structure can include a grid structure that defines multiple openings. Each opening can be configured to receive a corresponding optical module.

The grid structure can be configured such that when the optical modules are inserted into the openings of the grid structure, the optical modules are oriented such that each optical module is rotated 90 degrees relative to at least one adjacent optical module, and the rotational axis is perpendicular to the circuit board or the substrate.

The first structure can be configured to enable the optical modules to be mounted on the first structure in a 90-degree rotate checkerboard fashion.

The first structure can be configured to function as a heat spreader.

The first structure can have an opening located opposite the data processor unit relative to the circuit board or the substrate, discrete circuit components can be mounted on the second side of the circuit board or the substrate, and the discrete circuit components can extend from the circuit board or the substrate into the opening in the first structure.

The apparatus can include the circuit board and the substrate. The first structure can be attached to the second side of the circuit board, the data processor unit can be mounted on the first side of the substrate, the opening in the first structure can be located opposite the data processor unit relative to the substrate, discrete circuit components can be mounted on the second side of the substrate, and the discrete circuit components can extend from the substrate into the opening in the structure.

The discrete circuit components can include at least one of one or more voltage regulators, one or more filters, or one or more capacitors.

A second structure can be attached to a first side of the circuit board or the substrate, and the first structure can be mechanically and thermally attached to the second structure.

The first structure can be attached to the second structure by screws that pass through the printed circuit board or the substrate.

The first structure can be attached to the second structure by thermal vias.

The apparatus can include a heat sink attached to at least one of the first structure or the second structure.

The apparatus can include a snap-in mechanism that is configured to secure the optical module when the optical module is inserted into the first structure.

The snap-in mechanism can be configured to enable the optical module to be pulled away from the first structure when a force above a threshold is applied to the optical module.

The snap-in mechanism can include one or more grooves formed on walls of the first structure, the optical module can include one or more elastic wings, and each elastic wing can include a tongue that is configured to engage a corresponding groove when the optical module is inserted into the first structure.

The snap-in mechanism can include a lever-based latch mechanism, the latch mechanism can be movable between a first position and a second position, the latch mechanism can engage a support structure on the first structure when in the first position and disengage from the support structure when in the second position, and the optical module can be secured to the first structure when the latch mechanism is in the first position and released from the first structure when the latch mechanism is in the second position.

A lever can be provided as part of the optical module. The lever can be movable between a first position and a second position. The lever can be configured such that moving the lever to the first position causes the latch mechanism to move to the first position, and moving the lever to the second position causes the latch mechanism to move to the second position.

A lever can be provided as part of a tool used to insert or remove the optical module into or from the first structure.

The optical module can include a co-packaged optical module.

The co-packaged optical module can include: a photonic integrated circuit configured to perform at least one of converting first optical signals to first electrical signals or converting second electrical signals to second optical signals; and the two-dimensional arrangement of first electrical contacts. The two-dimensional arrangement of first electrical contacts can be configured to at least one of (i) enable the first electrical signals to be transmitted from the photonic integrated circuit to the circuit board or the substrate, or (ii) enable the second electrical signals to be transmitted from the circuit board or the substrate to the photonic integrated circuit. The co-packaged optical module can include an optical fiber connector part configured to be optically coupled to an array of optical fibers. The optical fiber connector part can be configured to at least one of (i) receive the first optical signals from the array of optical fibers and transmit the first optical signals to the photonic integrated circuit, or (ii) receive the second optical signals from the photonic integrated circuit and transmit the second optical signals to the array of optical fibers.

The co-packaged optical module can include at least one of: micro-optics assembly facilitating fiber-to-photonic integrated circuit coupling, one or more driver amplifiers, one or more trans-impedance amplifiers, one or more SerDes integrated circuits, one or more digital signal processors, one or more lasers or light emitting diodes, or one or more microcontrollers.

The apparatus can include the optical module. The optical module can include a snap-in mechanism configured such that the optical fiber connector locks in place the snap-in mechanism when the optical fiber connector is coupled to the optical module.

The optical module can include a mechanical connector structure. The optical fiber connector can snap into a part of the mechanical connector structure to hold the optical fiber connector in place when the optical fiber connector is coupled to the optical module.

The apparatus can include the optical fiber connector. The optical fiber connector and the optical module can include a ball-detent mechanism configured to hold the optical fiber connector in place when the optical fiber connector is coupled to the optical module.

In another general aspect, an apparatus includes: an optical module configured to be removably coupled to a first structure that is attached to a circuit board or a substrate. The optical module includes a two-dimensional arrangement of at least 16 electrical contacts distributed in a two-dimensional surface area of the optical module. The optical module includes a photonic integrated circuit, the optical module is configured to hold the photonic integrated circuit in place when the optical module is coupled to the first structure and to enable electronic signals from the photonic integrated circuit to be transmitted to the circuit board or the substrate through the two-dimensional arrangement of at least 16 electrical contacts. The optical module includes a connector part that is configured to enable an optical fiber connector to be removably coupled to the optical module, in which the optical module is configured to enable optical signals from the optical fiber connector to be transmitted to the photonic integrated circuit.

Implementations can include one or more of the following features. The optical fiber connector can be configured to couple a two-dimensional array of optical fibers to a two-dimensional array of optical coupling elements on the photonic integrated circuit.

The two-dimension array of optical fibers can include at least a 3×12 array of optical fibers.

The apparatus can include at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is coupled to the circuit board or the substrate and configured to process electrical signals received from or transmitted to the photonic integrated circuit.

The apparatus can include the first structure and at least one of the circuit board or the substrate. The circuit board or the substrate can be attached to a first side of the first structure, and the optical module can be configured to be removably coupled to the first structure from the second side of the first structure, and the second side of the first structure is opposite to the first side of the first structure.

The apparatus can include two or more optical modules that are removably coupled to the first structure in a 90-degree rotate checkerboard fashion.

The apparatus can include the circuit board and the substrate. The circuit board can be attached to the first side of the first structure, the substrate can be attached to the circuit board, and the optical module can be configured to hold the photonic integrated circuit in place when the optical module is coupled to the first structure and to enable electronic signals from the photonic integrated circuit to be transmitted to the substrate.

The first structure can include a grid structure that enables two or more optical modules to be removably coupled to the first structure in an array defined by the grid structure.

In another general aspect, a system includes: a housing; and any of the apparatuses described above, in which the optical module is configured to be removably coupled to, partially through, or through a front panel of the housing.

Implementations can include one or more of the following features. The first structure can be part of the front panel of the housing.

The circuit board can be part of the front panel of the housing.

The first structure can be positioned near and spaced apart from the front panel of the housing.

The first structure can have an overall structure that extends along a plane that is substantially parallel to the front panel of the housing.

The circuit board can be substantially parallel to the front panel of the housing.

In another general aspect, a method includes: providing at least one of a circuit board or a substrate, in which a data processor unit is mounted on a first side of the circuit board or the substrate, a first structure is attached to a second side of the circuit board or the substrate, and the second side of the circuit board or the substrate includes a two-dimensional arrangement of second electrical contacts. The method includes removably coupling an optical module to the first structure, in which the optical module includes a two-dimensional arrangement of first electrical contacts. The method includes electrically coupling the optical module to the second side of the circuit board or the substrate through the two-dimensional arrangement of first electrical contacts and the two-dimensional arrangement of second electrical contacts.

Implementations can include one or more of the following features. The method can include removably coupling an optical fiber connector to the optical module.

The method can include: inserting the optical module through a first opening defined by walls of the first structure; using one or more retaining mechanisms on the walls of the first structure to engage one or more latch mechanisms on the optical module to secure the optical module to the first structure; and electrically coupling the second electrical contacts on the circuit board or the substrate to the first electrical contacts on the optical module.

The method can include: transmitting optical signals from an optical fiber connector to the optical module; at the optical module, generating electrical signals based on the optical signals; and transmitting the electrical signals from the optical module to the circuit board or the substrate.

The optical module can include a photonic integrated circuit that includes a two-dimensional array of optical coupling elements. The method can include using the optical fiber connector to couple a two-dimensional array of optical fibers to the two-dimensional array of optical coupling elements on the photonic integrated circuit.

The two-dimension array of optical fibers can include at least a 3×12 array of optical fibers.

The arrangement of second electrical contacts on the circuit board or the substrate can include an array of at least four rows and four columns of electrical contacts, and the arrangement of first electrical contacts of the optical module can include an array of at least four rows and four columns of electrical contacts. Electrically coupling the optical module to the second side of the circuit board or the substrate can include electrically coupling the array of at least four rows and four columns of electrical contacts of the optical module to the array of at least four rows and four columns of electrical contacts of the circuit board or the substrate.

The first structure can include a grid structure that defines multiple first openings. The method can include: removably coupling a plurality of optical modules to the grid structure, including inserting each optical module through a corresponding first opening defined by the walls of the grid structure. The method can include for each of the plurality of optical modules, using one or more retaining mechanisms on the walls of the grid structure to engage one or more latch mechanisms on the optical module to secure the optical module to the grid structure. The method can include for each of the plurality of optical modules, electrically coupling the first electrical contacts on the optical module to corresponding second electrical contacts on the circuit board or the substrate.

The method can include orienting the optical modules such that each optical module is rotated 90 degrees relative to at least one adjacent optical module, and the rotational axis is perpendicular to the circuit board or the substrate.

The method can include removably coupling a plurality of optical modules to the first structure; and orienting the optical modules coupled to the first structure in a 90-degree rotate checkerboard fashion.

Removably coupling the optical module to the first structure can include securing, using a snap-in mechanism, the optical module to the first structure.

The method can include applying a force above a threshold to the optical module to disengage the snap-in mechanism, and pulling the optical module away from the first structure.

The snap-in mechanism can include one or more grooves formed on walls of the first structure, the optical module includes one or more elastic wings, and each elastic wing includes a tongue. The method can include engaging the tongue of the elastic wing with a corresponding groove formed on walls of the first structure when inserting the optical module into an opening defined by the walls of the first structure.

The snap-in mechanism can include a lever-based latch mechanism, the latch mechanism can be movable between a first position and a second position, and the latch mechanism can engage a support structure on the first structure when in the first position and disengages from the support structure when in the second position. The method can include placing the latch mechanism in the first position to secure the optical module to the first structure; and placing the latch mechanism in the second position to release the optical module from the first structure.

A lever can be provided as part of the optical module. The method can include: moving the lever to a first position to cause the latch mechanism to move to the first position, and moving the lever to a second position causes the latch mechanism to move to the second position.

The optical module can include a co-packaged optical module.

The co-packaged optical module can include: a photonic integrated circuit configured to perform at least one of converting first optical signals to first electrical signals or converting second electrical signals to second optical signals; and the two-dimensional arrangement of first electrical contacts. The two-dimensional arrangement of first electrical contacts can be configured to at least one of (i) enable the first electrical signals to be transmitted from the photonic integrated circuit to the circuit board or the substrate, or (ii) enable the second electrical signals to be transmitted from the circuit board or the substrate to the photonic integrated circuit. The co-packaged optical module can include an optical fiber connector part configured to be optically coupled to an array of optical fibers. The optical fiber connector part can be configured to at least one of (i) receive the first optical signals from the array of optical fibers and transmit the first optical signals to the photonic integrated circuit, or (ii) receive the second optical signals from the photonic integrated circuit and transmit the second optical signals to the array of optical fibers.

The co-packaged optical module can include at least one of: micro-optics assembly facilitating fiber-to-photonic integrated circuit coupling, one or more driver amplifiers, one or more trans-impedance amplifiers, one or more SerDes integrated circuits, one or more digital signal processors, one or more lasers or light emitting diodes, or one or more microcontrollers.

In another general aspect, a method includes: attaching a first structure to a first side of a circuit board or a substrate, in which the circuit board or the substrate includes a plurality of sets of two-dimensional arrangements of electrical contacts on the first side. The method includes mounting an application specific integrated circuit on a second side of the circuit board or the substrate. The first structure has a first opening located opposite the application specific integrated circuit relative to the circuit board or the substrate, the first structure defines second openings that are configured to receive optical modules, each second opening corresponding to a set of two-dimensional arrangement of electrical contacts in the plurality of sets of two-dimensional arrangements of electrical contacts. The first structure is configured to enable each optical module to be electrically coupled to the circuit board or the substrate through the corresponding set of two-dimensional arrangement of electrical contacts when the optical module is inserted through the corresponding second opening defined by the first structure. The method includes mounting discrete circuit components on the first side of the circuit board or the substrate, in which the discrete circuit components extend from the circuit board or the substrate into the first opening in the first structure.

Implementations can include one or more of the following features. The method can include: attaching the first structure to the first side of the circuit board; mounting the application specific integrated circuit on the second side of the substrate; and mounting discrete circuit components on the first side of the substrate. The discrete circuit components can extend from the substrate into the opening in the structure.

The discrete circuit components can include at least one of one or more voltage regulators, one or more filters, or one or more capacitors.

The method can include attaching a second structure to a second side of the circuit board or the substrate, and mechanically and thermally coupling the first structure to the second structure.

The method can include attaching the first structure to the second structure using screws that pass through the circuit board or the substrate.

The method can include attaching the first structure to the second structure using thermal vias.

The method can include attaching a heat sink to at least one of the first structure or the second structure.

In another general aspect, an apparatus includes: at least one of a circuit board or a substrate; and a first structure attached to the at least one of a circuit board or a substrate, in which the first structure is configured to enable an optical module with connector to be removably coupled to the first structure, and the optical module with connector is configured to enable an optical fiber connector to be removably coupled to the optical module with connector.

Implementations can include one or more of the following features. The circuit board or the substrate can include first electrical contacts, the first structure can include walls that define a first opening, the walls also define one or more retaining mechanisms such that when the optical module with connector is inserted into the first opening, the one or more retaining mechanisms on the walls of the first structure engage one or more latch mechanisms on the optical module with connector to secure the optical module with connector to the first structure, and second electrical contacts on the optical module with connector are electrically coupled to the first electrical contacts on the circuit board or the substrate.

The apparatus can include at least one optical module with connector. The optical module with connector can include an optical module and a mechanical connector structure, the mechanical connector structure can be configured to removably couple the optical module to the circuit board or the substrate to enable electrical signals output from the optical module to be transmitted to the first electrical contacts of the circuit board or the substrate.

The mechanical connector structure can be configured to receive the optical fiber connector to enable light signals from the optical fiber connector to be transmitted to the optical module.

The apparatus can include the optical fiber connector, in which the optical fiber connector can be optically coupled to a fiber cable that includes a plurality of optical fibers, and the optical fiber connector can be configured to transmit optical signals carried in the optical fibers to the optical module.

The circuit board or the substrate can include an array of first electrical contacts including at least four rows and four columns of electrical contacts, the optical module can include an array of second electrical contacts including at least four rows and four columns of electrical contacts, and the first structure can be configured to enable the array of second electrical contacts of the optical module to be electrically coupled to the array of first electrical contacts of the circuit board or the substrate when the optical module with connector is coupled to the first structure.

The first structure can include a grid structure that defines multiple openings, and each opening can be configured to receive a corresponding optical module with connector.

The grid structure can be configured such that when the optical module with connectors are inserted into the openings of the grid structure, the optical module with connectors are oriented such that each optical module with connector is rotated 90 degrees relative to at least one adjacent optical module with connector, and the rotational axis is perpendicular to the circuit board or the substrate.

The first structure can be configured to enable the optical module with connectors to be mounted on the first structure in a 90-degree rotate checkerboard fashion.

The first structure can be configured to function as a heat spreader.

Each of the at least one of the circuit board or substrate can include a first side and a second side, the first structure can be attached to the first side of the circuit board or the substrate, an application specific integrated circuit can be mounted on the second side of the circuit board or substrate, the first structure can have an opening, the opening can be located opposite the application specific integrated circuit relative to the circuit board or substrate, discrete circuit components can be mounted on the first side of the circuit board or substrate, and the discrete circuit components can extend from the circuit board or substrate into the opening in the structure.

The apparatus can include the circuit board and the substrate. The first structure can be attached to the first side of the circuit board, an application specific integrated circuit can be mounted on the second side of the substrate, the first structure can have an opening, the opening can be located opposite the application specific integrated circuit relative to the substrate, discrete circuit components can be mounted on the first side of the substrate, and the discrete circuit components can extend from the substrate into the opening in the structure.

The discrete circuit components can include at least one of one or more voltage regulators, one or more filters, or one or more capacitors.

The circuit board or substrate can include a first side and a second side, the first structure can be attached to the first side of the circuit board or substrate, a second structure can be attached to the second side of the circuit board or substrate, and the first structure can be mechanically and thermally attached to the second structure.

The first structure can be attached to the second structure by screws that pass through the printed circuit board or substrate.

The first structure can be attached to the second structure by thermal vias.

The apparatus can include a heat sink attached to at least one of the first structure or the second structure.

The apparatus can include a snap-in mechanism that is configured to secure the optical module with connector when the optical module with connector is inserted into the first structure.

The snap-in mechanism can be configured to enable the optical module with connector to be pulled away from the first structure when a force above a threshold is applied to the optical module with connector.

The snap-in mechanism can include one or more grooves formed on walls of the first structure, the optical module with connector can include one or more elastic wings, and each elastic wing can include a tongue that is configured to engage a corresponding groove when the optical module with connector is inserted into the first structure.

The snap-in mechanism can include a lever-based latch mechanism, the latch mechanism can be movable between a first position and a second position, the latch mechanism can engage a support structure on the first structure when in the first position and disengage from the support structure when in the second position, the optical module with connector can be secured to the first structure when the latch mechanism is in the first position and released from the first structure when the latch mechanism is in the second position.

A lever can be provided as part of the optical module with connector, the lever can be movable between a first position and a second position, the lever can be configured such that moving the lever to the first position causes the latch mechanism to move to the first position, and moving the lever to the second position can cause the latch mechanism to move to the second position.

A lever can be provided as part of a tool used to insert or remove the optical module with connector into or from the first structure.

In any of the apparatuses described above, the optical module with connector can include a co-packaged optical module.

The apparatus can include the optical module with connector, in which the optical module with connector can include a snap-in mechanism configured such that the optical fiber connector locks in place the snap-in mechanism when the optical fiber connector is coupled to the optical module with connector.

The optical module with connector can include a mechanical connector structure, and the optical fiber connector can snap into a part of the mechanical connector structure to hold the optical fiber connector in place when the optical fiber connector is coupled to the optical module with connector.

The apparatus can include the optical fiber connector, in which the optical fiber connector and the optical module with connector can include a ball-detent mechanism configured to hold the optical fiber connector in place when the optical fiber connector is coupled to the optical module with connector.

In another general aspect, an apparatus includes: an optical module with connector configured to be removably coupled to a first structure that is attached to a circuit board or a substrate. The optical module includes a photonic integrated circuit, the optical module with connector is configured to hold the photonic integrated circuit in place when the optical module with connector is coupled to the first structure and to enable electronic signals from the photonic integrated circuit to be transmitted to the circuit board or the substrate. The optical module with connector is configured to enable an optical fiber connector to be removably coupled to the optical module with connector, in which the optical module with connector is configured to enable optical signals from the optical fiber connector to be transmitted to the photonic integrated circuit.

Implementations can include one or more of the following features. The apparatus can include at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is coupled to the circuit board or the substrate and configured to process electrical signal received from or transmitted to the photonic integrated circuit.

The apparatus can include the first structure and at least one of the circuit board or the substrate. The circuit board or the substrate can be attached to a first side of the first structure, and the optical module with connector can be configured to be removable coupled to the first structure from the second side of the first structure, and the second side of the first structure is opposite to the first side of the first structure.

The apparatus can include two or more optical module with connectors that are removably coupled to the first structure in a 90-degree rotate checkerboard fashion.

The apparatus can include the circuit board and the substrate. The circuit board can be attached to a first side of the first structure, the substrate can be attached to the circuit board, and the optical module with connector can be configured to hold the photonic integrated circuit in place when the optical module with connector is coupled to the first structure and to enable electronic signals from the photonic integrated circuit to be transmitted to the substrate.

The first structure can include a grid structure that enables two or more optical module with connectors to be removably coupled to the first structure in an array defined by the grid structure.

In another general aspect, a system includes: a housing; and any of the apparatuses described above, in which the optical module with connector is configured to be removably coupled to, partially through, or through a front panel of the housing.

Implementations can include one or more of the following features. The first structure can be part of the front panel of the housing.

The circuit board can be part of the front panel of the housing.

The first structure can be positioned near and spaced apart from the front panel of the housing.

The first structure can have an overall structure that extends along a plane that is substantially parallel to the front panel of the housing.

The circuit board can be substantially parallel to the front panel of the housing.

In another general aspect, a method includes: removably coupling an optical fiber connector to an optical module with connector; removably coupling the optical module with connector to a first structure attached to at least one of a circuit board or a substrate; and electrically coupling the optical module with connector to the circuit board or the substrate.

Implementations can include one or more of the following features. The method can include: inserting the optical module with connector through a first opening defined by walls of the first structure; using one or more retaining mechanisms on the walls of the first structure to engage one or more latch mechanisms on the optical module with connector to secure the optical module with connector to the first structure; and electrically coupling first electrical contacts on the circuit board or the substrate to second electrical contacts on the optical module with connector.

The method can include: transmitting optical signals from the optical fiber connector to the optical module with connector; at the optical module with connector, generating electrical signals based on the optical signals; and transmitting the electrical signals from the optical module with connector to the circuit board or the substrate.

The circuit board or the substrate can include an array of first electrical contacts including at least four rows and four columns of electrical contacts, the optical module with connector can include an array of second electrical contacts including at least four rows and four columns of electrical contacts. Electrically coupling the optical module with connector to the circuit board or the substrate can include electrically coupling the array of second electrical contacts of the optical module with connector to the array of first electrical contacts of the circuit board or the substrate.

The first structure can include a grid structure that defines multiple first openings. The method can include: removably coupling a plurality of optical modules with connectors to the grid structure, including inserting each optical module with connector through a corresponding first opening defined by the walls of the grid structure. The method can include: for each of the plurality of optical modules with connectors, using one or more retaining mechanisms on the walls of the grid structure to engage one or more latch mechanisms on the optical module with connector to secure the optical module with connector to the grid structure. The method can include: for each of the plurality of optical modules with connectors, electrically coupling second electrical contacts on the optical module with connector to corresponding first electrical contacts on the circuit board or the substrate.

The method can include orienting the optical modules with connectors such that each optical module with connector is rotated 90 degrees relative to at least one adjacent optical module with connector, and the rotational axis is perpendicular to the circuit board or the substrate.

The method can include removably coupling a plurality of optical modules with connectors to the first structure; and orienting the optical modules with connectors coupled to the first structure in a 90-degree rotate checkerboard fashion.

Removably coupling the optical module with connector to the first structure can include securing, using a snap-in mechanism, the optical module with connector to the first structure.

The method can include applying a force above a threshold to the optical module with connector to disengage the snap-in mechanism, and pulling the optical module with connector away from the first structure.

The snap-in mechanism can include one or more grooves formed on walls of the first structure, the optical module with connector can include one or more elastic wings, and each elastic wing can include a tongue. The method can include engaging the tongue of the elastic wing with a corresponding groove formed on walls of the first structure when inserting the optical module with connector into an opening defined by the walls of the first structure.

The snap-in mechanism can include a lever-based latch mechanism, the latch mechanism can be movable between a first position and a second position, the latch mechanism can engage a support structure on the first structure when in the first position and disengage from the support structure when in the second position. The method can include placing the latch mechanism in the first position to secure the optical module with connector to the first structure; and placing the latch mechanism in the second position to release the optical module with connector from the first structure.

A lever can be provided as part of the optical module with connector. The method can include: moving the lever to a first position to cause the latch mechanism to move to the first position, and moving the lever to a second position causes the latch mechanism to move to the second position.

The optical module with connector can include a co-packaged optical module.

In another general aspect, a method includes: attaching a first structure to a first side of a circuit board or a substrate; and mounting an application specific integrated circuit on a second side of the circuit board or the substrate. The first structure has an opening located opposite the application specific integrated circuit relative to the circuit board or the substrate. The method includes: mounting discrete circuit components on the first side of the circuit board or the substrate. The discrete circuit components extend from the circuit board or the substrate into the opening in the structure.

Implementations can include one or more of the following features. The method can include: attaching the first structure to the first side of the circuit board; mounting the application specific integrated circuit on the second side of the substrate; and mounting discrete circuit components on the first side of the substrate. The discrete circuit components can extend from the substrate into the opening in the structure.

The discrete circuit components can include at least one of one or more voltage regulators, one or more filters, or one or more capacitors.

The method can include attaching a second structure to a second side of the circuit board or the substrate, and mechanically and thermally coupling the first structure to the second structure.

The method can include attaching the first structure to the second structure using screws that pass through the circuit board or the substrate.

The method can include attaching the first structure to the second structure using thermal vias.

The method can include attaching a heat sink to at least one of the first structure or the second structure.

Other aspects include other combinations of the features recited above and other features, expressed as methods, apparatus, systems, program products, and in other ways.

Interconnecting electronic chip packages using optical signals can have the advantage that the optical signals can be delivered with a higher input/output capacity per unit area compared to electrical input/outputs.

Particular embodiments of the subject matter described in this specification can be implemented to realize one or more of the following advantages. The data processing system has a high power efficiency, a low construction cost, a low operation cost, and high flexibility in reconfiguring optical network connections.

The details of one or more embodiments of the subject matter described in this specification are set forth in the accompanying drawings and the description below. Other features, aspects, and advantages of the invention will become apparent from the description, the drawings, and the claims.

Unless otherwise defined, all technical and scientific terms used herein have the same meaning as commonly understood by one of ordinary skill in the art to which this invention belongs. In case of conflict with patent applications or patent application publications incorporated herein by reference, the present specification, including definitions, will control.

BRIEF DESCRIPTION OF THE DRAWINGS

The disclosure is best understood from the following detailed description when read in conjunction with the accompanying drawings. It is emphasized that, according to common practice, the various features of the drawings are not to-scale. The dimensions of the various features can be arbitrarily expanded or reduced for clarity.

FIG. 80D is an enlarged diagram of the upper portion of the optical cable assembly of FIG. 80B.

FIG. 80E is an enlarged diagram of the lower portion of the optical cable assembly of FIG. 80B.

FIG. 133 is a diagram of an example of a wave spring.

FIGS. 134 and 135A to 135C are diagrams of an example of compression plates secured to a front lattice structure.

FIG. 136 is an exploded front perspective view of an example of an assembly in a rackmount system that includes a substrate, a printed circuit board, a front lattice structure, a rear lattice structure, and a heat dissipating device.

FIG. 137 is an exploded rear perspective view of an example of the assembly shown in FIG. 136.

FIG. 138 is an exploded top view of an example of the assembly shown in FIG. 136.

FIG. 139 is an exploded side view of an example of the assembly shown in FIG. 136.

FIG. 140 is a front perspective view of an example of the assembly that has been fastened together.

FIG. 141 is a front perspective view of an example of the assembled assembly without the front lattice structure.

FIG. 142 is a front perspective view of an example of the substrate, the rear lattice structure, and the heat dissipating device that have been fastened together.

FIG. 143 is a front perspective view of an example of the rear lattice structure and the heat dissipating device that have been fastened together.

FIG. 144 is a front perspective view of an example of the heat dissipating device and the screws.

FIG. 145 is a rear perspective view of an example of the assembly that has been fastened together.

Figure 146:
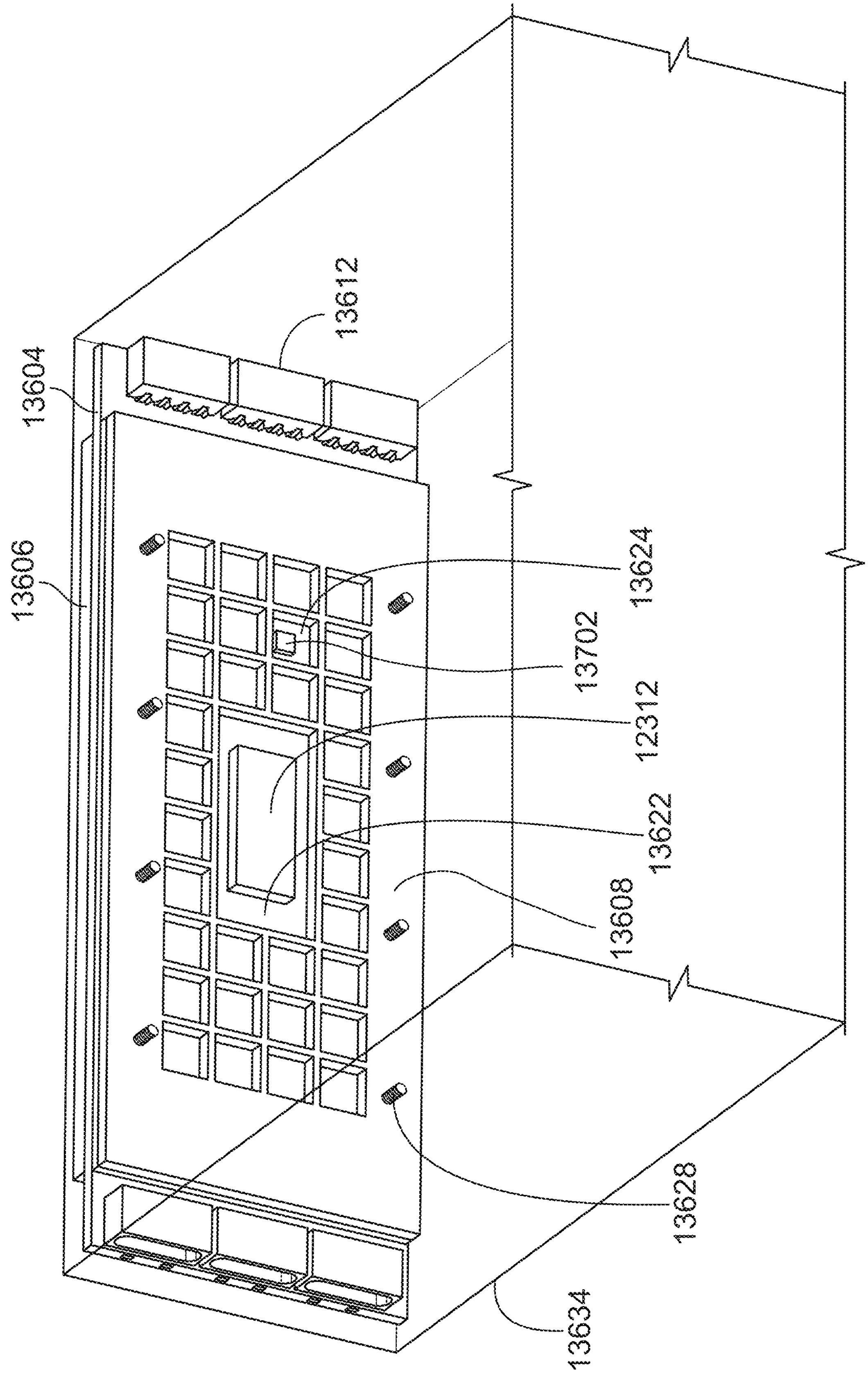

FIG. 146 is a rear perspective view of an example of the assembly without the rear lattice structure.

Figure 147:
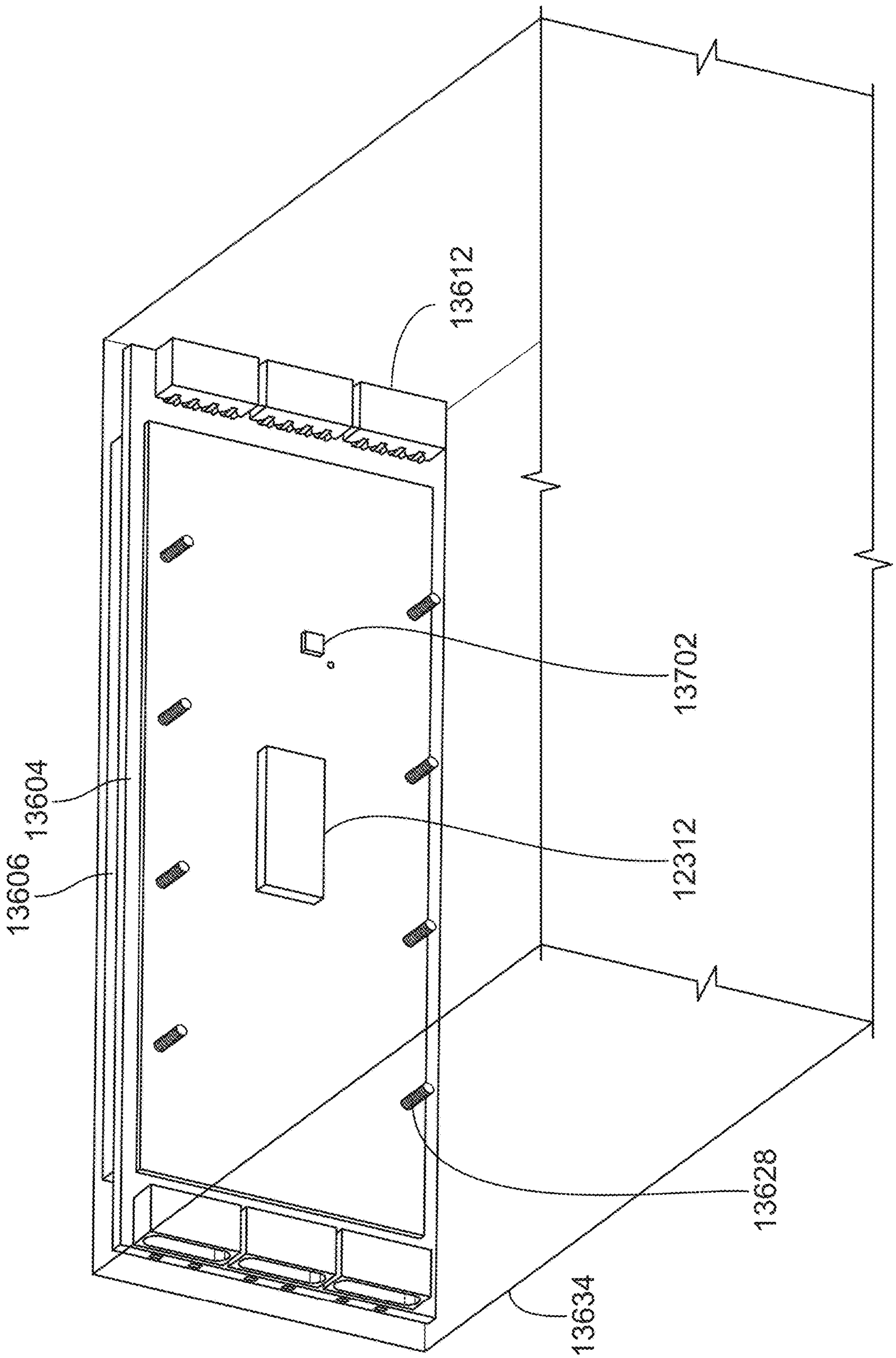

FIG. 147 is a rear perspective view of an example of the front lattice structure, the printed circuit board, and the substrate that have been fastened together.

Figure 148:
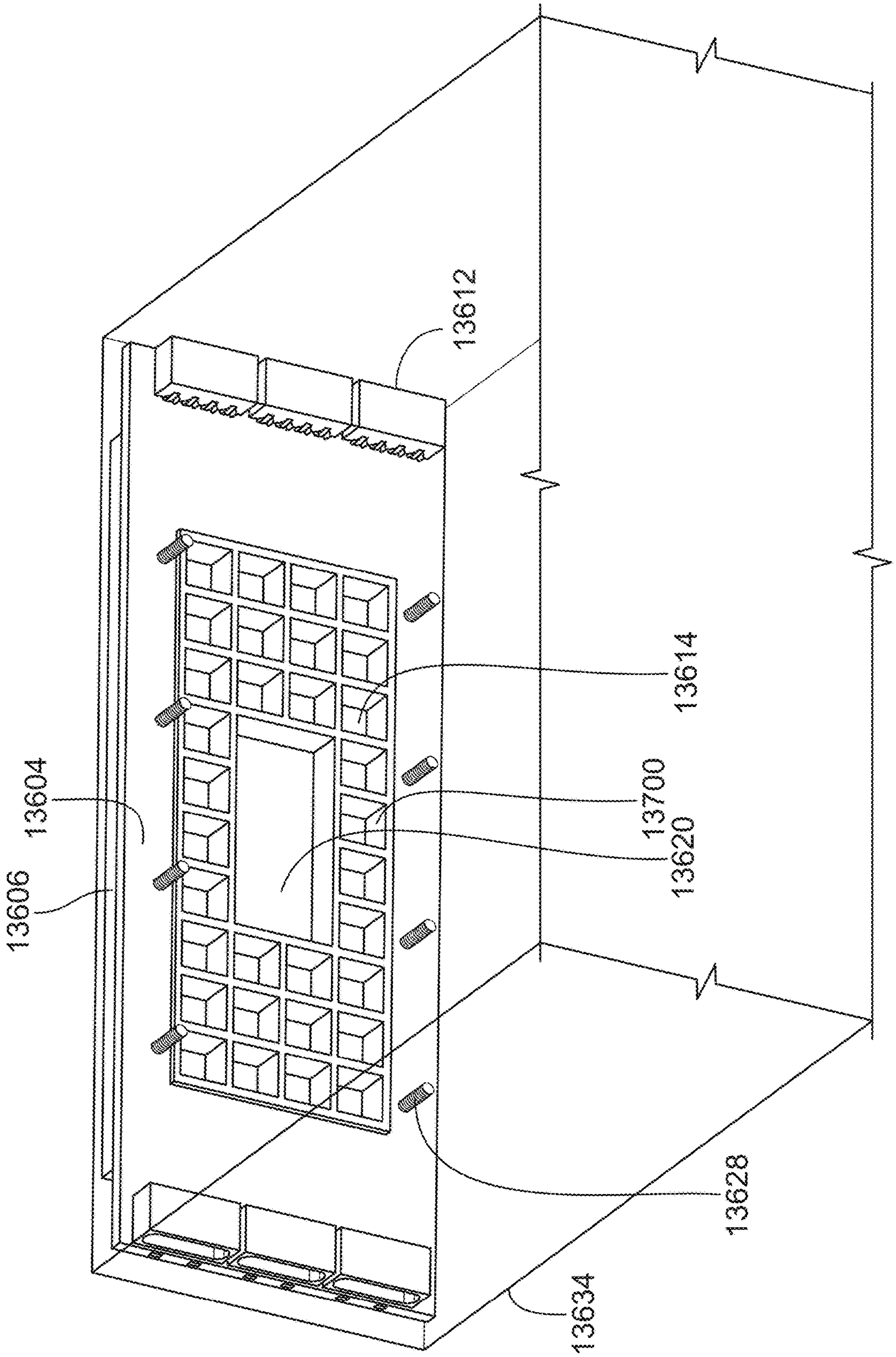

FIG. 148 is a rear perspective view of an example of the front lattice structure and the printed circuit board that have been fastened together.

Figure 149:
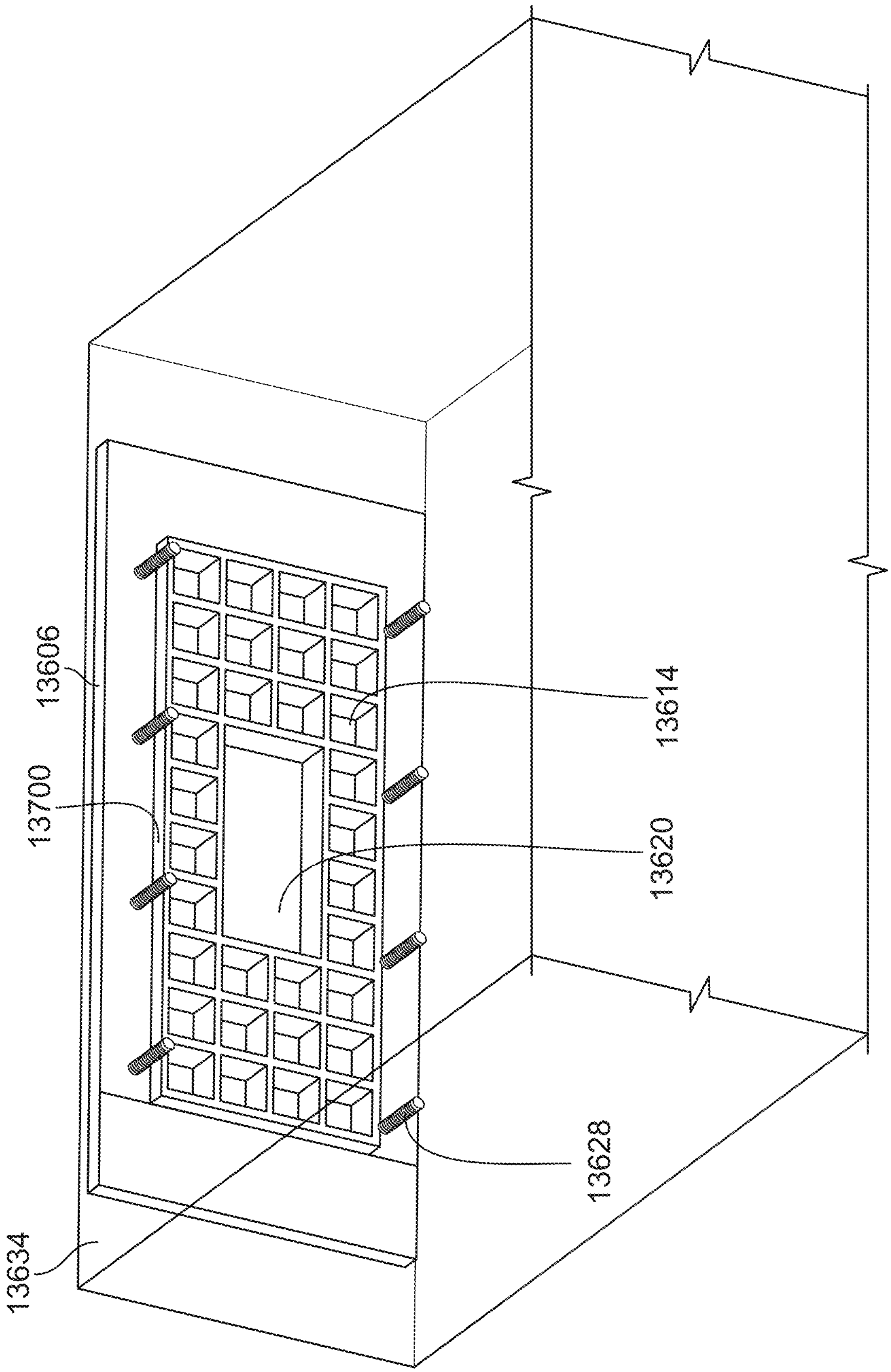

FIG. 149 is a rear perspective view of an example of the front lattice structure.

Figure 150:
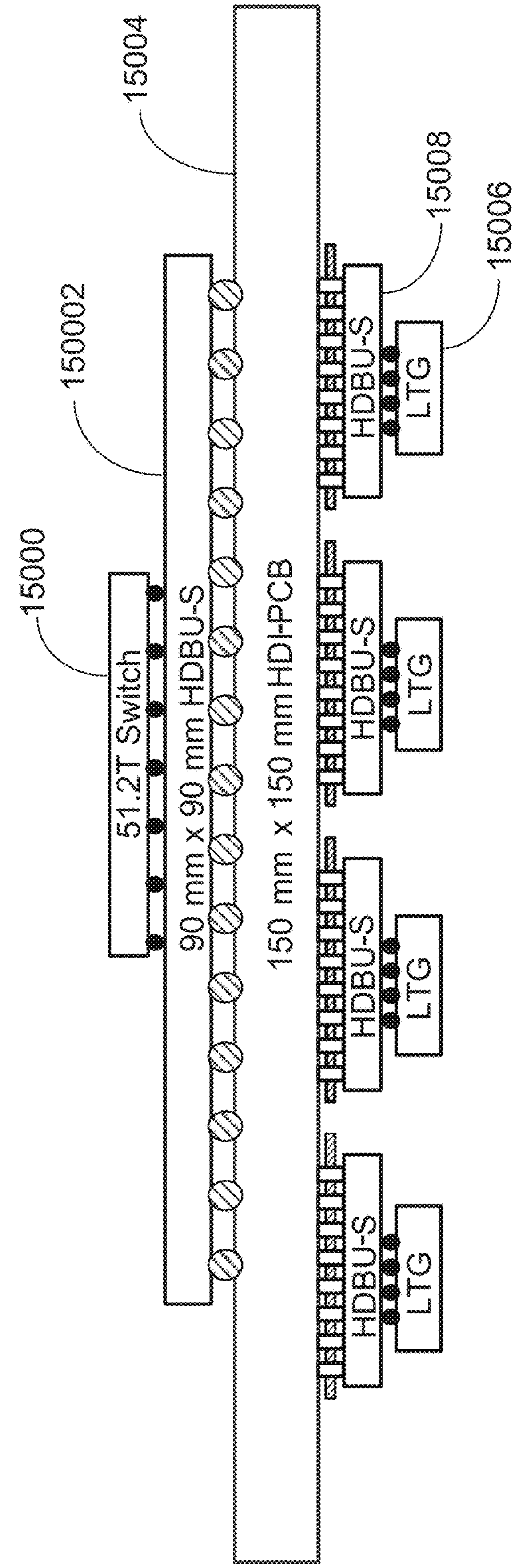

FIG. 150 is a diagram of an example of a configuration for connecting a data processing chip to CPO modules.

Figure 151:
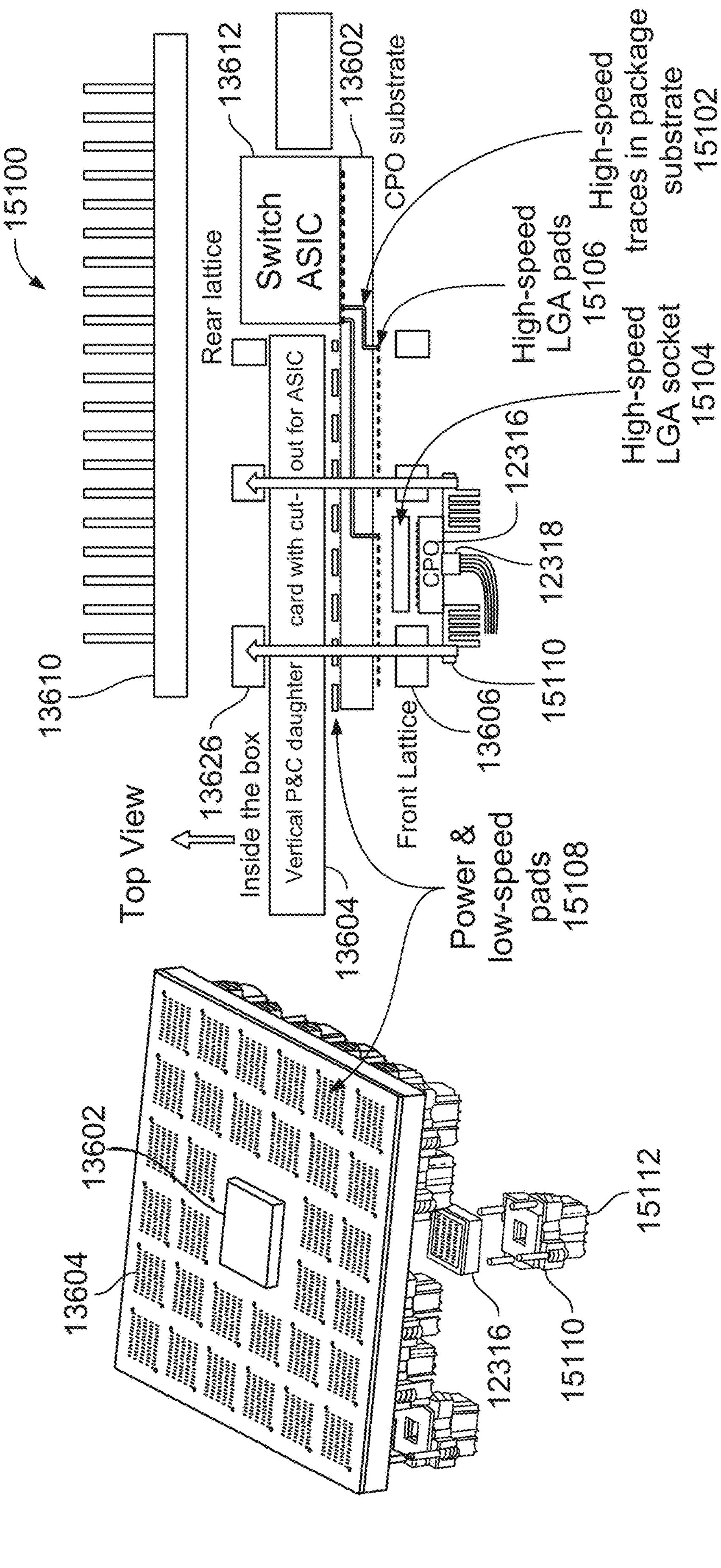
Figure 152:
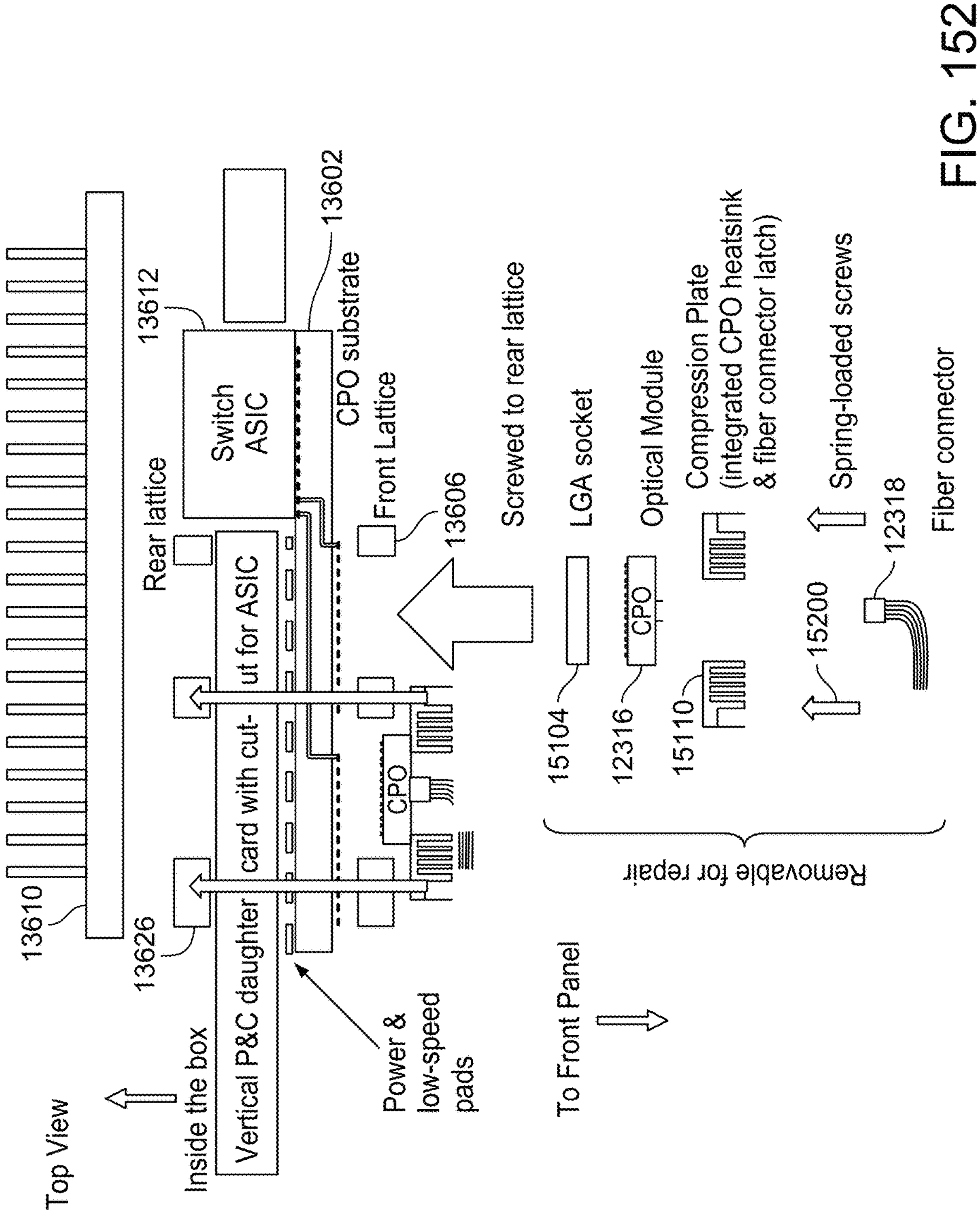
Figure 153:
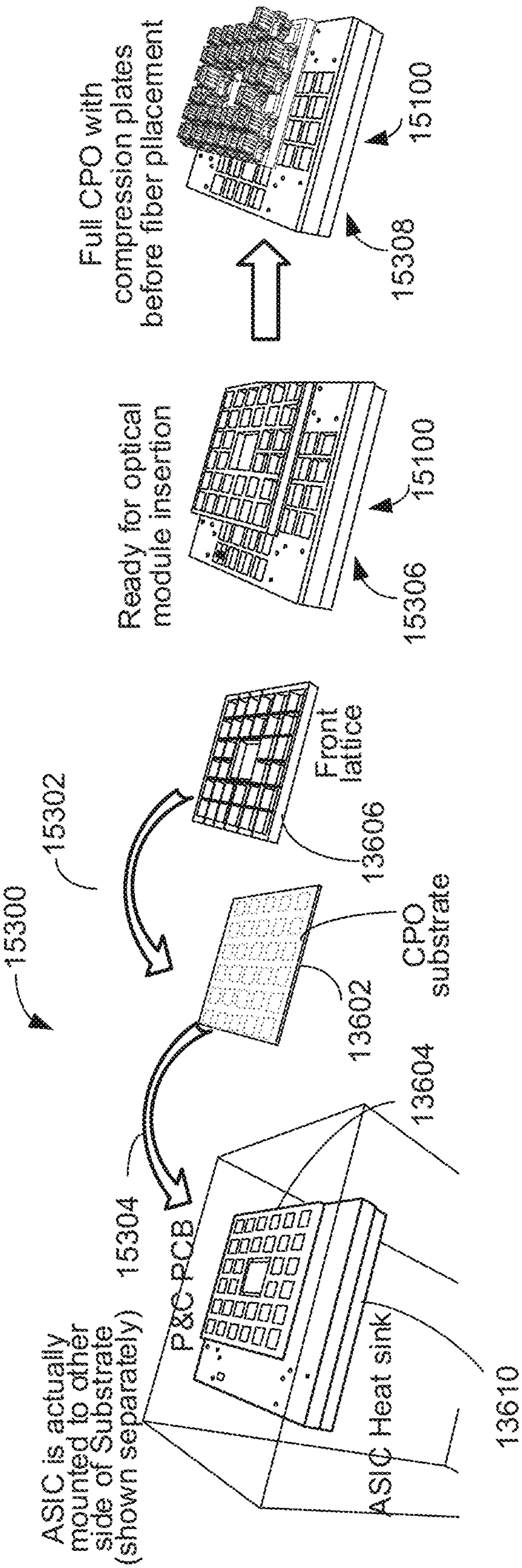

FIGS. 151 to 153 are diagrams of examples of an assembly in a rackmount system that includes a substrate, a printed circuit board, a front lattice structure, a rear lattice structure, and a heat dissipating device.

Figure 154:
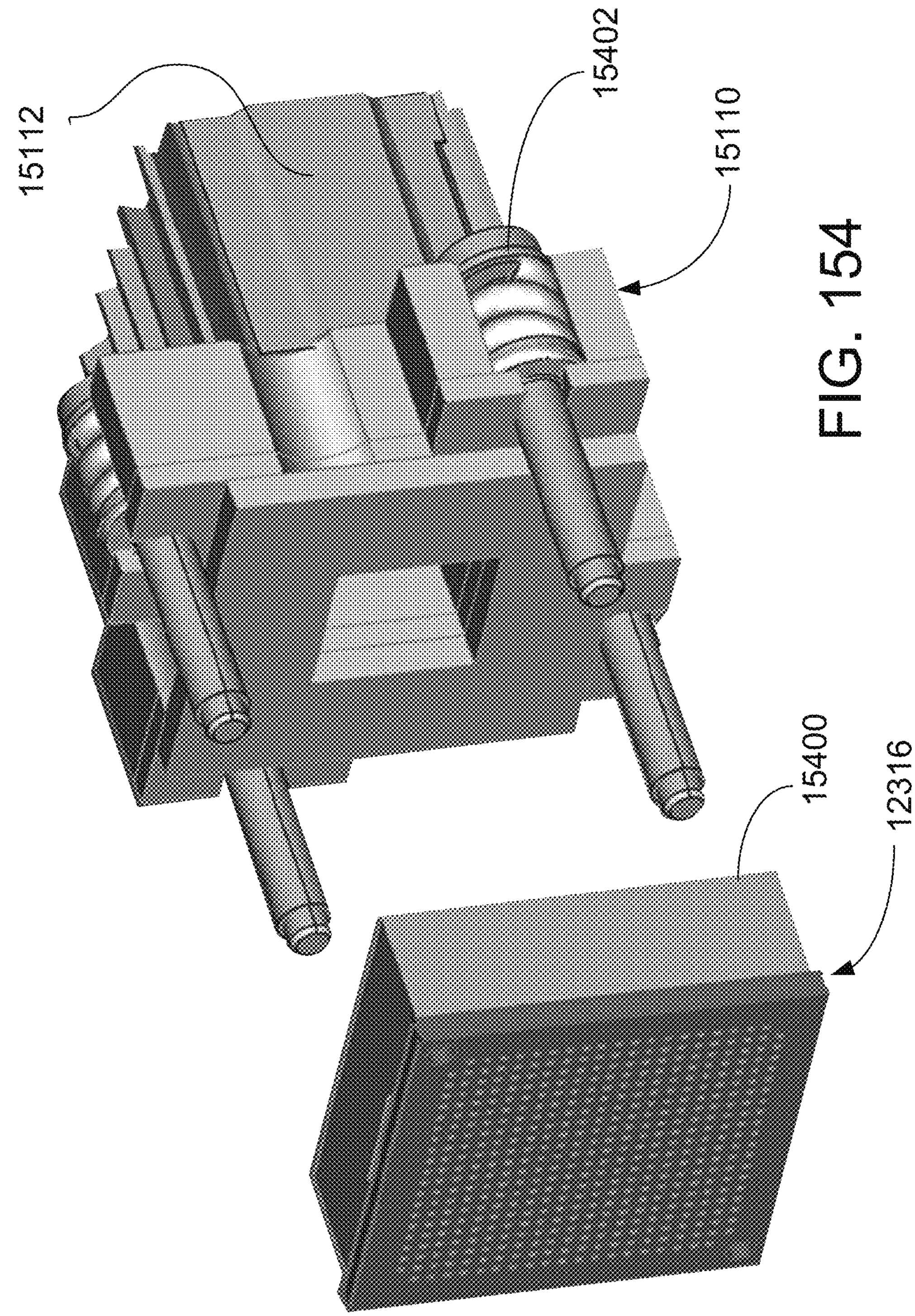

FIG. 154 is a diagram of an example of a CPO module.

Figures 155A, 155B:
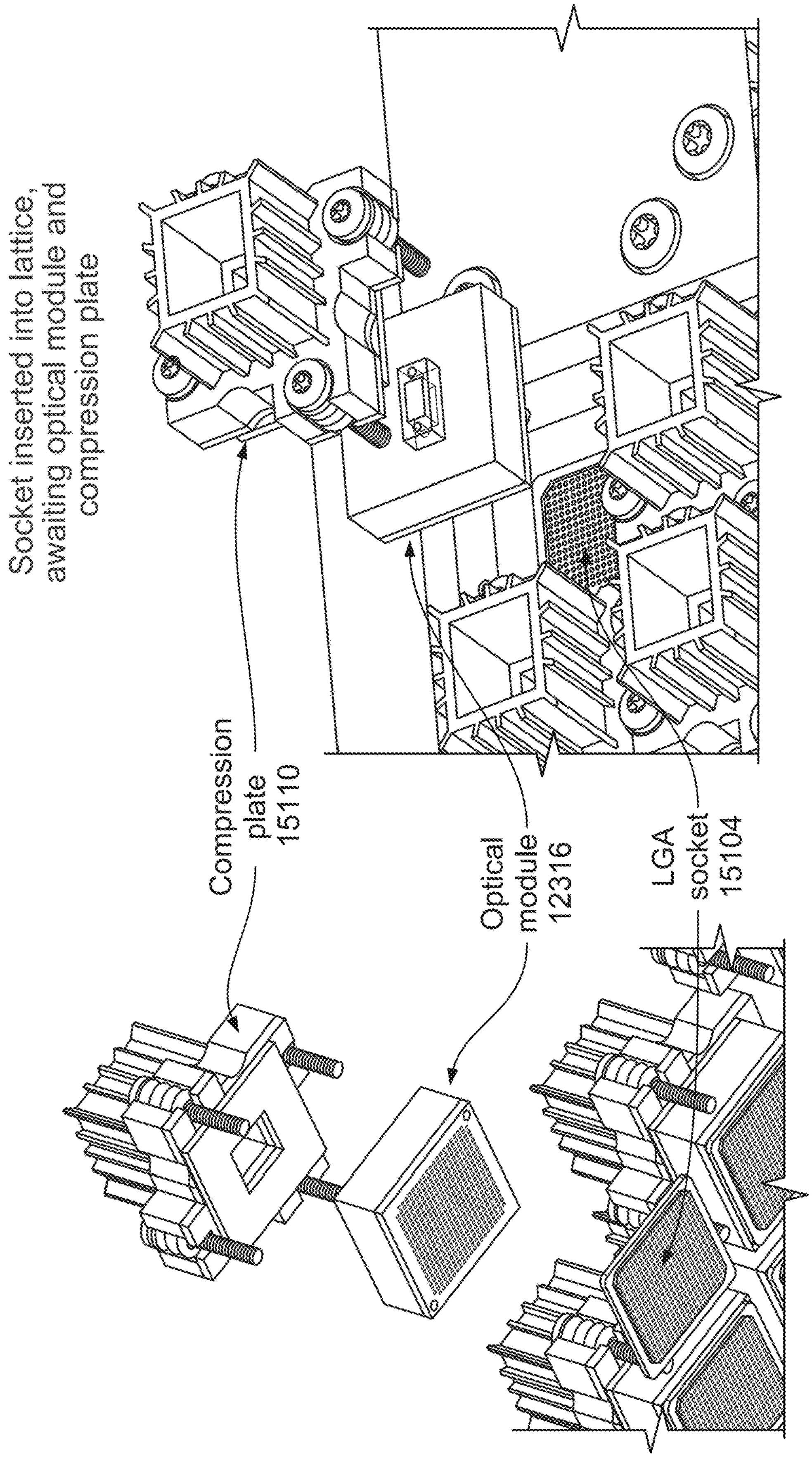

FIGS. 155A and 155B are perspective views of examples of LGA sockets, optical modules, and compression plates.

Figure 156:
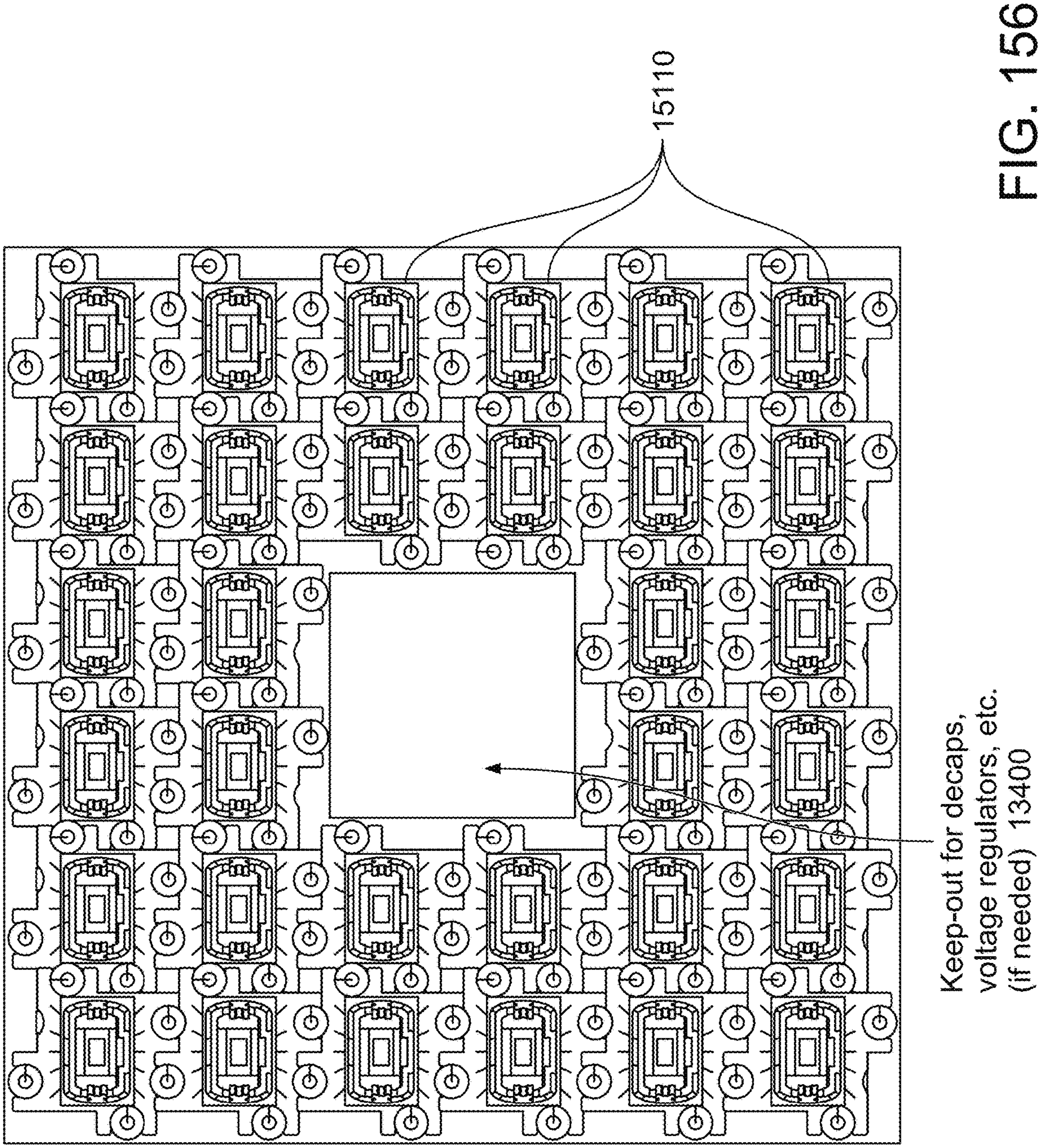

FIG. 156 is a front view of an example of an array of compression plates.

Figure 157:
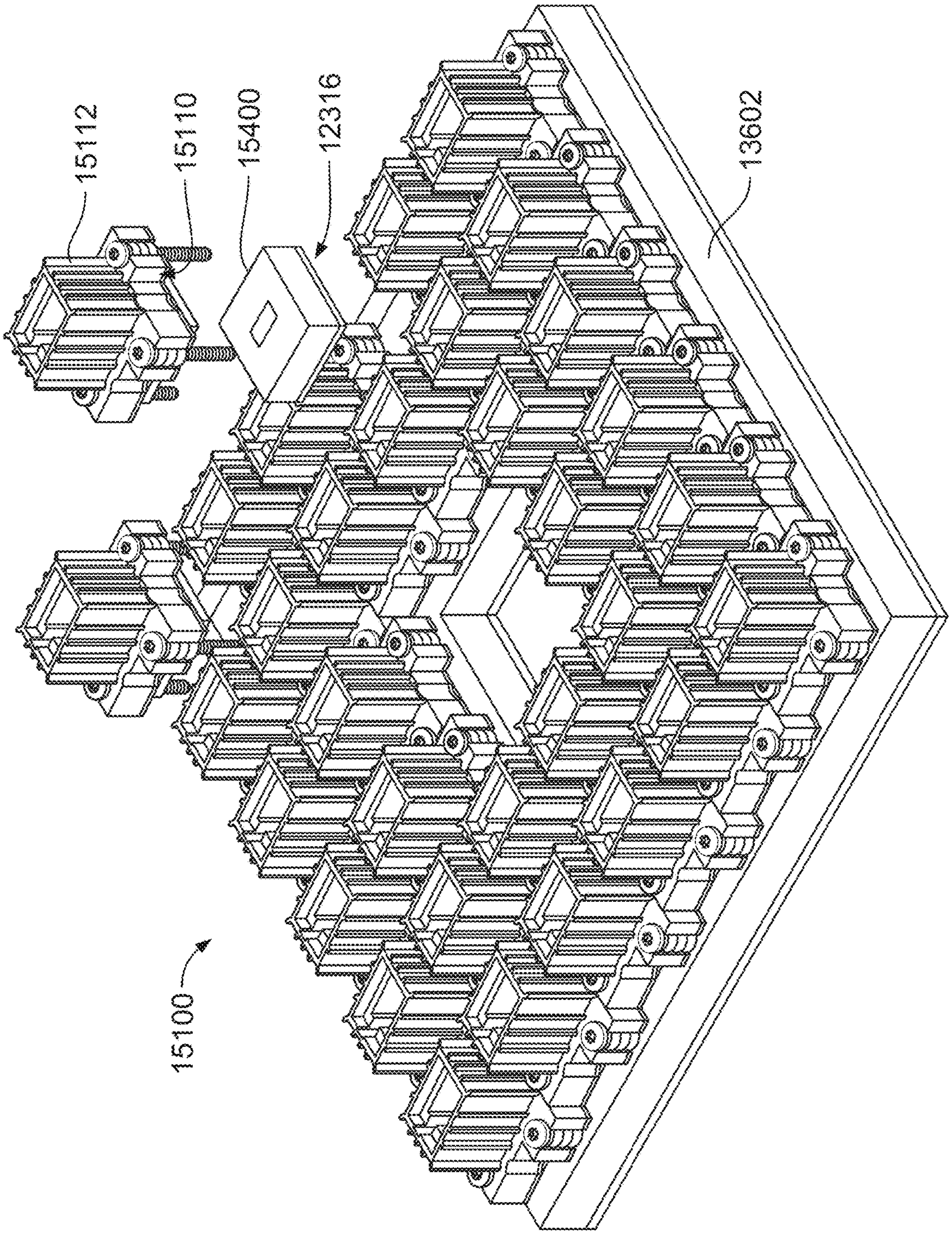

FIG. 157 is a front perspective view of an example of an assembly that includes a substrate, optical modules, and compression plates.

Figure 158:
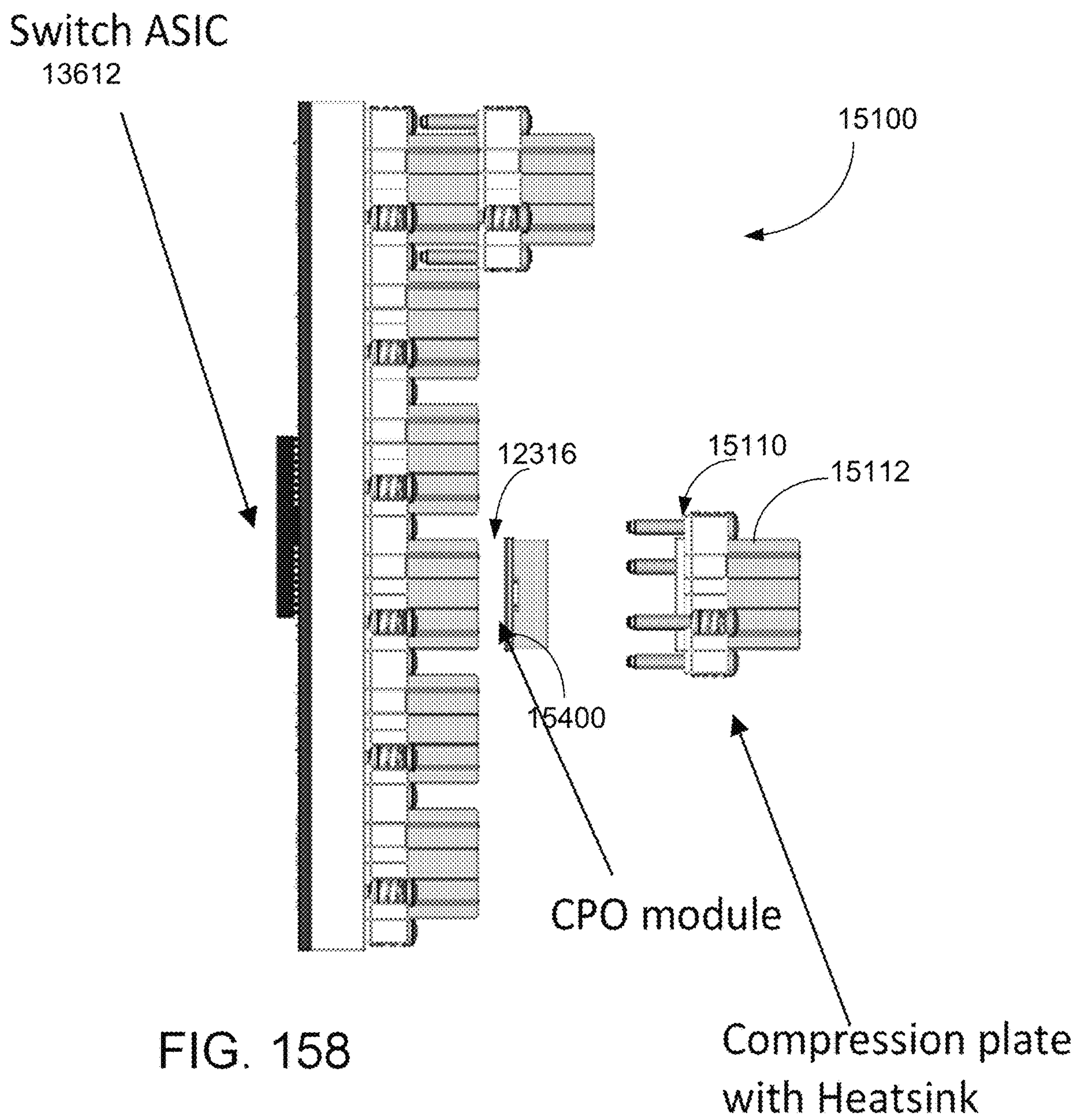

FIG. 158 is a top view of an example of an assembly that includes a substrate, a data processing integrated circuit, optical modules, and compression plates.

Figure 159:
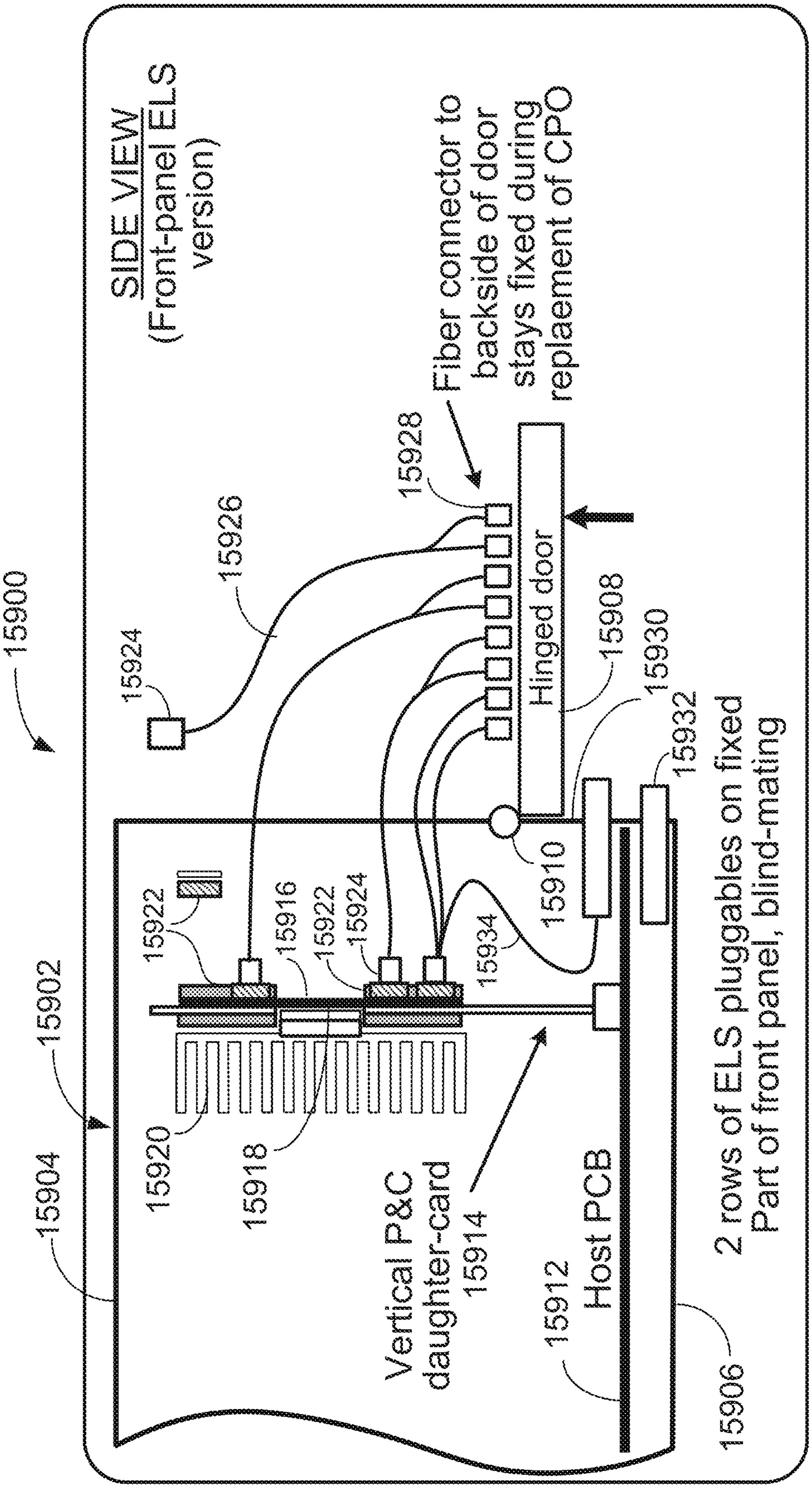

FIG. 159 is a side view of an example of a rackmount server that has a hinge-mounted front panel.

Figure 160:
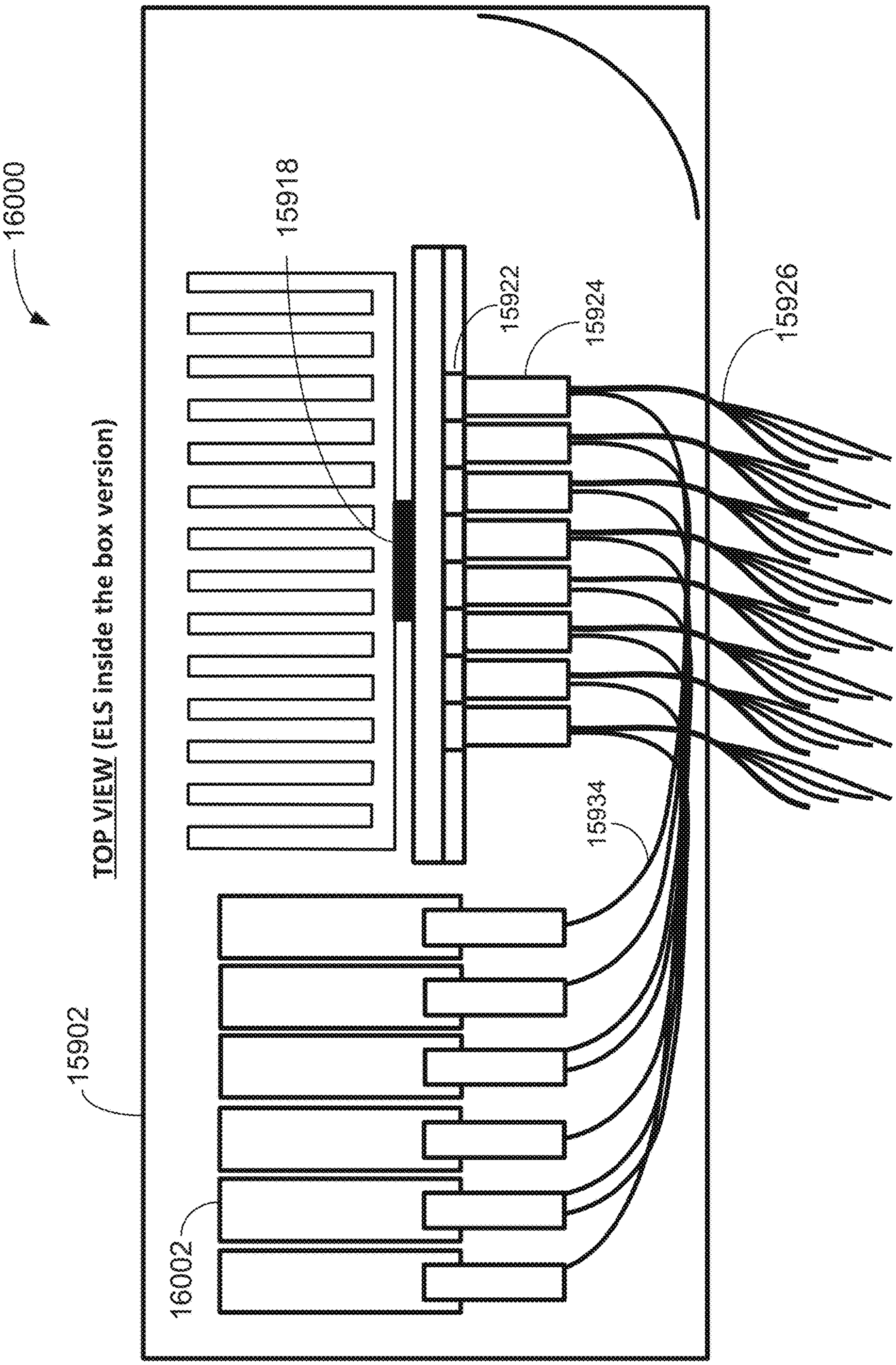

FIG. 160 is a top view of an example of a rackmount server that has a hinge-mounted front panel.

Figure 161:
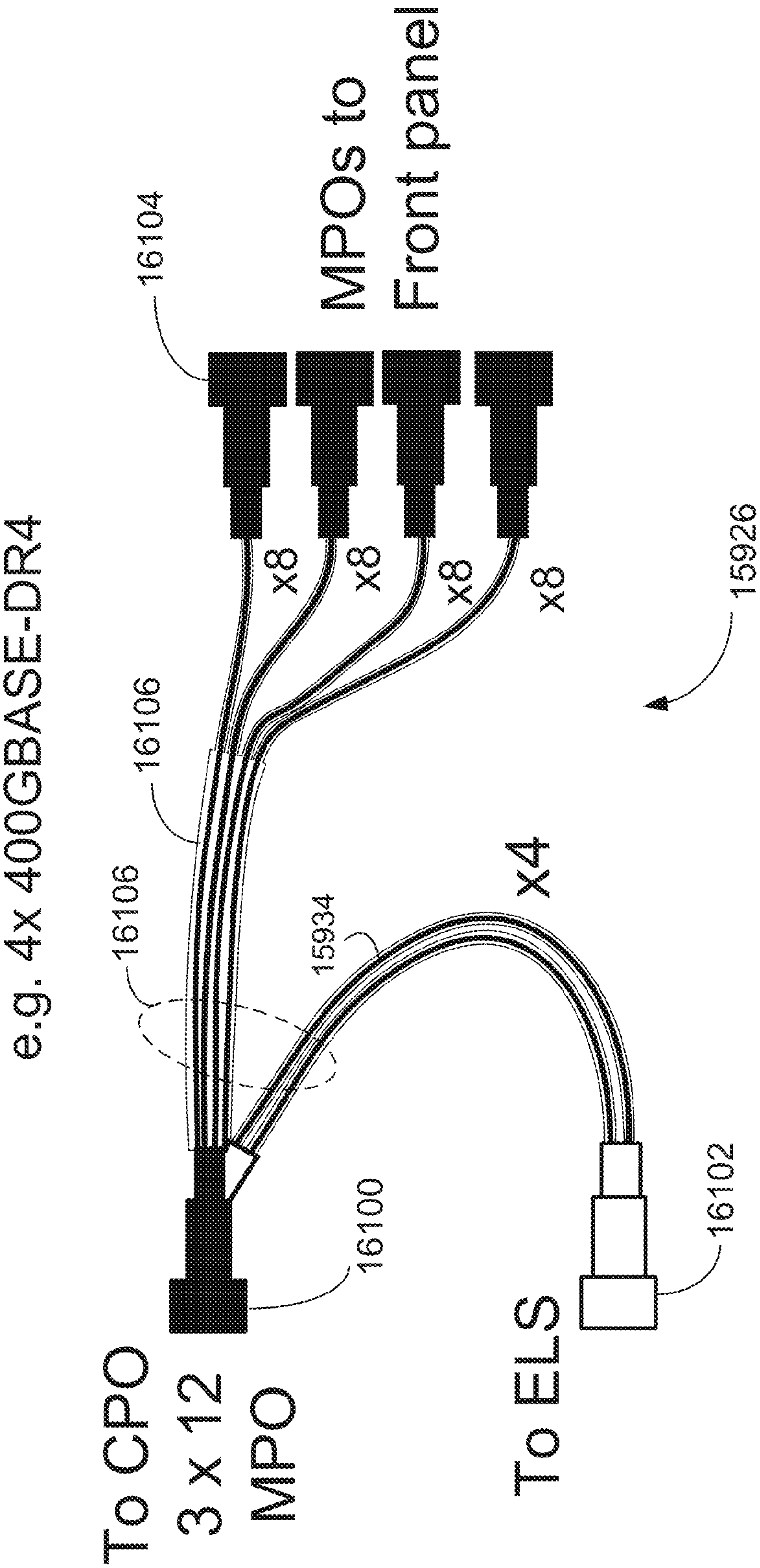

FIG. 161 is a diagram of an example of an optical cable.

FIGS. 162 to 166 are diagrams of examples of a system that can provide a large memory bank or memory pool.

FIGS. 167 to 171D are diagrams of examples of packaging configurations for compact co-packaged optical modules.

DETAILED DESCRIPTION

This document describes a novel system for high bandwidth data processing, including novel input/output interface modules for coupling bundles of optical fibers to data processing integrated circuits (e.g., network switches, central processing units, graphics processor units, tensor processing units, digital signal processors, and/or other application specific integrated circuits (ASICs)) that process the data transmitted through the optical fibers. In some implementations, the data processing integrated circuit is mounted on a circuit board positioned near the input/output interface module through a relatively short electrical signal path on the circuit board. The input/output interface module includes a first connector that allows a user to conveniently connect or disconnect the input/output interface module to or from the circuit board. The input/output interface module includes a second connector that allows the user to conveniently connect or disconnect the bundle of optical fibers to or from the input/output interface module. In some implementations, a rack mount system having a front panel is provided in which the circuit board (which supports the input/output interface modules and the data processing integrated circuits) is vertically mounted in an orientation substantially parallel to, and positioned near, the front panel. In some examples, the circuit board functions as the front panel or part of the front panel. The second connectors of the input/output interface modules face the front side of the rack mount system to allow the user to conveniently connect or disconnect bundles of optical fibers to or from the system.

In some implementations, a feature of the high bandwidth data processing system is that, by vertically mounting the circuit board that supports the input/output interface modules and the data processing integrated circuits to be near the front panel, or configuring the circuit board as the front panel or part of the front panel, the optical signals can be routed from the optical fibers through the input/output interface modules to the data processing integrated circuits through relatively short electrical signal paths. This allows the signals transmitted to the data processing integrated circuits to have a high bit rate (e.g., over 50 Gbps) while maintaining low crosstalk, distortion, and noise, hence reducing power consumption and footprint of the data processing system.

In some implementations, a feature of the high bandwidth data processing system is that the cost of maintenance and repair can be lower compared to traditional systems. For example, the input/output interface modules and the fiber optic cables are configured to be detachable, a defective input/output interface module can be replaced without taking apart the data processing system and without having to re-route any optical fiber. Another feature of the high bandwidth data processing system is that, because the user can easily connect or disconnect the bundles of the optical fibers to or from the input/output interface modules through the front panel of the rack mount system, the configurations for routing of high bit rate signals through the optical fibers to the various data processing integrated circuits is flexible and can easily be modified. For example, connecting a bundle of hundreds of strands of optical fibers to the optical connector of the rack mount system can be almost as simple as plugging a universal serial bus (USB) cable into a USB port. A further feature of the high bandwidth data processing system is that the input/output interface module can be made using relatively standard, low cost, and energy efficient components so that the initial hardware costs and subsequent operational costs of the input/output interface modules can be relatively low, compared to conventional systems.

In some implementations, optical interconnects can co-package and/or co-integrate optical transponders with electronic processing chips. It is useful to have transponder solutions that consume relatively low power and that are sufficiently robust against significant temperature variations as may be found within an electronic processing chip package. In some implementations, high speed and/or high bandwidth data processing systems can include massively spatially parallel optical interconnect solutions that multiplex information onto relatively few wavelengths and use a relatively large number of parallel spatial paths for chip-to-chip interconnection. For example, the relatively large number of parallel spatial paths can be arranged in two-dimensional arrays using connector structures such as those disclosed in U.S. patent application Ser. No. 16/816,171, filed on Mar. 11, 2020, now U.S. Pat. No. 11,287,585, and incorporated herein by reference in its entirety.

Figure 1:
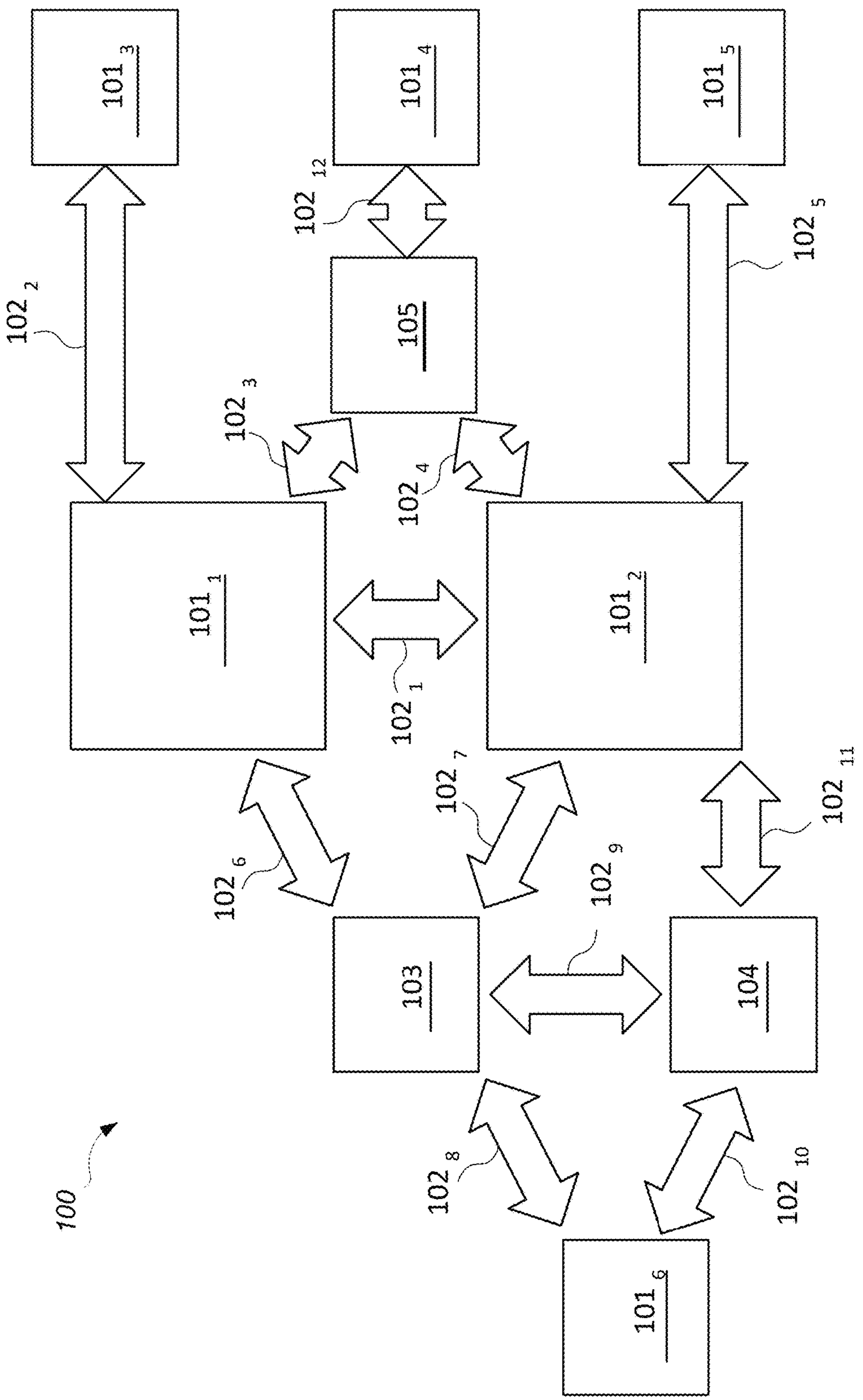
FIG. 1 is a block diagram of an example optical communication system.

FIG. 1 shows a block diagram of a communication system 100 that incorporates one or more novel features described in this document. In some implementations, the system 100 includes nodes 101_1 to 101_6 (collectively referenced as 101), which in some embodiments can each include one or more of: optical communication devices, electronic and/or optical switching devices, electronic and/or optical routing devices, network control devices, traffic control devices, synchronization devices, computing devices, and data storage devices. The nodes 101_1 to 101_6 can be suitably interconnected by optical fiber links 102_1 to 102_12 (collectively referenced as 102) establishing communication paths between the communication devices within the nodes. The optical fiber links 102 can include the fiber-optic cables described in U.S. patent application Ser. No. 16/822,103 filed on Mar. 18, 2020, now U.S. Pat. No. 11,194,109, and incorporated herein by reference in its entirety. The system 100 can also include one or more optical power supply modules 103 producing one or more light outputs, each light output comprising one or more continuous-wave (CW) optical fields and/or one or more trains of optical pulses for use in one or more of the optical communication devices of the nodes 101_1 to 101_6. For illustration purposes, only one such optical power supply module 103 is shown in FIG. 1. A person of ordinary skill in the art will understand that some embodiments can have more than one optical power supply module 103 appropriately distributed over the system 100 and that such multiple power supply modules can be synchronized, e.g., using some of the techniques disclosed in U.S. patent application Ser. No. 16/847,705 filed on Apr. 14, 2020, now U.S. Pat. No. 11,153,670, and incorporated herein by reference in its entirety.

Some end-to-end communication paths can pass through an optical power supply module 103 (e.g., see the communication path between the nodes 101_2 and 101_6). For example, the communication path between the nodes 101_2 and 101_6 can be jointly established by the optical fiber links 102_7 and 102_8, whereby light from the optical power supply module 103 is multiplexed onto the optical fiber links 102_7 and 102_8.

Some end-to-end communication paths can pass through one or more optical multiplexing units 104 (e.g., see the communication path between the nodes 101_2 and 101_6). For example, the communication path between the nodes 101_2 and 101_6 can be jointly established by the optical fiber links 102_10 and 102_11. Multiplexing unit 104 is also connected, through the link 102_9, to receive light from the optical power supply module 103 and, as such, can be operated to multiplex said received light onto the optical fiber links 102_10 and 102_11.

Some end-to-end communication paths can pass through one or more optical switching units 105 (e.g., see the communication path between the nodes 101_1 and 101_4). For example, the communication path between the nodes 101_1 and 101_4 can be jointly established by the optical fiber links 102_3 and 102_12, whereby light from the optical fiber links 102_3 and 102_4 is either statically or dynamically directed to the optical fiber link 102_12.

As used herein, the term "network element" refers to any element that generates, modulates, processes, or receives light within the system 100 for the purpose of communication. Example network elements include the node 101, the optical power supply module 103, the optical multiplexing unit 104, and the optical switching unit 105.

Some light distribution paths can pass through one or more network elements. For example, optical power supply module 103 can supply light to the node 101_4 through the optical fiber links 102_7, 102_4, and 102_12, letting the light pass through the network elements 101_2 and 105.

Various elements of the communication system 100 can benefit from the use of optical interconnects, which can use photonic integrated circuits comprising optoelectronic devices, co-packaged and/or co-integrated with electronic chips comprising integrated circuits.

As used herein, the term "photonic integrated circuit" (or PIC) should be construed to cover planar lightwave circuits (PLCs), integrated optoelectronic devices, wafer-scale products on substrates, individual photonic chips and dies, and hybrid devices. A substrate can be made of, e.g., one or more ceramic materials, or organic "high density build-up" (HDBU). Example material systems that can be used for manufacturing various photonic integrated circuits can include but are not limited to III-V semiconductor materials, silicon photonics, silica-on-silicon products, silica-glass-based planar lightwave circuits, polymer integration platforms, lithium niobate and derivatives, nonlinear optical materials, etc. Both packaged devices (e.g., wired-up and/or encapsulated chips) and unpackaged devices (e.g., dies) can be referred to as planar lightwave circuits.

Photonic integrated circuits are used for various applications in telecommunications, instrumentation, and signal-processing fields. In some implementations, a photonic integrated circuit uses optical waveguides to implement and/or interconnect various circuit components, such as for example, optical switches, couplers, routers, splitters, multiplexers/demultiplexers, filters, modulators, phase shifters, lasers, amplifiers, wavelength converters, optical-to-electrical (O/E) and electrical-to-optical (E/O) signal converters, etc. For example, a waveguide in a photonic integrated circuit can be an on-chip solid light conductor that guides light due to an index-of-refraction contrast between the waveguide's core and cladding. A photonic integrated circuit can include a planar substrate onto which optoelectronic devices are grown by an additive manufacturing process and/or into which optoelectronic devices are etched by a subtractive manufacturing processes, e.g., using a multi-step sequence of photolithographic and chemical processing steps.

In some implementations, an "optoelectronic device" can operate on both light and electrical currents (or voltages) and can include one or more of: (i) an electrically driven light source, such as a laser diode; (ii) an optical amplifier; (iii) an optical-to-electrical converter, such as a photodiode; and (iv) an optoelectronic component that can control the propagation and/or certain properties (e.g., amplitude, phase, polarization) of light, such as an optical modulator or a switch. The corresponding optoelectronic circuit can additionally include one or more optical elements and/or one or more electronic components that enable the use of the circuit's optoelectronic devices in a manner consistent with the circuit's intended function. Some optoelectronic devices can be implemented using one or more photonic integrated circuits.

As used herein, the term "integrated circuit" (IC) should be construed to encompass both a non-packaged die and a packaged die. In a typical integrated circuit-fabrication process, dies (chips) are produced in relatively large batches using wafers of silicon or other suitable material(s). Electrical and optical circuits can be gradually created on a wafer using a multi-step sequence of photolithographic and chemical processing steps. Each wafer is then cut ("diced") into many pieces (chips, dies), each containing a respective copy of the circuit that is being fabricated. Each individual die can be appropriately packaged prior to being incorporated into a larger circuit or be left non-packaged.

The term "hybrid circuit" can refer to a multi-component circuit constructed of multiple monolithic integrated circuits, and possibly some discrete circuit components, all attached to each other to be mountable on and electrically connectable to a common base, carrier, or substrate. A representative hybrid circuit can include (i) one or more packaged or non-packaged dies, with some or all of the dies including optical, optoelectronic, and/or semiconductor devices, and (ii) one or more optional discrete components, such as connectors, resistors, capacitors, and inductors. Electrical connections between the integrated circuits, dies, and discrete components can be formed, e.g., using patterned conducting (such as metal) layers, ball-grid arrays, solder bumps, wire bonds, etc. Electrical connections can also be removable, e.g., by using land-grid arrays and/or compression interposers. The individual integrated circuits can include any combination of one or more respective substrates, one or more redistribution layers (RDLs), one or more interposers, one or more laminate plates, etc.

In some embodiments, individual chips can be stacked. As used herein, the term "stack" refers to an orderly arrangement of packaged or non-packaged dies in which the main planes of the stacked dies are substantially parallel to each other. A stack can typically be mounted on a carrier in an orientation in which the main planes of the stacked dies are parallel to each other and/or to the main plane of the carrier.

A "main plane" of an object, such as a die, a photonic integrated circuit, a substrate, or an integrated circuit, is a plane parallel to a substantially planar surface thereof that has the largest sizes, e.g., length and width, among all exterior surfaces of the object. This substantially planar surface can be referred to as a main surface. The exterior surfaces of the object that have one relatively large size, e.g., length, and one relatively small size, e.g., height, are typically referred to as the edges of the object.

Figure 2:
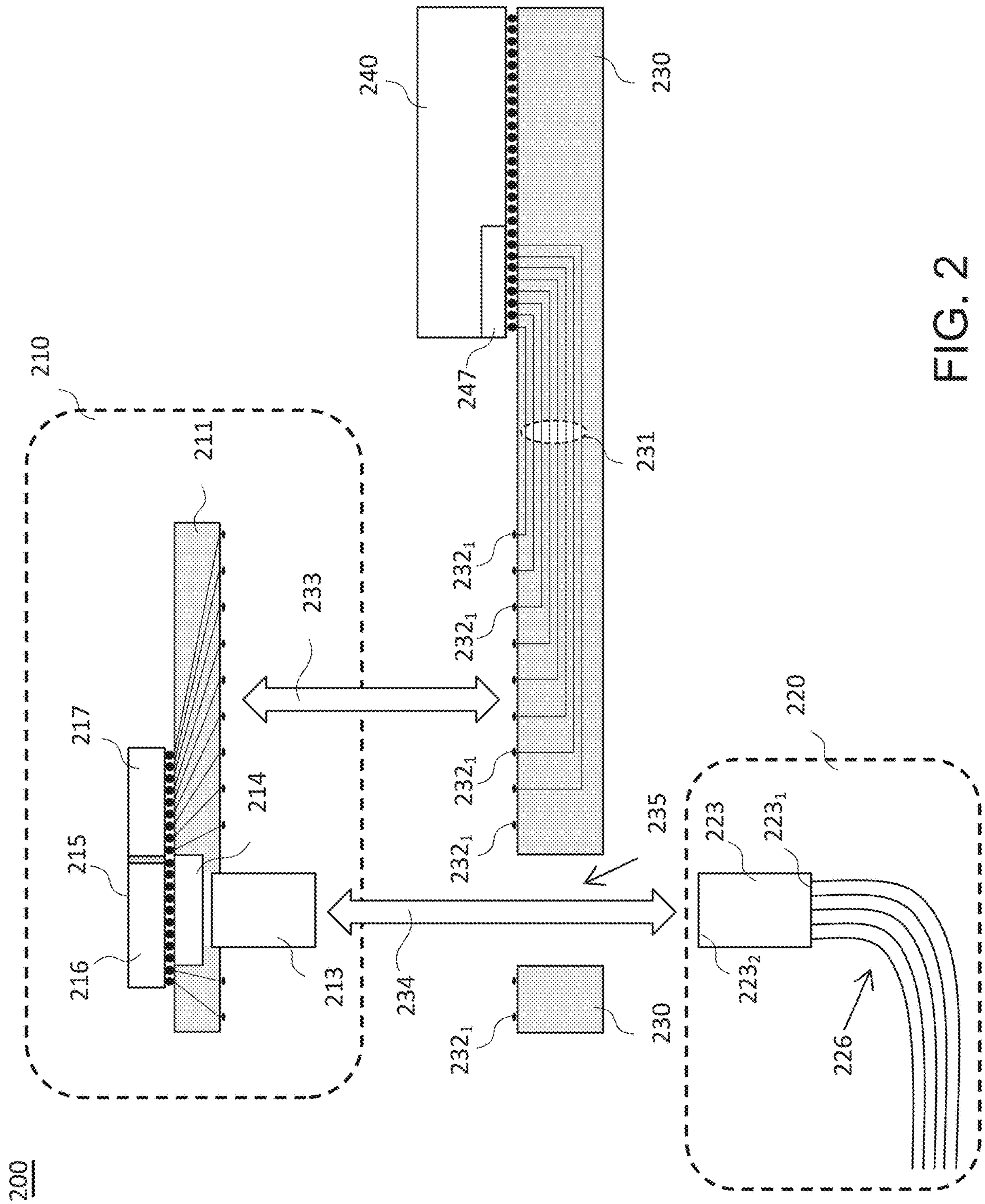
FIG. 2 is a schematic side view of an example data processing system.
Figure 3:
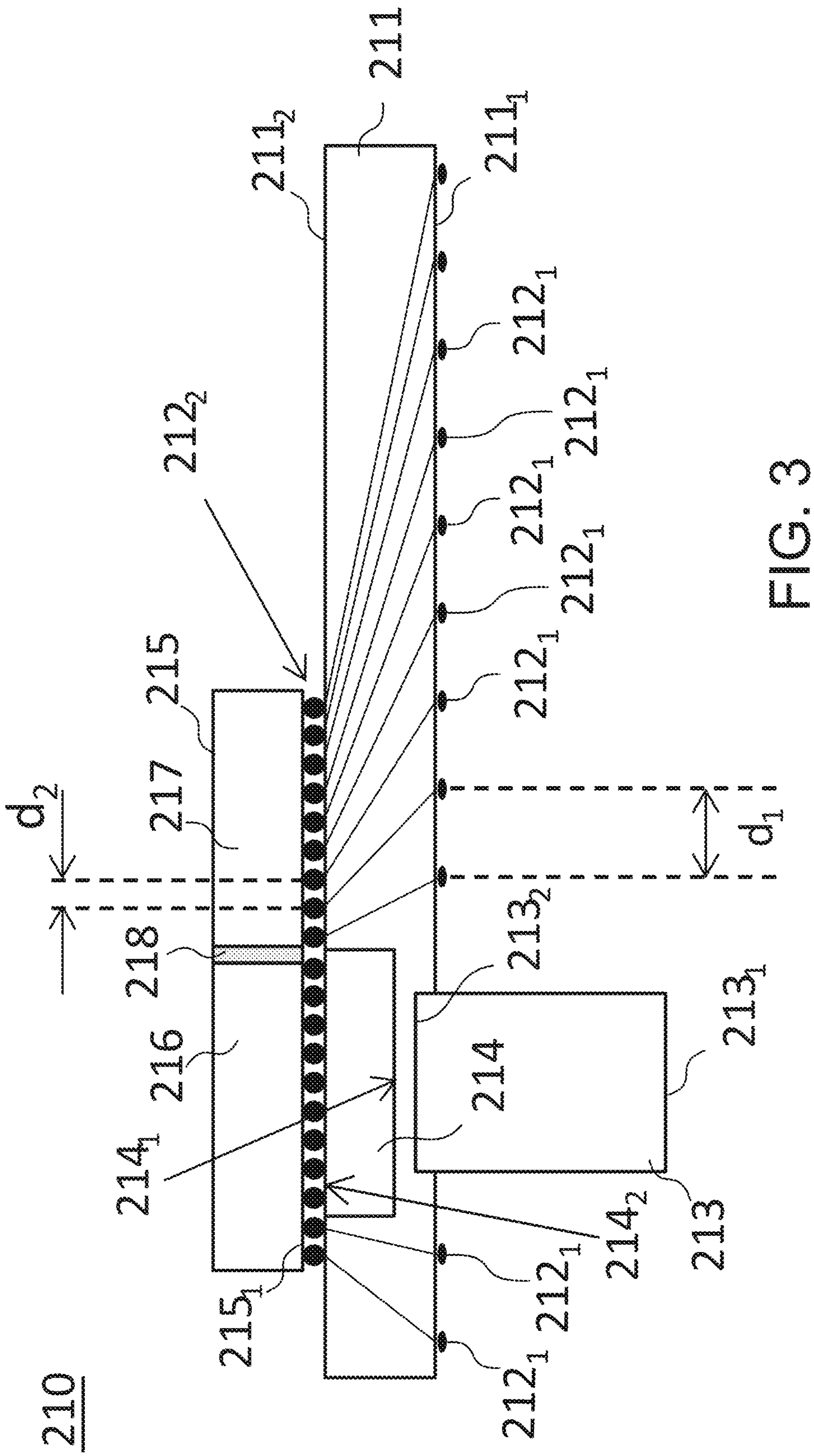
FIG. 3 is a schematic side view of an example integrated optical device.

FIG. 2 is a schematic cross-sectional diagram of a data processing system 200 that includes an integrated optical communication device 210 (also referred to as an optical interconnect module), a fiber-optic connector assembly 220, a package substrate 230, and an electronic processor integrated circuit 240. The data processing system 200 can be used to implement, e.g., one or more of devices 101_1 to 101_6 of FIG. 1. FIG. 3 shows an enlarged cross-sectional diagram of the integrated optical communication device 210.

Referring to FIGS. 2 and 3, the integrated optical communication device 210 includes a substrate 211 having a first main surface 211_1 and a second main surface 211_2. The main surfaces 211_1 and 211_2, respectively, include arrays of electrical contacts 212_1 and 212_2. In some embodiments, the minimum spacing $d_1$ between any two contacts within the array of contacts 212_1 is larger than the minimum spacing $d_2$ between any two contacts within the array of contacts 212_2. In some embodiments the minimum spacing between any two contacts within the array of contacts 212_2 is between 40 and 200 micrometers. In some embodiments, the minimum spacing between any two contacts within the array of contacts 212_1 is between 200 micrometers and 1 millimeter. At least some of the contacts 212_1 are electrically connected through the substrate 211 with at least some of the contacts 212_2. In some embodiments, the contacts 212_1 can be permanently attached to a corresponding array of electrical contacts 232_1 on the package substrate 230. In some embodiments, the contacts 212_1 can include mechanisms to allow the device 210 to be removably connected to the package substrate 230, as indicated by a double arrow 233. For example, the system can include mechanical mechanisms (e.g., one or more snap-on or screw-on mechanisms) to hold the various modules in place. In some embodiments, the contacts 212_1, 212_2, and/or 232_1 can include one or more of solder balls, metal pillars, and/or metal pads, etc. In some embodiments, the contacts 212_1, and/or 232_1 can include one or more of spring-loaded elements, compression interposers, and/or land-grid arrays.

In some embodiments, the integrated optical communication device 210 can be connected to the electronic processor integrated circuit 240 using traces 231 embedded in one or more layers of the package substrate 230. In some embodiments, the processor integrated circuit 240 can include monolithically embedded therein an array of serializers/deserializers (SerDes) 247 electrically coupled to the traces 231. In some embodiments, the processor integrated circuit 240 can include electronic switching circuitry, electronic routing circuitry, network control circuitry, traffic control circuitry, computing circuitry, synchronization circuitry, time stamping circuitry, and data storage circuitry. In some implementations, the processor integrated circuit 240 can be a network switch, a central processing unit, a graphics processor unit, a tensor processing unit, a digital signal processor, or an application specific integrated circuit (ASIC).

Because the electronic processor integrated circuit 240 and the integrated communication device 210 are both mounted on the package substrate 230, the electrical connectors or traces 231 can be made shorter, as compared to mounting the electronic processor integrated circuit 240 and the integrated communication device 210 on separate circuit boards. Shorter electrical connectors or traces 231 can transmit signals that have a higher data rate with lower noise, lower distortion, and/or lower crosstalk.

In some implementations, the electrical connectors or traces can be configured as differential pairs of transmission lines, e.g., in a ground-signal-ground-signal-ground configuration. In some examples, the speed of such signal links can be 10 Gbps or more; 56 Gbps or more; 112 Gbps or more; or 224 Gbps or more.

In some implementations, the integrated optical communication device 210 further includes a first optical connector part 213 having a first surface 213_1 and a second surface 213_2. The connector part 213 is configured to receive a second optical connector part 223 of the fiber-optic connector assembly 220, optically coupled to the connector part 213 through the surfaces 213_1 and 213_2. In some embodiments the connector part 213 can be removably attached to the connector part 223, as indicated by a double-arrow 234, e.g., through a hole 235 in the package substrate 230. In some embodiments the connector part 213 can be permanently attached to the connector part 223. In some embodiments, the connector parts 213 and 223 can be implemented as a single connector element combining the functions of both the connector parts 213 and 223.

In some implementations, the optical connector part 223 is attached to an array of optical fibers 226. In some embodiments, the array of optical fibers 226 can include one or more of: single-mode optical fiber, multi-mode optical fiber, multi-core optical fiber, polarization-maintaining optical fiber, dispersion-compensating optical fiber, hollow-core optical fiber, or photonic crystal fiber. In some embodiments, the array of optical fibers 226 can be a linear (1D) array. In some other embodiments, the array of optical fibers 226 can be a two-dimensional (2D) array. For example, the array of optical fibers 226 can include 2 or more optical fibers, 4 or more optical fibers, 10 or more optical fibers, 100 or more optical fibers, 500 or more optical fibers, or 1000 or more optical fibers. Each optical fiber can include, e.g., 2 or more cores, or 10 or more cores, in which each core provides a distinct light path. Each light path can include a multiplex of, e.g., 2 or more, 4 or more, 8 or more, or 16 or more serial optical signals, e.g., by use of wavelength division multiplexing channels, polarization-multiplexed channels, coherent quadrature-multiplexed channels. The connector parts 213 and 223 are configured to establish light paths through the first main surface 211_1 of the substrate 211. For example, the array of optical fibers 226 can includes n1 optical fibers, each optical fiber can include n2 cores, and the connector parts 213 and 223 can establish n1×n2 light paths through the first main surface 211_1 of the substrate 211. Each light path can include a multiplex of n3 serial optical signals, resulting in a total of n1×n2×n3 serial optical signals passing through the connector parts 213 and 223. In some embodiments, the connector parts 213 and 223 can be implemented, e.g., as disclosed in U.S. patent application Ser. No. 16/816,171, now U.S. Pat. No. 11,287,585.

In some implementations, the integrated optical communication device 210 further includes a photonic integrated circuit 214 having a first main surface 214_1 and a second main surface 214_2. The photonic integrated circuit 214 is optically coupled to the connector part 213 through its first main surface 214_1, e.g., as disclosed in in U.S. patent application Ser. No. 16/816,171, now U.S. Pat. No. 11,287,585. For example, the connector part 213 can be configured to optically couple light to the photonic integrated circuit 214 using optical coupling interfaces, e.g., vertical grating couplers or turning mirrors. In the example above, a total of n1×n2×n3 serial optical signals can be coupled through the connector parts 213 and 223 to the photonic integrated circuit 214. Each serial optical signal is converted to a serial electrical signal by the photonic integrated circuit 214, and each serial electrical signal is transmitted from the photonic integrated circuit 214 to a deserializer unit, or a serializer/deserializer unit, described below.

In some embodiments, the connector part 213 can be mechanically connected (e.g., glued) to the photonic integrated circuit 214. The photonic integrated circuit 214 can contain active and/or passive optical and/or opto-electronic components including optical modulators, optical detectors, optical phase shifters, optical power splitters, optical wavelength splitters, optical polarization splitters, optical filters, optical waveguides, or lasers. In some embodiments, the photonic integrated circuit 214 can further include monolithically integrated active or passive electronic elements such as resistors, capacitors, inductors, heaters, or transistors.

Figure 40A:
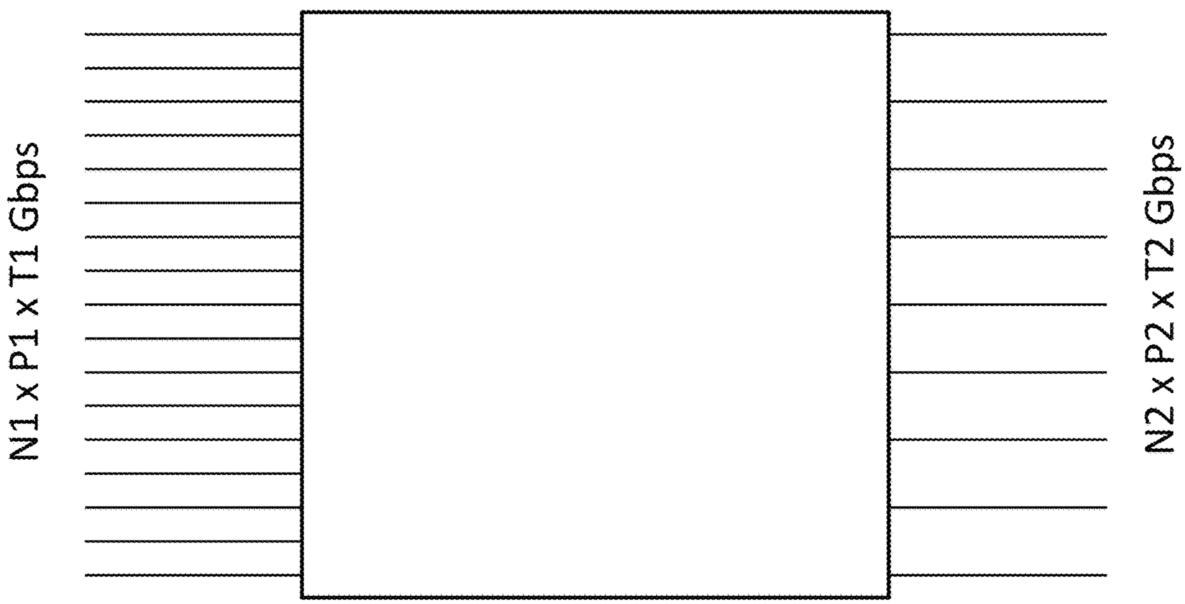
FIGS. 40A, 40B, 41A, 41B, and 42 are diagrams of examples of bus processing units.

In some implementations, the integrated optical communication device 210 further includes an electronic communication integrated circuit 215 configured to facilitate communication between the array of optical fibers 226 and the electronic processor integrated circuit 240. A first main surface 215_1 of the electronic communication integrated circuit 215 is electrically coupled to the second main surface 214_2 of the photonic integrated circuit 214, e.g., through solder bumps, copper pillars, etc. The first main surface 215_1 of the electronic communication integrated circuit 215 is further electrically connected to the second main surface 211_2 of the substrate 211 through the array of electrical contacts 212_2. In some embodiments, the electronic communication integrated circuit 215 can include electrical pre-amplifiers and/or electrical driver amplifiers electrically coupled, respectively, to photodetectors and modulators within the photonic integrated circuit 214 (see also FIG. 14). In some embodiments, the electronic communication integrated circuit 215 can include a first array of serializers/deserializers (SerDes) 216 (also referred to as a serializers/deserializers module) whose serial inputs/outputs are electrically connected to the photodetectors and the modulators of the photonic integrated circuit 214 and a second array of serializers/deserializers 217, whose serial inputs/outputs are electrically coupled to the contacts 212_1 through the substrate 211. Parallel inputs of the array of serializers/deserializers 216 can be connected to parallel outputs of the array of serializers/deserializers 217 and vice versa through a bus processing unit 218, which can be, e.g., a parallel bus of electrical lanes, a cross-connect device, or a re-mapping device (gearbox). For example, the bus processing unit 218 can be configured to enable switching of the signals, allowing the routing of signals to be re-mapped. For example, Nx 50 Gbps electrical lanes can be remapped into N/2×100 Gbps electrical lanes, N being a positive even integer. An example of a bus processing unit 218 is shown in FIG. 40A.

For example, the electronic communication integrated circuit 215 includes a first serializers/deserializers module that includes multiple serializer units and multiple deserializer units, and a second serializers/deserializers module that includes multiple serializer units and multiple deserializer units. The first serializers/deserializers module includes the first array of serializers/deserializers 216. The second serializers/deserializers module includes the second array of serializers/deserializers 217.

In some implementations, the first and second serializers/deserializers modules have hardwired functional units so that which units function as serializers and which units function as deserializers are fixed. In some implementations, the functional units can be configurable. For example, the first serializers/deserializers module is capable of operating as serializer units upon receipt of a first control signal, and operating as deserializer units upon receipt of a second control signal. Likewise, the second serializers/deserializers module is capable of operating as serializer units upon receipt of a first control signal, and operating as deserializer units upon receipt of a second control signal.

Signals can be transmitted between the optical fibers 226 and the electronic processor integrated circuit 240. For example, signals can be transmitted from the optical fibers 226 to the photonic integrated circuit 214, to the first array of serializers/deserializers 216, to the second array of serializers/deserializers 217, and to the electronic processor integrated circuit 240. Similarly, signals can be transmitted from the electronic processor integrated circuit 240 to the second array of serializers/deserializers 217, to the first array of serializers/deserializers 216, to the photonic integrated circuit 214, and to the optical fibers 226.

In some implementations, the electronic communication integrated circuit 215 is implemented as a first integrated circuit and a second integrated circuit that are electrically coupled each other. For example, the first integrated circuit includes the array of serializers/deserializers 216, and the second integrated circuit includes the array of serializers/deserializers 217.

In some implementations, the integrated optical communication device 210 is configured to receive optical signals from the array of optical fibers 226, generate electrical signals based on the optical signals, and transmit the electrical signals to the electronic processor integrated circuit 240 for processing. In some examples, the signals can also flow from the electronic processor integrated circuit 240 to the integrated optical communication device 210. For example, the electronic processor integrated circuit 240 can transmit electronic signals to the integrated optical communication device 210, which generates optical signals based on the received electronic signals, and transmits the optical signals to the array of optical fibers 226.

In some implementations, the photodetectors of the photonic integrated circuit 214 convert the optical signals transmitted in the optical fibers 226 to electrical signals. In some examples, the photonic integrated circuit 214 can include transimpedance amplifiers for amplifying the currents generated by the photodetectors, and drivers for driving output circuits (e.g., driving optical modulators). In some examples, the transimpedance amplifiers and drivers are integrated with the electronic communication integrated circuit 215. For example, the optical signal in each optical fiber 226 can be converted to one or more serial electrical signals. For example, one optical fiber can carry multiple signals by use of wavelength division multiplexing. The optical signals (and the serial electrical signals) can have a high data rate, such as 50 Gbps, 100 Gbps, or more. The first serializers/deserializers module 216 converts the serial electrical signals to sets of parallel electrical signals. For example, each serial electrical signal can be converted to a set of N parallel electrical signals, in which N can be, e.g., 2, 4, 8, 16, or more. The first serializers/deserializers module 216 conditions the serial electrical signals upon conversion into sets of parallel electrical signals, in which the signal conditioning can include, e.g., one or more of clock and data recovery, and signal equalization. The first serializers/deserializers module 216 sends the sets of parallel electrical signals to the second serializers/deserializers module 217 through the bus processing unit 218. The second serializers/deserializers module 217 converts the sets of parallel electrical signals to high speed serial electrical signals that are output to the electrical contacts 212_2 and 212_1.

Figure 40B:
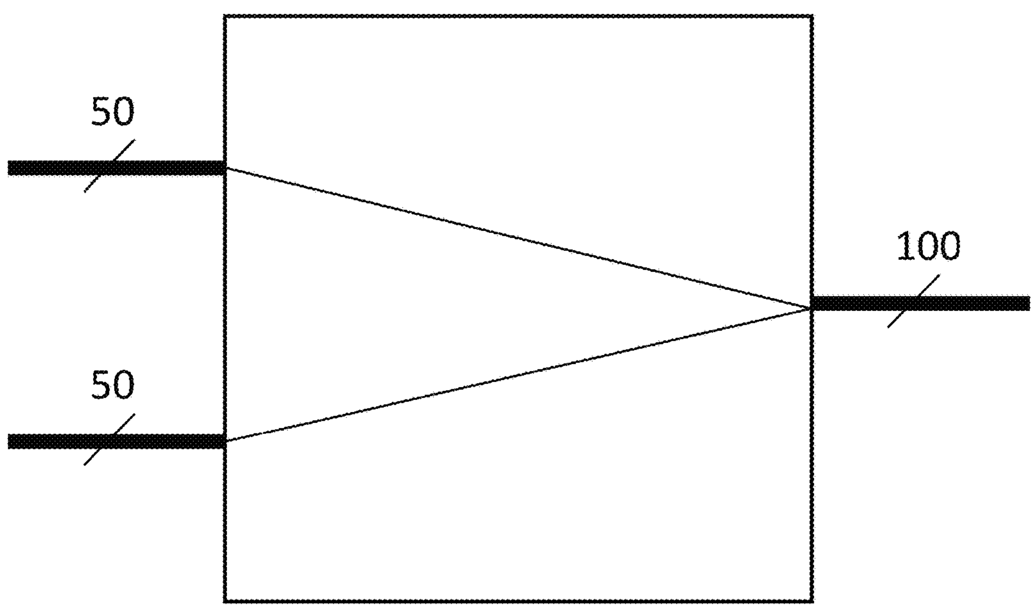

The serializers/deserializers module (e.g., 216, 217) can perform functions such as fixed or adaptive signal pre-distortion on the serialized signal. Also, the parallel-to-serial mapping can use a serialization factor M different from N, e.g., 50 Gbps at the input to the first serializers/deserializers module 216 can become 50×1 Gbps on a parallel bus, and two such parallel buses from two serializers/deserializers modules 216 having a total of 100×1 Gbps can then be mapped to a single 100 Gbps serial signal by the serializers/deserializers module 217. An example of the bus processing unit 218 for performing such mapping is shown in FIG. 40B. Also, the high-speed modulation on the serial side can be different, e.g., the serializers/deserializers module 216 can use 50 Gbps Non-Return-to-Zero (NRZ) modulation whereas the serializers/deserializers module 217 can use 100 Gbps Pulse-Amplitude Modulation 4-Level (PAM4) modulation. In some implementations, coding (line coding or error-correction coding) can be performed at the bus processing unit 218. The first and second serializers/deserializers modules 216 and 217 can be commercially available high quality, low power serializers/deserializers that can be purchased in bulk at a low cost.

In some implementations, the package substrate 230 can include connectors on the bottom side that connects the package substrate 230 to another circuit board, such as a motherboard. The connection can use, e.g., fixed (e.g., by use of solder connection) or removable (e.g., by use of one or more snap-on or screw-on mechanisms). In some examples, another substrate can be provided between the electronic processor integrated circuit 240 and the package substrate 230.

Figure 4:
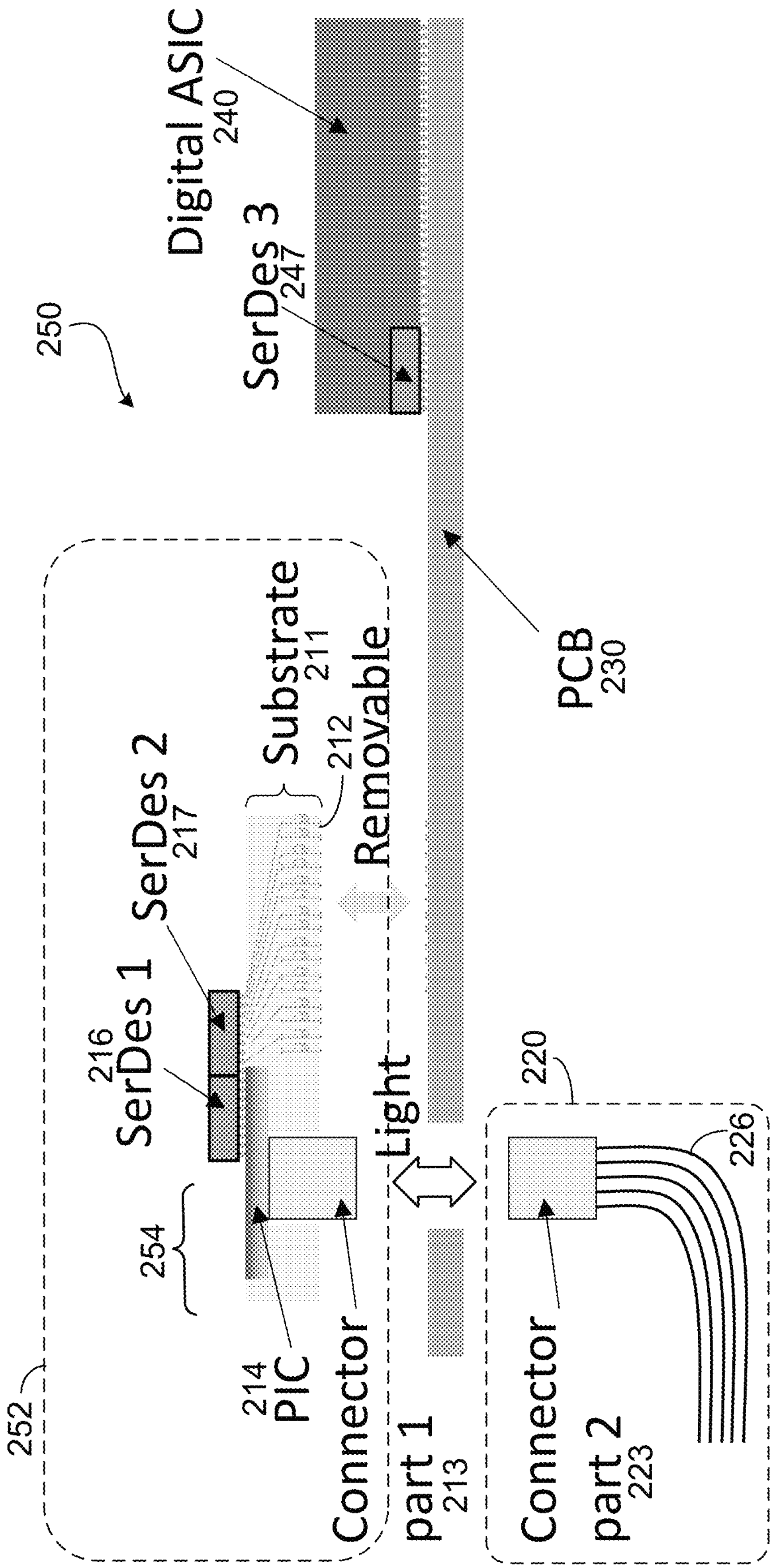
FIG. 4 is a schematic side view of an example data processing system.

Referring to FIG. 4, in some implementations, a data processing system 250 includes an integrated optical communication device 252 (also referred to as an optical interconnect module), a fiber-optic connector assembly 220, a package substrate 230, and an electronic processor integrated circuit 240. The data processing system 250 can be used, e.g., to implement one or more of devices 101_1 to 101_6 of FIG. 1. The integrated optical communication device 252 is configured to receive optical signals, generate electrical signals based on the optical signals, and transmit the electrical signals to the electronic processor integrated circuit 240 for processing. In some examples, the signals can also flow from the electronic processor integrated circuit 240 to the integrated optical communication device 252. For example, the electronic processor integrated circuit 240 can transmit electronic signals to the integrated optical communication device 252, which generates optical signals based on the received electronic signals, and transmits the optical signals to the array of optical fibers 226.

Figure 6:
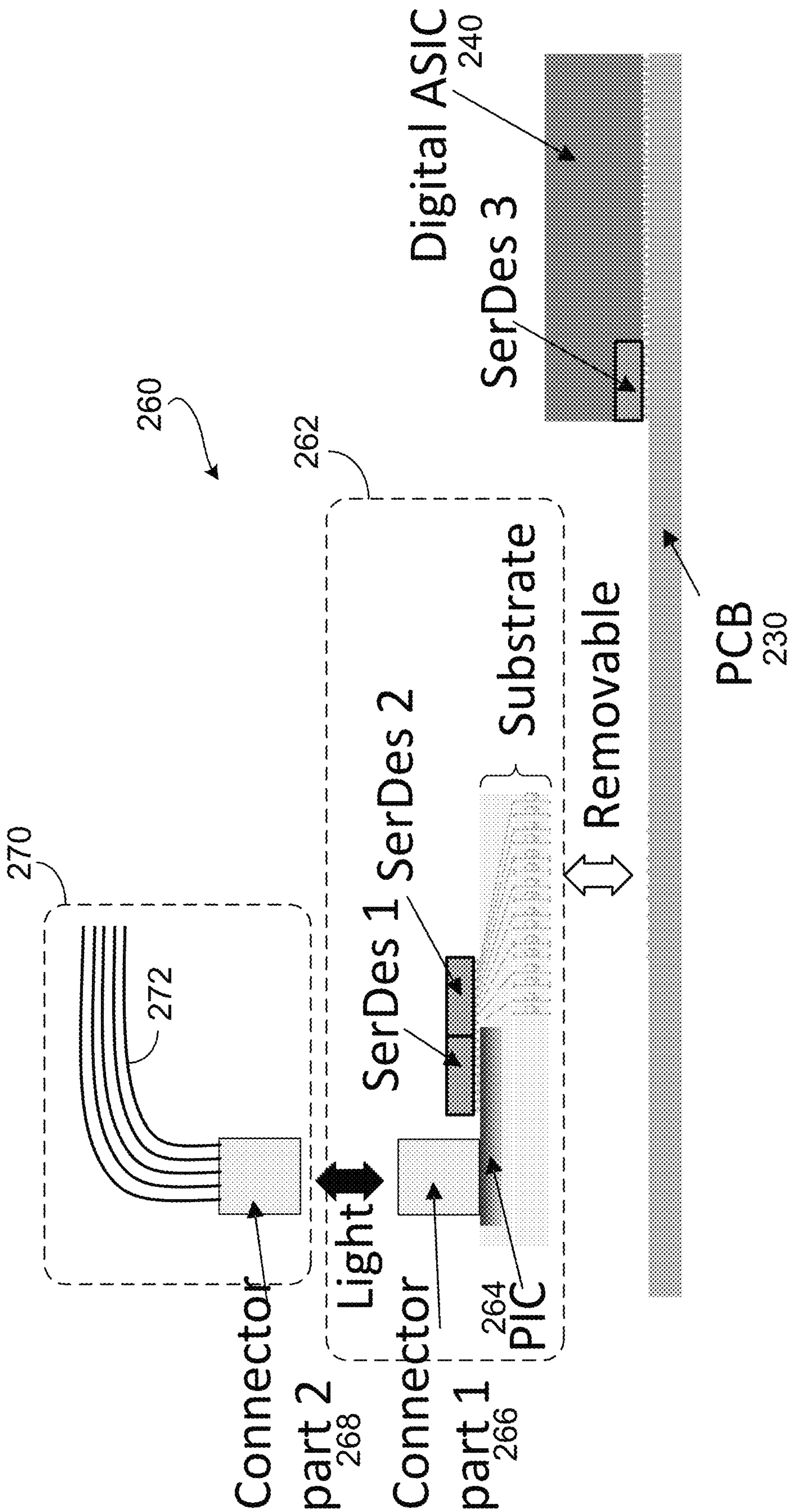
FIGS. 6 and 7 are schematic side views of examples of data processing systems.

The system 250 is similar to the data processing system 200 of FIG. 2 except that in the system 250, in the direction of the cross section of the figure, a portion 254 of the top surface of the photonic integrated circuit 214 is not covered by the first serializers/deserializers module 216 and the second serializers/deserializers module 217. For example, the portion 254 can be used to couple to other electronic components, optical components, or electro-optical components, either from the bottom (as shown in FIG. 4) or from the top (as shown in FIG. 6). In some examples, the first serializers/deserializers module 216 can have a high temperature during operation. The portion 254 is not covered by the first serializers/deserializers module 216 and can be less thermally coupled to the first serializers/deserializers module 216. In some examples, the photonic integrated circuit 214 can include modulators that modulate the phases of optical signals by modifying the temperature of waveguides and thereby modifying the refractive indices of the waveguides. In such devices, using the design shown in the example of FIG. 4 can allow the modulators to operate in a more thermally stable environment.

Figure 5:
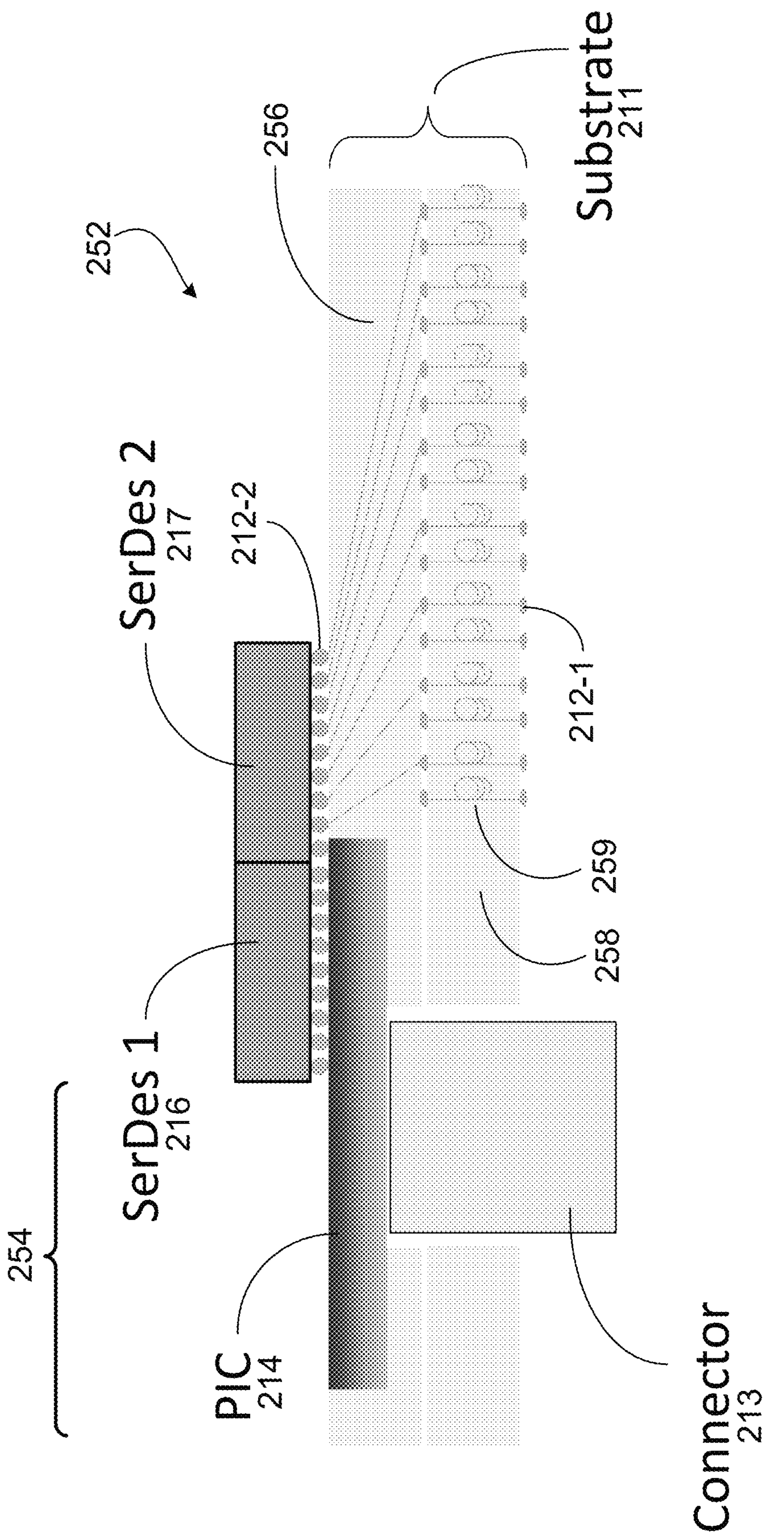
FIG. 5 is a schematic side view of an example integrated optical device.

FIG. 5 shows an enlarged cross-sectional diagram of the integrated optical communication device 252. In some implementations, the substrate 211 includes a first slab 256 and a second slab 258. The first slab 256 provides electrical connectors to fan out the electrical contacts, and the second slab 258 provides a removable connection to the package substrate 230. The first slab 256 includes a first set of contacts arranged on the top surface and a second set of contacts arranged on the bottom surface, in which the first set of contacts has a fine pitch and the second set of contacts has a coarse pitch. The minimum distance between contacts in the second set of contacts is greater than the minimum distance between contacts in the first set of contacts. The second slab 258 can include, e.g., spring-loaded contacts 259.

Referring to FIG. 6, in some implementations, a data processing system 260 includes an integrated optical communication device 262 (also referred to as an optical interconnect module), a fiber-optic connector assembly 270, a package substrate 230, and an electronic processor integrated circuit 240. The data processing system 260 can be used, e.g., to implement one or more of devices 101_1 to 101_6 of FIG. 1. The integrated optical communication device 262 includes a photonic integrated circuit 264. The photonic integrated circuit 264 can include components that perform functions similar to those of the photonic integrated circuit 214 of FIGS. 2-5. The integrated optical communication device 262 further includes a first optical connector part 266 that is configured to receive a second optical connector part 268 of the fiber-optic connector assembly 270. For example, snap-on or screw-on mechanisms can be used to hold the first and second optical connector parts 266 and 268 together.

The connector parts 266 and 268 can be similar to the connector parts 213 and 223, respectively, of FIG. 4. In some examples, the optical connector part 268 is attached to an array of optical fibers 272, which can be similar to the fibers 226 of FIG. 4.

The photonic integrated circuit 264 has a top main surface and bottom main surface. The terms "top" and "bottom" refer to the orientations shown in the figure. It is understood that the devices described in this document can be positioned in any orientation, so for example the "top surface" of a device can be oriented facing downwards or sideways, and the "bottom surface" of the device can be oriented facing upwards or sideways. A difference between the photonic integrated circuit 264 and the photonic integrated circuit 214 (FIG. 4) is that the photonic integrated circuit 264 is optically coupled to the connector part 268 through the top main surface, whereas the photonic integrated circuit 214 is optically coupled to the connector part 213 through the bottom main surface. For example, the connector part 266 can be configured to optically couple light to the photonic integrated circuit 214 using optical coupling interfaces, e.g., vertical grating couplers or turning mirrors, similar to the way that the connector part 213 optically couples light to the photonic integrated circuit 214.

The integrated optical communication devices 252 (FIG. 4) and 262 (FIG. 6) provide flexibility in the design of the data processing systems, allowing the fiber-optic connector assembly 220 or 270 to be positioned on either side of the package substrate 230.

Figure 7:
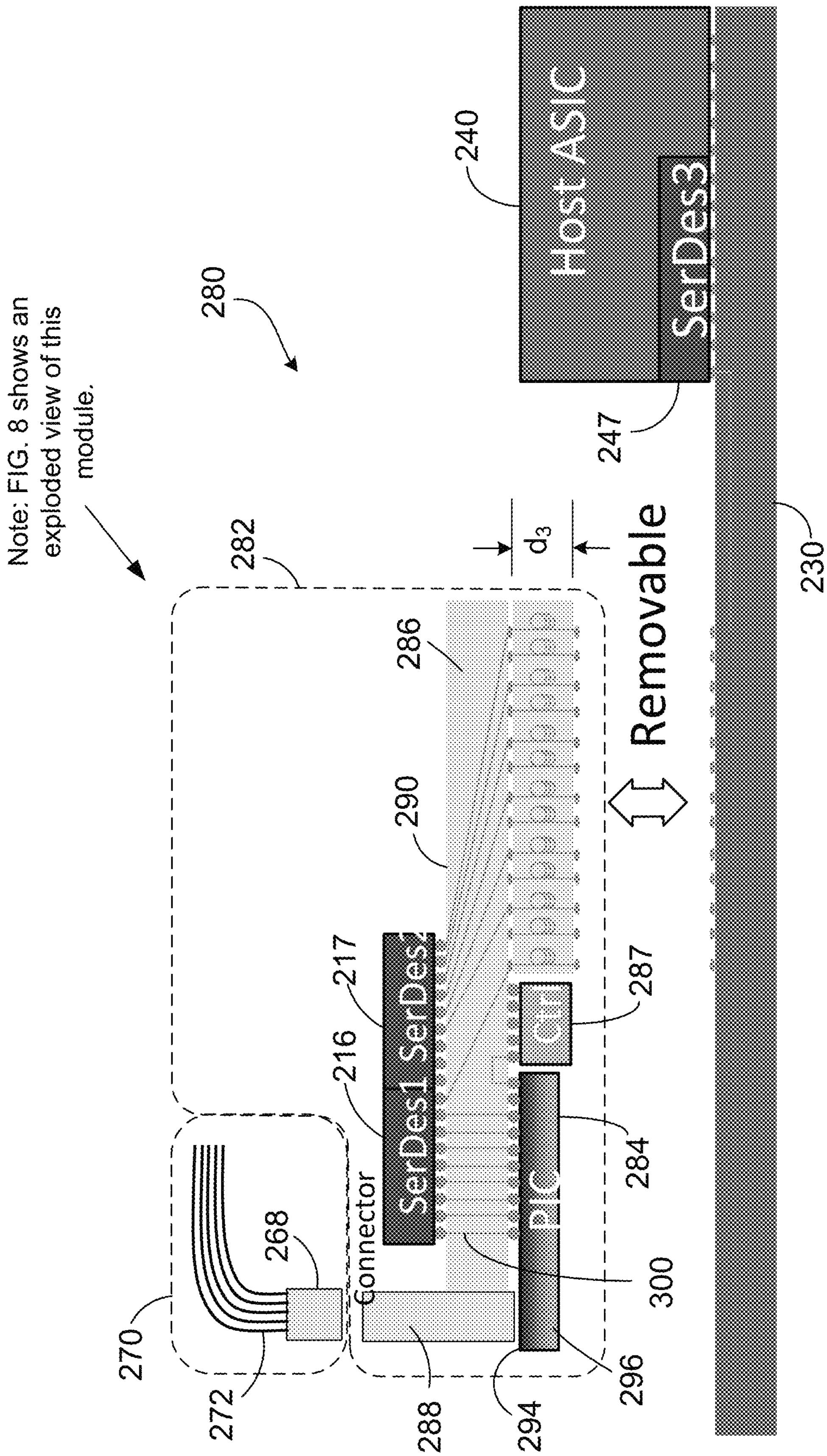

Referring to FIG. 7, in some implementations, a data processing system 280 includes an integrated optical communication device 282 (also referred to as an optical interconnect module), a fiber-optic connector assembly 270, a package substrate 230, and an electronic processor integrated circuit 240. The data processing system 280 can be used, e.g., to implement one or more of devices 101_1 to 101_6 of FIG. 1.

The integrated optical communication device 282 includes a photonic integrated circuit 284, a circuit board 286, a first serializers/deserializers module 216, a second serializers/deserializers module 217, and a control circuit 287. The photonic integrated circuit 284 can include components that perform functions similar to those of the photonic integrated circuit 214 (FIGS. 2-5) and 264 (FIG. 6). The control circuit 287 controls the operation of the photonic integrated circuit 284. For example, the control circuit 287 can control one or more photodetector and/or modulator bias voltages, heater voltages, etc., either statically or adaptively based on one or more sensor voltages that the control circuit 287 can receive from the photonic integrated circuit 284. The integrated optical communication device 282 further includes a first optical connector part 288 that is configured to receive a second optical connector part 268 of the fiber-optic connector assembly 270. The optical connector part 268 is attached to an array of optical fibers 272.

The circuit board 286 has a top main surface 290 and a bottom main surface 292. The photonic integrated circuit 284 has a top main surface 294 and bottom main surface 296. The first and second serializers/deserializers modules 216, 217 are mounted on the top main surface 290 of the circuit board 286. The top main surface 294 of the photonic integrated circuit 284 has electrical terminals that are electrically coupled to corresponding electrical terminals on the bottom main surface 292 of the circuit board 286. In this example, the photonic integrated circuit 284 is mounted on a side of the circuit board 286 that is opposite to the side of the circuit board 286 on which the first and second serializers/deserializers modules 216, 217 are mounted. The photonic integrated circuit 284 is electrically coupled to the first serializers/deserializers 216 by electrical connectors 300 that pass through the circuit board 286 in the thickness direction. In some embodiments, the electrical connectors 300 can be implemented as vias.

The connector part 288 has dimensions that are configured such that the fiber-optic connector assembly 270 can be coupled to the connector part 288 without bumping into other components of the integrated optical communication device 282. The connector part 288 can be configured to optically couple light to the photonic integrated circuit 284 using optical coupling interfaces, e.g., vertical grating couplers or turning mirrors, similar to the way that the connector part 213 or 266 optically couples light to the photonic integrated circuit 214 or 264, respectively.

When the integrated optical communication device 282 is coupled to the package substrate 230, the photonic integrated circuit 284 and the control circuit 287 are positioned between the circuit board 286 and the package substrate 230. The integrated optical communication device 282 includes an array of contacts 298 arranged on the bottom main surface 292 of the circuit board 286. The array of contacts 298 is configured such that after the circuit board 286 is coupled to the package substrate 230, the array of contacts 298 maintains a thickness d3 between the circuit board 286 and the package substrate 230, in which the thickness d3 is slightly larger than the thicknesses of the photonic integrated circuit 284 and the control circuit 287.

Figure 8:
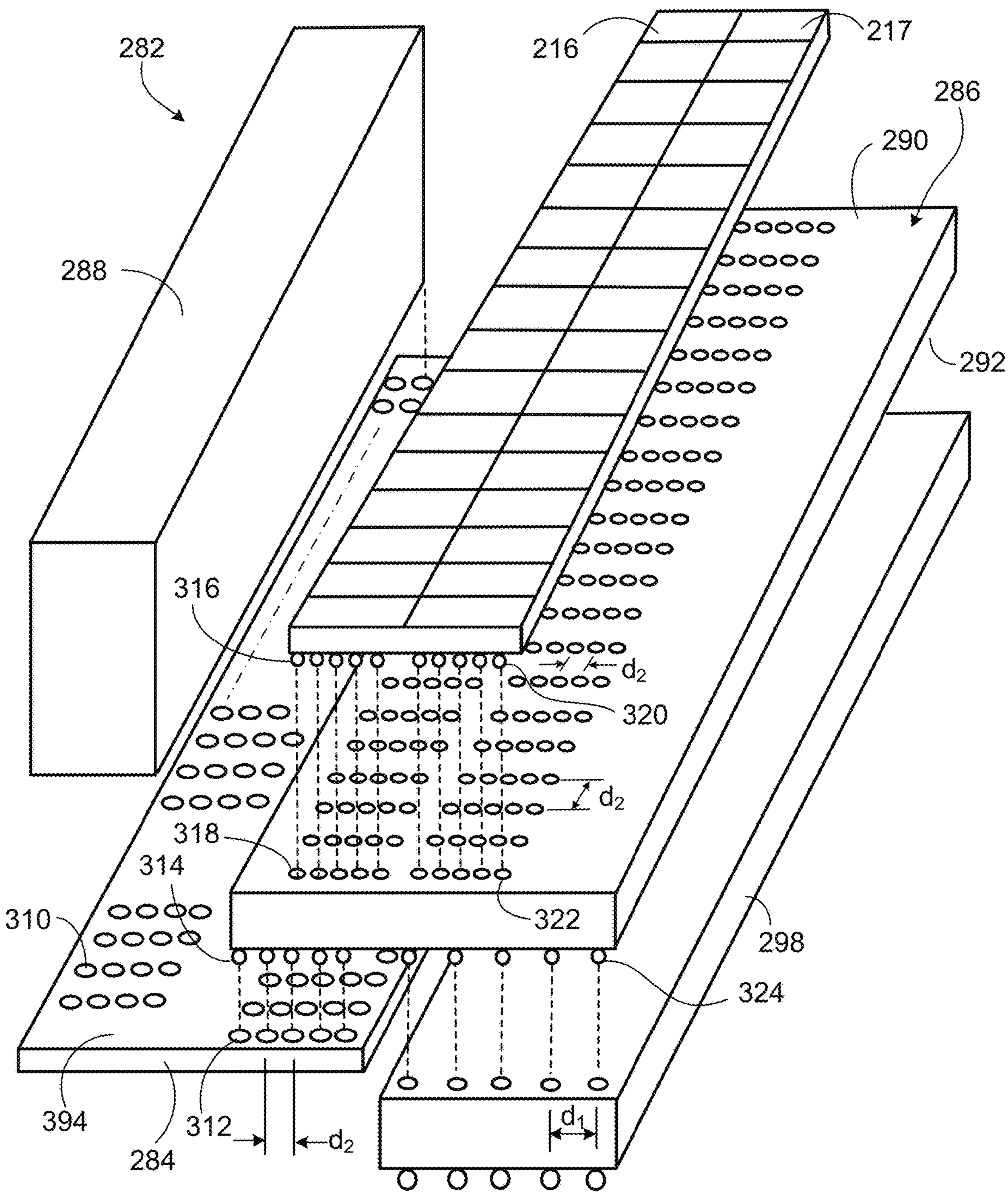
FIG. 8 is an exploded perspective view of an integrated optical communication device.

FIG. 8 is an exploded perspective view of the integrated optical communication device 282 of FIG. 7. The photonic integrated circuit 284 includes an array of optical coupling components 310, e.g., vertical grating couplers or turning mirrors, as disclosed in U.S. patent application Ser. No. 16/816,171, now U.S. Pat. No. 11,287,585, that are configured to optically couple light from the optical connector part 288 to the photonic integrated circuit 214. The optical coupling components 310 are densely packed and have a fine pitch so that optical signals from many optical fibers can be coupled to the photonic integrated circuit 284. For example, the minimum distance between adjacent optical coupling components 310 can be as small as, e.g., 5 μm, 10 μm, 50 μm, or 100 μm.

An array of electrical terminals 312 arranged on the top main surface 294 of the photonic integrated circuit 284 are electrically coupled to an array of electrical terminals 314 arranged on the bottom main surface 292 of the circuit board 286. The array of electrical terminals 312 and the array of electrical terminals 314 have a fine pitch, in which the minimum distance between two adjacent electrical terminals can be as small as, e.g., 10 μm, 40 μm, or 100 μm. An array of electrical terminals 316 arranged on the bottom main surface of the first serializers/deserializers 216 are electrically coupled to an array of electrical terminals 318 arranged on the top main surface 290 of the circuit board 286. An array of electrical terminals 320 arranged on the bottom main surface of the second serializers/deserializers module 217 are electrically coupled an array of electrical terminals 322 arranged on the top main surface 290 of the circuit board 286.

For example, the arrays of electrical terminals 312, 314, 316, 318, 320, and 322 have a fine pitch (or fine pitches). For simplicity of description, in the example of FIG. 8, for each of the arrays of electrical terminals 312, 314, 316, 318, 320, and 322, the minimum distance between adjacent terminals is d2, which can be in the range of, e.g., 10 μm to 200 μm. In some examples, the minimum distance between adjacent terminals for different arrays of electrical terminals can be different. For example, the minimum distance between adjacent terminals for the arrays of electrical terminals 314 (which are arranged on the bottom surface of the circuit board 286) can be different from the minimum distance between adjacent terminals for the arrays of electrical terminals 318 arranged on the top surface of the circuit board 286. The minimum distance between adjacent terminals for the arrays of electrical terminals 316 of the first serializers/deserializers 216 can be different from the minimum distance between adjacent terminals for the arrays of electrical terminals 320 of the second serializers/deserializers module 217.

An array of electrical terminals 324 arranged on the bottom main surface of the circuit board 286 are electrically coupled to the array of contacts 298. The array of electrical terminals 324 can have a coarse pitch. For example, the minimum distance between adjacent electrical terminals is d1, which can be in the range of, e.g., 200 μm to 1 mm. The array of contacts 298 can be configured as a module that maintains a distance that is slightly larger than the thicknesses of the photonic integrated circuit 284 and the control circuit 287 (which is not shown in FIG. 8) between the integrated optical communication device 282 and the package substrate 230 after the integrated optical communication device 282 is coupled to the package substrate 230. The array of contacts 298 can include, e.g., a substrate that has embedded spring loaded connectors.

Figure 9:
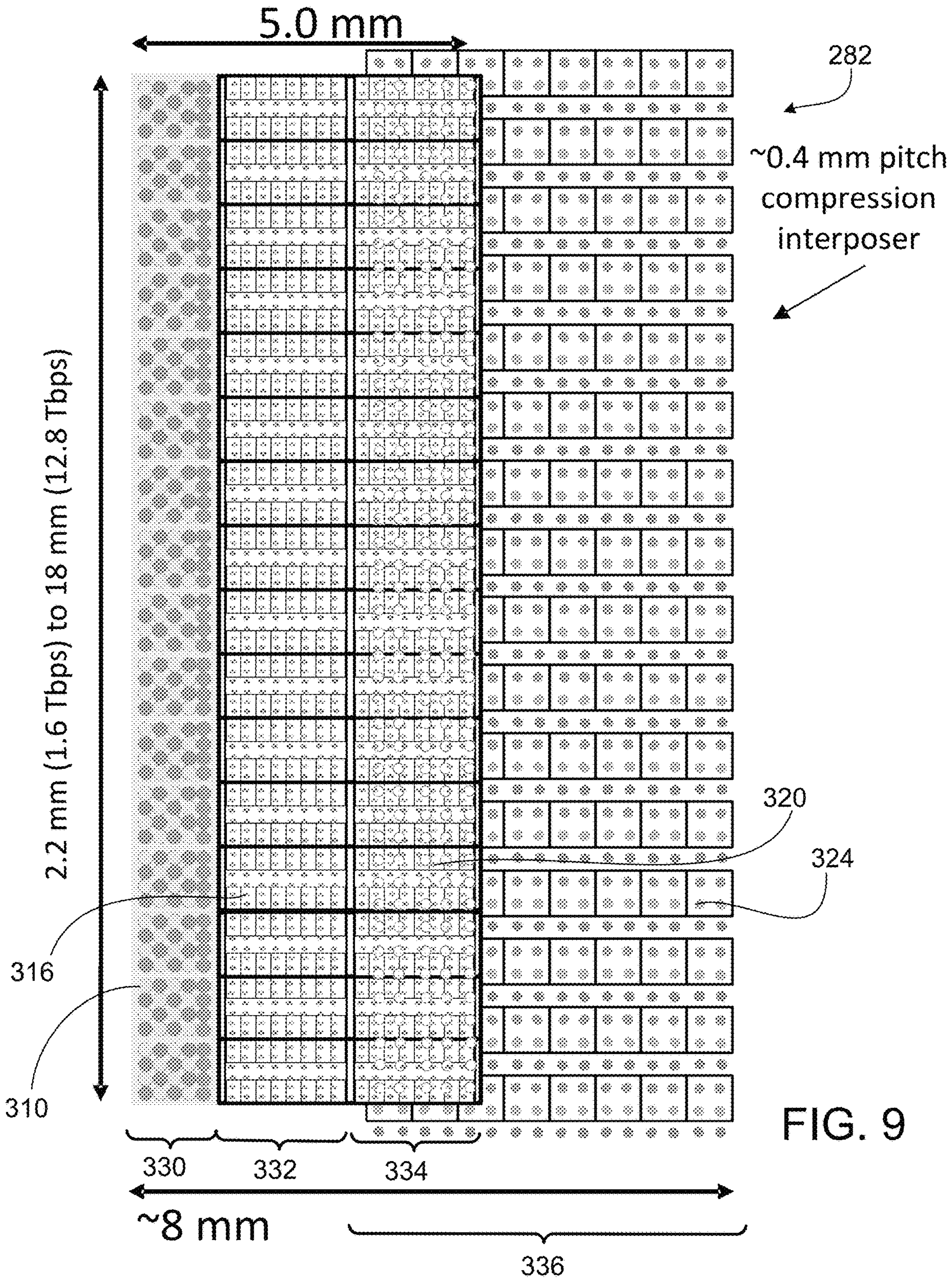
FIGS. 9 and 10 are diagrams of example layout patterns of optical and electrical terminals of integrated optical devices.

FIG. 9 is a diagram of an example layout design for optical and electrical terminals of the integrated optical communication device 282 of FIGS. 7 and 8. FIG. 9 shows the layout of the optical and electrical terminals when viewed from the top or bottom side of the device 282. In this example, the photonic integrated circuit 284 has a width of about 5 mm and a length of about 2.2 mm to 18 mm. For the example in which the length of the photonic integrated circuit 284 is about 2.2 mm, the optical signals provided to the photonic integrated circuit 284 can have a total bandwidth of about 1.6 Tbps. For the example in which the length of the photonic integrated circuit is about 18 mm, the optical signals provided to the photonic integrated circuit can have a total bandwidth of about 12.8 Tbps. The width of the integrated optical communication device 282 can be about 8 mm.

An array 330 of optical coupling components 310 is provided to allow optical signals to be provided to the photonic integrated circuit 284 in parallel. The first serializers/deserializers 216 include an array 332 of electrical terminals 316 arranged on the bottom surface of the first serializers/deserializers 216. The second serializers/deserializers module 217 include an array 334 of electrical terminals 320 arranged on the bottom surface of the second serializers/deserializers module 217. The arrays 332 and 334 of electrical terminals 316, 320 have a fine pitch, and the minimum distance between adjacent terminals can be in the range of, e.g., 40 μm to 200 μm. An array 336 of electrical terminals 324 is arranged on the bottom main surface of the circuit board 286. The array 336 of electrical terminals 324 has a coarse pitch, and the minimum distance between adjacent terminals can be in the range of, e.g., 200 μm to 1 mm. For example, the array 336 of electrical terminals 324 can be part of a compression interposer that has a pitch of about 400 μm between terminals.

Figure 10:
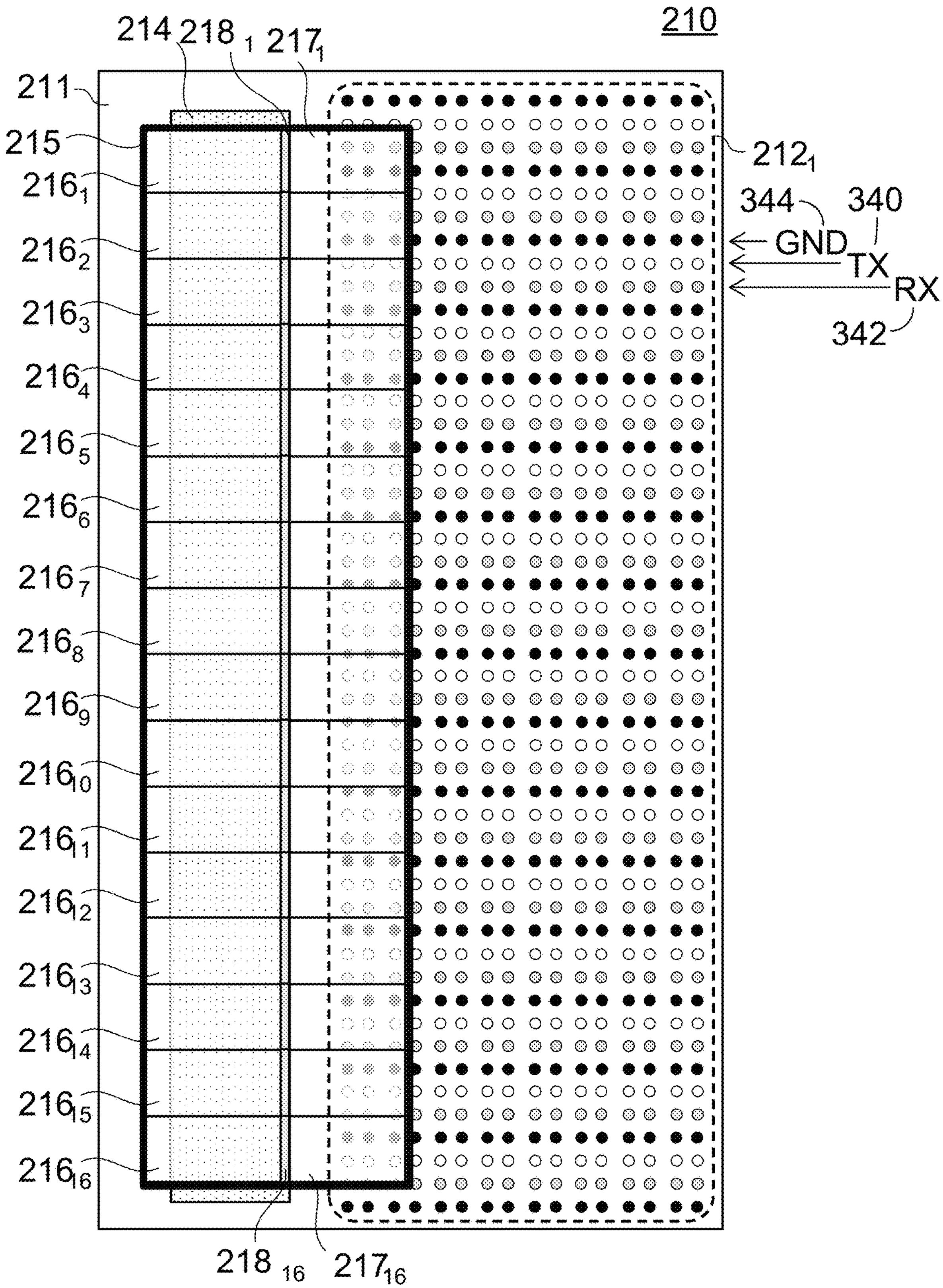

FIG. 10 is a diagram of an example layout design for optical and electrical terminals of the integrated optical communication device 210 of FIG. 2. FIG. 10 shows the layout of the optical and electrical terminals when viewed from the top or bottom side of the device 210. In this embodiment, the photonic integrated circuit 214 is implemented as a single chip. In some embodiments, the photonic integrated circuit 214 can be tiled across multiple chips. Likewise, the electronic communication integrated circuit 215 is implemented as a single chip in this embodiment. In some embodiments, the electronic communication integrated circuit 215 can be tiled cross multiple chips. In this embodiment, the electronic communication integrated circuit 215 is implemented using 16 serializers/deserializers blocks 216_1 to 216_16 that are electrically connected to the photonic integrated circuit 214 and 16 serializers/deserializers blocks 217_1 to 217_16, which are electrically connected to an array of contacts 212_1 by electrical connectors that pass through the substrate 211 in the thickness direction. The 16 serializers/deserializers blocks 216_1 to 216_16 are electrically coupled to the 16 serializers/deserializers blocks 217_1 to 217_16 by bus processing units 218_1 to 218_16, respectively. In this embodiment, each serializers/deserializers block (216 or 217) is implemented using 8 serial differential transmitters (TX) and 8 serial differential receivers (RX). In order to transfer the electrical signals from the serializers/deserializers blocks 217 to ASIC 240, a total of 8×16×2=256 electrical differential signal contacts 212_1 in addition to 8×17×2=272 ground (GND) contacts 212_1 can be used. Other contact arrangements that beneficially reduce crosstalk, e.g., placing a ground contact between every pair of TX and RX contacts, can also be used as will be appreciated by a person skilled in the art. The transmitter contacts are collectively referenced as 340, the receiver contacts are collectively referenced as 342, and the ground contacts are collectively referenced as 344.

The electrical contacts of the serializers/deserializers blocks 216_1 to 216_12 and 217_1 to 217_12 have a fine pitch, and the minimum distance between adjacent terminals can be in the range of, e.g., 40 μm to 200 μm. The electrical contacts 212_1 have a coarse pitch, and the minimum distance between adjacent terminals can be in the range of, e.g., 200 μm to 1 mm.

Figure 11:
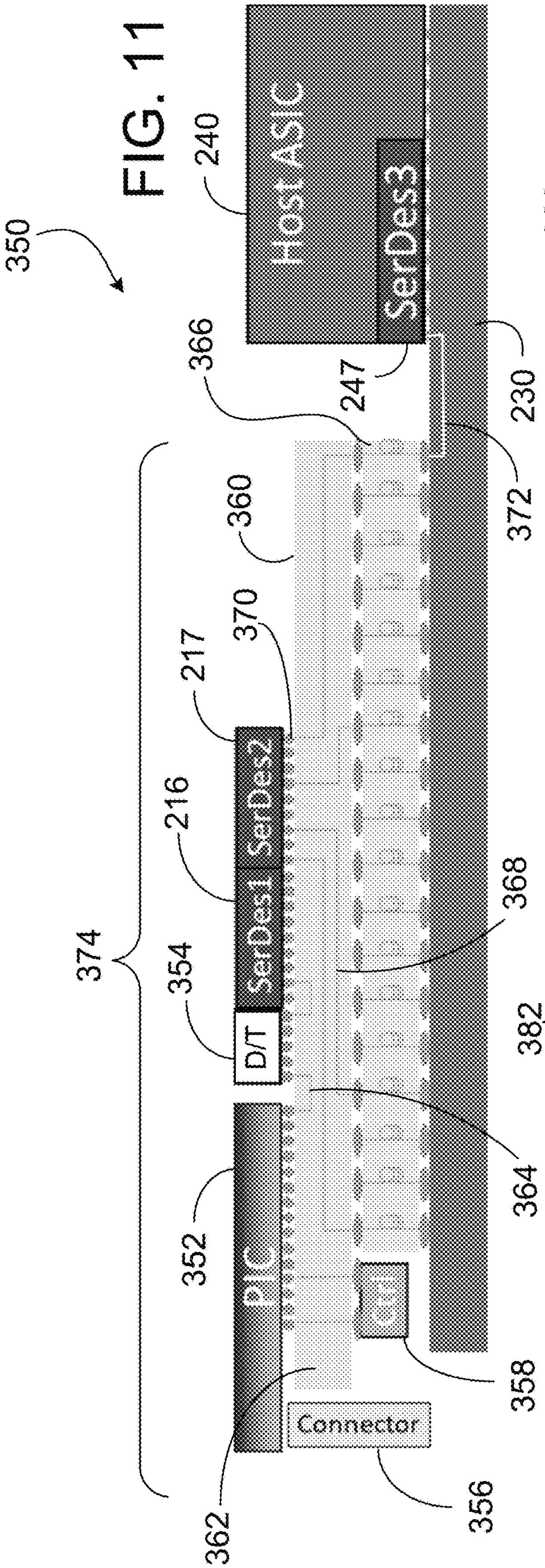
FIGS. 11, 12, 13, and 14 are schematic side views of examples of data processing systems.

FIG. 11 is a schematic side view of an example data processing system 350, which includes an integrated optical communication device 374, a package substrate 230, and a host application specific integrated circuit 240. The integrated optical communication device 374 and the host application specific integrated circuit 240 are mounted on the top side of the package substrate 230. The integrated optical communication device 374 includes a first optical connector 356 that allows optical signals transmitted in optical fibers to be coupled to the integrated optical communication device 374, in which a portion of the optical fibers connected to the first optical connector 356 are positioned at a region facing the bottom side of the package substrate 230.

The integrated optical communication device 374 includes a photonic integrated circuit 352, a combination of drivers and transimpedance amplifiers (D/T) 354, a first serializers/deserializers module 216, a second serializers/deserializers module 217, the first optical connector 356, a control module 358, and a substrate 360. The host application specific integrated circuit 240 includes an embedded third serializers/deserializers module 247.

In this example, the photonic integrated circuit 352, the drivers and transimpedance amplifiers 354, the first serializers/deserializers module 216, and the second serializers/deserializers module 217 are mounted on the top side of the substrate 360. In some embodiments, the drivers and transimpedance amplifiers 354, the first serializers/deserializers module 216, and the second serializers/deserializers module 217 can be monolithically integrated into a single electrical chip. The first optical connector 356 is optically coupled to the bottom side of the photonic integrated circuit 352. The control module 358 is electrically coupled to electrical terminals arranged on the bottom side of the substrate 360, whereas the photonic integrated circuit 352 is connected to electrical terminals arranged on the top side of the substrate 360. The control module 358 is electrically coupled to the photonic integrated circuit 352 through electrical connectors 362 that pass through the substrate 360 in the thickness direction. In some embodiments, the substrate 360 can be removably connected to the package substrate 230, e.g., using a compression interposer or a land grid array.

The photonic integrated circuit 352 is electrically coupled to the drivers and transimpedance amplifiers 354 through electrical connectors 364 on or in the substrate 360. The drivers and transimpedance amplifiers 354 are electrically coupled to the first serializers/deserializers module 216 by electrical connectors 366 on or in the substrate 360. The second serializers/deserializers module 216 has electrical terminals 370 on the bottom side that are electrically coupled to electrical terminals 366 arranged on the bottom side of the substrate 360 through electrical connectors 368 that pass through the substrate 360 in the thickness direction. The electrical terminals 370 have a fine pitch, whereas the electrical terminals 366 have a coarse pitch. The electrical terminals 366 are electrically coupled to the third serializers/deserializers module 247 through electrical connectors or traces 372 on or in the package substrate 230.

In some implementations, optical signals are converted by the photonic integrated circuit 352 to electrical signals, which are conditioned by the first serializers/deserializers module 216 (or the second serializers/deserializers module 217), and processed by the host application specific integrated circuit 240. The host application specific integrated circuit 240 generates electrical signals that are converted by the photonic integrated circuit 352 into optical signals.

Figure 12:
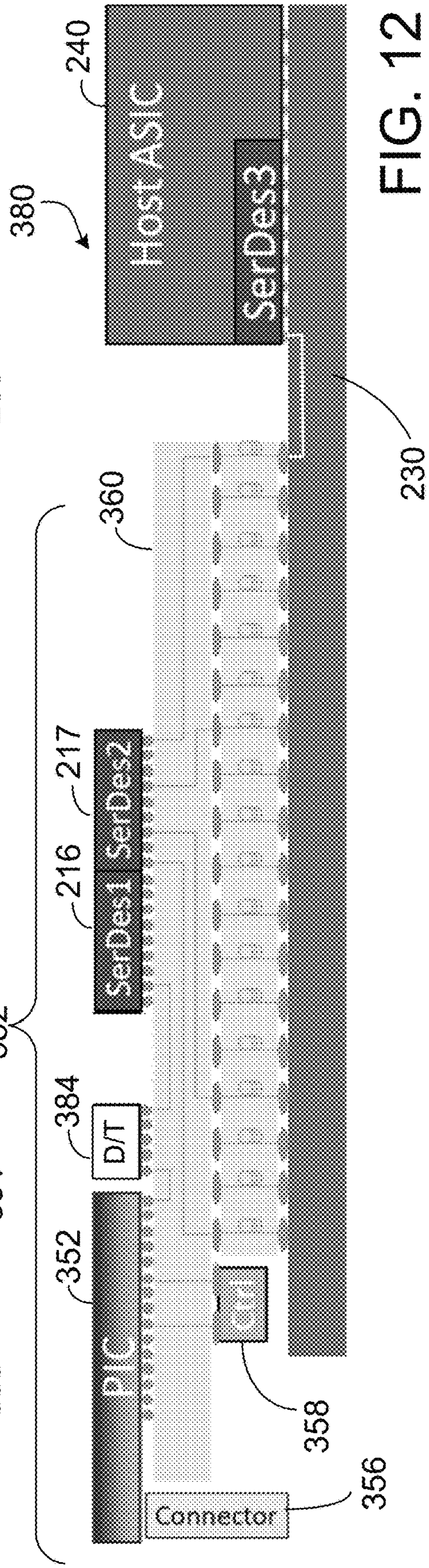

FIG. 12 is a schematic side view of an example data processing system 380, which includes an integrated optical communication device 382, a package substrate 230, and a host application specific integrated circuit 240. The integrated optical communication device 382 is similar to the integrated optical communication device 374 (FIG. 11), except that the transimpedance amplifiers and drivers are implemented in a separate chip 384 from the chip housing the serializers/deserializers modules 216 and 217.

Figure 13:
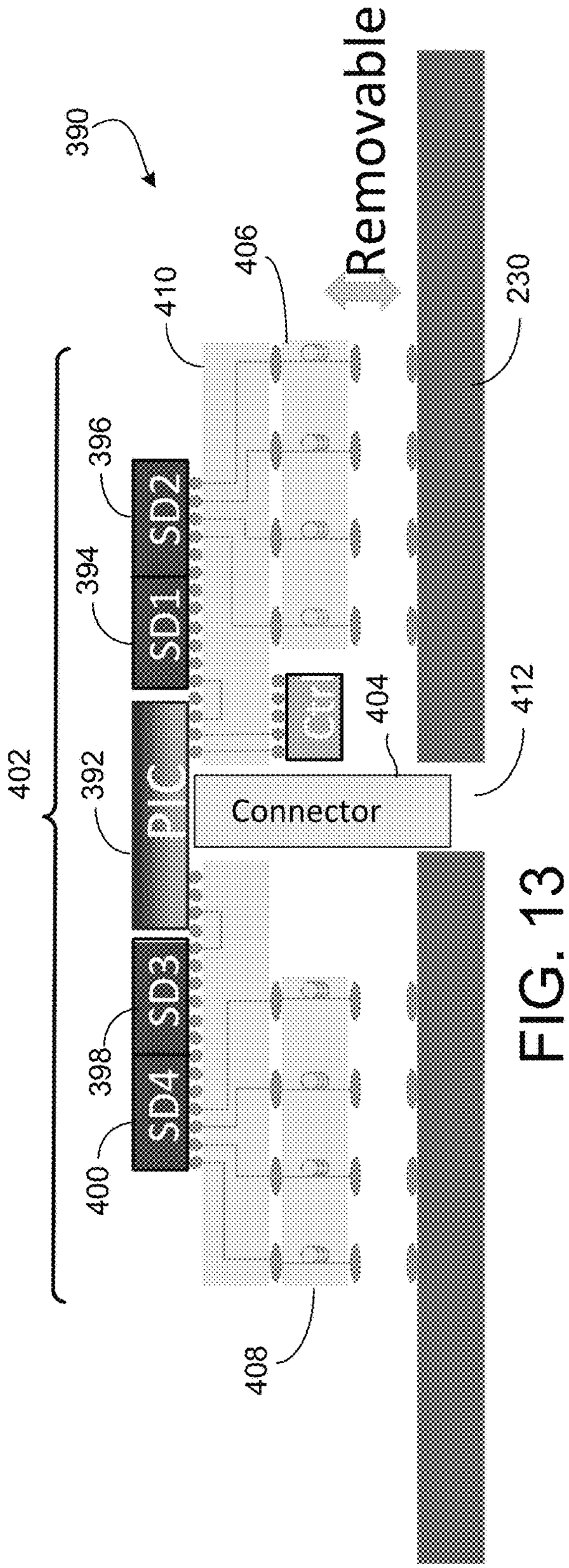

FIG. 13 is a schematic side view of an example data processing system 390 that includes an integrated optical communication device 402, a package substrate 230, and a host application specific integrated circuit (not shown in the figure). The integrated optical communication device 402 includes photonic integrated circuit 392, a first serializers/deserializers module 394, a second serializers/deserializers module 396, a third serializers/deserializers module 398, and a fourth serializers/deserializers module 400 that are mounted on a substrate 410. The photonic integrated circuit 392 can include transimpedance amplifiers and drivers, or such amplifiers and/or drivers can be included in the serializers/deserializers modules 394 and 398. The first serializers/deserializers module 394 and the second serializers/deserializers module 396 are positioned on the right side of the photonic integrated circuit 392. The third serializers/deserializers module 398 and the fourth serializers/deserializers module 400 are positioned on the left side of the photonic integrated circuit 392. Here, the term "left" and "right" refer to the relative positions shown in the figure. It is understood that the system 390 can be positioned in any orientation so that the first serializers/deserializers module 394 and the second serializers/deserializers module 396 are not necessarily at the right side of the photonic integrated circuit 392, and the third serializers/deserializers module 398 and the fourth serializers/deserializers module 400 are not necessarily at the left side of the photonic integrated circuit 392.

The photonic integrated circuit 392 receives optical signals from a first optical connector 404, generates serial electrical signals based on the optical signals, sends the serial electrical signals to the first and second serializers/deserializers modules 394 and 398. The first and second serializers/deserializers modules 394 and 398 generate parallel electrical signals based on the received serial electrical signals, and send the parallel electrical signals to the third and fourth serializers/deserializers modules 396 and 400, respectively. The third and fourth serializers/deserializers modules 396 and 400 generate serial electrical signals based on the received parallel electrical signals, and send the serial electrical signals to electrical terminals 406 and 408, respectively, arranged on the bottom side of the substrate 410.

The first optical connector 404 is optically coupled to the bottom side of the photonic integrated circuit 392. In some embodiments, the optical connector 404 can also be placed on the top of the photonic integrated circuit 392 and couple light to the top side of the photonic integrated circuit 392 (not shown in the figure). The first optical connector 404 is optically coupled to a second optical connector, which in turn is optically coupled to a plurality of optical fibers. In the configuration shown in FIG. 13, the first optical connector 404, the second optical connector, and/or the optical fibers pass through an opening 412 in the package substrate 230. The electrical terminals 406 are arranged on the right side of the first optical connector 404, and the electrical terminals 408 are arranged on the left side of the first optical connector 404. The electrical terminals 406 and 408 are configured such that the substrate 410 can be removably coupled to the package substrate 230.

Figure 14:
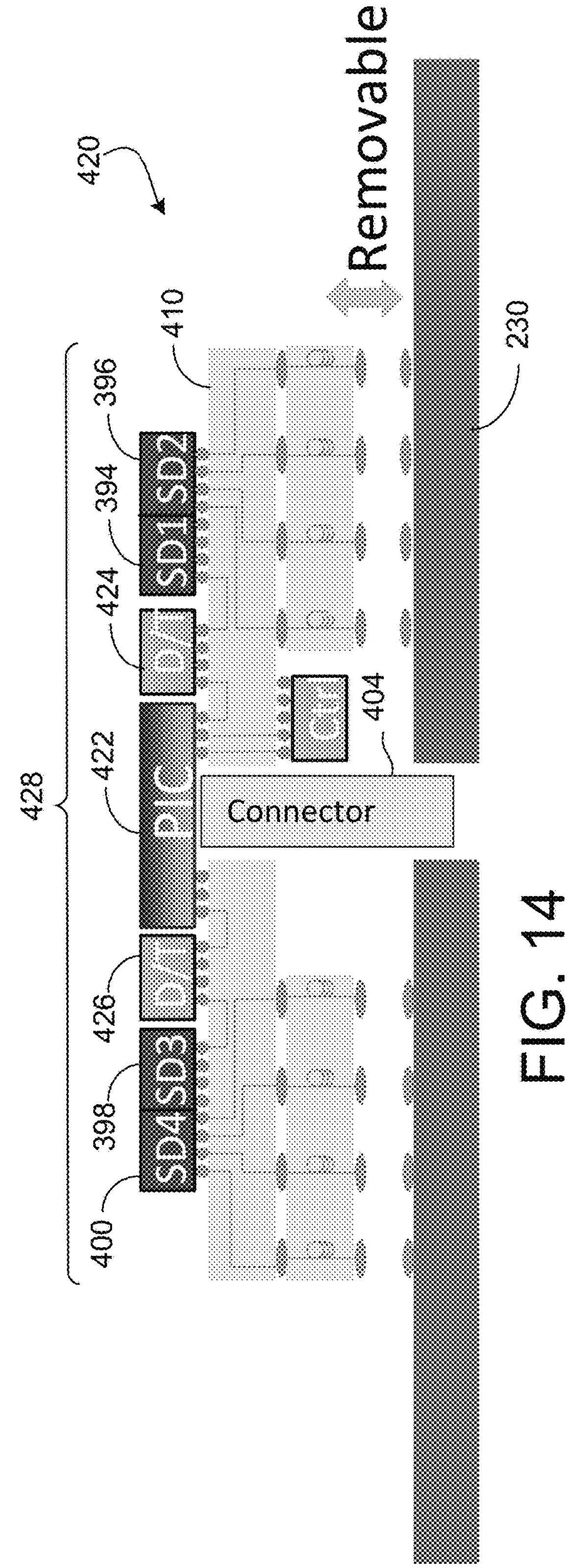

FIG. 14 is a schematic side view of an example data processing system 420 that includes an integrated optical communication device 428, a package substrate 230, and a host application specific integrated circuit (not shown in the figure). The integrated optical communication device 428 includes a photonic integrated circuit 422 (which does not include a transimpedance amplifier and driver), a first serializers/deserializers module 394, a second serializers/deserializers module 396, a third serializers/deserializers module 398, and a fourth serializers/deserializers module 400 that are mounted on a substrate 410. The integrated optical communication device 428 includes a first set of transimpedance amplifiers and driver circuits 424 positioned at the right of the photonic integrated circuit 422, and a second set of transimpedance amplifiers and driver circuits 426 positioned at the left of the photonic integrated circuit 422. The first set of transimpedance amplifiers and driver circuits 424 is positioned between the photonic integrated circuit 422 and a first serializers/deserializers module 394. The second set of transimpedance amplifiers and driver circuits 424 is positioned between the photonic integrated circuit 422 and a third serializers/deserializers module 398.

In some implementations, the integrated optical communication device 402 (or 408) can be modified such that the first optical connector 404 couples optical signals to the top side of the photonic integrated circuit 392 (or 422).

Figure 32:
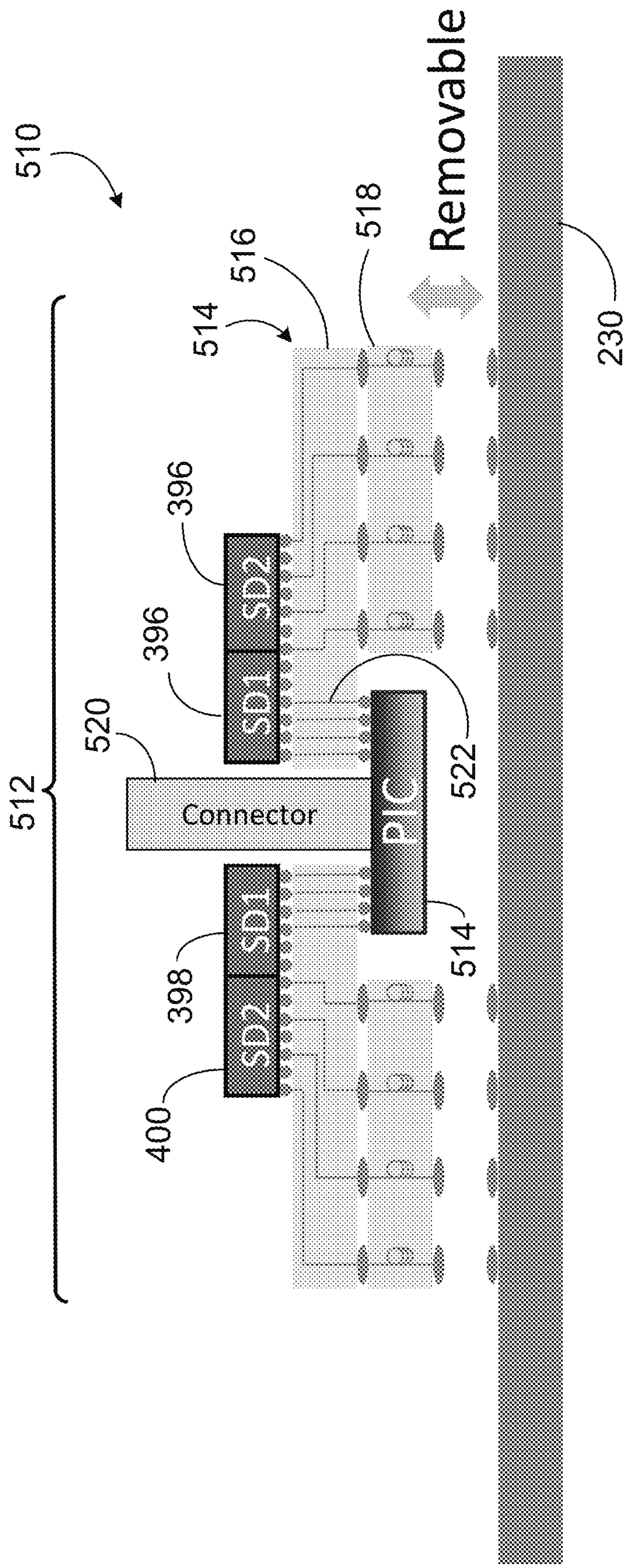
FIG. 32 is a schematic side view of an example data processing system.

FIG. 32 is a schematic side view of an example data processing system 510 that includes an integrated optical communication device 512, a package substrate 230, and a host application specific integrated circuit (not shown in the figure). The integrated optical communication device 512 includes a substrate 514 that includes a first slab 516 and a second slab 518. The first slab 516 provides electrical connectors to fan out the electrical contacts. The first slab 516 includes a first set of contacts arranged on the top surface and a second set of contacts arranged on the bottom surface, in which the first set of contacts has a fine pitch and the second set of contacts has a coarse pitch. The second slab 518 provides a removable connection to the package substrate 230. A photonic integrated circuit 524 is mounted on the bottom side of the first slab 516. A first optical connector 520 passes through an opening in the substrate 514 and couples optical signals to the top side of the photonic integrated circuit 524.

A first serializers/deserializers module 394, a second serializers/deserializers module 396, a third serializers/deserializers module 398, and a fourth serializers/deserializers module 400 are mounted on the top side of the first slab 516. The photonic integrated circuit 524 is electrically coupled to the first and third serializers/deserializers modules 394 and 398 by electrical connectors 522 that pass through the substrate 514 in the thickness direction. For example, the electrical connectors 522 can be implemented as vias. In some examples, drivers and transimpedance amplifiers can be integrated in the photonic integrated circuit 524, or integrated in the serializers/deserializers modules 394 and 398. In some examples, the drivers and transimpedance amplifiers can be implemented in a separate chip (not shown in the figure) positioned between the photonic integrated circuit 524 and the serializers/deserializers modules 394 and 398, similar to the example in FIG. 14. A control chip (not shown in the figure) can be provided to control the operation of the photonic integrated circuit 512.

Figure 15:
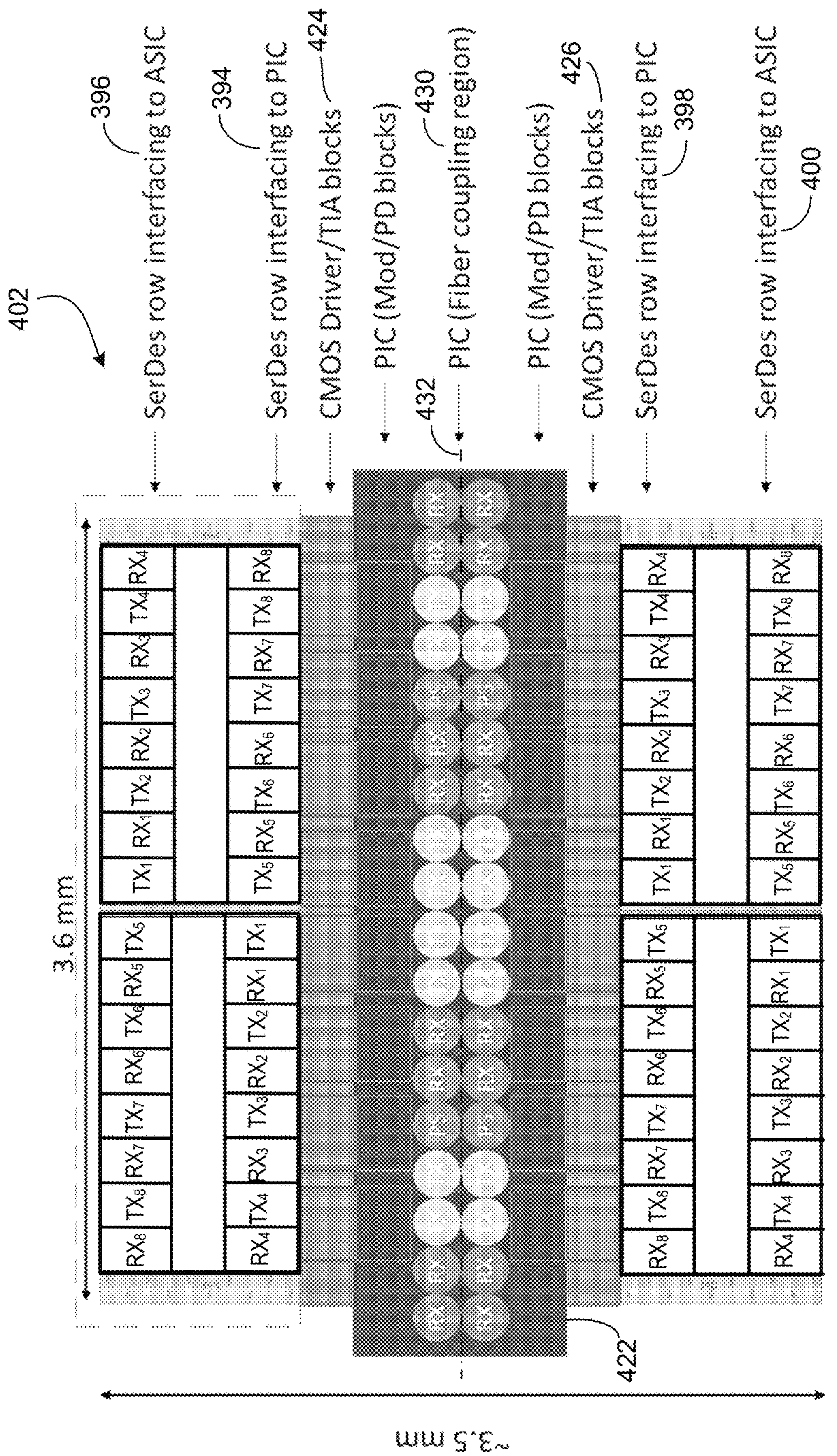
FIGS. 15 and 16 are bottom views of examples of integrated optical devices.

FIG. 15 is a bottom view of an example of the integrated optical communication device 428 of FIG. 14. The photonic integrated circuit 422 includes modulator and photodetector blocks on both sides of a center line 432 in the longitudinal direction. The photonic integrated circuit 422 includes a fiber coupling region 430 arranged either at the bottom side of the photonic integrated circuit 392 or at the top side of the photonic integrated circuit (see FIG. 32), in which the fiber coupling region 430 includes multiple optical coupling elements 310, e.g., receiver optical coupling elements (RX), transmitter optical coupling elements (TX), and remote optical power supply (e.g., 103 in FIG. 1) optical coupling elements (PS).

Complementary metal oxide semiconductor (CMOS) transimpedance amplifier and driver blocks 424 are arranged on the right side of the photonic integrated circuit 422, and CMOS transimpedance amplifier and driver blocks 426 are arranged on the left side of the photonic integrated circuit 422. A first serializers/deserializers module 394 and a second serializers/deserializers module 396 are arranged on the right side of the CMOS transimpedance amplifier and driver blocks 424. A third serializers/deserializers module 398 and a fourth serializers/deserializers module 400 are arranged on the left side of the CMOS transimpedance amplifier and driver blocks 426.

In this example, each of the first, second, third, and fourth serializers/deserializers module 394, 396, 398, 400 includes 8 serial differential transmitter blocks and 8 serial differential receiver blocks. The integrated optical communication device 428 has a width of about 3.5 mm and a length of slightly more than about 3.6 mm.

Figure 16:
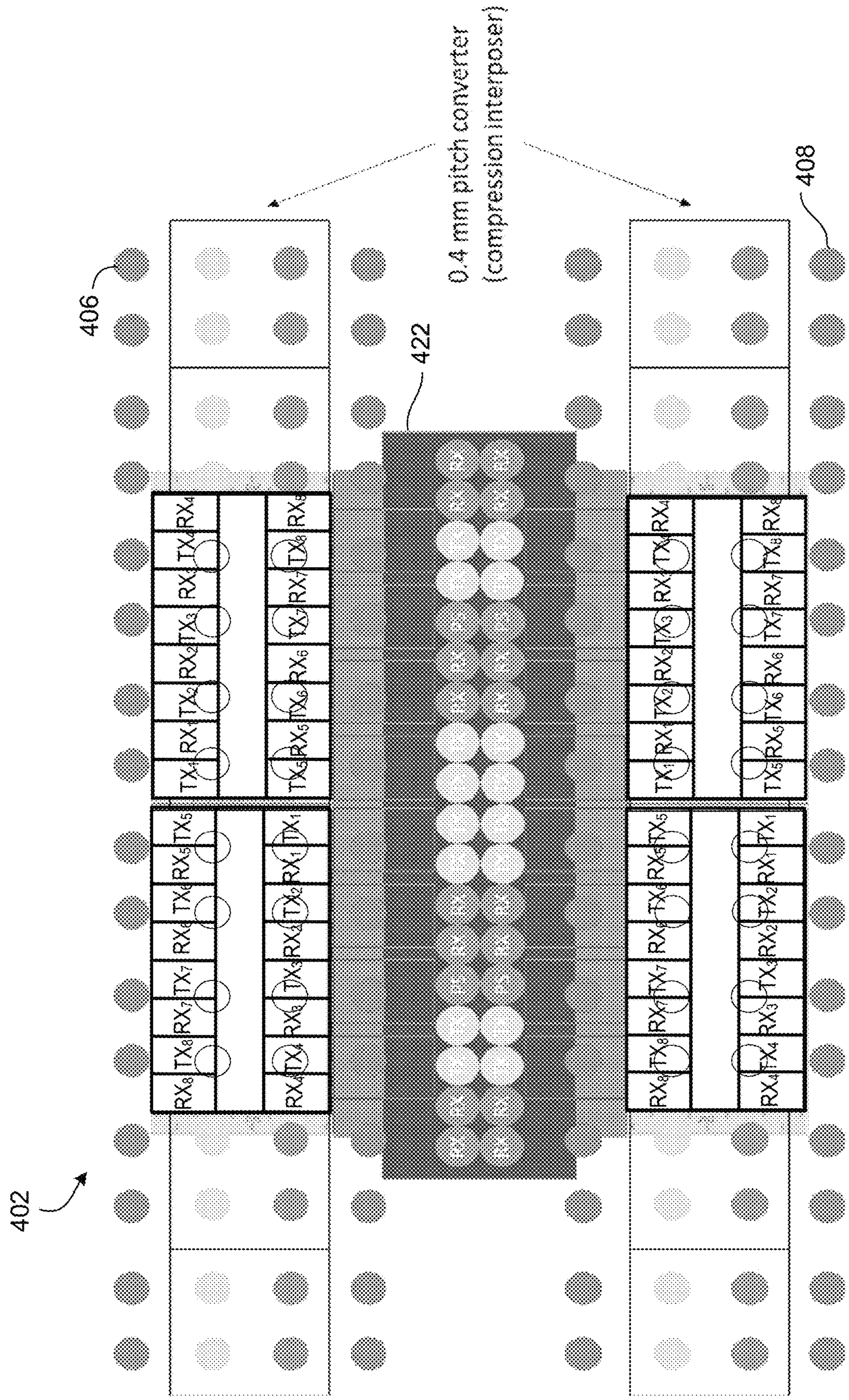

FIG. 16 is a bottom view of an example of the integrated optical communication device 428 of FIG. 14, in which the electrical terminals 406 and 408 are also shown. As shown in the figure, the electrical terminals 406 and 408 have a coarse pitch, the minimum distance between terminals in the array of electrical terminals 406 or 408 is much larger than the minimum distance between terminals in the array of electrical terminals of the first, second, third, and fourth serializers/deserializers modules 394, 396, 398, and 400. For example, the array of electrical terminals 406 and 408 can be part of a compression interposer that has a pitch of about 400 μm between terminals.

Figure 66:
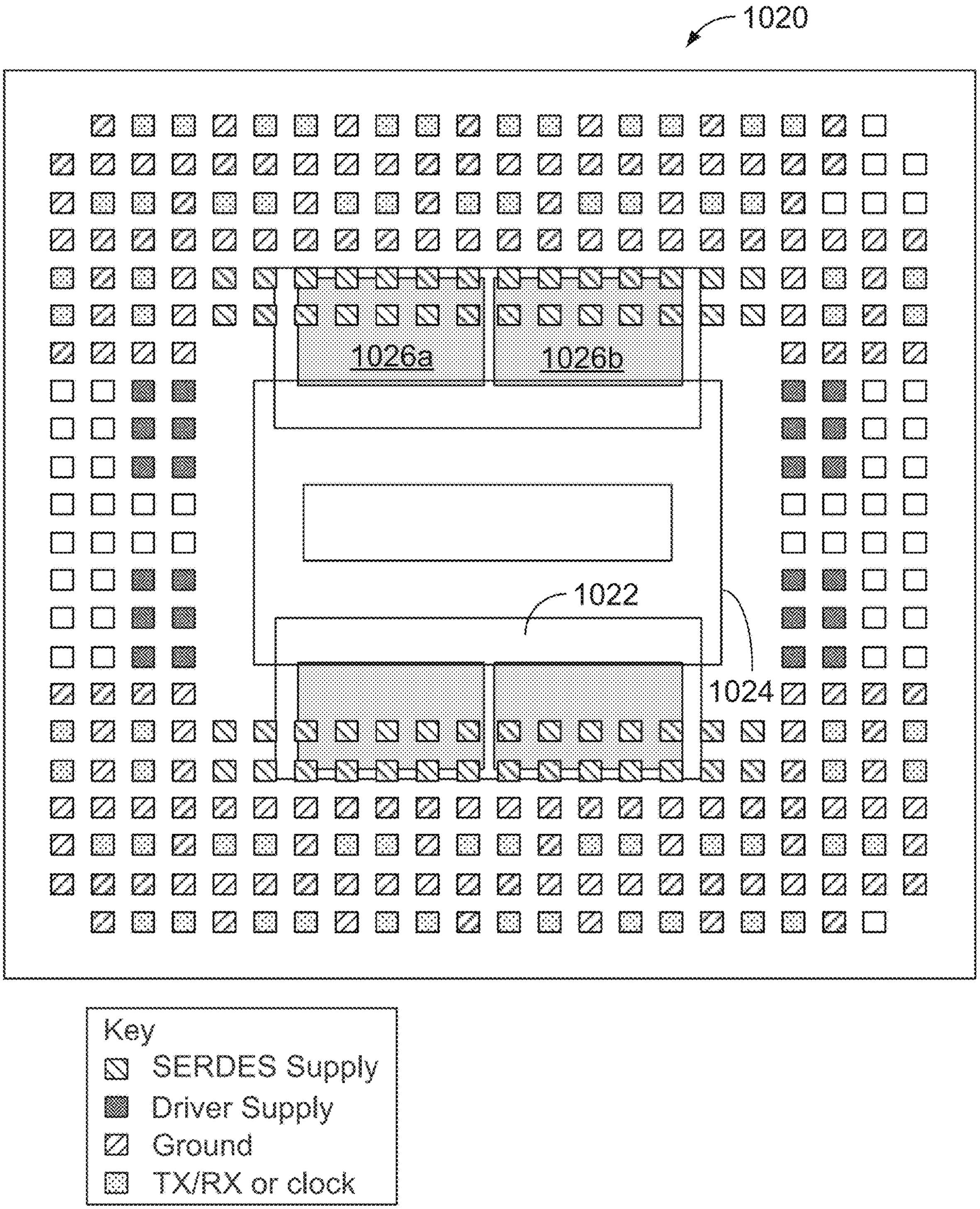
FIG. 66 is a map of electrical contact pads.

In some implementations, the electrical terminals (e.g., 406 and 408) can be arranged in a configuration as shown in FIG. 66. FIG. 66 shows a pad map 1020 that shows the locations of various contact pads as viewed from the bottom of the package. The contact pads occupy an area that is about 9.8 mm×9.8 mm, in which 400 μm pitch pads are used.

The middle rectangle 1022 is a cutout that connects the photonic integrated circuit to the optics that leave from the top of the module. The bigger rectangle 1024 represents the photonic integrated circuit. The two gray rectangles 1026*a*, 1026*b* represent circuitry in a serializers/deserializers chip 1028*a*. The two gray rectangles 1026*c*, 1026*d* represent circuitry in another serializers/deserializers chip 1028*b*. The serializers/deserializers chips are positioned on the top of the package, and the photonic integrated circuit is positioned on the bottom of the package. The overlap between the photonic integrated circuit and the serializers/deserializers chips 1028*a*, 1028*b* is designed so that vias (not shown in the figure) can directly connect these integrated circuits through the package. In some implementations, the serializers/deserializers chips 1028*a*, 1028*b* and/or other electronic integrated circuits can be placed around three or four sides of the optical connector (represented by the rectangle 1022), similar to the examples shown in FIGS. 168 to 170.

In the examples of the data processing systems shown in FIGS. 2-8, 11-14, and 32, the integrated optical communication device (e.g., 210, 252, 262, 282, 374, 382, 402, 428, 512, which includes the photonic integrated circuit and the serializers/deserializers modules) is mounted on the package substrate 230 on the same side (top side in the examples shown in the figures) as the electronic processor integrated circuit (or host application specific integrated circuit) 240. The data processing systems can also be modified such that the integrated optical communication device is mounted on the package substrate 230 on the opposite side as the electronic processor integrated circuit (or host application specific integrated circuit) 240. For example, the electronic processor integrated circuit 240 can be mounted on the top side of the package substrate 230 and one or more integrated optical communication devices of the form disclosed in FIGS. 2-8, 11-14, and 32 can be mounted on the bottom side of the package substrate 230.

Figure 17:
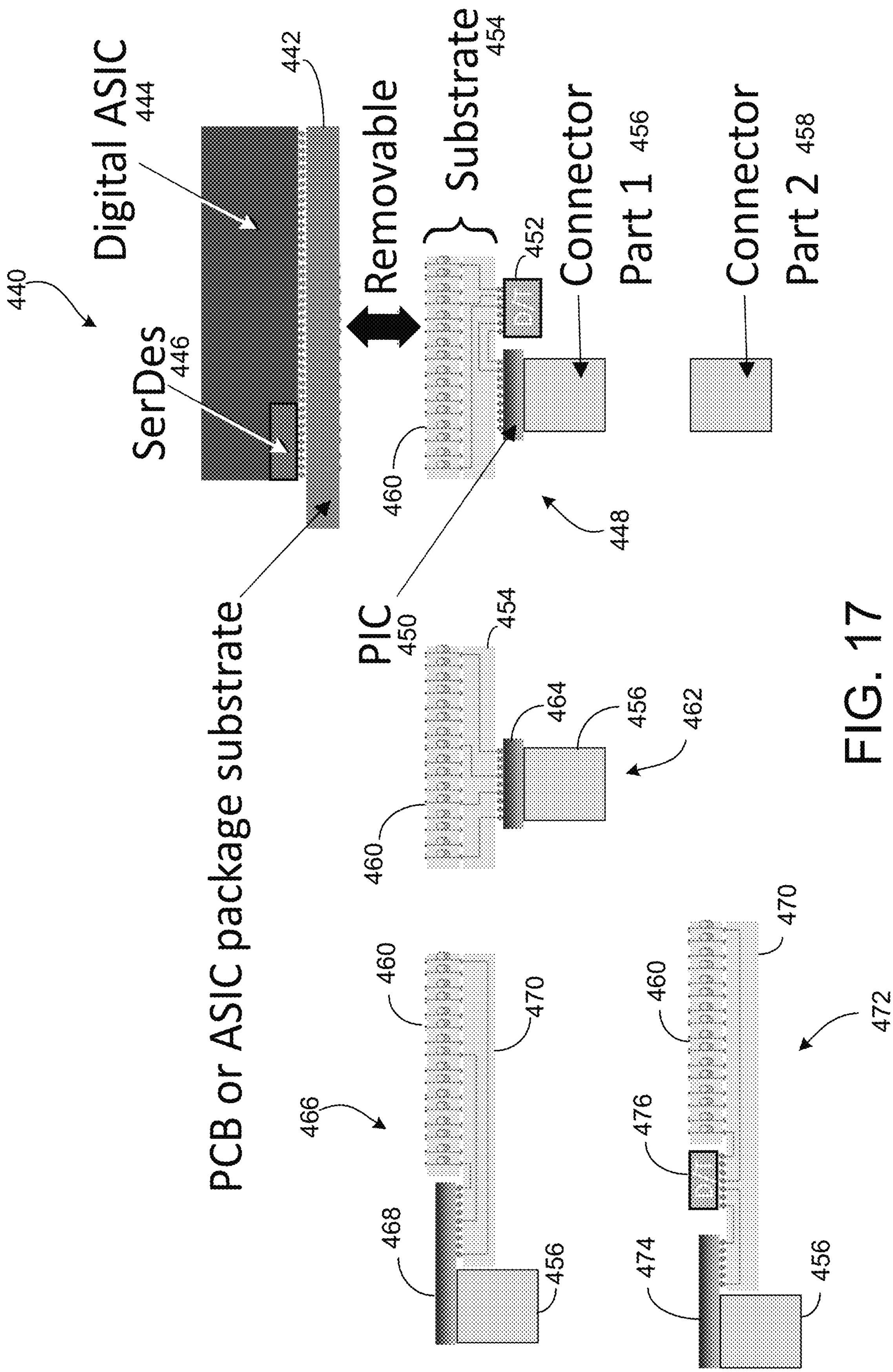
FIG. 17 is a diagram showing various types of integrated optical communication devices that can be used in a data processing system.

FIG. 17 is a diagram showing four types of integrated optical communication devices that can be used in a data processing system 440. In these examples, the integrated optical communication device does not include serializers/deserializers modules. At least some of the signal conditioning is performed by the serializers/deserializers module(s) in the digital application specific integrated circuit. The integrated optical communication device is mounted on the side of the printed circuit board that is opposite to the side on which the digital application specific integrated circuit is mounted, allowing the connectors to be short.

In a first example, the data processing system includes a digital application specific integrated circuit 444 mounted on the top side of a substrate 442, and an integrated optical communication device 448 mounted on the bottom side of the first circuit board. In some implementations, the integrated optical communication device 448 includes a photonic integrated circuit 450 and a set of transimpedance amplifiers and drivers 452 that are mounted on the bottom side of a substrate 454 (e.g., a second circuit board). The top side of the photonic integrated circuit 450 is electrically coupled to the bottom side of the substrate 454. A first optical connector part 456 is optically coupled to the bottom side of the photonic integrated circuit 450. The first optical connector part 456 is configured to be optically coupled to a second optical connector part 458 that is optically coupled to a plurality of optical fibers (not shown in the figure). An array of electrical terminals 460 is arranged on the top side of the substrate 454 and configured to enable the integrated optical communication device 448 to be removably coupled to the substrate 442.

The optical signals from the optical fibers are processed by the photonic integrated circuit 450, which generates serial electrical signals based on the optical signals. The serial electrical signals are amplified by the set of transimpedance amplifiers and drivers 452, which drives the output signals that are transmitted to a serializers/deserializers module 446 embedded in the digital application specific integrated circuit 444.

In a second example, an integrated optical communication device 462 can be mounted on the bottom side of the substrate 442 to provide an optical/electrical communications interface between the optical fibers and the digital application specific integrated circuit 444. The integrated optical communication device 462 includes a photonic integrated circuit 464 that is mounted on the bottom side of a substrate 454 (e.g., a second circuit board). The top side of the photonic integrated circuit 464 is electrically coupled to the bottom side of the substrate 454. A first optical connector part 456 is optically coupled to the bottom side of the photonic integrated circuit 450. An array of electrical terminals 460 is arranged on the top side of the substrate 454 and configured to enable the integrated optical communication device 462 to be removably coupled to the substrate 442. The integrated optical communication device 462 is similar to the integrated optical communication device 448, except that either the photonic integrated circuit 464 or the serializers/deserializers module 446 includes the set of transimpedance amplifiers and driver circuitry. In some examples, the serializers/deserializers module 446 is configured to directly accept electrical signals emerging from photonic integrated circuit 464, e.g., by having a high enough receiver input impedance that converts the photocurrent generated within the photonic integrated circuit 464 to a voltage swing suitable for further electrical processing. For example, the serializers/deserializers module 446 is configured to have a low transmitter output impedance, and provide an output voltage swing that allows direct driving of optical modulators embedded within the photonic integrated circuit 464.

In a third example, an integrated optical communication device 466 can be mounted on the bottom side of the substrate 442 to provide an optical/electrical communications interface between the optical fibers and the digital application specific integrated circuit 444. The integrated optical communication device 466 includes a photonic integrated circuit 468 that is mounted on the top side of a substrate 470 (e.g., a second circuit board). The bottom side of the photonic integrated circuit 468 is electrically coupled to the top side of the substrate 470. A first optical connector part 456 is optically coupled to the bottom side of the photonic integrated circuit 468. An array of electrical terminals 460 is arranged on the top side of the substrate 470 and configured to enable the integrated optical communication device 466 to be removably coupled to the substrate 442. In some examples, either the photonic integrated circuit 468 or the serializers/deserializers module 446 includes the set of transimpedance amplifiers and driver circuitry. In some examples, the serializers/deserializers module 446 is configured to directly accept electrical signals emerging from the photonic integrated circuit 464.

In a fourth example, an integrated optical communication device 472 can be mounted on the bottom side of the substrate 442 to provide an optical/electrical communications interface between the optical fibers and the digital application specific integrated circuit 444. The integrated optical communication device 472 includes a photonic integrated circuit 474 and a set of transimpedance amplifiers and drivers 476 that are mounted on the top side of a substrate 470 (e.g., a second circuit board). The bottom side of the photonic integrated circuit 474 is electrically coupled to the top side of the substrate 470. A first optical connector part 456 is optically coupled to the bottom side of the photonic integrated circuit 468. An array of electrical terminals 460 is arranged on the top side of the substrate 470 and configured to enable the integrated optical communication device 466 to be removably coupled to the substrate 442. The integrated optical communication device 472 is similar to the integrated optical communication device 466, except that neither the photonic integrated circuit 464 nor the serializers/deserializers module 446 include a set of transimpedance amplifiers and driver circuitry, and the set of transimpedance amplifiers and drivers 476 is implemented as a separate integrated circuit.

Figure 18:
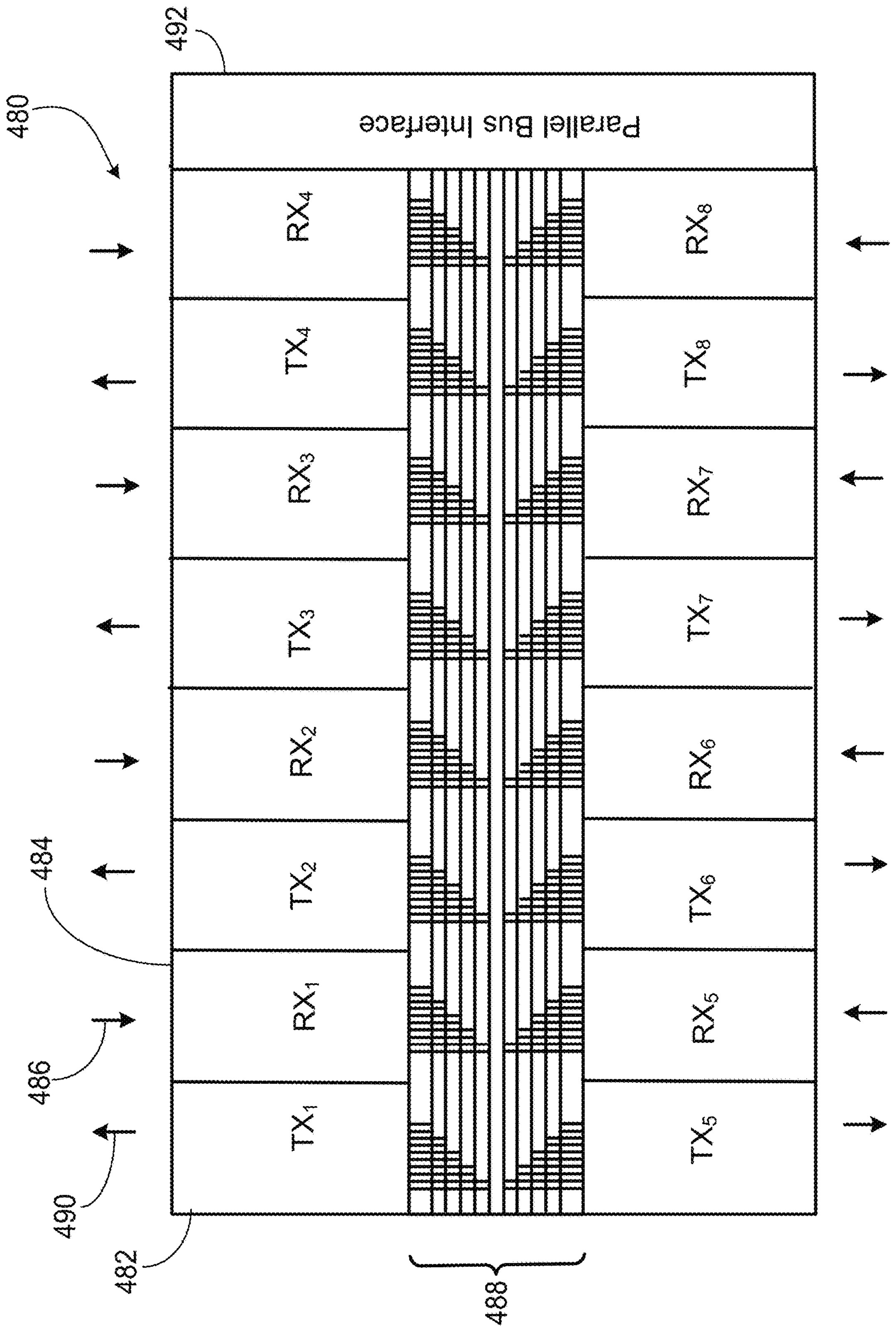
FIG. 18 is a diagram of an example octal serializers/deserializers block.

FIG. 18 is a diagram of an example octal serializers/deserializers block 480 that includes 8 serial differential transmitters (TX) 482 and 8 serial differential receivers (RX) 484. Each serial differential receiver 484 receives a serial differential signal, generates parallel signals based on the serial differential signal, and provides the parallel signals on the parallel bus 488. Each serial differential transmitter 482 receives parallel signals from the parallel bus 488, generates a serial differential signal based on the parallel signals, and provides the serial differential signal on an output electrical terminal 490. The serializers/deserializers block 480 outputs and/or receives parallel signals through a parallel bus interface 492.

In the examples described above, such as those shown in FIGS. 2-14, the integrated optical communication device (e.g., 210, 252, 262, 282, 374, 382, 402, 428) includes a first serializers/deserializers module (e.g., 216, 394, 398) and a second serializers/deserializers module (e.g., 217, 396, 400). The first serializers/deserializers module serially interfaces with the photonic integrated circuit, and the second serializers/deserializers module serially interfaces with the electronic processor integrated circuit or host application specific integrated circuit (e.g., 240). In some implementations, the electronic communication integrated circuit 215 includes an array of serializers/deserializers that can be logically partitioned into a first sub-array of serializers/deserializers and a second sub-array of serializers/deserializers. The first sub-array of serializers/deserializers corresponds to the serializers/deserializers module (e.g., 216, 394, 398), and the second sub-array of serializers/deserializers corresponds to the second serializers/deserializers module (e.g., 217, 396, 400).

Figure 38:
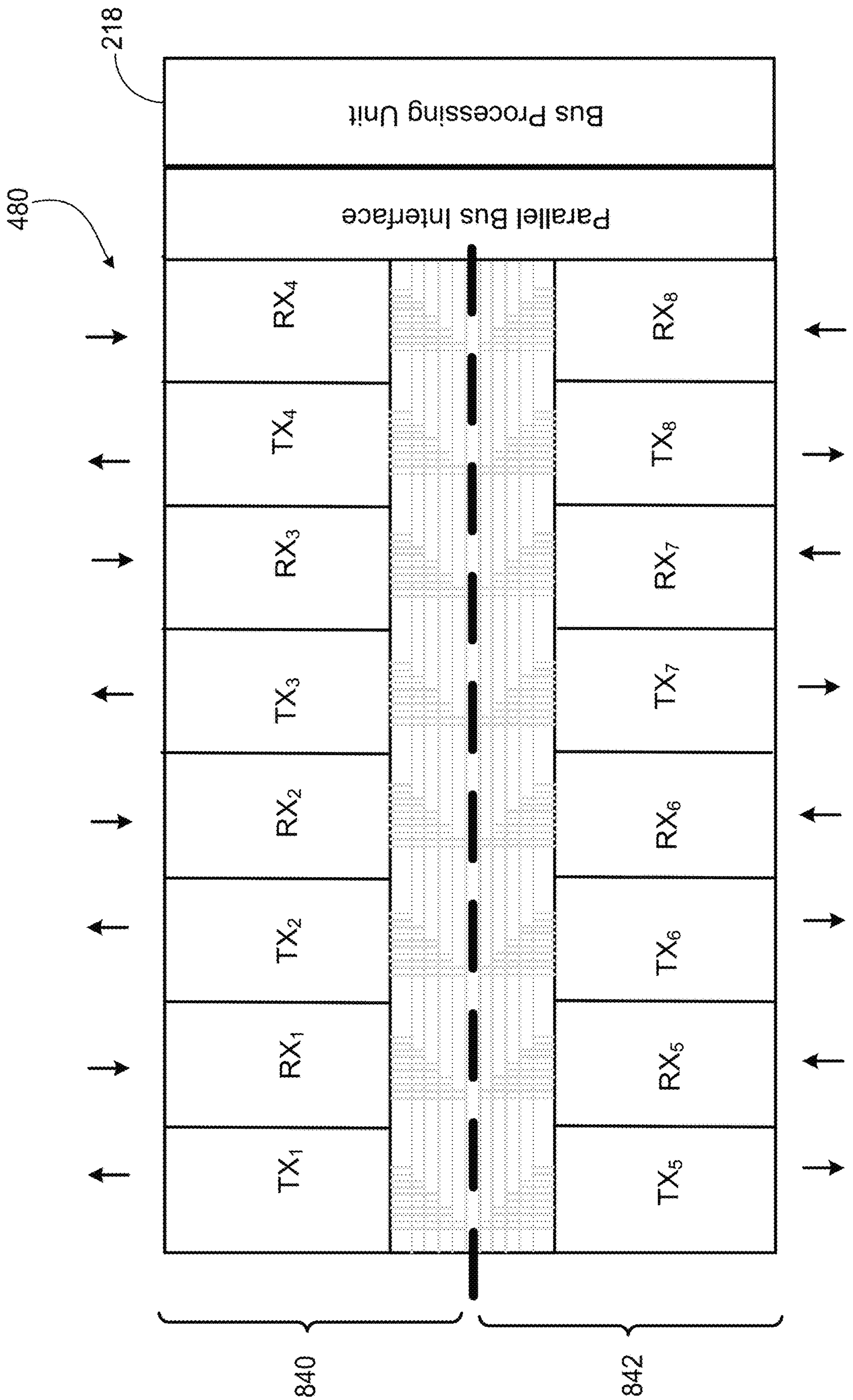
FIGS. 38 and 39 are diagrams of examples of serializers/deserializers blocks.

FIG. 38 is a diagram of an example octal serializers/deserializers block 480 coupled to a bus processing unit 218. The octal serializers/deserializers block 480 includes 8 serial differential transmitters (TX1 to TX8) 482 and 8 serial differential receivers (RX1 to RX4) 484. In some implementations, the transmitters and receivers are partitioned such that the transmitters TX1, TX2, TX3, TX4 and receivers RX1, RX2, RX3, RX4 form a first serializers/deserializers module 840, and the transmitters TX5, TX6, TX7, TX8 and receivers RX5, RX6, RX7, RX8 form a second serializers/deserializers module 842. Serial electrical signals received at the receivers RX1, RX2, RX3, RX4 are converted to parallel electrical signals and routed by the bus processing unit 218 to the transmitters TX5, TX6, TX7, TX8, which convert the parallel electrical signals to serial electrical signals. For example, the photonic integrated circuit can send serial electrical signals to the receivers RX1, RX2, RX3, RX4, and the transmitters TX5, TX6, TX7, TX8 can transmit serial electrical signals to the electronic processor integrated circuit or host application specific integrated circuit.

For example, the bus processing unit 218 can re-map the lanes of signals and perform coding on the signals, such that the bit rate and/or modulation format of the serial signals output from the transmitters TX5, TX6, TX7, TX8 can be different from the bit rate and/or modulation format of the serial signals received at the receivers RX1, RX2, RX3, RX4. For example, 4 lanes of T Gbps NRZ serial signals received at the receivers RX1, RX2, RX3, RX4 can be re-encoded and routed to transmitters TX5, TX6 to output 2 lanes of 2×T Gbps PAM4 serial signals.

Similarly, serial electrical signals received at the receivers RX5, RX6, RX7, RX8 are converted to parallel electrical signals and routed by the bus processing unit 218 to the transmitters TX1, TX2, TX3, TX4, which convert the parallel electrical signals to serial electrical signals. For example, the electronic processor integrated circuit or host application specific integrated circuit can send serial electrical signals to the receivers RX5, RX6, RX7, RX8, and the transmitters TX1, TX2, TX3, TX4 can transmit serial electrical signals to the photonic integrated circuit.

For example, the bus processing unit 218 can re-map the lanes of signals and perform coding on the signals, such that the bit rate and/or modulation format of the serial signals output from the transmitters TX1, TX2, TX3, TX4 can be different from the bit rate and/or modulation format of the serial signals received at the receivers RX5, RX6, RX7, RX8. For example, 2 lanes of 2×T Gbps PAM4 serial signals received at receivers RX5, RX6 can be re-encoded and routed to the transmitters TX5, TX6, TX7, TX8 to output 4 lanes of T Gbps NRZ serial signals.

Figure 39:
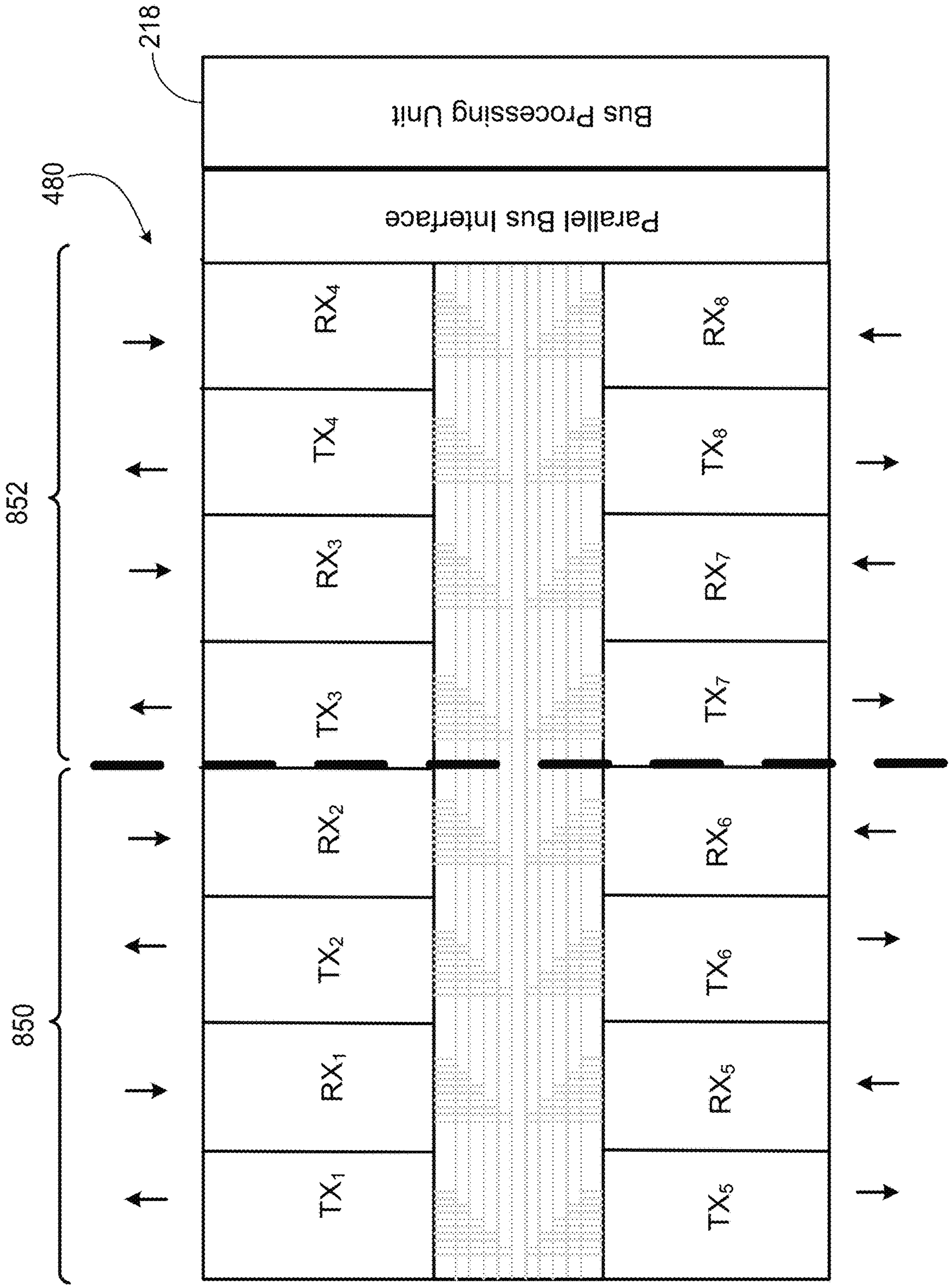

FIG. 39 is a diagram of another example octal serializers/deserializers block 480 coupled to a bus processing unit 218, in which the transmitters and receivers are partitioned such that the transmitters TX1, TX2, TX5, TX6 and receivers RX1, RX2, RX5, RX6 form a first serializers/deserializers module 850, and the transmitters TX3, TX4, TX7, TX8 and receivers RX3, RX4, RX7, RX8 form a second serializers/deserializers module 852. Serial electrical signals received at the receivers RX1, RX2, RX5, RX6 are converted to parallel electrical signals and routed by the bus processing unit 218 to the transmitters TX3, TX4, TX7, TX8, which convert the parallel electrical signals to serial electrical signals. For example, the photonic integrated circuit can send serial electrical signals to the receivers RX1, RX2, RX5, RX6, and the transmitters TX3, TX4, TX7, TX8 can transmit serial electrical signals to the electronic processor integrated circuit or host application specific integrated circuit.

Similarly, serial electrical signals received at the receivers RX3, RX4, RX7, RX8 are converted to parallel electrical signals and routed by the bus processing unit 218 to the transmitters TX1, TX2, TX5, TX6, which convert the parallel electrical signals to serial electrical signals. For example, the electronic processor integrated circuit or host application specific integrated circuit can send serial electrical signals to the receivers RX3, RX4, RX7, RX8, and the transmitters TX1, TX2, TX5, TX6 can transmit serial electrical signals to the photonic integrated circuit.

In some implementations, the bus processing unit 218 can re-map the lanes of signals and perform coding on the signals, such that the bit rate and/or modulation format of the serial signals output from the transmitters TX3, TX4, TX7, TX8 can be different from the bit rate and/or modulation format of the serial signals received at the receivers RX1, RX2, RX5, RX6. Similarly, the bus processing unit 218 can re-map the lanes of signals and perform coding on the signals such that the bit rate and/or modulation format of the serial signals output from the transmitters TX1, TX2, TX5, TX6 can be different from the bit rate and/or modulation format of the serial signals received at the receivers RX4, RX4, RX7, RX8.

FIGS. 38 and 39 show two examples of how the receivers and transmitters can be partitioned to form the first serializers/deserializers module and the second serializers/deserializers module. The partitioning can be arbitrarily determined based on application, and is not limited to the examples shown in FIGS. 38 and 39. The partitioning can be programmable and dynamically changed by the system.

Figure 19:
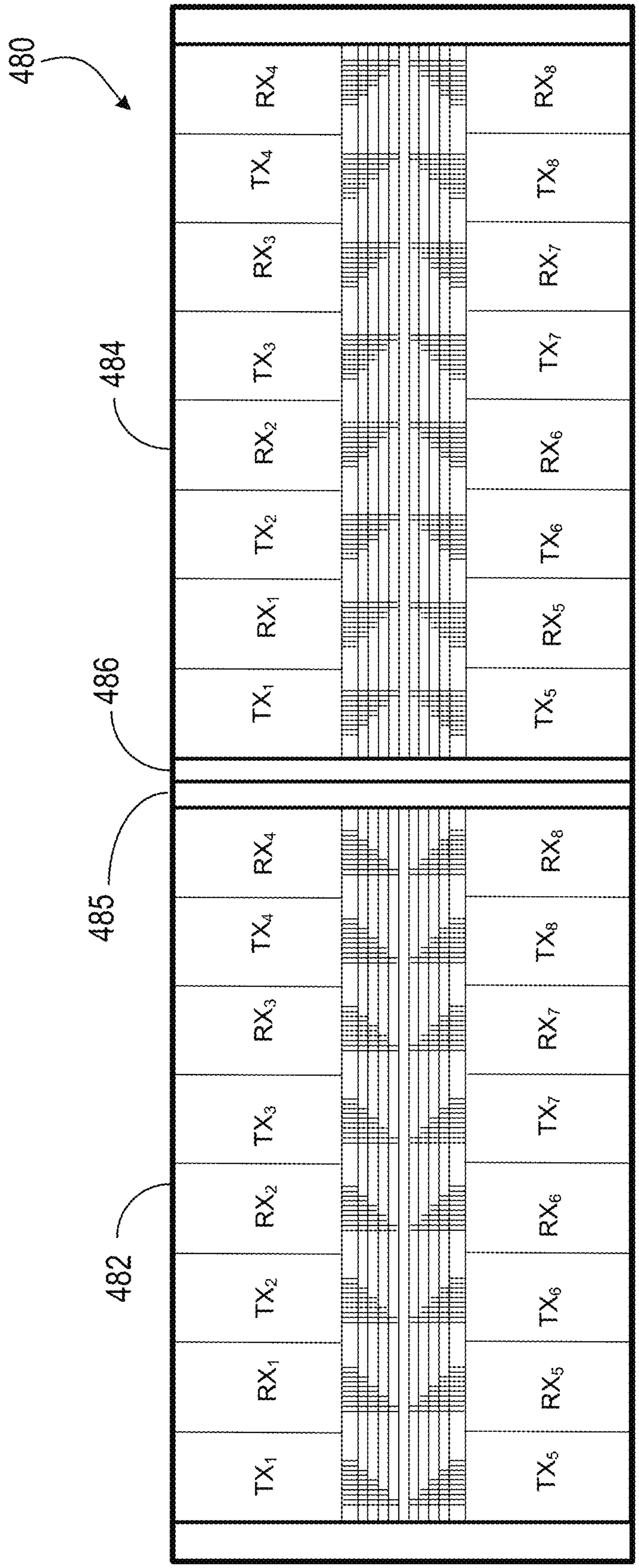
FIG. 19 is a diagram of an example electronic communication integrated circuit.

FIG. 19 is a diagram of an example electronic communication integrated circuit 480 that includes a first octal serializers/deserializers block 482 electrically coupled to a second octal serializers/deserializers block 484. For example, the electronic communication integrated circuit 480 can be used as the electronic communication integrated circuit 215 of FIGS. 2 and 3. The first octal serializers/deserializers block 482 can be used as the first serializers/deserializers module 216, and the second octal serializers/deserializers block 484 can be used as the second serializers/deserializers module 217. For example, the first octal serializers/deserializers block 482 can receive 8 serial differential signals, e.g., through electrical terminals arranged at the bottom side of the block, and generate 8 sets of parallel signals based on the 8 serial differential signals, in which each set of parallel signals is generated based on the corresponding serial differential signal. The first octal serializers/deserializers block 482 can condition serial electrical signals upon conversion into the 8 sets of parallel signals, such as performing clock and data recovery, and/or signal equalization. The first octal serializers/deserializers block 482 transmits the 8 sets of parallel signals to the second octal serializers/deserializers block 484 through a parallel bus 485 and a parallel bus 486. The second octal serializers/deserializers block 484 can generate 8 serial differential signals based on the 8 sets of parallel signals, in which each serial differential signal is generated based on the corresponding set of parallel signals. The second octal serializers/deserializers block 484 can output the 8 serial differential signals through, e.g., electrical terminals arranged at the bottom side of the block.

Figure 33:
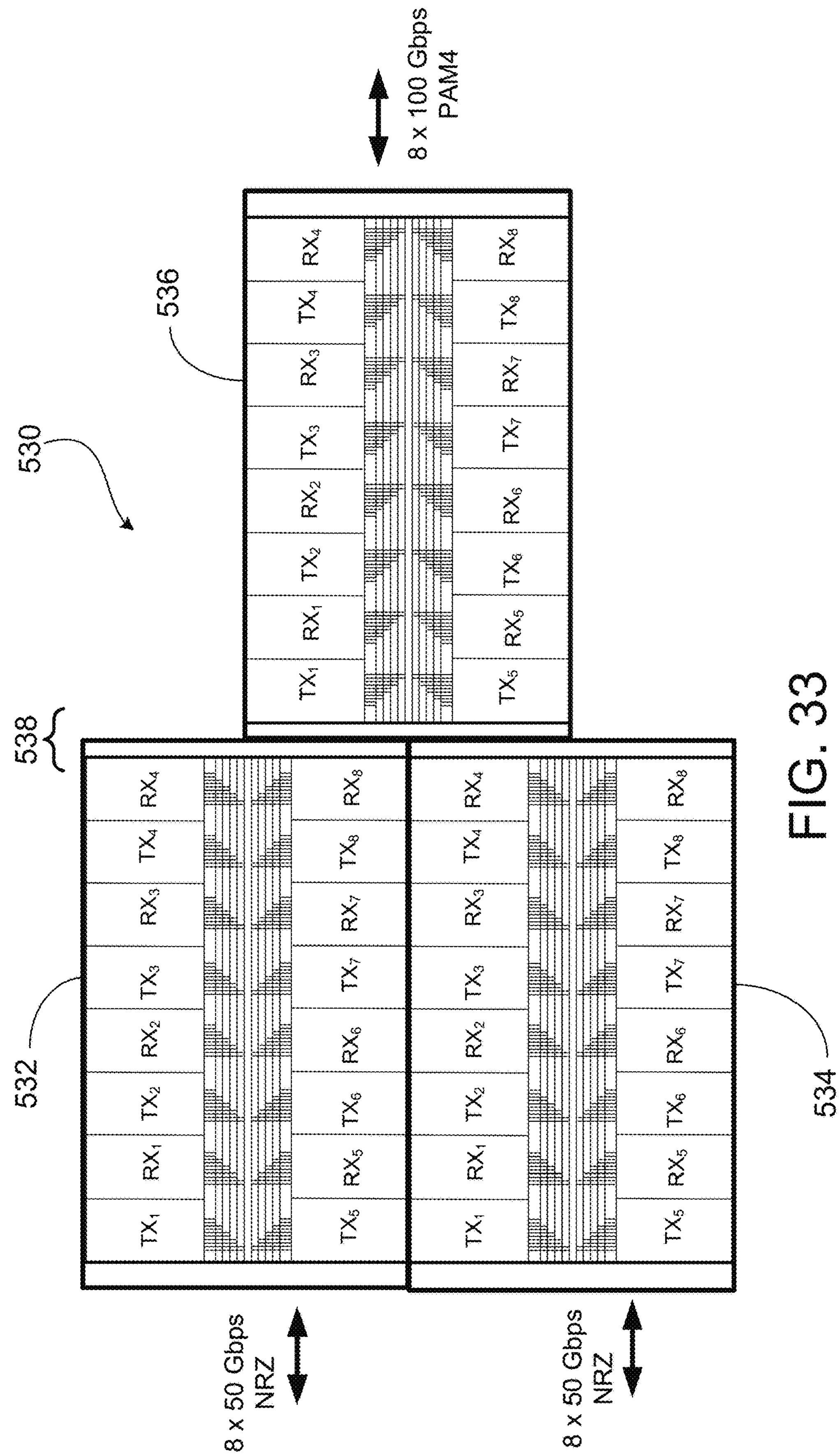
FIG. 33 is a diagram of an example electronic communication integrated circuit that includes octal serializers/deserializers blocks.
Figure 41A:
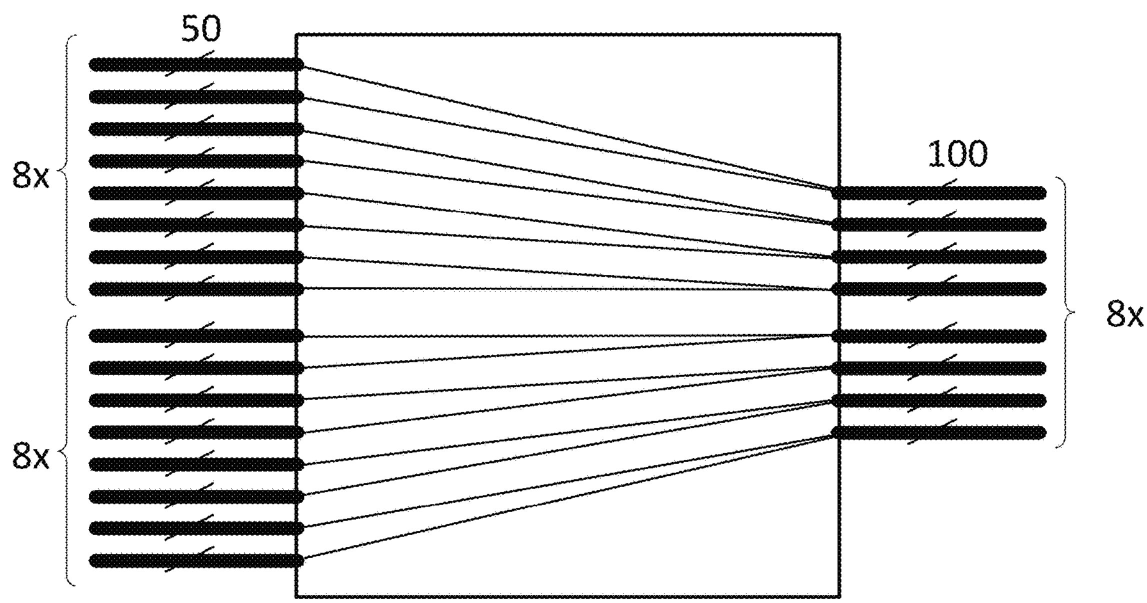

Multiple serializers/deserializers blocks can be electrically coupled to multiple serializers/deserializers blocks through a bus processing unit that can be, e.g., a parallel bus of electrical lanes, a static or a dynamically reconfigurable cross-connect device, or a re-mapping device (gearbox). FIG. 33 is a diagram of an example electronic communication integrated circuit 530 that includes a first octal serializers/deserializers block 532 and a second octal serializers/deserializers block 534 electrically coupled to a third octal serializers/deserializers block 536 through a bus processing unit 538. In this example, the bus processing unit 538 is configured to enable switching of the signals, allowing the routing of signals to be re-mapped, in which 8×50 Gbps serial electrical signals using NRZ modulation that are serially interfaced to the first and second octal serializers/deserializers blocks 532 and 534 are re-routed or combined into 8×100 Gbps serial electrical signals using PAM4 modulation that are serially interfaced to the third octal serializers/deserializers block 536. An example of the bus processing unit 538 is shown in FIG. 41A. In some examples, the bus processing unit 538 enables N lanes of T Gbps serial electrical signals to be remapped into N/M lanes of M×T Gbps serial electrical signals, N and Mbeing positive integers, Tbeing a real value, in which the N serially interfacing electrical signals can be modulated using a first modulation format and the M serially interfacing electrical signals can be modulated using a second modulation format.

Figure 41B:
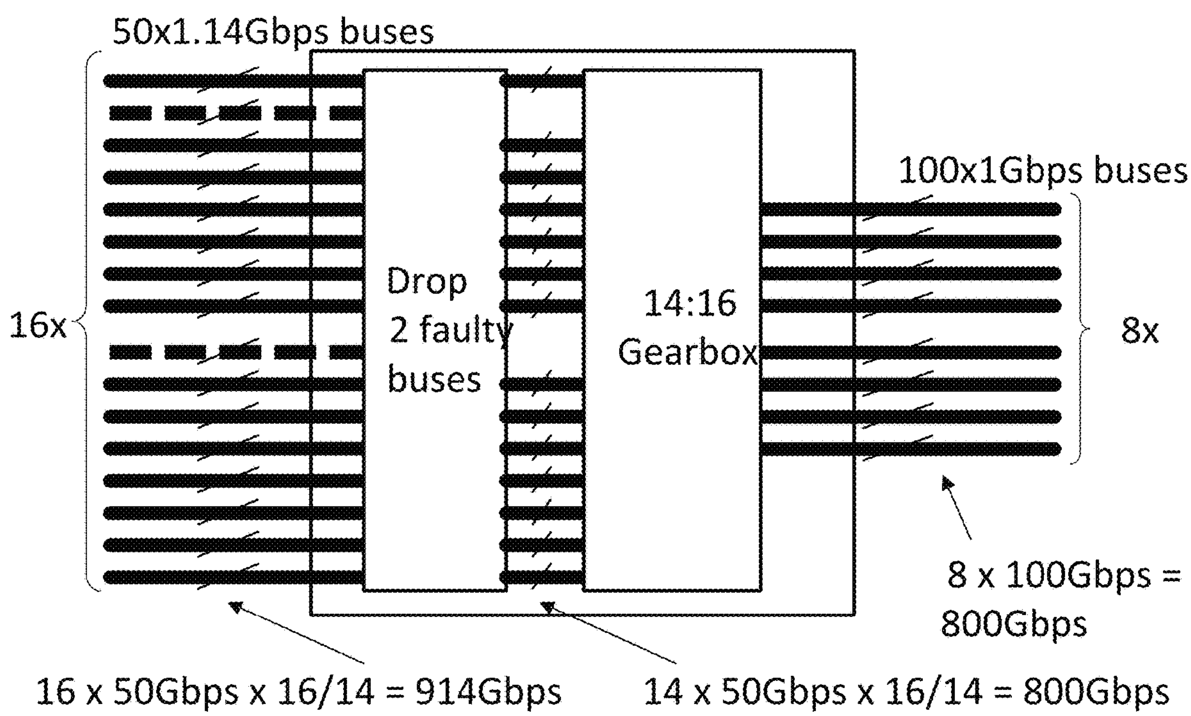

In some other examples, the bus processing unit 538 can allow for redundancy to increase reliability. For example, the first and the second serializers/deserializers blocks 532 and 534 can be jointly configured to serially interface to a total of N lanes of T×N/(N−k) Gbps electrical signals, while the third serializers/deserializers block 536 can be configured to serially interface to N lanes of T Gbps electrical signals. The bus processing unit 538 can then be configured to remap the data from only N-k out of the N lanes serially interfacing to the first and the second serializers/deserializers blocks 532 and 534 (carrying an aggregate bit rate of (N−k)×T×N/(N−k)=T×N) to the third serializers/deserializers block 536. This way, the bus processing unit 538 allows for k out of N serially interfacing electrical links to the first and the second serializers/deserializers blocks 532 and 534 to fail while still maintaining an aggregate of T×N Gbps of data serially interfacing to the third serializers/deserializers block 536. The number k is a positive integer. In some embodiments, k can be approximately 1% of N. In some other embodiments, k can be approximately 10% of N. In some embodiment, the selection of which N-k of the N serially interfacing electrical links to the first and the second serializers/deserializers blocks 532 and 534 to remap to the third serializers/deserializers block 536 using bus processing unit 538 can be dynamically selected, e.g., based on signal integrity and signal performance information extracted from the serially interfacing signals by the serializers/deserializers blocks 532 and 534. An example of the bus processing unit 538 is shown in FIG. 41B, in which N=16, k=2, T=50 Gbps.

In some examples, using the redundancy technique discussed above, the bus processing unit 538 enables N lanes of T×N/(N−k) Gbps serial electrical signals to be remapped into N/M lanes of M×T Gbps serial electrical signals. The bus processing unit 538 enables k out of N serially interfacing electrical links to fail while still maintaining an aggregate of T×N Gbps of data serially interfacing to the third serializers/deserializers block 536.

Figure 20:
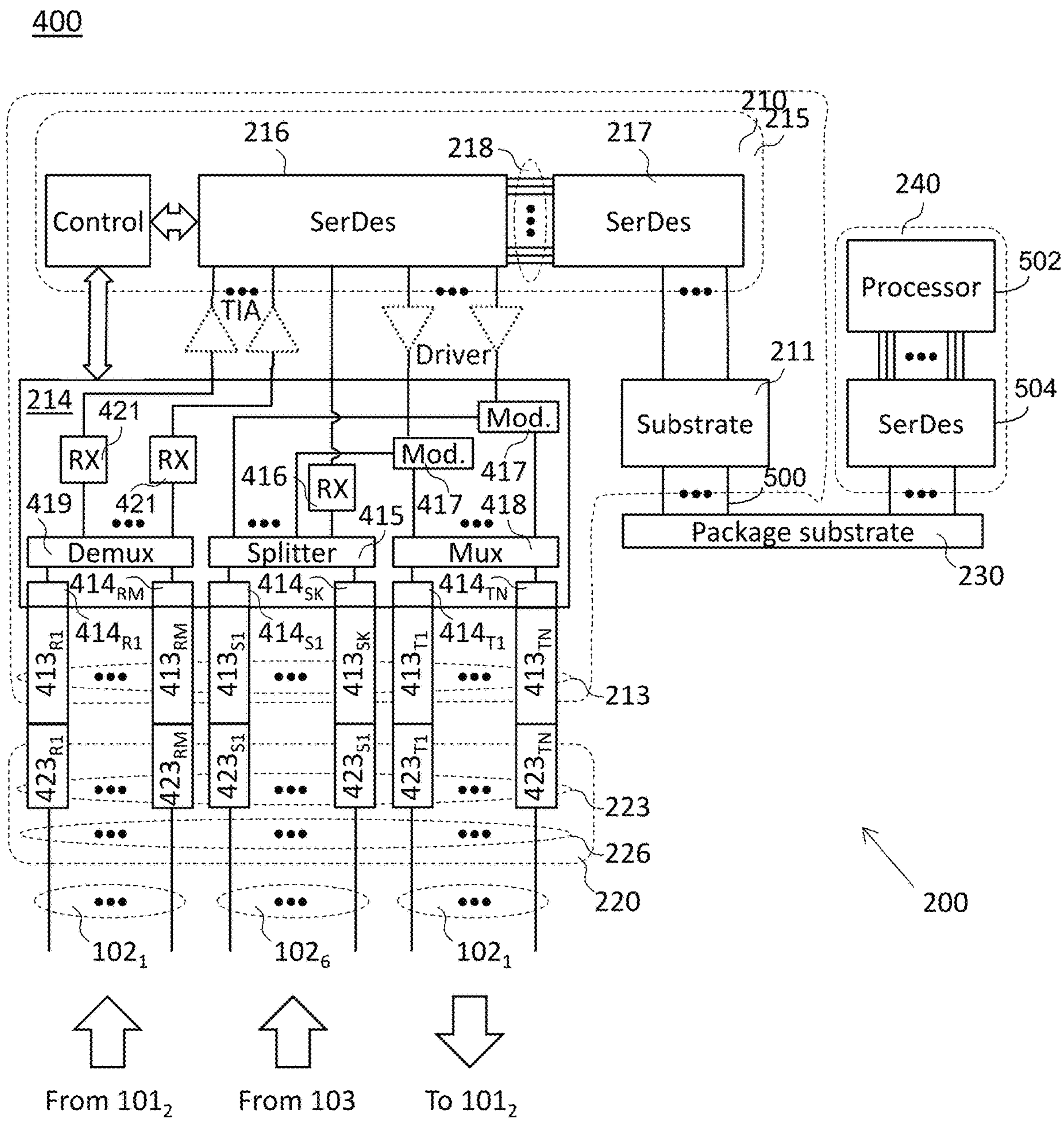
FIG. 20 is a functional block diagram of an example data processing system.

FIG. 20 is a functional block diagram of an example data processing system 200, which can be used to implement, e.g., one or more of devices 101_1 to 101_6 of FIG. 1. Without implied limitation, the data processing system 200 is shown as part of the node 101_1 for illustration purposes. The data processing system 200 can be part of any other network element of the system 100. The data processing system 200 includes an integrated communication device 210, a fiber-optic connector assembly 220, a package substrate 230, and an electronic processor integrated circuit 240.

The connector assembly 220 includes a connector 223 and a fiber array 226. The connector 223 can include multiple individual fiber-optic connectors 423_*i* (i∈{R1 . . . RM; S1 . . . SK; T1 . . . TN} with K, M, and N being positive integers). In some embodiments, some or all of the individual connectors 423_*i* can form a single physical entity. In some embodiments some or all of the individual connectors 423_*i* can be separate physical entities. When operating as part of the network element 101_1 of the system 100, (i) the connectors 423_S1 through 423_SK can be connected to optical power supply 103, e.g., through link 102_6, to receive supply light; (ii) the connectors 423_R1 through 423 RM can be connected to the transmitters of the node 101_2, e.g., through the link 102_1, to receive from the node 101_2 optical communication signals; and (iii) the connectors 423_T1 through 423_TN can be connected to the receivers of the node 101_2, e.g., through the link 102_1, to transmit to the node 101_2 optical communication signals.

In some implementations, the communication device 210 includes an electronic communication integrated circuit 215, a photonic integrated circuit 214, a connector part 213, and a substrate 211. The connector part 213 can include multiple individual optical connectors 413_*i* to photonic integrated circuit 214 (i∈{R1 . . . RM; S1 . . . SK; T1 . . . TN} with K, M, and N being positive integers). In some embodiments, some or all of the individual connectors 413_*i* can form a single physical entity. In some embodiments some or all of the individual connectors 413_*i* can be separate physical entities. The optical connectors 413_*i* are configured to optically couple light to the photonic integrated circuit 214 using optical coupling interfaces 414, e.g., vertical grating couplers, turning mirrors, etc., as disclosed in U.S. patent application Ser. No. 16/816,171, now U.S. Pat. No. 11,287,585.

In operation, light entering the photonic integrated circuit 214 from the link 102_6 through coupling interfaces 414_S1 through 414_SK can be split using an optical splitter 415. The optical splitter 415 can be an optical power splitter, an optical polarization splitter, an optical wavelength demultiplexer, or any combination or cascade thereof, e.g., as disclosed in U.S. patent application Ser. No. 16/847,705, now U.S. Pat. No. 11,153,670, and in U.S. patent application Ser. No. 16/888,890, filed on Jun. 1, 2020, now U.S. Pat. No. 11,621,795, which is incorporated herein by reference in its entirety. In some embodiments, one or more splitting functions of the splitter 415 can be integrated into the optical coupling interfaces 414 and/or into optical connectors 413. For example, in some embodiments, a polarization-diversity vertical grating coupler can be configured to simultaneously act as a polarization splitter 415 and as a part of optical coupling interface 414. In some other embodiments, an optical connector that includes a polarization-diversity arrangement can simultaneously act as an optical connector 413 and as a polarization splitter 415.

In some embodiments, light at one or more outputs of the splitter 415 can be detected using a receiver 416, e.g., to extract synchronization information as disclosed in U.S. patent application Ser. No. 16/847,705, now U.S. Pat. No. 11,153,670. In various embodiments, the receiver 416 can include one or more p-i-n photodiodes, one or more avalanche photodiodes, one or more self-coherent receivers, or one or more analog (heterodyne/homodyne) or digital (intradyne) coherent receivers. In some embodiments, one or more opto-electronic modulators 417 can be used to modulate onto light at one or more outputs of the splitter 415 data for communication to other network elements.

Modulated light at the output of the modulators 417 can be multiplexed in polarization or wavelength using a multiplexer 418 before leaving the photonic integrated circuit 214 through optical coupling interfaces 414_T1 through 414_TN. In some embodiments, the multiplexer 418 is not provided, i.e., the output of each modulator 417 can be directly coupled to a corresponding optical coupling interface 414.

On the receiver side, light entering the photonic integrated circuit 214 through a coupling interfaces 414_R1 through 414_RM from, e.g., the link 101_2, can first be demultiplexed in polarization and/or in wavelength using an optical demultiplexer 419. The outputs of the demultiplexer 419 are then individually detected using receivers 421. In some embodiments, the demultiplexer 419 is not provided, i.e., the output of each coupling interface 414_R1 through 414_RM can be directly coupled to a corresponding receiver 421. In various embodiments, the receiver 421 can include one or more p-i-n photodiodes, one or more avalanche photodiodes, one or more self-coherent receivers, or one or more analog (heterodyne/homodyne) or digital (intradyne) coherent receivers.

Figure 42:
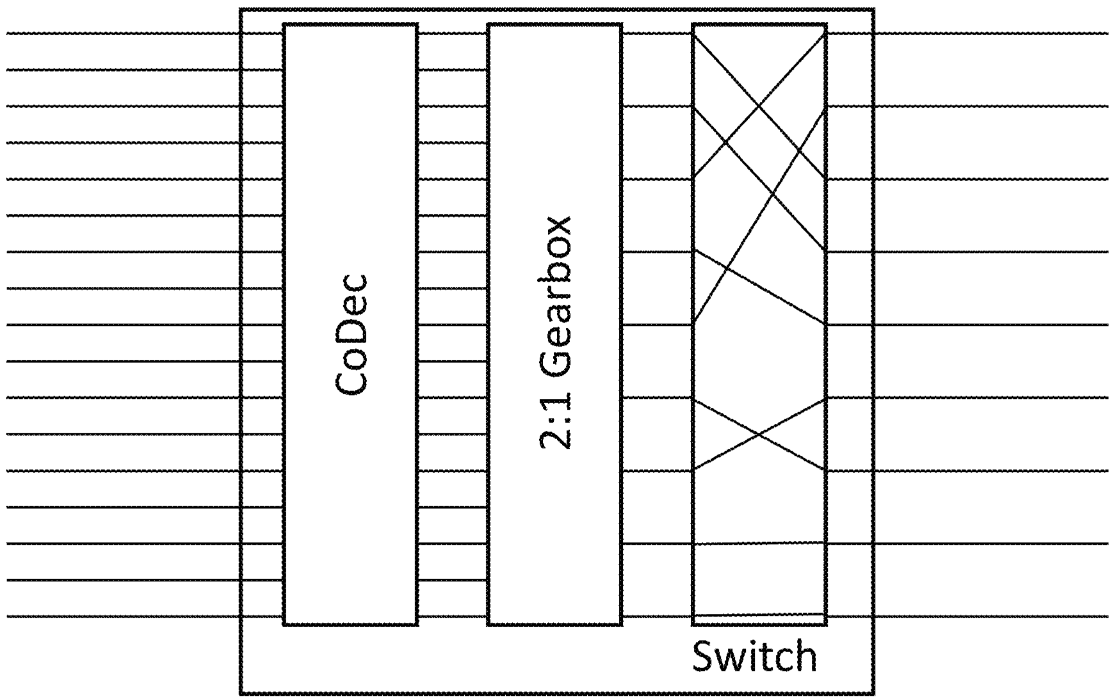

The photonic integrated circuit 214 is electrically coupled to the integrated circuit 215. In some implementations, the photonic integrated circuit 214 provides a plurality of serial electrical signals to the first serializers/deserializers module 216, which generates sets of parallel electrical signals based on the serial electrical signals, in which each set of parallel electrical signal is generated based on a corresponding serial electrical signal. The first serializers/deserializers module 216 conditions the serial electrical signals, demultiplexes them into the sets of parallel electrical signals and sends the sets of parallel electrical signals to the second serializers/deserializers module 217 through a bus processing unit 218. In some implementations, the bus processing unit 218 enables switching of signals and performs line coding and/or error-correcting coding functions. An example of the bus processing unit 218 is shown in FIG. 42.

The second serializers/deserializers module 217 generates a plurality of serial electrical signals based on the sets of parallel electrical signals, in which each serial electrical signal is generated based on a corresponding set of parallel electrical signal. The second serializers/deserializers module 217 sends the serial electrical signals through electrical connectors that pass through the substrate 211 in the thickness direction to an array of electrical terminals 500 that are arranged on the bottom surface of the substrate 211. For example, the array of electrical terminals 500 configured to enable the integrated communication device 210 to be easily coupled to, or removed from, the package substrate 230.

In some implementations, the electronic processor integrated circuit 240 includes a data processor 502 and an embedded third serializers/deserializers module 504. The third serializers/deserializers module 504 receives the serial electrical signals from the second serializers/deserializers module 217, and generates sets of parallel electrical signals based on the serial electrical signals, in which each set of parallel electrical signal is generated based on a corresponding serial electrical signal. The data processor 502 processes the sets of parallel signals generated by the third serializers/deserializers module 504.

In some implementations, the data processor 502 generates sets of parallel electrical signals, and the third serializers/deserializers module 504 generates serial electrical signals based on the sets of parallel electrical signals, in which each serial electrical signal is generated based on a corresponding set of parallel electrical signal. The serial electrical signals are sent to the second serializers/deserializers module 217, which generates sets of parallel electrical signals based on the serial electrical signals, in which each set of parallel electrical signal is generated based on a corresponding serial electrical signal. The second serializers/deserializers module 217 sends the sets of parallel electrical signals to the first serializers/deserializers module 216 through the bus processing unit 218. The first serializers/deserializers module 216 generates serial electrical signals based on the sets of parallel electrical signals, in which each serial electrical signal is generated based on a corresponding set of parallel electrical signals. The first serializers/deserializers module 216 sends the serial electrical signals to the photonic integrated circuit 214. The opto-electronic modulators 417 modulate optical signals based on the serial electrical signals, and the modulated optical signals are output from the photonic integrated circuit 214 through optical coupling interfaces 414_T1 through 414_TN.

In some embodiments, supply light from the optical power supply 103 includes an optical pulse train, and synchronization information extracted by the receiver 416 can be used by the serializers/deserializers module 216 to align the electrical output signals of the serializers/deserializers module 216 with respective copies of the optical pulse trains at the outputs of the splitter 415 at the modulators 417. For example, the optical pulse train can be used as an optical power supply at the optical modulator. In some such implementations, the first serializers/deserializers module 216 can include interpolators or other electrical phase adjustment elements.

Figure 21:
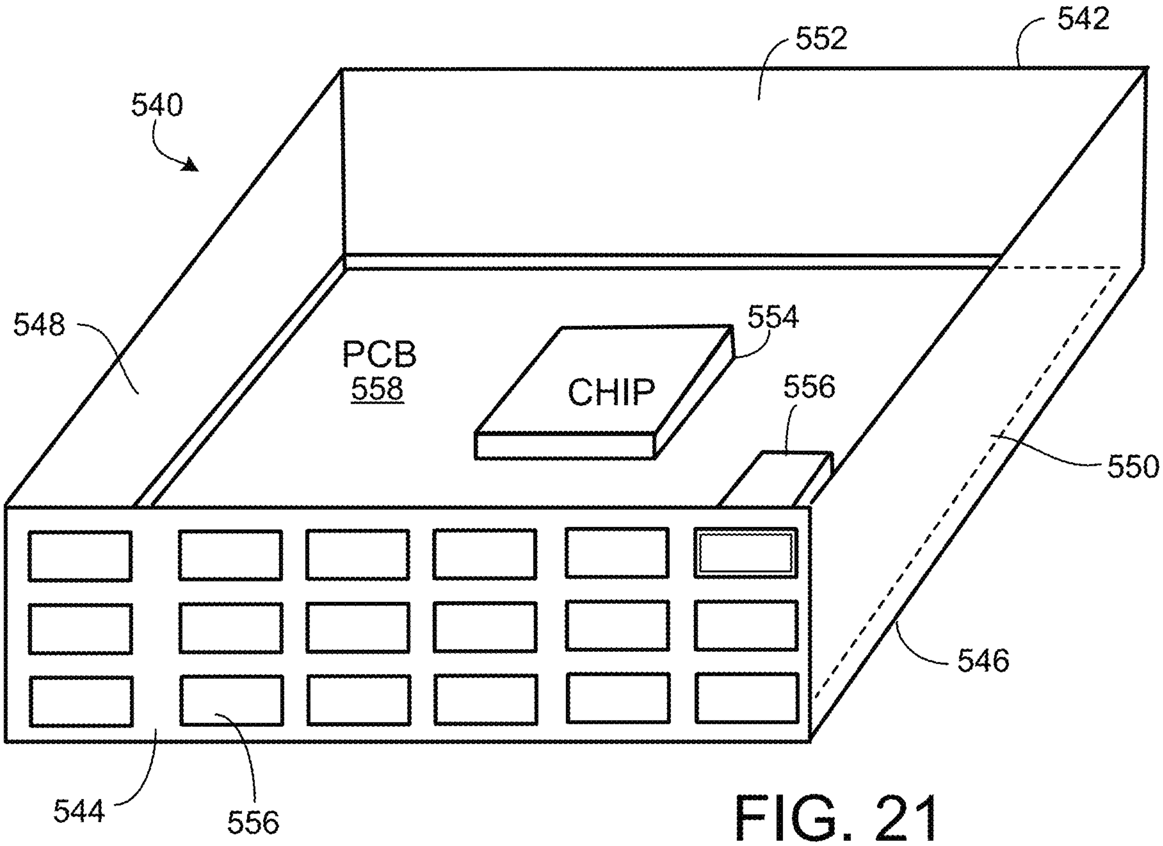
FIG. 21 is a diagram of an example rackmount data processing system.

Referring to FIG. 21, in some implementations, a data processing system 540 includes an enclosure or housing 542 that has a front panel 544, a bottom panel 546, side panels 548 and 550, a rear panel 552, and a top panel (not shown in the figure). The system 540 includes a printed circuit board 558 that extends substantially parallel to the bottom panel 546. A data processing chip 554 is mounted on the printed circuit board 558, in which the chip 554 can be, e.g., a network switch, a central processor unit, a graphics processor unit, a tensor processing unit, a neural network processor, an artificial intelligence accelerator, a digital signal processor, a microcontroller, or an application specific integrated circuit (ASIC).

At the front panel 544 are pluggable input/output interfaces 556 that allow the data processing chip 554 to communicate with other systems and devices. For example, the input/output interfaces 556 can receive optical signals from outside of the system 540 and convert the optical signals to electrical signals for processing by the data processing chip 554. The input/output interfaces 556 can receive electrical signals from the data processing chip 554 and convert the electrical signals to optical signals that are transmitted to other systems or devices. For example, the input/output interfaces 556 can include one or more of small form factor pluggable (SFP), SFP+, QSFP, QSFP28, or QSFP56 transceivers. The electrical signals from the transceiver outputs are routed to the data processing chip 554 through electrical connectors on or in the printed circuit board 558.

In the examples shown in FIGS. 21 to 29B, 69A, 70, 71A, 72, 72A, 74A, 75A, 75C, 76, 77A, 77B, 78, 96 to 98, 100, 110, 112, 113, 115, 117 to 122, 125A to 127, 129, 136 to 149, 159, and 160, various embodiments can have various form factors, e.g., in some embodiments the top panel and the bottom panel 546 can have the largest area, in other embodiments the side panels 548 and 550 can have the largest area, and in yet other embodiments the front panel 544 and the rear panel 552 can have the largest area. In various embodiments, the printed circuit board 558 can be substantially parallel to the two side panels, e.g., the data processing system 540 as shown in FIG. 21 can stand on one of its side panels during normal operation (such that the side panel 550 is positioned at the bottom, and the bottom panel 546 is positioned at the side). In various embodiments, the data processing system 540 can comprise two or more printed circuit boards some of which can be substantially parallel to the bottom panel and some of which can be substantially parallel to the side panels. For example, in some computer systems for machine learning/artificial intelligence applications have vertical circuit boards that are plugged into the systems. As used herein, the distinction between "front" and "back" is made based on where the majority of input/output interfaces 556 are located, irrespective of what a user may consider the front or back of data processing system 540.

Figure 22:
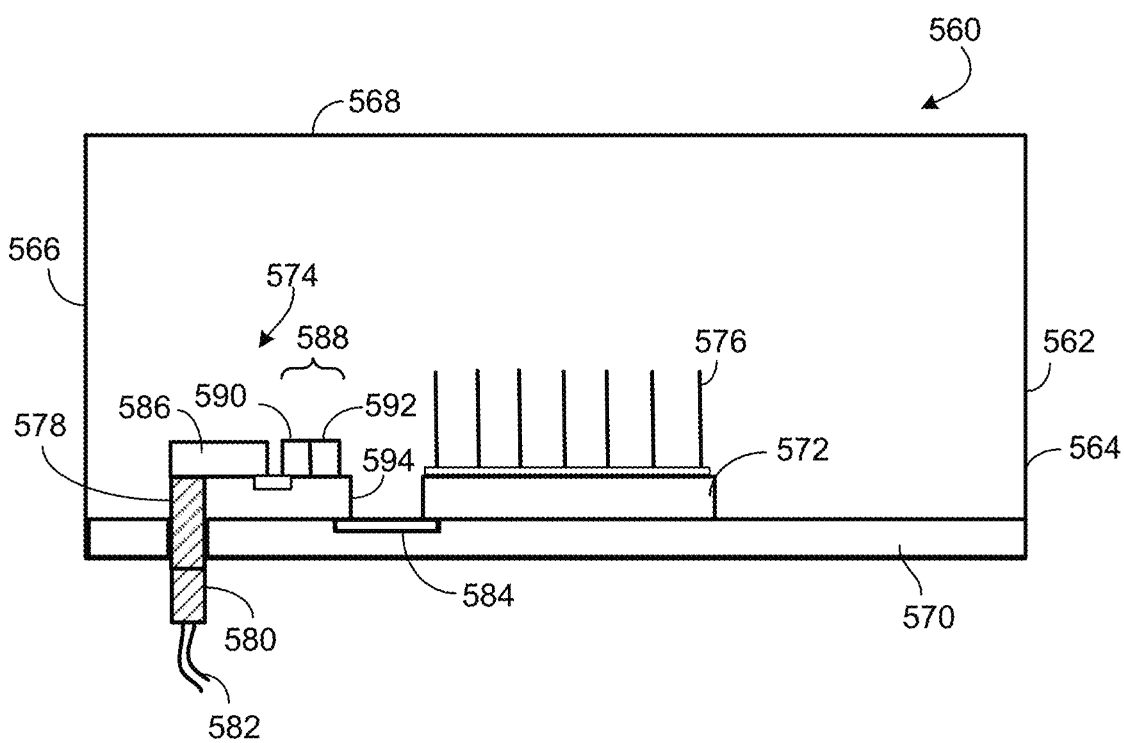
FIGS. 22, 23, 24, 25, 26A, 26B, 26C, 27, 28A, and 28B are top view diagrams of examples of rackmount data processing systems incorporating optical interconnect modules.

FIG. 22 is a diagram of a top view of an example data processing system 560 that includes a housing 562 having side panels 564 and 566, and a rear panel 568. The system 560 includes a vertically mounted printed circuit board 570 that can also function as the front panel. The surface of the printed circuit board 570 is substantially perpendicular to the bottom panel of the housing 562. The term "substantially perpendicular" is meant to take into account of manufacturing and assembly tolerances, so that if a first surface is substantially perpendicular to a second surface, the first surface is at an angle in a range from 85° to 95° relative to the second surface. On the printed circuit board 570 are mounted a data processing chip 572 and an integrated communication device 574. In some examples, the data processing chip 572 and the integrated communication device 574 are mounted on a substrate (e.g., a ceramic substrate), and the substrate is attached (e.g., electrically coupled) to the printed circuit board 570. The data processing chip 572 can be, e.g., a network switch, a central processor unit, a graphics processor unit, a tensor processing unit, a neural network processor, an artificial intelligence accelerator, a digital signal processor, a microcontroller, or an application specific integrated circuit (ASIC). A heat sink 576 is provided on the data processing chip 572.

In some implementations, the integrated communication device 574 includes a photonic integrated circuit 586 and an electronic communication integrated circuit 588 mounted on a substrate 594. The electronic communication integrated circuit 588 includes a first serializers/deserializers module 590 and a second serializers/deserializers module 592. The printed circuit board 570 can be similar to the package substrate 230 (FIGS. 2, 4, 11-14), the data processing chip 572 can be similar to the electronic processor integrated circuit or application specific integrated circuit 240, and the integrated communication device 574 can be similar to the integrated communication device 210, 252, 374, 382, 402, 428. In some embodiments, the integrated communication device 574 is soldered to the printed circuit board 570. In some other embodiments, the integrated communication device 574 is removably connected to the printed circuit board 570, e.g., via a land grid array or a compression interposer. Related holding fixtures including snap-on or screw-on mechanisms are not shown in the figure.

In some examples, the integrated communication device 574 includes a photonic integrated circuit without serializers/deserializers modules, and drivers/transimpedance amplifiers (TIA) are provided separately. In some examples, the integrated communication device 574 includes a photonic integrated circuit and drivers/transimpedance amplifiers but without serializers/deserializers modules.

The integrated communication device 574 includes a first optical connector 578 that is configured to receive a second optical connector 580 that is coupled to a bundle of optical fibers 582. The integrated communication device 574 is electrically coupled to the data processing chip 572 through electrical connectors or traces 584 on or in the printed circuit board 570. Because the data processing chip 572 and the integrated communication device 574 are both mounted on the printed circuit board 570, the electrical connectors or traces 584 can be made shorter, compared to the electrical connectors that electrically couple the transceivers 556 to the data processing chip 554 of FIG. 21. Using shorter electrical connectors or traces 584 allows the signals to have a higher data rate with lower noise, lower distortion, and/or lower crosstalk. Mounting the printed circuit board 570 perpendicular to the bottom panel of the housing allows for more easily accessible connections to the integrated communication device 574 that may be removed and re-connected without, e.g., removing the housing from a rack.

In some examples, the bundle of optical fibers 582 can be firmly attached to the photonic integrated circuit 586 without the use of the first and second optical connectors 578, 580.

The printed circuit board 570 can be secured to the side panels 564 and 566, and the bottom and top panels of the housing using, e.g., brackets, screws, clips, and/or other types of fastening mechanisms. The surface of the printed circuit board 570 can be oriented perpendicular to bottom panel of the housing, or at an angle (e.g., between −60° to 60°) relative to the vertical direction (the vertical direction being perpendicular to the bottom panel). The printed circuit board 570 can have multiple layers, in which the outermost layer (i.e., the layer facing the user) has an exterior surface that is configured to be aesthetically pleasing.

The first optical connector 578, the second optical connector 580, and the bundle of optical fibers 582 can be similar to those shown in FIGS. 2, 4, and 11-16. As described above, the bundle of fibers 582 can include 10 or more optical fibers, 100 or more optical fibers, 500 or more optical fibers, or 1000 or more optical fibers. The optical signals provided to the photonic integrated circuit 586 can have a high total bandwidth, e.g., about 1.6 Tbps, or about 12.8 Tbps, or more.

Although FIG. 22 shows one integrated communication device 574, there can be additional integrated communication devices 574 that are electrically coupled to the data processing chip 572. The data processing system 560 can include a second printed circuit board (not shown in the figure) oriented parallel to the bottom panel of the housing 562. The second printed circuit board can support other optical and/or electronic devices, such as storage devices, memory chips, controllers, power supply modules, fans, and other cooling devices.

In some examples of the data processing system 540 (FIG. 21), the transceiver 556 can include circuitry (e.g., integrated circuits) that perform some type of processing of the signals and/or the data contained in the signals. The signals output from the transceiver 556 need to be routed to the data processing chip 554 through longer signal paths that place a limit on the data rate. In some data processing systems, the data processing chip 554 outputs processed data that are routed to one of the transceivers and transmitted to another system or device. Again, the signals output from the data processing chip 554 need to be routed to the transceiver 556 through longer signal paths that place a limit on the data rate. By comparison, in the data processing system 560 (FIG. 22), the electrical signals that are transmitted between the integrated communication devices 574 and the data processing chip 572 pass through shorter signal paths and thus support a higher data rate.

Figure 23:
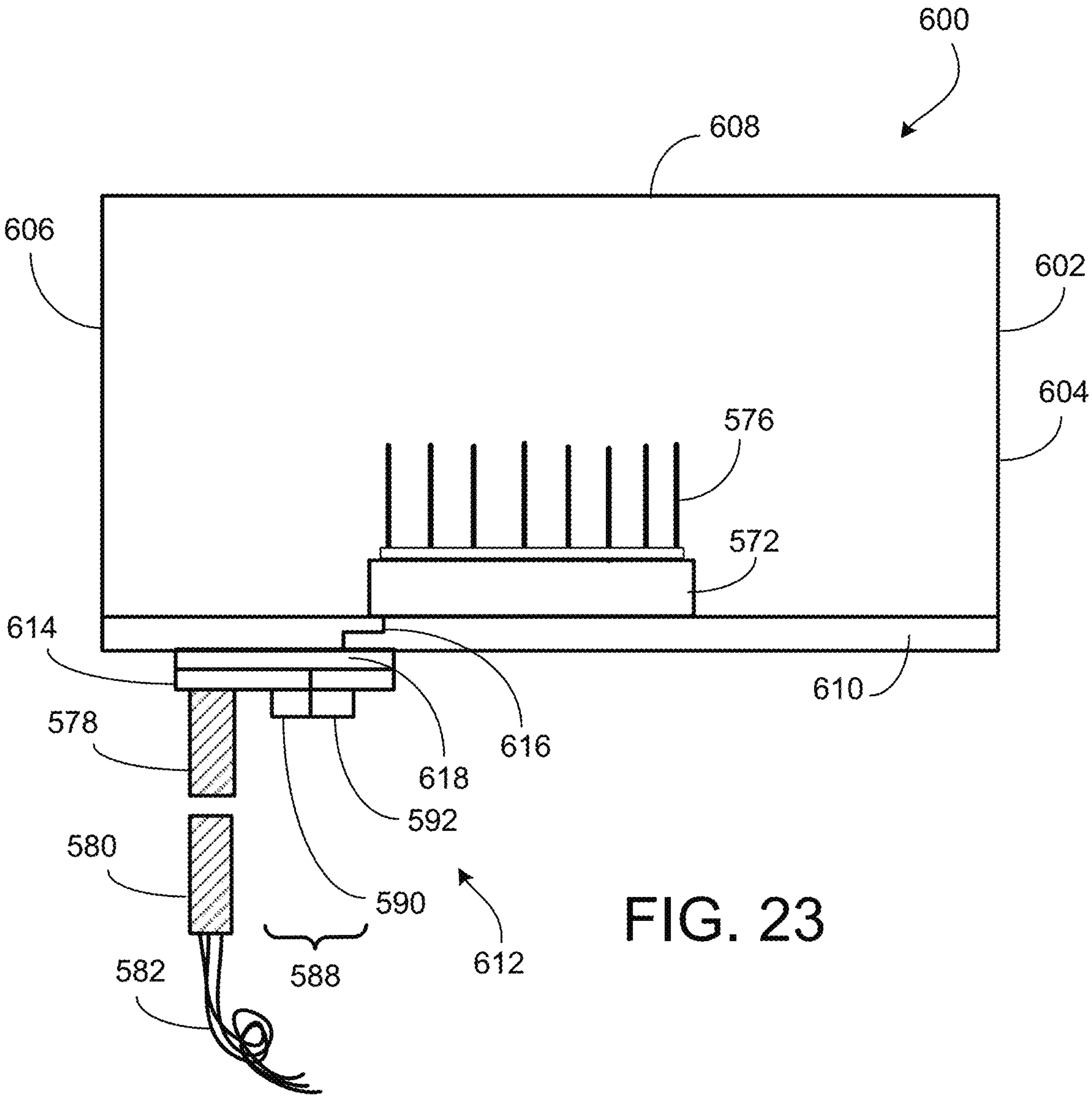

FIG. 23 is a diagram of a top view of an example data processing system 600 that includes a housing 602 having side panels 604 and 606, and a rear panel 608. The system 600 includes a vertically mounted printed circuit board 610 that functions as the front panel. The surface of the printed circuit board 610 is substantially perpendicular to the bottom panel of the housing 602. A data processing chip 572 is mounted on an interior side of the printed circuit board 610, and an integrated communication device 612 is mounted on an exterior side of the printed circuit board 610. In some examples, the data processing chip 572 is mounted on a substrate (e.g., a ceramic substrate), and the substrate is attached to the printed circuit board 610. In some embodiments, the integrated communication device 612 is soldered to the printed circuit board 610. In some other embodiments, the integrated communication device 612 is removably connected to the printed circuit board 610, e.g., via a land grid array or a compression interposer. Related holding fixtures including snap-on or screw-on mechanisms are not shown in the figure. A heat sink 576 is provided on the data processing chip 572.

In some implementations, the integrated communication device 612 includes a photonic integrated circuit 614 and an electronic communication integrated circuit 588 mounted on a substrate 618. The electronic communication integrated circuit 588 includes a first serializers/deserializers module 590 and a second serializers/deserializers module 592. The integrated communication device 612 includes a first optical connector 578 that is configured to receive a second optical connector 580 that is coupled to a bundle of optical fibers 582. The integrated communication device 612 is electrically coupled to the data processing chip 572 through electrical connectors or traces 616 that pass through the printed circuit board 610 in the thickness direction. Because the data processing chip 572 and the integrated communication device 612 are both mounted on the printed circuit board 610, the electrical connectors or traces 616 can be made shorter, thereby allowing the signals to have a higher data rate with lower noise, lower distortion, and/or lower crosstalk. Mounting the integrated communication device 612 on the outside of the printed circuit board 610 perpendicular to the bottom panel of the housing and accessible from outside the housing allows for more easily accessible connections to the integrated communication device 612 that may be removed and re-connected without, e.g., removing the housing from a rack.

In some examples, the integrated communication device 612 includes a photonic integrated circuit without serializers/deserializers modules, and drivers and transimpedance amplifiers (TIA) are provided separately. In some examples, the integrated communication device 612 includes a photonic integrated circuit and drivers/transimpedance amplifiers but without serializers/deserializers modules. In some examples, the bundle of optical fibers 582 can be firmly attached to the photonic integrated circuit 614 without the use of the first and second optical connectors 578, 580.

In some examples, the data processing chip 572 is mounted on the rear side of the substrate, and the integrated communication device 612 are removably attached to the front side of the substrate, in which the substrate provides high speed connections between the data processing chip 572 and the integrated communication device 612. For example, the substrate can be attached to a front side of a printed circuit board, in which the printed circuit board includes an opening that allows the data processing chip 572 to be mounted on the rear side of the substrate. The printed circuit board can provide from a motherboard electrical power to the substrate (and hence to the data processing chip 572 and the integrated communication device 612, and allow the data processing chip 572 and the integrated communication device 612 to connect to the motherboard using low-speed electrical links.

The printed circuit board 610 can be secured to the side panels 604 and 606, and the bottom and top panels of the housing using, e.g., brackets, screws, clips, and/or other types of fastening mechanisms. The surface of the printed circuit board 610 can be oriented perpendicular to bottom panel of the housing, or at an angle (e.g., between −60° to 60°) relative to the vertical direction (the vertical direction being perpendicular to the bottom panel). The printed circuit board 610 can have multiple layers, in which the portion of the outermost layer (i.e., the layer facing the user) not covered by the integrated communication device 612 has an exterior surface that is configured to be aesthetically pleasing.

Figure 24:
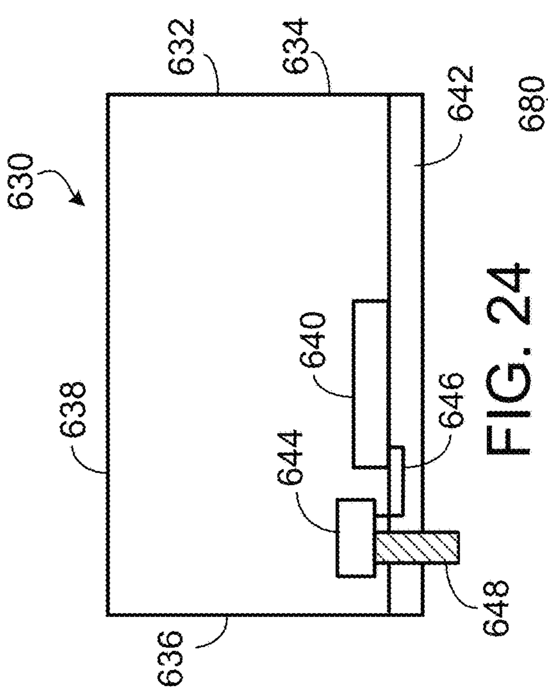

FIGS. 24-27 below illustrate four general designs in which the data processing chips are positioned near the input/output communication interfaces. FIG. 24 is a top view of an example data processing system 630 in which a data processing chip 640 is mounted near an optical/electrical communication interface 644 to enable high bandwidth data paths (e.g., one, ten, or more Gigabits per second per data path) between the data processing chip 640 and the optical/electrical communication interface 644. In this example, the data processing chip 640 and the optical/electrical communication interface 644 are mounted on a circuit board 642 that functions as the front panel of an enclosure 632 of the system 630, thus allowing optical fibers to be easily coupled to the optical/electrical communication interface 644. In some examples, the data processing chip 640 is mounted on a substrate (e.g., a ceramic substrate), and the substrate is attached to the circuit board 642.

The enclosure 632 has side panels 634 and 636, a rear panel 638, a top panel, and a bottom panel. In some examples, the circuit board 642 is perpendicular to the bottom panel. In some examples, the circuit board 642 is oriented at an angle in a range −60° to 60° relative to a vertical direction of the bottom panel. The side of the circuit board 642 facing the user is configured to be aesthetically pleasing.

The optical/electrical communication interface 644 is electrically coupled to the data processing chip 640 by electrical connectors or traces 646 on or in the circuit board 642. The circuit board 642 can be a printed circuit board that has one or more layers. The electrical connectors or traces 646 can be signal lines printed on the one or more layers of the printed circuit board 642 and provide high bandwidth data paths (e.g., one or more Gigabits per second per data path) between the data processing chip 640 and the optical/electrical communication interface 644.

In a first example, the data processing chip 640 receives electrical signals from the optical/electrical communication interface 644 and does not send electrical signals to the optical/electrical communication interface 644. In a second example, the data processing chip 640 receives electrical signals from, and sends electrical signals to, the optical/electrical communication interface 644. In the first example, the optical/electrical communication interface 644 receives optical signals from optical fibers, generates electrical signals based on the optical signals, and sends the electrical signals to the data processing chip 640. In the second example, the optical/electrical communication interface 644 also receives electrical signals from the data processing chip, generates optical signals based on the electrical signals, and sends the optical signals to the optical fibers.

An optical connector 648 is provided to couple optical signals from the optical fibers to the optical/electrical communication interface 644. In this example, the optical connector 648 passes through an opening in the circuit board 642. In some examples, the optical connector 648 is securely fixed to the optical/electrical communication interface 644. In some examples, the optical connector 648 is configured to be removably coupled to the optical/electrical communication interface 644, e.g., by using a pluggable and releasable mechanism, which can include one or more snap-on or screw-on mechanisms. In some other examples, an array of 10 or more fibers is securely or fixedly attached to the optical connector 648.

The optical/electrical communication interface 644 can be similar to, e.g., the integrated communication device 210 (FIG. 2), 252 (FIG. 4), 374 (FIG. 11), 382 (FIG. 12), 402 (FIG. 13), and 428 (FIG. 14). In some examples, the optical/electrical communication interface 644 can be similar to the integrated optical communication device 448, 462, 466, 472 (FIG. 17), except that the optical/electrical communication interface 644 is mounted on the same side of the circuit board 642 as the data processing chip 640. The optical connector 648 can be similar to, e.g., the first optical connector part 213 (FIGS. 2, 4), the first optical connector 356 (FIGS. 11, 12), the first optical connector 404 (FIGS. 13, 14), and the first optical connector part 456 (FIG. 17). In some examples, a portion of the optical connector 648 can be part of the optical/electrical communication interface 644. In some examples, the optical connector 648 can also include the second optical connector part 223 (FIGS. 2, 4), 458 (FIG. 17) that is optically coupled to the optical fibers. FIG. 24 shows that the optical connector 648 passes through the circuit board 642. In some examples, the optical connector 648 can be short so that the optical fibers pass through, or partly through, the circuit board 642. In some examples, the optical connector is not attached vertically to a photonic integrated circuit that is part of the optical/electrical communication interface 644 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. Any such solution is conceptually included in the vertical optical coupling attachment schematically visualized in FIGS. 24-27.

Figure 25:
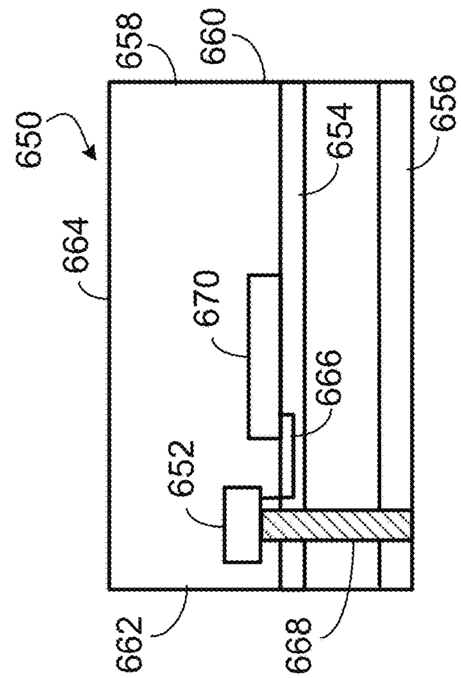

FIG. 25 is a top view of an example data processing system 650 in which a data processing chip 670 is mounted near an optical/electrical communication interface 652 to enable high bandwidth data paths (e.g., one, ten, or more Gigabits per second per data path) between the data processing chip 670 and the optical/electrical communication interface 652. In this example, the data processing chip 670 and the optical/electrical communication interface 652 are mounted on a circuit board 654 that is positioned near a front panel 656 of an enclosure 658 of the system 630, thus allowing optical fibers to be easily coupled to the optical/electrical communication interface 652. In some examples, the data processing chip 670 is mounted on a substrate (e.g., a ceramic substrate), and the substrate is attached to the circuit board 654.

The enclosure 658 has side panels 660 and 662, a rear panel 664, a top panel, and a bottom panel. In some examples, the circuit board 654 and the front panel 656 are perpendicular to the bottom panel. In some examples, the circuit board 654 and the front panel 656 are oriented at an angle in a range −60° to 60° relative to a vertical direction of the bottom panel. In some examples, the circuit board 654 is substantially parallel to the front panel 656, e.g., the angle between the surface of the circuit board 654 and the surface of the front panel 656 can be in a range of −5° to 5°. In some examples, the circuit board 654 is at an angle relative to the front panel 656, in which the angle is in a range of −45° to 45°.

The optical/electrical communication interface 652 is electrically coupled to the data processing chip 670 by electrical connectors or traces 666 on or in the circuit board 654, similar to those of the system 630. The signal path between the data processing chip 670 and the optical/electrical communication interface 652 can be unidirectional or bidirectional, similar to that of the system 630.

An optical connector 668 is provided to couple optical signals from the optical fibers to the optical/electrical communication interface 652. In this example, the optical connector 668 passes through an opening in the front panel 656 and an opening in the circuit board 654. The optical connector 668 can be securely fixed, or releasably connected, to the optical/electrical communication interface 652, similar to that of the system 630.

The optical/electrical communication interface 652 can be similar to, e.g., the integrated communication device 210 (FIG. 2), 252 (FIG. 4), 374 (FIG. 11), 382 (FIG. 12), 402 (FIG. 13), and 428 (FIG. 14). In some examples, the optical/electrical communication interface 652 can be similar to the integrated optical communication device 448, 462, 466, 472 (FIG. 17), except that the optical/electrical communication interface 652 is mounted on the same side of the circuit board 654 as the data processing chip 640. The optical connector 668 can be similar to, e.g., the first optical connector part 213 (FIGS. 2, 4), the first optical connector 356 (FIGS. 11, 12), the first optical connector 404 (FIGS. 13, 14), and the first optical connector part 456 (FIG. 17). In some examples, the optical connector is not attached vertically to a photonic integrated circuit that is part of the optical/electrical communication interface 652 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 668 can be part of the optical/electrical communication interface 652. In some examples, the optical connector 668 can also include the second optical connector part 223 (FIGS. 2, 4), 458 (FIG. 17) that is optically coupled to the optical fibers. FIG. 25 shows that the optical connector 668 passes through the front panel 656 and the circuit board 654. In some examples, the optical connector 668 can be short so that the optical fibers pass through, or partly through, the front panel 656. The optical fibers can also pass through, or partly through, the circuit board 654.

In the examples of FIGS. 24 and 25, only one optical/electrical communication interface (544, 652) is shown in the figures. It is understood that the systems 630, 650 can include multiple optical/electrical communication interfaces that are mounted on the same circuit board as the data processing chip to enable high bandwidth data paths (e.g., one, ten, or more Gigabits per second per data path) between the data processing chip and each of the optical/electrical communication interfaces.

Figure 26A:
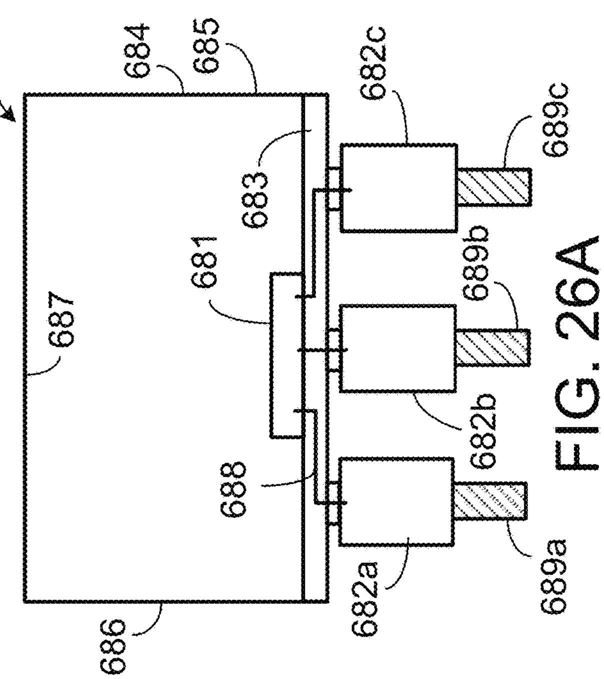

FIG. 26A is a top view of an example data processing system 680 in which a data processing chip 681 is mounted near optical/electrical communication interfaces 682*a*, 682*b*, 682*c* (collectively referenced as 682) to enable high bandwidth data paths (e.g., one, ten, or more Gigabits per second per data path) between the data processing chip 681 and each of the optical/electrical communication interfaces 682. The data processing chip 681 is mounted on a first side of a circuit board 683 that functions as a front panel of an enclosure 684 of the system 680. In some examples, the data processing chip 681 is mounted on a substrate (e.g., a ceramic substrate), and the substrate is attached to the circuit board 683. The optical/electrical communication interfaces 682 are mounted on a second side of the circuit board 683, in which the second side faces the exterior of the enclosure 684. In this example, the optical/electrical communication interfaces 682 are mounted on an exterior side of the enclosure 684, allowing optical fibers to be easily coupled to the optical/electrical communication interfaces 682.

The enclosure 684 has side panels 685 and 686, a rear panel 687, a top panel, and a bottom panel. In some examples, the circuit board 683 is perpendicular to the bottom panel. In some examples, the circuit board 683 is oriented at an angle in a range −60° to 60° (or −30° to 30°, or −10° to 10°, or −1° to 1°) relative to a vertical direction of the bottom panel.

Each of the optical/electrical communication interfaces 682 is electrically coupled to the data processing chip 681 by electrical connectors or traces 688 that pass through the circuit board 683 in the thickness direction. For example, the electrical connectors or traces 688 can be configured as vias of the circuit board 683. The signal paths between the data processing chip 681 and each of the optical/electrical communication interfaces 682 can be unidirectional or bidirectional, similar to those of the systems 630 and 650.

For example, the system 680 can be configured such that signals are transmitted unidirectionally between the data processing chip 681 and one of the optical/electrical communication interfaces 682, and bidirectionally between the data processing chip 681 and another one of the optical/electrical communication interfaces 682. For example, the system 680 can be configured such that signals are transmitted unidirectionally from the optical/electrical communication interface 682*a* to the data processing chip 681, and unidirectionally from the data processing chip to the optical/electrical communication interface 682*b* and/or optical/electrical communication interface 682*c*.

Optical connectors 689*a*, 689*b*, 689*c* (collectively referenced as 689) are provided to couple optical signals from the optical fibers to the optical/electrical communication interfaces 682*a*, 682*b*, 682*c*, respectively. The optical connectors 689 can be securely fixed, or releasably connected, to the optical/electrical communication interfaces 682, similar to those of the systems 630 and 650.

The optical/electrical communication interface 682 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interface 682 is mounted on the side of the circuit board 683 opposite to the side of the data processing chip 681. In some examples, the optical/electrical communication interface 682 can be similar to the integrated optical communication device 448, 462, 466, 472 (FIG. 17). The optical connector 689 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 682 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 689 can be part of the optical/electrical communication interface 682. In some examples, the optical connector 689 can also include the second optical connector part 223 (FIGS. 2, 4), 458 (FIG. 17) that is optically coupled to the optical fibers.

In some examples, the optical/electrical communication interfaces 682 are securely fixed (e.g., by soldering) to the circuit board 683. In some examples, the optical/electrical communication interfaces 682 are removably connected to the circuit board 683, e.g., by use of mechanical mechanisms such as one or more snap-on or screw-on mechanisms. An advantage of the system 680 is that in case of a malfunction at one of the optical/electrical communication interfaces 682, the faulty optical/electrical communication interface 682 can be replaced without opening the enclosure 684.

Figure 26C:
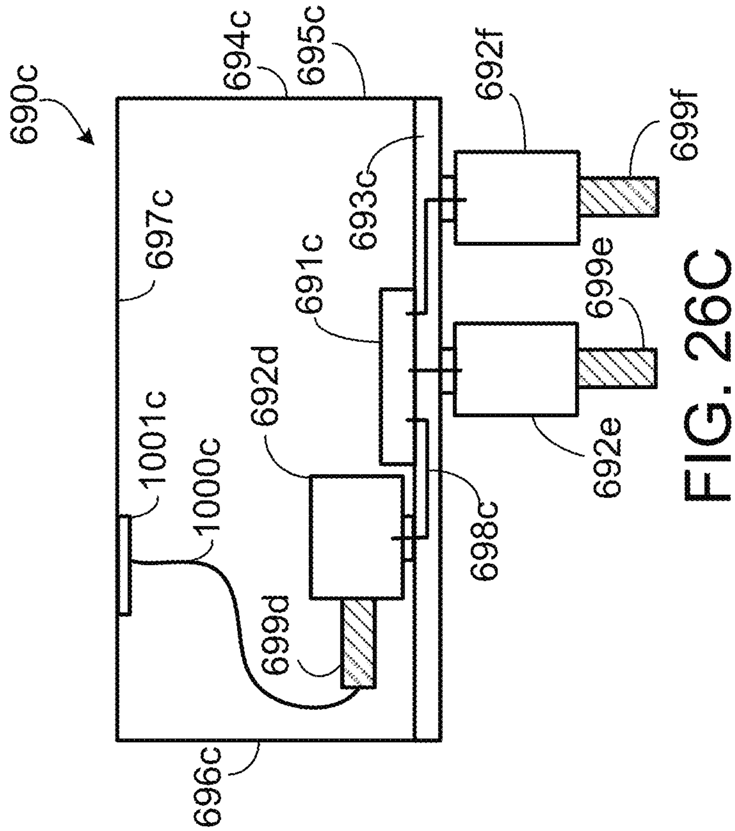
Figure 26B:
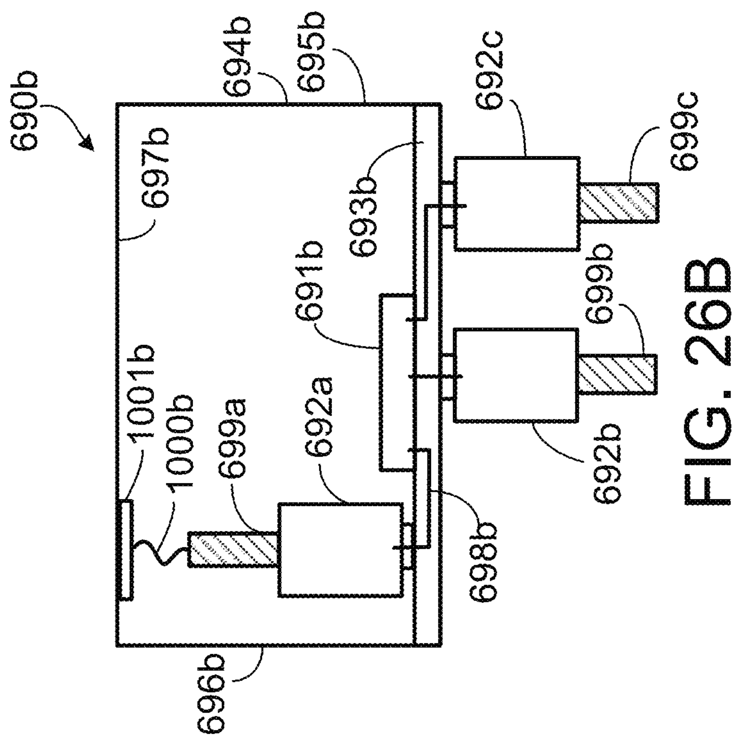

FIG. 26B is a top view of an example data processing system 690*b* in which a data processing chip 691*b* is mounted near optical/electrical communication interfaces 692*a*, 692*b*, 692*c* (collectively referenced as 692) to enable high bandwidth data paths (e.g., one, ten, or more Gigabits per second per data path) between the data processing chip 691*b* and each of the optical/electrical communication interfaces 692. The data processing chip 691 is mounted on a first side of a circuit board 693*b* that functions as a front panel of an enclosure 694*b* of the system 690*b*. In this example, the optical/electrical communication interface 692*a* is mounted on the first side of the circuit board 693*b* and the optical/electrical communication interfaces 692*b* and 692*c* are mounted on a second side of the circuit board 693*b*, in which the second side faces the exterior of the enclosure 694*b*. In this example, the optical/electrical communication interfaces 692*b* and 692*c* are mounted on an exterior side of the enclosure 694*b*, allowing connection to optical fiber from the front of the enclosure 694*b* while the optical/electrical communication interface 692*a* is located internal to the enclosure 694*b*, for example, to allow connection to optical fiber at the rear of the enclosure 694*b*. In some examples, two or more of the optical/electrical communication interfaces 692 can be located internal to the enclosure 694*b* and connect to optical fibers at the rear of the enclosure 694*b*.

The enclosure 694*b* has side panels 695*b* and 696*b*, a rear panel 697*b*, a top panel, and a bottom panel. In some examples, the circuit board 693*b* is perpendicular to the bottom panel. In some examples, the circuit board 693*b* is oriented at an angle in a range −60° to 60° (or −30° to 30°, or −10° to 10°, or −1° to 1°) relative to a vertical direction of the bottom panel.

Each of the optical/electrical communication interfaces 692 is electrically coupled to the data processing chip 691*b* by electrical connectors or traces 698*b* that pass through the circuit board 693*b* in the thickness direction. For example, the electrical connectors or traces 698*b* can be configured as vias of the circuit board 693*b*. In this example, the electrical connectors or traces 698*b* extend to both sides of the circuit board 693*b* (e.g., for connecting to optical/electrical communication interfaces 692 located internal to and external of the enclosure 694*b*). The signal paths between the data processing chip 691*b* and each of the optical/electrical communication interfaces 692 can be unidirectional or bidirectional, similar to those of the systems 630, 650 and 680.

For example, the system 690*b* can be configured such that signals are transmitted unidirectionally between the data processing chip 691*b* and one of the optical/electrical communication interfaces 692, and bidirectionally between the data processing chip 691*b* and another one of the optical/electrical communication interfaces 692. For example, the system 690*b* can be configured such that signals are transmitted unidirectionally from the optical/electrical communication interface 692*a* to the data processing chip 691*b*, and unidirectionally from the data processing chip 691*b* to the optical/electrical communication interface 692*b* and/or optical/electrical communication interface 692*c*.

Optical connectors 699*a*, 699*b*, 699*c* (collectively referenced as 699) are provided to couple optical signals from the optical fibers to the optical/electrical communication interfaces 692*a*, 692*b*, 692*c*, respectively. The optical connectors 699 can be securely fixed, or releasably connected, to the optical/electrical communication interfaces 692, similar to those of the systems 630, 650, and 680. In this example, optical connector 699*b* and optical connector 699*c* can connect to optical fibers at the front of the enclosure 694*b* and the optical connector 699*a* can connect to optical fibers at the rear of the enclosure 694*b*. In the illustrated example, the optical connector 699*a* connects to an optical fiber at the rear of the enclosure 694*b* by being connected to a fiber 1000*b* that connects to a rear panel interface 1001*b* (e.g., a backplane, etc.) that is mounted to the rear panel 697*b*. In some examples, the optical connectors 699 can be securely or fixedly attached to communication interfaces 692. In some examples, the optical connectors 699 can be securely or fixedly attached to an array of optical fibers.

The optical/electrical communication interface 692 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interfaces 692*b* and 692*c* are mounted on the side of the circuit board 693*b* opposite to the side of the data processing chip 691*b*. In some examples, the optical/electrical communication interface 692 can be similar to the integrated optical communication device 448, 462, 466, 472 (FIG. 17). The optical connector 699 can be similar to, e.g., the first optical connector part

213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 692 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 699 can be part of the optical/electrical communication interface 692. In some examples, the optical connector 699 can also include the second optical connector part 223 (FIGS. 2, 4), 458 (FIG. 17) that is optically coupled to the optical fibers.

In some examples, the optical/electrical communication interfaces 692 are securely fixed (e.g., by soldering) to the circuit board 693*b*. In some examples, the optical/electrical communication interfaces 692 are removably connected to the circuit board 693*b*, e.g., by use of mechanical mechanisms such as one or more snap-on or screw-on mechanisms. An advantage of the system 690*b* is that in case of a malfunction at one of the optical/electrical communication interfaces 692, the faulty optical/electrical communication interface 692 can be replaced without opening the enclosure 694*b*.

FIG. 26C is a top view of an example data processing system 690*c* in which a data processing chip 691*c* is mounted near optical/electrical communication interfaces 692*d*, 692*e*, 692*f* (collectively referenced as 692) to enable high bandwidth data paths (e.g., one, ten, or more Gigabits per second per data path) between the data processing chip 691*c* and each of the optical/electrical communication interfaces 692. The data processing chip 691*c* is mounted on a first side of a circuit board 693*c* that functions as a front panel of an enclosure 694*c* of the system 690*c*. In this example, the optical/electrical communication interface 692*d* is mounted on the first side of the circuit board 693*c* and the optical/electrical communication interfaces 692*e* and 692*f* are mounted on a second side of the circuit board 693*c*, in which the second side faces the exterior of the enclosure 694*c*. In this example, the optical/electrical communication interfaces 692*e* and 692*f* are mounted on an exterior side of the enclosure 694*c*, allowing connection to optical fibers from the front of the enclosure 694*c* while the optical/electrical communication interface 692*d* is located internal to the enclosure 694*c*, for example, to allow connection to optical fiber at the rear of the enclosure 694*c*. In some examples, two or more of the optical/electrical communication interfaces 692 can be located internal to the enclosure 694*c* and connect to optical fibers at the rear of the enclosure 694*c*.

The enclosure 694*c* has side panels 695*c* and 696*c*, a rear panel 697*c*, a top panel, and a bottom panel. In some examples, the circuit board 693*c* is perpendicular to the bottom panel. In some examples, the circuit board 693*c* is oriented at an angle in a range −60° to 60° (or −30° to 30°, or −10° to 10°, or −1° to 1°) relative to a vertical direction of the bottom panel.

Each of the optical/electrical communication interfaces 692 is electrically coupled to the data processing chip 691*c* by electrical connectors or traces 698*c* that pass through the circuit board 693*c* in the thickness direction. For example, the electrical connectors or traces 698*c* can be configured as vias of the circuit board 693*c*. In this example, the electrical connectors or traces 698*c* extend to both sides of the circuit board 693*b* (e.g., for connecting to optical/electrical communication interfaces 692 located internal to and external of the enclosure 694*b*. The signal paths between the data processing chip 691*c* and each of the optical/electrical communication interfaces 692 can be unidirectional or bidirectional, similar to those of the systems 630, 650 and 680.

For example, the system 690*c* can be configured such that signals are transmitted unidirectionally between the data processing chip 691*c* and one of the optical/electrical communication interfaces 692, and bidirectionally between the data processing chip 691*c* and another one of the optical/electrical communication interfaces 692. For example, the system 690*c* can be configured such that signals are transmitted unidirectionally from the optical/electrical communication interface 692*d* to the data processing chip 691*c*, and unidirectionally from the data processing chip 691*c* to the optical/electrical communication interface 692*e* and/or optical/electrical communication interface 692*f*.

Optical connectors 699*d*, 699*e*, 699*f* (collectively referenced as 699) are provided to couple optical signals from the optical fibers to the optical/electrical communication interfaces 692*d*, 692*e*, 692*f*, respectively. The optical connectors 699 can be securely fixed, or releasably connected, to the optical/electrical communication interfaces 692, similar to those of the systems 630, 650, and 680. In the illustrated example, the optical/electrical communication interfaces 692*d* and optical connector 699*d* are oriented differently compared to the optical/electrical communication interfaces 692*a* and optical connector 699*a* of FIG. 26B. Here the orientation change is a counter clockwise rotation of 90 degrees. Other types of orientation changes (e.g., rotations, pitches, tipping, etc.) may be implemented. Position changes (e.g., translations) and other types of location changes may also be employed. In this example, optical connector 699*e* and optical connector 699*f* can connect to optical fibers at the front of the enclosure 694*c* and the optical connector 699*d* can connect to optical fibers the rear of the enclosure 694*c*. In the illustrated example, the optical connector 699*d* connects to an optical fiber at the rear of the enclosure 694*c* by being connected to a fiber 1000*c* that connects to a rear panel interface 1001*c* (e.g., a backplane, etc.) that is mounted to the rear panel 697*c*.

The optical/electrical communication interface 692 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interface 692*e* and 692*f* are mounted on the side of the circuit board 693*c* opposite to the side of the data processing chip 691*c*. In some examples, the optical/electrical communication interface 692 can be similar to the integrated optical communication device 448, 462, 466, 472 (FIG. 17). The optical connector 699 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 692 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 699 can be part of the optical/electrical communication interface 692. In some examples, the optical connector 699 can also include the second optical connector part 223 (FIGS. 2, 4), 458 (FIG. 17) that is optically coupled to the optical fibers.

In some examples, the optical/electrical communication interfaces 692 are securely fixed (e.g., by soldering) to the circuit board 693*c*. In some examples, the optical/electrical communication interfaces 692 are removably connected to the circuit board 693*c*, e.g., by use of mechanical mechanisms such as one or more snap-on or screw-on mechanisms. An advantage of the system 690*c* is that in case of a malfunction at one of the optical/electrical communication interfaces 692, the faulty optical/electrical communication interface 692 can be replaced without opening the enclosure 694*c*.

Figure 27:
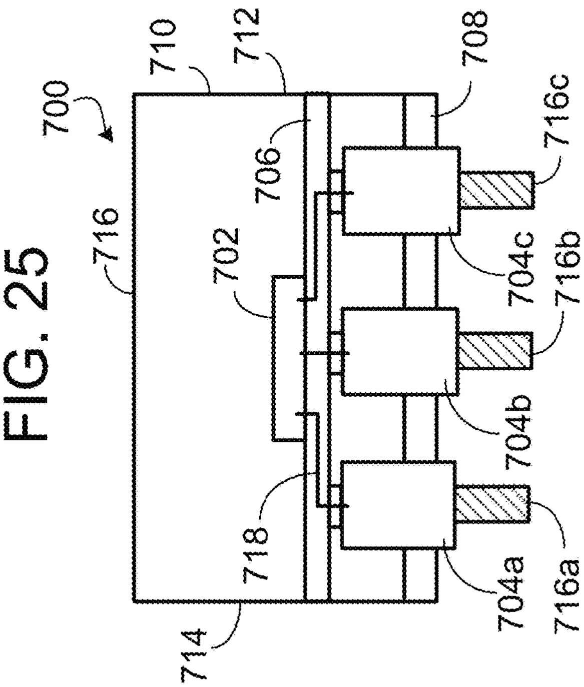

FIG. 27 is a top view of an example data processing system 700 in which a data processing chip 702 is mounted near optical/electrical communication interfaces 704*a*, 704*b*, 704*c* (collectively referenced as 704) to enable high bandwidth data paths (e.g., one, ten, or more Gigabits per second per data path) between the data processing chip 702 and each of the optical/electrical communication interfaces 704. The data processing chip 702 is mounted on a first side of a circuit board 706 that is positioned near a front panel of an enclosure 710 of the system 700, similar to the configuration of the system 650 (FIG. 25). In some examples, the data processing chip 702 is mounted on a substrate (e.g., a ceramic substrate), and the substrate is attached to the circuit board 706. The optical/electrical communication interfaces 704 are mounted on a second side of the circuit board 708. In this example, the optical/electrical communication interfaces 704 pass through openings in the front panel 708, allowing optical fibers to be easily coupled to the optical/electrical communication interfaces 704.

The enclosure 710 has side panels 712 and 714, a rear panel 716, a top panel, and a bottom panel. In some examples, the circuit board 706 and the front panel 708 are oriented at an angle in a range −60° to 60° relative to a vertical direction of the bottom panel. In some examples, the circuit board 706 is substantially parallel to the front panel 708, e.g., the angle between the surface of the circuit board 706 and the surface of the front panel 708 can be in a range of −5° to 5°. In some examples, the circuit board 706 is at an angle relative to the front panel 708, in which the angle is in a range of −45° to 45°.

For example, the angle can refer to a rotation around an axis that is parallel to the larger dimension of the front panel (e.g., the width dimension in a typical 1U, 2U, or 4U rackmount device), or a rotation around an axis that is parallel to the shorter dimension of the front panel (e.g., the height dimension in the 1U, 2U, or 4U rackmount device). The angle can also refer to a rotation around an axis along any other direction. For example, the circuit board 706 is positioned relative to the front panel such that components such as the interconnection modules, including optical modules or photonic integrated circuits, mounted on or attached to the circuit board 706 can be accessed through the front side, either through one or more openings in the front panel, or by opening the front panel to expose the components, without the need to separate the top or side panels from the bottom panel. Such orientation of the circuit board (or a substrate on which a data processing module is mounted) relative to the front panel also applies to the examples shown in FIGS. 21 to 26, 28B to 29B, 69A, 70, 71A, 72, 72A, 74A, 75A, 75C, 76, 77A, 77B, 78, 96 to 98, 100, 110, 112, 113, 115, 117 to 122, 125A to 127, 129, 136 to 149, 159, and 160.

Each of the optical/electrical communication interfaces 704 is electrically coupled to the data processing chip 702 by electrical connectors or traces 718 that pass through the circuit board 706 in the thickness direction, similar to those of the system 680 (FIG. 26). The signal paths between the data processing chip 702 and each of the optical/electrical communication interfaces 704 can be unidirectional or bidirectional, similar to those of the system 630 (FIG. 24), 650 (FIG. 25), and 680 (FIG. 26).

Optical connectors 716*a*, 716*b*, 716*c* (collectively referenced as 716) are provided to couple optical signals from the optical fibers to the optical/electrical communication interfaces 704*a*, 704*b*, 704*c*, respectively. The optical connectors 716 can be securely fixed, or releasably connected, to the optical/electrical communication interfaces 704, similar to those of the systems 630, 650, and 680.

The optical/electrical communication interface 704 can be similar to, e.g., the integrated communication device 210 (FIG. 2), 252 (FIG. 4), 374 (FIG. 11), 382 (FIG. 12), 402 (FIG. 13), 428 (FIG. 14), and 512 (FIG. 32), except that the optical/electrical communication interface 704 is mounted on the side of the circuit board 706 opposite to the side of the data processing chip 702. In some examples, the optical/electrical communication interface 704 can be similar to the integrated optical communication device 448, 462, 466, 472 (FIG. 17). The optical connector 716 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). In some examples, the optical connector is not attached vertically to a photonic integrated circuit that is part of the optical/electrical communication interface 704 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc. In some examples, a portion of the optical connector 716 can be part of the optical/electrical communication interface 704. In some examples, the optical connector 716 can also include the second optical connector part 223 (FIGS. 2, 4), 458 (FIG. 17) that is optically coupled to the optical fibers.

In some examples, the optical/electrical communication interfaces 704 are securely fixed (e.g., by soldering) to the circuit board 706. In some examples, the optical/electrical communication interfaces 704 are removably connected to the circuit board 706, e.g., by use of mechanical mechanisms such as one or more snap-on or screw-on mechanisms. An advantage of the system 700 is that in case of a malfunction at one of the optical/electrical communication interfaces 704, the faulty optical/electrical communication interface 704 can unplugged or decoupled from the circuit board 706 and replaced without opening the enclosure 710.

In some implementations, the optical/electrical communication interfaces 704 do not protrude through openings in the front panel 708. For example, each optical/electrical communication interface 704 can be at a distance behind the front panel 708, and a fiber patchcord or pigtail can connect the optical/electrical communication interface 704 to an optical connector on the front panel 708, similar to the examples shown in FIGS. 77A, 77B, 78, 125A, 125B, 129, and 159. In some examples, the front panel 708 is configured to be removable or to be able to open to allow servicing of communication interface 704, similar to the examples shown in FIGS. 77A, 125A, and 159.

Figure 28A:
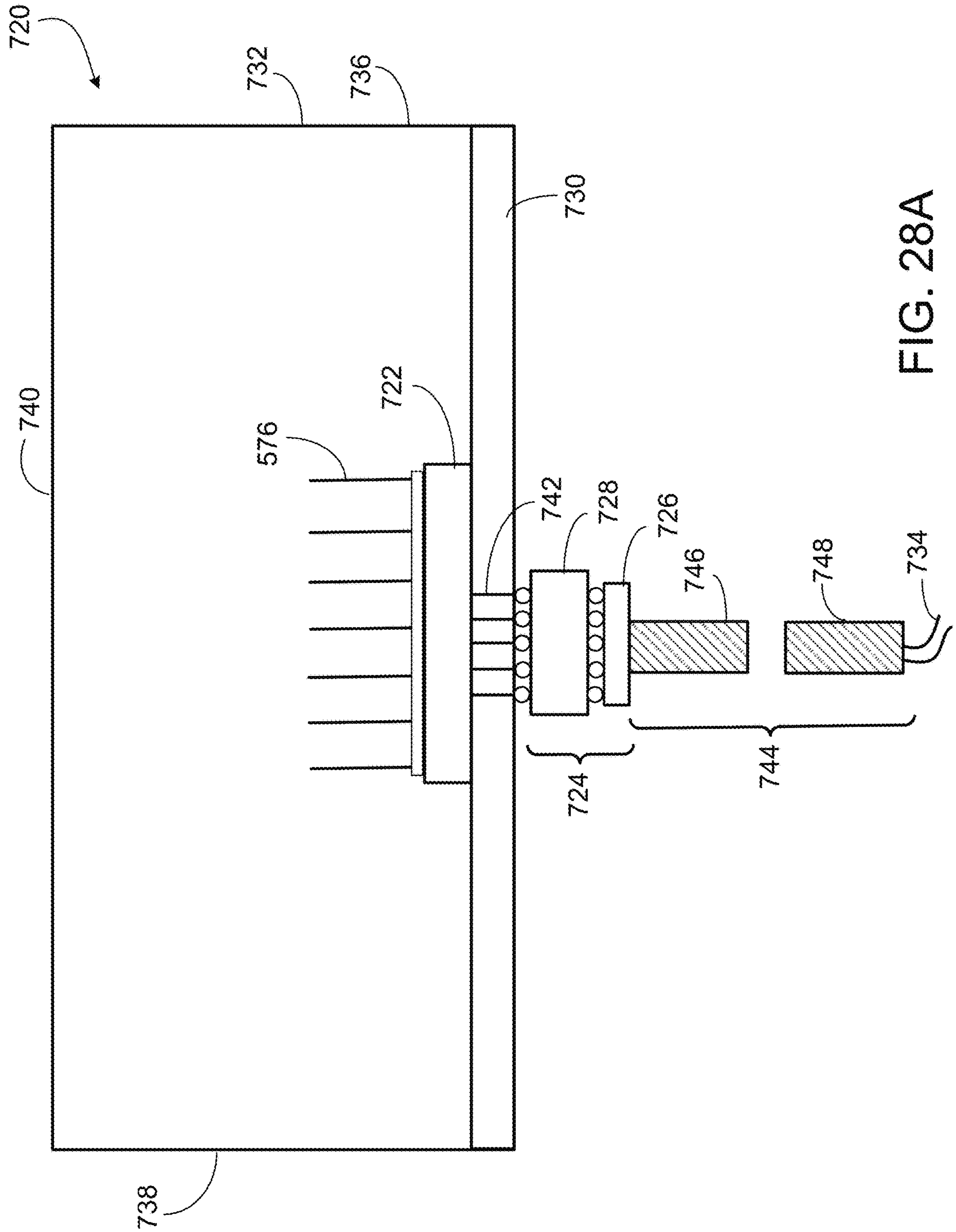

FIG. 28A is a top view of an example data processing system 720 in which a data processing chip 722 is mounted near an optical/electrical communication interface 724 to enable high bandwidth data paths (e.g., one, ten, or more Gigabits per second per data path) between the data processing chip 720 and the optical/electrical communication interface 724. The data processing chip 722 is mounted on a first side of a circuit board 730 that functions as a front panel of an enclosure 732 of the system 720. In some examples, the data processing chip 722 is mounted on a substrate (e.g., a ceramic substrate), and the substrate is attached to the circuit board 730. The optical/electrical communication interface 724 is mounted on a second side of the circuit board 730, in which the second side faces the exterior of the enclosure 732. In this example, the optical/electrical communication interface 724 is mounted on an exterior side of the enclosure 732, allowing optical fibers 734 to be easily coupled to the optical/electrical communication interface 724.

The enclosure 732 has side panels 736 and 738, a rear panel 740, a top panel, and a bottom panel. In some examples, the circuit board 730 is perpendicular to the bottom panel. In some examples, the circuit board 730 is oriented at an angle in a range −60° to 60° relative to a vertical direction of the bottom panel.

The optical/electrical communication interface 724 includes a photonic integrated circuit 726 mounted on a substrate 728 that is electrically coupled to the circuit board 730. The optical//electrical communication interface 724 is electrically coupled to the data processing chip 722 by electrical connectors or traces 742 that pass through the circuit board 730 in the thickness direction. For example, the electrical connectors or traces 742 can be configured as vias of the circuit board 730. The signal paths between the data processing chip 722 and the optical/electrical communication interface 724 can be unidirectional or bidirectional, similar to those of the systems 630, 650, 680, and 700.

An optical connector 744 is provided to couple optical signals from the optical fibers 734 to the optical/electrical communication interface 724. The optical connector 744 can be securely fixed, or removably connected, to the optical/electrical communication interface 744, similar to those of the systems 630, 650, 680, and 700.

In some implementations, the optical/electrical communication interface 724 can be similar to, e.g., the integrated communication device 448, 462, 466, and 472 of FIG. 17. The optical signals from the optical fibers are processed by the photonic integrated circuit 726, which generates serial electrical signals based on the optical signals. For example, the serial electrical signals are amplified by a set of transimpedance amplifiers and drivers (which can be part of the photonic integrated circuit 726 or a serializers/deserializers module in the data processing chip 722), which drives the output signals that are transmitted to the serializers/deserializers module embedded in the data processing chip 722.

The optical connector 744 includes a first optical connector 746 and a second optical connector 748, in which the second optical connector 748 is optically coupled to the optical fibers 734. The first optical connector 746 can be similar to, e.g., the first optical connector part 213 (FIGS. 2, 4), the first optical connector 356 (FIGS. 11, 12), the first optical connector 404 (FIGS. 13, 14), the first optical connector part 456 (FIG. 17), and the first optical connector part 520 (FIG. 32). The second optical connector 748 can be similar to the second optical connector part 223 (FIGS. 2, 4) and 458 (FIG. 17). In some examples, the optical connectors 746 and 748 can form a single piece such that the optical/electrical communication interface 724 is securely or fixedly attached to a fiber bundle. In some examples, the optical connector is not attached vertically to the photonic integrated circuit 726 but rather can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc.

In some examples, the optical/electrical communication interface 724 is securely fixed (e.g., by soldering) to the circuit board 730. In some examples, the optical/electrical communication interface 724 is removably connected to the circuit board 730, e.g., by use of mechanical mechanisms such as one or more snap-on or screw-on mechanisms. An advantage of the system 720 is that in case of a malfunction of the optical/electrical communication interface 724, the faulty optical/electrical communication interface 724 can be replaced without opening the enclosure 732.

Figure 28B:
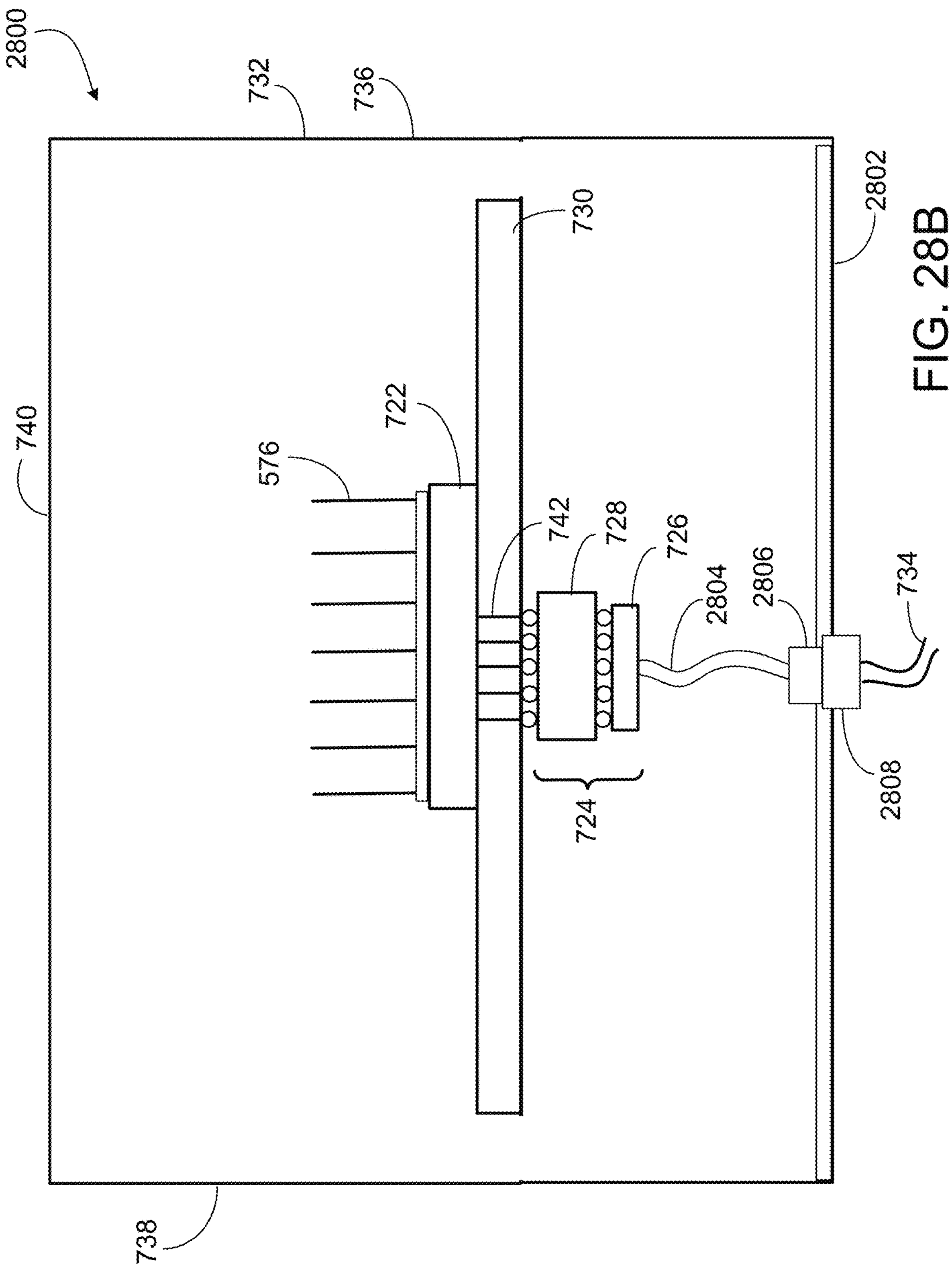

FIG. 28B is a top view of an example data processing system 2800 that is similar to the system 720 of FIG. 28A, except that the circuit board 730 that is recessed from a front panel 2802 of an enclosure 732 of the system 2800. The photonic integrated circuit 726 is optically coupled through a fiber patchcord or pigtail 2804 to a first optical connector 2806 attached to the inner side of the front panel 2802. The first optical connector 2806 is optically coupled to a second optical connector 2808 attached to the outer side of the front panel 2802. The second optical connector 2808 is optically coupled to the exterior optical fibers 734.

The technique of using a fiber patchcord or pigtail to optically couple the photonic integrated circuit to the optical connector attached to the inner side of the front panel can also be applied to the data processing system 700 of FIG. 27. For example, the modified system can have a recessed substrate or circuit board, multiple co-packaged optical modules (e.g., 704) mounted on the opposite side of the data processing chip 702 relative to the substrate or circuit board, and fiber jumpers (e.g., 2804) optically coupling the co-packaged optical modules to the front panel.

In the examples of FIGS. 28A and 28B, the data processing chip 722 can be mounted on a substrate that is electrically coupled to the circuit board 730, similar to the example shown in FIG. 150.

In each of the examples in FIGS. 24, 25, 26, 27, and 28, the optical/electrical communication interface 644, 652, 684, 704, and 724 can be electrically coupled to the circuit board 642, 654, 686, 706, and 730, respectively, using electrical contacts that include one or more of spring-loaded elements, compression interposers, and/or land-grid arrays.

Figure 29A:
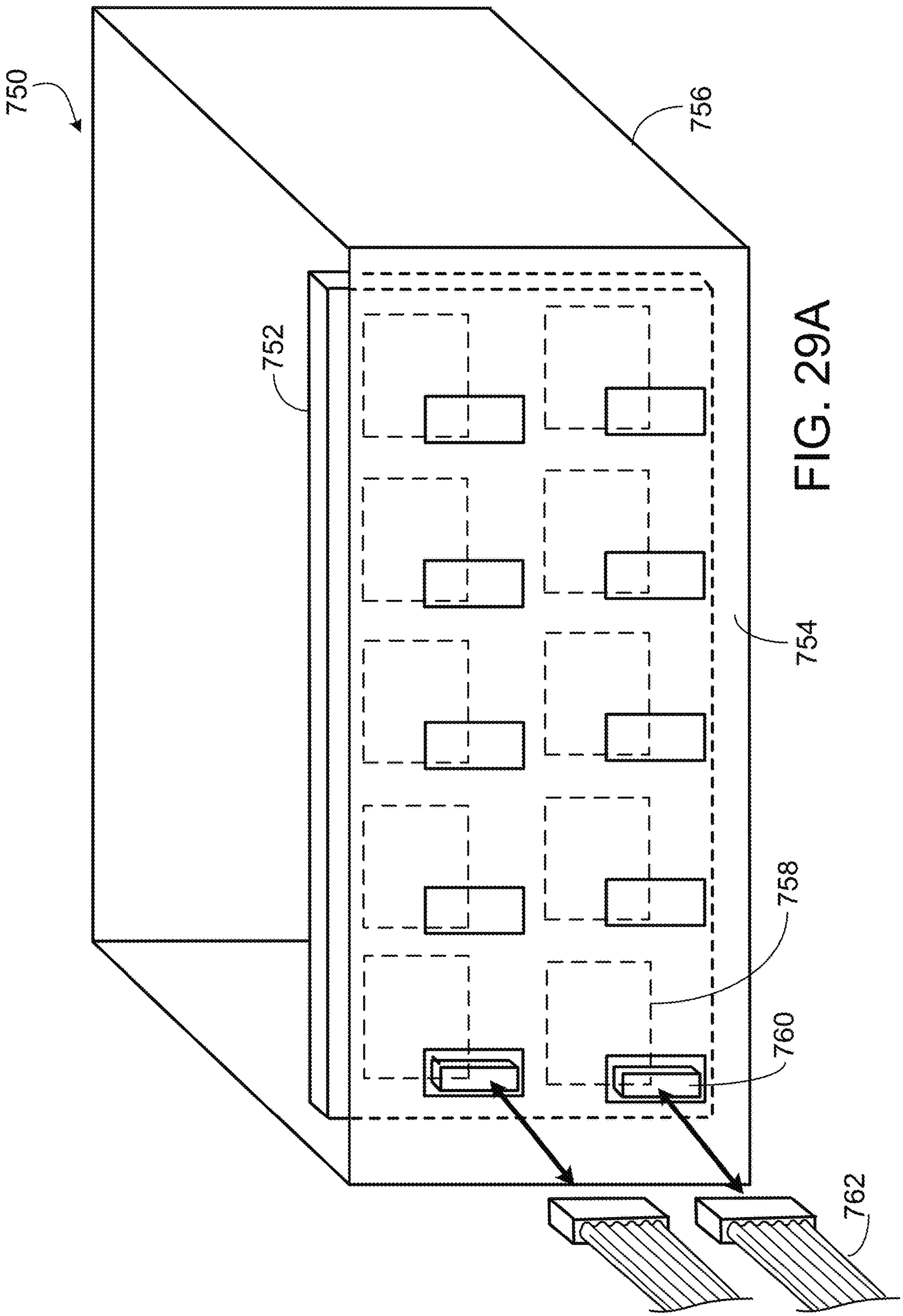
FIGS. 29A and 29B are diagrams of an example rackmount data processing system incorporating multiple optical interconnect modules.

FIG. 29A is a diagram of an example data processing system 750 that includes a vertically mounted circuit board 752 that enables high bandwidth data paths (e.g., one, ten, or more Gigabits per second per data path) between data processing chips 758 and optical/electrical communication interfaces 760. The data processing chips 758 and the optical/electrical communication interfaces 760 are mounted on the circuit board 752, in which each data processing chip 758 is electrically coupled to a corresponding optical/electrical communication interface 760. The data processing chips 758 are electrically coupled to one another by electrical connectors (e.g., electrical signal lines on one or more layers of the circuit board 752).

The data processing chips 758 can be similar to, e.g., the electronic processor integrated circuit, data processing chip, or host application specific integrated circuit 240 (FIGS. 2, 4, 6, 7, 11, 12), digital application specific integrated circuit 444 (FIG. 17), data processor 502 (FIG. 20), data processing chip 572 (FIGS. 22, 23), 640 (FIG. 24), 670 (FIG. 25), 681 (FIG. 26), 702 (FIG. 27), and 722 (FIG. 28). Each of the data processing chips 758 can be, e.g., a network switch, a central processor unit, a graphics processor unit, a tensor processing unit, a neural network processor, an artificial intelligence accelerator, a digital signal processor, a microcontroller, or an application specific integrated circuit (ASIC).

Although the figure shows that the optical/electrical communication interfaces 760 are mounted on the side of the circuit board 752 facing the front panel 754, the optical/electrical communication interfaces 760 can also be mounted on the side of the circuit board 752 facing the interior of the enclosure 756. The optical/electrical communication interfaces 760 can be similar to, e.g., the integrated communication devices 210 (FIGS. 2, 3, 10), 252 (FIGS. 4, 5), 262 (FIG. 6), the integrated optical communication devices 282 (FIGS. 7-9), 374 (FIG. 11), 382 (FIG. 12), 390 (FIG. 13), 428 (FIG. 14), 402 (FIGS. 15, 16), 448, 462, 466, 472 (FIG. 17), the integrated communication devices 574 (FIG. 22), 612 (FIG. 23), and the optical/electrical communication interfaces 644 (FIG. 24), 652 (FIG. 25), 684 (FIG. 26), 704 (FIG. 27).

The circuit board 752 is positioned near a front panel 754 of an enclosure 756, and optical signals are coupled to the optical/electrical communication interfaces 760 through optical paths that pass through openings in the front panel 754. This allows users to conveniently removably connect optical fiber cables 762 to the input/output interfaces 760. The position and orientation of the circuit board 752 relative to the enclosure 756 can be similar to, e.g., those of the circuit board 654 (FIG. 25) and 706 (FIG. 27).

In some implementations, the data processing system 750 can include multiple types of optical/electrical communication interfaces 760. For example, some of the optical/electrical communication interfaces 760 can be mounted on the same side of the circuit board 752 as the corresponding data processing chip 758, and some of the optical/electrical communication interfaces 760 can be mounted on the opposite side of the circuit board 752 as the corresponding data processing chip 758. Some of the optical/electrical communication interfaces 760 can include first and second serializers/deserializers modules, and the corresponding data processing chips 758 can include third serializers/deserializers modules, similar to the examples in FIGS. 2-8, 11-14, 20, 22, and 23. Some of the optical/electrical communication interfaces 760 can include no serializers/deserializers module, and the corresponding data processing chips 758 can include serializers/deserializers modules, similar to the example of FIG. 17. Some of the optical/electrical communication interfaces 760 can include sets of transimpedance amplifiers and drivers, either embedded in the photonic integrated circuits or in separate chips external to the photonic integrated circuits. Some of the optical/electrical communication interfaces 760 do not include transimpedance amplifiers and drivers, in which sets of transimpedance amplifiers and drivers are included in the corresponding data processing chips 758. The data processing system 750 can also include electrical communication interfaces that interface to electrical cables, such as high speed PCIe cables, Ethernet cables, or Thunderbolt™ cables. The electrical communication interfaces can include modules that perform various functions, such as translation of communication protocols and/or conditioning of signals.

Other types of connections may be present and associated with circuit board 752 and other boards included in the enclosure 756. For example, two or more circuit boards (e.g., vertically mounted circuit boards) can be connected which may or may not include the circuit board 752. For instances in which circuit board 752 is connected to at least one other circuit board (e.g., vertically mounted in the enclosure 756), one or more connection techniques can be employed. For example, an optical/electrical communication interface (e.g., similar to optical/electrical communication interfaces 760) can be used to connect data processing chips 758 to other circuit boards. Interfaces for such connections can be located on the same side of the circuit board 752 that the processing chips 758 are mounted. In some implementations, interfaces can be located on another portion of the circuit board (e.g., a side that is opposite from the side that the processing chips 758 are mounted). Connections can utilize other portions of the circuit board 752 and/or one or more other circuit boards present in the enclosure 756. For example an interface can be located on an edge of one or more of the boards (e.g., an upper edge of a vertically mounted circuit board) and the interface can connect with one or more other interfaces (e.g., the optical/electrical communication interfaces 760, another edge mounted interface, etc.). Through such connections, two or more circuit boards can connect, receive and send signals, etc.

In the example shown in FIG. 29A, the circuit board 752 is placed near the front panel 754. In some examples, the circuit board 752 can also function as the front panel, similar to the examples in FIGS. 22-24, 26, and 28.

Figure 29B:
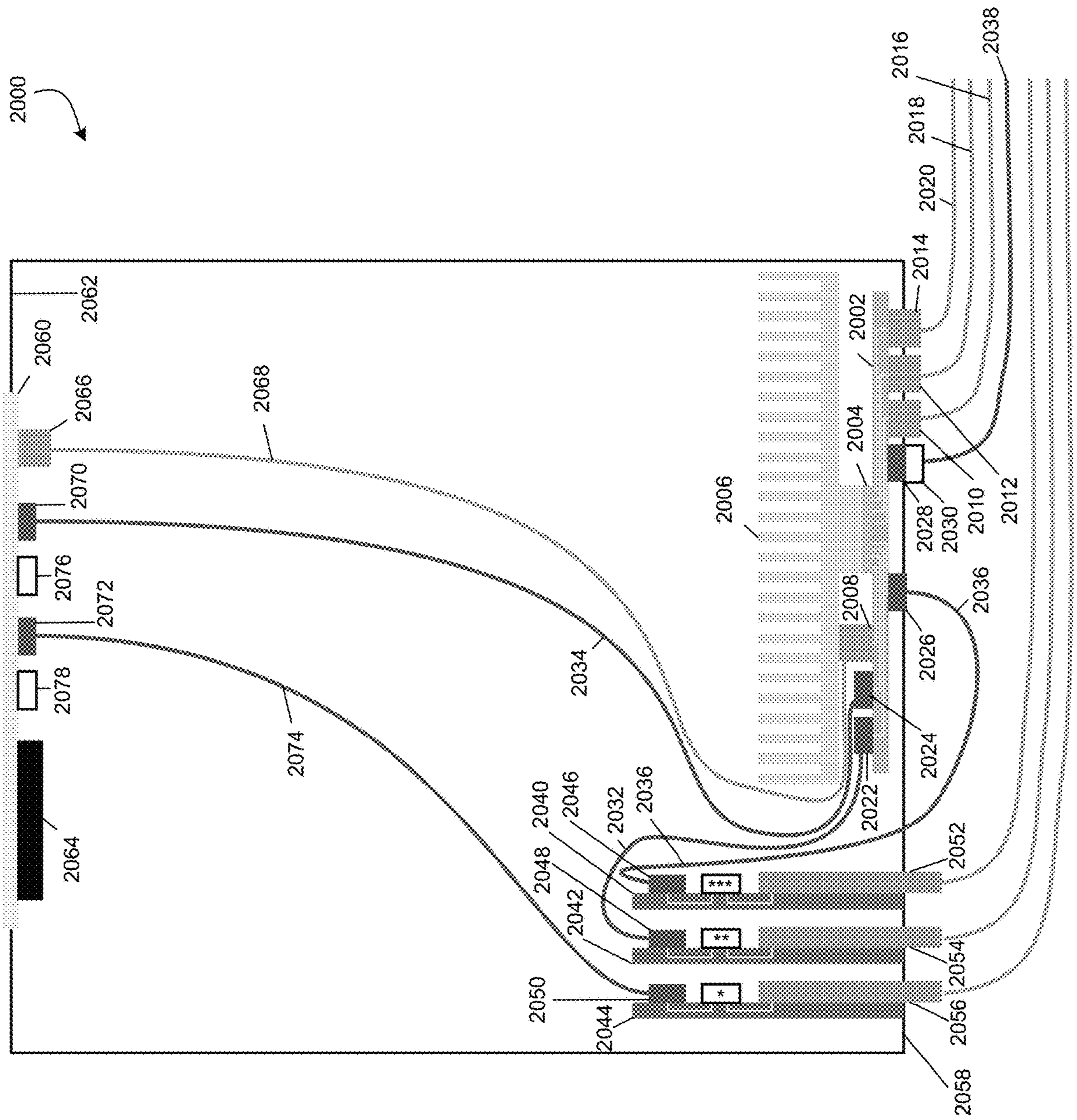

FIG. 29B is a diagram of an example data processing system 2000 that illustrates some of the configurations described with respect to FIGS. 26A to 26C and FIG. 29A along with other capabilities. The system 2000 includes a vertically mounted printed circuit board 2002 (or, e.g., a substrate) upon which is mounted a data processing chip 2004 (e.g., an ASIC), and a heat sink 2006 is thermally coupled to the data processing chip 2004. Optical/electrical communication interfaces are mounted on both sides of the printed circuit board 2002. In particular, optical/electrical communication interface 2008 is mounted on the same side of the printed circuit board 2002 as the data processing chip 2004. In this example, optical/electrical communication interfaces 2010, 2012, and 2014 are mounted on an opposite side of the printed circuit board 2002. To send and receive signals (e.g., with other optical/electrical communication interfaces), each of the optical/electrical communication interfaces 2010, 2012, and 2014 connects to optical fibers 2016, 2018, 2020, respectively. Electrical connection sockets/connectors can also be mounted to one or more sides of the printed circuit board 2002 for sending and receiving electrical signals, for example. In this example, two electrical connection sockets/connectors 2022 and 2024 are mounted to the side of the printed circuit board 2002 that the data processing chip 2004 is mounted and two electrical connection sockets/connectors 2026 and 2028 are mounted to the opposite side of the printed circuit board 2002. In this example, electrical connection sockets/connector 2028 is connected (or includes) a timing module 2030 that provides various functionality (e.g., regenerate data, retime data, maintain signal integrity, etc.). To send and receive electrical signals, each of the electrical connection sockets/connectors

2022-2028 are connected to electrical connection cables 2032, 2034, 2036, 2038, respectively. One or more types of connection cables can be implemented, for example, fly-over cables can be employed for connecting to one or more of the electrical connection sockets/connectors 2022-2028.

In this example, the system 2000 includes vertically mounted line cards 2040, 2042, 2044. In this particular example, line card 2040 includes an electrical connection sockets/connector 2046 that is connected to electrical cable 2036, and line card 2042 includes an electrical connection sockets/connector 2048 that is connected to electrical cable 2032. Line card 2044 includes an electrical connection sockets/connector 2050. Each of the line cards 2040, 2042, 2044 include pluggable optical modules 2052, 2054, 2056 that can implement various interface techniques (e.g., QSFP, QSFP-DD, XFP, SFP, CFP).

In this particular example, the printed circuit board 2002 is approximate to a forward panel 2058 of the system 2000; however, the printed circuit board 2002 can be positioned in other locations within the system 2000. Multiple printed circuit boards can also be included in the system 2000. For example, a second printed circuit board 2060 (e.g., a backplane) is included in the system 2000 and is located approximate to a back panel 2062. By locating the printed circuit board 2060 towards the rear, signals (e.g., data signals) can be sent to and received from other systems (e.g., another switch box) located, for example, in the same switch rack or other location as the system 2000. In this example, a data processing chip 2064 is mounted to the printed circuit board 2060 that can perform various operations (e.g., data processing, prepare data for transmission, etc.). Similar to the printed circuit board 2002 located forward in the system 2000, the printed circuit board 2060 includes an optical/electrical communication interface 2066 that communicates with the optical/electrical communication interface 2008 (located on the same side on printed circuit board 2002 as data processing chip 2004) using optical fibers 2068. The printed circuit board 2060 includes electrical connection sockets/connectors 2070 that uses the electrical connection cable 2034 to send electrical signals to and receive electrical signals from the electrical connection sockets/connectors 2024. The printed circuit board 2060 can also communicate with other components of the system 2000, for example, one or more of the line cards. As illustrated in the figure, electrical connection sockets/connectors 2072 located on the printed circuit board 2060 uses the electrical connection cable 2074 to send electrical signals to and/or receive electrical signals from the electrical connection sockets/connector 2050 of the line card 2044. Similar to the printed circuit board 2002, other portions of the system 2000 can include timing modules. For example, the line cards 2040, 2042, and 2044 can include timing modules (respectively identified with symbol "*", "", and "*"). Similarly, the second circuit board 2060 can include timing modules such as timing modules 2076 and 2078 for regenerating data, re-timing data, maintaining signal integrity, etc.

A feature of some of the systems described in this document is that the main data processing module(s) of a system, such as switch chip(s) in a switch server, and the communication interface modules that support the main data processing module(s), are configured to allow convenient access by users, in the examples shown in FIGS. 21 to 29B, 69A, 70, 71A 72, 72A, 74A, 75A, 75C, 76, 77A, 77B, 78, 96 to 98, 100, 110, 112, 113, 115, 117 to 122, 125A to 127, 129, 136 to 149, 159, and 160, the main data processing module and the communication interface modules are positioned near the front panel, the rear panel, or both, and allow easy access by the user through the front/rear panel. However, it is also possible to position the main data processing module and the communication interface modules near one or more side panels, the top panel, the bottom panel, or two or more of the above, depending on how the system is placed in the environment. In a system that includes multiple racks of rackmount devices (see e.g., FIGS. 76 and 86), the communication interfaces (e.g., co-packaged optical modules) in each rackmount device can be conveniently accessed without the need to remove the rackmount device from the rack and opening up the housing in order to expose the inner components.

In some implementations, for a single rack of rackmount servers where there is open space at the front, rear, left, and right side of the rack, in each rackmount server, it is possible to place a first main data processing module and the communication interface modules supporting the first main data processing module near the front panel, place a second main data processing module and the communication interface modules supporting the second main data processing module near the left panel, place a third main data processing module and the communication interface modules supporting the third main data processing module near the right panel, and place a fourth main data processing module and the communication interface modules supporting the fourth main data processing module near the rear panel. The thermal solutions, including the placement of fans and heat dissipating devices, and the configuration of airflows around the main data processing modules and the communication interface modules, are adjusted accordingly.

For example, if a data processing server is mounted to the ceiling of a room or a vehicle, the main data processing module and the communication interface modules can be positioned near the bottom panel for easy access. For example, if a data processing server is mounted beneath the floor panel of a room or a vehicle, the main data processing module and the communication interface modules can be positioned near the top panel for easy access. The housing of the data processing system does not have to be in a box shape. For example, the housing can have curved walls, be shaped like a globe, or have an arbitrary three-dimensional shape.

Figure 30:
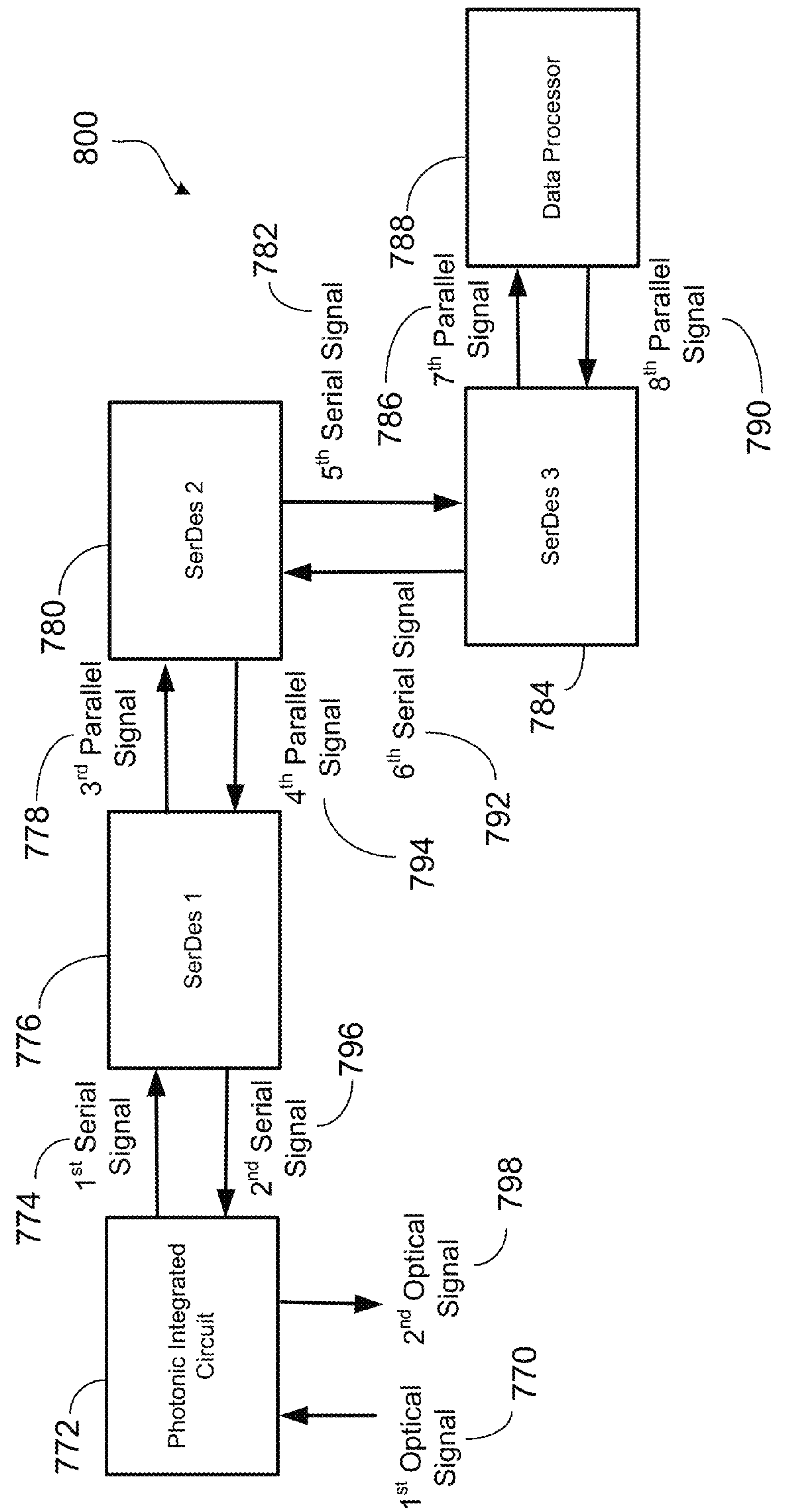
FIGS. 30 and 31 are block diagrams of example data processing systems.

FIG. 30 is a diagram of an example high bandwidth data processing system 800 that can be similar to, e.g., systems 200 (FIGS. 2, 20), 250 (FIG. 4), 260 (FIG. 6), 280 (FIG. 7), 350 (FIG. 11), 380 (FIG. 12), 390 (FIG. 13), 420 (FIG. 14), 560 (FIG. 22), 600 (FIG. 23), 630 (FIG. 24), and 650 (FIG. 25) described above. A first optical signal 770 is transmitted from an optical fiber to a photonic integrated circuit 772, which generates a first serial electrical signal 774 based on the first optical signal. The first serial electrical signal 774 is provided to a first serializers/deserializers module 776, which converts the first serial electrical signal 774 to a third set of parallel signals 778. The first serializers/deserializers module 776 conditions the serial electrical signal upon conversion into the parallel electrical signals, in which the signal conditioning can include, e.g., one or more of clock and data recovery, and signal equalization. The third set of parallel signals 778 is provided to a second serializers/deserializers module 780, which generates a fifth serial electrical signal 782 based on the third set of parallel signals 778. The fifth serial electrical signal 782 is provided to a third serializers/deserializers module 784, which generates a seventh set of parallel signals 786 that is provided to a data processor 788.

In some implementations, the photonic integrated circuit 772, the first serializers/deserializers module 776, and the second serializers/deserializers module 780 can be mounted on a substrate of an integrated communication device, an optical/electrical communication interface, or an input/output interface module. The first serializers/deserializers module 776 and the second serializers/deserializers module 780 can be implemented in a single chip. In some implementations, the third serializers/deserializers module 784 can be embedded in the data processor 788, or the third serializers/deserializers module 784 can be separate from the data processor 788.

The data processor 788 generates an eighth set of parallel signals 790 that is sent to the third serializers/deserializers module 784, which generates a sixth serial electrical signal 792 based on the eighth set of parallel signals 790. The sixth serial electrical signal 792 is provided to the second serializers/deserializers module 780, which generates a fourth set of parallel signals 794 based on the sixth serial electrical signal 792. The second serializers/deserializers module 780 can condition the serial electrical signal 792 upon conversion into the fourth set of parallel electrical signals 794. The fourth set of parallel signals 794 is provided to the first serializers/deserializers module 780, which generates a second serial electrical signal 796 based on the fourth set of parallel signals 794 that is sent to the photonic integrated circuit 772. The photonic integrated circuit 772 generates a second optical signal 798 based on the second serial electrical signal 796, and sends the second optical signal 798 to an optical fiber. The first and second optical signals 770, 798 can travel on the same optical fiber or on different optical fibers.

A feature of the system 800 is that the electrical signal paths traveled by the first, fifth, sixth, and second serial electrical signals 774, 782, 792, 796 are short (e.g., less than 5 inches), to allow the first, fifth, sixth, and second serial electrical signals 782, 792 to have a high data rate (e.g., up to 50 Gbps).

Figure 31:
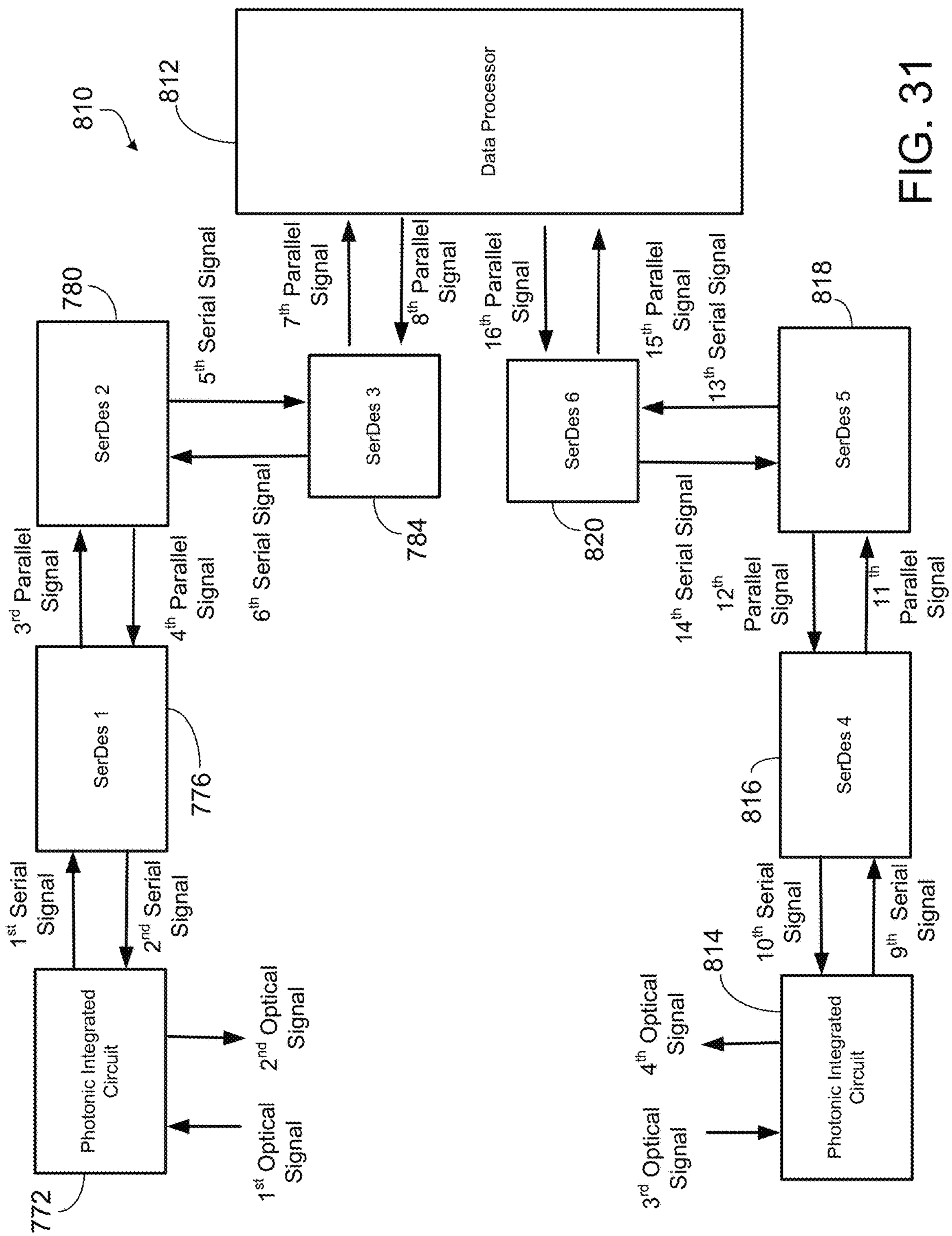

FIG. 31 is a diagram of an example high bandwidth data processing system 810 that can be similar to, e.g., systems 680 (FIG. 26), 700 (FIG. 27), and 750 (FIG. 29) described above. The system 810 includes a data processor 812 that receives and sends signals from and to multiple photonic integrated circuits. The system 810 includes a second photonic integrated circuit 814, a fourth serializers/deserializers module 816, a fifth serializers/deserializers module 818, and a sixth serializers/deserializers module 820. The operations of the second photonic integrated circuit 814, a fourth serializers/deserializers module 816, a fifth serializers/deserializers module 818, and a sixth serializers/deserializers module 820 can be similar to those of the first photonic integrated circuit 772, the first serializers/deserializers module 776, the second serializers/deserializers module 780, and the third serializers/deserializers module 784. The third serializers/deserializers module 784 and the sixth serializers/deserializers module 820 can be embedded in the data processor 812, or be implemented in separate chips.

In some examples, the data processor 812 processes first data carried in the first optical signal received at the first photonic integrated circuit 772, and generates second data that is carried in the fourth optical signal output from the second photonic integrated circuit 814.

The examples in FIGS. 30 and 31 include three serializers/deserializers modules between the photonic integrated circuit and the data processor, it is understood that the same principles can be applied to systems that has only one serializers/deserializers module between the photonic integrated circuit and the data processor.

In some implementations, signals are transmitted unidirectionally from the photonic integrated circuit 772 to the data processor 788 (FIG. 30). In that case, the first serializers/deserializers module 776 can be replaced with a serial-to-parallel converter, the second serializers/deserializers module 780 can be replaced with a parallel-to-serial converter, and the third serializers/deserializers module 784 can be replaced with a serial-to-parallel converter. In some implementations, signals are transmitted unidirectionally from the data processor 812 (FIG. 31) to the second photonic integrated circuit 814. In that case, the sixth serializers/deserializers module 820 can be replaced with a parallel-to-serial converter, the fifth serializers/deserializers module 818 can be replaced with a serial-to-parallel converter, and the fourth serializers/deserializers module 816 can be replaced with a parallel-to-serial converter.

It should be appreciated by those of ordinary skill in the art that the various embodiments described herein in the context of coupling light from one or more optical fibers, e.g., 226 (FIGS. 2 and 4) or 272 (FIGS. 6 and 7) to the photonic integrated circuit, e.g., 214 (FIGS. 2 and 4), 264 (FIG. 6), or 296 (FIG. 7) will be equally operable to couple light from the photonic integrated circuit to one or more optical fibers. This reversibility of the coupling direction is a general feature of at least some embodiments described herein, including some of those using polarization diversity.

The example optical systems disclosed herein should only be viewed as some of many possible embodiments that can be used to perform polarization demultiplexing and independent array pattern scaling, array geometry re-arrangement, spot size scaling, and angle-of-incidence adaptation using diffractive, refractive, reflective, and polarization-dependent optical elements, 3D waveguides and 3D printed optical components. Other implementations achieving the same set of functionalities are also covered by the spirit of this disclosure.

For example, the optical fibers can be coupled to the edges of the photonic integrated circuits, e.g., using fiber edge couplers. The signal conditioning (e.g., clock and data recovery, signal equalization, or coding) can be performed on the serial signals, the parallel signals, or both. The signal conditioning can also be performed during the transition from serial to parallel signals.

In some implementations, the data processing systems described above can be used in, e.g., data center switching systems, supercomputers, internet protocol (IP) routers, Ethernet switching systems, graphics processing work stations, and systems that apply artificial intelligence algorithms.

In the examples described above in which the figures show a first serializers/deserializers module (e.g., 216) placed adjacent to a second serializers/deserializers module (e.g., 217), it is understood that a bus processing unit 218 can be positioned between the first and second serializers/deserializers modules and perform, e.g., switching, re-routing, and/or coding functions described above.

In some implementations, the data processing systems described above includes multiple data generators that generate large amounts of data that are sent through optical fibers to the data processors for processing. For example, an autonomous driving vehicle (e.g., car, truck, train, boat, ship, submarine, helicopter, drone, airplane, space rover, or space ship) or a robot (e.g., an industrial robot, a helper robot, a medical surgery robot, a merchandise delivery robot, a teaching robot, a cleaning robot, a cooking robot, a construction robot, an entertainment robot) can include multiple high resolution cameras and other sensors (e.g., LIDARs (Light Detection and Ranging), radars) that generate video and other data that have a high data rate. The cameras and/or sensors can send the video data and/or sensor data to one or more data processing modules through optical fibers. The one or more data processing modules can apply artificial intelligence technology (e.g., using one or more neural networks) to recognize individual objects, collections of objects, scenes, individual sounds, collections of sounds, and/or situations in the environment of the vehicle and quickly determine appropriate actions for controlling the vehicle or robot.

Figure 34:
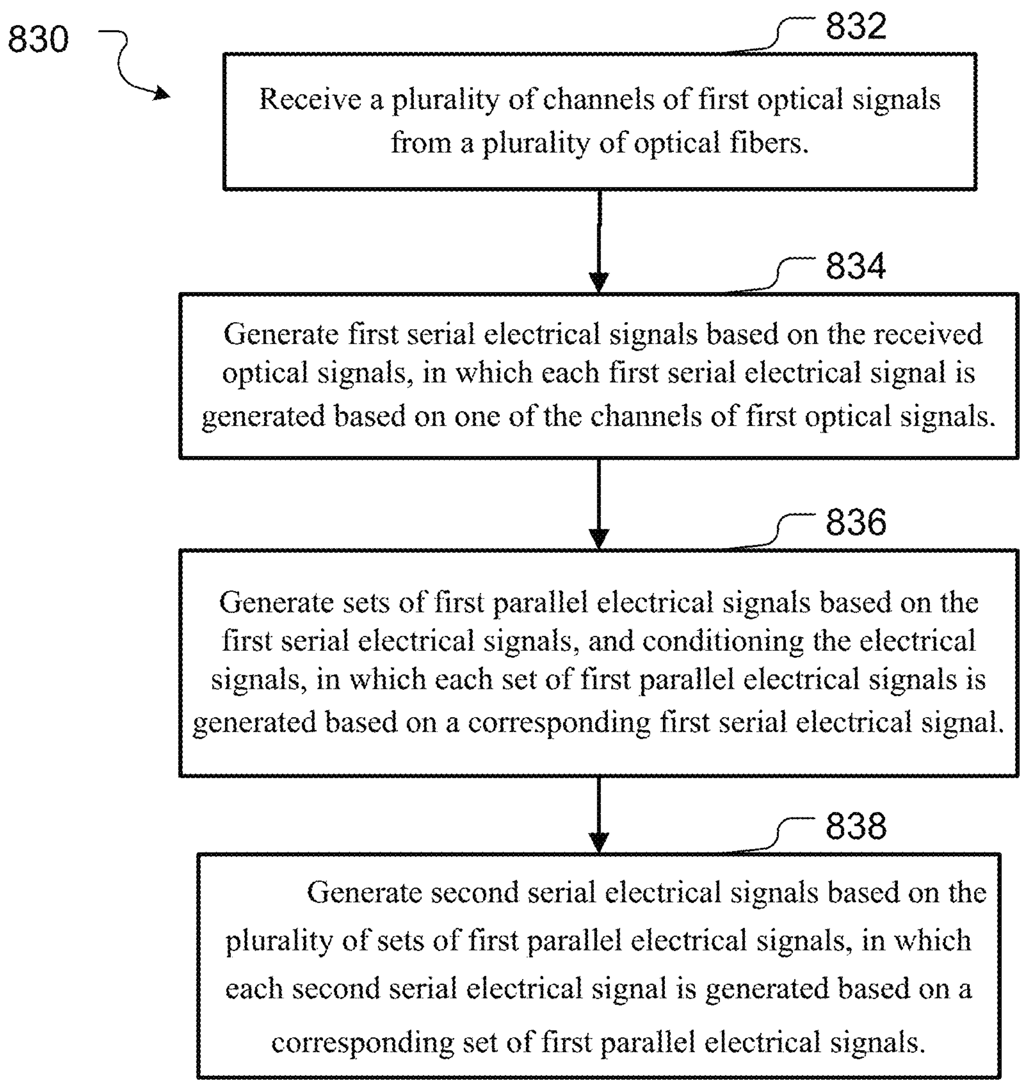
FIG. 34 is a flow diagram of an example process for processing optical and electrical signals using a data processing system.

FIG. 34 is a flow diagram of an example process for processing high bandwidth data. A process 830 includes receiving 832 a plurality of channels of first optical signals from a plurality of optical fibers. The process 830 includes generating 834 a plurality of first serial electrical signals based on the received optical signals, in which each first serial electrical signal is generated based on one of the channels of first optical signals. The process 830 includes generating 836 a plurality of sets of first parallel electrical signals based on the plurality of first serial electrical signals, and conditioning the electrical signals, in which each set of first parallel electrical signals is generated based on a corresponding first serial electrical signal. The process 830 includes generating 838 a plurality of second serial electrical signals based on the plurality of sets of first parallel electrical signals, in which each second serial electrical signal is generated based on a corresponding set of first parallel electrical signals.

In some implementations, a data center includes multiple systems, in which each system incorporates the techniques disclosed in FIGS. 22 to 29 and the corresponding description. Each system includes a vertically mounted printed circuit board, e.g., 570 (FIG. 22), 610 (FIG. 23), 642 (FIG. 24), 654 (FIG. 25), 686 (FIG. 26), 706 (FIG. 27), 730 (FIG. 28), 752 (FIG. 29) that functions as the front panel of the housing or is substantially parallel to the front panel. At least one data processing chip and at least one integrated communication device or optical/electrical communication interface are mounted on the printed circuit board. The integrated communication device or optical/electrical communication interface can incorporate techniques disclosed in FIGS. 2-22 and 30-34 and the corresponding description. Each integrated communication device or optical/electrical communication interface includes a photonic integrated circuit that receives optical signals and generates electrical signals based on the optical signals. The optical signals are provided to the photonic integrated circuit through one or more optical paths (or spatial paths) that are provided by, e.g., cores of the fiber-optic cables, which can incorporate techniques described in U.S. patent application Ser. No. 16/822,103, now U.S. Pat. No. 11,194,109. A large number of parallel optical paths (or spatial paths) can be arranged in two-dimensional arrays using connector structures, which can incorporate techniques described in U.S. patent application Ser. No. 16/816,171, now U.S. Pat. No. 11,287,585.

Figure 35B:
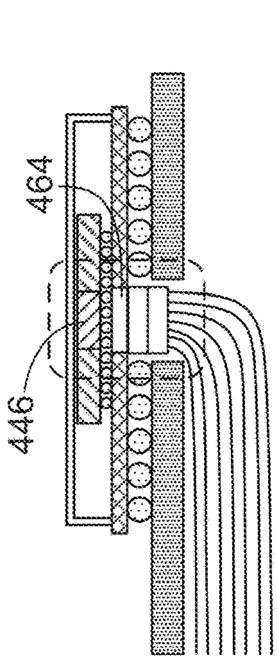
FIGS. 35B and 35C are diagrams of co-packaged optical interconnect modules.
Figure 35C:
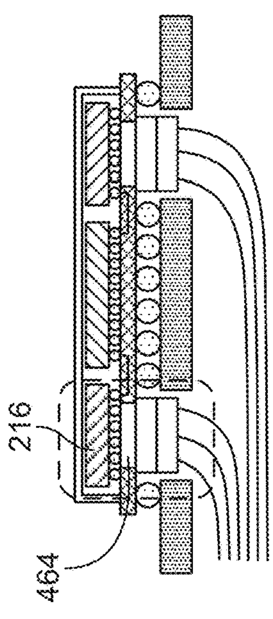
Figure 35A:
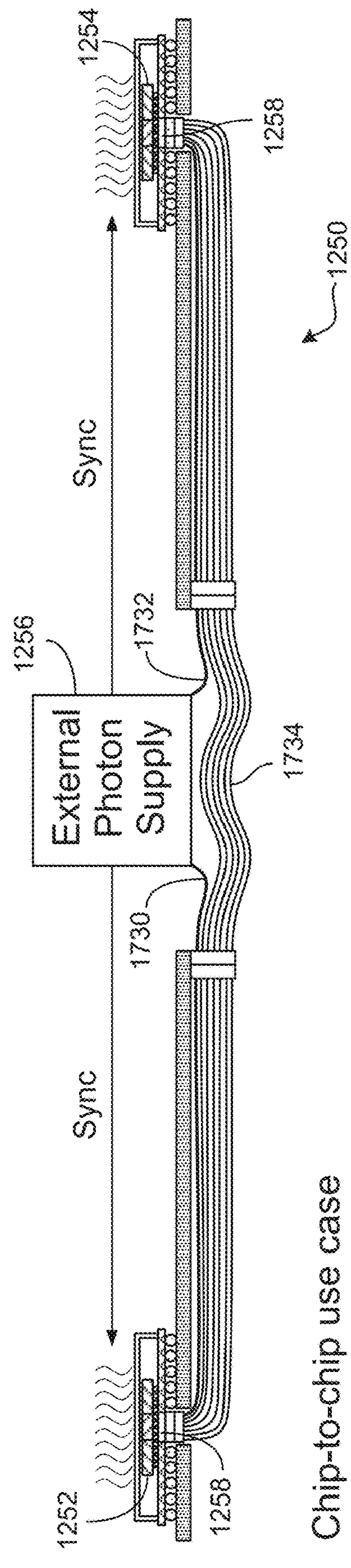
FIG. 35A is a diagram an optical communications system.

FIG. 35A shows an optical communications system 1250 providing high-speed communications between a first chip 1252 and a second chip 1254 using co-packaged optical (CPO) interconnect modules 1258 similar to those shown in, e.g., FIGS. 2-5 and 17. Each of the first and second chips 1252, 1254 can be a high-capacity chip, e.g., a high bandwidth Ethernet switch chip. The first and second chips 1252, 1254 communicate with each other through an optical fiber interconnection cable 1734 that includes a plurality of optical fibers. In some implementations, the optical fiber interconnection cable 1734 can include optical fiber cores that transmit data and control signals between the first and second chips 802, 804. The optical fiber interconnection cable 1734 also includes one or more optical fiber cores that transmit optical power supply light from an optical power supply or photon supply to photonic integrated circuits that provide optoelectronic interfaces for the first and second chips 1252, 1254. The optical fiber interconnection cable 1734 can include single-core fibers or multi-core fibers. Each single-core fiber includes a cladding and a core, typically made from glasses of different refractive indices such that the refractive index of the cladding is lower than the refractive index of the core to establish a dielectric optical waveguide. Each multi-core optical fiber includes a cladding and multiple cores, typically made from glasses of different refractive indices such that the refractive index of the cladding is lower than the refractive index of the core. More complex refractive index profiles, such as index trenches, multi-index profiles, or gradually changing refractive index profiles can also be used. More complex geometric structures such as non-circular cores or claddings, photonic crystal structures, photonic bandgap structures, or nested antiresonant nodeless hollow core structures can also be used.

The example of FIG. 35A illustrates a switch-to-switch use case. An external optical power supply or photon supply 1256 provides optical power supply signals, which can be, e.g., continuous-wave light, one or more trains of periodic optical pulses, or one or more trains of non-periodic optical pulses. The power supply light is provided from the photon supply 1256 to the co-packaged optical interconnect modules 1258 through optical fibers 1730 and 1732, respectively. For example, the optical power supply 1256 can provide continuous wave light, or both pulsed light for data modulation and synchronization, as described in U.S. patent application Ser. No. 16/847,705, now U.S. Pat. No. 11,153,670. This allows the first chip 1252 to be synchronized with the second chip 1254.

For example, the photon supply 1256 can correspond to the optical power supply 103 of FIG. 1. The pulsed light from the photon supply 1256 can be provided to the link 102_6 of the data processing system 200 of FIG. 20. In some implementations, the photon supply 1256 can provide a sequence of optical frame templates, in which each of the optical frame templates includes a respective frame header and a respective frame body, and the frame body includes a respective optical pulse train. The modulators 417 can load data into the respective frame bodies to convert the sequence of optical frame templates into a corresponding sequence of loaded optical frames that are output through optical fiber link 102_1.

The implementation shown in FIG. 35A uses a packaging solution corresponding to FIG. 35B, whereby in contrast to FIG. 17 substrates 454 and 460 are not used and the photonic integrated circuit 464 is directly attached to the serializers/deserializers module 446. FIG. 35C shows an implementation similar to FIG. 5, in which the photonic integrated circuit 464 is directly attached to the serializers/deserializers 216.

Figure 36:
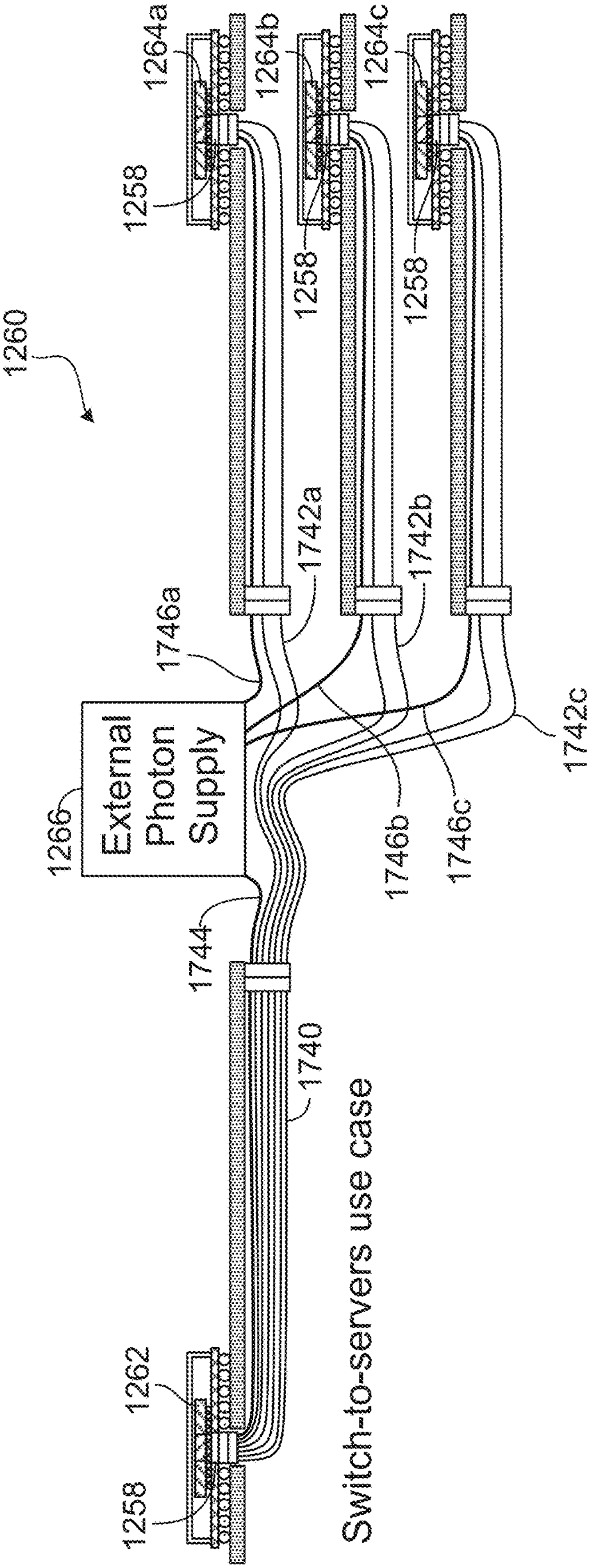
FIGS. 36 and 37 are diagrams of examples of optical communications systems.

FIG. 36 shows an example of an optical communications system 1260 providing high-speed communications between a high-capacity chip 1262 (e.g., an Ethernet switch chip) and multiple lower-capacity chips 1264*a*, 1264*b*, 1264*c*, e.g., multiple network interface cards (NICs) attached to computer servers) using co-packaged optical interconnect modules 1258 similar to those shown in FIG. 35A. The high-capacity chip 1262 communicates with the lower-capacity chips 1264*a*, 1264*b*, 1264*c* through a high-capacity optical fiber interconnection cable 1740 that later branches out into several lower-capacity optical fiber interconnection cables 1742*a*, 1742*b*, 1742*c* that are connected to the lower-capacity chips 1264*a*, 1264*b*, 1264*c*, respectively. This example illustrates a switch-to-servers use case.

An external optical power supply or photon supply 1266 provides optical power supply signals, which can be continuous-wave light, one or more trains of periodic optical pulses, or one or more trains of non-periodic optical pulses. The power supply light is provided from the photon supply 1266 to the optical interconnect modules 1258 through optical fibers 1744, 1746*a*, 1746*b*, 1746*c*, respectively. For example, the optical power supply 1266 can provide both pulsed light for data modulation and synchronization, as described in U.S. patent application Ser. No. 16/847,705, now U.S. Pat. No. 11,153,670. This allows the high-capacity chip 1262 to be synchronized with the lower-capacity chips 1264*a*, 1264*b*, and 1264*c*.

Figure 37:
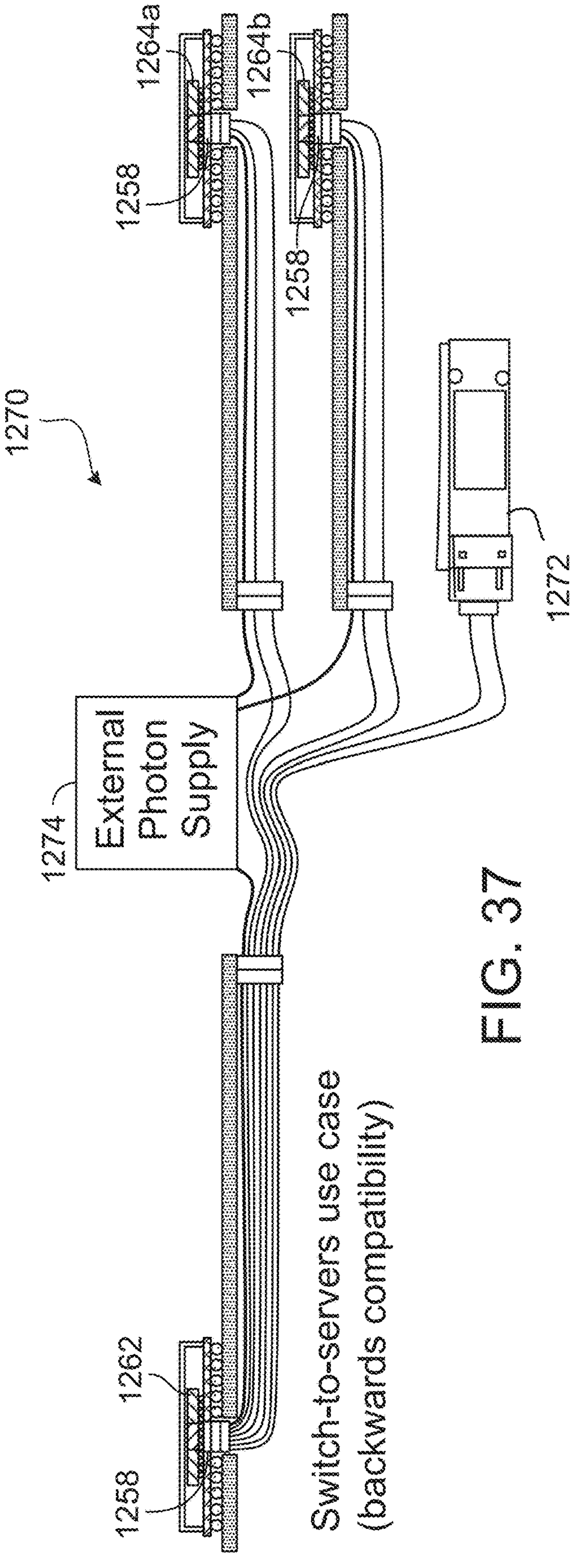

FIG. 37 shows an optical communications system 1270 providing high-speed communications between a high-capacity chip 1262 (e.g., an Ethernet switch chip) and multiple lower-capacity chips (1264*a*, 1264*b*, e.g., multiple network interface cards (NICs) attached to computer servers) using a mix of co-packaged optical interconnect modules 1258 similar to those shown in FIG. 35 as well as conventional pluggable optical interconnect modules 1272.

An external optical power supply or photon supply 1274 provides optical power supply signals, which can be continuous-wave light, one or more trains of periodic optical pulses, or one or more trains of non-periodic optical pulses. For example, the optical power supply 1274 can provide both pulsed light for data modulation and synchronization, as described in U.S. patent application Ser. No. 16/847,705, now U.S. Pat. No. 11,153,670. This allows the high-capacity chip 1262 to be synchronized with the lower-capacity chips 1264*a* and 1264*b*.

Some aspects of the systems 1250, 1260, and 1270 are described in more detail in connection with FIGS. 79 to 84B.

Figure 43:
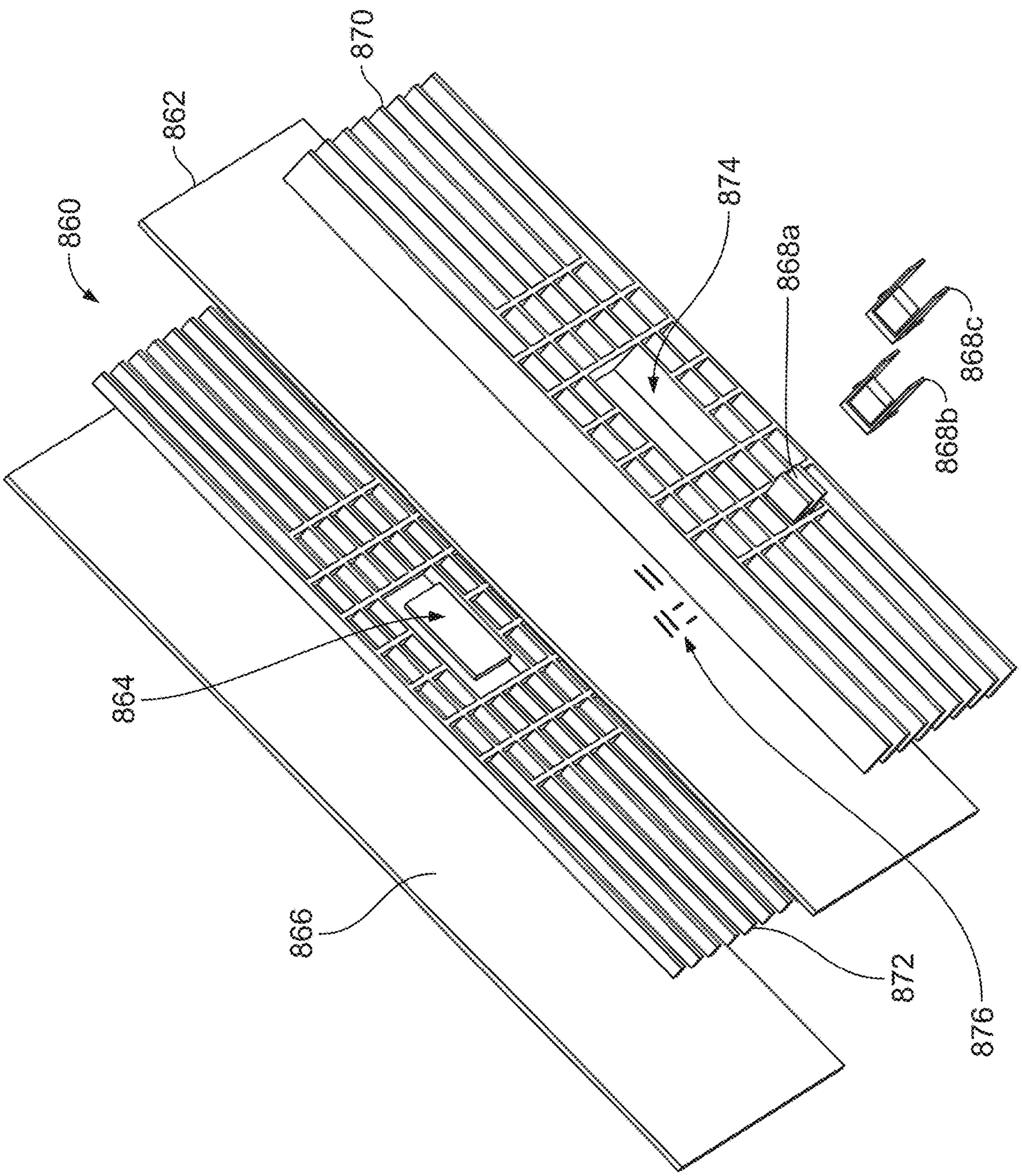
FIG. 43 is an exploded view of an example of a front-mounted module of a data processing system.

FIG. 43 shows an exploded view of an example of a front-mounted module 860 of a data processing system that includes a vertically mounted printed circuit board 862 (or substrate made of, e.g., organic or ceramic material), a host application specific integrated circuit 864 mounted on the back-side of the circuit board 862, and a heat sink 866. In some examples, the host application specific integrated circuit 864 is mounted on a substrate (e.g., a ceramic substrate), and the substrate is attached to the circuit board 862. The front-mounted module 860 can be, e.g., the front panel of the housing of the data processing system, similar to the configuration shown in FIGS. 26A, 28A or positioned near the front panel of the housing, similar to the configuration shown in FIGS. 27, 28B. Three optical modules with connectors, e.g., 868*a*, 868*b*, 868*c*, collectively referenced as 868, are shown in the figure. Additional optical modules with connectors can be used. The data processing system can be similar to, e.g., the data processing system 680 (FIG. 26A) or 700 (FIG. 27). The printed circuit board 862 can be similar to, e.g., the printed circuit board 683 (FIG. 26) or 708 (FIG. 27). The application specific integrated circuit 864 can be similar to, e.g., the application specific integrated circuit 681 (FIG. 26) or 702 (FIG. 27). The heat sink 866 can be similar to, e.g., the heat sink 576 (FIG. 23). The optical modules with connectors 868 each include an optical module 880 (see FIGS. 44, 45) and a mechanical connector structure 900 (see FIGS. 46, 47). The optical module 880 can be similar to, e.g., the optical/electrical communication interfaces 682 (FIG. 26) or 704 (FIG. 27), or the integrated optical communication device 512 of FIG. 32.

The optical module with connector 868 can be inserted into a first grid structure 870, which can function as both (i) a heat spreader/heat sink and (ii) a mechanical holding fixture for the optical modules with connectors 868. The first grid structure 870 includes an array of receptors, and each receptor can receive an optical module with connector 868. When assembled, the first grid structure 870 is connected to the printed circuit board 862. The first grid structure 870 can be firmly held in place relative to the printed circuit board 862 by sandwiching the printed circuit board 862 in between the first grid structure 870 and a second structure 872 (e.g., a second grid structure) located on the opposite side of the printed circuit board 862 and connected to the first grid structure 870 through the printed circuit board 862, e.g., by use of screws. Thermal vias between the first grid structure 870 and the second structure 872 can conduct heat from the front-side of the printed circuit board 862 to the heat sink 866 on the back-side of the printed circuit board 862. Additional heat sinks can also be mounted directly onto the first grid structure 870 to provide cooling in the front.

The printed circuit board 862 includes electrical contacts 876 configured to electrically connect to the removable optical module with connectors 868 after the removable optical module with connectors 868 are inserted into the first grid structure 870. The first grid structure 870 can include an opening 874 at the location in which the host application specific integrated circuit 864 is mounted on the other side of the printed circuit board 862 to allow for components such as voltage regulators, filters, and/or decoupling capacitors to be mounted on the printed circuit board 862 in immediate lateral vicinity to the host application specific integrated circuit 864.

In some examples, the host application specific integrated circuit 864 is mounted on a substrate (e.g., a ceramic substrate), and the substrate is attached to the circuit board 862, similar to the examples shown in FIGS. 136 to 159. The substrate can be similar to the substrate 13602 of FIGS. 136 to 159, the second grid structure 872 can be similar to the rear lattice structure 13626, the circuit board 862 can be similar to the printed circuit board 13604, the host application specific integrated circuit 864 can be similar to the data processing chip 12312, and the heat sink 866 can be similar to the heat dissipating device 13610. The first grid structure 870 can have an overall shape similar to the front lattice structure 13606 of FIGS. 136 to 159, except that the first grid structure 870 includes mechanisms for coupling to the removable optical module with connectors 868.

Figure 45:
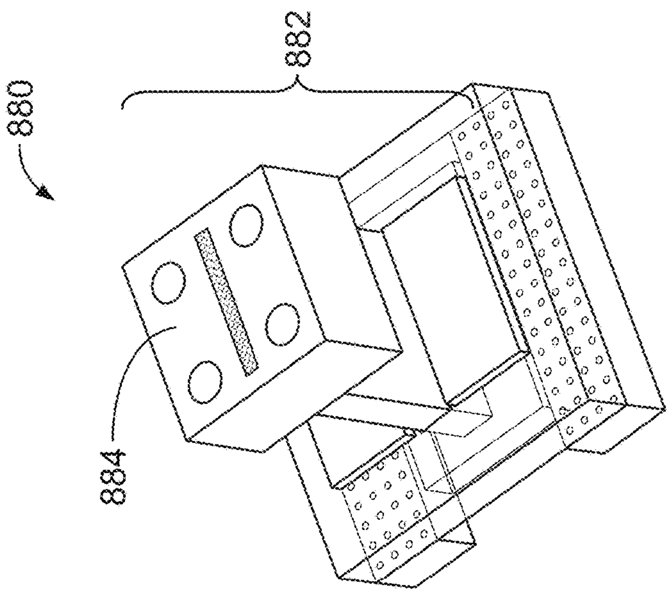
FIG. 45 is an assembled view of the internals of an optical module.
Figure 44:
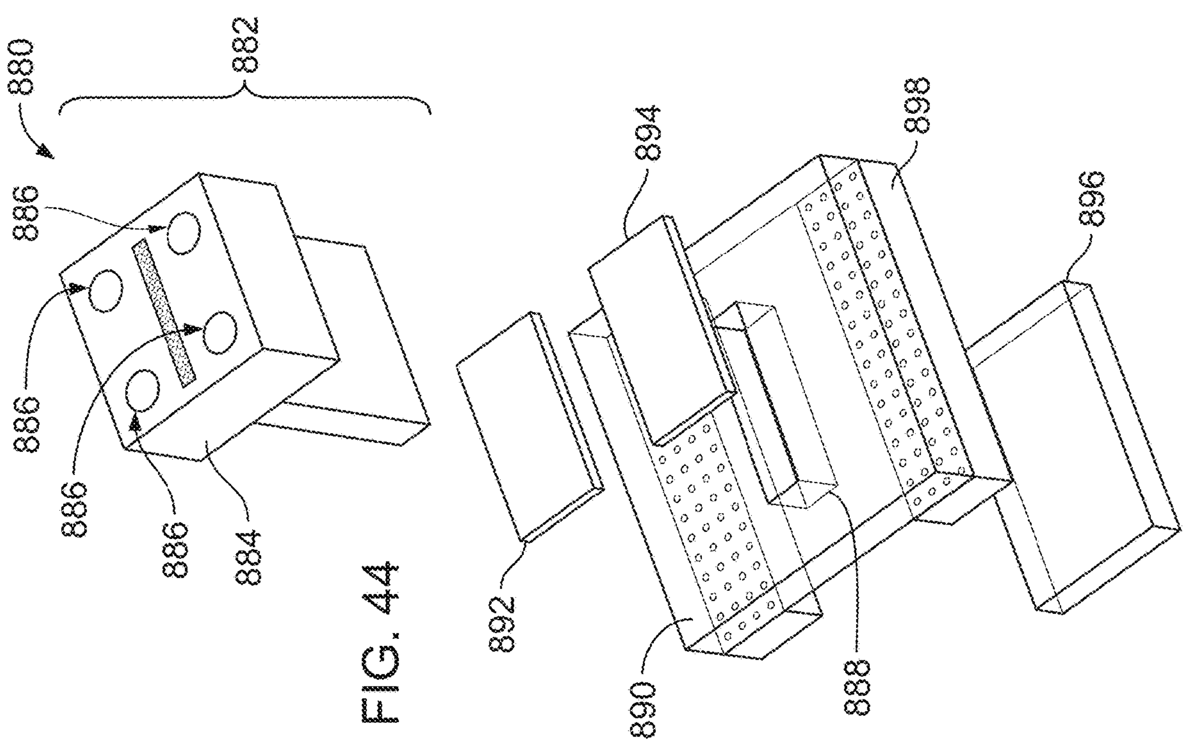
FIG. 44 is an exploded view of an example of the internals of an optical module.

FIGS. 44 and 45 show an exploded view and an assembled view, respectively, of an example optical module 880, which can be similar to the integrated optical communication device 512 of FIG. 32. The optical module 880 includes an optical connector part 882 (which can be similar to the first optical connector 520 of FIG. 32) that can either directly or through an (e.g., geometrically wider) upper connector part 884 receive light from fibers embedded in a second optical connector part (not shown in FIGS. 44, 45), which can be similar to, e.g., the optical connector part 268 of FIGS. 6 and 7). In the example shown in FIGS. 44, 45, a matrix of fibers, e.g., 2×18 fibers, can be optically coupled to the optical connector part 882. The matrix of fibers can have other configurations, such as a 3×12, 1×12, 3×12, 6×12, 12×12, 16×16, or 32×32 array of fibers. For example, the optical connector part 882 can have a configuration similar to the fiber coupling region 430 of FIG. 15 that is configured to couple 2×18 fibers, or any other number of fibers. The upper connector part 884 can also include alignment structures 886 (e.g., holes, grooves, posts) to receive corresponding mating structures of the second optical connector part.

The optical module 880 can have any of various configurations, including an optical module containing silicon photonics integrated optics, indium phosphide integrated optics, one or more vertical-cavity surface-emitting lasers (VC SEL)s, one or more direct-detection optical receivers, or one or more coherent optical receivers. The optical module 880 can include any of the optical modules, co-packaged optical modules, integrated optical communication devices (e.g., 448, 462, 466, or 472 of FIG. 17, or 210 of FIG. 20), integrated communication devices (e.g., 612 of FIG. 23), or optical/electrical communication interfaces (e.g., 684 of FIG. 26, 724 of FIG. 28, or 760 of FIG. 29) described in this specification and the documents incorporated by reference.

The optical connector part 882 is inserted through an opening 888 of a substrate 890 and optically coupled to a photonic integrated circuit 896 mounted on the underside of the substrate 890. The substrate 890 can be similar to the substrate 514 of FIG. 32, and the photonic integrated circuit 896 can be similar to the photonic integrated circuit 524. A first serializers/deserializers chip 892 and a second serializers/deserializers chip 894 are mounted on the substrate 890, in which the chip 892 is positioned on one side of the optical connector part 882, and the chip 894 is positioned on the other side of the optical connector part 882. The first serializers/deserializers chip 892 can include circuitry similar to, e.g., the third serializers/deserializers module 398 and the fourth serializers/deserializers module 400 of FIG. 32. The second serializers/deserializers chip 894 can include circuitry similar to, e.g., the first serializers/deserializers module 394 and the second serializers/deserializers module 396. A second slab 898 (which can be similar to the second slab 518 of FIG. 32) can be provided on the underside of the substrate 890 to provide a removable connection to a package substrate (e.g., 230).

Figure 46:
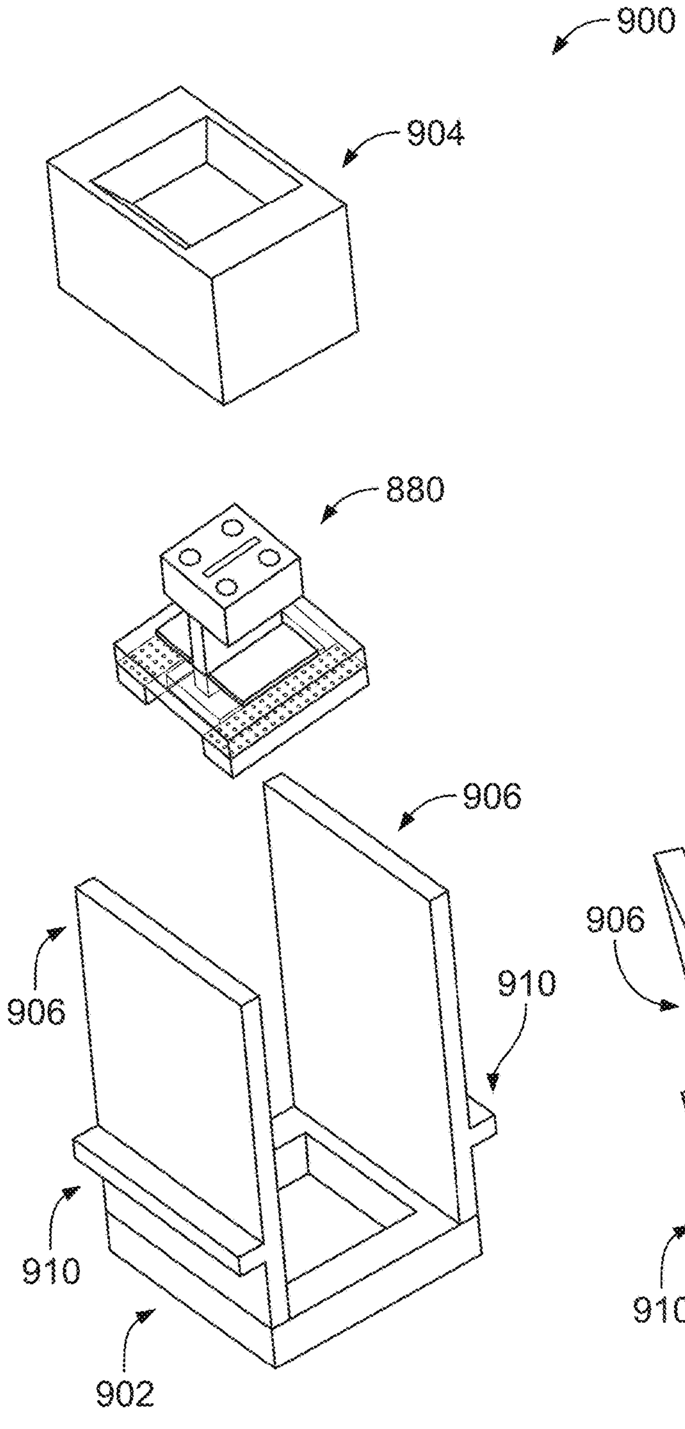
FIG. 46 is an exploded view of an optical module.
Figure 47:
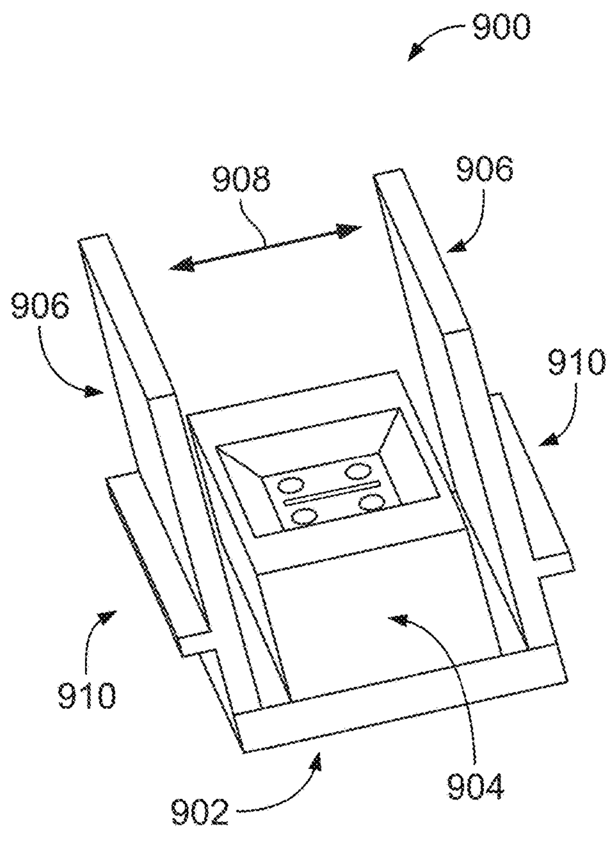
FIG. 47 is an assembled view of an optical module.

FIGS. 46 and 47 show an exploded view and an assembled view, respectively, of a mechanical connector structure 900 built around the functional optical module 880 of FIGS. 44, 45. In this example embodiment, the mechanical connector structure 900 includes a lower mechanical part 902 and an upper mechanical part 904 that together receive the optical module 880. Both lower and upper mechanical connector parts 902, 904 can be made of a heat-conducting and rigid material, e.g., a metal.

In some implementations, the upper mechanical part 904, at its underside, is brought in thermal contact with the first serializers/deserializers chip 892 and the second serializers/deserializers chip 894. The upper mechanical part 904 is also brought in thermal contact with the lower mechanical part 902. The lower mechanical part 902 includes a removable latch mechanism, e.g., two wings 906 that can be elastically bent inwards (the movement of the wings 906 are represented by a double-arrow 908 in FIG. 47), and each wing 906 includes a tongue 910 on an outer side.

Figure 48:
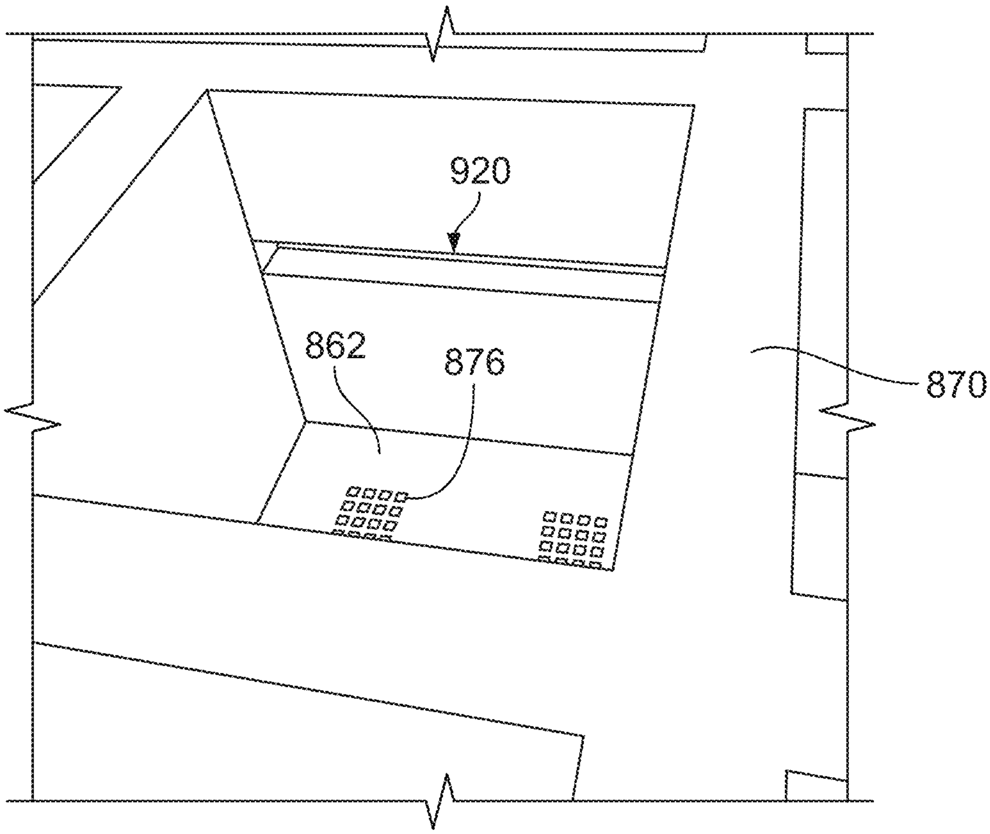
FIG. 48 is a diagram of a portion of a grid structure and a circuit board.

FIG. 48 is a diagram of a portion of the first grid structure 870 and the circuit board 862. In some examples, a substrate (e.g., a ceramic substrate) can be used in place of the circuit board 862. Grooves 920 are provided on the walls of the first grid structure 870. As shown in the figure, the printed circuit board 862 (or substrate) has electrical contacts 876 that can be electrically coupled to electrical contacts on the second slab 898 of the optical module 880. For example, the electrical contacts 876 can include an array of electrical contacts that has at least four rows and four columns of electrical contacts. For example, the array of electrical contacts can have ten or more rows or columns of electrical contacts. The electrical contacts 876 can be arranged in any two-dimensional pattern and do not necessarily have to be arranged in rows and columns. The circuit board 862 (or substrate) can also have three-dimensional features, such as on protruding elements or recessed elements, and the electrical contacts can be provided on the three-dimensional features. The optical module with connectors 868 can have three-dimensional features with electrical contacts that mate with the corresponding three-dimensional features with electrical contacts on the circuit board 862 (or substrate).

Figure 49:
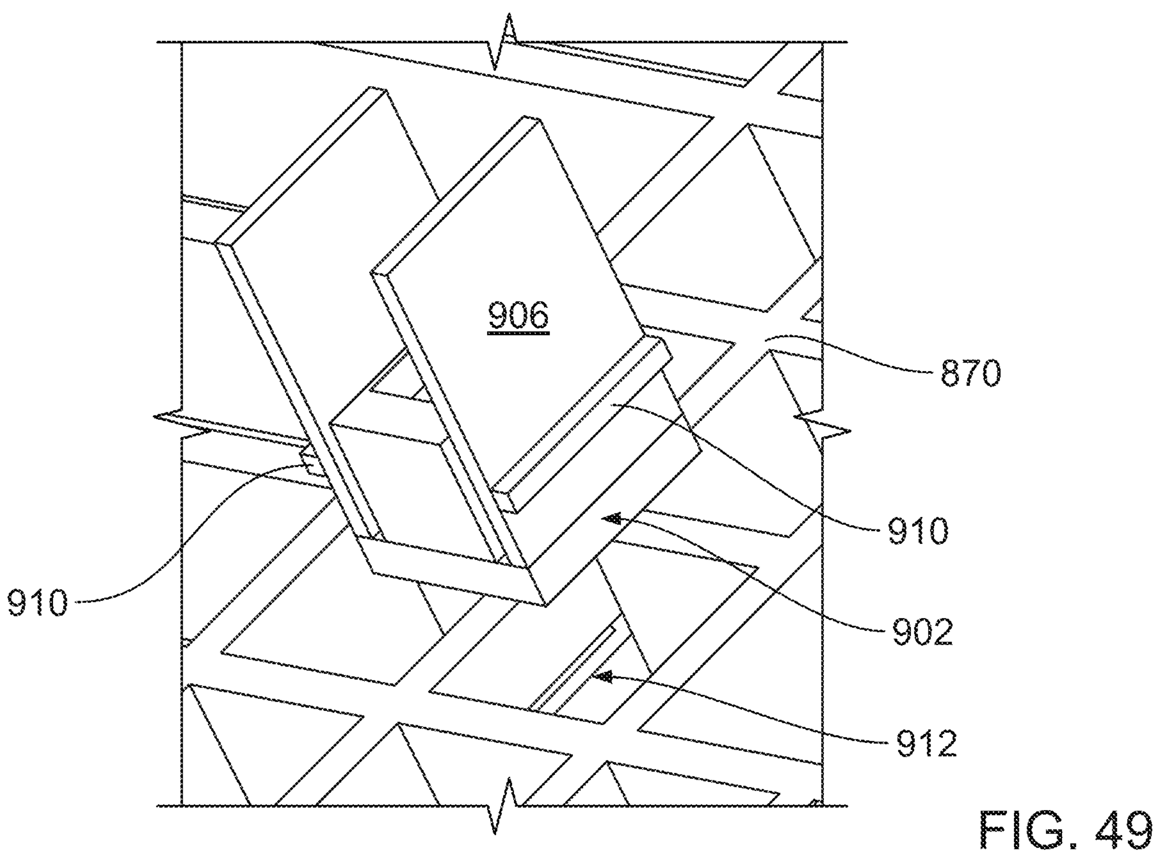
FIG. 49 is a diagram showing a lower mechanical part prior to insertion into the grid structure.

Referring to FIG. 49, when the lower mechanical part 902 is inserted into the first grid structure 870, the tongues 910 (on the wings 906 of the lower mechanical part 902) can snap into corresponding grooves 920 within the first grid structure 870 to mechanically hold the optical module 880 in place. The position of the tongues 910 on the wings 906 is selected such that when the mechanical connector structure 900 and the optical module 880 are inserted into the first grid structure 870, the electrical connectors at the bottom of the second slab 898 are electrically coupled to the electrical contacts 876 on the printed circuit board 862 (or substrate). For example, the second slab 898 can include spring-loaded contacts that are mated with the contacts 876.

Figure 50:
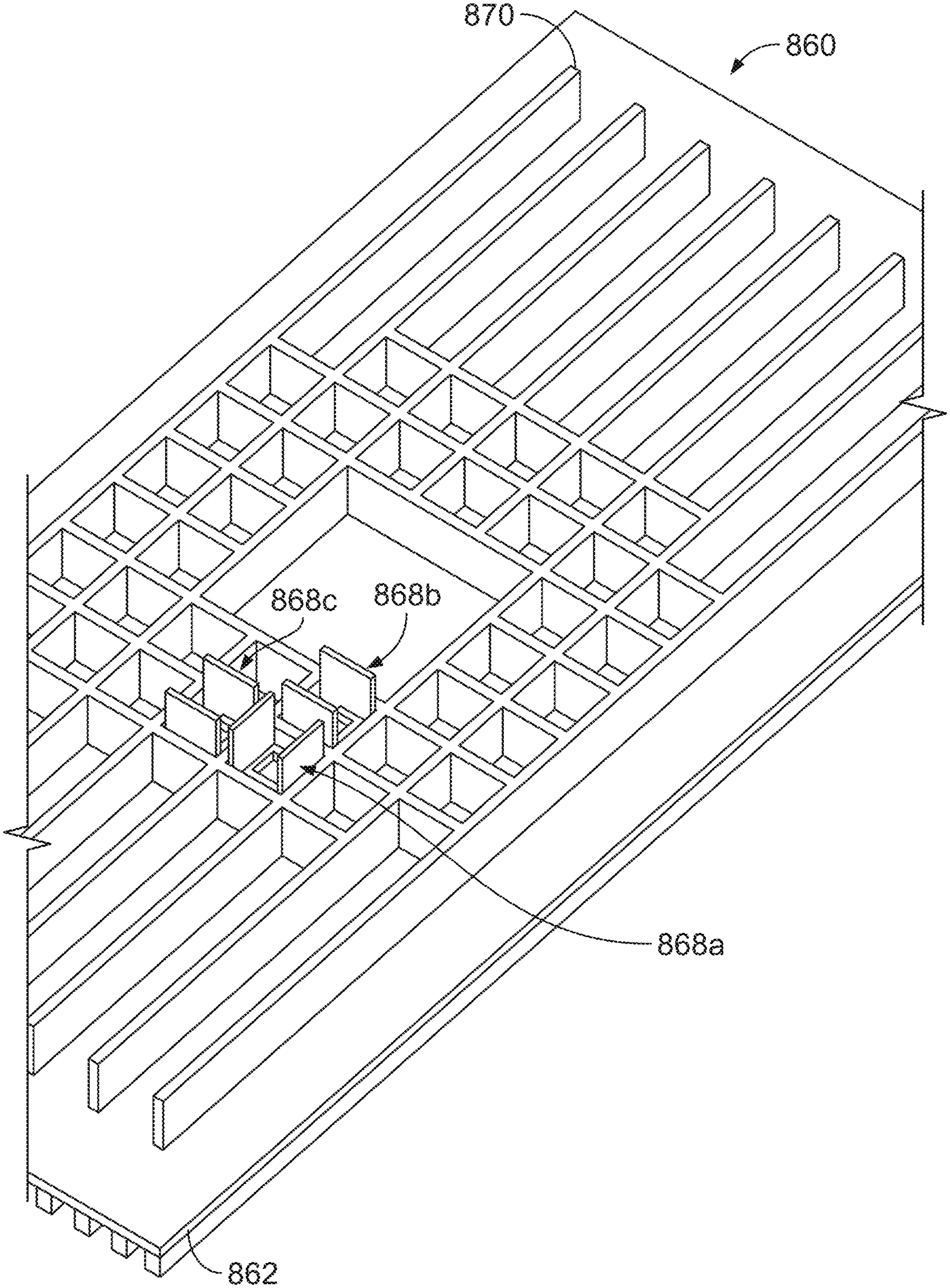
FIG. 50 is a diagram of an example of a partially populated front-view of an assembled system.

FIG. 50 shows the front-view of an assembled front module 860. Three optical module with connectors (e.g., 868*a*, 868*b*, 868*c*) are inserted into the first grid structure 870. In some embodiments, the optical modules 880 are arranged in a checkerboard pattern, whereby adjacent optical modules 880 and the corresponding mechanical connector structures 900 are rotated by 90 degrees such as to not allow any two wings to touch. This facilitates the removal of individual modules. In this example, the optical module with connector 868*a* is rotated 90 degrees relative to the optical module with connectors 868*b*, 868*c*.

Figure 51B:
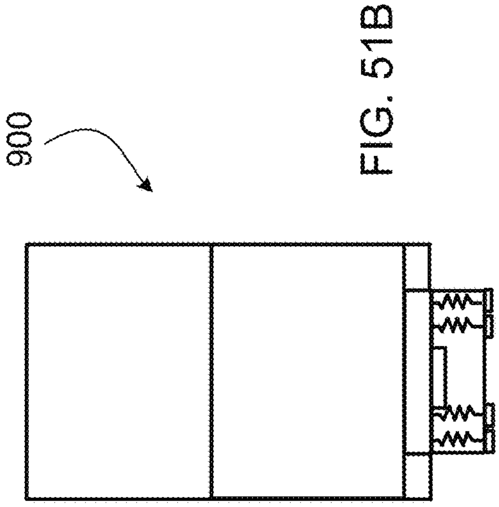
FIG. 51B is a side view of an example of the mounting of the module.
Figure 51A:
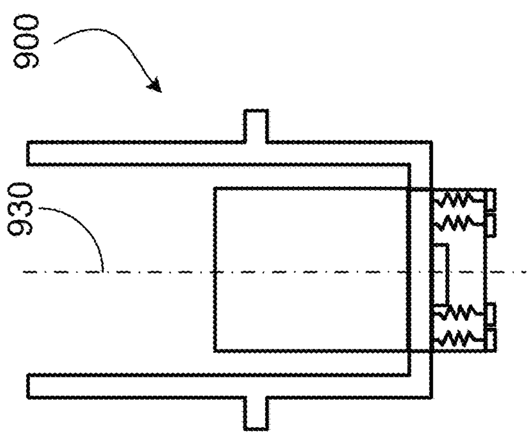
FIG. 51A is a front view of an example of the mounting of the module.

FIG. 51A shows a first side view of the mechanical connector structure 900. FIG. 51B shows a cross-sectional view of the mechanical connector structure 900 along a plane 930 shown in FIG. 51A. In some examples, the compression interposer (e.g., spring-loaded contacts) can be part of the receiving structure (e.g., mounted on the circuit board or substrate) as opposed to the removable module.

Figure 52B:
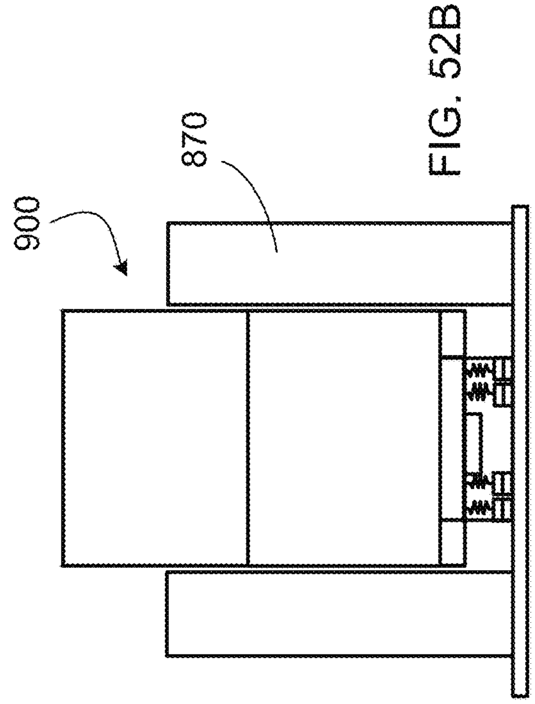
FIG. 52B is a side view of an example of the mechanical connector structure and an optical module mounted within a grid structure.
Figure 52A:
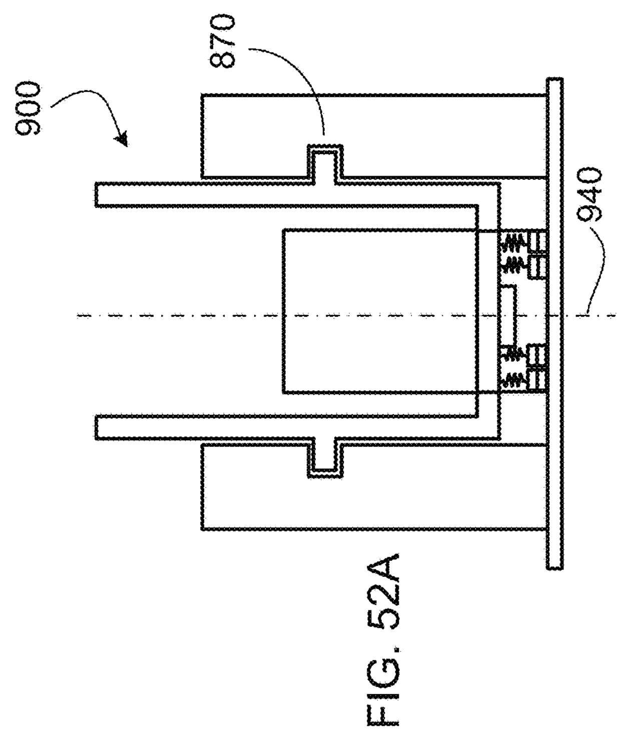
FIG. 52A is a front view of an example of the mechanical connector structure and an optical module mounted within a grid structure.

FIG. 52A shows a first side view of the mechanical connector structure 900 mounted within the first grid structure 870. FIG. 52B shows a cross-sectional view of the mechanical connector structure 900 mounted within the first grid structure 870 along a plane 940 shown in FIG. 52A.

Figure 53:
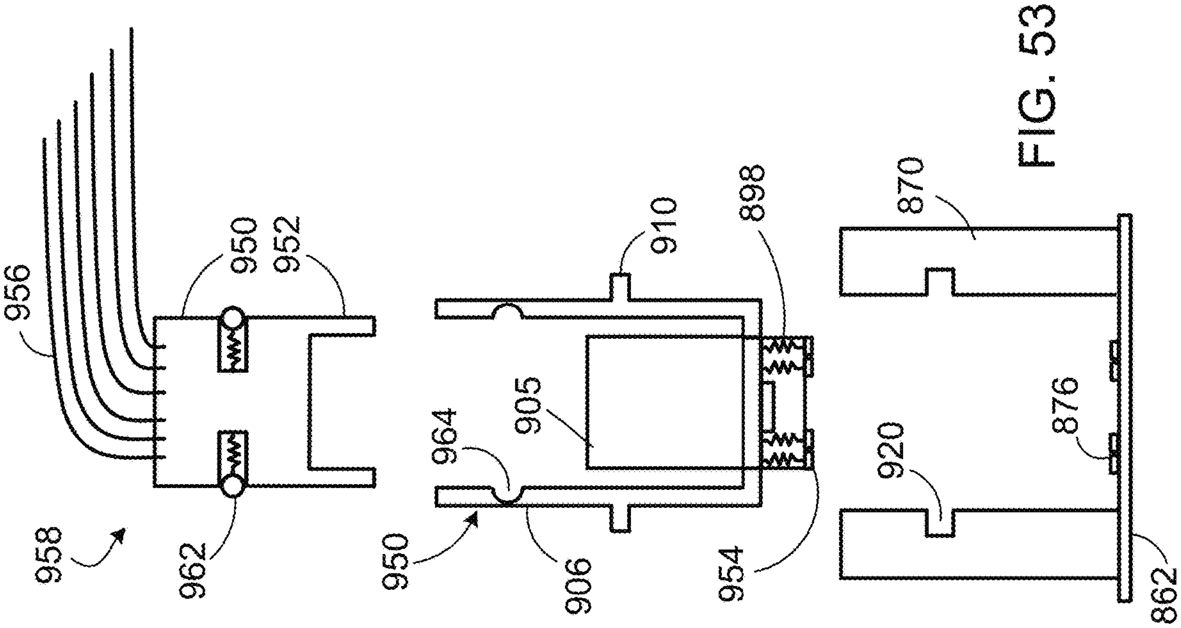

FIG. 53 is a diagram of an assembly 958 that includes a fiber cable 956 that includes a plurality of optical fibers, an optical fiber connector 950, the mechanical connector module 900, and the first grid structure 870. The optical fiber connector 950 can be inserted into the mechanical connector module 900, which can be further inserted into the first grid structure 870. The printed circuit board 862 (or substrate) is attached to the first grid structure 870, in which the electrical contacts 876 face electrical contacts 954 on the bottom side of the second slab 898 of the optical module 880.

Figure 54:
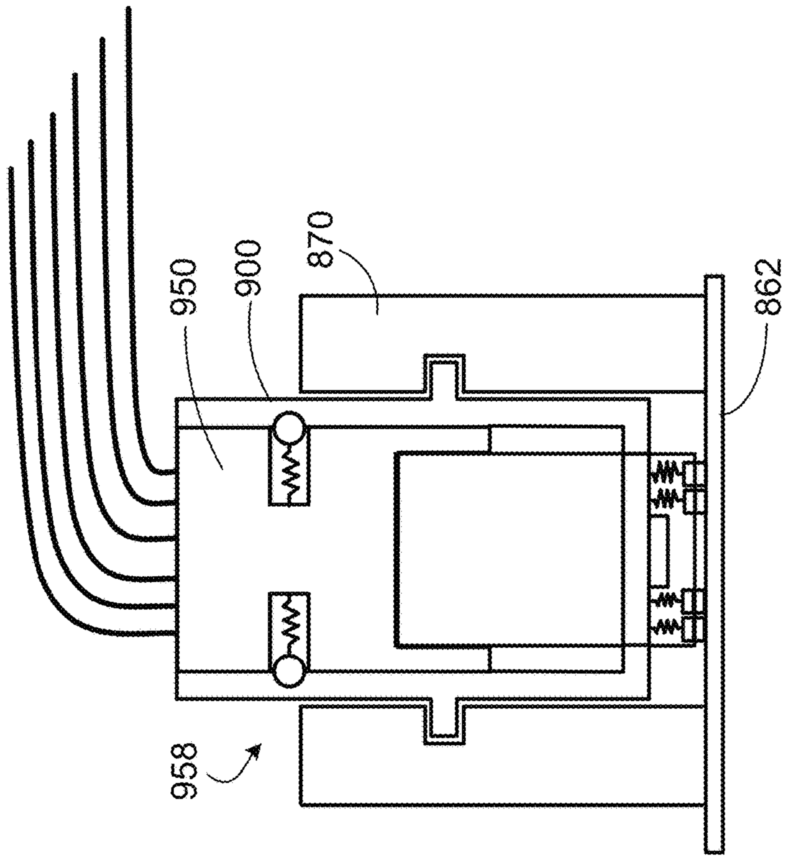
FIGS. 53 and 54 are diagrams of an example of an assembly that includes a fiber cable, an optical fiber connector, a mechanical connector module, and a grid structure.

FIG. 53 shows the individual components before they are connected. FIG. 54 is a diagram that shows the components after they are connected. The optical fiber connector 950 includes a lock mechanism 952 that disables the snap-in mechanism of the mechanical connector structure 900 so as to lock in place the mechanical connector structure 900 and the optical module 880. In this example embodiment, the lock mechanism 952 includes studs on the optical fiber connector 950 that insert between the wings 906 and the upper mechanical part 904 of the mechanical connector module 900, hence disabling the wings 906 from elastically bending inwards and consequentially locking the mechanical connector structure 900 and the optical module 880 in place. Further, the mechanical connector structure 900 includes a mechanism to hold the optical fiber connector 950 in place, such as a ball-detent mechanism as shown in the figure. When the optical fiber connector 950 is inserted into the mechanical connector structure 900, spring-loaded balls 962 on the optical fiber connector 950 engage detents 964 in the wings 906 of the mechanical connector structure 900. The springs push the balls 962 against the detents 964 and secure the optical fiber connector 950 in place.

To remove the optical module 880 from the first grid structure 870, the user can pull the optical fiber connector 950 and cause the balls 962 to disengage from the detents 964. The user can then bend the wings 906 inwards so that the tongues 910 disengage from the grooves 920 on the walls of the first grid structure 870.

Figure 55A:
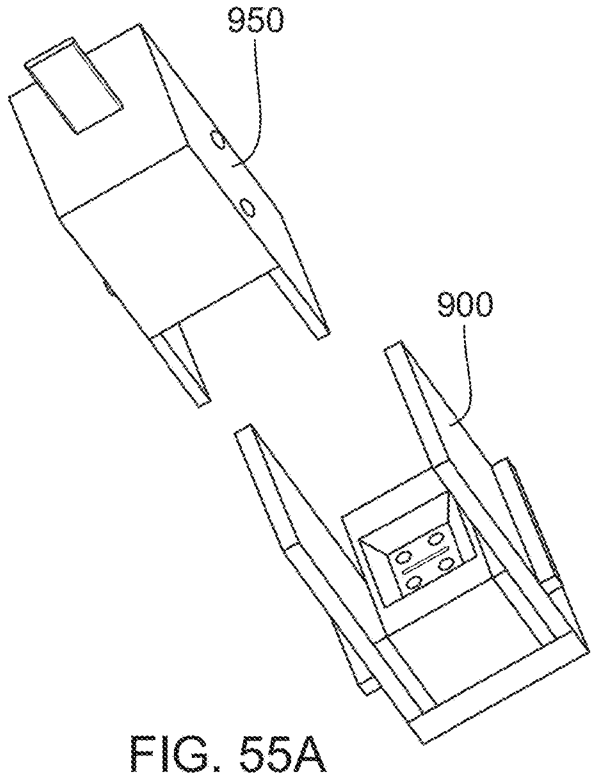
FIGS. 55A and 55B are perspective views of the mechanisms shown in FIGS. 53 and 54 before the optical fiber connector is inserted into the mechanical connector structure.
Figure 55B:
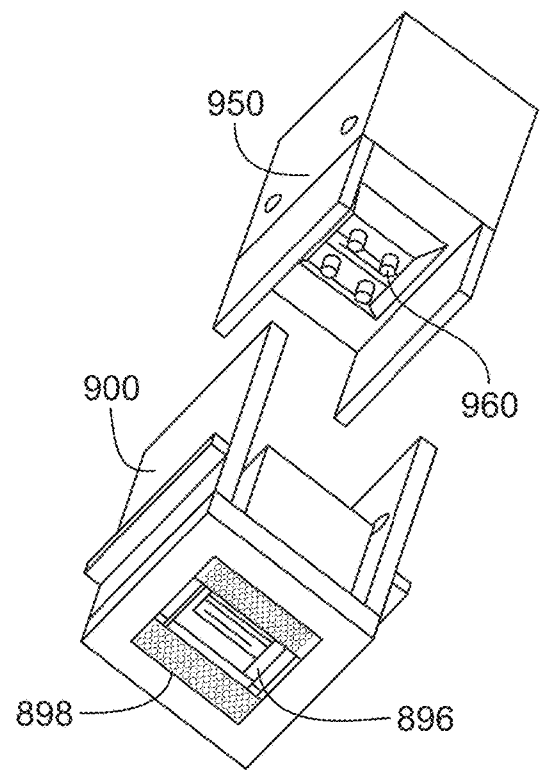

FIGS. 55A and 55B show perspective views of the mechanisms shown in FIGS. 53 and 54 before the optical fiber connector 950 is inserted into the mechanical connector structure 900. As shown in FIG. 55B, the lower side of the optical connector 950 includes alignment structures 960 that mate with the alignment structures 886 (FIG. 44) on the upper connector part 884 of the optical module 880. FIG. 55B also shows the photonic integrated circuit 896 and the second slab 898 that includes electrical contacts (e.g., spring-loaded electrical contacts).

Figure 56:
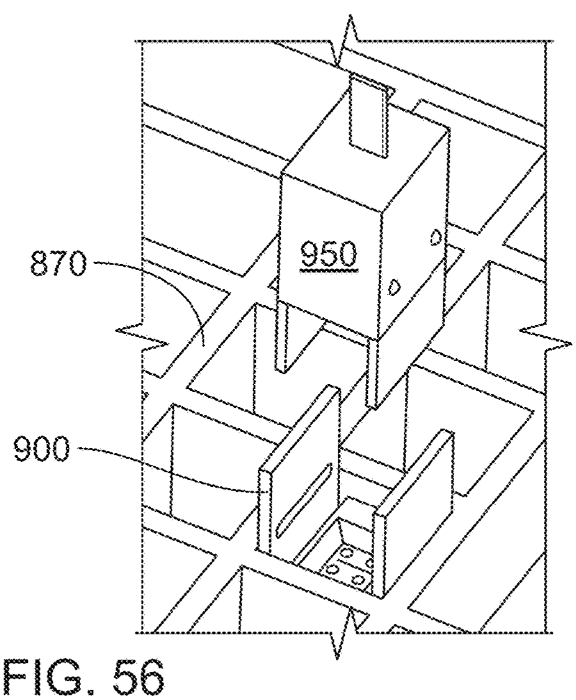
FIG. 56 is a perspective view showing that the optical module and the mechanical connector structure are inserted into the grid structure.

FIG. 56 is a perspective view showing that the optical module 880 and the mechanical connector structure 900 are inserted into the first grid structure 870, and the optical fiber connector 950 is separated from the mechanical connector structure 900.

Figure 57:
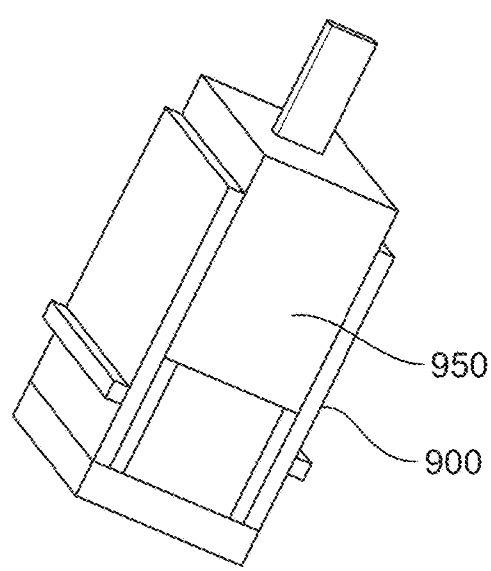
FIG. 57 is a perspective view showing that the optical fiber connector is mated with the mechanical connector structure.

FIG. 57 is a perspective view showing that the optical fiber connector 950 is mated with the mechanical connector structure 900, locking the optical module 880 within the mechanical connector structure 900.

Figure 58A:
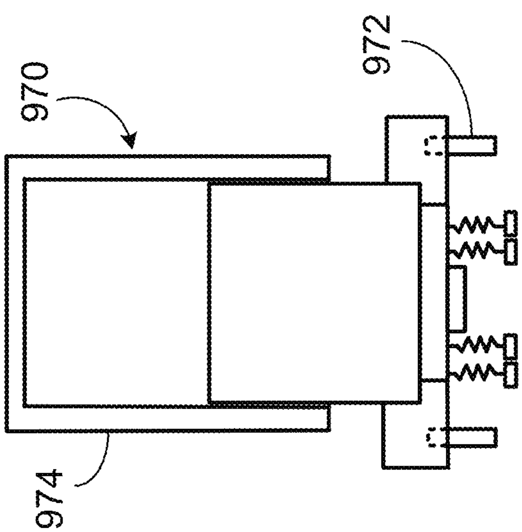
FIGS. 58A to 58D are diagrams of an example an optical module that includes a latch mechanism.
Figure 58B:
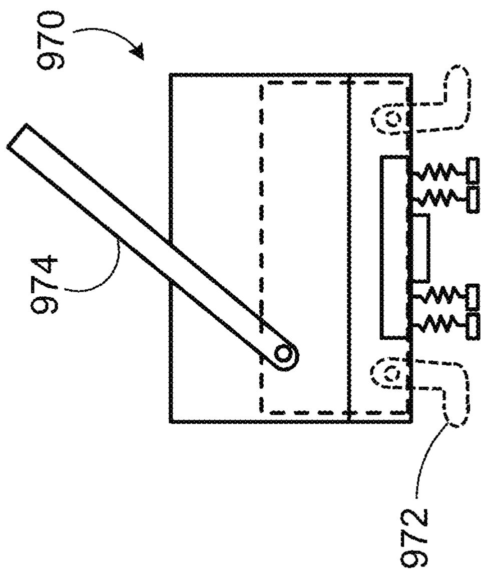
Figure 58C:
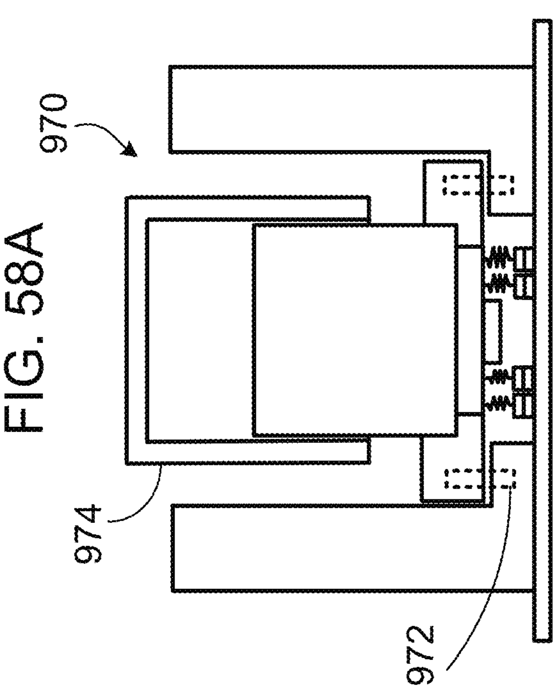
Figure 58D:
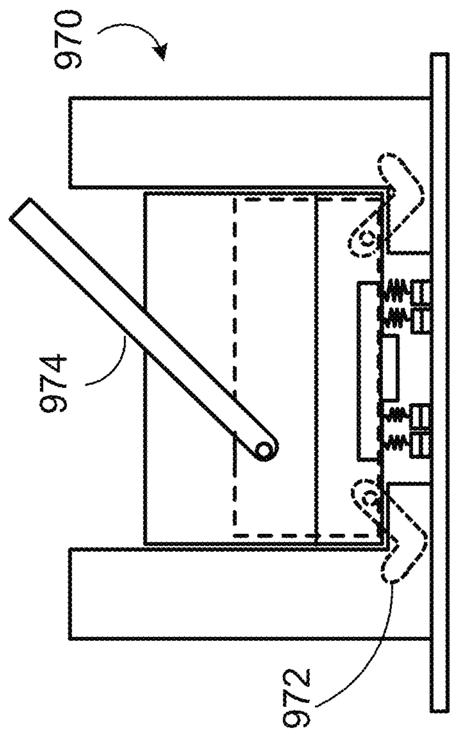

FIGS. 58A to 58D show an alternate embodiment in which an optical module with connector 970 includes a latch mechanism 972 that acts as a mechanical fastener that joins the optical module 880 to the printed circuit board 862 (or substrate) using the first grid structure 870 as a support. FIGS. 58A and 58B show various views of the optical module with connector 970 that includes the latch mechanism 972. FIGS. 58C and 58D show various views of the optical module with connector 970 coupled to the printed circuit board 862 (or substrate) and the first grid structure 870. For example, the user can easily attach or remove the optical module with connector 970 by pressing a lever 974 activating the latch mechanism 972. The lever 974 is built in a way that it does not block the optical fibers (not shown in the figure) coming out of the optical module with connector 970. Alternatively, an external tool can be used as a removable lever.

Figure 59:
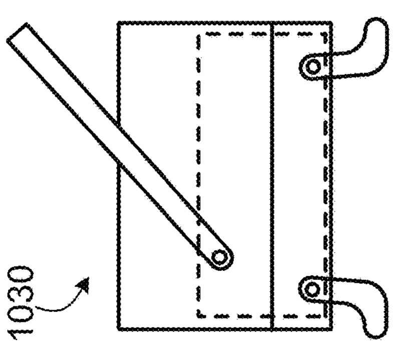
FIG. 59 is a diagram of an alternative example of the optical module.
Figure 60A:
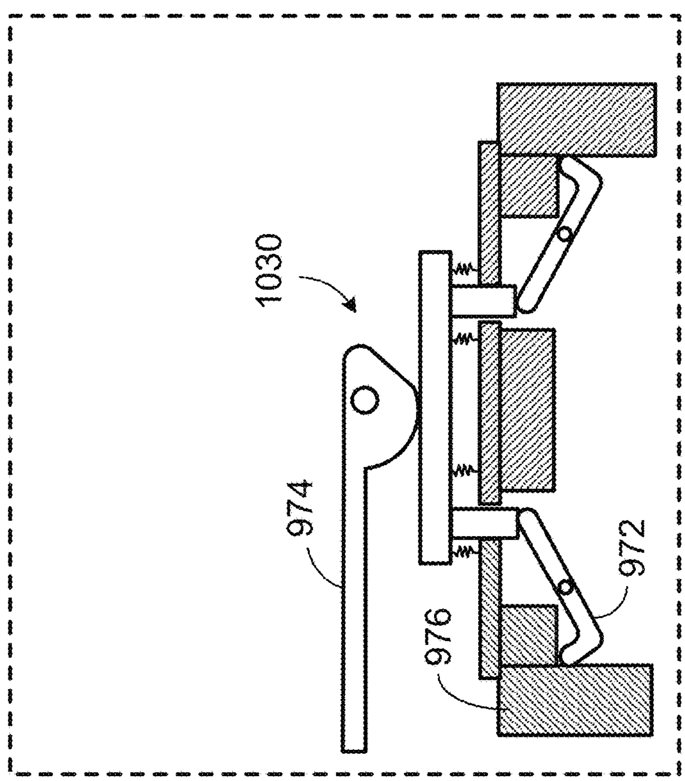
FIGS. 60A and 60B are diagrams of an example implementation of the lever and the latch mechanism in the optical module with connector.
Figure 60B:
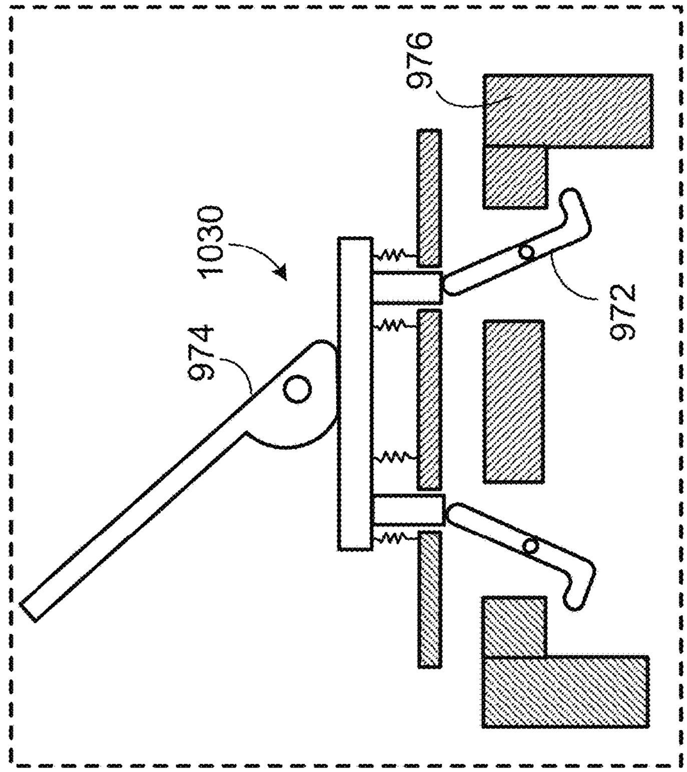

FIG. 59 is a view of an optical module 1030 that includes an optical engine with a latch mechanism used to realize the compression and attachment of the optical engine to the printed circuit board. The module 1030 is similar to the example shown in FIG. 58B but without the compression interposer. FIGS. 60A and 60B show an example latch mechanism that can be used for securing (with enough compression force) and removing the optical engine.

FIGS. 60A and 60B show an example implementation of the lever 974 and the latch mechanism 972 in the optical module 1030. FIG. 60A shows an example in which the lever 974 is pushed down, causing the latch mechanism 972 to latch on to a support structure 976, which can be part of the first grid structure 870. FIG. 60B shows an example in which the lever 974 is pulled up, causing the latch mechanism 972 to be released from the support structure 976.

Figure 61:
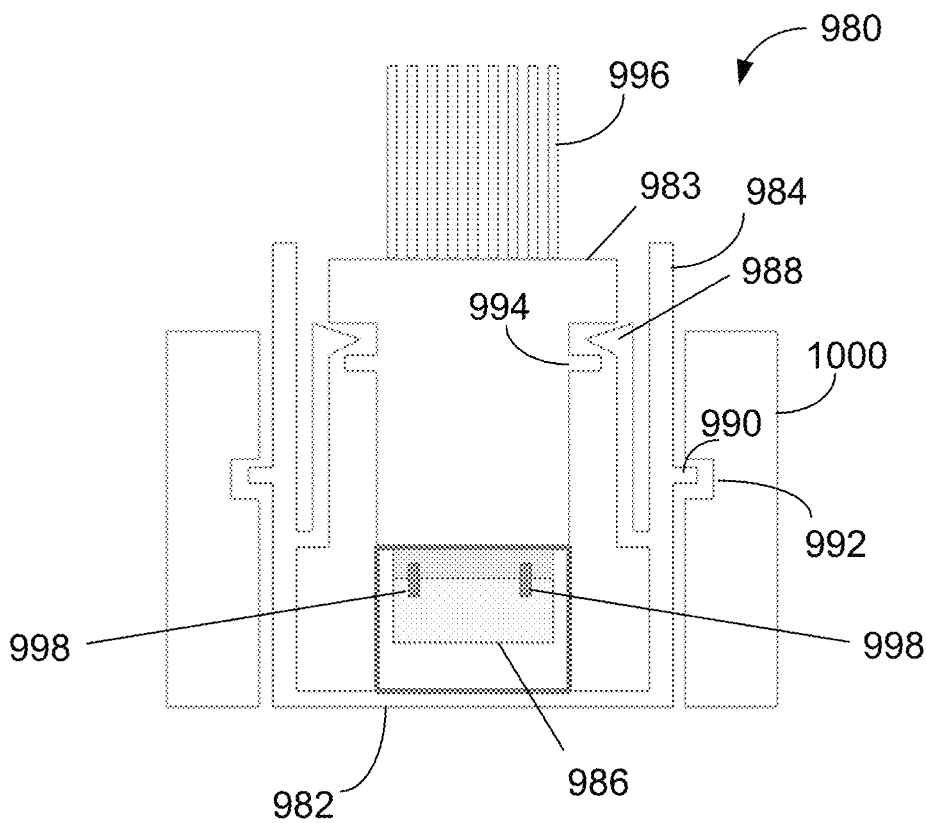
FIG. 61 is a diagram of cross section of the module viewed from the front mounted in the assembly with the connector.

FIG. 61 is a diagram of an example of a fiber cable connection design 980 that includes nested fiber optic cable and co-packaged optical module connections. In this design, a co-packaged optical module 982 is removably coupled to a co-packaged optical port 1000 formed in a support structure, such as the first grid structure 870, and a fiber connector 983 is removably coupled to the co-packaged optical module 982. The fiber connector 983 is coupled to a fiber cable 996 that includes a plurality of optical fibers. The fiber cable connection can be designed to be, e.g., MTP/MPO (Multi-fiber Termination Push-on/Multi-fiber Push On) compatible, or compatible to new standards as they emerge. Multi-fiber push on (MPO) connectors are commonly used to terminate multi-fiber ribbon connections in indoor environments and conforms to IEC-61754-7; EIA/TIA-604-5 (FOCIS 5) standards.

In some implementations, the co-packaged optical module 982 includes a mechanical connector structure 984 and a smart optical assembly 986. The smart optical assembly 986 includes, e.g., a photonic integrated circuit (e.g., 896 of FIG. 44), and components for guiding light, power splitting, polarization management, optical filtering, and other light beam management before the photonic integrated circuit. The components can include, e.g., optical couplers, waveguides, polarization optics, filters, and/or lenses. Additional examples of the components that can be included in the co-packaged optical module 982 are described in U.S. patent application Ser. No. 16/816,171, now U.S. Pat. No. 11,287,585. The mechanical connector structure 984 includes one or more fiber connector latches 988 and one or more co-packaged optical module latches 990. The mechanical connector structure 984 can be inserted into the co-packaged optical port 1000 (e.g., formed in the first grid structure 870), in which the co-packaged optical module latches 990 engage grooves 992 in the walls of the first grid structure 870, thus securing the co-packaged optical module 982 to the co-packaged optical port 1000, and causing the electrical contacts of the smart optical assembly 986 to be electrically coupled to the electrical contacts 876 on the printed circuit board 862 (or substrate). When the fiber connector 983 is inserted into the mechanical connector structure 984, the fiber connector latches 988 engage grooves 994 in the fiber connector 983, thus securing the fiber connector 983 to the co-packaged optical module 982, and causing the fiber cable 996 to be optically coupled to the smart optical assembly 986, e.g., through optical paths in the fiber connector 983.

In some examples, the fiber connector 983 includes guide pins 998 that are inserted into holes in the smart optical assembly 986 to improve alignment of optical components (e.g., waveguides and/or lenses) in the fiber connector 983 to optical components (e.g., optical couplers and/or waveguides) in the smart optical assembly 986. In some examples, the guide pins 998 can be chamfered shaped, or elliptical shaped that reduces wear.

In some implementations, after the fiber connector 983 is installed in the co-packaged optical module 982, the fiber connector 983 prevents the co-packaged optical module latches 990 from bending inwards, thus preventing the co-packaged optical module 982 from being inserted into, or released from, the co-packaged optical port 1000. To couple the fiber cable 996 to the data processing system, the co-packaged optical module 982 is first inserted into the co-packaged optical port 1000 without the fiber connector 983, then the fiber connector 983 is inserted into the mechanical connector structure 984. To remove the fiber cable 996 from the data processing system, the fiber connector 983 can be removed from the mechanical connector structure 984 while the co-packaged optical module 982 is still coupled to the co-packaged optical port 1000.

In some implementations, the nested connection latches can be designed to allow the co-packaged optical module 982 to be inserted in, or removed from, the co-packaged optical port 1000 when a fiber cable is connected to the co-packaged optical module 982.

Figure 62:
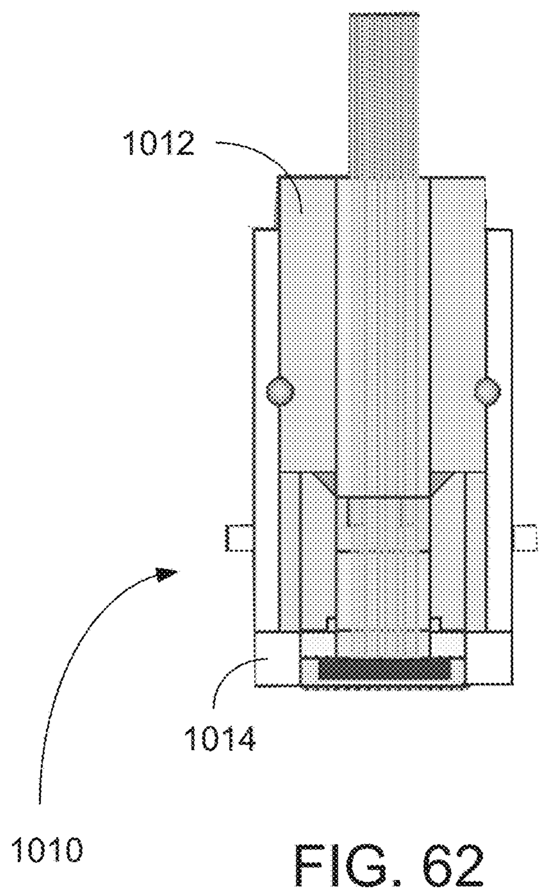
FIGS. 62 to 65 are diagrams showing cross-sectional views of an example of a fiber cable connection design.
Figure 63:
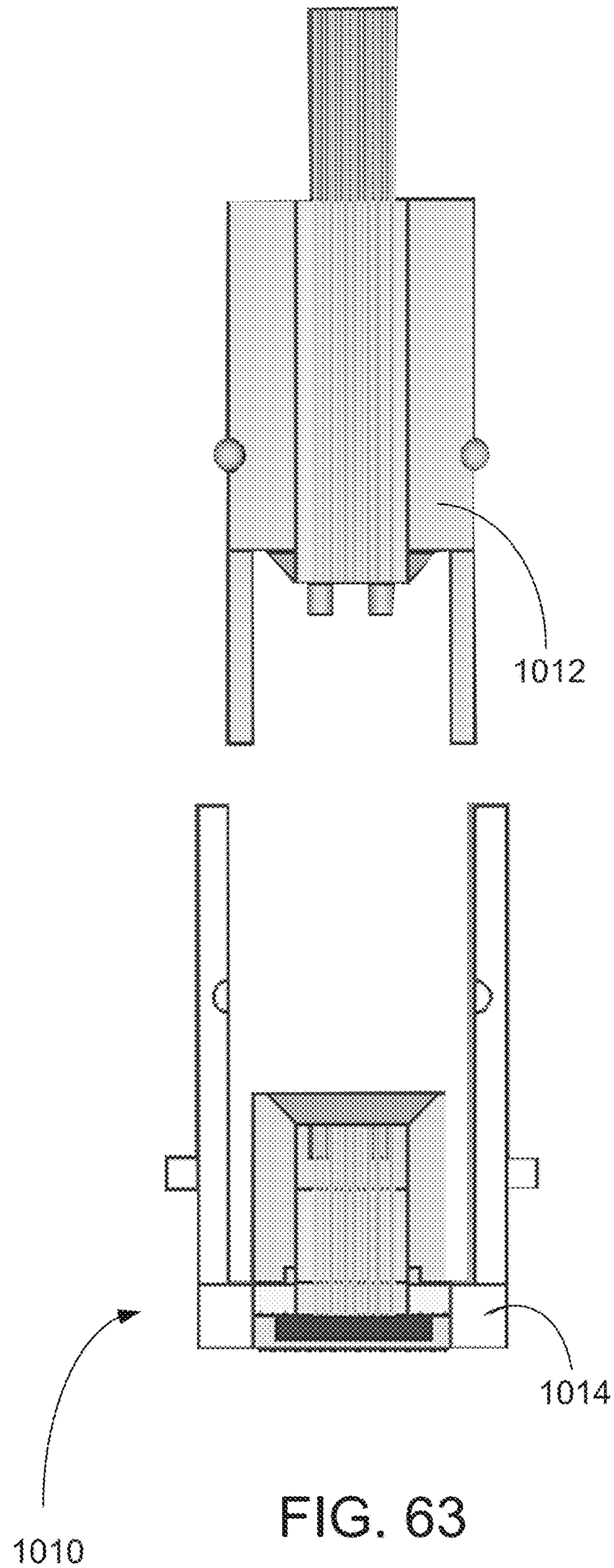

FIGS. 62 and 63 are diagrams showing cross-sectional views of an example of a fiber cable connection design 1010 that includes nested fiber optic cable and co-packaged optical module connections. FIG. 62 shows an example in which a fiber connector 1012 is removably coupled to a co-packaged optical module 1014. FIG. 63 shows an example in which the fiber connector 1012 is separated from the co-packaged optical module 1014.

Figure 64:
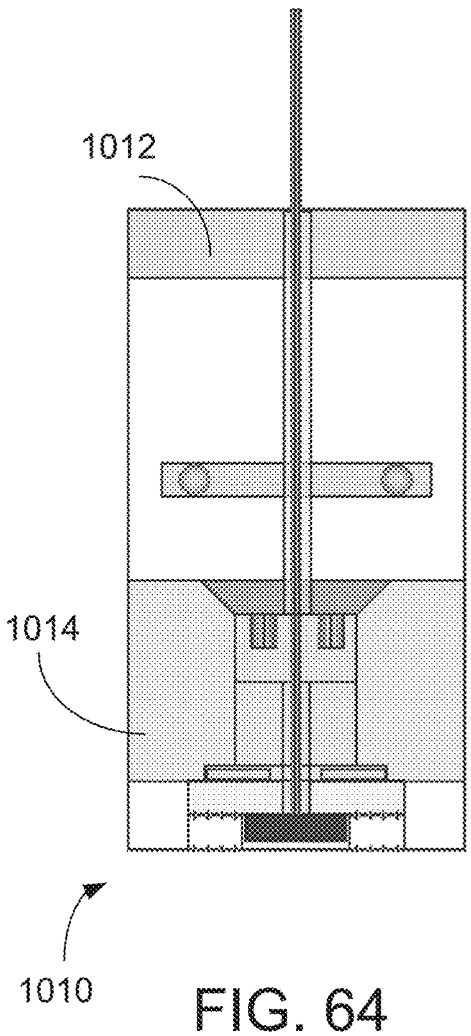
Figure 65:
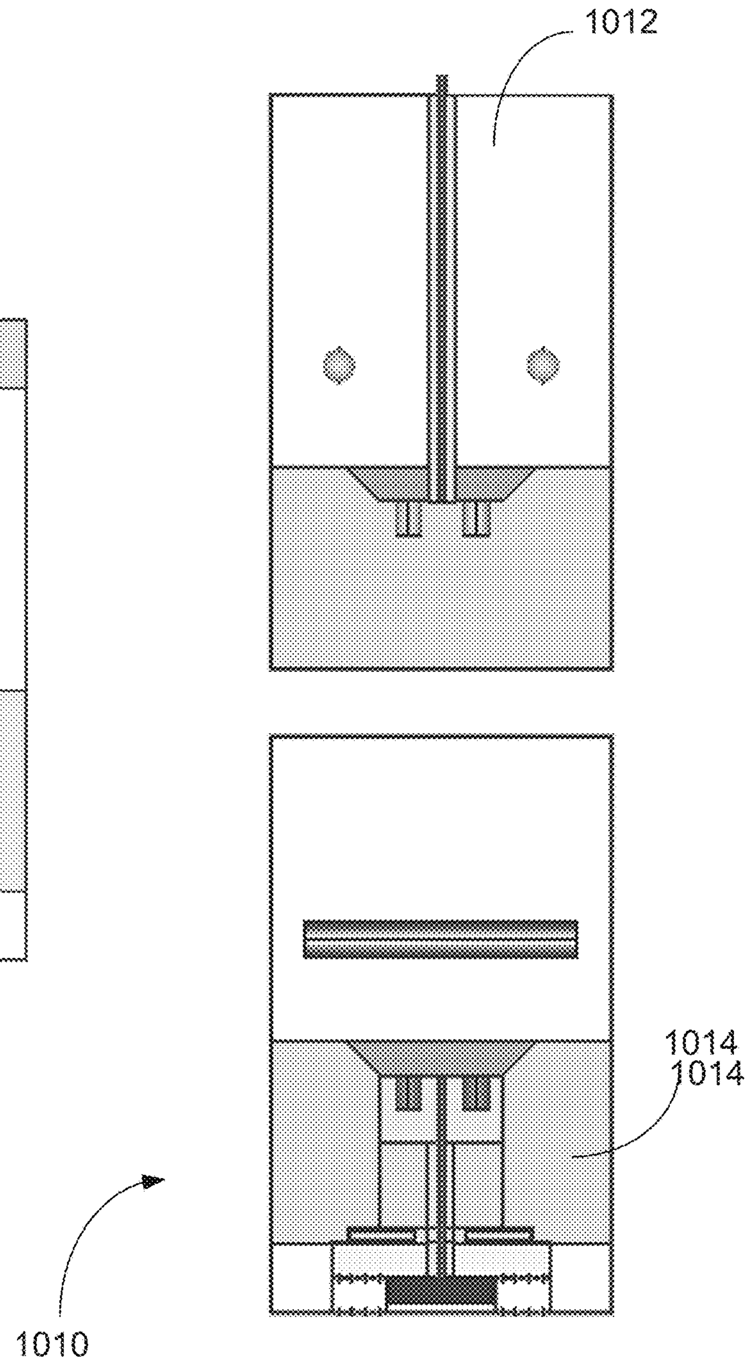

FIGS. 64 and 65 are diagrams showing additional cross-sectional views of the fiber cable connection design 1010. The cross-sections are made along planes that vertically cut through the middle of the components shown in FIGS. 62 and 63. FIG. 64 shows an example in which the fiber connector 1012 is removably coupled to the co-packaged optical module 1014. FIG. 65 shows an example in which the fiber connector 1012 is separated from the co-packaged optical module 1014.

The following describes rack unit thermal architectures for rackmount systems (e.g., 560 of FIG. 22, 600 of FIG. 23, 630 of FIG. 24, 680 of FIG. 26, 720 of FIG. 28, 750 of FIG. 29, 860 of FIG. 43) that include data processing chips (e.g., 572 of FIGS. 22, 23, 640 of FIG. 24, 681 of FIG. 26, 722 of FIG. 28, 758 of FIG. 29, 864 of FIG. 43) that are mounted on vertically oriented circuit boards that are substantially vertical to the bottom surfaces of the system housings or enclosures. In some implementations, the rack unit thermal architectures use air cooling to remove heat generated by the data processing chips. In these systems, the heat-generating data processing chips are positioned near the input/output interfaces, which can include, e.g., one or more of the integrated optical communication device 448, 462, 466, or 472 of FIG. 17, the integrated communication device 574 of FIG. 22 or 612 of FIG. 23, the optical/electrical communication interface 644 of FIG. 24, 684 of FIG. 26, 724 of FIG. 28, or 760 of FIG. 29, or the optical module with connector 868 of FIG. 43, that are positioned at or near the front panel to enable users to conveniently connect/disconnect optical transceivers to/from the rackmount systems. The rack unit thermal architectures described in this specification include mechanisms for increasing airflow across the surfaces of the data processing chips, or heat sinks thermally coupled to the data processing chips, taking into consideration that a substantial portion of the surface area on the front panel of the housing needs to be allocated to the input/output interfaces.

Figure 67:
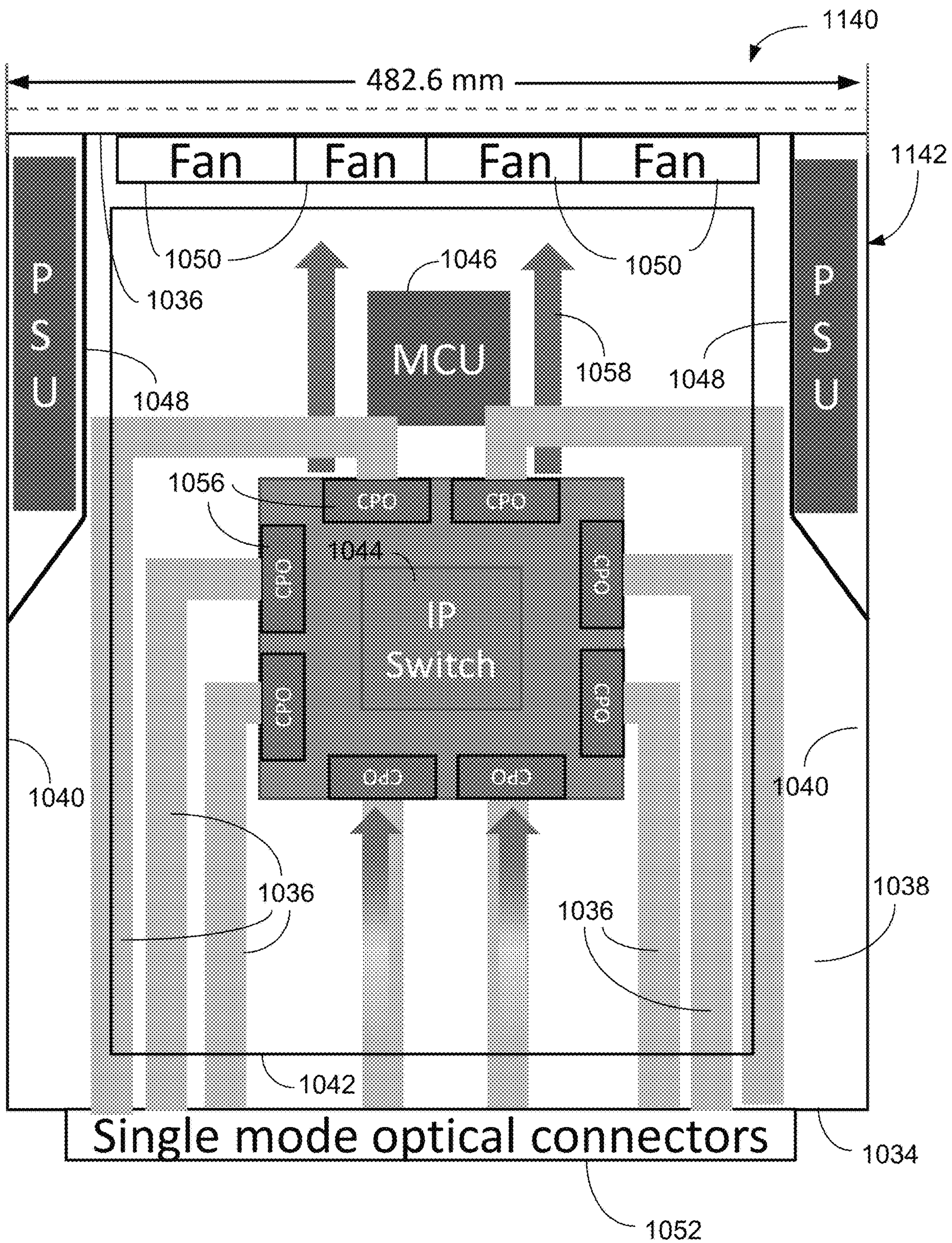
FIG. 67 is a top view of an example of a rackmount server.

Referring to FIG. 67, a data server 1140 suitable for installation in a standard server rack can include a housing 1142 that has a front panel 1034, a rear panel 1036, a bottom panel 1038, a top panel, and side panels 1040. For example, the housing 1142 can have a 2 rack unit (RU) form factor, having a width of about 482.6 mm (19 inches) and a height of 2 rack units. One rack unit is about 44.45 mm (approximately 1.75 inches). A printed circuit board 1042 is mounted on the bottom panel 1038, and at least one data processing chip 1044 is electrically coupled to the printed circuit board 1042. A microcontroller unit 1046 is provided to control various modules, such as power supplies 1048 and exhaust fans 1050. In this example, the exhaust fans 1050 are mounted at the rear panel 1036. For example, single mode optical connectors 1052 are provided at the front panel 1034 for connection to external optical cables. Optical interconnect cables 1036 transmit signals between the single mode optical connectors 1052 and the at least one data processing chip 1044. The exhaust fans 1050 mounted at the rear panel 1036 cause the air to flow from the front side to the rear side of the housing 1142. The directions of air flow are represented by arrows 1058. Warm air inside the housing 1142 is vented out of the housing 1142 through the exhaust fans 1050 at the rear panel 1036. In this example, the front panel 1034 does not include any fan in order to maximize the area used for the single mode optical connectors 1052.

For example, the data server 1300 can be a network switch server, and the at least one data processing chip 1044 can include at least one switch chip configured to process data having a total bandwidth of, e.g., about 51.2 Tbps. The at least one switch chip 1044 can be mounted on a substrate 1054 having dimensions of, e.g., about 100 mm×100 mm, and co-packaged optical modules 1056 can be mounted near the edges of the substrate 1054. The co-packaged optical modules 1056 convert input optical signals received from the optical interconnect cables 1036 to input electrical signals that are provided to the at least one switch chip 1044, and converts output electrical signals from the at least one switch chip 1044 to output optical signals that are provided to the optical interconnect cables 1036. When any of the co-packaged optical modules 1056 fails, the user needs to remove the network switch server 1030 from the server rack and open the housing 1142 in order to repair or replace the faulty co-packaged optical module 1056.

Figure 68A:
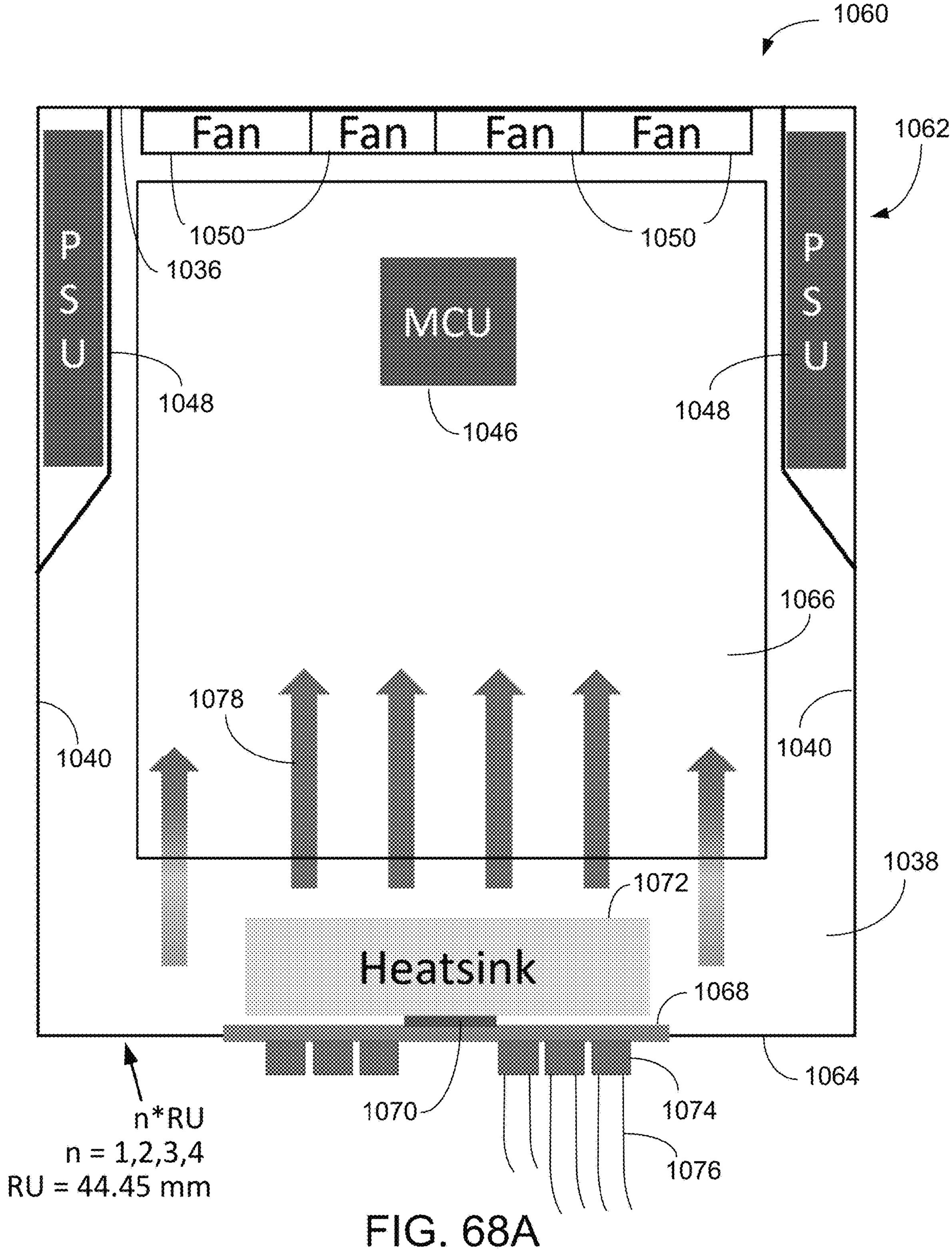
FIG. 68A is a top view of an example of a rackmount server.
Figure 68B:
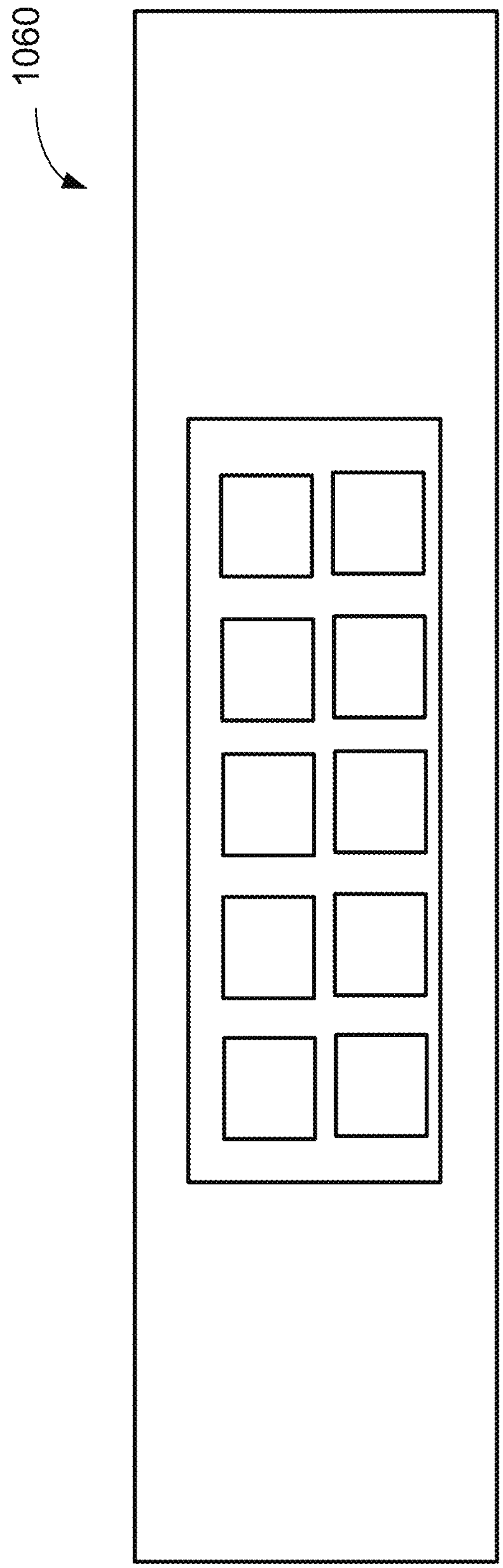
FIG. 68B is a diagram of an example of a front panel of the rackmount server.

Referring to FIGS. 68A and 68B, in some implementations, a rackmount server 1060 includes a housing or case 1062 having a front panel 1064 (or face plate), a rear panel 1036, a bottom panel 1038, a top panel, and side panels 1040. For example, the housing 1062 can have a form factor of 1RU, 2RU, 3RU, or 4RU, having a width of about 482.6 mm (19 inches) and a height of 1, 2, 3, or 4 rack units. A first printed circuit board 1066 is mounted on the bottom panel 1038, and a microcontroller unit 1046 is electrically coupled to the first printed circuit board 1066 and configured to control various modules, such as power supplies 1048 and exhaust fans 1050.

Figure 68C:
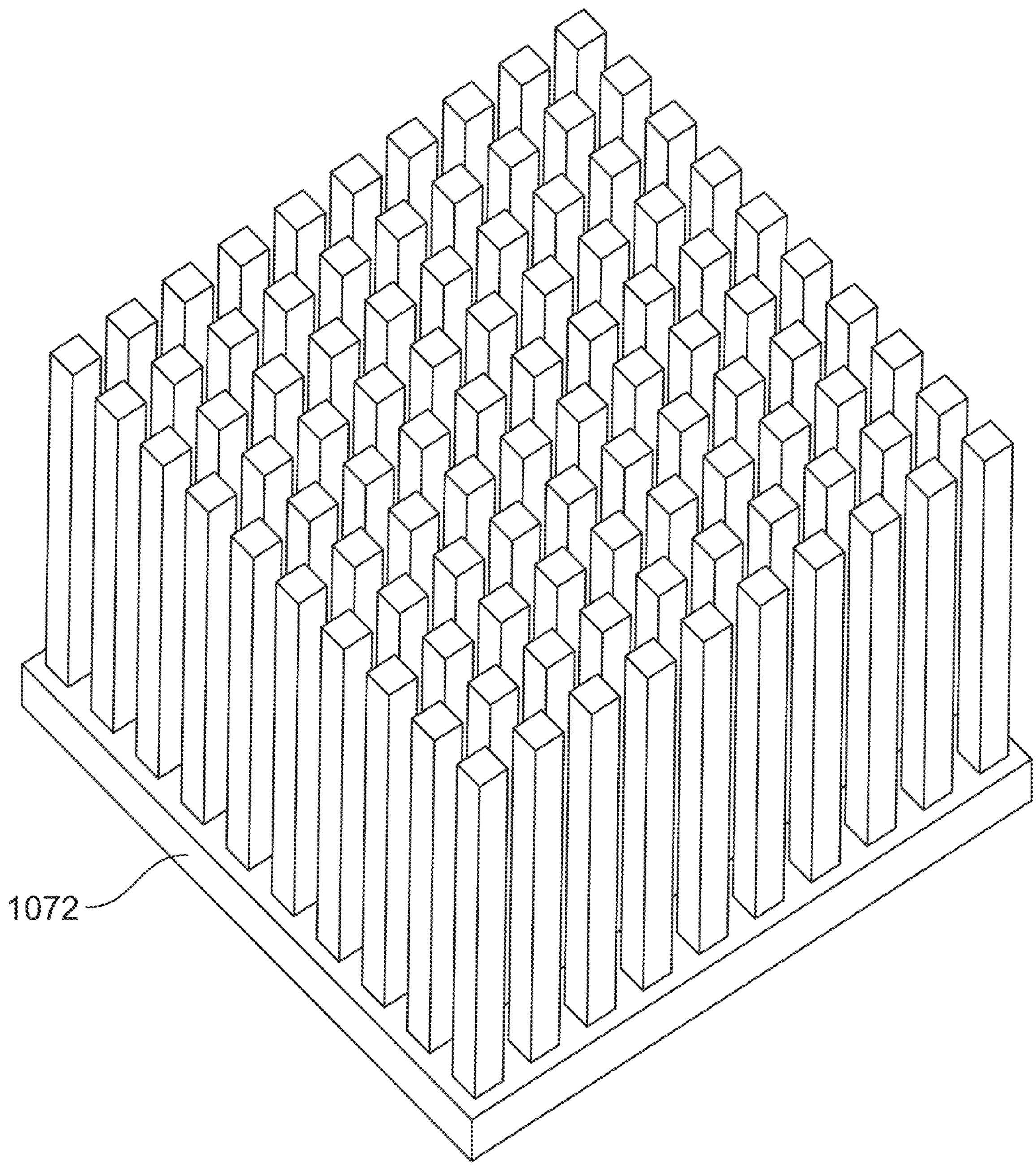
FIG. 68C is a perspective view of an example of a heat sink.

In some implementations, the front panel 1064 includes a second printed circuit board 1068 that is oriented in a vertical direction, e.g., substantially perpendicular to the first circuit board 1066 and the bottom panel 1038. In the following, the second printed circuit board 1068 is referred to as the vertical printed circuit board 1068. The figures shows that the second printed circuit board 1066 forms part of the front panel 1064, but in some examples the second printed circuit board 1066 can also be attached to the front panel 1064, in which the front panel 1064 includes openings to allow input/output connectors to pass through. The second printed circuit board 1066 includes a first side facing the front direction relative to the housing 1062 and a second side facing the rear direction relative to the housing 1062. At least one data processing chip 1070 is electrically coupled to the second side of the vertical printed circuit board 1068, and a heat dissipating device or heat sink 1072 is thermally coupled to the at least one data processing chip 1070. In some examples, the at least one data processing chip 1070 is mounted on a substrate (e.g., a ceramic substrate), and the substrate is attached to the printed circuit board 1068. FIG. 68C is a perspective view of an example of the heat dissipating device or heat sink 1072. For example, the heat dissipating device 1072 can include a vapor chamber thermally coupled to heat sink fins. The exhaust fans 1050 mounted at the rear panel 1036 cause the air to flow from the front side to the rear side of the housing 1142. The directions of air flow are represented by arrows 1078. Warm air inside the housing 1142 is vented out of the housing 1142 through the exhaust fans 1050 at the rear panel 1036.

Co-packaged optical modules 1074 (also referred to as the optical/electrical communication interfaces) are attached to the first side (i.e., the side facing the front exterior of the housing 1062) of the vertical printed circuit board 1068 for connection to external fiber cables 1076. Each fiber cable 1076 can include an array of optical fibers. By placing the co-packaged optical modules 1074 on the exterior side of the front panel 1064, the user can conveniently service (e.g., repair or replace) the co-packaged optical modules 1074 when needed. Each co-packaged optical module 1074 is configured to convert input optical signals received from the external fiber cable 1076 into input electrical signals that are transmitted to the at least one data processing chip 1070 through signal lines in or on the vertical printed circuit board 1068. The co-packaged optical module 1074 also converts output electrical signals from the at least one data processing chip 1070 into output optical signals that are provided to the external fiber cables 1076. Warm air inside the housing 1062 is vented out of the housing 1062 through the exhaust fans 1050 mounted at the rear panel 1036.

For example, the at least one data processing chip 1070 can include a network switch, a central processor unit, a graphics processor unit, a tensor processing unit, a neural network processor, an artificial intelligence accelerator, a digital signal processor, a microcontroller, or an application specific integrated circuit (ASIC). For example, each co-packaged optical module 1074 can include a module similar to the integrated optical communication device 448, 462, 466, or 472 of FIG. 17, the integrated optical communication device 210 of FIG. 20, the integrated communication device 612 of FIG. 23, the optical/electrical communication interface 684 of FIG. 26, 724 of FIG. 28, or 760 of FIG. 29, the integrated optical communication device 512 of FIG. 32, or the optical module with connector 868 of FIG. 43. For example, each fiber cable 1076 can include the optical fibers 226 (FIGS. 2, 4), 272 (FIGS. 6, 7), 582 (FIG. 22, 23), or 734 (FIG. 28), or the optical fiber cable 762 (FIG. 762), 956 (FIG. 53), or 996 (FIG. 61).

For example, the co-packaged optical module 1074 can include a first optical connector part (e.g., 456 of FIG. 17, 578 of FIG. 22 or 23, 746 of FIG. 28) that is configured to be removably coupled to a second optical connector part (e.g., 458 of FIG. 17, 580 of FIG. 22 or 23, 748 of FIG. 28) that is attached to the external fiber cable 1076. For example, the co-packaged optical module 1074 includes a photonic integrated circuit (e.g., 450, 464, 468, or 474 of FIG. 17, 586 of FIG. 22, 618 of FIG. 23, or 726 of FIG. 28) that is optically coupled to the first optical connector part. The photonic integrated circuit receives input optical signals from the first optical connector part and generates input electrical signals based on the input optical signals. At least a portion of the input electrical signals generated by the photonic integrated circuit are transmitted to the at least one data processing chip 1070 through electrical signal lines in or on the vertical printed circuit board 1068. For example, the photonic integrated circuit can be configured to receive output electrical signals from the at least one data processing chip 1070 and generate output optical signals based on the output electrical signals. The output optical signals are transmitted through the first and second optical connector parts to the external fiber cable 1076.

In some examples, the fiber cable 1076 can include, e.g., 10 or more cores of optical fibers, and the first optical connector part is configured to couple 10 or more channels of optical signals to the photonic integrated circuit. In some examples, the fiber cable 1076 can include 100 or more cores of optical fibers, and the first optical connector part is configured to couple 100 or more channels of optical signals to the photonic integrated circuit. In some examples, the fiber cable 1076 can include 500 or more cores of optical fibers, and the first optical connector part is configured to couple 500 or more channels of optical signals to the photonic integrated circuit. In some examples, the fiber cable 1076 can include 1000 or more cores of optical fibers, and the first optical connector part is configured to couple 1000 or more channels of optical signals to the photonic integrated circuit.

In some implementations, the photonic integrated circuit can be configured to generate first serial electrical signals based on the received optical signals, in which each first serial electrical signal is generated based on one of the channels of first optical signals. Each co-packaged optical module 1074 can include a first serializers/deserializers module that includes serializer units and deserializer units, in which the first serializers/deserializers module is configured to generate sets of first parallel electrical signals based on the first serial electrical signals and condition the electrical signals, and each set of first parallel electrical signals is generated based on a corresponding first serial electrical signal. Each co-packaged optical module 1074 can include a second serializers/deserializers module that includes serializer units and deserializer units, in which the second serializers/deserializers module is configured to generate second serial electrical signals based on the sets of first parallel electrical signals, and each second serial electrical signal is generated based on a corresponding set of first parallel electrical signals.

In some examples, the rackmount server 1060 can include 4 or more co-packaged optical modules 1074 that are configured to be removably coupled to corresponding second optical connector parts that are attached to corresponding fiber cables 1076. For example, the rackmount server 1060 can include 16 or more co-packaged optical modules 1074 that are configured to be removably coupled to corresponding second optical connector parts that are attached to corresponding fiber cables 1076. In some examples, each fiber cable 1076 can include 10 or more cores of optical fibers. In some examples, each fiber cable 1076 can include 100 or more cores of optical fibers. In some examples, each fiber cable 1076 can include 500 or more cores of optical fibers. In some examples, each fiber cable 1076 can include 1000 or more cores of optical fibers. Each optical fiber can transmit one or more channels of optical signals. For example, the at least one data processing chip 1070 can include a network switch that is configured to receive data from an input port associated with a first one of the channels of optical signals, and forward the data to an output port associated with a second one of the channels of optical signals.

In some implementations, the co-packaged optical modules 1074 is removably coupled to the vertical printed circuit board 1068. For example, the co-packaged optical modules 1074 can be electrically coupled to the vertical printed circuit board 1068 using electrical contacts that include, e.g., spring-loaded elements, compression interposers, or land-grid arrays.

Figure 69A:
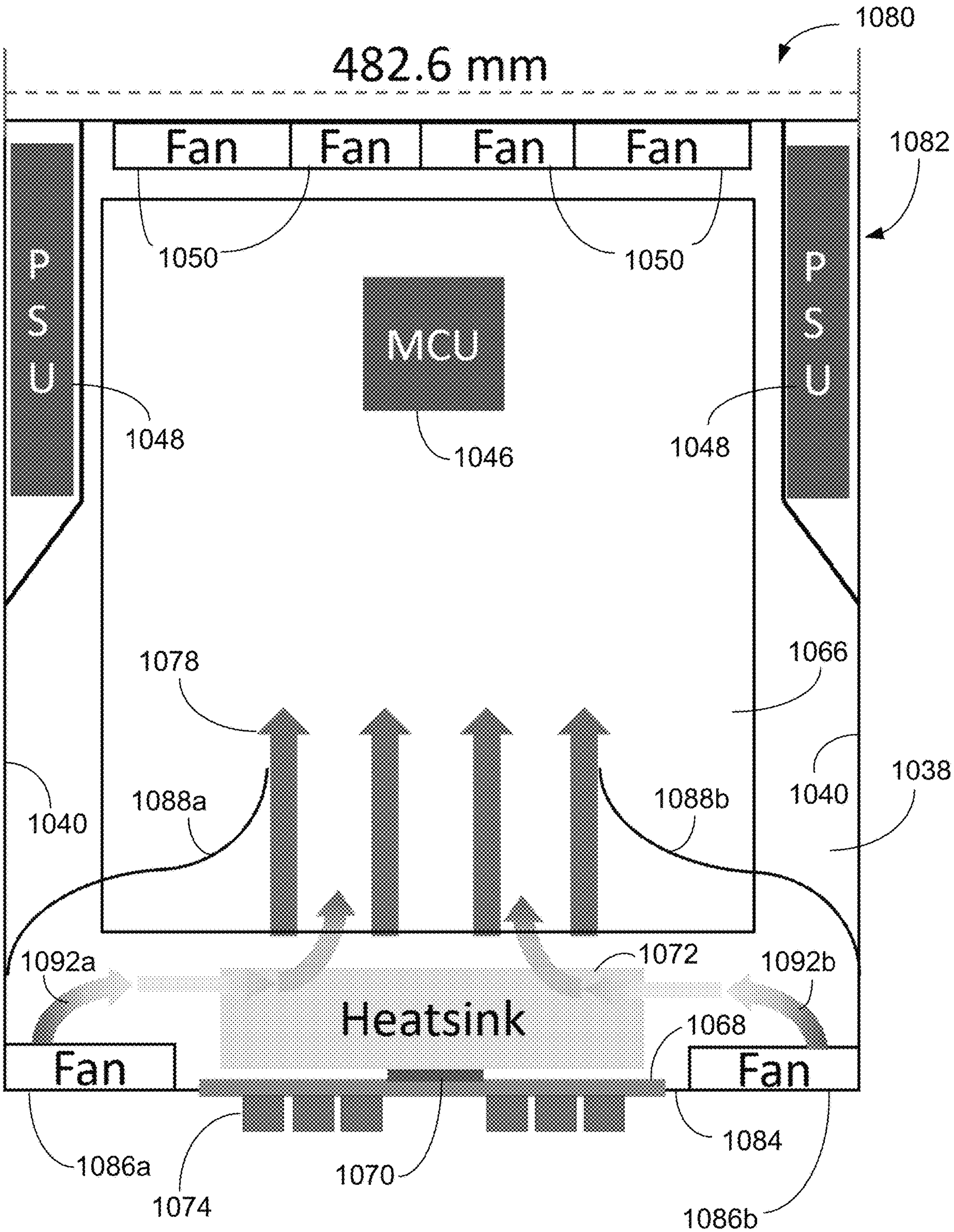
FIG. 69A is a top view of an example of a rackmount server.
Figure 69B:
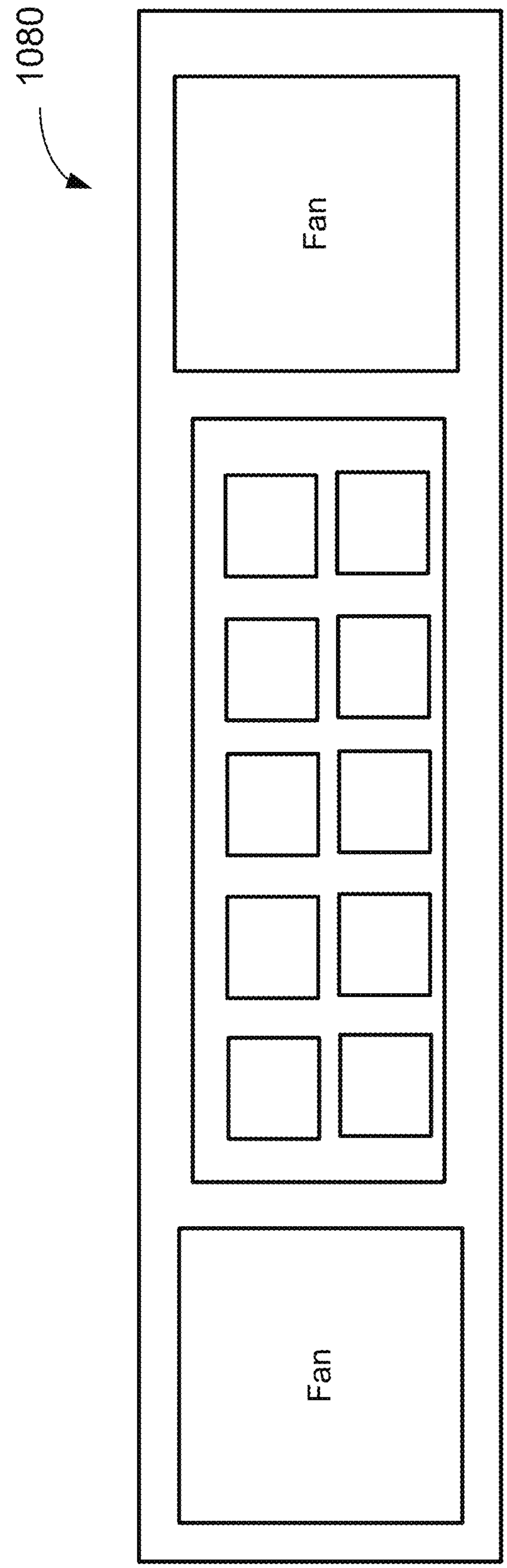
FIG. 69B is a diagram of an example of a front panel of the rackmount server.

Referring to FIGS. 69A and 69B, in some implementations, a rackmount server 1080 includes a housing 1082 having a front panel 1084. The rackmount server 1080 is similar to the rackmount server 1060 of FIG. 68A, except that one or more fans are mounted on the front panel 1084, and one or more air louvers installed in the housing 1082 to direct air flow towards the heat dissipating device. For example, the rackmount server 1080 can include a first inlet fan 1086*a* mounted on the front panel 1084 to the left of the vertical printed circuit board 1068, and a second inlet fan 1086*b* mounted on the front panel 1084 to the right of the vertical printed circuit board 1068. The terms "right" and "left" refer to relative positions of components shown in the figure. It is understood that, depending on the orientation of a device having a first and second modules, a first module that is positioned to the "left" or "right" of a second module can in fact be to the "right" or "left" (or any other relative position) of the second module. The inlet and exhaust fans operate in a push-pull manner, in which the inlet fans 1086*a* and 1086*b* (collectively referenced as 1086) pull cool air into the housing 1082, and the exhaust fans 1050 push warm air out of the housing 1082. The inlet fans 1086 in the front panel or face plate 1064 and the exhaust fans 1050 on the backside of the rack generate a pressure gradient through the housing or case to improve air cooling compared to standard 1RU implementations that include on backside exhaust fans.

In some implementations, a left air louver 1088*a* and a right air louver 1088*b* are installed in the housing 1082 to direct airflow toward the heat dissipating device 1072. The air louvers 1088*a*, 1088*b* (collectively referenced as 1088) partitions the space in the housing 1082 and forces air to flow from the inlet fans 1086*a* and 1086*b*, pass over surfaces of fins of the heat dissipating device 1072, and towards an opening 1090 between distal ends of the air louvers 1088. The directions of air flow near the inlet fans 1086*a* and 1086*b* are represented by arrows 1092*a* and 1092*b*. The air louvers 1088 increase the amount of air flows across the surfaces of the heat sink fins and enhance the efficiency of heat removal. The heat sink fins are oriented to extend along planes that are substantially parallel to the bottom surface 1038 of the housing 1082. For example, the air louvers 1088 can have a curved shape, e.g., an S-shape as shown in the figure. The curved shape of the air louvers 1088 can be configured to maximize the efficiency of the heat sink. In some examples, the air louvers 1088 can also have a linear shape.

For example, the heat sink can be a plate-fin heat sink, a pin-fin heat sink, or a plate-pin-fin heat sink. The pins can have a square or circular cross section. The heat sink configuration (e.g., pin pitch, length of pins or fins) and the louver configuration can be designed to optimize heat sink efficiency.

For example, the co-packaged optical modules 1074 can be electrically coupled to the vertical printed circuit board 1068 using electrical contacts that include, e.g., spring-loaded elements, compression interposers, or land-grid arrays. For example, when compression interposers are used, the vertical circuit board 1068 can be positioned such that the face of compression interposers of the co-packaged optical module 1074 is coplanar with the face plate 1064 and the inlet fans 1086.

Figure 70:
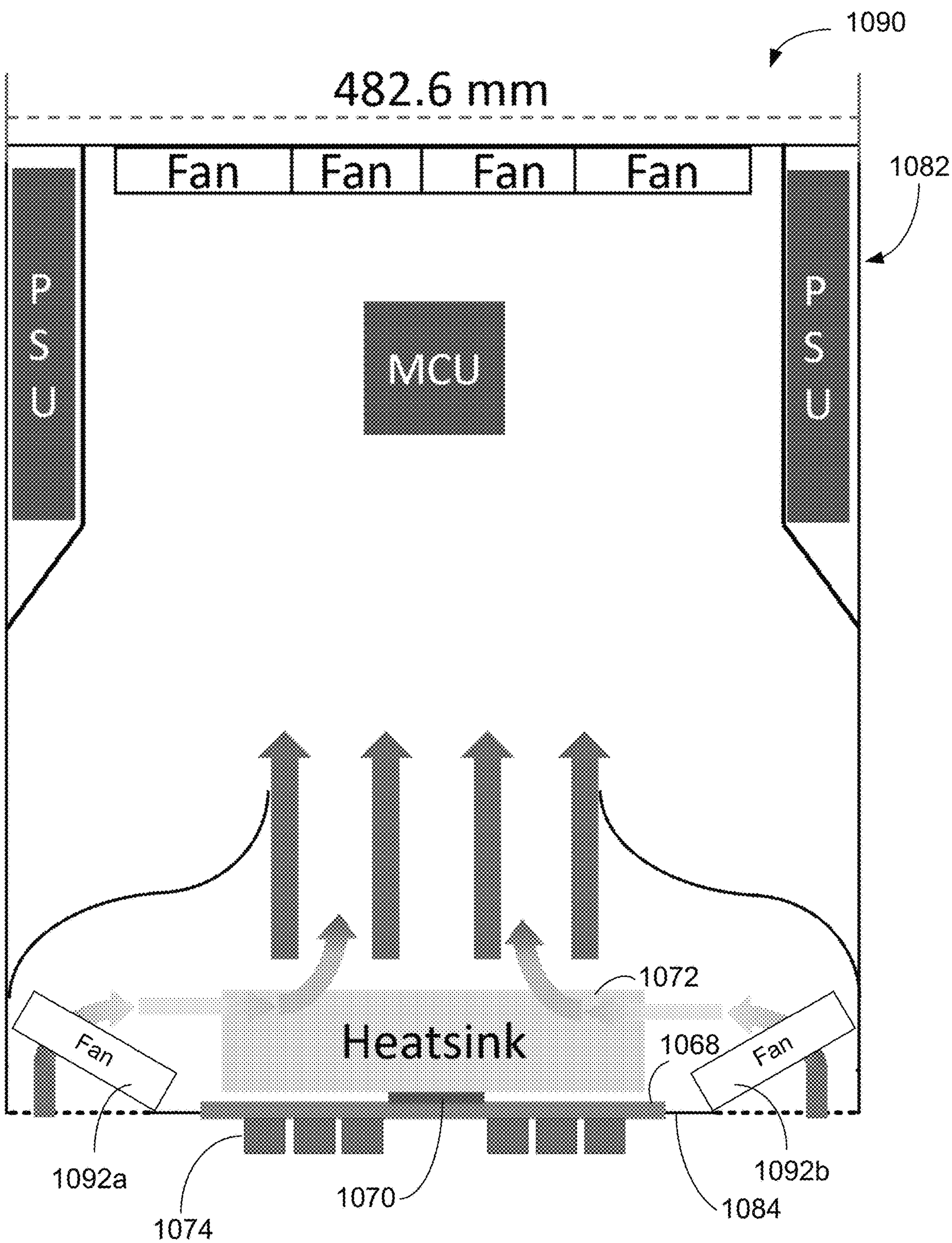
FIG. 70 is a top view of an example of a rackmount server.

Referring to FIG. 70, in some implementations, a rack-mount server 1090 is similar to the rackmount server 1080 of FIG. 69, which includes inlet fans mounted on the front panel. The inlet fans of the rackmount server 1090 are slightly rotated, as compared to the inlet fans of the rack-mount server 1080 to improve efficiency of the heat sink. The rotational axes of the inlet fans, instead of being parallel to the front-to-rear direction relative to the housing 1082, can be rotated slightly inwards. For example, the rotational axis of a left inlet fan 1092*a* can be rotated slightly clock-wise and the rotational axis of a right inlet fan 1092*b* can be rotated slightly counter-clockwise, to enhance the air flow across the surfaces of the heat sink fins, further improving the efficiency of heat removal.

In some implementations heat removal efficiency can be improved by positioning the vertical circuit board 1068 and the heat dissipating device 1072 further toward the rear of the housing so that a larger amount of air flows across the surface of the fins of the heat dissipating device 1072.

Figure 71A:
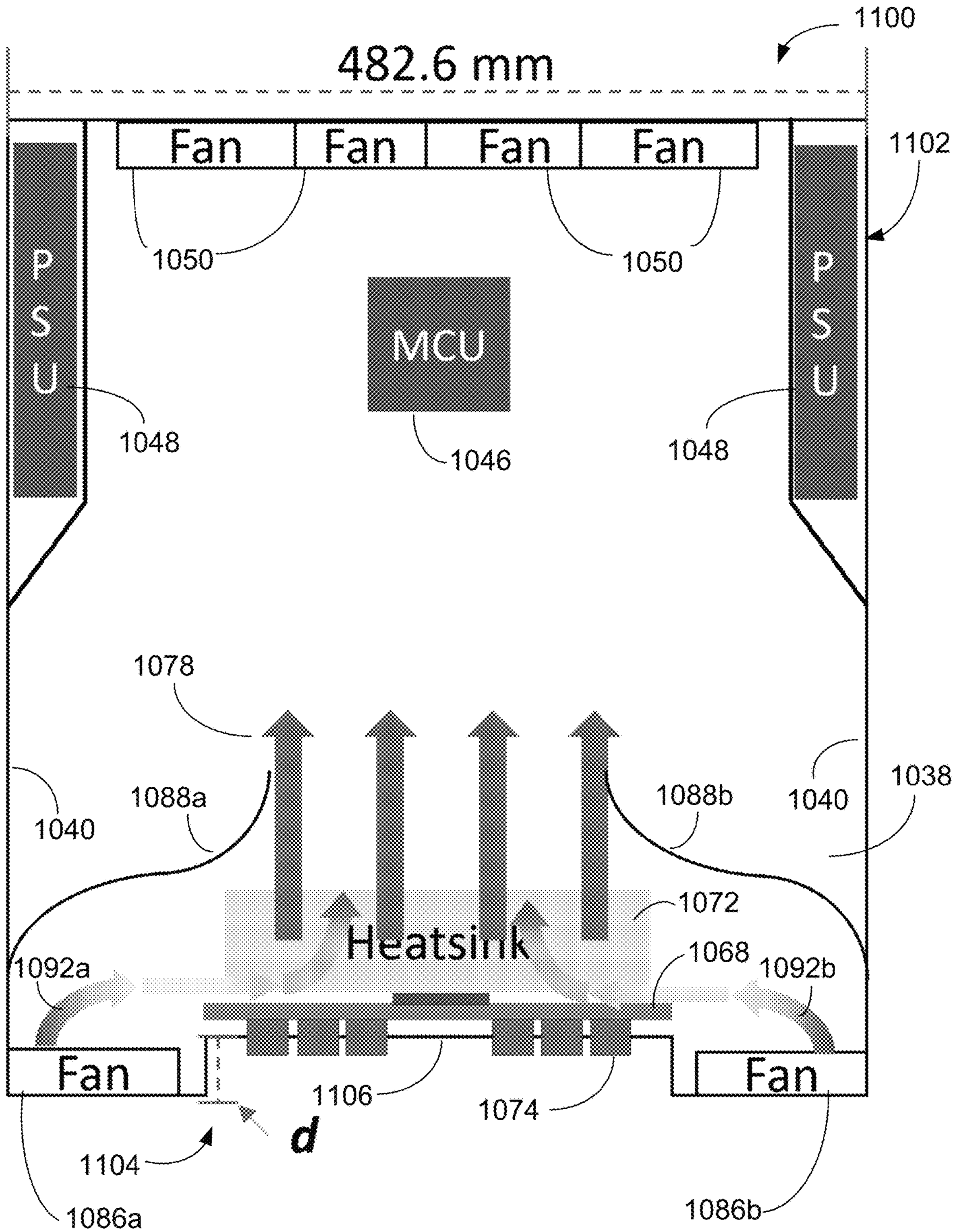
FIG. 71A is a top view of an example of a rackmount server.
Figure 71B:
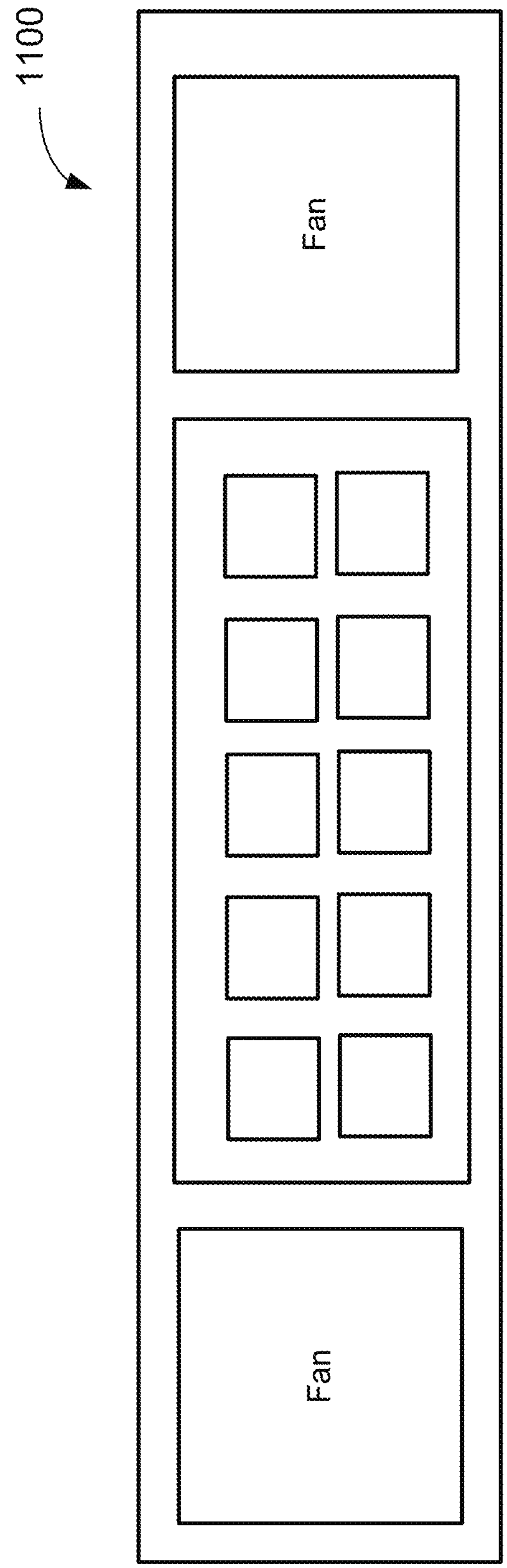
FIG. 71B is a front view of the rackmount server.

Referring to FIGS. 71A to 71B, a rackmount server 1100 includes a housing 1102 having a front panel or face plate 1104, in which the portion of the face plate 1104 where the compression interposers for the co-packaged optical module 1074 are located are inset by a distance d with respect to the original face plate 1104. The face plate 1104 has a recessed portion or an inset portion 1106 that is offset at a distance d (referred to as the "front panel inset distance") toward the rear of the housing 1102 relative to the other portions (e.g., the portions on which the inlet fans 1086*a* and 1086*b* are mounted) of the front panel 1104. The inset portion 1106 is referred to as the "recessed front panel," "recessed face plate," "front panel inset," or "face plate inset." The vertical printed circuit board 1068 is attached to the inset portion 1106, which includes openings to allow the co-packaged optical modules 1074 to pass through. The inset portion 1106 is configured to have sufficient area to accommodate the co-packaged optical modules 1074.

By providing the inset portion 1106 in the front panel 1104, the fins of the heat dissipating device 1072 can be more optimally positioned to be closer to the main air flow generated by the inlet fans 1086, while maintaining serviceability of the co-packaged optical modules 1074, e.g., allowing the user to repair or replace damaged co-packaged optical modules 1074 without opening the housing 1102. The heat sink configuration (e.g., pin pitch, length of pins or fins) and the louver configuration can be designed to optimize heat sink efficiency. In addition, the front panel inset distance d can be optimized to improve heat sink efficiency.

Figure 72:
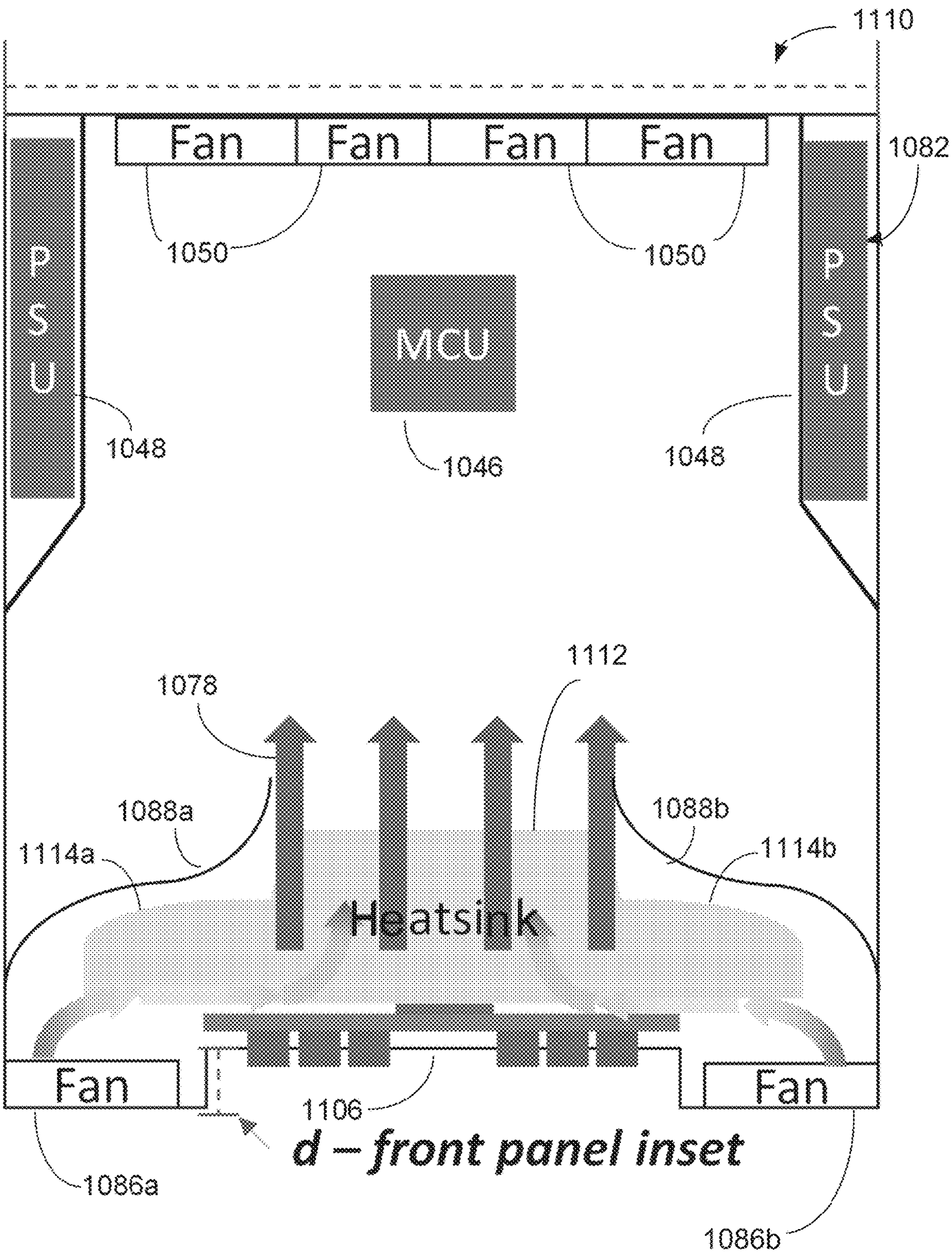
FIG. 72 is a top view of an example of a rackmount server.

Referring to FIG. 72, in some implementations, a rack-mount server 1110 is similar to the rackmount server 1100 of FIG. 71, except that the server 1110 includes a heat dissipating device 1112 that has fins 1114*a* and 1114*b* that extend beyond the edge of the vertical printed circuit board 1068 and closer to the inlet fans 1086*a*, 1086*b*, as compared to the fins in the example of FIG. 71. The configuration of the fins (e.g., the shapes, sizes, and number of fins) can be selected to maximize the efficiency of heat removal.

Figure 73A:
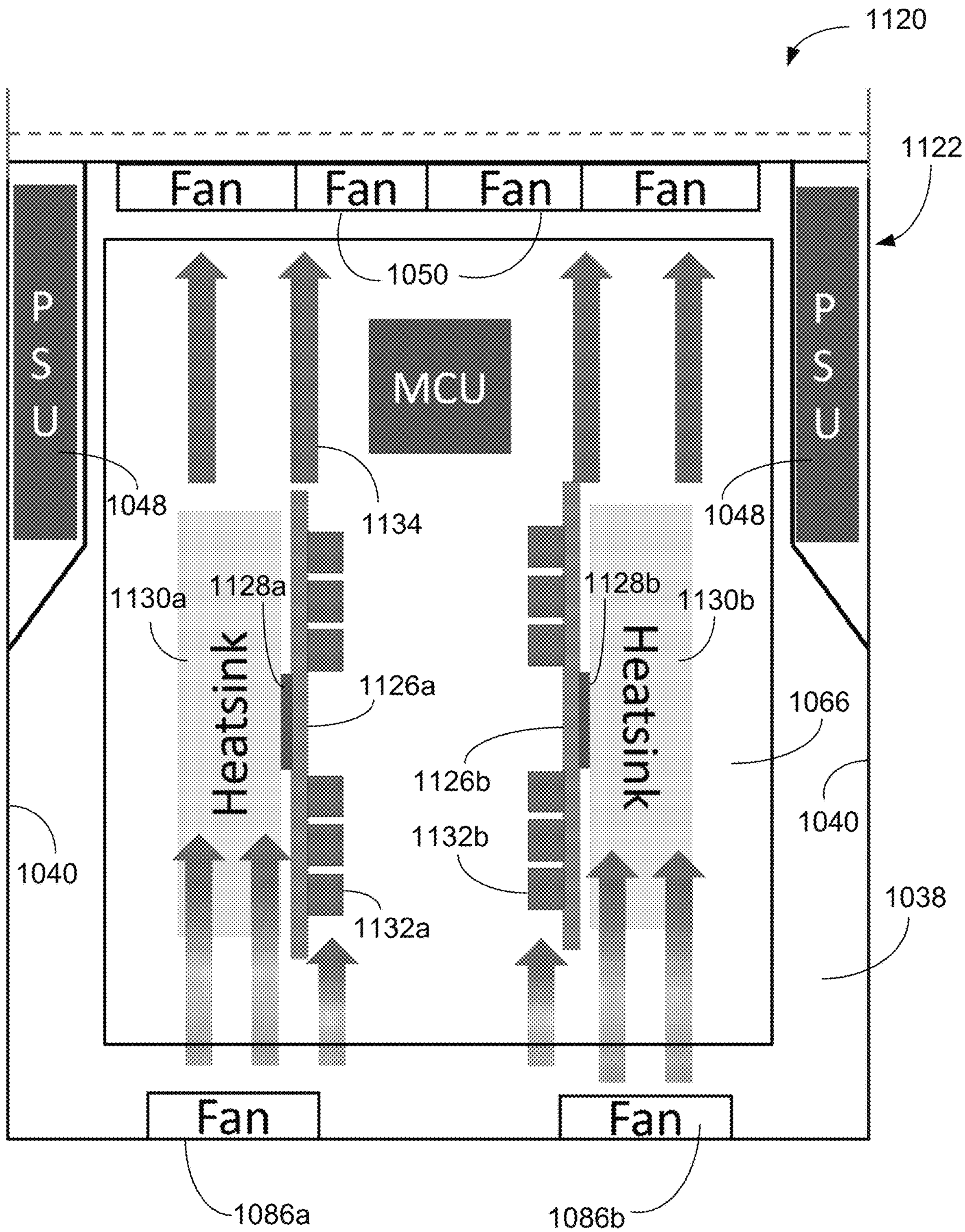
FIG. 73A is a top view of an example of a rackmount server.
Figure 73B:
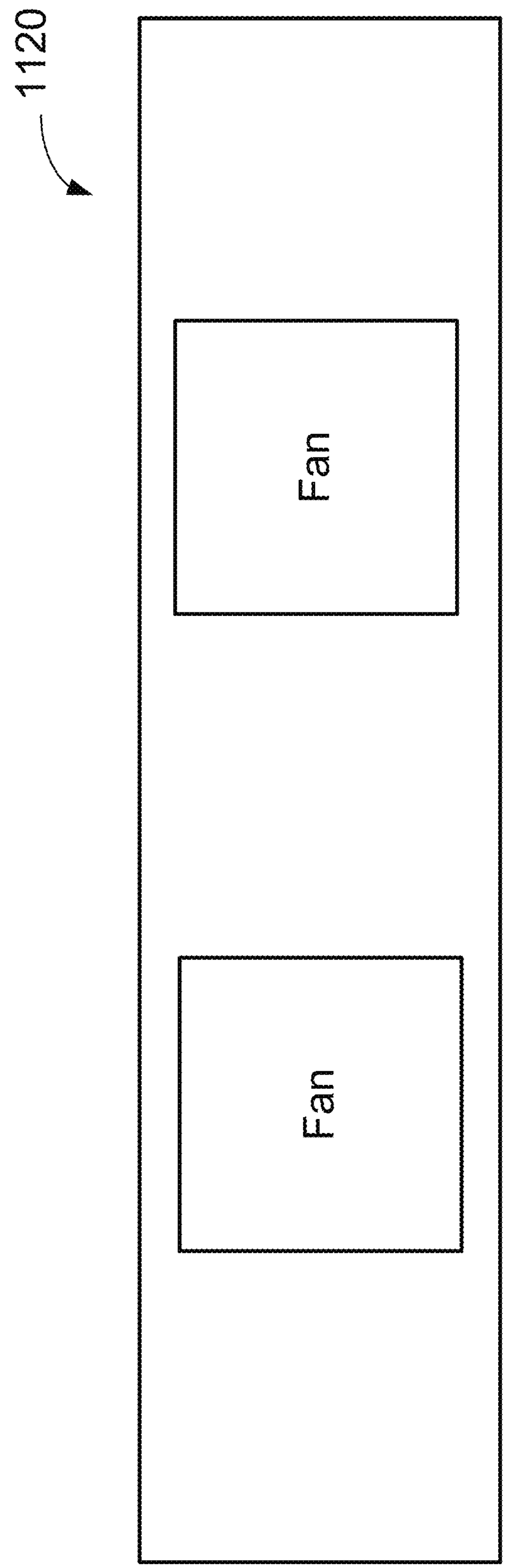
FIG. 73B is a front view of the rackmount server.

Referring to FIGS. 73A and 73B, in some implementations, a rackmount server 1120 includes a housing 1122 having a front panel 1124, a rear panel 1036, a bottom panel 1038, a top panel, and side panels 1040. The width and height of the housing 1122 can be similar to those of the housing 1062 of FIG. 68A. The server 1120 includes a first printed circuit board 1066 that extends parallel to the bottom panel 1038, and one or more vertical printed circuit boards, e.g., 1126*a* and 1126*b* (collectively referenced as 1126), that are mounted perpendicular to the first printed circuit board 1066. The server 1120 includes one or more inlet fans 1086 mounted on the front panel 1124 and one or more exhaust fans 1050 mounted on the rear panel 1036. The air flow in the housing 1122 is generally in the front-to-rear direction. The directions of the air flows are represented by the arrows 1134.

Each vertical printed circuit board 1126 has a first surface and a second surface. The first surface defines the length and width of the vertical printed circuit board 1126. The distance between the first and second surfaces defines the thickness of the vertical printed circuit board 1126. The vertical printed circuit board 1126*a* or 1126*b* is oriented such that the first surface extends along a plane that is substantially parallel to the front-to-rear direction relative to the housing 1122. At least one data processing chip 1128*a* or 1128*b* is electrically coupled to the first surface of the vertical printed circuit board 1126*a* or 1126*b*, respectively.

In some examples, the at least one data processing chip 1128*a* or 1128*b* is mounted on a substrate (e.g., a ceramic substrate), and the substrate is attached to the printed circuit board 1126*a* or 1126*b*. A heat dissipating device 1130*a* or 1130*b* is thermally coupled to the at least one data processing chip 1128*a* or 1128*b*, respectively. The heat dissipating device 1130 includes fins that extend along planes that are substantially parallel to the bottom panel 1038 of the housing 1122. The heat sinks 1130*a* and 1130*b* are positioned directly behind to the inlet fans 1086*a* and 1086*b*, respectively, to maximize air flow across the fins and/or pins of the heat sinks 1130.

At least one co-packaged optical module 1132*a* or 1132*b* is mounted on the second side of the vertical printed circuit board 1126*a* or 1126*b*, respectively. The co-packaged optical modules 1132 are optically coupled, through optical interconnection links, to optical interfaces (not shown in the figure) mounted on the front panel 1124. The optical interfaces are optically coupled to external fiber cables. The orientations of the vertical printed circuit boards 1126 and the fins of the heat dissipating devices 1130 are selected to maximize heat removal.

Figure 74A:
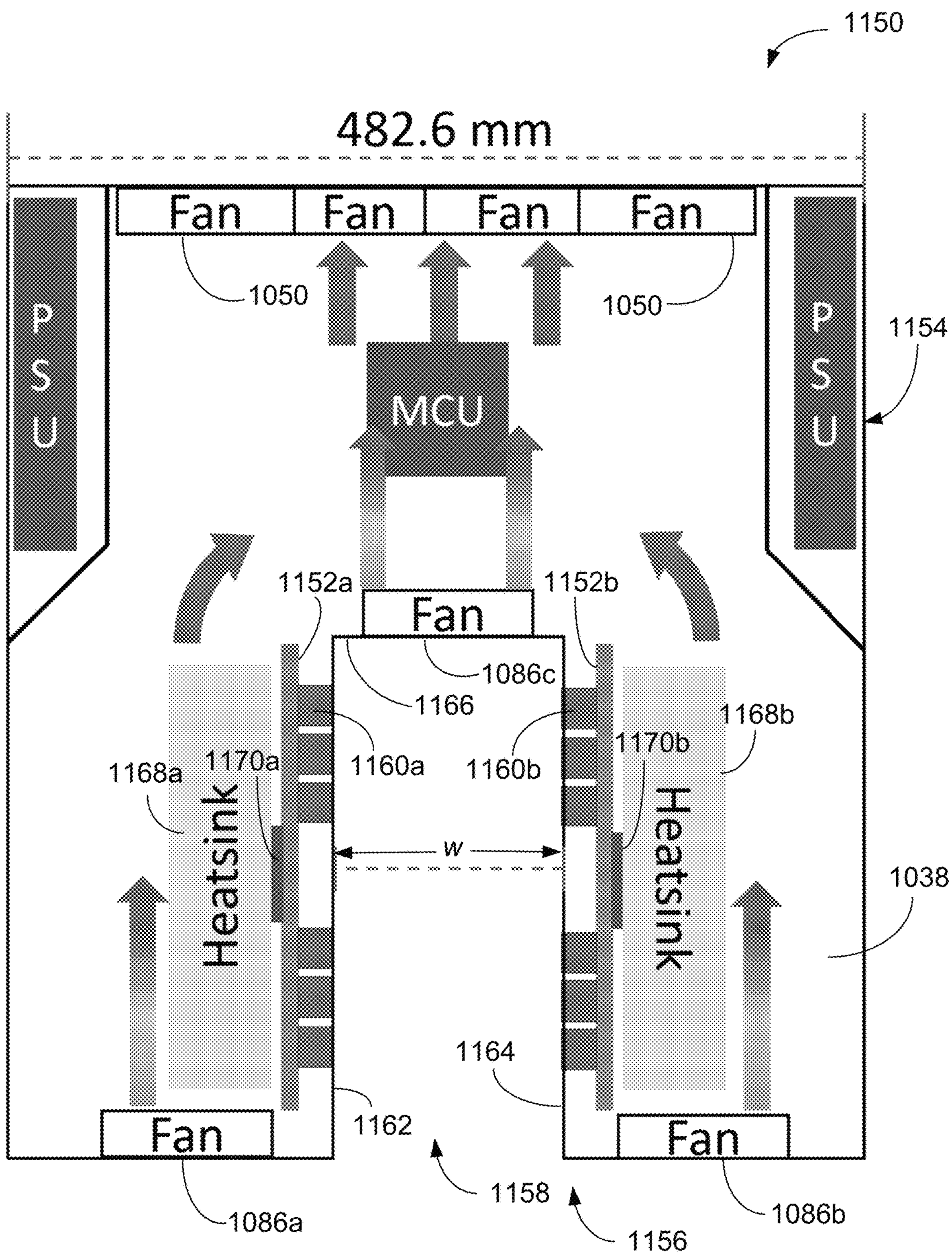
FIG. 74A is a top view of an example of a rackmount server.
Figure 74B:
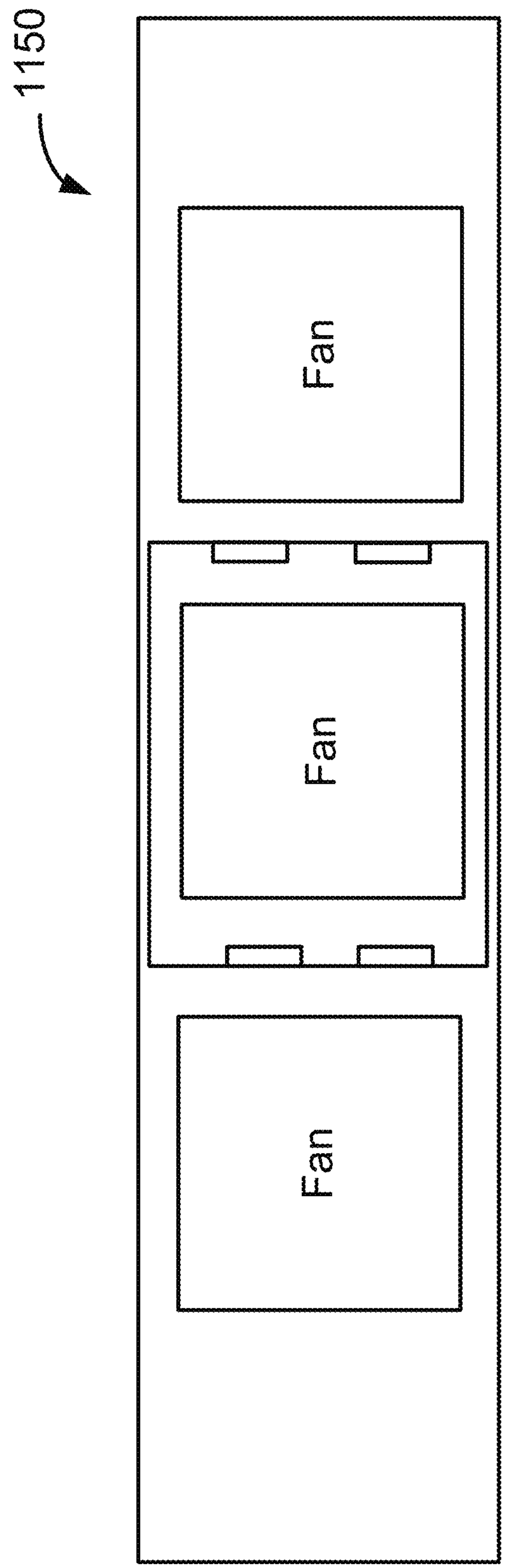
FIG. 74B is a front view of the rackmount server.

Referring to FIGS. 74A to 74B, in some implementations, a rackmount server 1150 includes vertical printed circuit boards 1152*a* and 1152*b* (collectively referenced as 1152) that have surfaces that extend along planes substantially parallel to the front-to-rear direction relative to the housing or case, similar to the vertical printed circuit boards 1126*a* and 1126*b* of FIG. 73. The rackmount server 1150 includes a housing 1154 that has a modified front panel or face plate 1156 that has an inset portion 1158 configured to improve access and field serviceability of co-packaged optical modules 1160*a* and 1160*b* (collectively referenced as 1160) that are mounted on the vertical printed circuit boards 1152*a* and 1152*b*, respectively. The inset portion 1158 is referred to as the "front panel inset" or "face plate inset." The inset portion 1158 has a width w that is selected to enable hot-swap, in-field serviceability of the co-packaged optical modules 1160 to avoid the need to take the rackmount server 1150 out of service for maintenance.

For example, the inset portion 1158 includes a first wall 1162, a second wall 1164, and a third wall 1166. The first wall 1162 is substantially parallel to the second wall 1164, and the third wall 1166 is positioned between the first wall 1162 and the second wall 1164. For example, the first wall 1162 extends along a direction that is substantially parallel to the front-to-rear direction relative to the housing 1122. The vertical printed circuit board 1152*a* is attached to the first wall 1162 of the inset portion 1158, and the vertical printed circuit board 1152*b* is attached to the first wall 1162 of the inset portion 1158. The first wall 1162 includes openings to allow the co-packaged optical modules 1160*a* to pass through, and the second wall 1164 includes openings to allow the co-packaged optical modules 1160*b* to pass through. For example, an inlet fan 1086*c* can be mounted on the third wall 1166.

Each vertical printed circuit board 1152 has a first surface and a second surface. The first surface defines the length and width of the vertical printed circuit board 1152. The distance between the first and second surfaces defines the thickness of the vertical printed circuit board 1152. The vertical printed circuit board 1152*a* or 1152*b* is oriented such that the first surface extends along a plane that is substantially parallel to the front-to-rear direction relative to the housing 1154. At least one data processing chip 1170*a* or 1170*b* is electrically coupled to the first surface of the vertical printed circuit board 1152*a* or 1152*b*, respectively. In some examples, the at least one data processing chip 1170*a* or 1170*b* is mounted on a substrate (e.g., a ceramic substrate), and the substrate is attached to the printed circuit board 1152*a* or 1152*b*. A heat dissipating device 1168*a* or 1168*b* is thermally coupled to the at least one data processing chip 1170*a* or 1170*b*, respectively. The heat dissipating device 1168 includes fins that extend along planes that are substantially parallel to the bottom panel 1038 of the housing 1154. The heat sinks 1168*a* and 1168*b* are positioned directly behind to the inlet fans 1086*a* and 1086*b*, respectively, to maximize air flow across the fins and/or pins of the heat sinks 1168*a* and 1168*b*.

Figure 75A:
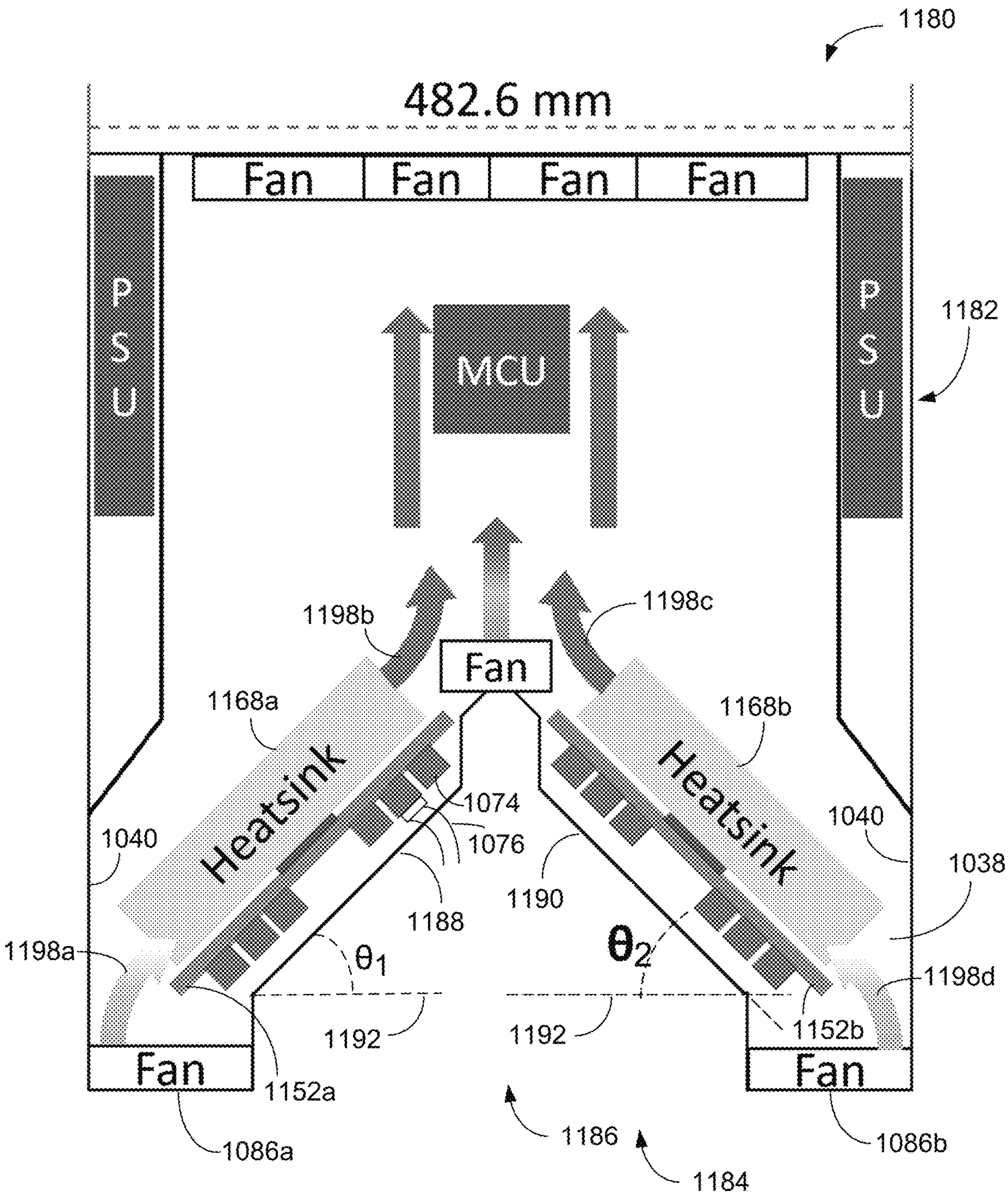
FIG. 75A is a top view of an example of a rackmount server.
Figure 75B:
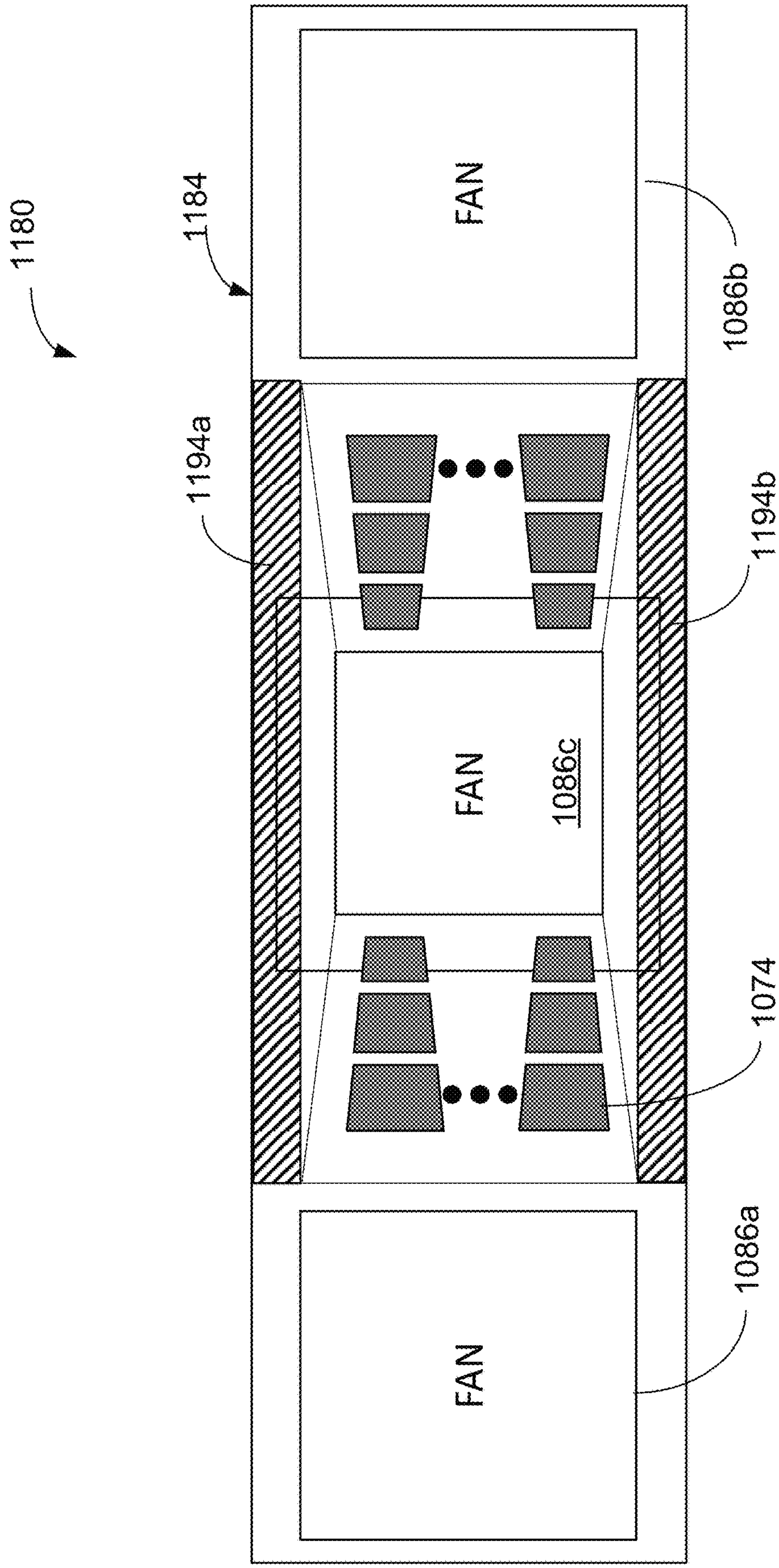
FIG. 75B is a front view of the rackmount server.

Referring to FIGS. 75A to 75B, in some implementations, a rackmount server 1180 includes a housing 1182 having a front panel 1184 that has an inset portion 1186 (referred to as the "front panel inset" or "face plate inset"). For example, the inset portion 1186 includes a first wall 1188 and a second wall 1190 that are oriented to make it easier for the user to connect or disconnect the fiber cables (e.g., 1076) to the server 1180, or to service the co-packaged optical modules 1074. For example, the first wall 1188 can be at an angle $\theta_1$ relative to a nominal plane 1192 of the front panel 1184, in which $0 \leq \theta_1 < 90°$. The second wall 1190 can be at an angle $\theta_2$ relative to the nominal plane 1192 of the front panel, in which $0 \leq \theta_2 < 90°$. The angles $\theta_1$ and $\theta_2$ can be the same or different. The nominal plane 1192 of the front panel 1184 is perpendicular to the side panels 1040 and the bottom panel.

For example, a first vertical printed circuit board 1152*a* is attached to the first wall 1188, and a second vertical printed circuit board 1152*b* is attached to the second wall 1190. Comparing the rackmount server 1180 with the rackmount servers 1060 of FIG. 68A, 1080 of FIG. 69A, and 1100 of FIG. 71, the server 1180 has a larger front panel area due to the angled front panel inset and can be connected to more fiber cables.

Positioning the first and second walls 1188, 1190 at an angle between 0 and 90° relative to the nominal plane of the front panel improves access and field serviceability of the co-packaged optical modules. Comparing the rackmount server 1180 with the rackmount server 1150 of FIG. 74A, the server 1180 allows the user to more easily access the co-packaged optical modules that are positioned farther away from the nominal plane of the front panel. The angles $\theta_1$ and 02 are selected to strike a balance between increasing the number of fiber cables that can be connected to the server and providing easy access to all of the co-packaged optical modules of the server. The front panel inset width and angle are configured to enable hot-swap, in-field serviceability to avoid taking the switch and rack out of service for maintenance.

For examples, intake fans 1086*a* and 1086*b* can be mounted on the front panel 1184. Outside air is drawn in by the intake fans 1086*a*, 1086*b*, passes through the surfaces of the fins and/or pins of the heatsinks 1168*a*, 1168*b*, and flows towards the rear of the housing 1182. Examples of the flow directions for the air entering through the intake fans 1186*a* and 1186*b* are represented by arrows 1198*a*, 1198*b*, 1198*c*, and 1198*d*.

Figure 75C:
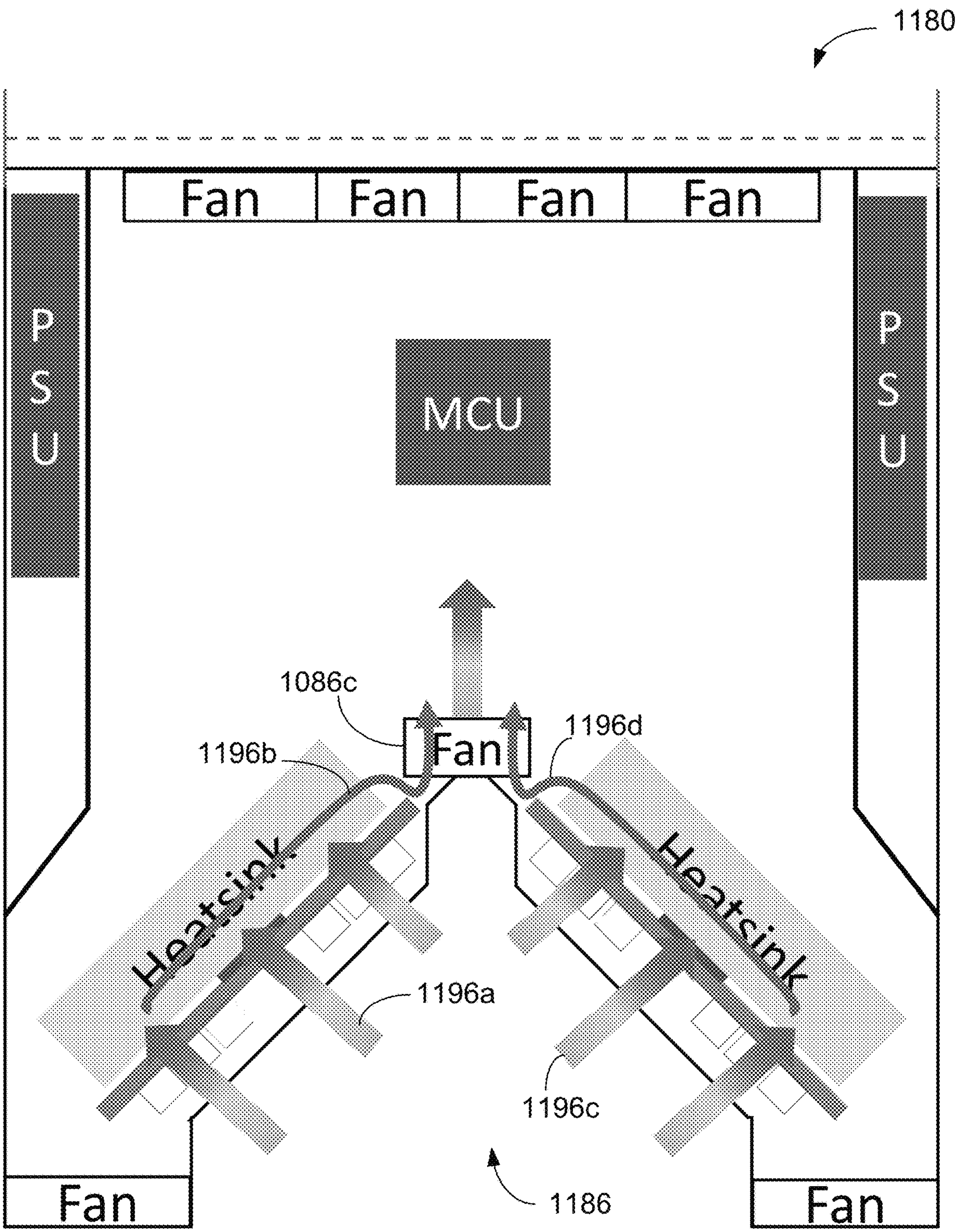
FIG. 75C is a diagram of the air flow in the rackmount server.

Referring to FIGS. 75B and 75C, in some implementations, the front panel 1184 includes an upper air vent 1194*a* and baffles to direct outside air to enter through the upper air vent 1194*a*, flows downward and rearward such that the air passes over the surfaces of some of the fins and/or pins of the heat sinks 1186 (e.g., including the fins and/or pins closer to the top of the heat sinks 1186) and then flows toward an intake fan 1086*c* mounted at or near the distal or rear end of the front panel inset portion 1186. The front panel 1184 includes a lower air vent 1194*b* and baffles to direct outside air to enter through the lower air vent 1194*b*, flows upward and rearward such that the air passes over the surfaces of some of the fins and/or pins of the heat sinks 1186 (e.g., including the fins and/or pins closer to the bottom of the heat sinks 1186) and then flows toward the intake fan 1086*c*. Examples of the air flows through the upper and lower air vents 1194*a*, 1194*b* to the intake fan 1086*c* are represented by arrows 1196*a*, 1196*b*, 1196*c*, and 1196*d* in FIG. 75C.

For example, fiber cables connected to the co-packaged optical modules 1074 can block air flow for the intake fan 1086*c* if the intake fan 1086*c* is configured to receive air through openings directly in front of the intake fan 1086*c*. By using the upper air vent 1194*a*, the lower air vent 1194*b*, and the baffles to direct air flow as described above, the heat dissipating efficiency of the system can be improved (as compared to not having the air vents 1194 and the baffles).

Figure 76:
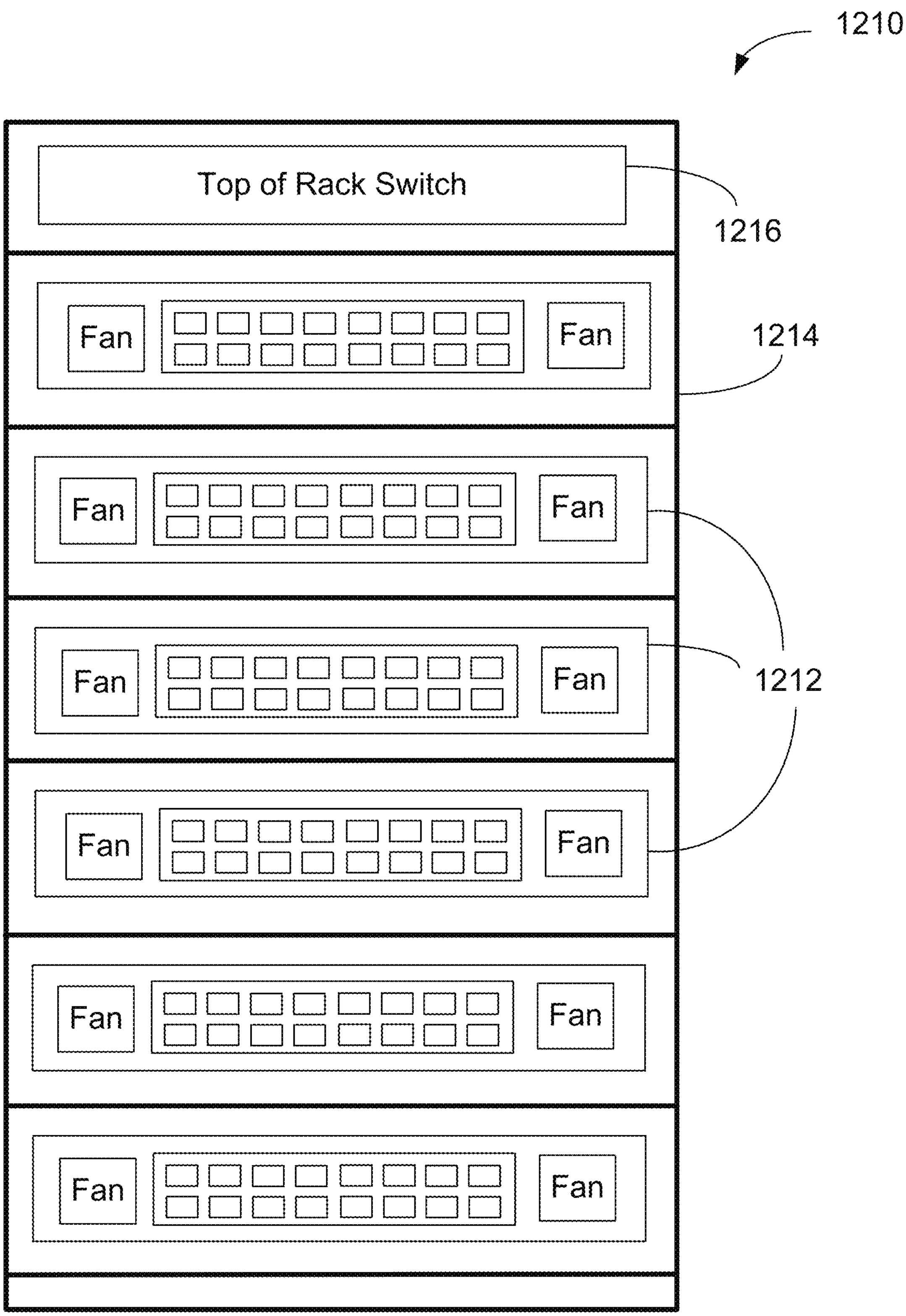
FIG. 76 is a diagram of a network rack that includes a plurality of rackmount servers.

Referring to FIG. 76, in some implementations, a network switch system 1210 includes a plurality of rackmount switch servers 1212 installed in a server rack 1214. The network switch rack includes a top of the rack switch 1216 that routes data among the switch servers 1212 within the network switch system 1210, and serves as a gateway between the network switch system 1210 and other network switch systems. The rackmount switch servers 1212 in the network switch system 1210 can be configured in a manner similar to any of the rackmount servers described above or below.

In some implementations, the examples of rackmount servers shown in in FIGS. 68A, 69A, and 70 can be modified by positioning the vertical printed circuit board behind the front panel. The co-packaged optical modules can be optically connected to fiber connector parts mounted on the front panel through short optical connection paths, e.g., fiber jumpers.

Figure 77A:
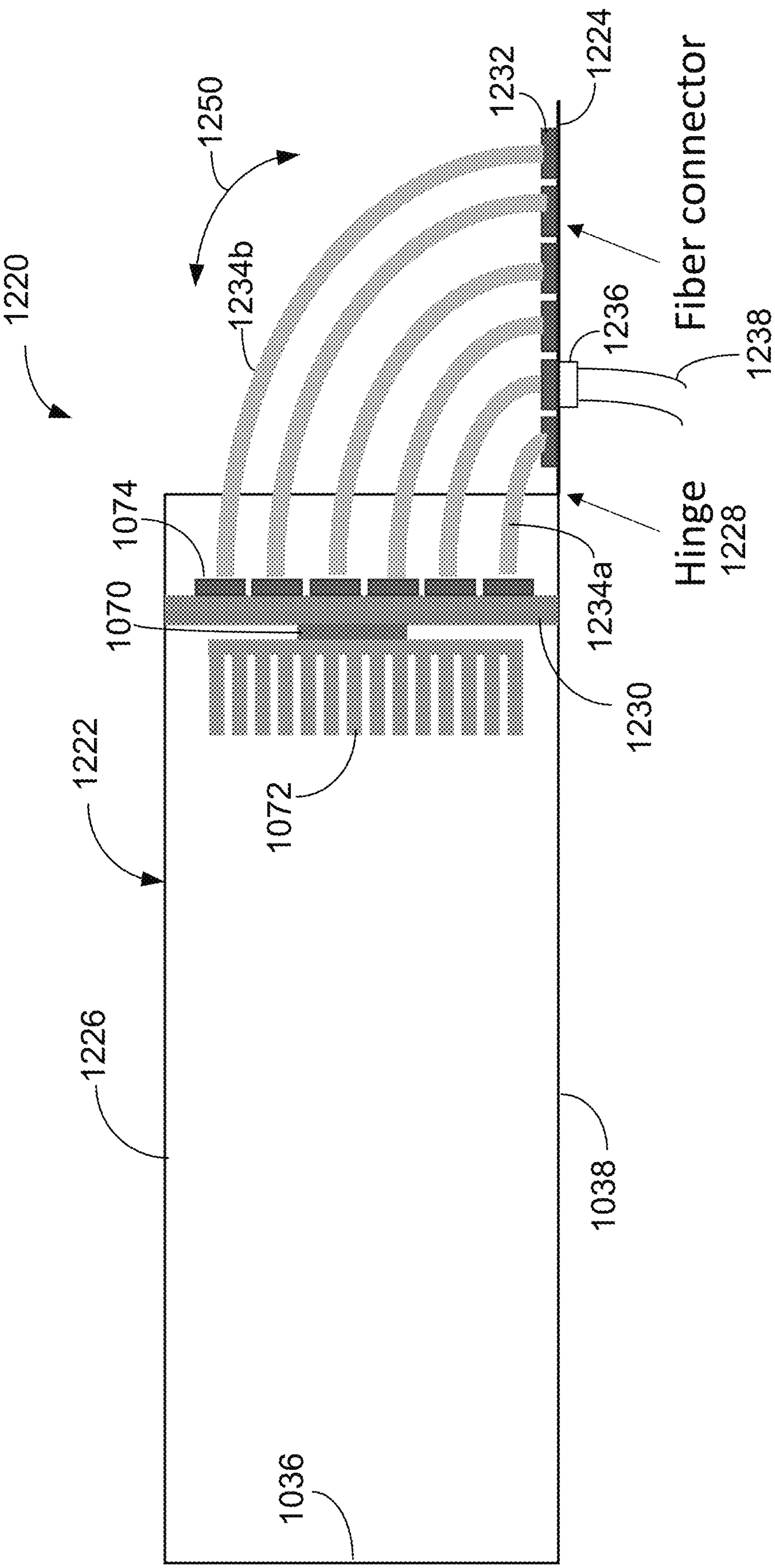
FIG. 77A is a side view of an example of a rackmount server.
Figure 77B:
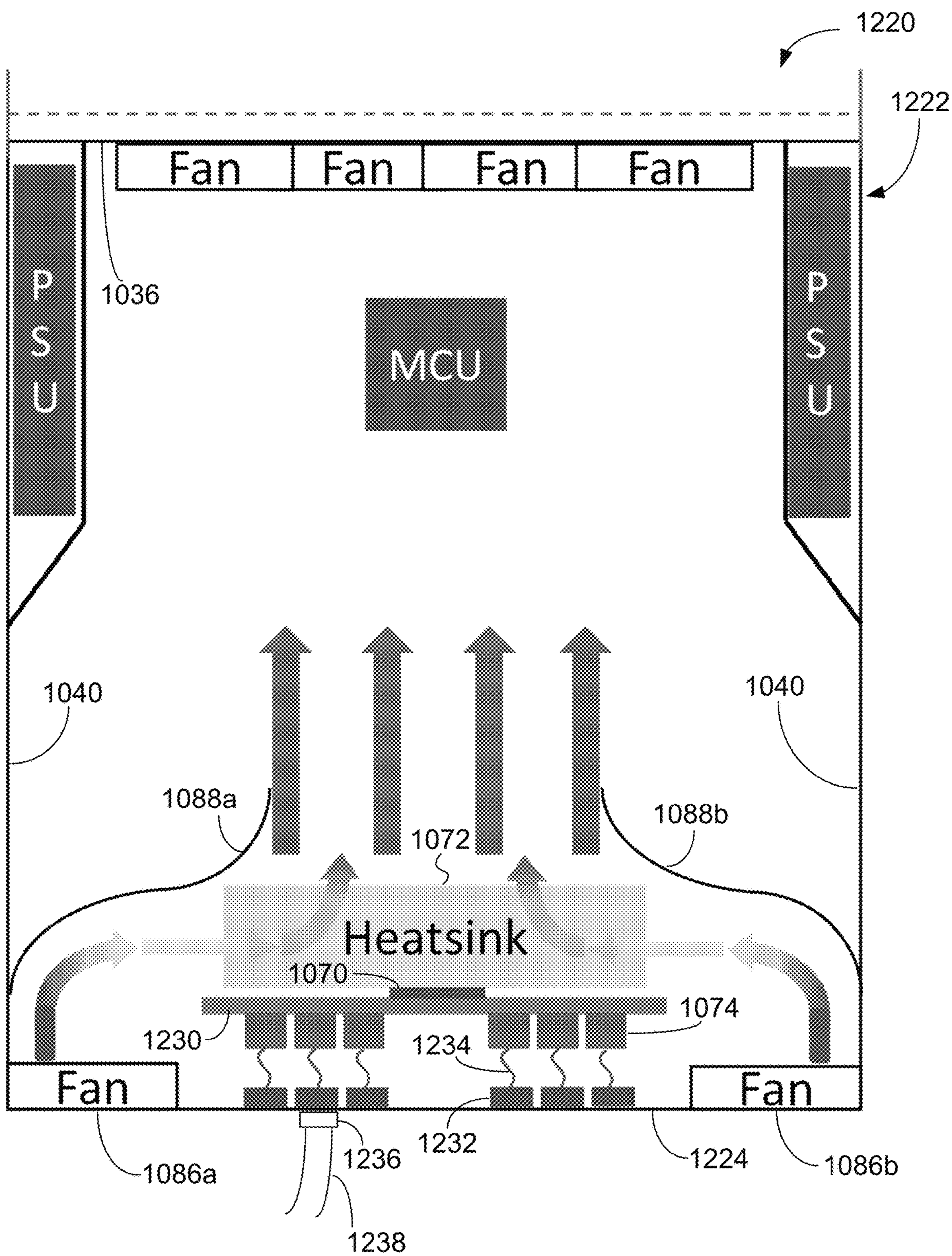
FIG. 77B is a top view of the rackmount server.

Referring to FIGS. 77A and 77B, in some implementations, a rackmount server 1220 includes a housing 1222 having a front panel 1224, a rear panel 1036, a top panel 1226, a bottom panel 1038, and side panels 1040. The front panel 1224 can be opened to allow the user to access components without removing the rackmount server 1220 from the rack. A vertically mounted printed circuit board 1230 is positioned substantially parallel to the front panel 1224 and recessed from the front panel 1224, i.e., spaced apart at a small distance (e.g., less than 6 inches, or less than 3 inches, or less than 2 inches) to the rear of the front panel 1224. The printed circuit board 1230 includes a first side facing the front direction relative to the housing 1222 and a second side facing the rear direction relative to the housing 1222. At least one data processing chip 1070 is electrically coupled to the second side of the vertical printed circuit board 1226, and a heat dissipating device or heat sink 1072 is thermally coupled to the at least one data processing chip 1070. In some examples, the at least one data processing chip 1070 is mounted on a substrate (e.g., a ceramic substrate), and the substrate is attached to the printed circuit board 1226.

Co-packaged optical modules 1074 (also referred to as the optical/electrical communication interfaces) are attached to the first side (i.e., the side facing the front exterior of the housing 1222) of the vertical printed circuit board 1230. In some examples, the co-packaged optical modules 1074 are mounted on a substrate that is attached to the vertical printed circuit board 1230, in which electrical contacts on the substrate are electrically coupled to corresponding electrical contacts on the vertical printed circuit board 1230. In some examples, the at least one data processing chip 1070 is mounted on the rear side of the substrate, and the co-packaged optical modules 1074 are removably attached to the front side of the substrate, in which the substrate provides high speed connections between the at least one data processing chip 1070 and the co-packaged optical modules 1074. For example, the substrate can be attached to a front side of the printed circuit board 1068, in which the printed circuit board 1068 includes one or more openings that allow the at least one data processing chip 1070 to be mounted on the rear side of the substrate. The printed circuit board 1068 can provide from a motherboard electrical power to the substrate (and hence to the at least one data processing chip 1070 and the co-packaged optical modules 1074, and allow the at least one data processing chip 1070 and the co-packaged optical modules 1074 to connect to the motherboard using low-speed electrical links. An array of co-packaged optical modules 1074 can be mounted on the vertical printed circuit board 1230 (or the substrate), similar to the examples shown in FIGS. 69B and 71B. The electrical connections between the co-packaged optical modules 1074 and the vertical printed circuit board 1070 (or the substrate) can be removable, e.g., by using land-grid arrays and/or compression interposers. The co-packaged optical modules 1074 are optically connected to first fiber connector parts 1232 mounted on the front panel 1224 through short fiber jumpers 1234*a*, 1234*b* (collectively referenced as 1234). When the front panel 1224 is closed, the user can plug a second fiber connector part 1236 into the first fiber connector part 1232 on the front panel 1224, in which the second fiber connector part 1236 is connected to an optical fiber cable 1238 that includes an array of optical fibers.

In some implementations, the rackmount server 1220 is pre-populated with co-packaged optical modules 1074, and the user does not need to access the co-packaged optical modules 1074 unless the modules need maintenance. During normal operation of the rackmount server 1220, the user mostly accesses the first fiber connector parts 1232 on the front panel 1224 to connect to fiber cables 1238.

One or more intake fans, e.g., 1086*a*, 1086*b*, can be mounted on the front panel 1224, similar to the examples shown in FIGS. 69A and 70. The positions and configurations of the intake fans 1086, the heat sink 1072, and the air louvers 1088*a*, 1088*b* are selected to maximize the heat transfer efficiency of the heat sink 1072.

The rackmount server 1220 can have a number of advantages. By placing the vertical printed circuit board 1230 at a recessed position inside the housing 1222, the vertical printed circuit board 1230 is better protected by the housing 1222, e.g., preventing users from accidentally bumping into the circuit board 1230. By orienting the vertical printed circuit board 1230 substantially parallel to the front panel 1224 and mounting the co-packaged optical modules 1074 on the side of the circuit board 1230 facing the front direction, the co-packaged optical modules 1074 can be accessible to users for maintenance without the need to remove the rackmount server 1220 from the rack.

In some implementations, the front panel 1224 is coupled to the bottom panel 1038 using a hinge 1228 and configured such that the front panel 1224 can be securely closed during normal operation of the rackmount server 1220 and easily opened for maintenance. For example, if a co-packaged optical module 1074 fails, a technician can open and rotate the front panel 1224 down to a horizontal position to gain access to the co-packaged optical module 1074 to repair or replace it. For example, the movements of the front panel 1224 is represented by the bi-directional arrow 1250. In some implementations, different fiber jumpers 1234 can have different lengths, depending on the distance between the parts that are connected by the fiber jumpers 1234. For example, the distance between the co-packaged optical module 1074 and the first fiber connector part 1232 connected by the fiber jumper 1234*a* is less than the distance between the co-packaged optical module 1074 and the first fiber connector part 1232 connected by the fiber jumper 1234*b*, so the fiber jumper 1234*a* can be shorter than the fiber jumper 1234*b*. This way, by using fiber jumpers with appropriate lengths, it is possible to reduce the clutter caused by the fiber jumpers 1234 inside the housing 1222 when the front panel 1224 is closed and in its vertical position.

In some implementations, the front panel 1224 can be configured to be opened and lifted upwards using lift-up hinges. This can be useful when the rackmount server is positioned near the top of the rack. In some examples, the front panel 1224 can be coupled to the side panel 1040 by using a hinge so that the front panel 1224 can be opened and rotated sideways. In some examples, the front panel can include a left front subpanel and a right front subpanel, in which the left front subpanel is coupled to the left side panel 1040 by using a first hinge, and the right front subpanel is coupled to the right panel 1040 by using a second hinge. The left front subpanel can be opened and rotated towards the left side, and the right front subpanel can be opened and rotated towards the right side. These various configurations for the front panel enable protection of the vertical printed circuit board 1230 and convenient access to the co-packaged optical modules 1074.

In some examples, the front panel can have an inset portion, similar to the example shown in FIG. 71A, in which the vertical printed circuit board is in a recessed position relative to the inset portion of the front panel, i.e., at a small distance to the rear of the inset portion of the front panel. The front panel inset distance, the distance between the vertical printed circuit board and the front panel inset portion, and the air louver configuration can be selected to maximize the heat sink efficiency.

Figure 78:
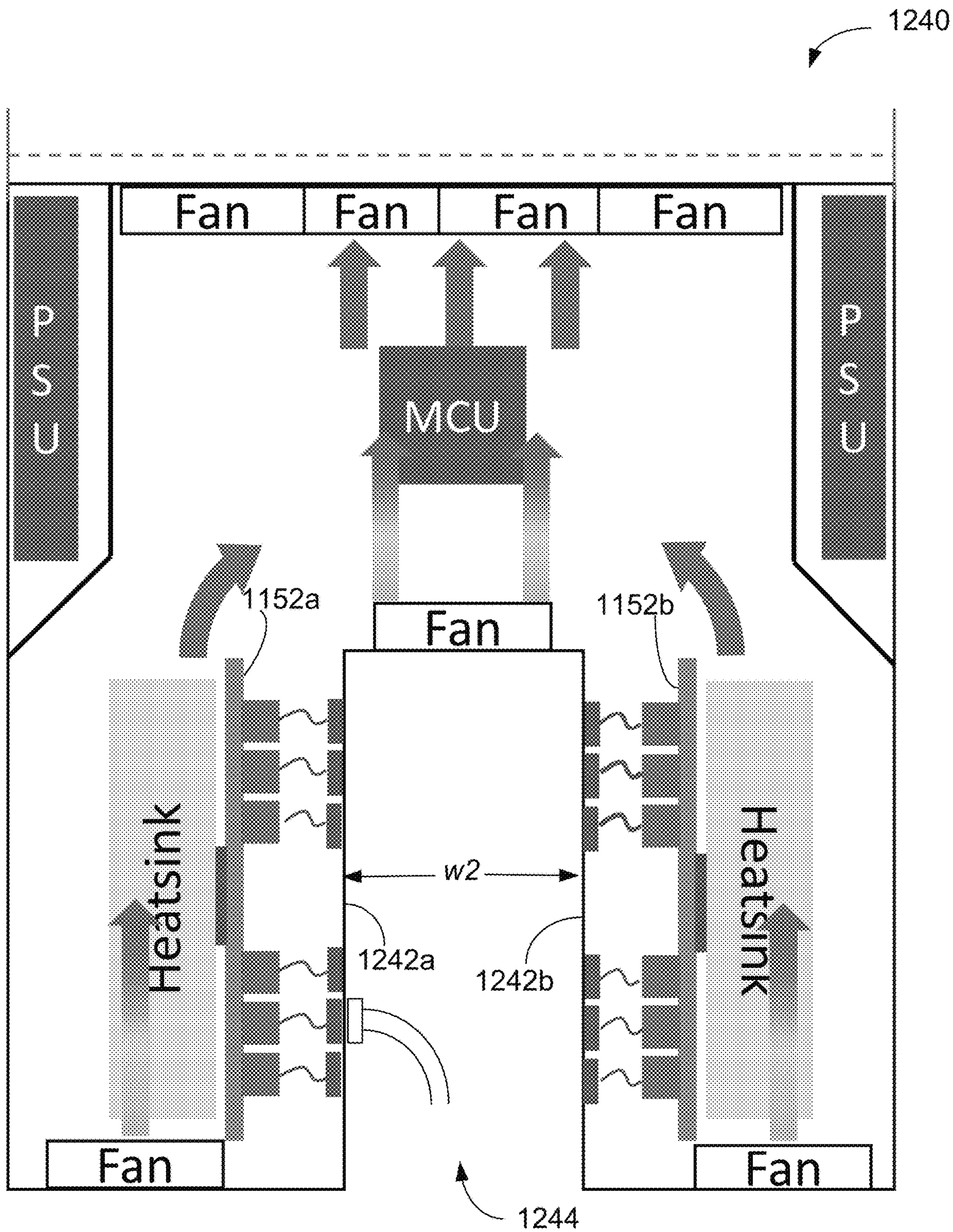
FIG. 78 is a top view of an example of a rackmount server.

Referring to FIG. 78, in some implementations, a rackmount server 1240 can be similar to the rackmount server 1150 of FIG. 74A, except that the vertical printed circuit boards are at recessed positions relative to the walls of the inset portion of the front panel. For example, a vertical printed circuit board 1152*a* is in a recessed position relative to a first wall 1242*a* of an inset portion 1244, i.e., the vertical printed circuit board 1152*a* is spaced apart a small distance to the left from the first wall 1242*a*. A vertical printed circuit board 1152*b* is in a recessed position relative to a second wall 1242*b* of the inset portion 1244, i.e., the vertical printed circuit board 1152*b* is spaced apart a small distance to the right from the second wall 1242*b*.

For example, the first wall 1242*a* can be coupled to the bottom or top panel through hinges so that the first wall 1242*a* can be closed during normal operation of the rackmount server 1240 and opened for maintenance of the server 1240. The distance w2 between the first wall 1242*a* and the second wall 1242*b* is selected to be sufficiently large to enable the first wall 1242*a* and the second wall 1242*b* to be opened properly. This design has advantages similar to those of the rackmount server 1220 in FIGS. 77A, 77B.

In some implementations, a rackmount server can be similar to the rackmount server 1180 shown in FIGS. 75A to 75C, except that the vertical printed circuit boards are at recessed positions relative to the walls of the inset portion of the front panel. For example, a first vertical printed circuit board is in a recessed position relative to the first wall 1188 of the inset portion 1186, and a second vertical printed circuit board is in a recessed position relative to the second wall 1190 of the inset portion 1186. For example, the first wall 1188 can be coupled to the bottom or top panel through hinges so that the first wall 1188 can be closed during normal operation of the rackmount server and opened for maintenance of the server. The angles $\theta_1$ and 02 are selected to enable the first wall 1188 and the second wall 1190 to be opened properly. This design has advantages similar to those of the rackmount server 1220 in FIGS. 77A, 77B.

A feature of the thermal architecture for the rackmount units (e.g., the rackmount servers 1060 of FIG. 68A, 1090 of FIGS. 69A, 70, 1100 of FIGS. 71A, 72, 1120 of FIG. 73A, 1150 of FIG. 74A, 1180 of FIG. 75A, 1220 of FIG. 77B, and 1240 of FIG. 78) described above is the use of co-packaged optical modules or optical/electrical communication interfaces that have higher bandwidth per module or interface, as compared to conventional designs. For example, each co-packaged optical module or optical/electrical communication interface can be coupled to a fiber cable that carries a large number of densely packed optical fiber cores. FIG. 9 shows an example of the integrated optical communication device 282 in which the optical signals provided to the photonic integrated circuit can have a total bandwidth of about 12.8 Tbps. By using co-packaged optical modules or optical/electrical communication interfaces that have higher bandwidth per module or interface, the number of co-packaged optical modules or optical/electrical communication interfaces required for a given total bandwidth for the rackmount unit is reduced, so the amount of area on the front panel of the housing reserved for connecting to optical fibers can be reduced. Therefore, it is possible to add one or more inlet fans on the front panel to improve thermal management while still maintaining or even increasing the total bandwidth of the rackmount unit, as compared to conventional designs.

In some implementations, for the examples shown in FIGS. 72, 74A, 75A, and 78, and the variations in which the vertical printed circuit boards are at recessed positions relative to the front panel, the shape of each of the top and bottom panels of the housing can have an inset portion at the front that corresponds to the inset portion of the front panel. This makes it more convenient to access the co-packaged optical modules or the optical connector parts mounted on the front panel without being hindered by the top and bottom panels. In some implementations, the server rack (e.g., 1214 of FIG. 76) is designed such that front support structures of the server rack also have inset portions that correspond to the insert portions of the front panels of the rackmount servers installed in the server rack. For example, a custom server rack can be designed to install rackmount servers that all have the inset portions similar to the inset portion 1158 of FIG. 74A. For example, a custom server rack can be designed to install rackmount servers that all have the inset portions similar to the inset portion 1186 of FIG. 75A. In such examples, the inset portions extend vertically from the bottom-most server to the top-most server without any obstruction, making it easier for the user to access the co-packaged optical modules or optical connector parts.

In some implementations, for the examples shown in FIGS. 72, 74A, 75A, and 78, and the variations in which the vertical printed circuit boards are at recessed positions relative to the front panel, the shape of the top and bottom panels of the housing can be similar to standard rackmount units, e.g., the top and bottom panels can have a generally rectangular shape.

In the examples shown in FIGS. 68A, 68B, 69A to 75C, and 77A to 78, a grid structure similar to the grid structure 870 shown in FIG. 43 can be attached to the vertical printed circuit board. The grid structure can function as both (i) a heat spreader/heat sink and (ii) a mechanical holding fixture for the co-packaged optical modules (e.g., 1074) or optical/electrical communication interfaces.

Figure 96:
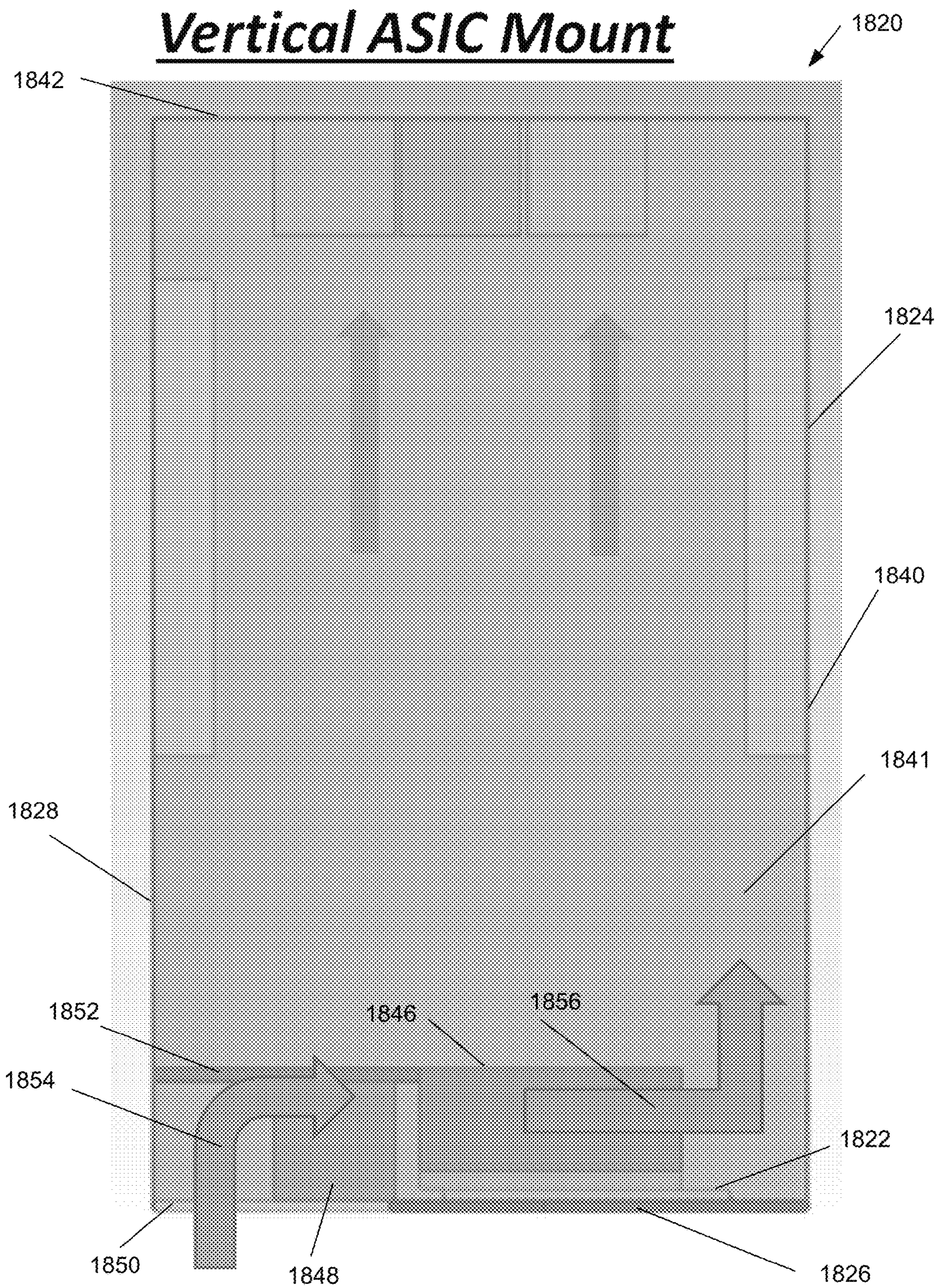
FIG. 96 is a top view of an example of a rackmount server.
Figure 97B:
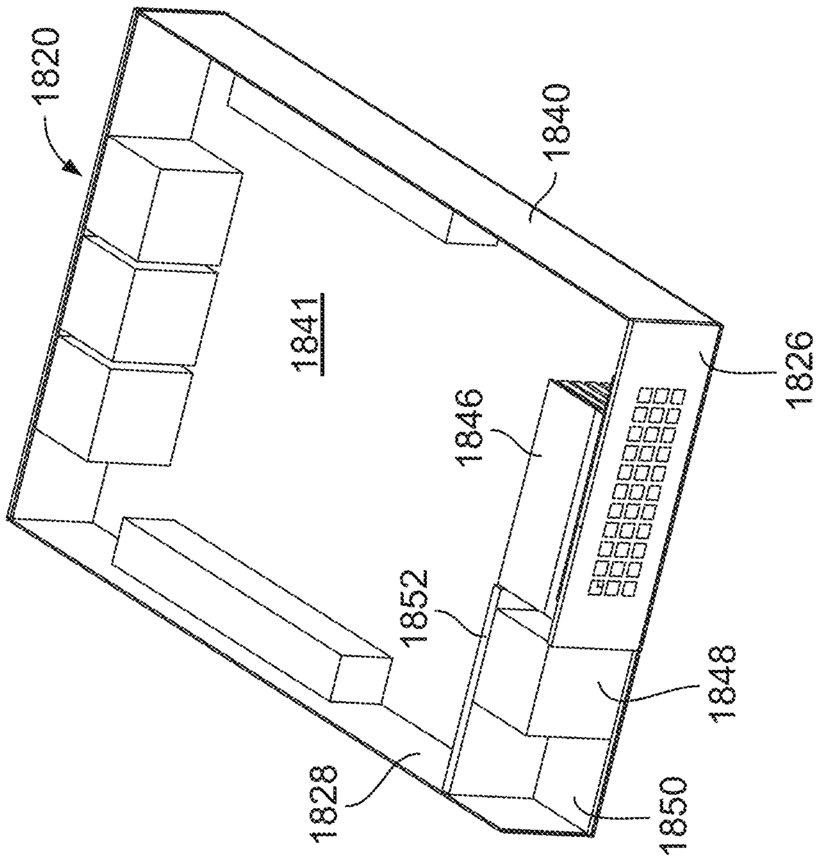
FIG. 97B is a perspective view of the rackmount server of FIG. 96 with the top panel removed.
Figure 97A:
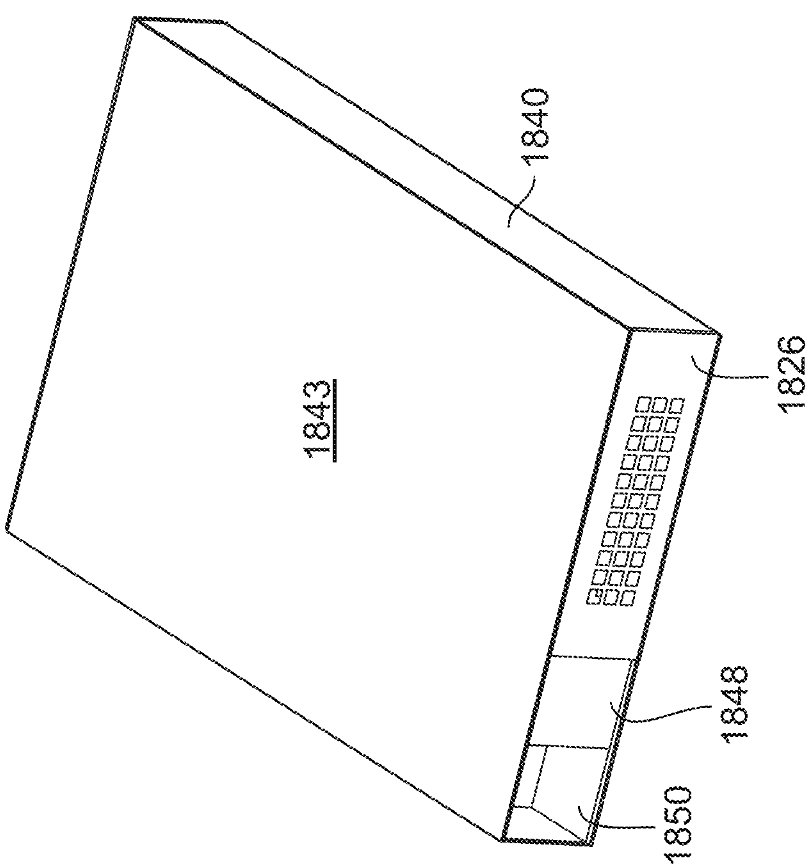
FIG. 97A is a perspective view of the rackmount server of FIG. 96.

FIGS. 96 to 97B are diagrams of an example of a rackmount server 1820 that includes a vertically oriented circuit board 1822 positioned at a front portion of the rackmount server 1820. FIG. 96 shows a top view of the rackmount server 1820, FIG. 97A shows a perspective view of the rackmount server 1820, and FIG. 97B shows a perspective view of the rackmount server 1820 with the top panel removed. The rackmount server 1820 has an active airflow management system that is configured to remove heat from a data processor during operation of the rack-mount server 1820.

Referring to FIGS. 96, 97A, and 97B, in some implementations, the rackmount server 1820 includes a housing 1824 that has a front panel 1826, a left side panel 1828, a right side panel 1840, a bottom panel 1841, a top panel 1843, and a rear panel 1842. The front panel 1826 can be similar to the front panels in the examples shown in FIGS. 68A, 68B, 69A to 72, 77A, and 77B. For example, the vertically oriented circuit board 1822 can be part of the front panel 1826, or attached to the front panel 1826, or positioned in a vicinity of the front panel 1826, in which a distance between the circuit board 1822 and the front panel 1826 is not more than, e.g., 6 inches. A data processor 1844 (which can be, e.g., a network switch, a central processor unit, a graphics processor unit, a tensor processing unit, a neural network processor, an artificial intelligence accelerator, a digital signal processor, a microcontroller, or an application specific integrated circuit)(see FIG. 99) is mounted on the circuit board 1822.

A heat dissipating module 1846, e.g., a heat sink, is thermally coupled to the data processor 1844 and configured to dissipate heat generated by the data processor 1828 during operation. The heat dissipating module 1846 can be similar to the heat dissipating device 1072 of FIGS. 68A, 68C, 69A, 70, and 71A. In some examples, the heat dissipating module 1846 includes heat sink fins or pins having heat dissipating surfaces configured to optimize heat dissipation. In some examples, the heating dissipating module 1846 includes a vapor chamber thermally coupled to heat sink fins or pins. The rackmount server 1820 can include other components, such as power supply units, rear outlet fans, one or more additional horizontally oriented circuit boards, one or more additional data processors mounted on the horizontally oriented circuit boards, and one or more additional air louvers, that have been previously described in other embodiments of rackmount servers and are not repeated here.

In some implementations, the active airflow management system includes an inlet fan 1848 that is positioned at a left side of the heat dissipating module 1846 and oriented to blow incoming air to the right toward the heat dissipating module 1846. A front opening 1850 provides incoming air for the inlet fan 1848. The front opening 1850 can be positioned to the left of the inlet fan 1848. In the example of FIG. 96, the circuit board 1822 is substantially parallel to the front panel 1826, and the rotational axis of the inlet fan 1848 is substantially parallel to the plane of the circuit board 1822. The inlet fan 1848 can also be oriented slightly differently. For example, the rotational axis of the inlet fan 1848 can be at an angle θ relative to the plane of the front panel 1826, the angle θ being measured along a plane parallel to the bottom panel 1841, in which $\theta \leq 45°$, or in some examples $\theta \leq 25°$, or in some examples $\theta \leq 5°$, or in some examples $\theta = 0°$.

In some implementations, a baffle or an air louver 1852 (or internal panel or internal wall) is provided to guide the air entering the opening 1850 towards the inlet fan 1848. An arrow 1854 shows the general direction of airflow from the opening 1850 to the inlet fan 1848. In some examples, the air louver 1852 extends from the left side panel 1828 of the housing 1840 to a rear edge of the inlet fan 1848. The air louver 1852 can be straight or curved. In some examples, the air louver 1852 can be configured to guide the inlet air blown from the inlet fan 1848 towards the heat dissipating module 1846. For example, the air louver 1852 can extend from the left side panel 1828 to the left edge of the heat dissipating module 1846. For example, the air louver 1852 can extend from the left side panel 1828 to a position at or near the rear of the heat dissipating module 1846, in which the position can be anywhere from the left rear portion of the heat dissipating module 1846 to the right rear portion of the heat dissipating module 1846. The air louver 1852 can extend from the bottom panel 1841 to the top panel 1843 in the vertical direction. An arrow 1856 shows the general direction of air flow through and out of the heating dissipating module 1846.

For example, the air louver 1852, a front portion of the left side panel 1828, the front panel 1826, the circuit board 1822, a front portion of the bottom panel 1841, and a front portion of the top panel 1843 can form an air duct that guides the incoming cool air to flow across the heat dissipating surface of the heat dissipating module 1846. Depending on the design, the air duct can extend to the left edge of the heat dissipating module 1846, to a middle portion of the heat dissipating module 1846, or extend approximately the entire length (from left to right) of the heat dissipating module 1846.

The inlet fan 1848 and the air louver 1852 are designed to improve airflow across the heat dissipating surface of the heat dissipating module 1846 to optimize or maximize heat dissipation from the data processor 1844 through the heat dissipating module 1846 to the ambient air. Different rack-mount servers can have vertically mounted circuit boards with different lengths, can have data processors with different heat dissipation requirements, and can have heat dissipating modules with different designs. For example, the heat sink fins and/or pins can have different configurations. The inlet fan 1848 and the air louver 1852 can also have any of various configurations in order to optimize or maximize the heat dissipation from the data processor 1844. In the example of FIG. 96, the inlet fan 1848 directs air to flow generally in a direction (in this example, from left to right) that is parallel to the front panel across the heat dissipating surface of the heat dissipating module 1846. In some implementations, the front opening can be positioned to the right side of the front panel, and the inlet fan can be positioned to the right side of the heat dissipating module and direct air to flow from right to left across the heat dissipating surface of the heat dissipating module. The air louver can be modified accordingly to optimize airflow and heat dissipation from the data processor.

Figure 98:
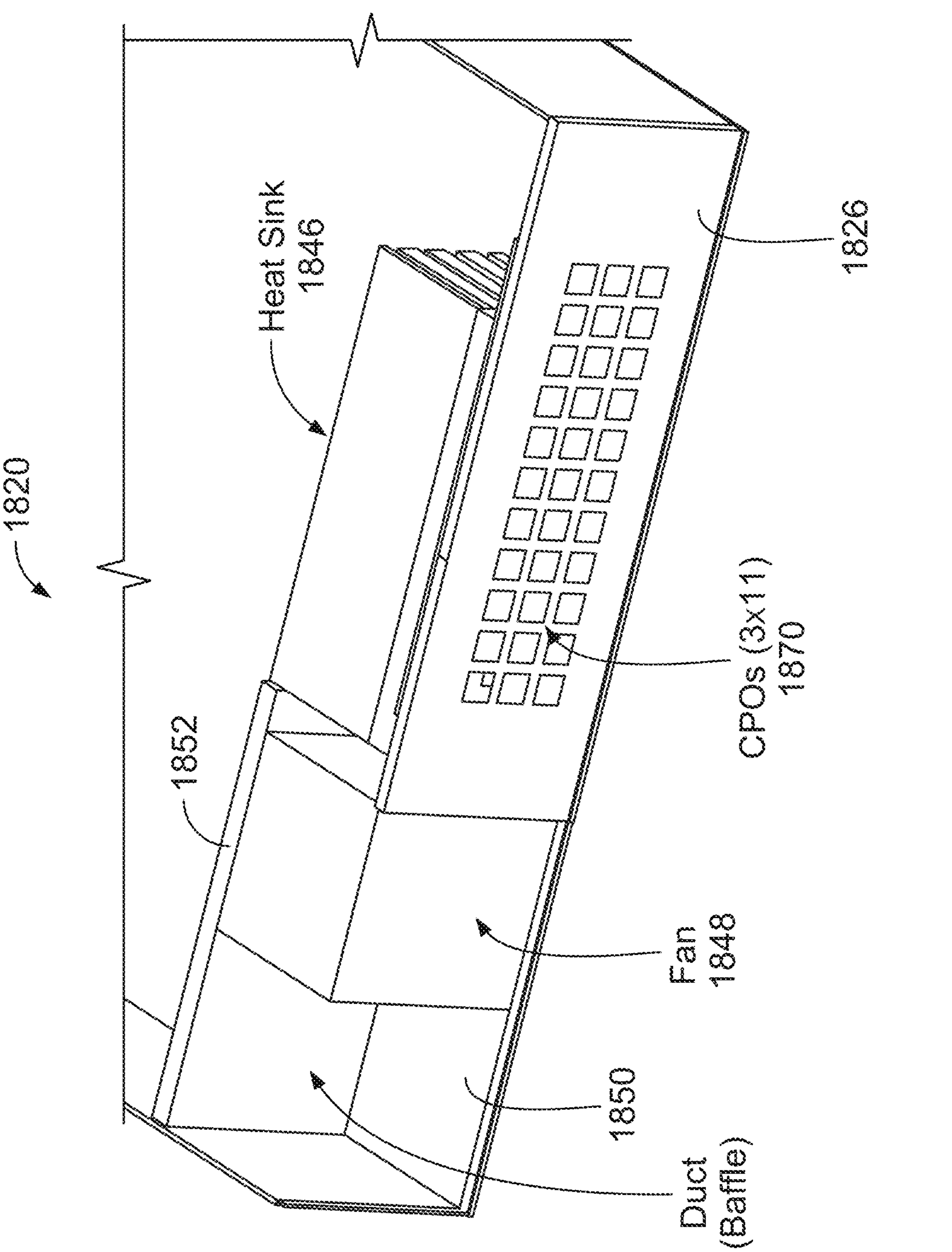
FIG. 98 is a diagram of the front portion of the rackmount server of FIG. 96.

FIG. 98 is a diagram showing the front portion of the rackmount server 1820. The baffle or air louver 1852, a portion of the bottom panel 1841, a portion of the top panel 1843, and a portion of the left side panel 1828 form a duct that directs external air toward the inlet fan 1848. A safety mechanism (not shown in the figure), such as a protective mesh, that allows air to substantially freely pass through while blocking larger objects, such as users' fingers, can be placed across the opening 1850.

In some examples, orienting the inlet fan to face towards the side direction instead of the front direction (as in the examples shown in FIGS. 69A and 71A) can improve the safety and comfort of users operating the rackmount server 1820. In some examples, orienting the inlet fan towards the side direction instead of the front direction can avoid the presence of a region in the heat dissipating module having little to no air flow. In the example of FIG. 71A, the left and right inlet fans blow air toward the left and right side regions, respectively, of the heat dissipating device 1072. The incoming air is drawn toward the rear of the heat dissipating module due to the air pressure gradient generated by the front and rear inlet fans. In some cases, the incoming air entering the left side of the heat dissipating device 1072 is drawn toward the rear of the heat dissipating device 1072 before reaching the middle part of the heat dissipating device 1072. Similarly, the incoming air entering the right side of the heat dissipating device 1072 is drawn toward the rear of the heat dissipating device 1072 before reaching the middle part of the heat dissipating device 1072. As a result, near the middle or middle-front region of the heat dissipating device 1072 there may be a region having little to no air flow, reducing the efficiency of heat dissipation. The design shown in FIGS. 96 to 98 avoids or reduces this problem.

The front panel 1826 includes openings or interface ports 1860 that allow the rackmount server 1820 to be coupled to optical fiber cables and/or electrical cables. In some implementations, co-packaged optical modules 1870 can be inserted into the interface ports 1860, in which the co-packaged optical modules 1870 function as optical/electrical communication interfaces for the data processor 1844. The co-packaged optical modules have been described earlier in this document.

Figure 99:
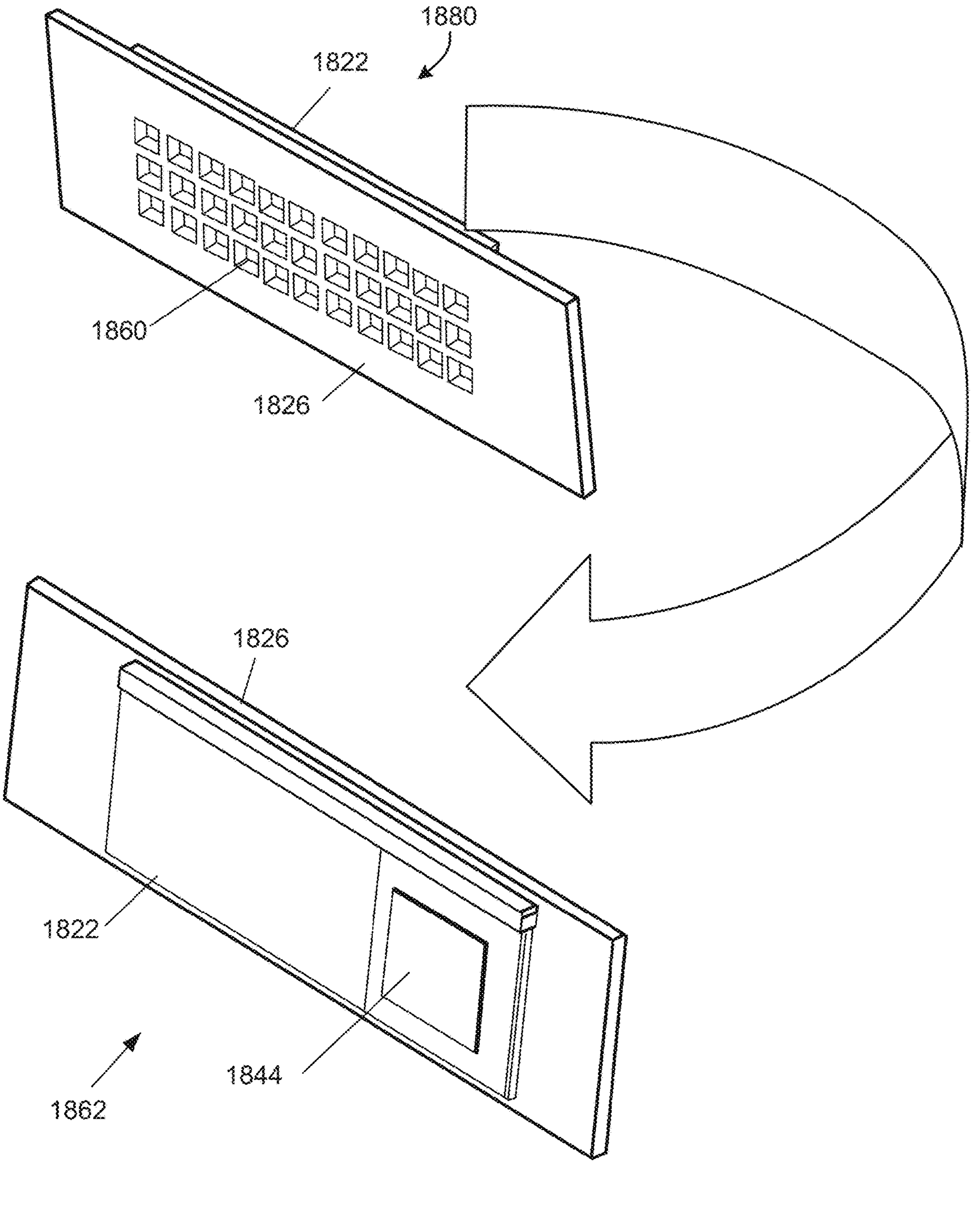
FIG. 99 includes perspective front and rear views of the front panel of the rackmount server of FIG. 96.

FIG. 99 includes an upper diagram 1880 that shows a perspective front view of an example of the front panel 1826, and a lower diagram 1882 that shows a perspective rear view of the front panel 1826. The lower diagram 1882 shows the data processor 1844 mounted to the back side of the vertically oriented circuit board 1822. The front panel 1826 includes openings or interface ports 1860 that allow insertion of communication interface modules, such as co-packaged optical modules, that provide interfaces between the data processor 1844 and external optical or electrical cables. The optical and electrical signal paths between the data processor 1844 and the co-packaged optical modules have been previously described in this document.

Figure 100:
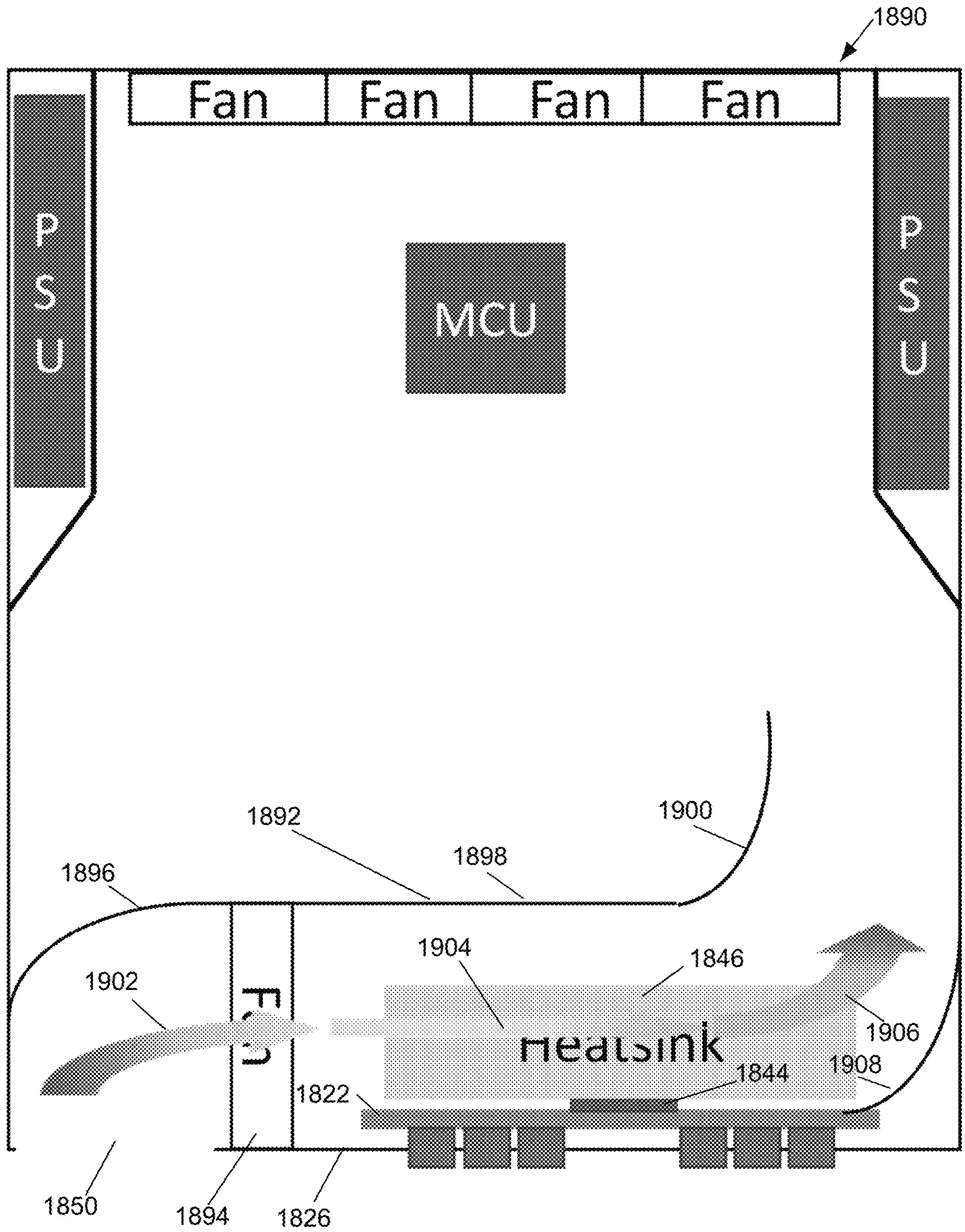
FIG. 100 is a top view of an example of a rackmount server.

FIG. 100 is a diagram of a top view of an example of a rackmount server 1890 that includes a vertically oriented circuit board 1822 positioned at a front portion of the rackmount server 1890. A data processor 1844 is mounted on the circuit board 1822, and a heat dissipating module 1846 is thermally coupled to the data processor 1844. The rackmount server 1890 has an active airflow management system that is configured to remove heat from the data processor 1844 during operation. The rackmount server 1890 includes components that are similar to those of the rackmount server 1820 (FIG. 96) and are not otherwise described here.

In some implementations, the active airflow management system includes an inlet fan 1894 that is positioned at a left side of the heat dissipating module 1846 and oriented to blow inlet air to the right toward the heat dissipating module 1846. A front opening 1850 allows incoming air to pass to the inlet fan 1894. The front opening 1850 can be positioned to the left of the inlet fan 1894. For example, the inlet fan 1894 can have a rotational axis that is at an angle θ relative to the front panel 1826, in which θ≤45°. In some examples, θ≤25°. In some examples, θ≤5°. In some examples, the circuit board 1822 is substantially parallel to the front panel 1826, and the rotational axis of the inlet fan 1894 is substantially parallel to the circuit board 1822. An inlet fan 1894, In some implementations, a first baffle or air louver 1892 is provided to guide air from the opening 1850 towards the inlet fan 1894, and from the inlet fan 1894 towards the heat dissipating module 1846. A second baffle or air louver 1908 is provided to guide air from the right portion of the heat dissipating module 1846 toward the rear of the rackmount server 1890. The first and second air louvers 1892, 1894 can extend from the bottom panel to the top panel in the vertical direction.

An arrow 1902 shows a general direction of airflow from the opening 1850 to the inlet fan 1894. An arrow 1904 shows a general direction of airflow from the inlet fan 1894 to, and through, a center portion the heat dissipating module 1846. An arrow 1906 shows a general direction of airflow through, and exiting, the right portion of the heat dissipating module 1846. The first air louver 1892, a front portion of the left panel, a front portion of the top panel, a front portion of the bottom panel, the front panel 1826, the circuit board 1822, and the second air louver 1908 in combination form a duct that channels the air to flow through the entire heat dissipating module 1846, or a substantial portion of the heat dissipating module 1846, thereby increasing the efficiency of heat dissipation from the data processor 1844.

In this example, the first air louver 1892 includes a left curved section 1896, a middle straight section 1898, and a right curved section 1900. The left curved section 1896 extends from the left side panel to the inlet fan 1894. The left curved section 1896 directs incoming air to turn from flowing in the rear direction to flowing in the left-to-right direction. The middle straight section 1898 is positioned to the rear of the heat dissipating module 1846 and extends from the inlet fan 1894 to beyond the center portion of the heat dissipating module 1846. The middle straight section 1898 directs the air to flow generally in a left-to-right direction through a substantial portion (e.g., more than half) of the heat dissipating module 1846. The right curved section 1900 and the second air louver 1908 in combination guide the air to turn from flowing in the left-to-right direction to flowing in a rear direction. The designs of the first and second air louvers 1892, 1908 are selected to optimize the heat dissipation efficiency. The heat dissipating module 1846 can have a design that is different from what is shown in the figure, and the first and second air louvers 1892, 1908 can also be modified accordingly.

In the example of FIG. 100, the inlet fan 1894 directs air to flow generally in a direction (in this example, from left to right) that is parallel to the front panel 1826 across the heat dissipating surface of the heat dissipating module 1846. In some implementations, the front opening can be positioned to the left side of the front panel, and the inlet fan can be positioned to the right side of the heat dissipating module and direct air to flow from right to left across the heat dissipating surface of the heat dissipating module. The first and second air louvers can be modified accordingly to optimize airflow and heat dissipation from the data processor.

FIGS. 35A to 37 show examples of optical communications systems 1250, 1260, 1270 in which in each system an optical power supply or photon supply provides optical power supply light to photonic integrated circuits hosted in multiple communication devices (e.g., optical transponders), and the optical power supply is external to the communication devices. The optical power supply can have its own housing, electrical power supply, and control circuitry, independent of the housings, electrical power supplies, and control circuitry of the communication devices. This allows the optical power supply to be serviced, repaired, or replaced independent of the communication devices. Redundant optical power supplies can be provided so that a defective external optical power supply can be repaired or replaced without taking the communication devices off-line. The external optical power supply can be placed at a convenient centralized location with a dedicated temperature environment (as opposed to being crammed inside the communication devices, which may have a high temperature). The external optical power supply can be built more efficiently than individual power supply units, as certain common parts such as monitoring circuitry and thermal control units can be amortized over many more communication devices. The following describes implementations of the fiber cabling for remote optical power supplies.

Figure 79:
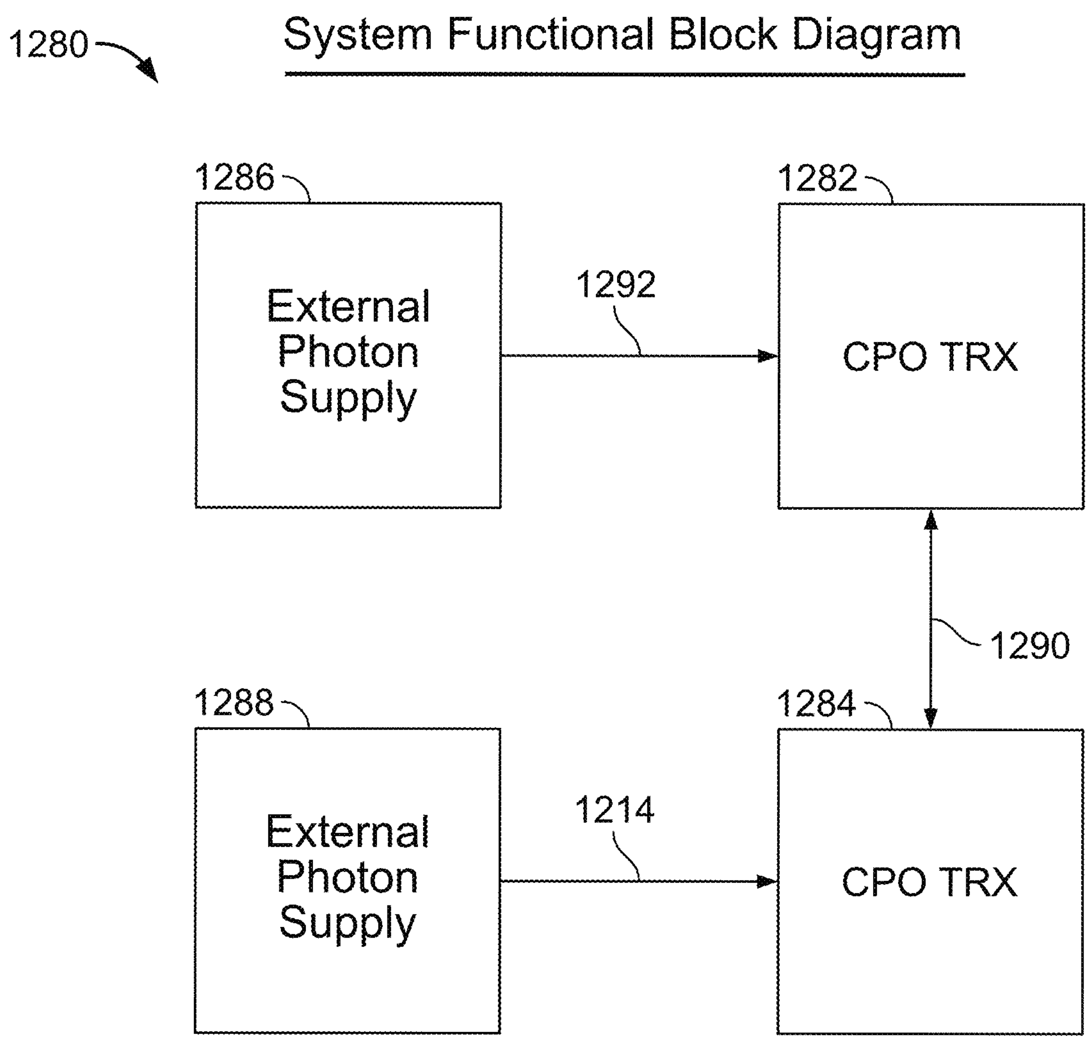
FIG. 79 is a block diagram of an example of an optical communication system.

FIG. 79 is a system functional block diagram of an example of an optical communication system 1280 that includes a first communication transponder 1282 and a second communication transponder 1284. Each of the first and second communication transponders 1282, 1284 can include one or more co-packaged optical modules described above. Each communication transponder can include, e.g., one or more data processors, such as network switches, central processing units, graphics processor units, tensor processing units, digital signal processors, and/or other application specific integrated circuits (ASICs). In this example, the first communication transponder 1282 sends optical signals to, and receives optical signals from, the second communication transponder 1284 through a first optical communication link 1290. The one or more data processors in each communication transponder 1282, 1284 process the data received from the first optical communication link 1290 and outputs processed data to the first optical communication link 1290. The optical communication system 1280 can be expanded to include additional communication transponders. The optical communication system 1280 can also be expanded to include additional communication between two or more external photon supplies, which can coordinate aspects of the supplied light, such as the respectively emitted wavelengths or the relative timing of the respectively emitted optical pulses.

A first external photon supply 1286 provides optical power supply light to the first communication transponder 1282 through a first optical power supply link 1292, and a second external photon supply 1288 provides optical power supply light to the second communication transponder 1284 through a second optical power supply link 1294. In one example embodiment, the first external photon supply 1286 and the second external photon supply 1288 provide continuous wave laser light at the same optical wavelength. In another example embodiment, the first external photon supply 1286 and the second external photon supply 1288 provide continuous wave laser light at different optical wavelengths. In yet another example embodiment, the first external photon supply 1286 provides a first sequence of optical frame templates to the first communication transponder 1282, and the second external photon supply 1288 provides a second sequence of optical frame templates to the second communication transponder 1284. For example, as described in U.S. patent Ser. No. 16/847,705, each of the optical frame templates can include a respective frame header and a respective frame body, and the frame body includes a respective optical pulse train. The first communication transponder 1282 receives the first sequence of optical frame templates from the first external photon supply 1286, loads data into the respective frame bodies to convert the first sequence of optical frame templates into a first sequence of loaded optical frames that are transmitted through the first optical communication link 1290 to the second communication transponder 1284. Similarly, the second communication transponder 1284 receives the second sequence of optical frame templates from the second external photon supply 1288, loads data into the respective frame bodies to convert the second sequence of optical frame templates into a second sequence of loaded optical frames that are transmitted through the first optical communication link 1290 to the first communication transponder 1282.

Figure 80B:
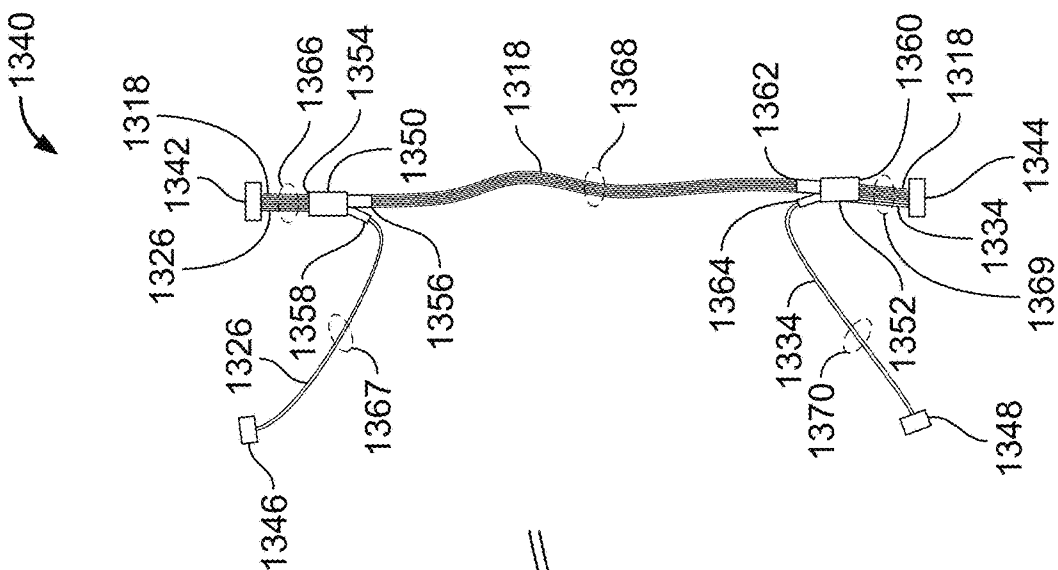
FIG. 80B is a diagram of an example of an optical cable assembly used in the optical communication system of FIG. 80A.
Figure 80A:
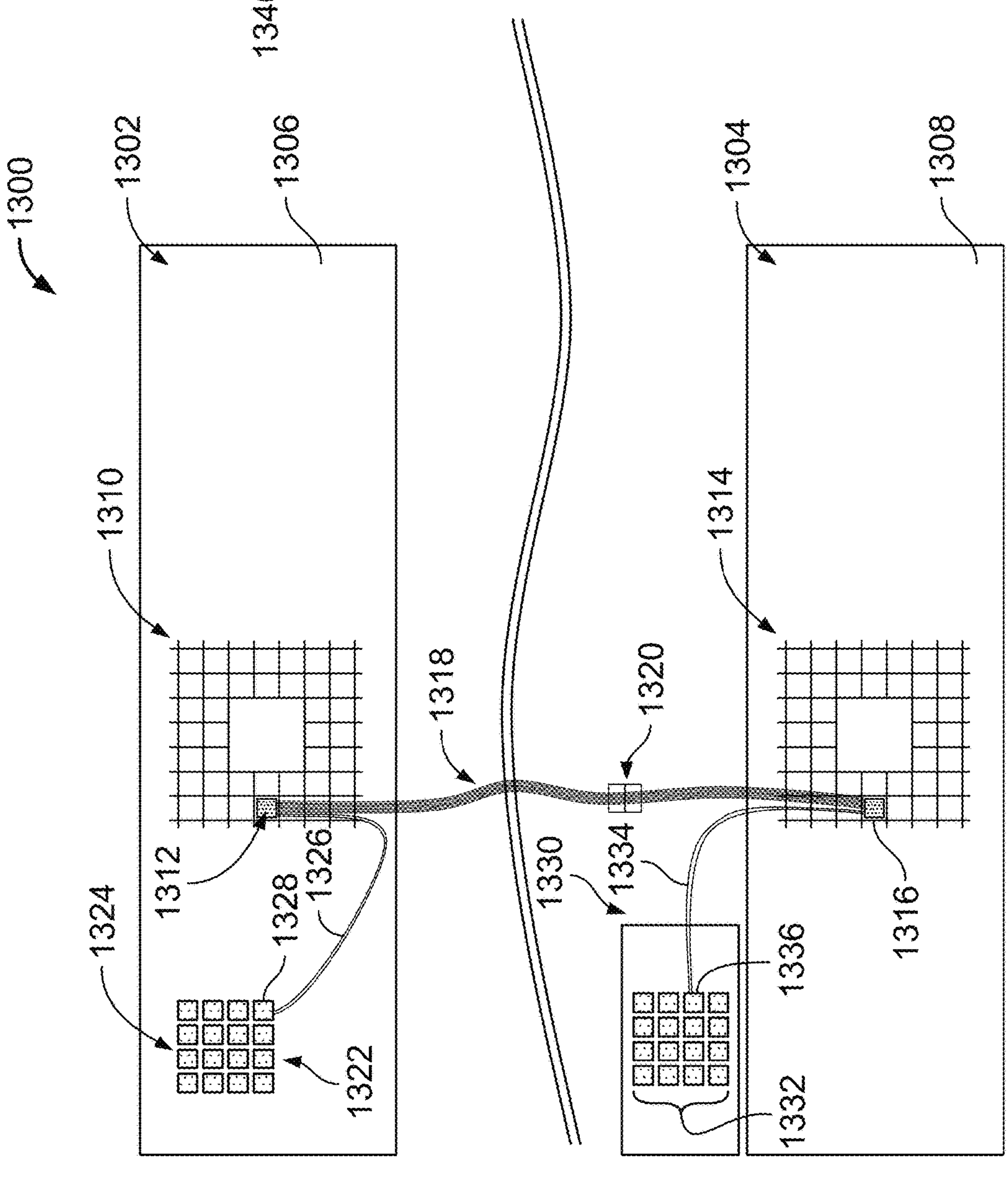
FIG. 80A is a diagram of an example of an optical communication system.

FIG. 80A is a diagram of an example of an optical communication system 1300 that includes a first switch box 1302 and a second switch box 1304. Each of the switch boxes 1302, 1304 can include one or more data processors, such as network switches. The first and second switch boxes 1302, 1304 can be separated by a distance greater than, e.g., 1 foot, 3 feet, 10 feet, 100 feet, or 1000 feet. The figure shows a diagram of a front panel 1306 of the first switch box 1302 and a front panel 1308 of the second switch box 1304. In this example, the first switch box 1302 includes a vertical ASIC mount grid structure 1310, similar to the grid structure 870 of FIG. 43. A co-packaged optical module 1312 is attached to a receptor of the grid structure 1310. The second switch box 1304 includes a vertical ASIC mount grid structure 1314, similar to the grid structure 870 of FIG. 43. A co-packaged optical module 1316 is attached to a receptor of the grid structure 1314. The first co-packaged optical module 1312 communicates with the second co-packaged optical module 1316 through an optical fiber bundle 1318 that includes multiple optical fibers. Optional fiber connectors 1320 can be used along the optical fiber bundle 1318, in which shorter sections of optical fiber bundles are connected by the fiber connectors 1320.

In some implementations, each co-packaged optical module (e.g., 1312, 1316) includes a photonic integrated circuit configured to convert input optical signals to input electrical signals that are provided to a data processor, and convert output electrical signals from the data processor to output optical signals. The co-packaged optical module can include an electronic integrated circuit configured to process the input electrical signals from the photonic integrated circuit before the input electrical signals are transmitted to the data processor, and to process the output electrical signals from the data processor before the output electrical signals are transmitted to the photonic integrated circuit. In some implementations, the electronic integrated circuit can include a plurality of serializers/deserializers configured to process the input electrical signals from the photonic integrated circuit, and to process the output electrical signals transmitted to the photonic integrated circuit. The electronic integrated circuit can include a first serializers/deserializers module having multiple serializer units and deserializer units, in which the first serializers/deserializers module is configured to generate a plurality of sets of first parallel electrical signals based on a plurality of first serial electrical signals provided by the photonic integrated circuit, and condition the electrical signals, in which each set of first parallel electrical signals is generated based on a corresponding first serial electrical signal. The electronic integrated circuit can include a second serializers/deserializers module having multiple serializer units and deserializer units, in which the second serializers/deserializers module is configured to generate a plurality of second serial electrical signals based on the plurality of sets of first parallel electrical signals, and each second serial electrical signal is generated based on a corresponding set of first parallel electrical signals. The plurality of second serial electrical signals can be transmitted toward the data processor.

The first switch box 1302 includes an external optical power supply 1322 (i.e., external to the co-packaged optical module) that provides optical power supply light through an optical connector array 1324. In this example, the optical power supply 1322 is located internal of the housing of the switch box 1302. Optical fibers 1326 are optically coupled to an optical connector 1328 (of the optical connector array 1324) and the co-packaged optical module 1312. The optical power supply 1322 sends optical power supply light through the optical connector 1328 and the optical fibers 1326 to the co-packaged optical module 1312. For example, the co-packaged optical module 1312 includes a photonic integrated circuit that modulates the power supply light based on data provided by a data processor to generate a modulated optical signal, and transmits the modulated optical signal to the co-packaged optical module 1316 through one of the optical fibers in the fiber bundle 1318.

In some examples, the optical power supply 1322 is configured to provide optical power supply light to the co-packaged optical module 1312 through multiple links that have built-in redundancy in case of malfunction in some of the optical power supply modules. For example, the co-packaged optical module 1312 can be designed to receive N channels of optical power supply light (e.g., N1 continuous wave light signals at the same or at different optical wavelengths, or N1 sequences of optical frame templates), N1 being a positive integer, from the optical power supply 1322. The optical power supply 1322 provides N1+M1 channels of optical power supply light to the co-packaged optical module 1312, in which M1 channels of optical power supply light are used for backup in case of failure of one or more of the N1 channels of optical power supply light, M1 being a positive integer.

The second switch box 1304 receives optical power supply light from a co-located optical power supply 1330, which is, e.g., external to the second switch box 1304 and located near the second switch box 1304, e.g., in the same rack as the second switch box 1304 in a data center. The optical power supply 1330 includes an array of optical connectors 1332. Optical fibers 1334 are optically coupled to an optical connector 1336 (of the optical connectors 1332) and the co-packaged optical module 1316. The optical power supply 1330 sends optical power supply light through the optical connector 1336 and the optical fibers 1334 to the co-packaged optical module 1316. For example, the co-packaged optical module 1316 includes a photonic integrated circuit that modulates the power supply light based on data provided by a data processor to generate a modulated optical signal, and transmits the modulated optical signal to the co-packaged optical module 1312 through one of the optical fibers in the fiber bundle 1318.

In some examples, the optical power supply 1330 is configured to provide optical power supply light to the co-packaged optical module 1316 through multiple links that have built-in redundancy in case of malfunction in some of the optical power supply modules. For example, the co-packaged optical module 1316 can be designed to receive N2 channels of optical power supply light (e.g., N2 continuous wave light signals at the same or at different optical wavelengths, or N2 sequences of optical frame templates), N2 being a positive integer, from the optical power supply 1322. The optical power supply 1322 provides N2+M2 channels of optical power supply light to the co-packaged optical module 1312, in which M2 channels of optical power supply light are used for backup in case of failure of one or more of the N2 channels of optical power supply light, M2 being a positive integer.

Figure 80C:
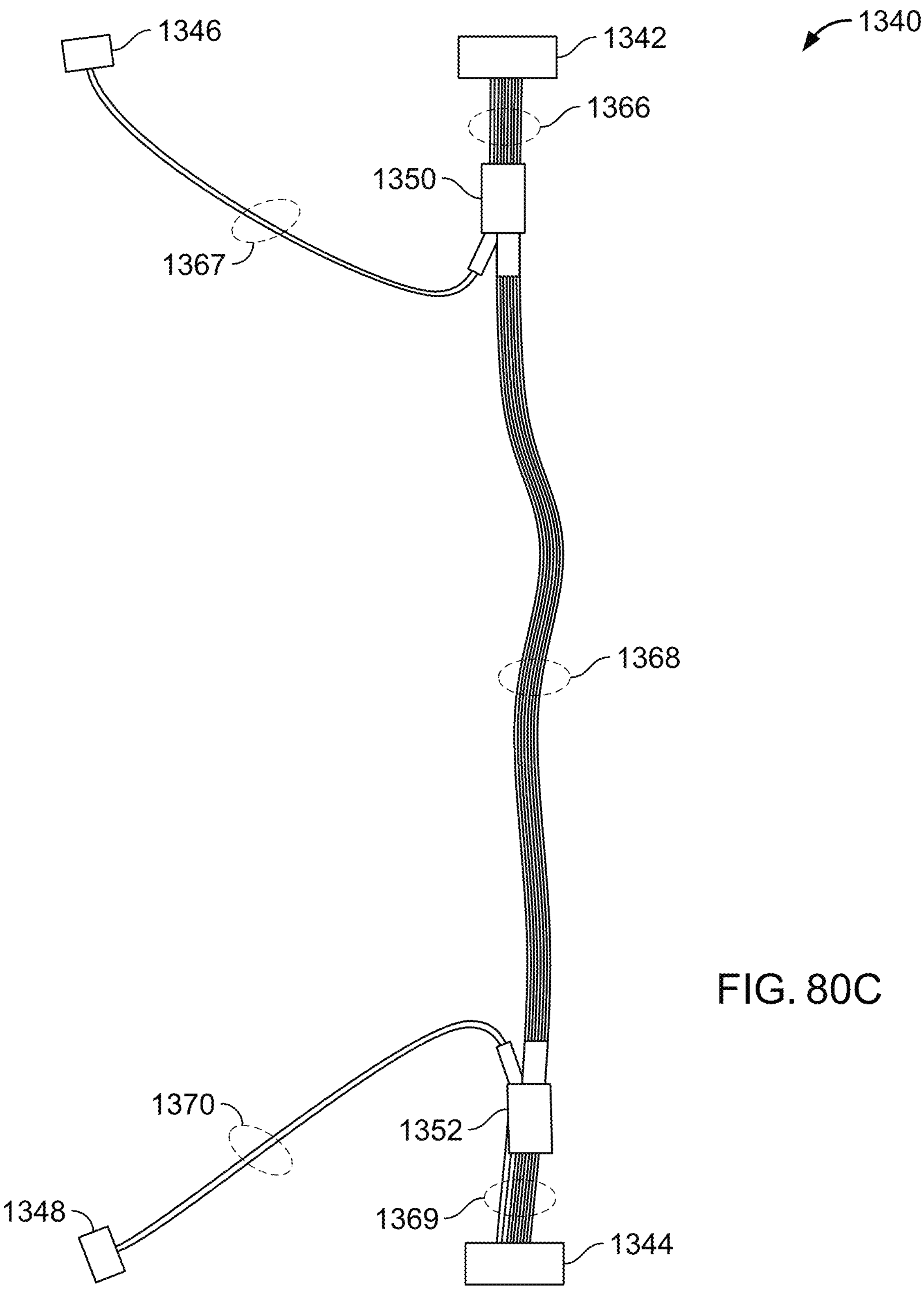
FIG. 80C is an enlarged diagram of the optical cable assembly of FIG. 80B.

FIG. 80B is a diagram of an example of an optical cable assembly 1340 that can be used to enable the first co-packaged optical module 1312 to receive optical power supply light from the first optical power supply 1322, enable the second co-packaged optical module 1316 to receive optical power supply light from the second optical power supply 1330, and enable the first co-packaged optical module 1312 to communicate with the second co-packaged optical module 1316. FIG. 80C is an enlarged diagram of the optical cable assembly 1340 without some of the reference numbers to enhance clarity of illustration.

The optical cable assembly 1340 includes a first optical fiber connector 1342, a second optical fiber connector 1344, a third optical fiber connector 1346, and a fourth optical fiber connector 1348. The first optical fiber connector 1342 is designed and configured to be optically coupled to the first co-packaged optical module 1312. For example, the first optical fiber connector 1342 can be configured to mate with a connector part of the first co-packaged optical module 1312, or a connector part that is optically coupled to the first co-packaged optical module 1312. The first, second, third, and fourth optical fiber connectors 1342, 1344, 1346, 1348 can comply with an industry standard that defines the specifications for optical fiber interconnection cables that transmit data and control signals, and optical power supply light.

Figure 89:
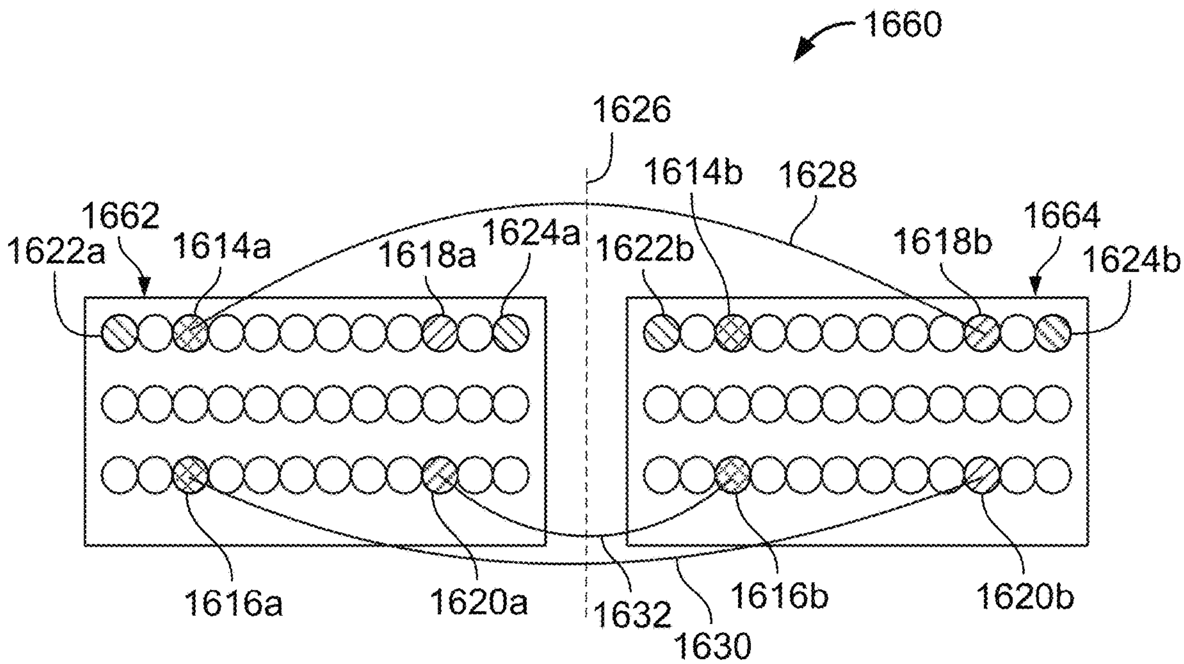
FIGS. 89 and 90 are diagrams of examples of fiber port mapping for optical fiber interconnection cables.
Figure 90:
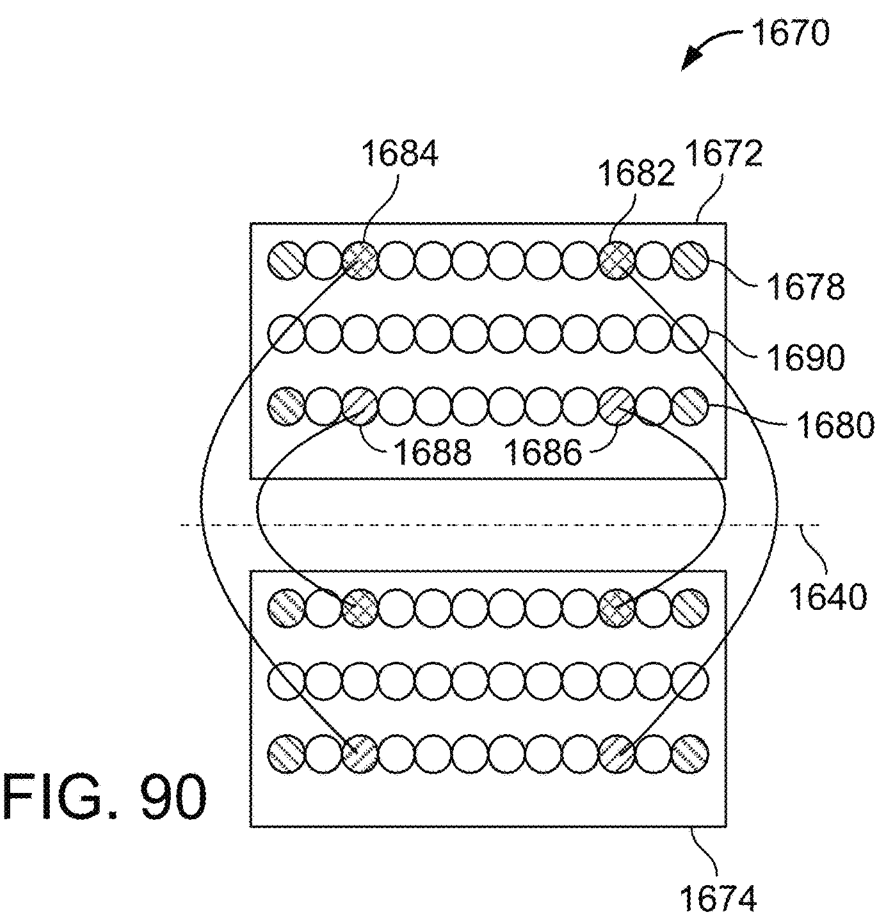

The first optical fiber connector 1342 includes optical power supply (PS) fiber ports, transmitter (TX) fiber ports, and receiver (RX) fiber ports. The optical power supply fiber ports provide optical power supply light to the co-packaged optical module 1312. The transmitter fiber ports allow the co-packaged optical module 1312 to transmit output optical signals (e.g., data and/or control signals), and the receiver fiber ports allow the co-packaged optical module 1312 to receive input optical signals (e.g., data and/or control signals). Examples of the arrangement of the optical power supply fiber ports, the transmitter ports, and the receiver ports in the first optical fiber connector 1342 are shown in FIGS. 80D, 89, and 90.

FIG. 80D shows an enlarged upper portion of the diagram of FIG. 80B, with the addition of an example of a mapping of fiber ports 1750 of the first optical fiber connector 1342 and a mapping of fiber ports 1752 of the third optical fiber connector 1346. The mapping of fiber ports 1750 shows the positions of the transmitter fiber ports (e.g., 1753), receiver fiber ports (e.g., 1755), and power supply fiber ports (e.g., 1751) of the first optical fiber connector 1342 when viewed in the direction 1754 into the first optical fiber connector 1342. The mapping of fiber ports 1752 shows the positions of the power supply fiber ports (e.g., 1757) of the third optical fiber connector 1346 when viewed in the direction 1756 into the third optical fiber connector 1346.

The second optical fiber connector 1344 is designed and configured to be optically coupled to the second co-packaged optical module 1316. The second optical fiber connector 1344 includes optical power supply fiber ports, transmitter fiber ports, and receiver fiber ports. The optical power supply fiber ports provide optical power supply light to the co-packaged optical module 1316. The transmitter fiber ports allow the co-packaged optical module 1316 to transmit output optical signals, and the receiver fiber ports allow the co-packaged optical module 1316 to receive input optical signals. Examples of the arrangement of the optical power supply fiber ports, the transmitter ports, and the receiver ports in the second optical fiber connector 1344 are shown in FIGS. 80E, 89, and 90.

FIG. 80E shows an enlarged lower portion of the diagram of FIG. 80B, with the addition of an example of a mapping of fiber ports 1760 of the second optical fiber connector 1344 and a mapping of fiber ports 1762 of the fourth optical fiber connector 1348. The mapping of fiber ports 1760 shows the positions of the transmitter fiber ports (e.g., 1763), receiver fiber ports (e.g., 1765), and power supply fiber ports (e.g., 1761) of the second optical fiber connector 1344 when viewed in the direction 1764 into the second optical fiber connector 1344. The mapping of fiber ports 1762 shows the positions of the power supply fiber ports (e.g., 1767) of the fourth optical fiber connector 1348 when viewed in the direction 1766 into the fourth fiber connector 1348.

The third optical connector 1346 is designed and configured to be optically coupled to the power supply 1322. The third optical connector 1346 includes optical power supply fiber ports (e.g., 1757) through which the power supply 1322 can output the optical power supply light. The fourth optical connector 1348 is designed and configured to be optically coupled to the power supply 1330. The fourth optical connector 1348 includes optical power supply fiber ports (e.g., 1762) through which the power supply 1322 can output the optical power supply light.

In some implementations, the optical power supply fiber ports, the transmitter fiber ports, and the receiver fiber ports in the first and second optical fiber connectors 1342, 1344 are designed to be independent of the communication devices, i.e., the first optical fiber connector 1342 can be optically coupled to the second switch box 1304, and the second optical fiber connector 1344 can be optically coupled to the first switch box 1302 without any re-mapping of the fiber ports. Similarly, the optical power supply fiber ports in the third and fourth optical fiber connectors 1346, 1348 are designed to be independent of the optical power supplies, i.e., if the first optical fiber connector 1342 is optically coupled to the second switch box 1304, the third optical fiber connector 1346 can be optically coupled to the second optical power supply 1330. If the second optical fiber connector 1344 is optically coupled to the first switch box 1302, the fourth optical fiber connector 1348 can be optically coupled to the first optical power supply 1322.

The optical cable assembly 1340 includes a first optical fiber guide module 1350 and a second optical fiber guide module 1352. The optical fiber guide module depending on context is also referred to as an optical fiber coupler or splitter because the optical fiber guide module combines multiple bundles of fibers into one bundle of fibers, or separates one bundle of fibers into multiple bundles of fibers. The first optical fiber guide module 1350 includes a first port 1354, a second port 1356, and a third port 1358. The second optical fiber guide module 1352 includes a first port 1360, a second port 1362, and a third port 1364. The fiber bundle 1318 extends from the first optical fiber connector 1342 to the second optical fiber connector 1344 through the first port 1354 and the second port 1356 of the first optical fiber guide module 1350 and the second port 1362 and the first port 1360 of the second optical fiber guide module 1352. The optical fibers 1326 extend from the third optical fiber connector 1346 to the first optical fiber connector 1342 through the third port 1358 and the first port 1354 of the first optical fiber guide module 1350. The optical fibers 1334 extend from the fourth optical fiber connector 1348 to the second optical fiber connector 1344 through the third port 1364 and the first port 1360 of the second optical fiber guide module 1352.

A portion (or section) of the optical fibers 1318 and a portion of the optical fibers 1326 extend from the first port 1354 of the first optical fiber guide module 1350 to the first optical fiber connector 1342. A portion of the optical fibers 1318 extend from the second port 1356 of the first optical fiber guide module 1350 to the second port 1362 of the second optical fiber guide module 1352, with optional optical connectors (e.g., 1320) along the paths of the optical fibers 1318. A portion of the optical fibers 1326 extend from the third port 1358 of the first optical fiber connector 1350 to the third optical fiber connector 1346. A portion of the optical fibers 1334 extend from the third port 1364 of the second optical fiber connector 1352 to the fourth optical fiber connector 1348.

The first optical fiber guide module 1350 is designed to restrict bending of the optical fibers such that the bending radius of any optical fiber in the first optical fiber guide module 1350 is greater than the minimum bending radius specified by the optical fiber manufacturer to avoid excess optical light loss or damage to the optical fiber. For example, the minimum bend radii can be 2 cm, 1 cm, 5 mm, or 2.5 mm. Other bend radii are also possible. For example, the fibers 1318 and the fibers 1326 extend outward from the first port 1354 along a first direction, the fibers 1318 extend outward from the second port 1356 along a second direction, and the fibers 1326 extend outward from the third port 1358 along a third direction. A first angle is between the first and second directions, a second angle is between the first and third directions, and a third angle is between the second and third directions. The first optical fiber guide module 1350 can be designed to limit the bending of optical fibers so that each of the first, second, and third angles is in a range from, e.g., 30° to 180°.

For example, the portion of the optical fibers 1318 and the portion of the optical fibers 1326 between the first optical fiber connector 1342 and the first port 1354 of the first optical fiber guide module 1350 can be surrounded and protected by a first common sheath 1366. The optical fibers 1318 between the second port 1356 of the first optical fiber guide module 1350 and the second port 1362 of the second optical fiber guide module 1352 can be surrounded and protected by a second common sheath 1368. The portion of the optical fibers 1318 and the portion of the optical fibers 1334 between the second optical fiber connector 1344 and the first port 1360 of the second optical fiber guide module 1352 can be surrounded and protected by a third common sheath 1369. The optical fibers 1326 between the third optical fiber connector 1346 and the third port 1358 of the first optical fiber guide module 1350 can be surrounded and protected by a fourth common sheath 1367. The optical fibers 1334 between the fourth optical fiber connector 1348 and the third port 1364 of the second optical fiber guide module 1352 can be surrounded and protected by a fifth common sheath 1370. Each of the common sheaths can be laterally flexible and/or laterally stretchable, as described in, e.g., U.S. patent application Ser. No. 16/822,103, now U.S. Pat. No. 11,194,109.

One or more optical cable assemblies 1340 (FIGS. 80B, 80C) and other optical cable assemblies (e.g., 1400 of FIG. 82B, 82C, 1490 of FIG. 84B, 84C) described in this document can be used to optically connect switch boxes that are configured differently compared to the switch boxes 1302, 1304 shown in FIG. 80A, in which the switch boxes receive optical power supply light from one or more external optical power supplies. For example, in some implementations, the optical cable assembly 1340 can be attached to a fiber-optic array connector mounted on the outside of the front panel of an optical switch, and another fiber-optic cable then connects the inside of the fiber connector to a co-packaged optical module that is mounted on a circuit board positioned inside the housing of the switch box. The co-packaged optical module (which includes, e.g., a photonic integrated circuit, optical-to-electrical converters, such as photodetectors, and electrical-to-optical converters, such as laser diodes) can be co-packaged with a switch ASIC and mounted on a circuit board that can be vertically or horizontally oriented. For example, in some implementations, the front panel is mounted on hinges and a vertical ASIC mount is recessed behind it. See the examples in FIGS. 77A, 77B, and 78. The optical cable assembly 1340 provides optical paths for communication between the switch boxes, and optical paths for transmitting power supply light from one or more external optical power supplies to the switch boxes. The switch boxes can have any of a variety of configurations regarding how the power supply light and the data and/or control signals from the optical fiber connectors are transmitted to or received from the photonic integrated circuits, and how the signals are transmitted between the photonic integrated circuits and the data processors.

One or more optical cable assemblies 1340 and other optical cable assemblies (e.g., 1400 of FIG. 82B, 82C, 1490 of FIG. 84B, 84C) described in this document can be used to optically connect computing devices other than switch boxes. For example, the computing devices can be server computers that provide a variety of services, such as cloud computing, database processing, audio/video hosting and streaming, electronic mail, data storage, web hosting, social network, supercomputing, scientific research computing, healthcare data processing, financial transaction processing, logistics management, weather forecast, or simulation, to list a few examples. The optical power light required by the optoelectronic modules of the computing devices can be provided using one or more external optical power supplies. For example, in some implementations, one or more external optical power supplies that are centrally managed can be configured to provide the optical power supply light for hundreds or thousands of server computers in a data center, and the one or more optical power supplies and the server computers can be optically connected using the optical cable assemblies (e.g., 1340, 1400, 1490) described in this document and variations of the optical cable assemblies using the principles described in this document.

Figure 81:
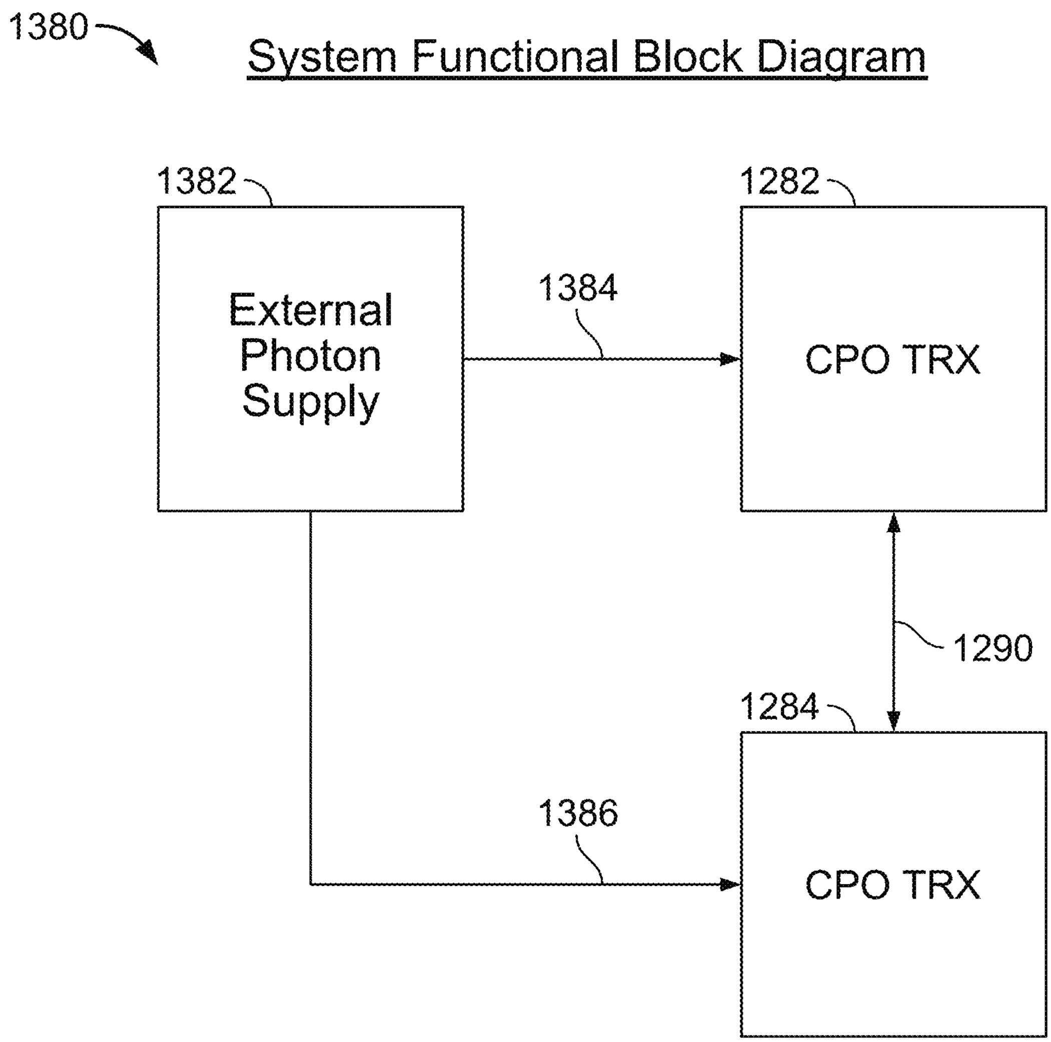
FIG. 81 is a block diagram of an example of an optical communication system.

FIG. 81 is a system functional block diagram of an example of an optical communication system 1380 that includes a first communication transponder 1282 and a second communication transponder 1284, similar to those in FIG. 79. The first communication transponder 1282 sends optical signals to, and receives optical signals from, the second communication transponder 1284 through a first optical communication link 1290. The optical communication system 1380 can be expanded to include additional communication transponders.

An external photon supply 1382 provides optical power supply light to the first communication transponder 1282 through a first optical power supply link 1384, and provides optical power supply light to the second communication transponder 1284 through a second optical power supply link 1386. In one example, the external photon supply 1382 provides continuous wave light to the first communication transponder 1282 and to the second communication transponder 1284. In one example, the continuous wave light can be at the same optical wavelength. In another example, the continuous wave light can be at different optical wavelengths. In yet another example, the external photon supply 1382 provides a first sequence of optical frame templates to the first communication transponder 1282, and provides a second sequence of optical frame templates to the second communication transponder 1284. Each of the optical frame templates can include a respective frame header and a respective frame body, and the frame body includes a respective optical pulse train. The first communication transponder 1282 receives the first sequence of optical frame templates from the external photon supply 1382, loads data into the respective frame bodies to convert the first sequence of optical frame templates into a first sequence of loaded optical frames that are transmitted through the first optical communication link 1290 to the second communication transponder 1284. Similarly, the second communication transponder 1284 receives the second sequence of optical frame templates from the external photon supply 1382, loads data into the respective frame bodies to convert the second sequence of optical frame templates into a second sequence of loaded optical frames that are transmitted through the first optical communication link 1290 to the first communication transponder 1282.

Figure 82B:
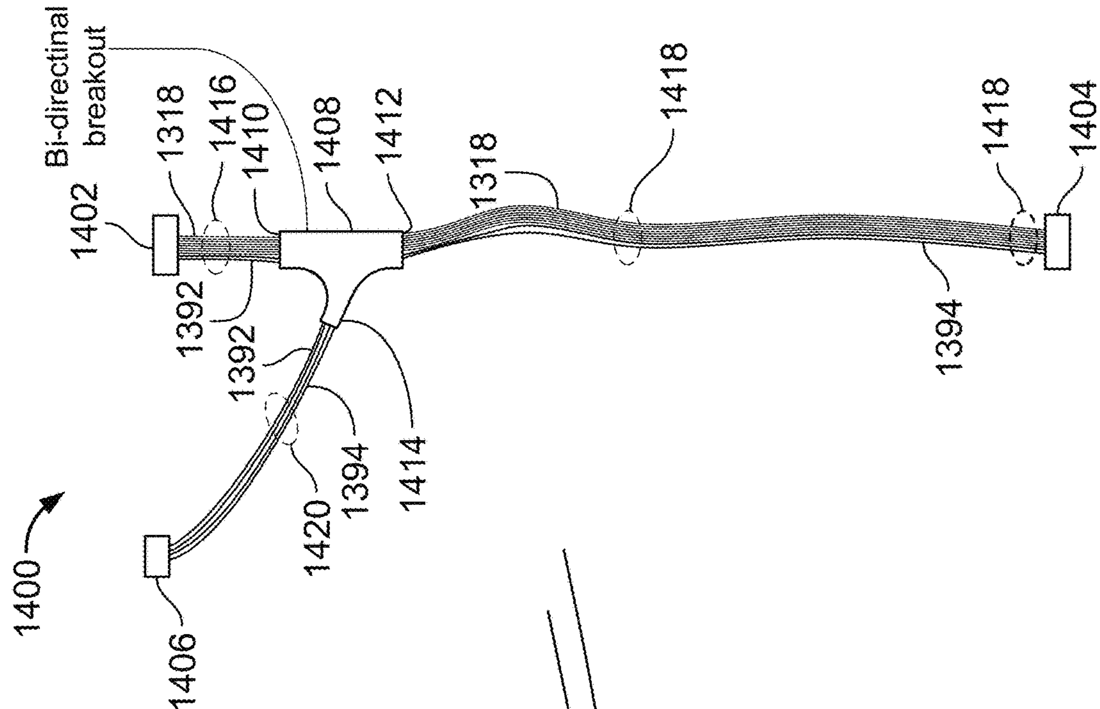
FIG. 82B is a diagram of an example of an optical cable assembly.
Figure 82A:
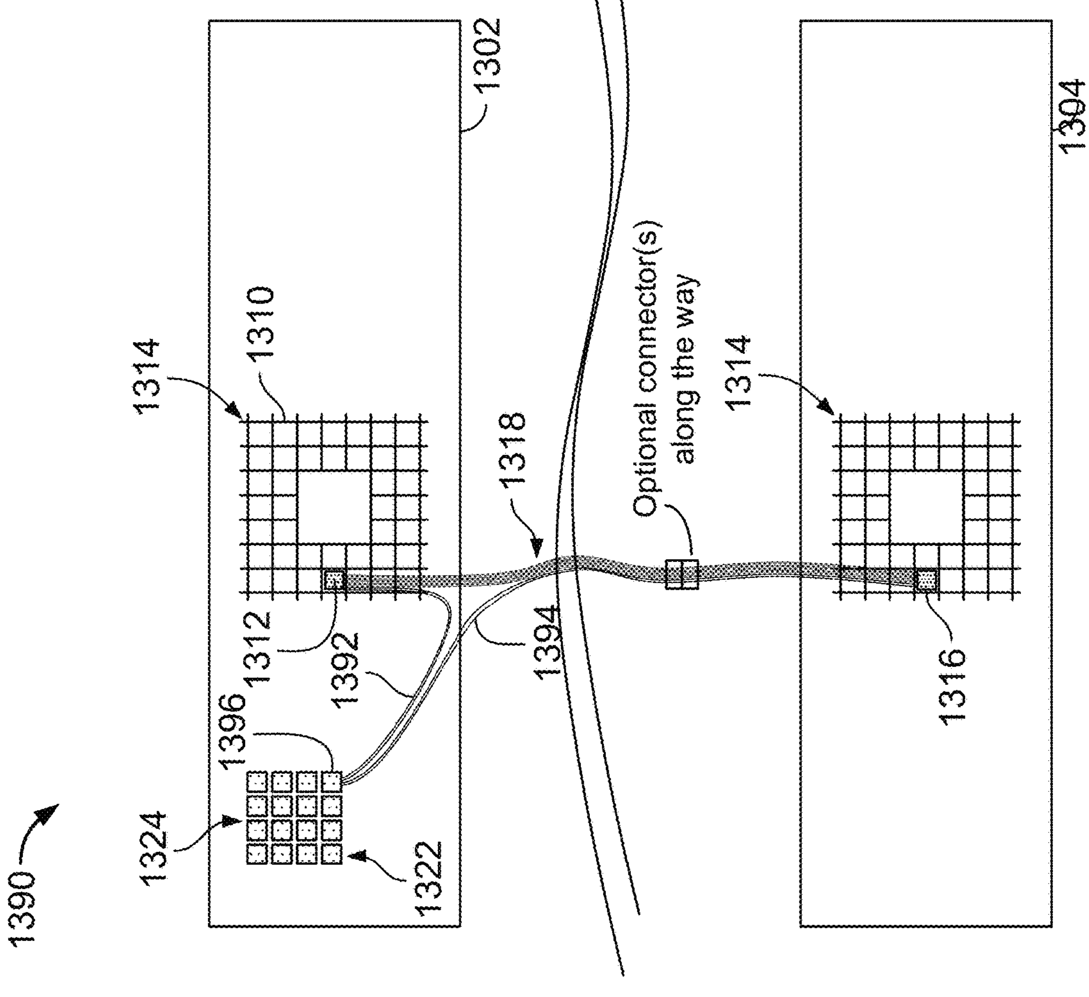
FIG. 82A is a diagram of an example of an optical communication system.

FIG. 82A is a diagram of an example of an optical communication system 1390 that includes a first switch box 1302 and a second switch box 1304, similar to those in FIG. 80A. The first switch box 1302 includes a vertical ASIC mount grid structure 1310, and a co-packaged optical module 1312 is attached to a receptor of the grid structure 1310. The second switch box 1304 includes a vertical ASIC mount grid structure 1314, and a co-packaged optical module 1316 is attached to a receptor of the grid structure 1314. The first co-packaged optical module 1312 communicates with the second co-packaged optical module 1316 through an optical fiber bundle 1318 that includes multiple optical fibers.

As discussed above in connection with FIGS. 80A to 80E, the first and second switch boxes 1302, 1304 can have other configurations. For example, horizontally mounted ASICs can be used. A fiber-optic array connector attached to a front panel can be used to optically connect the optical cable assembly 1340 to another fiber-optic cable that connects to a co-packaged optical module mounted on a circuit board inside the switch box. The front panel can be mounted on hinges and a vertical ASIC mount can be recessed behind it. The switch boxes can be replaced by other types of server computers.

In an example embodiment, the first switch box 1302 includes an external optical power supply 1322 that provides optical power supply light to both the co-packaged optical module 1312 in the first switch box 1302 and the co-packaged optical module 1316 in the second switch box 1304. In another example embodiment, the optical power supply can be located outside the switch box 1302 (cf. 1330, FIG. 80A). The optical power supply 1322 provides the optical power supply light through an optical connector array 1324. Optical fibers 1392 are optically coupled to an optical connector 1396 and the co-packaged optical module 1312. The optical power supply 1322 sends optical power supply light through the optical connector 1396 and the optical fibers 1392 to the co-packaged optical module 1312 in the first switch box 1302. Optical fibers 1394 are optically coupled to the optical connector 1396 and the co-packaged optical module 1316. The optical power supply 1322 sends optical power supply light through the optical connector 1396 and the optical fibers 1394 to the co-packaged optical module 1316 in the second switch box 1304.

Figure 82C:
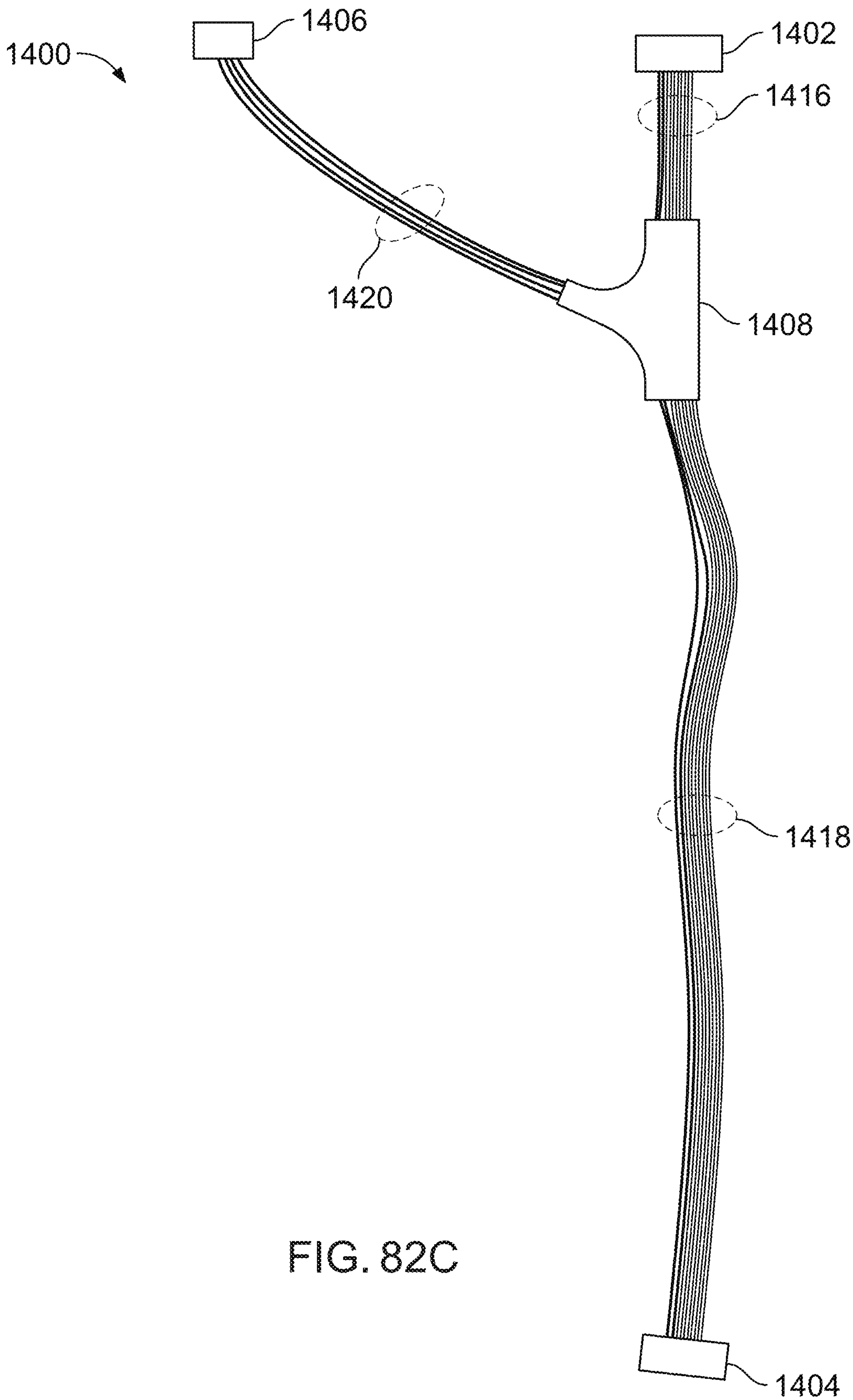
FIG. 82C is an enlarged diagram of the optical cable assembly of FIG. 82B.

FIG. 82B shows an example of an optical cable assembly 1400 that can be used to enable the first co-packaged optical module 1312 to receive optical power supply light from the optical power supply 1322, enable the second co-packaged optical module 1316 to receive optical power supply light from the optical power supply 1322, and enable the first co-packaged optical module 1312 to communicate with the second co-packaged optical module 1316. FIG. 82C is an enlarged diagram of the optical cable assembly 1400 without some of the reference numbers to enhance clarity of illustration.

The optical cable assembly 1400 includes a first optical fiber connector 1402, a second optical fiber connector 1404, and a third optical fiber connector 1406. The first optical fiber connector 1402 is similar to the first optical fiber connector 1342 of FIGS. 80B, 80C, 80D, and is designed and configured to be optically coupled to the first co-packaged optical module 1312. The second optical fiber connector 1404 is similar to the second optical fiber connector 1344 of FIGS. 80B, 80C, 80E, and is designed and configured to be optically coupled to the second co-packaged optical module 1316. The third optical connector 1406 is designed and configured to be optically coupled to the power supply 1322. The third optical connector 1406 includes first optical power supply fiber ports (e.g., 1770, FIG. 82D) and second optical power supply fiber ports (e.g., 1772). The power supply 1322 outputs optical power supply light through the first optical power supply fiber ports to the optical fibers 1392, and outputs optical power supply light through the second optical power supply fiber ports to the optical fibers 1394. The first, second, and third optical fiber connectors 1402, 1404, 1406 can comply with an industry standard that defines the specifications for optical fiber interconnection cables that transmit data and control signals, and optical power supply light.

Figure 82D:
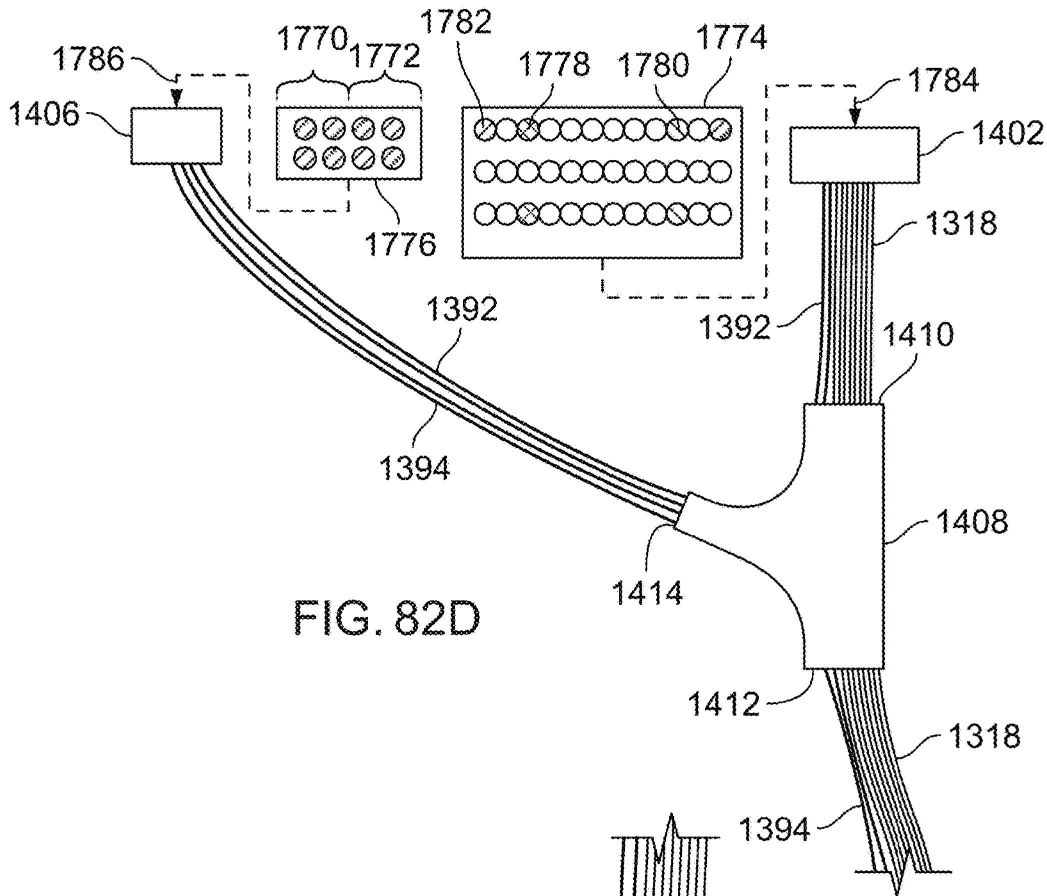
FIG. 82D is an enlarged diagram of the upper portion of the optical cable assembly of FIG. 82B.

FIG. 82D shows an enlarged upper portion of the diagram of FIG. 82B, with the addition of an example of a mapping of fiber ports 1774 of the first optical fiber connector 1402 and a mapping of fiber ports 1776 of the third optical fiber connector 1406. The mapping of fiber ports 1774 shows the positions of the transmitter fiber ports (e.g., 1778), receiver fiber ports (e.g., 1780), and power supply fiber ports (e.g., 1782) of the first optical fiber connector 1402 when viewed in the direction 1784 into the first optical fiber connector 1402. The mapping of fiber ports 1776 shows the positions of the power supply fiber ports (e.g., 1770, 1772) of the third optical fiber connector 1406 when viewed in the direction 1786 into the third optical fiber connector 1406. In this example, the third optical fiber connector 1406 includes 8 optical power supply fiber ports.

In some examples, optical connector array 1324 of the optical power supply 1322 can include a first type of optical connectors that accept optical fiber connectors having 4 optical power supply fiber ports, as in the example of FIG. 80D, and a second type of optical connectors that accept optical fiber connectors having 8 optical power supply fiber ports, as in the example of FIG. 82D. In some examples, if the optical connector array 1324 of the optical power supply 1322 only accepts optical fiber connectors having 4 optical power supply fiber ports, then a converter cable can be used to convert the third optical fiber connector 1406 of FIG. 82D to two optical fiber connectors, each having 4 optical power supply fiber ports, that is compatible with the optical connector array 1324.

Figure 82E:
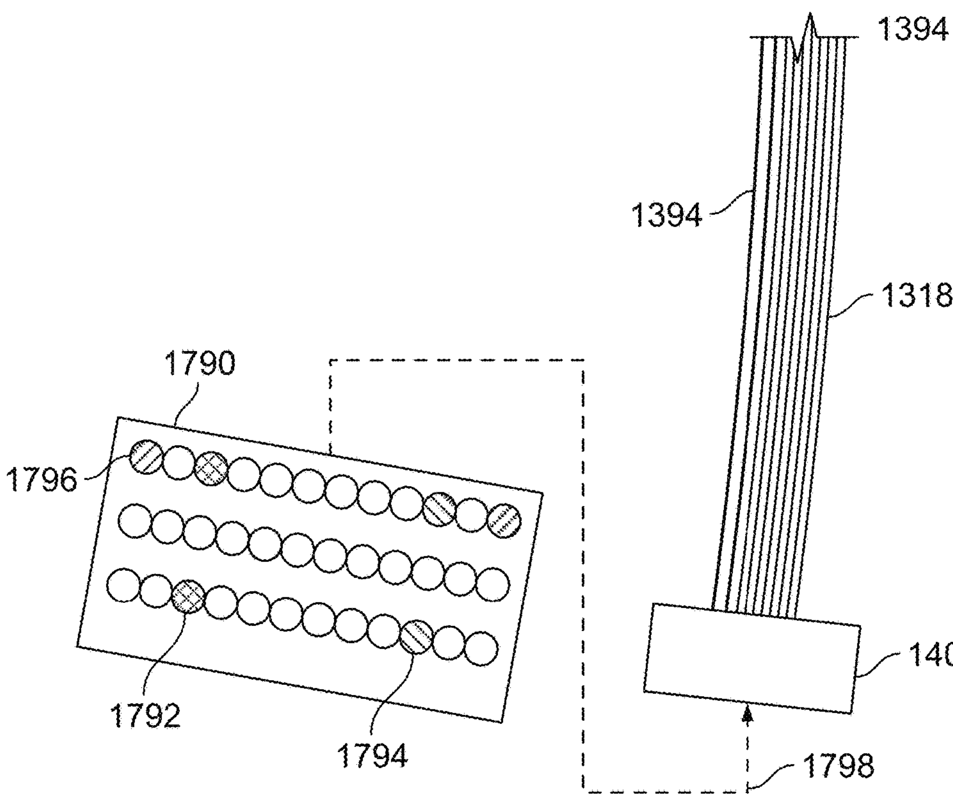
FIG. 82E is an enlarged diagram of the lower portion of the optical cable assembly of FIG. 82B.

FIG. 82E shows an enlarged lower portion of the diagram of FIG. 82B, with the addition of an example of a mapping of fiber ports 1790 of the second optical fiber connector 1404. The mapping of fiber ports 1790 shows the positions of the transmitter fiber ports (e.g., 1792), receiver fiber ports (e.g., 1794), and power supply fiber ports (e.g., 1796) of the second optical fiber connector 1404 when viewed in the direction 1798 into the second optical fiber connector 1404.

The port mappings of the optical fiber connectors shown in FIGS. 80D, 80E, 82D, and 82E are merely examples. Each optical fiber connector can include a greater number or a smaller number of transmitter fiber ports, a greater number or a smaller number of receiver fiber ports, and a greater number or a smaller number of optical power supply fiber ports, as compared to those shown in FIGS. 80D, 80E, 82D, and 82E. The arrangement of the relative positions of the transmitter, receiver, and optical power supply fiber ports can also be different from those shown in FIGS. 80D, 80E, 82D, and 82E.

The optical cable assembly 1400 includes an optical fiber guide module 1408, which includes a first port 1410, a second port 1412, and a third port 1414. The optical fiber guide module 1408 depending on context is also referred as an optical fiber coupler (for combining multiple bundles of optical fibers into one bundle of optical fiber) or an optical fiber splitter (for separating a bundle of optical fibers into multiple bundles of optical fibers). The fiber bundle 1318 extends from the first optical fiber connector 1402 to the second optical fiber connector 1404 through the first port 1410 and the second port 1412 of the optical fiber guide module 1408. The optical fibers 1392 extend from the third optical fiber connector 1406 to the first optical fiber connector 1402 through the third port 1414 and the first port 1410 of the optical fiber guide module 1408. The optical fibers 1394 extend from the third optical fiber connector 1406 to the second optical fiber connector 1404 through the third port 1414 and the second port 1412 of the optical fiber guide module 1408.

A portion of the optical fibers 1318 and a portion of the optical fibers 1392 extend from the first port 1410 of the optical fiber guide module 1408 to the first optical fiber connector 1402. A portion of the optical fibers 1318 and a portion of the optical fibers 1394 extend from the second port 1412 of the optical fiber guide module 1408 to the second optical fiber connector 1404. A portion of the optical fibers 1394 extend from the third port 1414 of the optical fiber connector 1408 to the third optical fiber connector 1406.

The optical fiber guide module 1408 is designed to restrict bending of the optical fibers such that the radius of curvature of any optical fiber in the optical fiber guide module 1408 is greater than the minimum radius of curvature specified by the optical fiber manufacturer to avoid excess optical light loss or damage to the optical fiber. For example, the optical fibers 1318 and the optical fibers 1392 extend outward from the first port 1410 along a first direction, the optical fibers 1318 and the optical fibers 1394 extend outward from the second port 1412 along a second direction, and the optical fibers 1392 and the optical fibers 1394 extend outward from the third port 1414 along a third direction. A first angle is between the first and second directions, a second angle is between the first and third directions, and a third angle is between the second and third directions. The optical fiber guide module 1408 is designed to limit the bending of optical fibers so that each of the first, second, and third angles is in a range from, e.g., 30° to 180°.

For example, the portion of the optical fibers 1318 and the portion of the optical fibers 1392 between the first optical fiber connector 1402 and the first port 1410 of the optical fiber guide module 1408 can be surrounded and protected by a first common sheath 1416. The optical fibers 1318 and the optical fibers 1394 between the second optical fiber connector 1404 and the second port 1412 of the optical fiber guide module 1408 can be surrounded and protected by a second common sheath 1418. The optical fibers 1392 and the optical fibers 1394 between the third optical fiber connector 1406 and the third port 1414 of the optical fiber guide module 1408 can be surrounded and protected by a third common sheath 1420. Each of the common sheaths can be laterally flexible and/or laterally stretchable.

Figure 83:
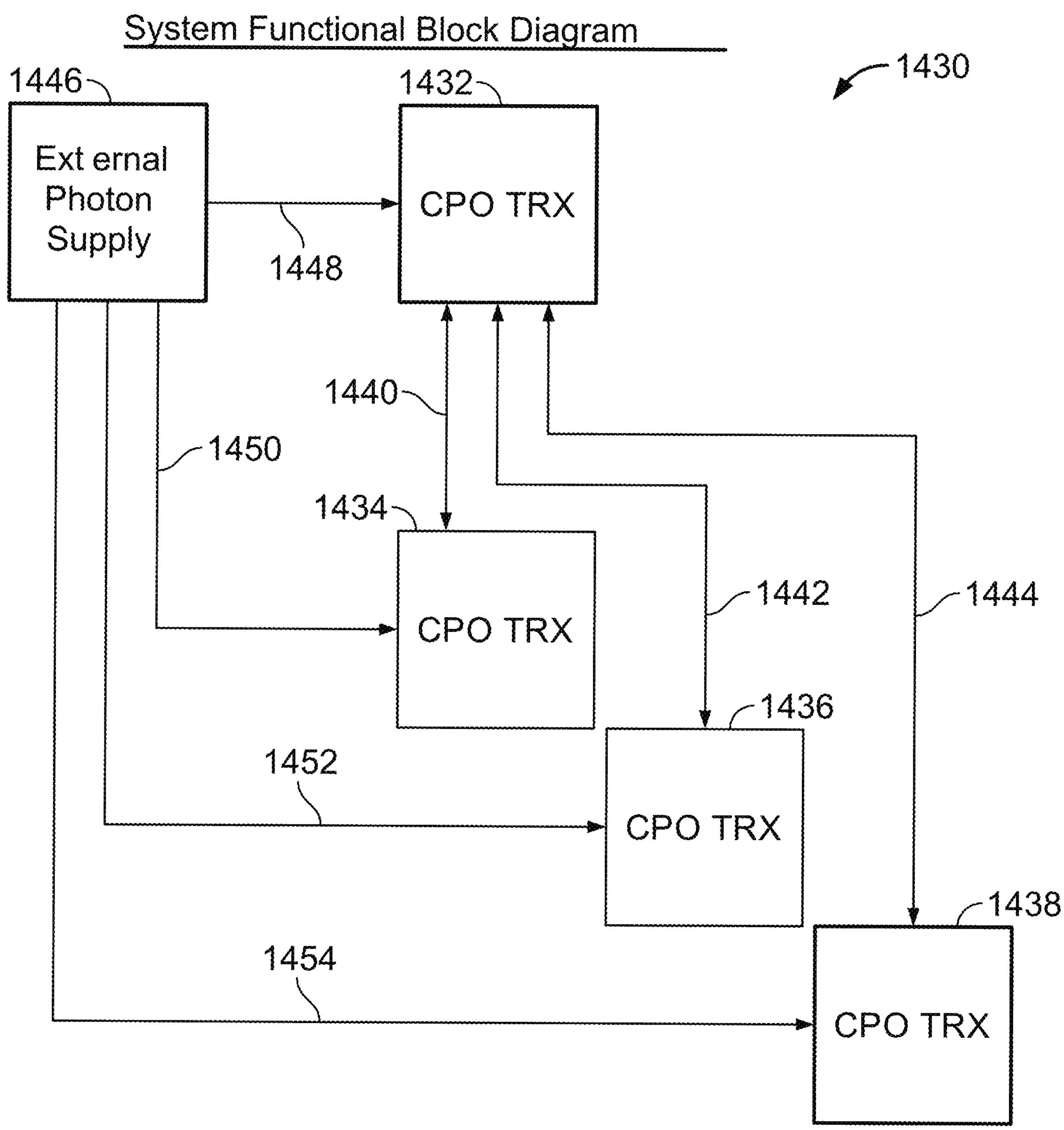
FIG. 83 is a block diagram of an example of an optical communication system.

FIG. 83 is a system functional block diagram of an example of an optical communication system 1430 that includes a first communication transponder 1432, a second communication transponder 1434, a third communication transponder 1436, and a fourth communication transponder 1438. Each of the communication transponders 1432, 1434, 1436, 1438 can be similar to the communication transponders 1282, 1284 of FIG. 79. The first communication transponder 1432 communicates with the second communication transponder 1434 through a first optical link 1440. The first communication transponder 1432 communicates with the third communication transponder 1436 through a second optical link 1442. The first communication transponder 1432 communicates with the fourth communication transponder 1438 through a third optical link 1444.

An external photon supply 1446 provides optical power supply light to the first communication transponder 1432 through a first optical power supply link 1448, provides optical power supply light to the second communication transponder 1434 through a second optical power supply link 1450, provides optical power supply light to the third communication transponder 1436 through a third optical power supply link 1452, and provides optical power supply light to the fourth communication transponder 1438 through a fourth optical power supply link 1454.

Figure 84B:
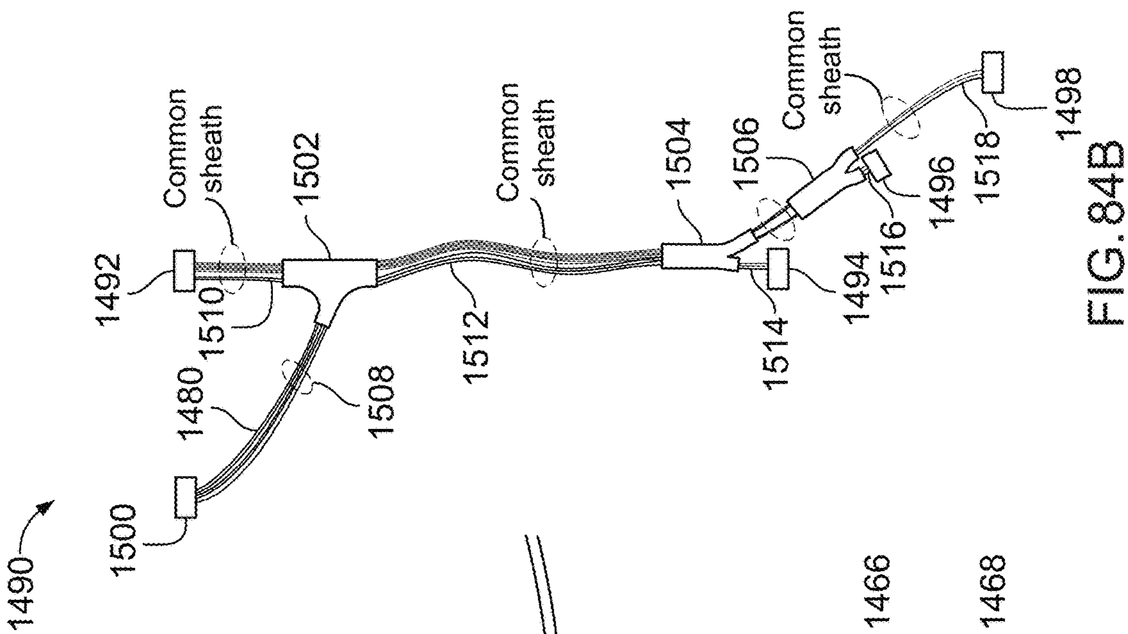
FIG. 84B is a diagram of an example of an optical cable assembly.
Figure 84A:
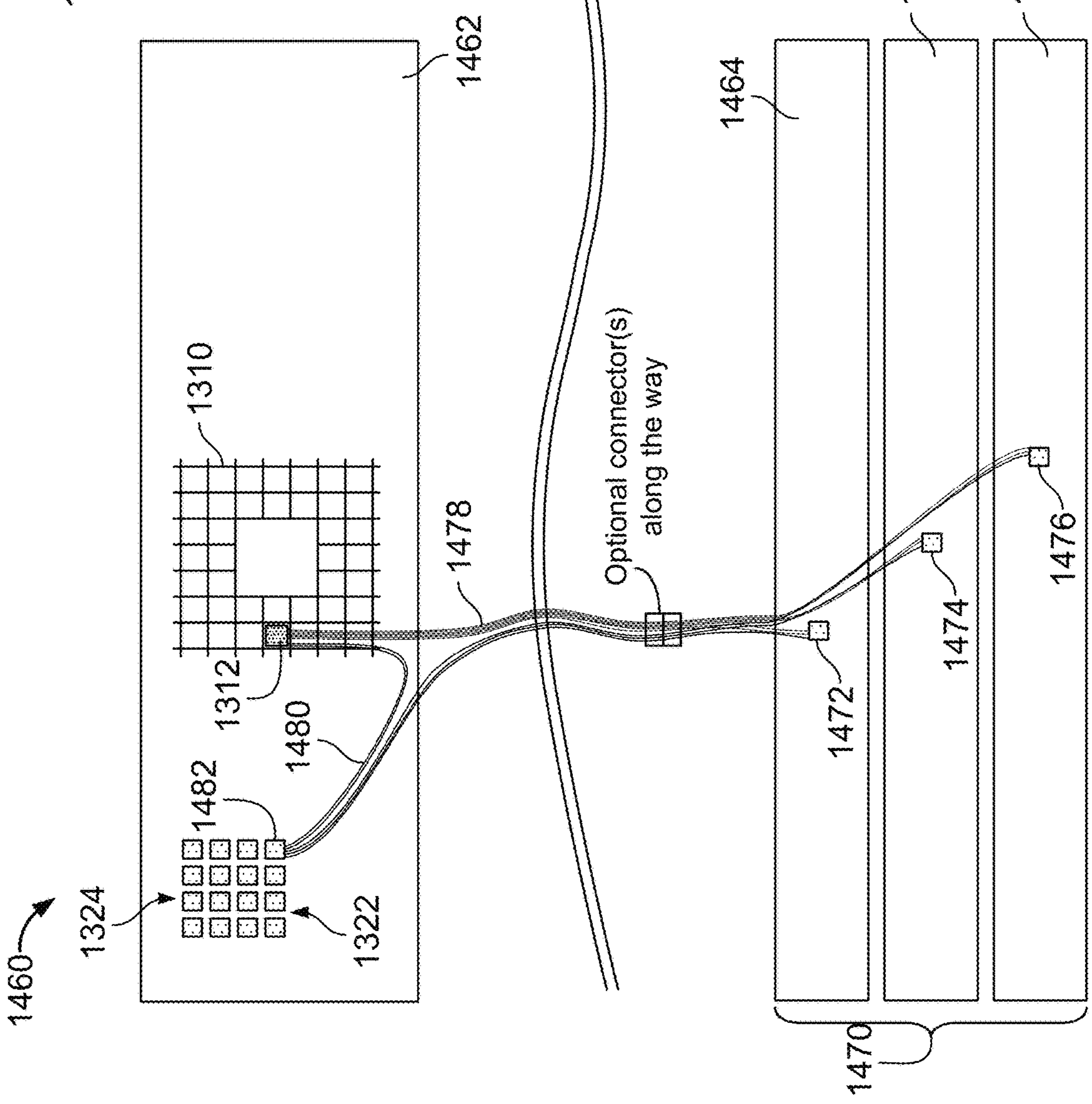
FIG. 84A is a diagram of an example of an optical communication system.

FIG. 84A is a diagram of an example of an optical communication system 1460 that includes a first switch box 1462 and a remote server array 1470 that includes a second switch box 1464, a third switch box 1466, and a fourth switch box 1468. The first switch box 1462 includes a vertical ASIC mount grid structure 1310, and a co-packaged optical module 1312 is attached to a receptor of the grid structure 1310. The second switch box 1464 includes a co-packaged optical module 1472, the third switch box 1466 includes a co-packaged optical module 1474, and the third switch box 1468 includes a co-packaged optical module 1476. The first co-packaged optical module 1312 communicates with the co-packaged optical modules 1472, 1474, 1476 through an optical fiber bundle 1478 that later branches out to the co-packaged optical modules 1472, 1474, 1476.

In one example embodiment, the first switch box 1462 includes an external optical power supply 1322 that provides optical power supply light through an optical connector array 1324. In another example embodiment, the optical power supply can be located external to switch box 1462 (cf. 1330, FIG. 80A). Optical fibers 1480 are optically coupled to an optical connector 1482, and the optical power supply 1322 sends optical power supply light through the optical connector 1482 and the optical fibers 1480 to the co-packaged optical modules 1312, 1472, 1474, 1476.

Figure 84C:
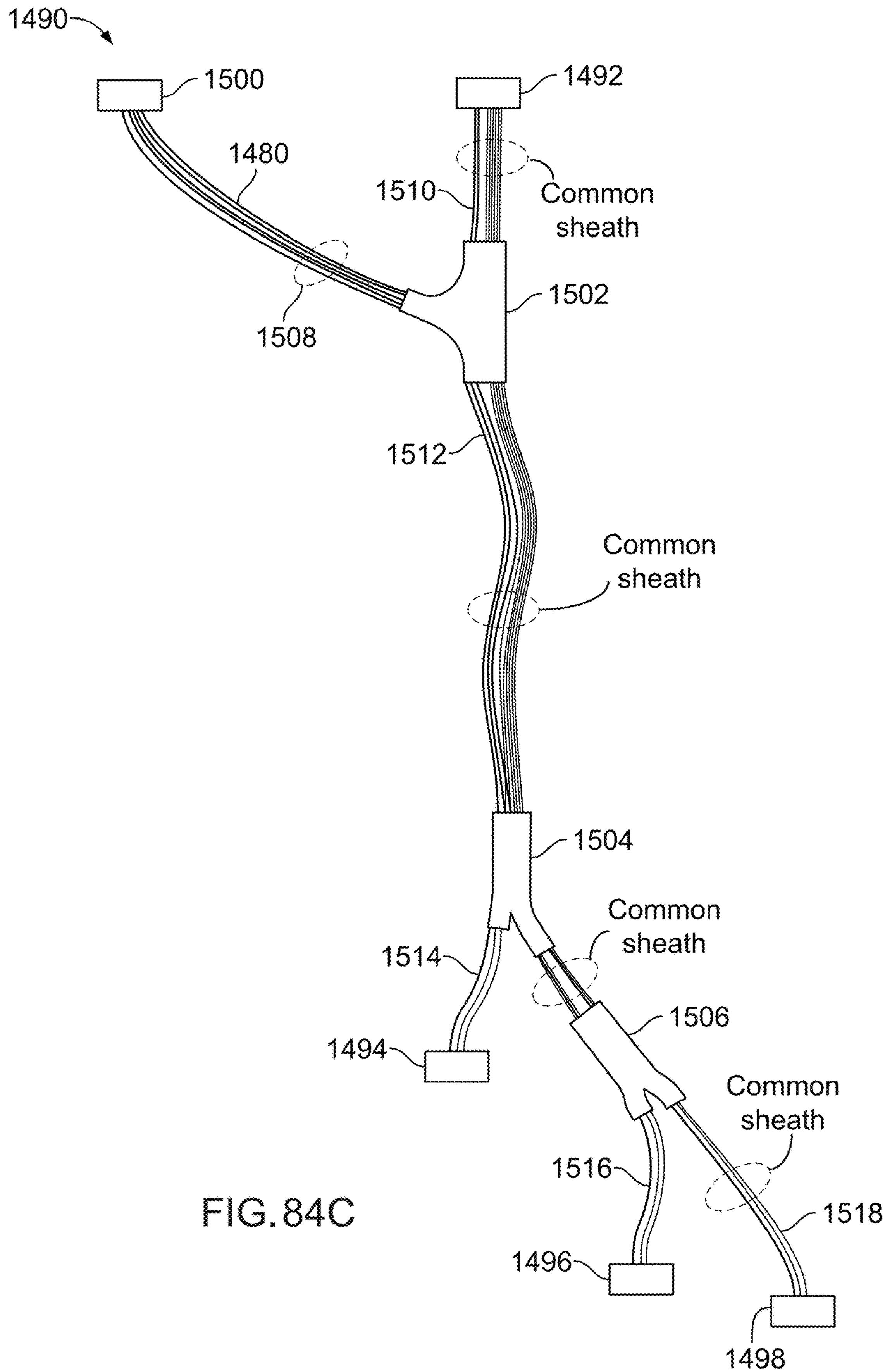
FIG. 84C is an enlarged diagram of the optical cable assembly of FIG. 84B.

FIG. 84B shows an example of an optical cable assembly 1490 that can be used to enable the optical power supply 1322 to provide optical power supply light to the co-packaged optical modules 1312, 1472, 1474, 1476, and enable the co-packaged optical module 1312 to communicate with the co-packaged optical modules 1472, 1474, 1476. The optical cable assembly 1490 includes a first optical fiber connector 1492, a second optical fiber connector 1494, a third optical fiber connector 1496, a fourth optical fiber connector 1498, and a fifth optical fiber connector 1500. The first optical fiber connector 1492 is configured to be optically coupled to the co-packaged optical module 1312. The second optical fiber connector 1494 is configured to be optically coupled to the co-packaged optical module 1472. The third optical fiber connector 1496 is configured to be optically coupled to the co-packaged optical module 1474. The fourth optical fiber connector 1498 is configured to be optically coupled to the co-packaged optical module 1476. The fifth optical fiber connector 1500 is configured to be optically coupled to the optical power supply 1322. FIG. 84C is an enlarged diagram of the optical cable assembly 1490.

Optical fibers that are optically coupled to the optical fiber connectors 1500 and 1492 enable the optical power supply 1322 to provide the optical power supply light to the co-packaged optical module 1312. Optical fibers that are optically coupled to the optical fiber connectors 1500 and 1494 enable the optical power supply 1322 to provide the optical power supply light to the co-packaged optical module 1472. Optical fibers that are optically coupled to the optical fiber connectors 1500 and 1496 enable the optical power supply 1322 to provide the optical power supply light to the co-packaged optical module 1474. Optical fibers that are optically coupled to the optical fiber connectors 1500 and 1498 enable the optical power supply 1322 to provide the optical power supply light to the co-packaged optical module 1476.

Optical fiber guide modules 1502, 1504, 1506, and common sheaths are provided to organize the optical fibers so that they can be easily deployed and managed. The optical fiber guide module 1502 is similar to the optical fiber guide module 1408 of FIG. 82B. The optical fiber guide modules 1504, 1506 are similar to the optical fiber guide module 1350 of FIG. 80B. The common sheaths gather the optical fibers in a bundle so that they can be more easily handled, and the optical fiber guide modules guide the optical fibers so that they extend in various directions toward the devices that need to be optically coupled by the optical cable assembly 1490. The optical fiber guide modules restrict bending of the optical fibers such that the bending radiuses are greater than minimum values specified by the optical fiber manufacturers to prevent excess optical light loss or damage to the optical fibers.

The optical fibers 1480 that extend from the include optical fibers that extend from the optical 1482 are surrounded and protected by a common sheath 1508. At the optical fiber guide module 1502, the optical fibers 1480 separate into a first group of optical fibers 1510 and a second group of optical fibers 1512. The first group of optical fibers 1510 extend to the first optical fiber connector 1492. The second group of optical fibers 1512 extend toward the optical fiber guide modules 1504, 1506, which together function as a 1:3 splitter that separates the optical fibers 1512 into a third group of optical fibers 1514, a fourth group of optical fibers 1516, and a fifth group of optical fibers 1518. The group of optical fibers 1514 extend to the optical fiber connector 1494, the group of optical fibers 1516 extend to the optical fiber connector 1496, and the group of optical fibers 1518 extend to the optical fiber connector 1498. In some examples, instead of using two 1:2 split optical fiber guide modules 1504, 1506, it is also possible to use a 1:3 split optical fiber guide module that has four ports, e.g., one input port and three output ports. In general, separating the optical fibers in a 1:N split (N being an integer greater than 2) can occur in one step or multiple steps.

Figure 85:
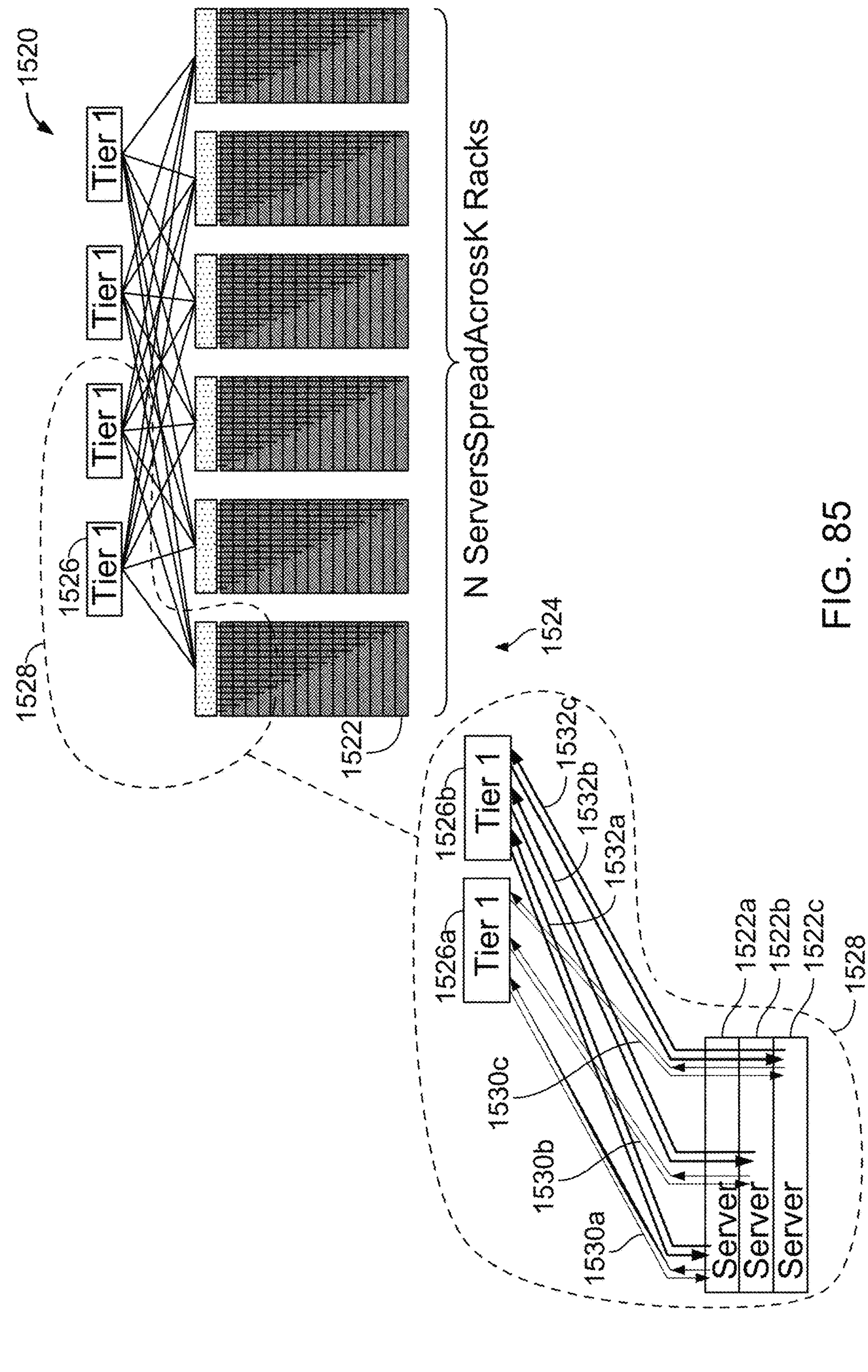
FIGS. 85 to 87B are diagrams of examples of data processing systems.

FIG. 85 is a diagram of an example of a data processing system (e.g., data center) 1520 that includes N servers 1522 spread across K racks 1524. In this example, there are 6 racks 1524, and each rack 1524 includes 15 servers 1522. Each server 1522 directly communicates with a tier 1 switch 1526. The left portion of the figure shows an enlarged view of a portion 1528 of the system 1520. A server 1522*a* directly communicates with a tier 1 switch 1526*a* through a communication link 1530*a*. Similarly, servers 1522*b*, 1522*c* directly communicate with the tier 1 switch 1526*a* through communication links 1530*b*, 1530*c*, respectively. The server 1522*a* directly communicates with a tier 1 switch 1526*b* through a communication link 1532*a*. Similarly, servers 1522*b*, 1522*c* directly communicate with the tier 1 switch 1526*b* through communication links 1532*b*, 1532*c*, respectively. Each communication link can include a pair of optical fibers to allow bi-directional communication. The system 1520 bypasses the conventional top-of-rack switch and can have the advantage of higher data throughput. The system 1520 includes a point-to-point connection between every server 1522 and every tier 1 switch 1526. In this example, there are 4 tier 1 switches 1526, and 4 fiber pairs are used per server 1522 for communicating with the tier 1 switches 1526. Each tier-1 switch 1526 is connected to N servers, so there are N fiber pairs connected to each tier-1 switch 1526.

Figure 86:
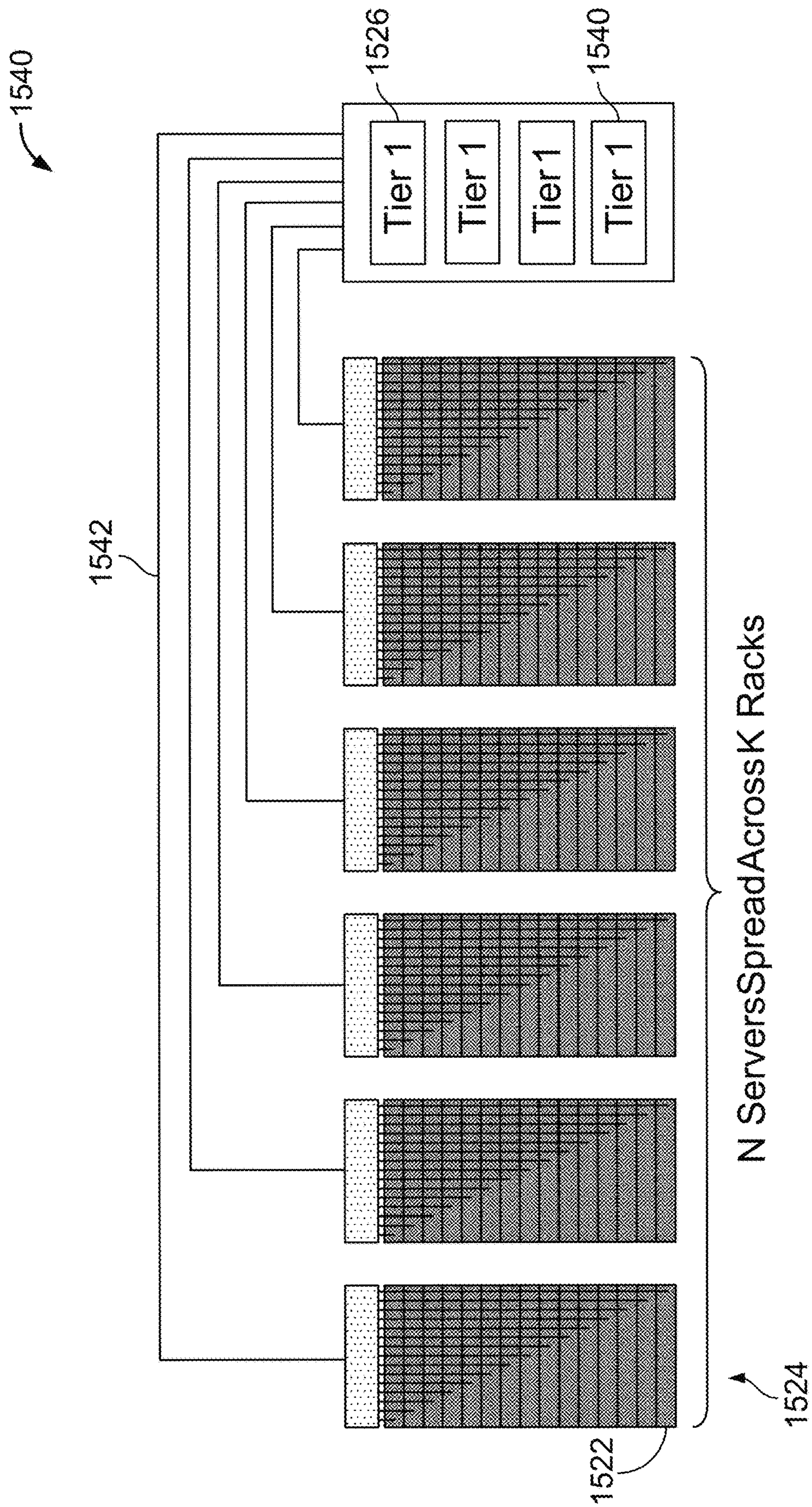

Referring to FIG. 86, in some implementations, a data processing system (e.g., data center) 1540 includes tier-1 switches 1526 that are co-located in a rack 1540 separate from the N servers 1522 that are spread across K racks 1524. Each server 1522 has a direct link to each of the tier-1 switches 1526. In some implementations, there is one fiber cable 1542 (or a small number <<N/K of fiber cables) from the tier-1 switch rack 1540 to each of the K server racks 1524.

Figure 87A:
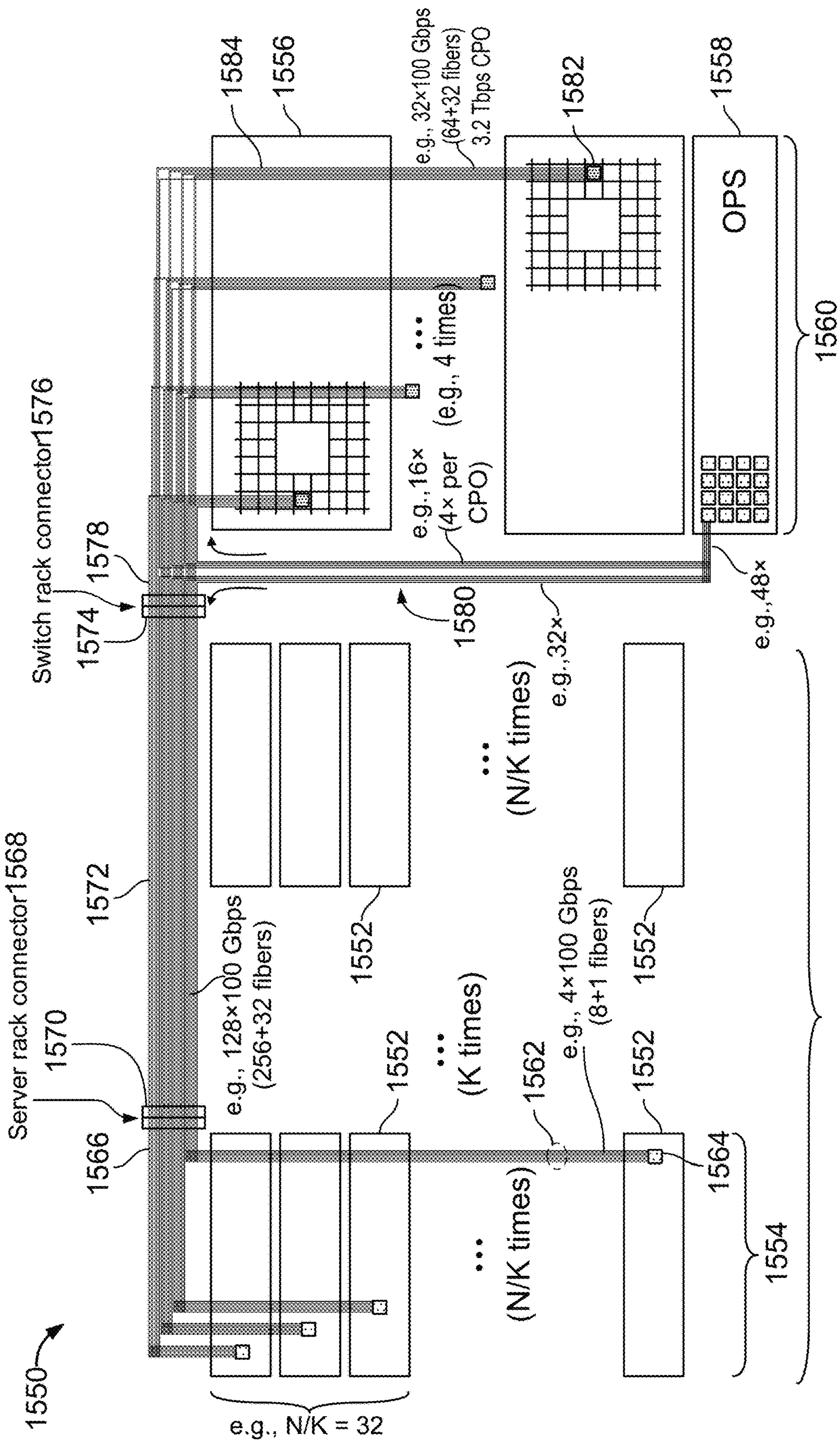

FIG. 87A is a diagram of an example of a data processing system 1550 that includes N=1024 servers 1552 spread across K=32 racks 1554, in which each rack 1554 includes N/K=1024/32=32 servers 1552. There are 4 tier-1 switches 1556 and an optical power supply 1558 that is co-located in a rack 1560.

Optical fibers connect the servers 1552 to the tier-1 switches 1556 and the optical power supply 1558. In this example, a bundle 1562 of 9 optical fibers is optically coupled to a co-packaged optical module 1564 of a server 1552, in which 1 optical fiber provides the optical power supply light, and 4 pairs of (a total of 8) optical fibers provide 4 bi-directional communication channels, each channel having a 100 Gbps bandwidth, for a total of 4×100 Gbps bandwidth in each direction. Because there are 32 servers 1552 in each rack 1554, there are a total of 256+32=288 optical fibers that extend from each rack 1554 of servers 1552, in which 32 optical fibers provide the optical power supply light, and 256 optical fibers provide 128 bi-directional communication channels, each channel having a 100 Gbps bandwidth.

For example, at the server rack side, optical fibers 1566 (that are connected to the servers 1552 of a rack 1554) terminate at a server rack connector 1568. At the switch rack side, optical fibers 1578 (that are connected to the switch boxes 1556 and the optical power supply 1558) terminate at a switch rack connector 1576. An optical fiber extension cable 1572 is optically coupled to the server rack side and the switch rack side. The optical fiber extension cable 1572 includes 256+32=288 optical fibers. The optical fiber extension cable 1572 includes a first optical fiber connector 1570 and a second optical fiber connector 1574. The first optical fiber connector 1570 is connected to the server rack connector 1568, and the second optical fiber connector 1574 is connected to the switch rack connector 1576. At the switch rack side, the optical fibers 1578 include 288 optical fibers, of which 32 optical fibers 1580 are optically coupled to the optical power supply 1558. The 256 optical fibers that carry 128 bi-directional communication channels (each channel having a 100 Gbps bandwidth in each direction) are separated into four groups of 64 optical fibers, in which each group of 64 optical fibers is optically coupled to a co-packaged optical module 1582 in one of the switch boxes 1556. The co-packaged optical module 1582 is configured to have a bandwidth of 32×100 Gbps=3.2 Tbps in each direction (input and output). Each switch box 1556 is connected to each server 1552 of the rack 1554 through a pair of optical fibers that carry a bandwidth of 100 Gbps in each direction.

The optical power supply 1558 provides optical power supply light to co-packaged optical modules 1582 at the switch boxes 1556. In this example, the optical power supply 1558 provides optical power supply light through 4 optical fibers to each co-packaged optical module 1582, so that a total of 16 optical fibers are used to provide the optical power supply light to the 4 switch boxes 1556. A bundle of optical fibers 1584 is optically coupled to the co-packaged optical module 1582 of the switch box 1556. The bundle of optical fibers 1584 includes 64+16=80 fibers. In some examples, the optical power supply 1558 can provide additional optical power supply light to the co-packaged optical module 1582 using additional optical fibers. For example, the optical power supply 1558 can provide optical power supply light to the co-packaged optical module 1582 using 32 optical fibers with built-in redundancy.

Figure 87B:
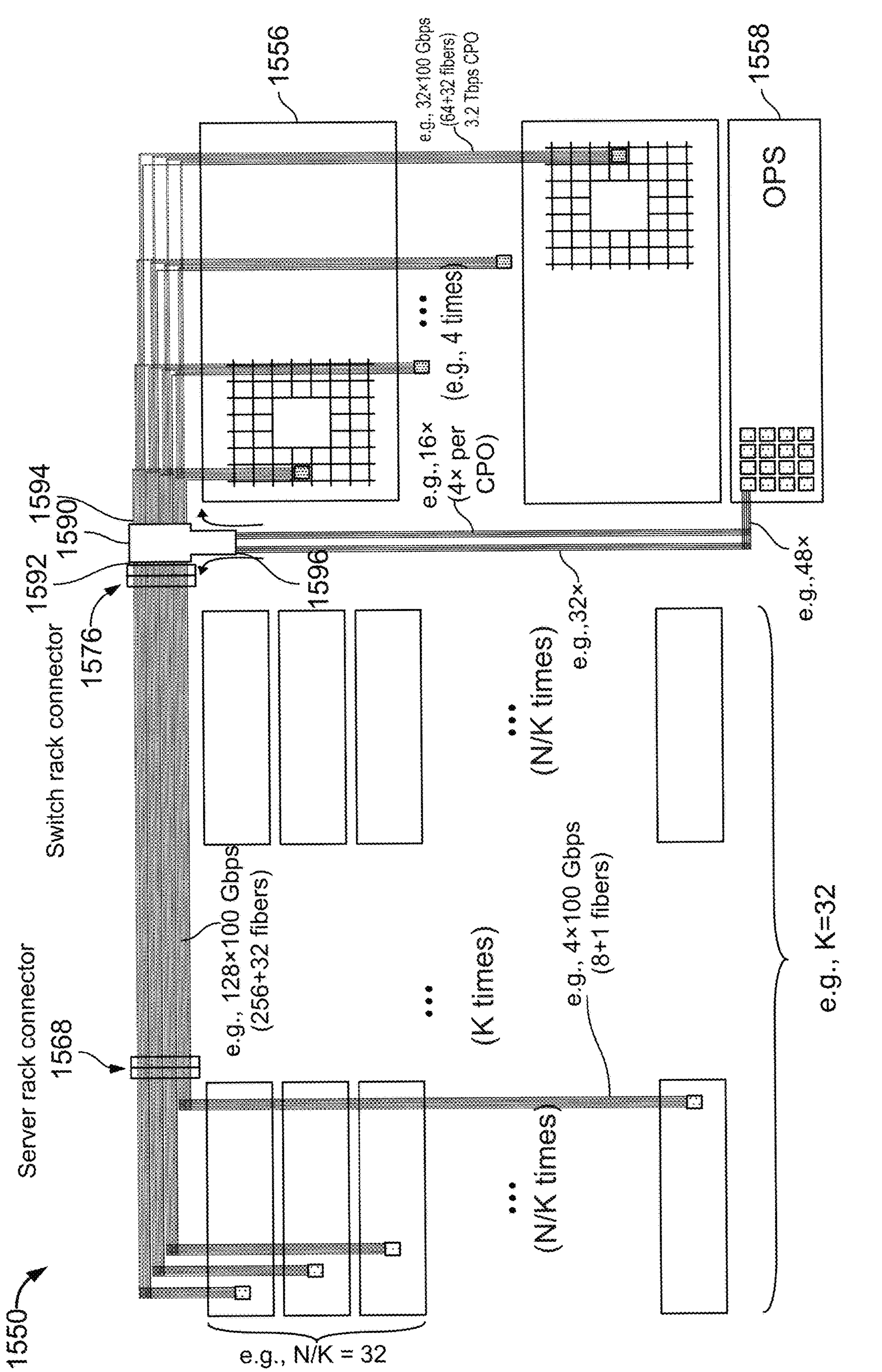

Referring to FIG. 87B, the data processing system 1550 includes an optical fiber guide module 1590 that helps organize the optical fibers so that they are directed to the appropriate directions. The optical fiber guide module 1590 also restricts bending of the optical fibers to be within the specified limits to prevent excess optical light loss or damage to the optical fibers. The optical fiber guide module 1590 includes a first port 1592, a second port 1594, and a third port 1596. The optical fibers that extend outward from the first port 1592 are optically coupled to the switch rack connector 1576. The optical fibers that extend outward from the second port 1594 are optically coupled to the switch boxes. The optical fibers that extend outward from the third port 1596 are optically coupled to the optical power supply 1558.

Figure 88:
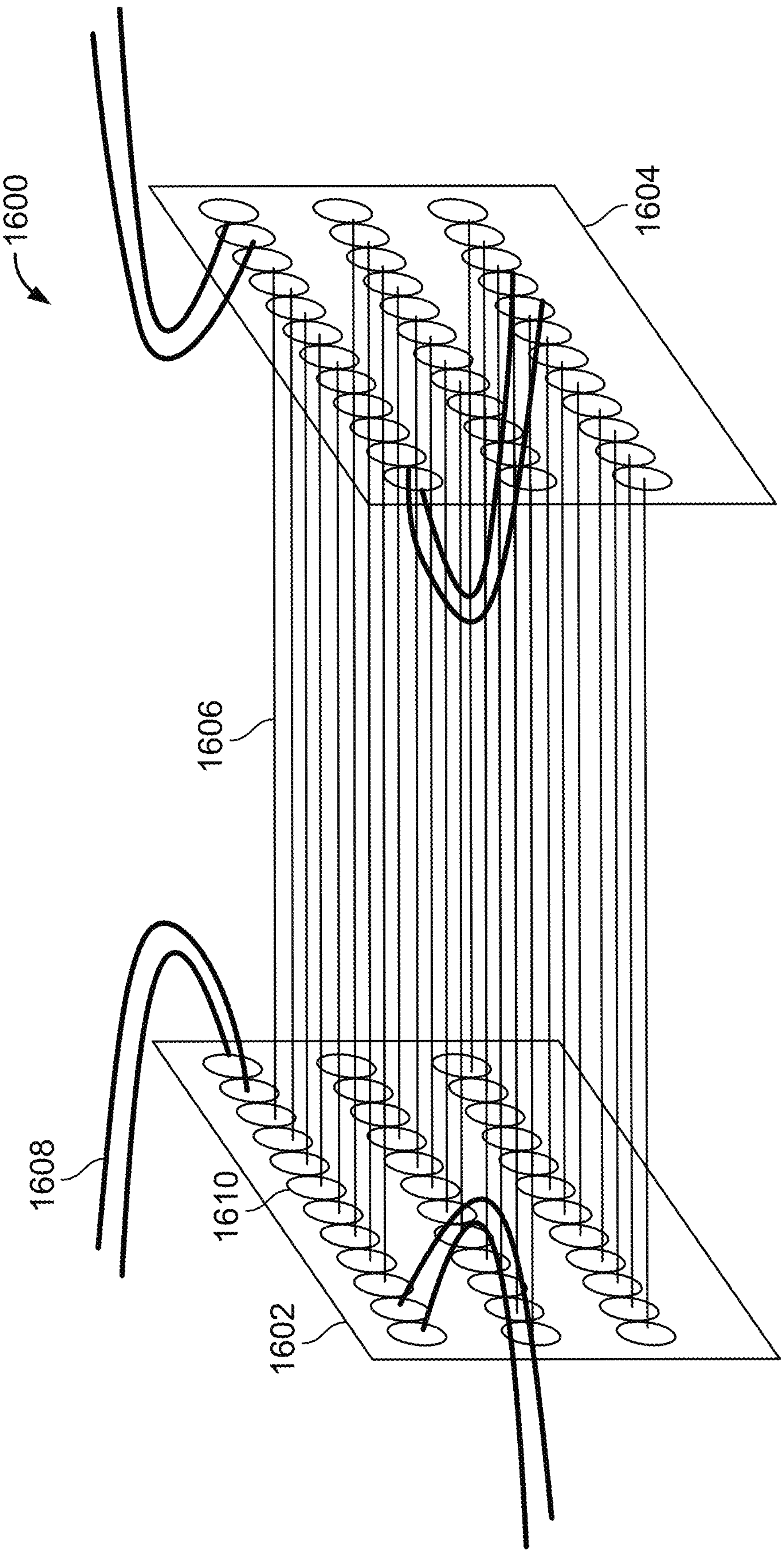
FIG. 88 is a diagram of an example of connector port mapping for an optical fiber interconnection cable.

FIG. 88 is a diagram of an example of the connector port mapping for an optical fiber interconnection cable 1600, which includes a first optical fiber connector 1602, a second optical fiber connector 1604, optical fibers 1606 that transmit data and/or control signals between the first and second optical fiber connectors 1602, 1604, and optical fibers 1608 that transmit optical power supply light. Each optical fiber terminates at an optical fiber port 1610, which can include, e.g., lenses for focusing light entering or exiting the optical fiber port 1610. The first and second optical fiber connectors 1602, 1604 can be, e.g., the optical fiber connectors 1342 and 1344 of FIGS. 80B, 80C, the optical fiber connectors 1402 and 1404 of FIGS. 82B, 82C, or the optical fiber connectors 1570 and 1574 of FIG. 87A. The principles for designing the optical fiber interconnection cable 1600 can be used to design the optical cable assembly 1340 of FIGS. 80B, 80C, the optical cable assembly 1400 of FIGS. 82B, 82C, and the optical cable assembly 1490 of FIGS. 84B, 84C.

In the example of FIG. 88, each optical fiber connector 1602 or 1604 includes 3 rows of optical fiber ports, each row including 12 optical fiber ports. Each optical fiber connector 1602 or 1604 includes 4 power supply fiber ports that are connected to optical fibers 1608 that are optically coupled to one or more optical power supplies. Each optical fiber connector 1602 or 1604 includes 32 fiber ports (some of which are transmitter fiber ports, and some of which are receiver fiber ports) that are connected to the optical fibers 1606 for data transmission and reception.

In some implementations, the mapping of the fiber ports of the optical fiber connectors 1602, 1604 are designed such that the interconnection cable 1600 can have the most universal use, in which each fiber port of the optical fiber connector 1602 is mapped to a corresponding fiber port of the optical fiber connector 1604 with a 1-to-1 mapping and without transponder-specific port mapping that would require fibers 1606 to cross over. This means that for an optical transponder that has an optical fiber connector compatible with the interconnection cable 1600, the optical transponder can be connected to either the optical fiber connector 1602 or the optical fiber connector 1604. The mapping of the fiber ports is designed such that each transmitter port of the optical fiber connector 1602 is mapped to a corresponding receiver port of the optical fiber connector 1604, and each receiver port of the optical fiber connector 1602 is mapped to a corresponding transmitter port of the optical fiber connector 1604.

FIG. 89 is a diagram showing an example of the fiber port mapping for an optical fiber interconnection cable 1660 that includes a pair of optical fiber connectors, i.e., a first optical fiber connector 1662 and a second optical fiber connector 1664. The optical fiber connectors 1662 and 1664 are designed such that either the first optical fiber connector 1662 or the second optical fiber connector 1664 can be connected to a given communication transponder that is compatible with the optical fiber interconnection cable 1660. The diagram shows the fiber port mapping when viewed from the outer edge of the optical fiber connector into the optical fiber connector (i.e., toward the optical fibers in the interconnection cable 1660).

The first optical fiber connector 1662 includes transmitter fiber ports (e.g., 1614*a*, 1616*a*), receiver fiber ports (e.g., 1618*a*, 1620*a*), and optical power supply fiber ports (e.g., 1622*a*, 1624*a*). The second optical fiber connector 1664 includes transmitter fiber ports (e.g., 1614*b*, 1616*b*), receiver fiber ports (e.g., 1618*b*, 1620*b*), and optical power supply fiber ports (e.g., 1622*b*, 1624*b*). For example, assume that the first optical fiber connector 1662 is connected to a first optical transponder, and the second optical fiber connector 1664 is connected to a second optical transponder. The first optical transponder transmits first data and/or control signals through the transmitter ports (e.g., 1614*a*, 1616*a*) of the first optical fiber connector 1662, and the second optical transponder receives the first data and/or control signals from the corresponding receiver fiber ports (e.g., 1618*b*, 1620*b*) of the second optical fiber connector 1664. The transmitter ports 1614*a*, 1616*a* are optically coupled to the corresponding receiver fiber ports 1618*b*, 1620*b* through optical fibers 1628, 1630, respectively. The second optical transponder transmits second data and/or control signals through the transmitter ports (e.g., 1614*b*, 1616*b*) of the second optical fiber connector 1664, and the first optical transponder receives the second data and/or control signals from the corresponding receiver fiber ports (1618*a*, 1620*a*) of the first optical fiber connector 1662. The transmitter port 1616*b* is optically coupled to the corresponding receiver fiber port 1620*a* through an optical fiber 1632.

A first optical power supply transmits optical power supply light to the first optical transponder through the power supply fiber ports of the first optical fiber connector 1662. A second optical power supply transmits optical power supply light to the second optical transponder through the power supply fiber ports of the second optical fiber connector 1664. The first and second power supplies can be different (such as the example of FIG. 80B) or the same (such as the example of FIG. 82B).

In the following description, when referring to the rows and columns of fiber ports of the optical fiber connector, the uppermost row is referred to as the $1^{st}$ row, the second uppermost row is referred to as the $2^{nd}$ row, and so forth. The leftmost column is referred to as the $1^{st}$ column, the second leftmost column is referred to as the $2^{nd}$ column, and so forth.

For an optical fiber interconnection cable having a pair of optical fiber connectors (i.e., a first optical fiber connector and a second optical fiber connector) to be universal, i.e., either one of the pair of optical fiber connectors can be connected to a given optical transponder, the arrangement of the transmitter fiber ports, the receiver fiber ports, and the power supply fiber ports in the optical fiber connectors have a number of properties. These properties are referred to as the "universal optical fiber interconnection cable port mapping properties." The term "mapping" here refers to the arrangement of the transmitter fiber ports, the receiver fiber ports, and the power supply fiber ports at particular locations within the optical fiber connector. The first property is that the mapping of the transmitter, receiver, and power supply fiber ports in the first optical fiber connector is the same as the mapping of the transmitter, receiver, and power supply fiber ports in the second optical fiber connector (as in the example of FIG. 89).

In the example of FIG. 89, the individual optical fibers connecting the transmitter, receiver, and power supply fiber ports in the first optical fiber connector to the transmitter, receiver, and power supply fiber ports in the second optical fiber connector are parallel to one another.

In some implementations, each of the optical fiber connectors includes a unique marker or mechanical structure, e.g., a pin, that is configured to be at the same spot on the co-packaged optical module, similar to the use of a "dot" to denote "pin 1" on electronic modules. In some examples, such as those shown in FIGS. 89 and 90, the larger distance from the bottom row (the third row in the examples of FIGS. 89 and 90) to the connector edge can be used as a "marker" to guide the user to attach the optical fiber connector to the co-packaged optical module connector in a consistent manner.

The mapping of the fiber ports of the optical fiber connectors of a "universal optical fiber interconnection cable" has a second property: When mirroring the port map of an optical fiber connector and replacing each transmitter port with a receiver port as well as replacing each receiver port with a transmitter port in the mirror image, the original port mapping is recovered. The mirror image can be generated with respect to a reflection axis at either connector edge, and the reflection axis can be parallel to the row direction or the column direction. The power supply fiber ports of the first optical fiber connector are mirror images of the power supply fiber ports of the second optical fiber connector.

The transmitter fiber ports of the first optical fiber connector and the receiver fiber ports of the second optical fiber connector are pairwise mirror images of each other, i.e., each transmitter fiber port of the first optical fiber connector is mirrored to a receiver fiber port of the second optical fiber connector. The receiver fiber ports of the first optical fiber connector and the transmitter fiber ports of the second optical fiber connector are pairwise mirror images of each other, i.e., each receiver fiber port of the first optical fiber connector is mirrored to a transmitter fiber port of the second optical fiber connector.

Another way of looking at the second property is as follows: Each optical fiber connector is transmitter port-receiver port (TX-RX) pairwise symmetric and power supply port (PS) symmetric with respect to one of the main or center axes, which can be parallel to the row direction or the column direction. For example, if an optical fiber connector has an even number of columns, the optical fiber connector can be divided along a center axis parallel to the column direction into a left half portion and a right half portion. The power supply fiber ports are symmetric with respect to the main axis, i.e., if there is a power supply fiber port in the left half portion of the optical fiber connector, there will also be a power supply fiber port at the mirror location in the right half portion of the optical fiber connector. The transmitter fiber ports and the receiver fiber ports are pairwise symmetric with respect to the main axis, i.e., if there is a transmitter fiber port in the left half portion of the optical fiber connector, there will be a receiver fiber port at a mirror location in the right half portion of the optical fiber connector. Likewise, if there is a receiver fiber port in the left half portion of the optical fiber connector, there will be a transmitter fiber port at a mirror location in the right half portion of the optical fiber connector.

For example, if an optical fiber connector has an even number of rows, the optical fiber connector can be divided along a center axis parallel to the row direction into an upper half portion and a lower half portion. The power supply fiber ports are symmetric with respect to the main axis, i.e., if there is a power supply fiber port in the upper half portion of the optical fiber connector, there will also be a power supply fiber port at the mirror location in the lower half portion of the optical fiber connector. The transmitter fiber ports and the receiver fiber ports are pairwise symmetric with respect to the main axis, i.e., if there is a transmitter fiber port in the upper half portion of the optical fiber connector, there will be a receiver fiber port at a mirror location in the lower half portion of the optical fiber connector. Likewise, if there is a receiver fiber port in the upper half portion of the optical fiber connector, there will be a transmitter fiber port at a mirror location in the lower half portion of the optical fiber connector.

The mapping of the transmitter fiber ports, receiver fiber ports, and power supply fiber ports follow a symmetry requirement that can be summarized as follows:

(i) Mirror all ports on either one of the two connector edges.

(ii) Swap T×(transmitter) and RX (receiver) functionality on the mirror image.

(iii) Leave mirrored PS (power supply) ports as PS ports.

(iv) The resulting port map is the same as the original one.

Essentially, a viable port map is TX-RX pairwise symmetric and PS symmetric with respect to one of the main axes.

The properties of the mapping of the fiber ports of the optical fiber connectors can be mathematically expressed as follows:

Port matrix M with entries PS=0, TX=+1, RX=−1;

Column-mirror operation $\overleftrightarrow{M}$;

Row-mirror operation $\updownarrow M$;

→A viable port map either satisfies $-\overleftrightarrow{M}=M$ or $-\updownarrow M=M$.

In some implementations, if a universal optical fiber interconnection cable has a first optical fiber connector and a second optical fiber connector that are mirror images of each other after swapping the transmitter fiber ports to receiver fiber ports and swapping the receiver fiber ports to transmitter fiber ports in the mirror image, and the mirror image is generated with respect to a reflection axis parallel to the column direction, as in the example of FIG. 89, then each optical fiber connector should be TX-RX pairwise symmetric and PS symmetric with respect to a center axis parallel to the column direction. If a universal optical fiber interconnection cable has a first optical fiber connector and a second optical fiber connector that are mirror images of each other after swapping the transmitter and receiver fiber ports in the mirror image, and the mirror image is generated with respect to a reflection axis parallel to the row direction, as in the example of FIG. 90, then each optical fiber connector should be TX-RX pairwise symmetric and PS symmetric with respect to a center axis parallel to the row direction.

In some implementations, a universal optical fiber interconnection cable:

a. Comprises n_trx strands of TX/RX fibers and n_p strands of power supply fibers, in which 0≤n_p≤n_trx.

b. The n_trx strands of TX/RX fibers are mapped 1:1 from a first optical fiber connector to the same port positions on a second optical fiber connector through the optical fiber cable, i.e. the optical fiber cable can be laid out in a straight manner without leading to any cross-over fiber strands.

c. Those connector ports that are not 1:1 connected by TX/RX fibers may be connected to power supply fibers via a break-out cable.

In some implementations, a universal optical module connector has the following properties:

a. Starting from a connector port map PM0.

b. First mirror port map PM0 either across the row dimension or across the column dimension.

c. Mirroring can be done either across a column axis or across a row axis.

d. Replace TX ports by RX ports and vice versa.

e. If at least one mirrored and replaced version of the port map again results in the starting port map PM0, the connector is called a universal optical module connector.

In FIG. 89, the arrangement of the transmitter, receiver, and power supply fiber ports in the first optical fiber connector 1662, and the arrangement of the transmitter, receiver, and power supply fiber ports in the second optical fiber connector 1664 have the two properties described above. First property: When looking into the optical fiber connector (from the outer edge of the connector inward toward the optical fibers), the mapping of the transmitter, receiver, and power supply fiber ports in the first optical fiber connector 1662 is the same as the mapping of the transmitter, receiver, and power supply fiber ports in the optical fiber connector 1664. Row 1, column 1 of the optical fiber connector 1662 is a power supply fiber port (1622*a*), and row 1, column 1 of the optical fiber connector 1664 is also a power supply fiber port (1622*b*). Row 1, column 3 of the optical fiber connector 1662 is a transmitter fiber port (1614*a*), and row 1, column 3 of the optical fiber connector 1664 is also a transmitter fiber port (1614*b*). Row 1, column 10 of the optical fiber connector 1662 is a receiver fiber port (1618*a*), and row 1, column 10 of the optical fiber connector 1664 is also a receiver fiber port (1618*b*), and so forth.

The optical fiber connectors 1662 and 1664 have the second universal optical fiber interconnection cable port mapping property described above. The port mapping of the optical fiber connector 1662 is a mirror image of the port mapping of the optical fiber connector 1664 after swapping each transmitter port to a receiver port and swapping each receiver port to a transmitter port in the mirror image. The mirror image is generated with respect to a reflection axis 1626 at the connector edge that is parallel to the column direction. The power supply fiber ports (e.g., 1662*a*, 1624*a*) of the optical fiber connector 1662 are mirror images of the power supply fiber ports (e.g., 1622*b*, 1624*b*) of the optical fiber connector 1664. The transmitter fiber ports (e.g., 1614*a*, 1616*a*) of the optical fiber connector 1662 and the receiver fiber ports (e.g., 1618*b*, 1620*b*) of the optical fiber connector 1664 are pairwise mirror images of each other, i.e., each transmitter fiber port (e.g., 1614*a*, 1616*a*) of the optical fiber connector 1662 is mirrored to a receiver fiber port (e.g., 1618*b*, 1620*b*) of the optical fiber connector 1664. The receiver fiber ports (e.g., 1618*a*, 1620*a*) of the optical fiber connector 1662 and the transmitter fiber ports (e.g., 1618*b*, 1620*b*) of the optical fiber connector 1664 are pairwise mirror images of each other, i.e., each receiver fiber port (e.g., 1618*a*, 1620*a*) of the optical fiber connector 1662 is mirrored to a transmitter fiber port (e.g., 1618*b*, 1620*b*) of the optical fiber connector 1664.

For example, the power supply fiber port 1622*a* at row 1, column 1 of the optical fiber connector 1662 is a mirror image of the power supply fiber port 1624*b* at row 1, column 12 of the optical fiber connector 1664 with respect to the reflection axis 1626. The power supply fiber port 1624*a* at row 1, column 12 of the optical fiber connector 1662 is a mirror image of the power supply fiber port 1622*b* at row 1, column 1 of the optical fiber connector 1664. The transmitter fiber port 1614*a* at row 1, column 3 of the optical fiber connector 1662 and the receiver fiber port 1618*b* at row 1, column 10 of the optical fiber connector 1604 are pairwise mirror images of each other. The receiver fiber port 1618*a* at row 1, column 10 of the optical fiber connector 1662 and the transmitter fiber port 1614*b* at row 1, column 3 of the optical fiber connector 1664 are pairwise mirror images of each other. The transmitter fiber port 1616*a* at row 3, column 3 of the optical fiber connector 1662 and the receiver fiber port 1620*b* at row 3, column 10 of the optical fiber connector 1664 are pairwise mirror images of each other. The receiver fiber port 1620*a* at row 3, column 10 of the optical fiber connector 1662 and the transmitter fiber port 1616*b* at row 3, column 3 of the optical fiber connector 1664 are pairwise mirror images of each other.

In addition, and as an alternate view of the second property, each optical fiber connector 1662, 1664 is TX-RX pairwise symmetric and PS symmetric with respect to the center axis that is parallel to the column direction. Using the first optical fiber connector 1662 as an example, the power supply fiber ports (e.g., 1622*a*, 1624*a*) are symmetric with respect to the center axis, i.e., if there is a power supply fiber port in the left half portion of the first optical fiber connector 1662, there will also be a power supply fiber port at the mirror location in the right half portion of the first optical fiber connector 1662. The transmitter fiber ports and the receiver fiber ports are pairwise symmetric with respect to the main axis, i.e., if there is a transmitter fiber port in the left half portion of the first optical fiber connector 1662, there will be a receiver fiber port at a mirror location in the right half portion of the first optical fiber connector 1662. Likewise, if there is a receiver fiber port in the left half portion of the optical fiber connector 1662, there will be a transmitter fiber port at a mirror location in the right half portion of the optical fiber connector 1662.

If the port mapping of the first optical fiber connector 1662 is represented by port matrix M with entries PS=0, TX=+1, RX=−1, then $-\overleftrightarrow{M}=M$, in which $\overleftrightarrow{M}$ represents the column-mirror operation, e.g., generating a mirror image with respect to the reflection axis 1626.

FIG. 90 is a diagram showing another example of the fiber port mapping for an optical fiber interconnection cable 1670 that includes a pair of optical fiber connectors, i.e., a first optical fiber connector 1672 and a second optical fiber connector 1674. In the diagram, the port mapping for the second optical fiber connector 1674 is the same as that of optical fiber connector 1672. The optical fiber interconnection cable 1670 has the two universal optical fiber interconnection cable port mapping properties described above.

First property: The mapping of the transmitter, receiver, and power supply fiber ports in the first optical fiber connector 1672 is the same as the mapping of the transmitter, receiver, and power supply fiber ports in the second optical fiber connector 1674.

Second property: The port mapping of the first optical fiber connector 1672 is a mirror image of the port mapping of the second optical fiber connector 1674 after swapping each transmitter port to a receiver port and swapping each receiver port to a transmitter port in the mirror image. The mirror image is generated with respect to a reflection axis 1640 at the connector edge parallel to the row direction.

Alternative view of the second property: Each of the first and second optical fiber connectors 1672, 1674 is TX-RX pairwise symmetric and PS symmetric with respect to the central axis that is parallel to the row direction. For example, the optical fiber connector 1672 can be divided in two halves along a central axis parallel to the row direction. The power supply fiber ports (e.g., 1678, 1680) are symmetric with respect to the center axis. The transmitter fiber ports (e.g., 1682, 1684) and the receiver fiber ports (e.g., 1686, 1688) are pairwise symmetric with respect to the center axis, i.e., if there is a transmitter fiber port (e.g., 1682 or 1684) in the upper half portion of the first optical fiber connector 1672, then there will be a receiver fiber port (e.g., 1686, 1688) at a mirror location in the lower half of the optical fiber connector 1672. Likewise, if there is a receiver fiber port in the upper half portion of the optical fiber connector 1672, then there is a transmitter fiber port at a mirror location in the lower half portion of the optical fiber connector 1672. In the example of FIG. 90, the middle row 1690 should all be power supply fiber ports.

In general, if the port mapping of the first optical fiber connector is a mirror image of the port mapping of the second optical fiber connector after swapping the transmitter and receiver ports in the mirror image, the mirror image is generated with respect to a reflection axis at the connector edge parallel to the row direction (as in the example of FIG. 90), and there is an odd number of rows in the port matrix, then the center row should all be power supply fiber ports. If the port mapping of the first optical fiber connector is a mirror image of the port mapping of the second optical fiber connector after swapping the transmitter and receiver ports in the mirror image, the mirror image is generated with respect to a reflection axis at the connector edge parallel to the column direction, and there is an odd number of columns in the port matrix, then the center column should all be power supply fiber ports.

Figure 91:
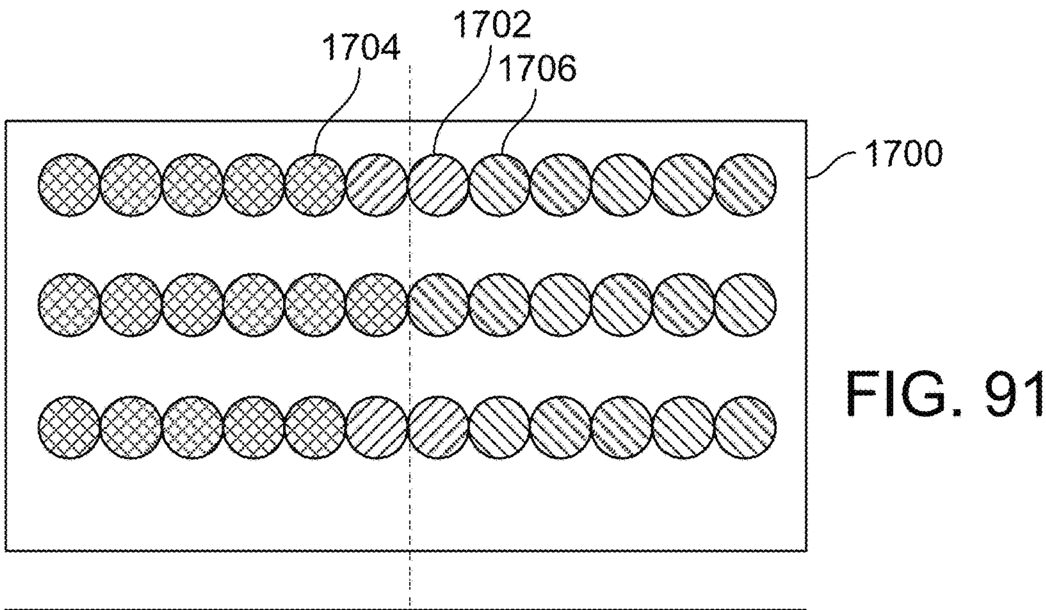
FIGS. 91 and 92 are diagrams of examples of viable port mapping for optical fiber connectors of universal optical fiber interconnection cables.

FIG. 91 is a diagram of an example of a viable port mapping for an optical fiber connector 1700 of a universal optical fiber interconnection cable. The optical fiber connector 1700 includes power supply fiber ports (e.g., 1702), transmitter fiber ports (e.g., 1704), and receiver fiber ports (e.g., 1706). The optical fiber connector 1700 is TX-RX pairwise symmetric and PS symmetric with respect to the center axis that is parallel to the column direction.

Figure 92:
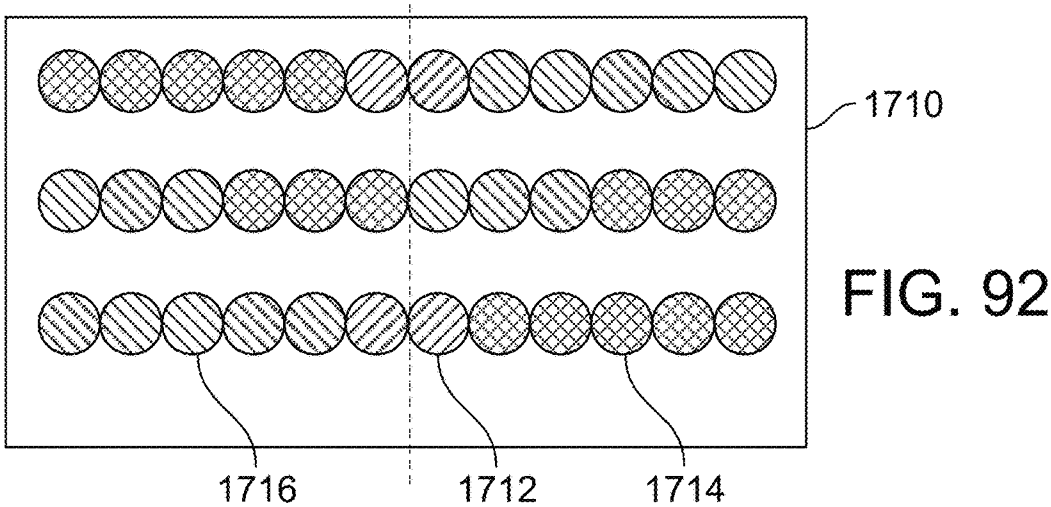

FIG. 92 is a diagram of an example of a viable port mapping for an optical fiber connector 1710 of a universal optical fiber interconnection cable. The optical fiber connector 1710 includes power supply fiber ports (e.g., 1712), transmitter fiber ports (e.g., 1714), and receiver fiber ports (e.g., 1716). The optical fiber connector 1710 is TX-RX pairwise symmetric and PS symmetric with respect to the center axis that is parallel to the column direction.

Figure 93:
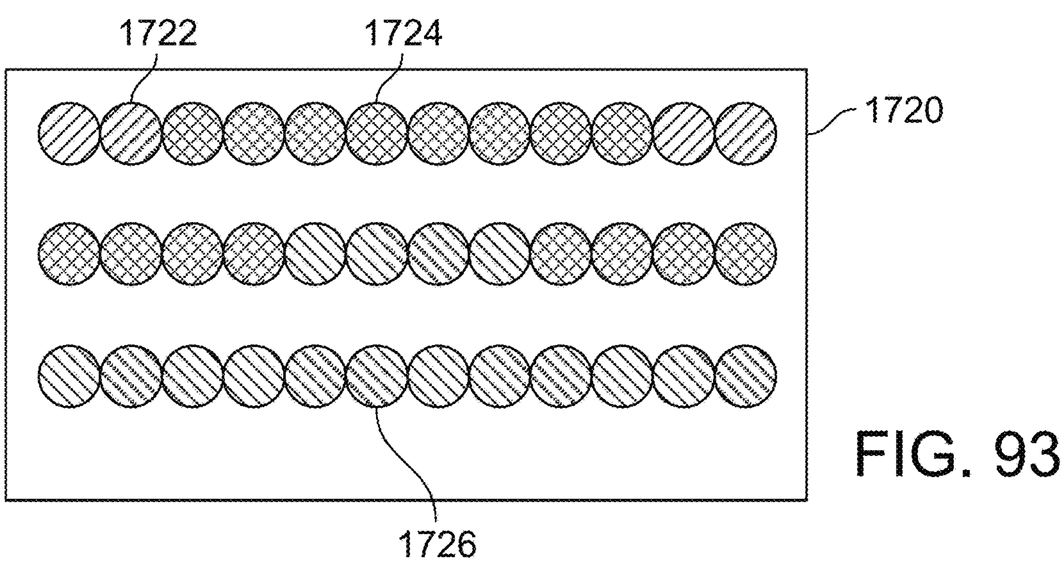
FIG. 93 is a diagram of an example of a port mapping for an optical fiber connector that is not appropriate for a universal optical fiber interconnection cable.

FIG. 93 is a diagram of an example of a port mapping for an optical fiber connector 1720 that is not appropriate for a universal optical fiber interconnection cable. The optical fiber connector 1720 includes power supply fiber ports (e.g., 1722), transmitter fiber ports (e.g., 1724), and receiver fiber ports (e.g., 1726). The optical fiber connector 1720 is not TX-RX pairwise symmetric with respect to the center axis that is parallel to the column direction, or the center axis that is parallel to the row direction.

Figure 94:
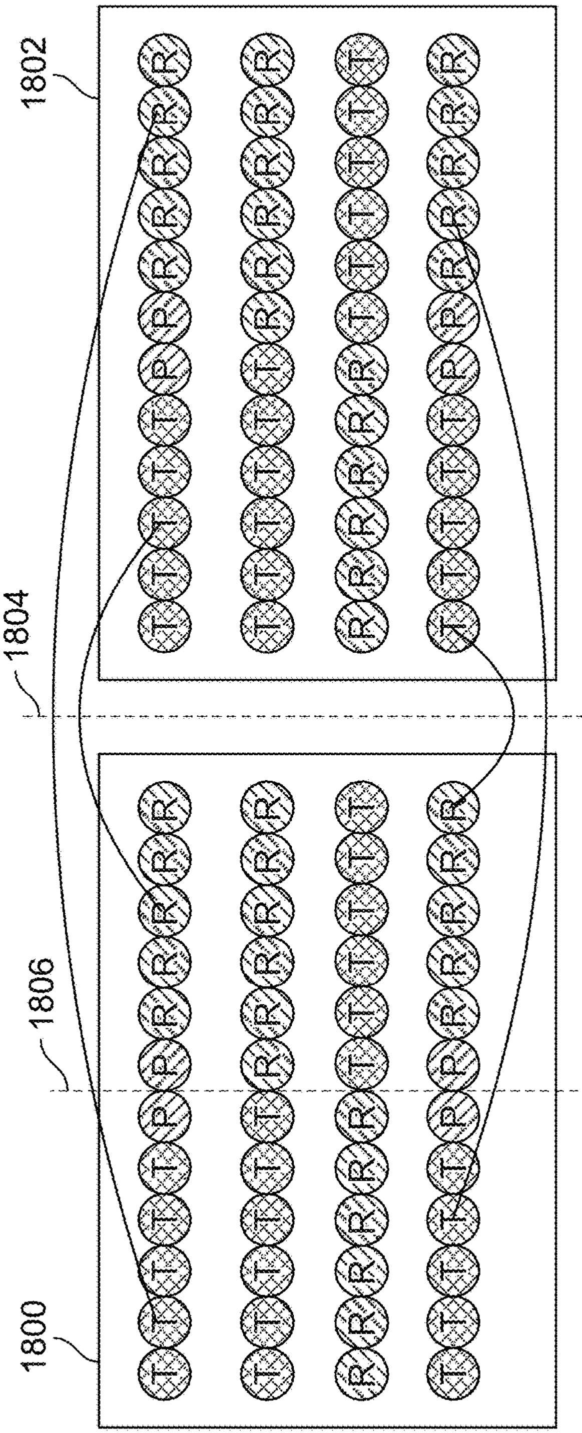
FIGS. 94 and 95 are diagrams of examples of viable port mapping for optical fiber connectors of universal optical fiber interconnection cables.

FIG. 94 is a diagram of an example of a viable port mapping for a universal optical fiber interconnection cable that includes a pair of optical fiber connectors, i.e., a first optical fiber connector 1800 and a second optical fiber connector 1802. The mapping of the transmitter, receiver, and power supply fiber ports in the first optical fiber connector 1800 is the same as the mapping of the transmitter, receiver, and power supply fiber ports in the second optical fiber connector 1802. The port mapping of the first optical fiber connector 1800 is a mirror image of the port mapping of the second optical fiber connector 1802 after swapping the transmitter and receiver ports in the mirror image. The mirror image is generated with respect to a reflection axis 1804 at the connector edge parallel to the column direction. The optical fiber connector 1800 is TX-RX pairwise symmetric and PS symmetric with respect to the center axis 1806 that is parallel to the column direction.

Figure 95:
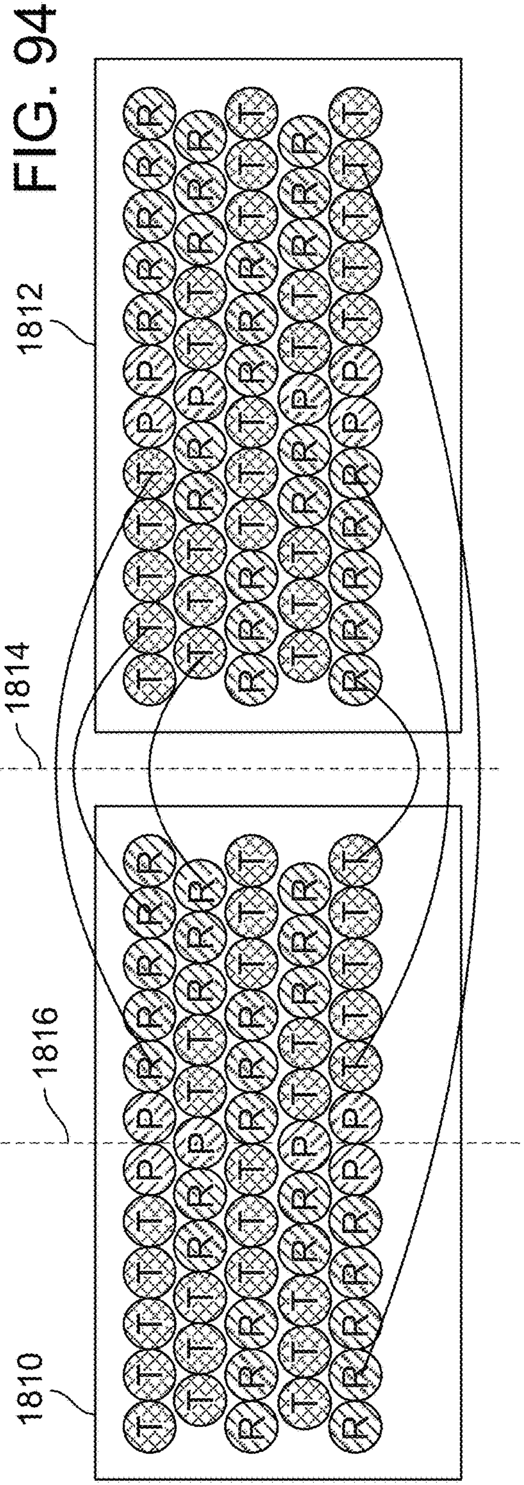

FIG. 95 is a diagram of an example of a viable port mapping for a universal optical fiber interconnection cable that includes a pair of optical fiber connectors, i.e., a first optical fiber connector 1810 and a second optical fiber connector 1812. The mapping of the transmitter, receiver, and power supply fiber ports in the first optical fiber connector 1810 is the same as the mapping of the transmitter, receiver, and power supply fiber ports in the second optical fiber connector 1812. The port mapping of the first optical fiber connector 1810 is a mirror image of the port mapping of the second optical fiber connector 1812 after swapping the transmitter and receiver ports in the mirror image. The mirror image is generated with respect to a reflection axis 1814 at the connector edge parallel to the column direction. The optical fiber connector 1810 is TX-RX pairwise symmetric and PS symmetric with respect to the center axis 1816 that is parallel to the column direction.

In the example of FIG. 95, the first, third, and fifth rows each has an even number of fiber ports, and the second and fourth rows each has an odd number of fiber ports. In general, a viable port mapping for a universal optical fiber interconnection cable can be designed such that an optical fiber connector includes (i) rows that all have even numbers of fiber ports, (ii) rows that all have odd numbers of fiber ports, or (iii) rows that have mixed even and odd numbers of fiber ports. A viable port mapping for a universal optical fiber interconnection cable can be designed such that an optical fiber connector includes (i) columns that all have even numbers of fiber ports, (ii) columns that all have odd numbers of fiber ports, or (iii) columns that have mixed even and odd numbers of fiber ports.

The optical fiber connector of a universal optical fiber interconnection cable does not have be a rectangular shape as shown in the examples of FIGS. 89, 90, 92 to 95. The optical fiber connectors can also have an overall triangular, square, pentagonal, hexagonal, trapezoidal, circular, oval, or n-sided polygon shape, in which n is an integer larger than 6, as long as the arrangement of the transmitter, receiver, and power supply fiber ports in the optical fiber connectors have the three universal optical fiber interconnection cable port mapping properties described above.

In the examples of FIGS. 80A, 82A, 84A, and 87A, the switch boxes (e.g., 1302, 1304) includes co-packaged optical modules (e.g., 1312, 1316) that is optically coupled to the optical fiber interconnection cables or optical cable assemblies (e.g., 1340, 1400, 1490) through fiber array connectors. For example, the fiber array connector can correspond to the first optical connector part 213 in FIG. 20. The optical fiber connector (e.g., 1342, 1344, 1402, 1404, 1492, 1498) of the optical cable assembly can correspond to the second optical connector part 223 in FIG. 20. The port map (i.e., mapping of power supply fiber ports, transmitter fiber ports, and receiver fiber ports) of the fiber array connector (which is optically coupled to the photonic integrated circuit) is a mirror image of the port map of the optical fiber connector (which is optically coupled to the optical fiber interconnection cable). The port map of the fiber array connector refers to the arrangement of the power supply, transmitter, and receiver fiber ports when viewed from an external edge of the fiber array connector into the fiber array connector.

As described above, universal optical fiber connectors have symmetrical properties, e.g., each optical fiber connector is TX-RX pairwise symmetric and PS symmetric with respect to one of the main or center axes, which can be parallel to the row direction or the column direction. The fiber array connector also has the same symmetrical properties, e.g., each fiber array connector is TX-RX pairwise symmetric and PS symmetric with respect to one of the main or center axes, which can be parallel to the row direction or the column direction.

In some implementations, a restriction can be imposed on the port mapping of the optical fiber connectors of the optical cable assembly such that the optical fiber connector can be pluggable when rotated by 180 degrees, or by 90 degrees in the case of a square connector. This results in further port mapping constraints.

Figure 101:
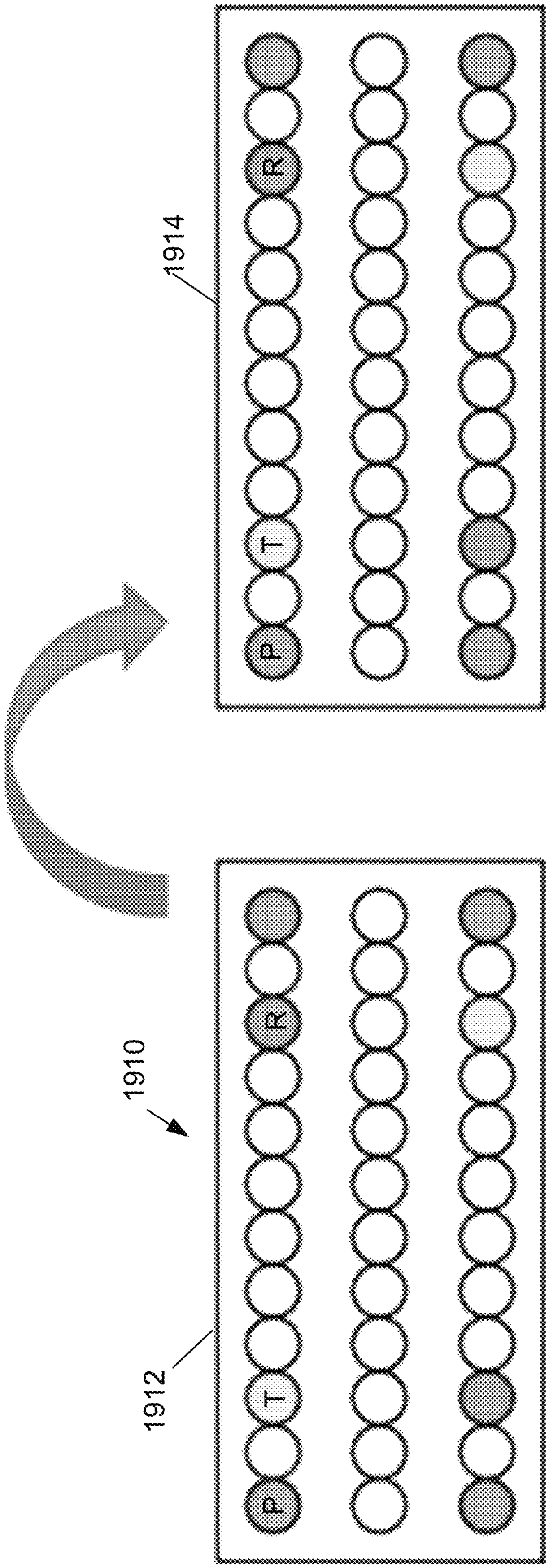
FIGS. 101, 102, 103A, and 103B are diagrams of examples of optical fiber connectors.

FIG. 101 is a diagram of an example of an optical fiber connector 1910 having a port map 1912 that is invariant against a 180-degree rotation. Rotating the optical fiber connector 1910 180 degrees results in a port map 1914 that is the same as the port map 1912. The port map 1912 also satisfies the second universal optical fiber interconnection cable port mapping property, e.g., the optical fiber connector is TX-RX pairwise symmetric and PS symmetric with respect to the center axis parallel to the column direction.

Figure 102:
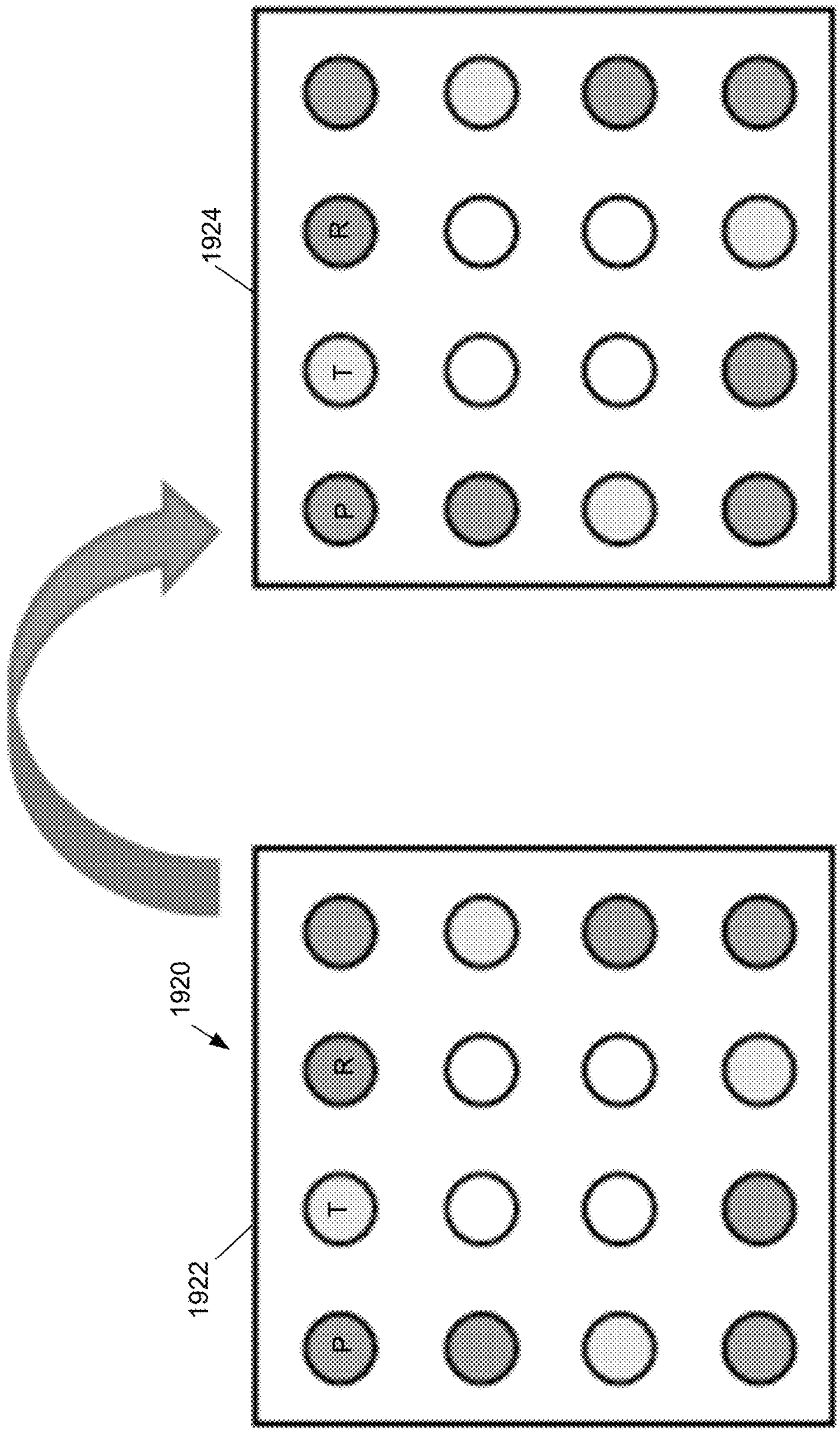

FIG. 102 is a diagram of an example of an optical fiber connector 1920 having a port map 1922 that is invariant against a 90-degree rotation. Rotating the optical fiber connector 1920 180 degrees results in a port map 1924 that is the same as the port map 1922. The port map 1922 also satisfies the second universal optical fiber interconnection cable port mapping property, e.g., the optical fiber connector is TX-RX pairwise symmetric and PS symmetric with respect to the center axis parallel to the column direction.

Figure 103A:
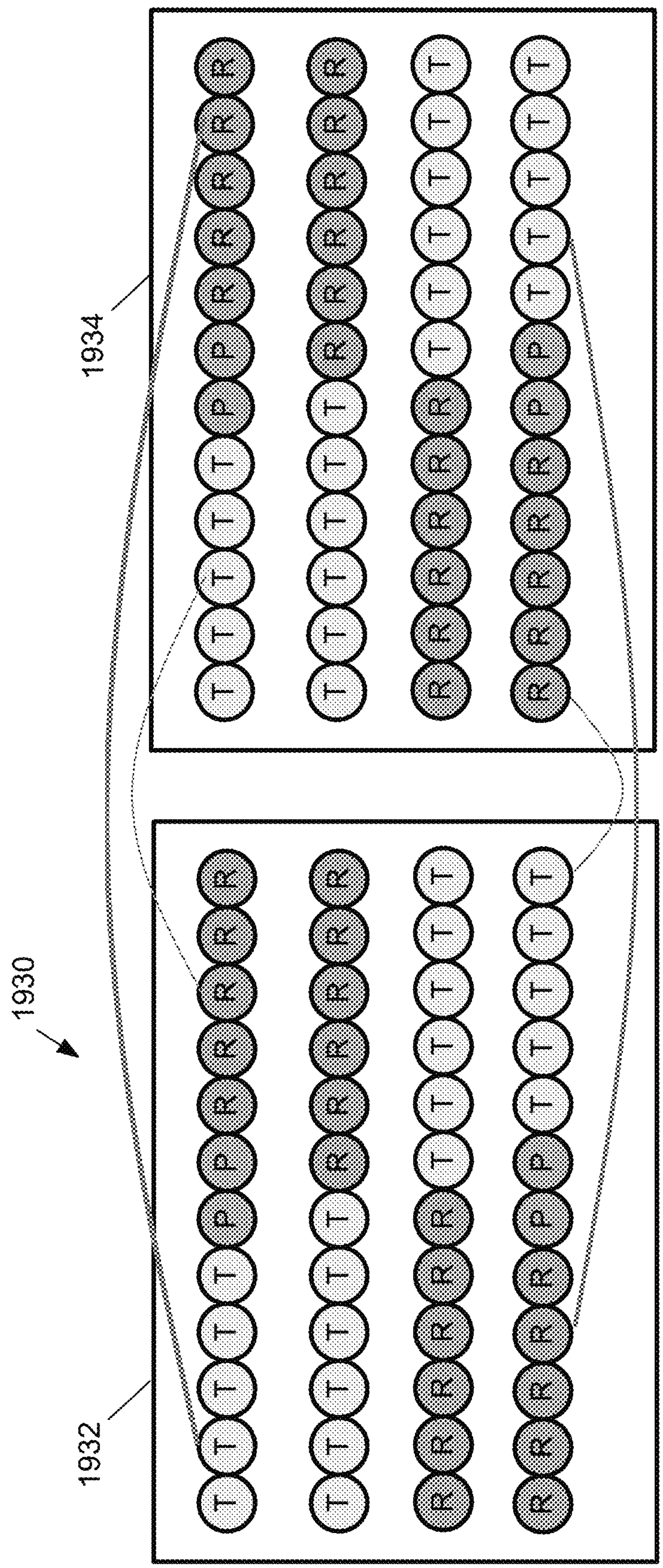

FIG. 103A is a diagram of an example of an optical fiber connector 1930 having a port map 1932 that is TX-RX pairwise symmetric and PS symmetric with respect to the center axis parallel to the column direction. When mirroring the port map 1932 to generate a mirror image 1934 and replacing each transmitter port with a receiver port as well as replacing each receiver port with a transmitter port in the mirror image 1934, the original port map 1932 is recovered. The mirror image 1934 is generated with respect to a reflection axis at the connector edge parallel to the column direction.

Figure 103B:
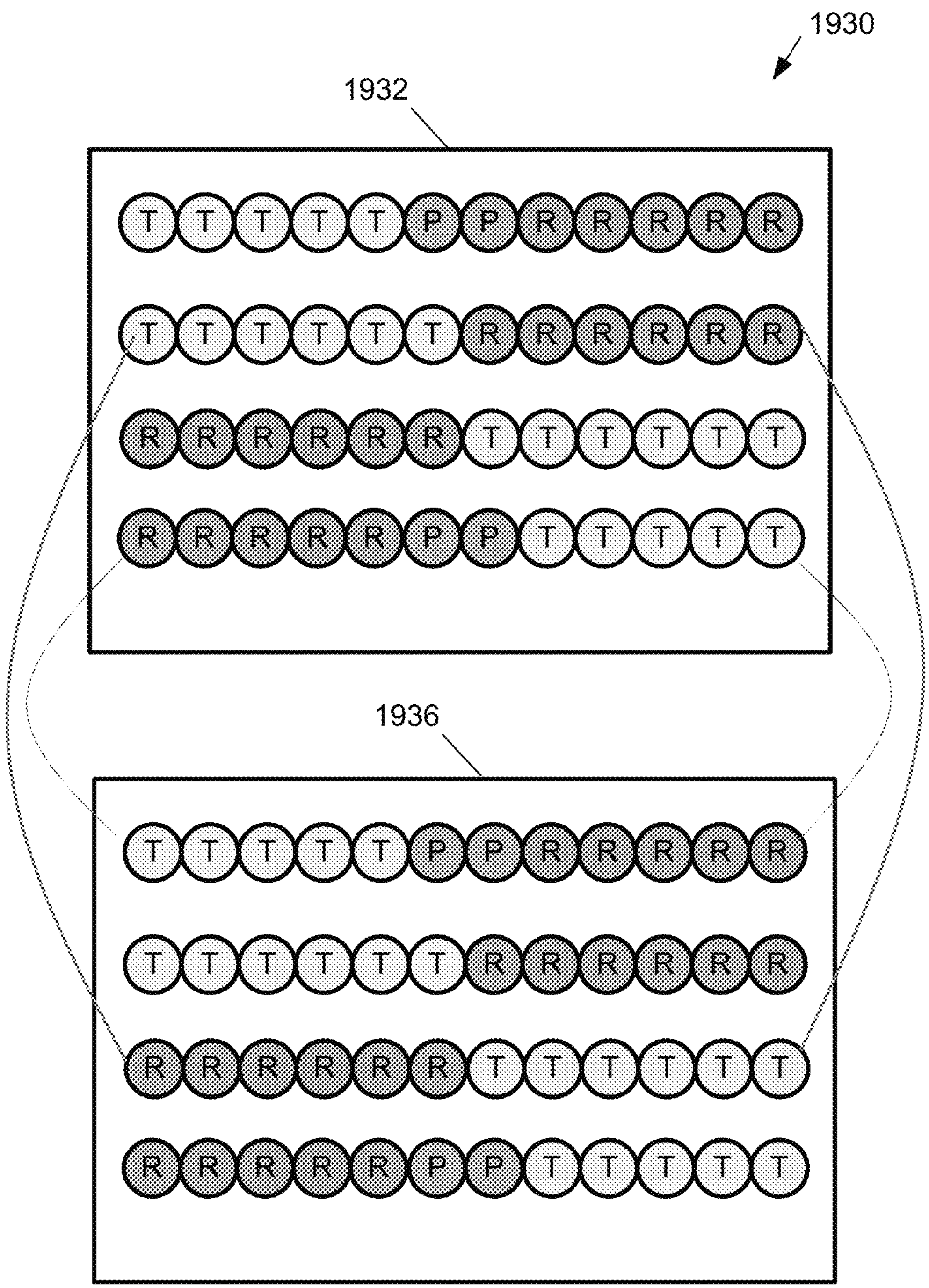

Referring to FIG. 103B, the port map 1932 of the optical fiber connector 1930 is also TX-RX pairwise symmetric and PS symmetric with respect to the center axis parallel to the row direction. When mirroring the port map 1932 to generate a mirror image 1936 and replacing each transmitter port with a receiver port as well as replacing each receiver port with a transmitter port in the mirror image 1936, the original port map 1932 is recovered. The mirror image 1936 is generated with respect to a reflection axis at the connector edge parallel to the row direction.

In the examples of FIGS. 69A to 78, 96 to 98, and 100, one or more fans (e.g., 1086, 1092, 1848, 1894) blow air across the heatsink (e.g., 1072, 1114, 1130, 1168, 1846) thermally coupled to the data processor (e.g., 1844). The co-packaged optical modules can generate heat, in which some of the heat can be directed toward the heatsink and dissipated through the heatsink. To further improve heat dissipation from the co-packaged optical modules, in some implementations, the rackmount system includes two fans placed side-by-side, in which a first fan blows air toward the co-packaged optical modules that are mounted on a front side of the printed circuit board (e.g., 1068), and a second fan blows air toward the heatsink that is thermally coupled to the data processor mounted on a rear side of the printed circuit board.

In some implementations, the one or more fans can have a height that is smaller than the height of the housing (e.g., 1824) of the rackmount server (e.g., 1820). The co-packaged optical modules (e.g., 1074) can occupy a region on the printed circuit board (e.g., 1068) that extends in the height direction greater than the height of the one or more fans. One or more baffles can be provided to guide the cool air from the one or more fans or intake air duct to the heatsink and the co-packaged optical modules. One or more baffles can be provided to guide the warm air from the heatsink and the co-packaged optical modules to an air duct that directs the air toward the rear of the housing.

When the one or more fans have a height that is smaller than the height of the housing (e.g., 1824), the space above and/or below the one or more fans can be used to place one or more remote laser sources. The remote laser sources can be positioned near the front panel and also near the co-packaged optical modules. This allows the remote laser sources to be serviced conveniently.

Figure 104:
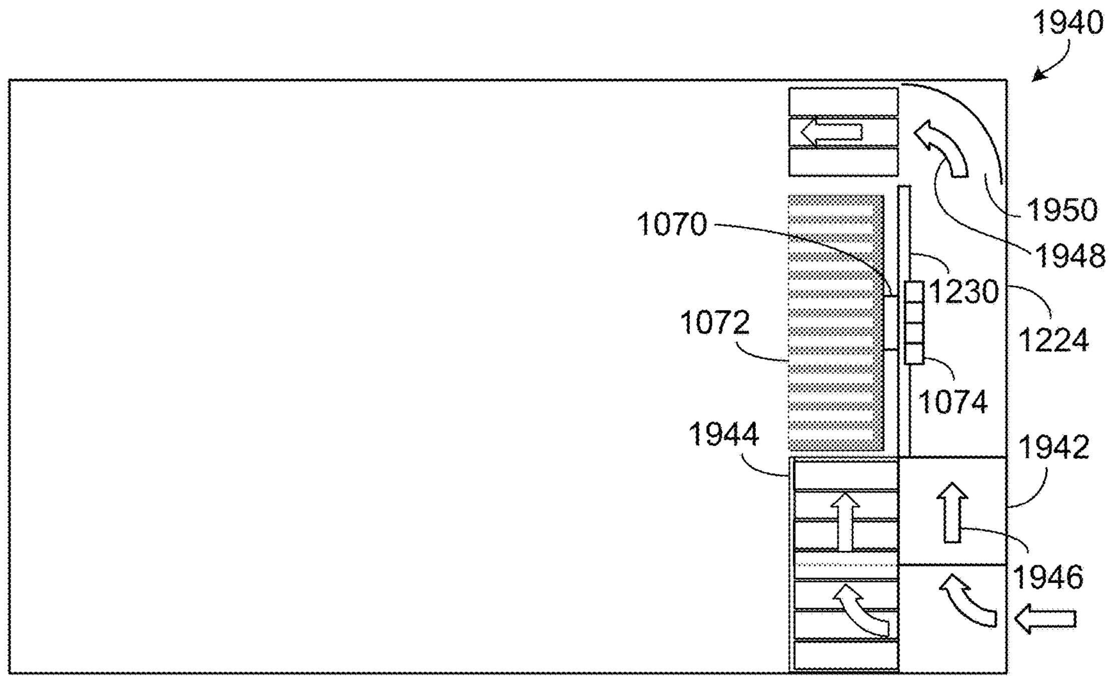
FIGS. 104 and 105 are a top view and a front view, respectively, of an example of a rackmount device that includes a vertical printed circuit board on which co-packaged optical modules are mounted.

FIG. 104 shows a top view of an example of a rackmount device 1940. The rackmount device 1940 includes a vertically oriented printed circuit board 1230 positioned at a distance behind a front panel 1224 that can be closed during normal operation of the device, and opened for maintenance of the device, similar to the configuration of the rackmount server 1220 of FIG. 77A. A data processing chip 1070 is electrically coupled to the rear side of the vertical printed circuit board 1230, and a heat dissipating device or heat sink 1072 is thermally coupled to the data processing chip 1070. Co-packaged optical modules 1074 are attached to the front side (i.e., the side facing the front exterior of the housing 1222) of the vertical printed circuit board 1230. A first fan 1942 is provided to blow air across the co-packaged optical modules 1074 at the front side of the printed circuit board 1230. A second fan 1944 is provided to blow air across the heatsink 1072 to the rear of the printed circuit board 1230. The first and second fans 1942, 1944 are positioned at the left of the printed circuit board 1230. Cooler air (represented by arrows 1946) is directed from the first and second fans 1942, 1944 toward the heatsink 1072 and the co-packaged optical modules 1074. Warmer air (represented by arrows 1948) is directed from the heatsink 1072 and the co-packaged optical modules 1074 through an air duct 1950 positioned at the right of the printed circuit board 1230 toward the rear of the housing.

Figure 105:
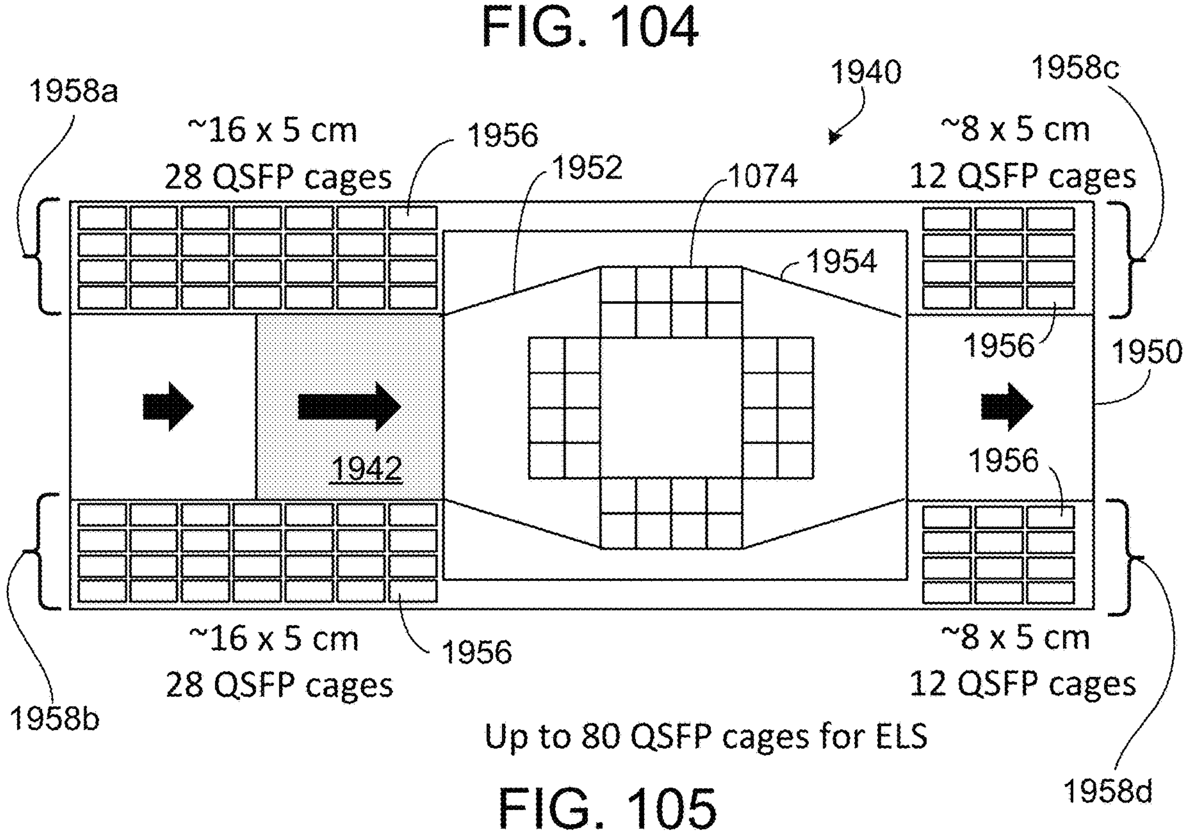

FIG. 105 shows a front view of the rackmount device 1940 when the front panel 1224 is opened to allow access to the co-packaged optical modules 1074. The first and second fans 1942, 1944 have a height that is smaller than the height of the region occupied by the co-packaged optical modules 1074. A first baffle 1952 directs the air from the fan 1942 to the region where the co-packaged optical modules 1074 are mounted, and a second baffle 1954 directs the air from the region where the co-packaged optical modules 1074 are mounted to the air duct 1950.

In this example, the first and second fans 1942, 1944 have a height that is smaller than the height of the housing of the rackmount device 1940. Remote laser sources 1956 can be positioned above and below the fans. Remote laser sources 1956 can also be positioned above and below the air duct 1950.

For example, a switch device having a 51.2 Tbps bandwidth can use thirty-two 1.6 Tbps co-packaged optical modules. Two to four power supply fibers (e.g., 1326 in FIG. 80A) can be provided for each co-packaged optical module, and a total of 64 to 128 power supply fibers can be used to provide optical power to the 32 co-packaged optical modules. One or two laser modules at 500 mW each can be used to provide the optical power to each co-packaged optical module, and 32 to 64 laser modules can be used to provide the optical power to the 32 co-packaged optical modules. The 32 to 64 laser modules can be fitted in the space above and below the fans 1942, 1944 and the air duct 1950.

For example, the area 1958*a* above the fans 1942, 1944 can have an area (measured along a plane parallel to the front panel) of about 16 cm×5 cm and can fit about 28 QSFP cages, and the area 1958*b* below the fans can have an area of about 16 cm×5 cm and can fit about 28 QSFP cages. The area 1958*c* above the air duct 1950 can have an area of about 8 cm×5 cm and can fit about 12 QSFP cages, and the area 1958*d* below the air duct 1950 can have an area of about 8 cm×5 cm and can fit about 12 QSFP cages. Each QSFP cage can include a laser module. In this example, a total of 80 QSFP cages can be fit above and below the fans and the air duct, allowing 80 laser modules to be positioned near the front panel and near the co-packaged optical modules, making it convenient to service the laser modules in the event of malfunction or failure.

Figure 106:
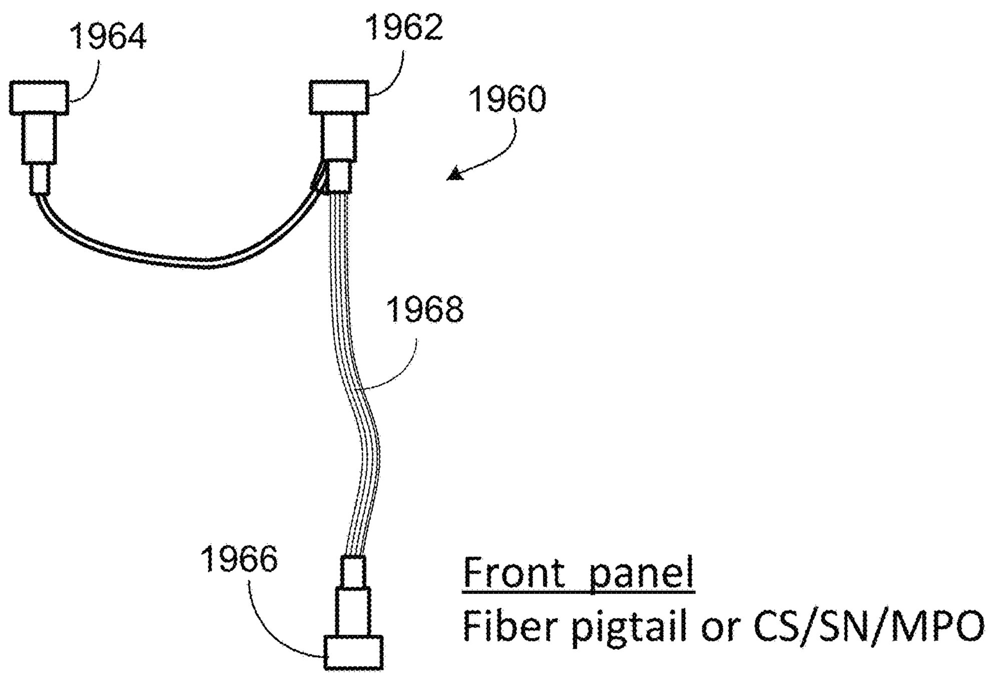
FIG. 106 is a diagram of an example of an optical cable assembly.
Figure 107:
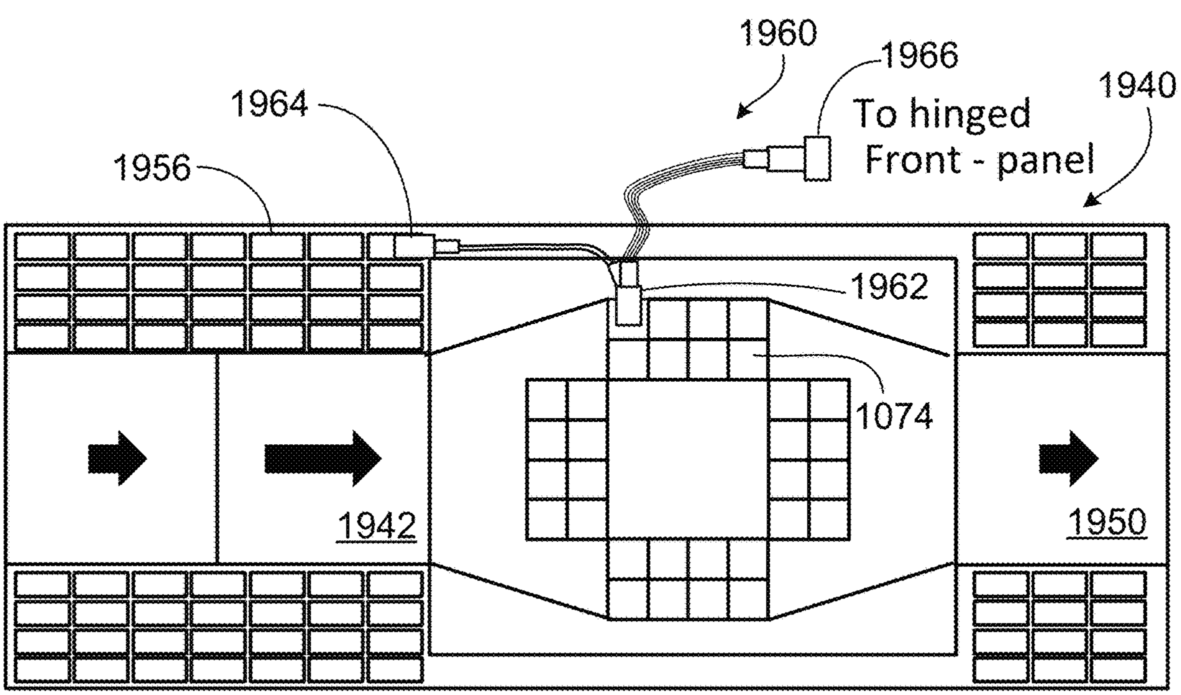
FIG. 107 is a front view diagram of the rackmount device with the optical cable assembly.

Referring to FIGS. 106 and 107, an optical cable assembly 1960 includes a first fiber connector 1962, a second fiber connector 1964, and a third fiber connector 1966. The first fiber connector 1962 can be optically connected to the co-packaged optical module 1074, the second fiber connector 1964 can be optically connected to the laser module, and the third fiber connector 1966 can be optically connected to the fiber connector part (e.g., 1232 of FIG. 77A) at the front panel 1224. The first fiber connector 1962 can have a configuration similar to that of the fiber connector 1342 of FIGS. 80C, 80D. The second fiber connector 1964 can have a configuration similar to that of the fiber connector 1346. The third fiber connector 1964 can have a configuration similar to that of the first fiber connector 1962 but without the power supply fiber ports. The optical fibers 1968 between the first fiber connector 1962 and the third fiber connector 1966 perform the function of the fiber jumper 1234 of FIG. 77A.

Figure 108:
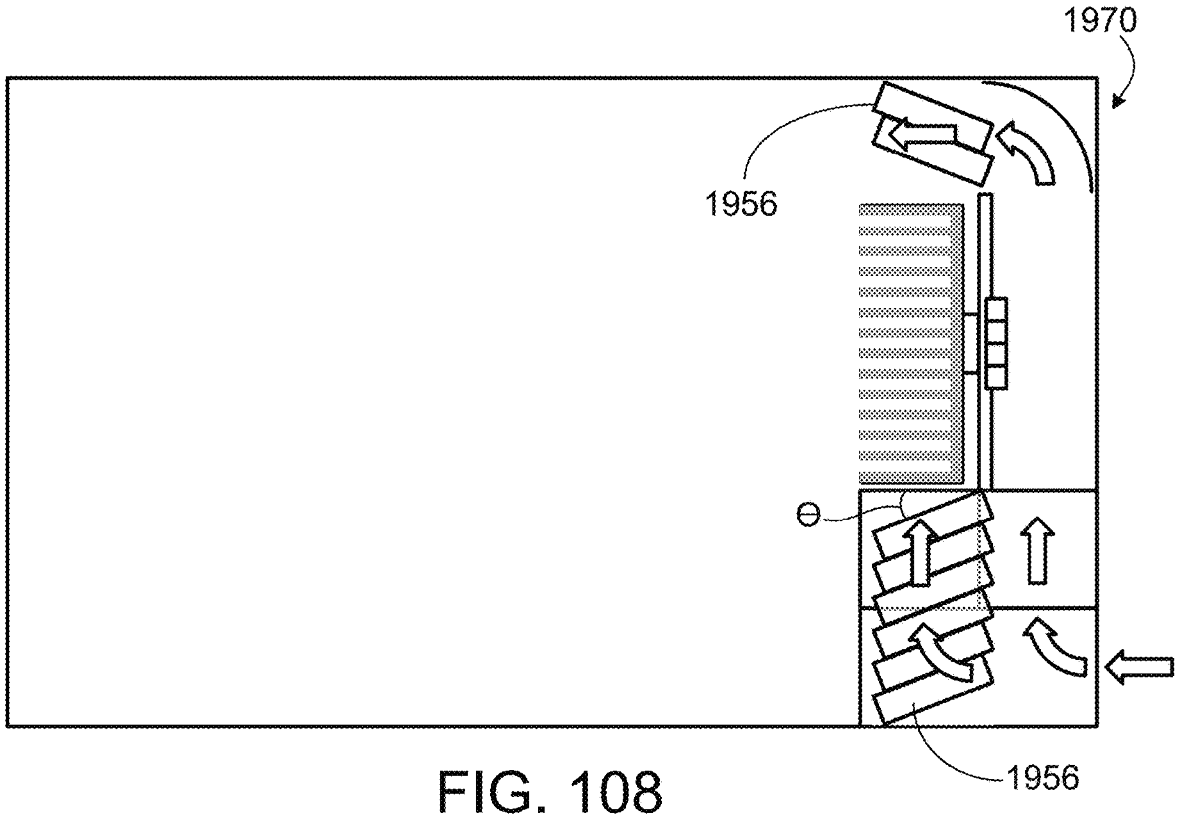
FIG. 108 is a top view diagram of an example of a rackmount device that includes a vertical printed circuit board on which co-packaged optical modules are mounted.

FIG. 108 is a diagram of an example of a rackmount device 1970 that is similar to the rackmount device 1940 of FIGS. 104, 105, 107, except that the optical axes of the laser modules 1956 are oriented at an angle θ relative to the front-to-rear direction, 0<θ<90°. This can reduce the bending of the optical fibers that are optically connected to the laser modules 1956.

Figure 109:
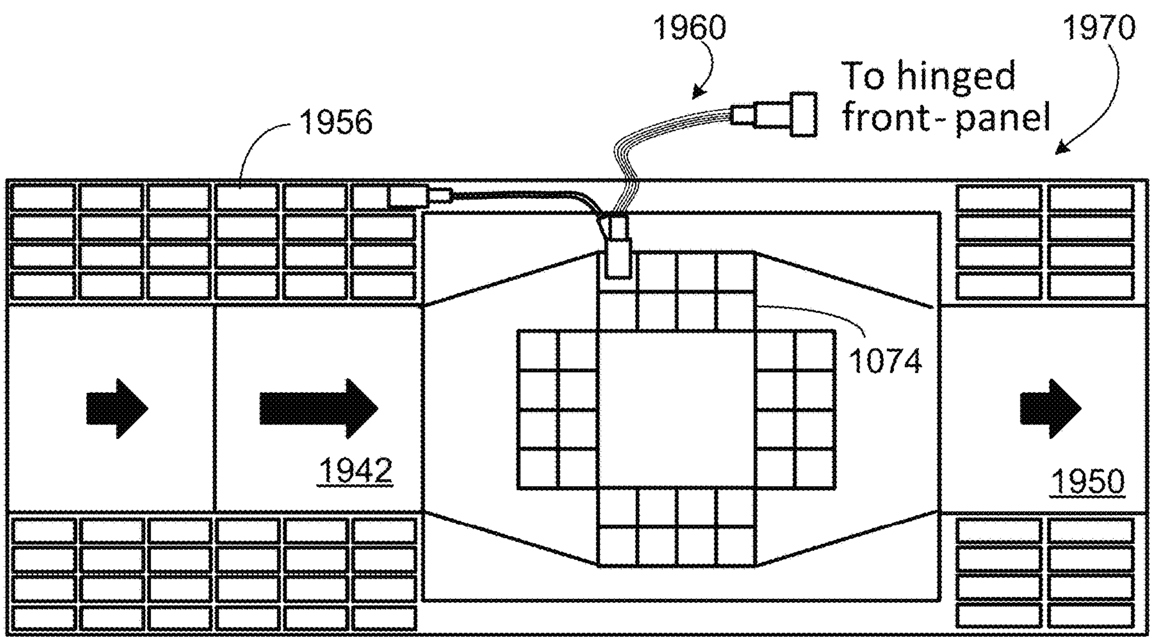
FIG. 109 is a front view diagram of the rackmount device with the optical cable assembly.

FIG. 109 is a diagram showing the front view of the rackmount device 1970, with the optical cable assembly 1960 optically connected to modules of the rackmount device 1970. When the laser modules 1956 are oriented at an angle θ relative to the front-to-rear direction, 0 <θ<90°, fewer laser modules 1956 can be placed in the spaces above and below the fans 1942, 1944 and the air duct 1950, as compared to the example of FIGS. 104, 105, 107, in which the optical axes of the laser modules 1956 are oriented parallel to the front-to-rear direction. In the example of FIG. 109, a total of 64 laser modules are placed in the spaces above and below the fans 1942, 1944 and the air duct 1950.

Figure 110:
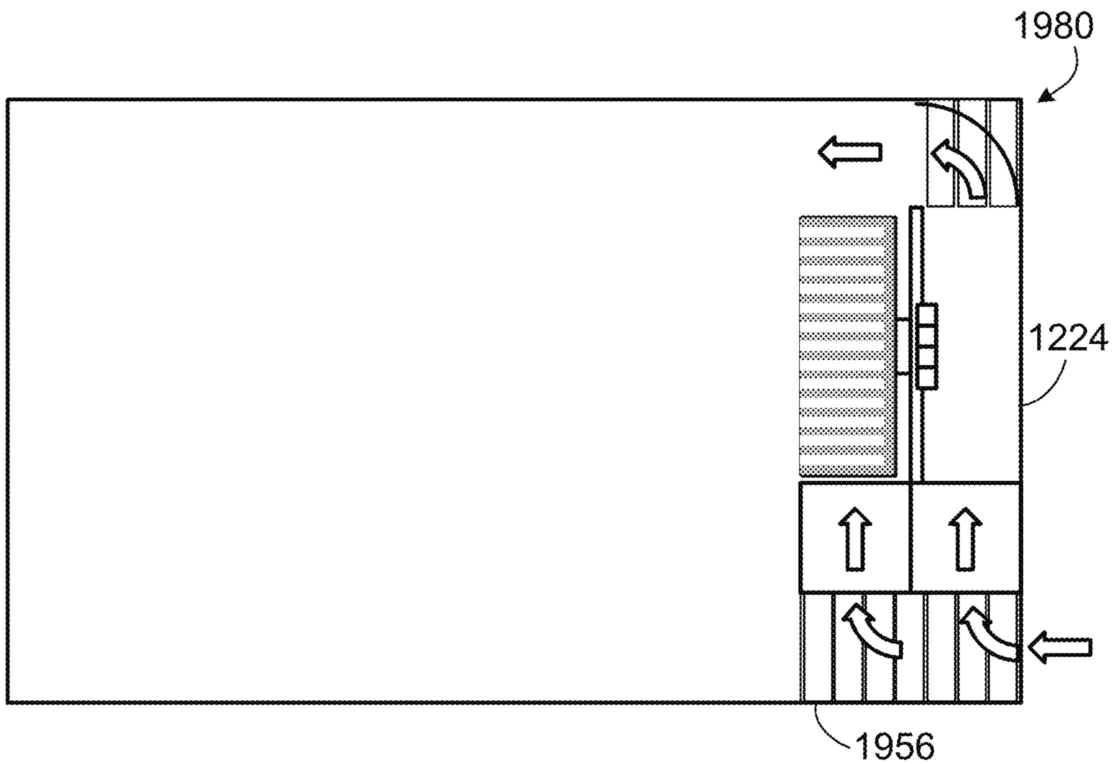
FIGS. 110 and 111 are a top view and a front view, respectively, of an example of a rackmount device.

FIG. 110 is a top view diagram of an example of a rackmount device 1980 that is similar to the rackmount device 1940 of FIGS. 104, 105, 107, except that the optical axes of the laser modules 1956 are oriented parallel to the front panel 1224. This can reduce the bending of the optical fibers that are optically connected to the laser modules 1956.

Figure 111:
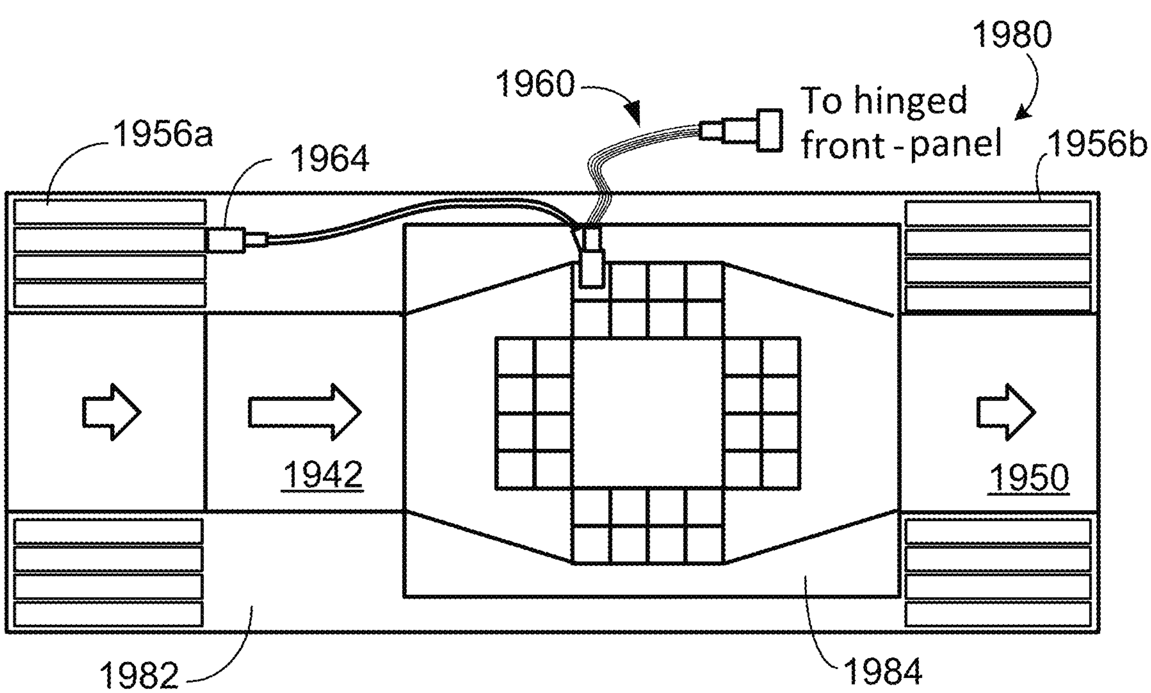

FIG. 111 is a front view diagram of the rackmount device 1980, with the optical cable assembly 1960 optically connected to modules of the rackmount device 1980. The laser modules 1956*a* are positioned to the left side of the space above and below the fans 1942, 1944. Sufficient space (e.g., 1982) is provided at the right of the laser modules 1956*a* to allow the user to conveniently connect or disconnect the fiber connectors 1964 to the laser modules 1956*a*. The laser modules 1956*b* are positioned above and below the air duct 1950. Sufficient space (e.g., 1984) is provided at the left of the laser modules 1956*b* to allow the user to conveniently connect or disconnect the fiber connectors 1964 to the laser modules 1956*b*.

Figure 112:
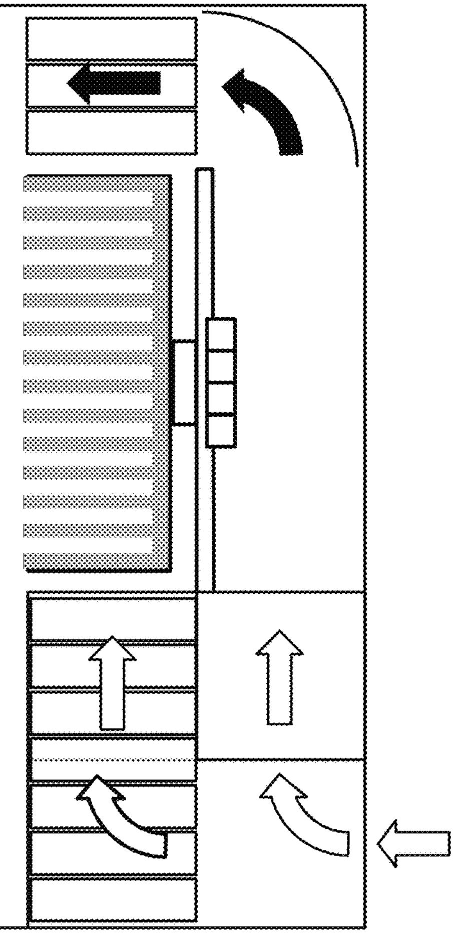
FIG. 112 is diagram of an example of a rackmount device with example parameter values.

Referring to FIG. 112, a table 1990 shows example parameter values of the rackmount device 1940.

Figure 113:
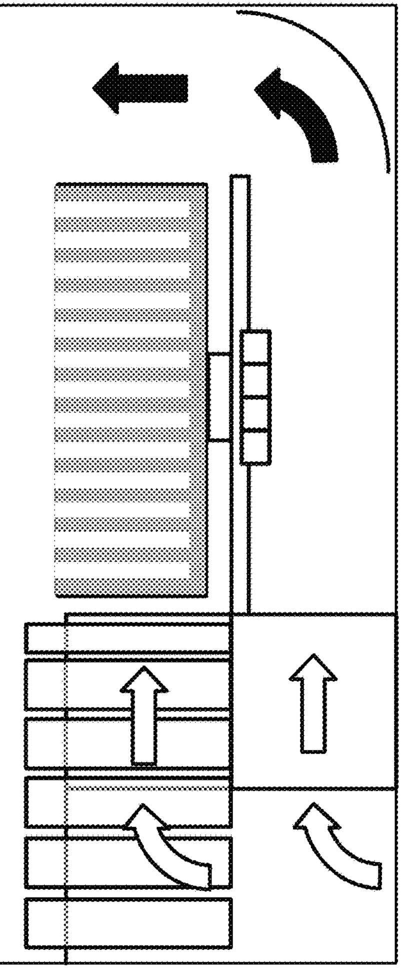
FIGS. 113 and 114 show another example of a rackmount device with example parameter values.
Figure 114:
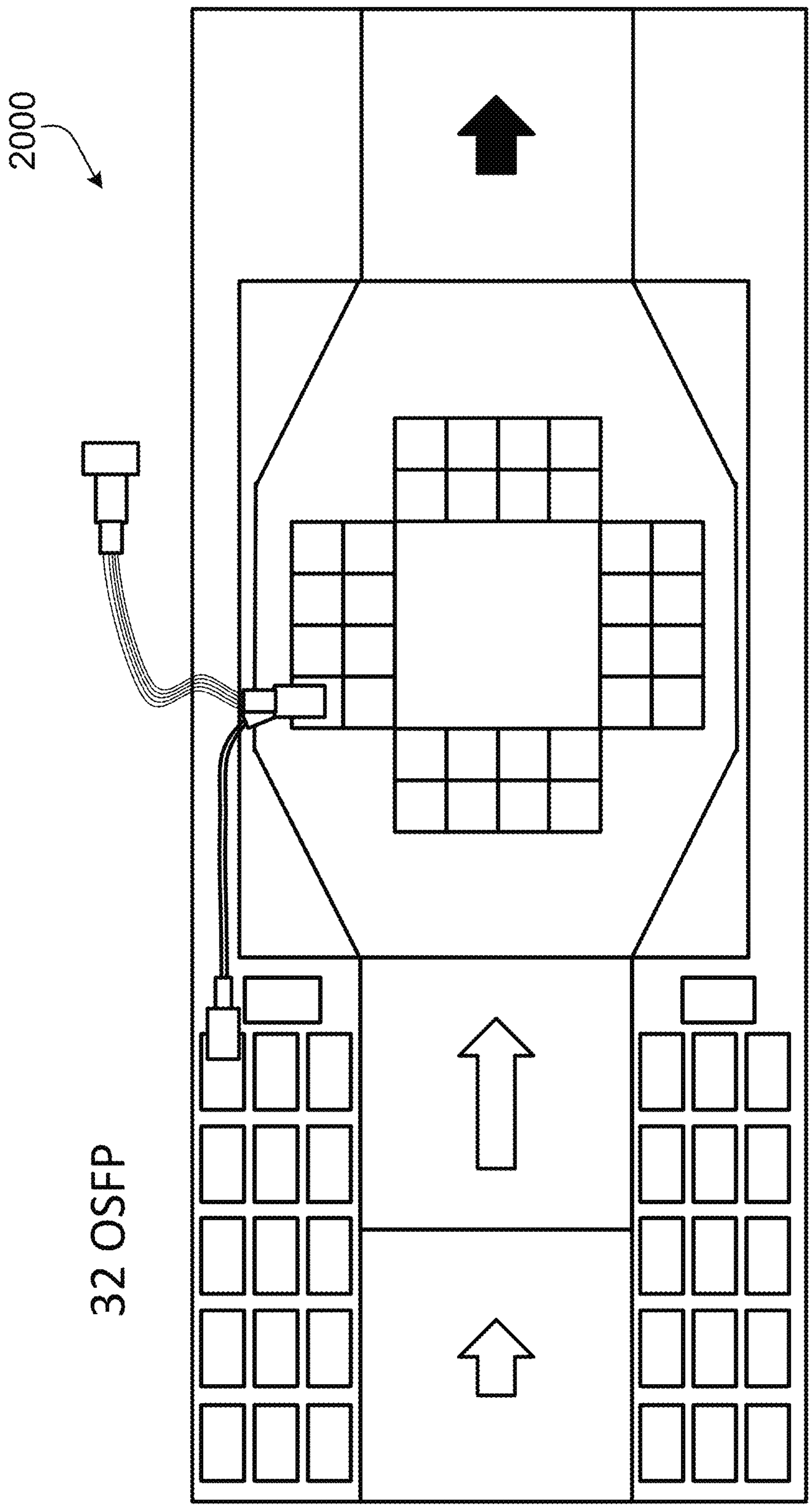

FIGS. 113 and 114 show another example of a rackmount device 2000 and example parameter values.

Figure 115:
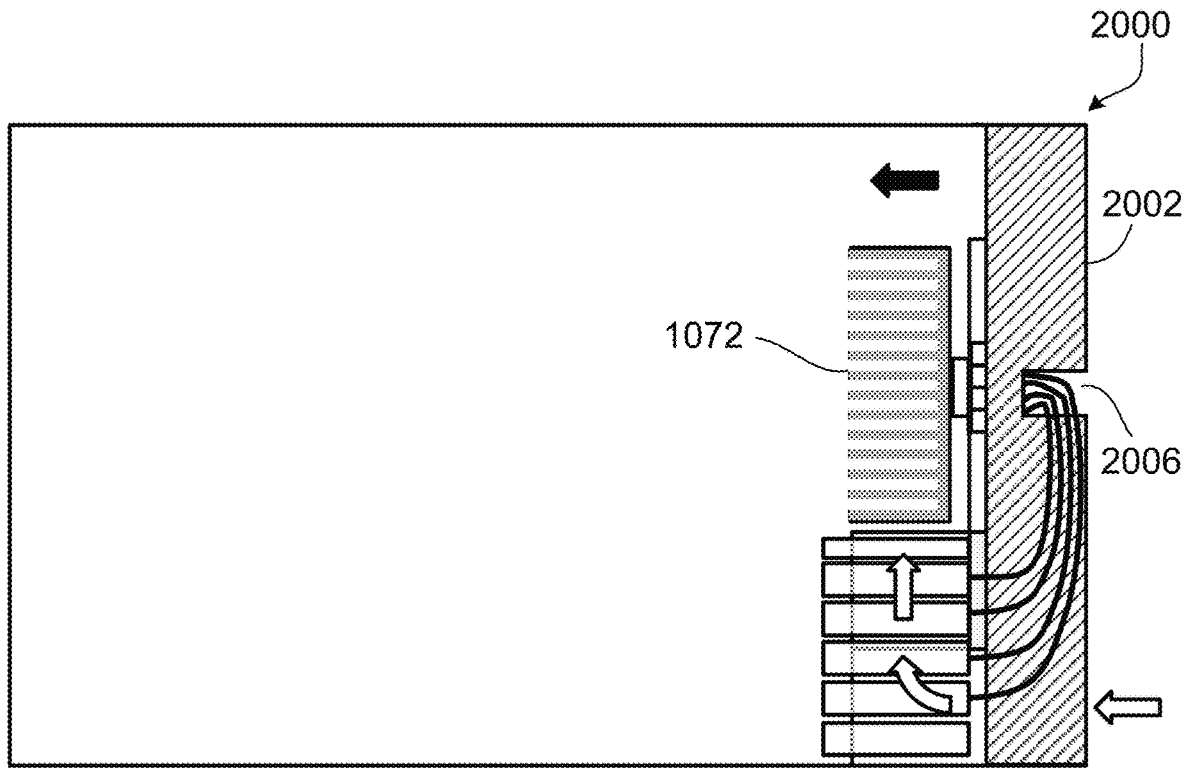
FIGS. 115 and 116 are a top view and a front view, respectively, of an example of a rackmount device.
Figure 116:
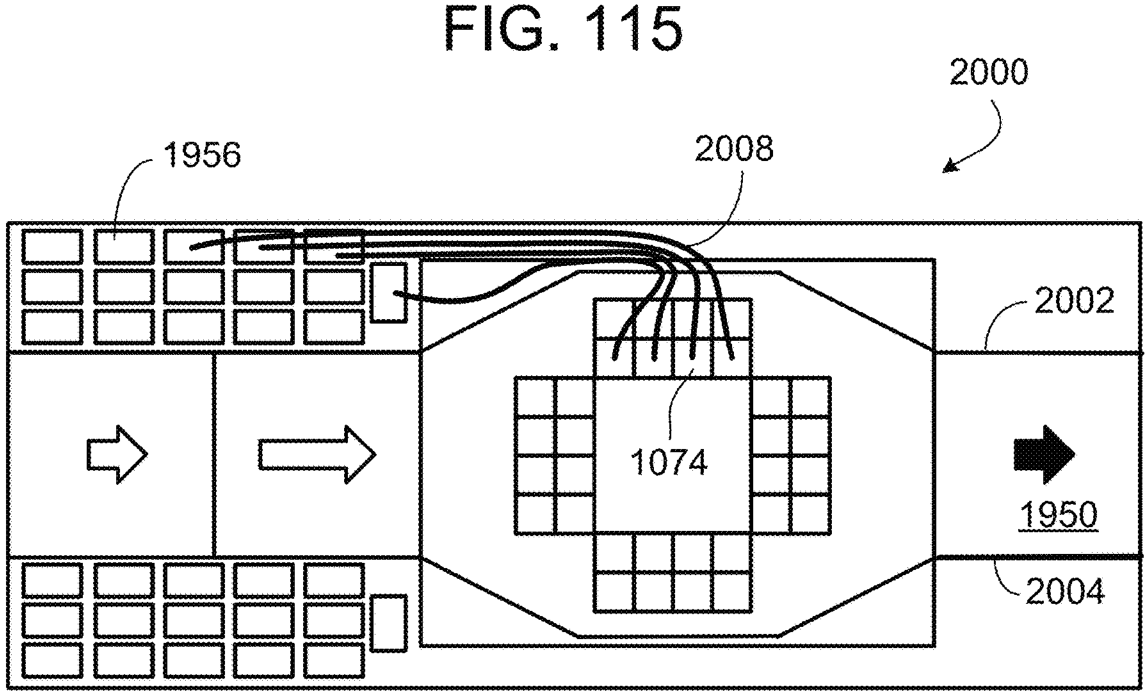

FIGS. 115 and 116 are a top view and a front view, respectively, of the rackmount device 2000. An upper baffle 2002 and a lower baffle 2004 are provided to guide the air flowing from the fans 1942, 1944 to the heatsink 1072 and the co-packaged optical modules 1074, and from the heatsink 1072 and the co-packaged optical modules 1074 to the air duct 1950. In this example, portions of the upper and lower baffles 2002, 2004 form portions of the upper and lower walls of the air duct 1950.

The upper baffle 2002 includes a cutout or opening 2007 that allows optical fibers 2008 to pass through. As shown in FIG. 116, the optical fibers 2008 extend from the co-packaged optical modules 1074*a* upward, through the cutout or opening 2007 in the upper baffle 2002, and extend toward the laser modules 1956 along the space above the upper baffle 2002. The upper baffle 2002 allows the optical fibers 2008 to be better organized to reduce the obstruction to the air flow caused by the optical fibers 2008. The lower baffle 2004 has a similar cutout or opening to help organize the optical fibers that are optically connected to the laser modules located in the space below the fans 1942, 1944.

Figure 117:
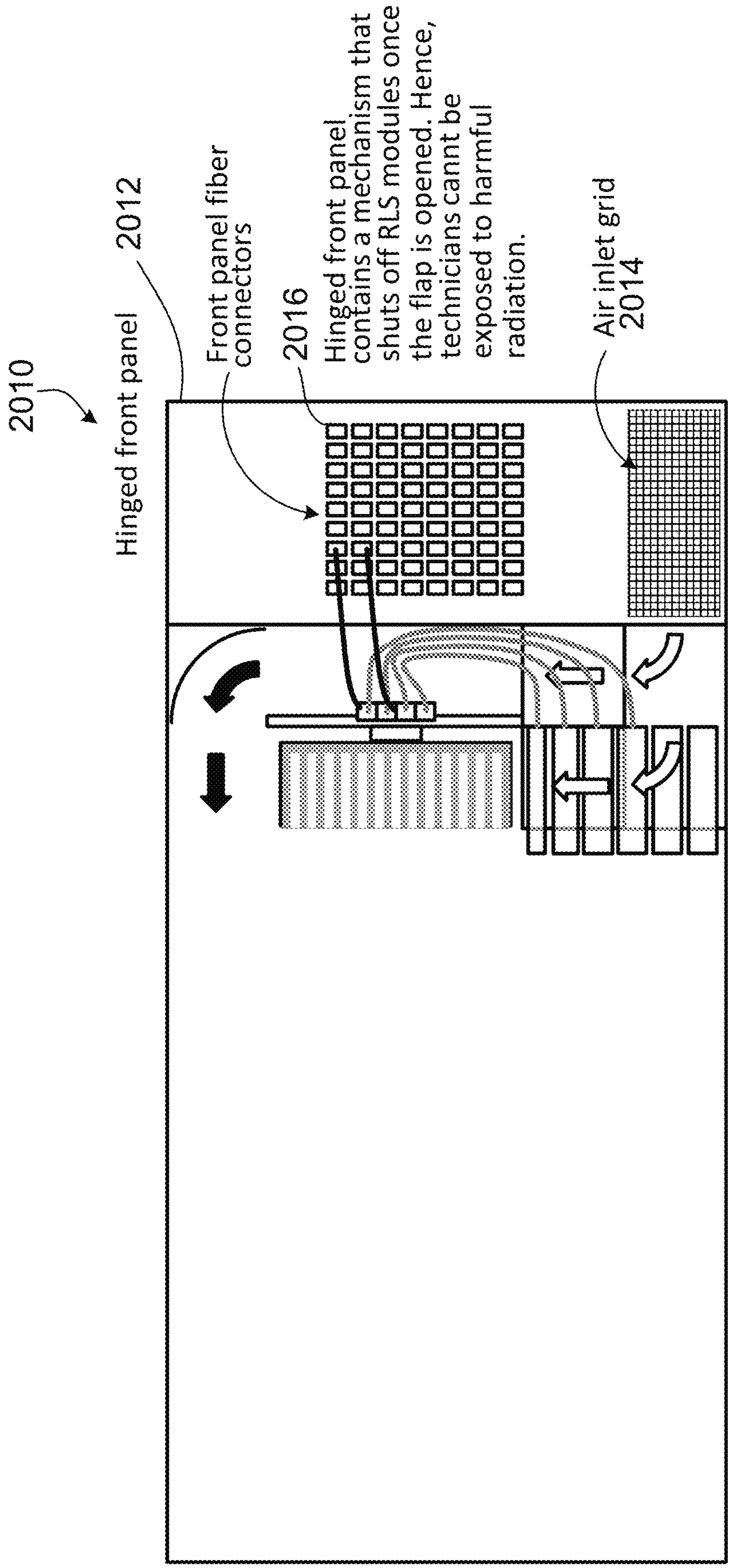
FIGS. 117 to 122 are diagrams of examples of systems that include co-packaged optical modules.

FIG. 117 is a top view diagram of a system 2010 that includes a front panel 2012, which can be rotatably coupled to the lower panel by a hinge. The front panel 2012 includes an air inlet grid 2014 and an array of fiber connector parts 2016. Each fiber connector part 2016 can be optically coupled to the third fiber connector 1966 of the cable assembly 1960 of FIG. 106. In some implementations, the hinged front panel includes a mechanism that shuts off the remote laser source modules 1956, or reduces the power to the remote laser source modules 1956, once the flap is opened. This prevents the technicians from being exposed to harmful radiation.

Figure 118:
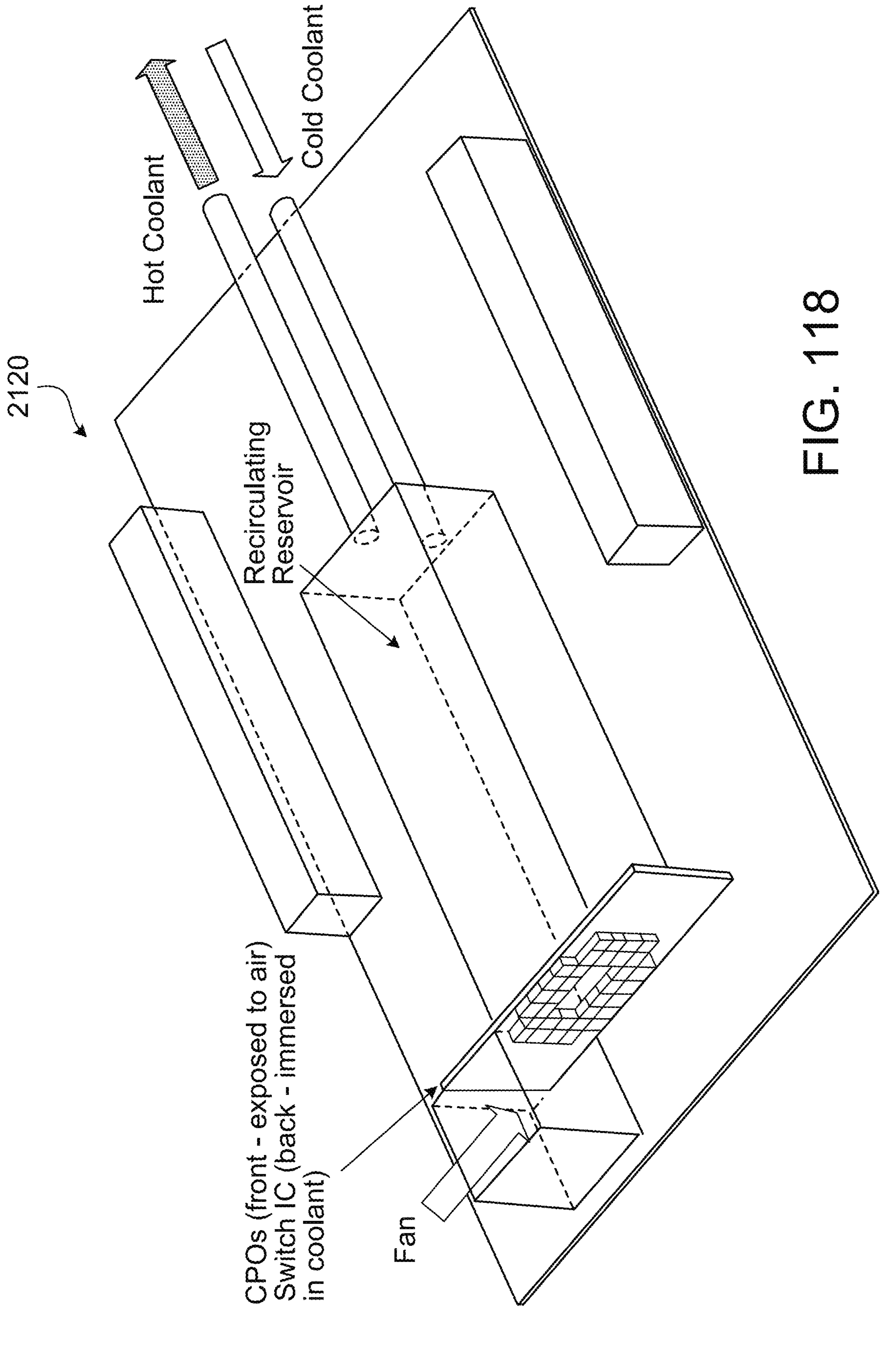
Figure 119:
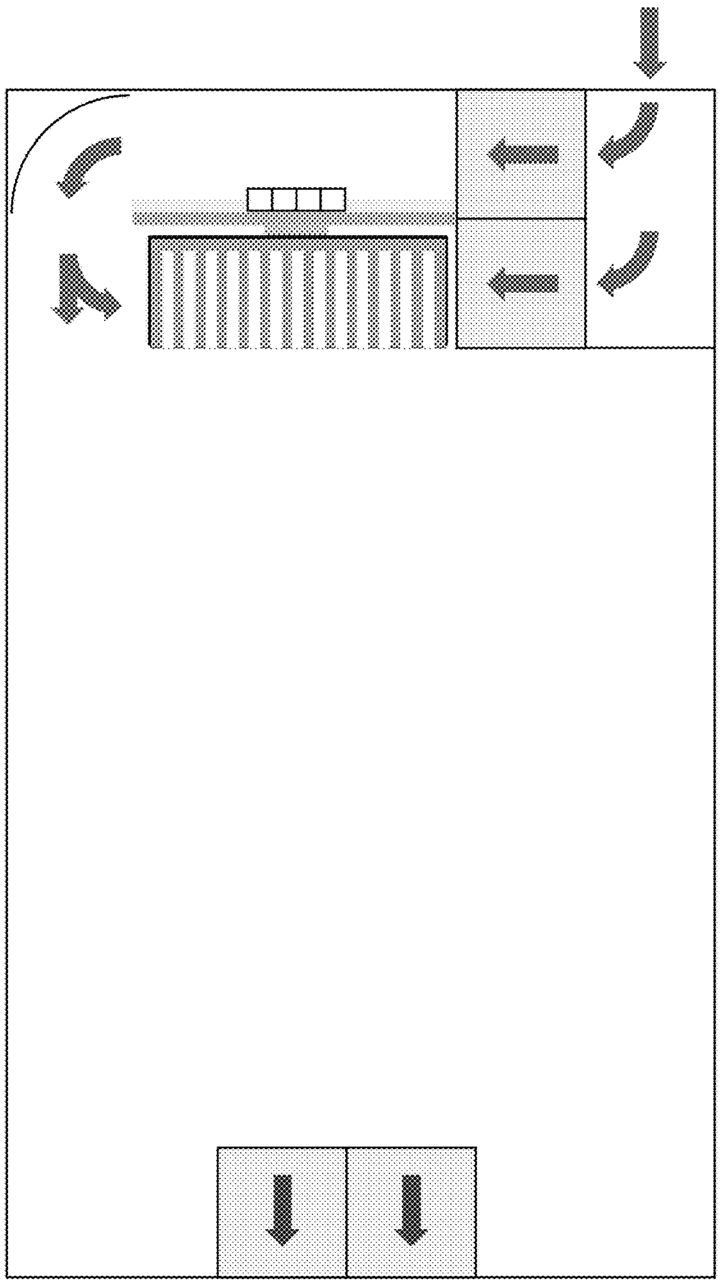
Figure 120:
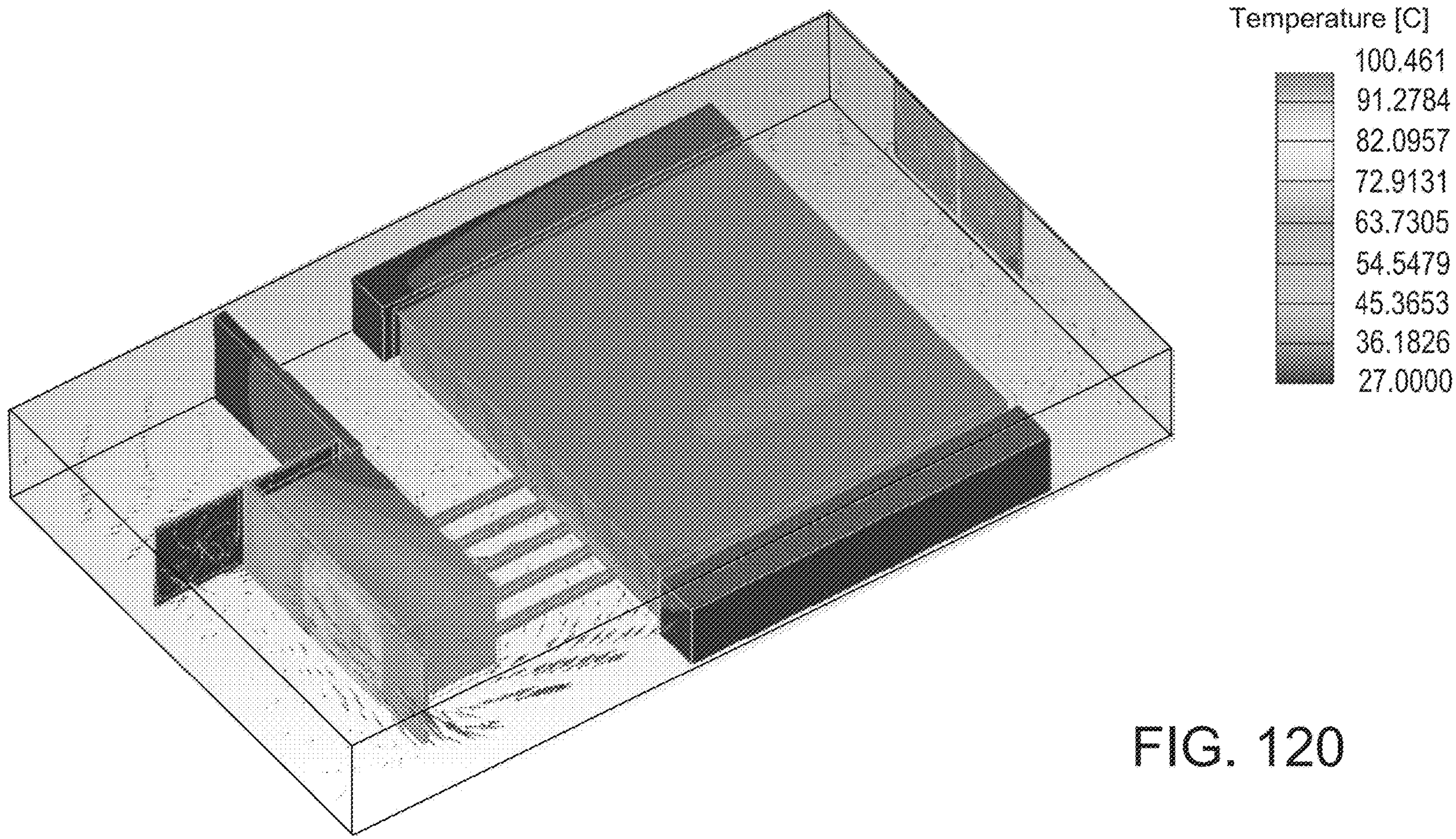
Figure 121:
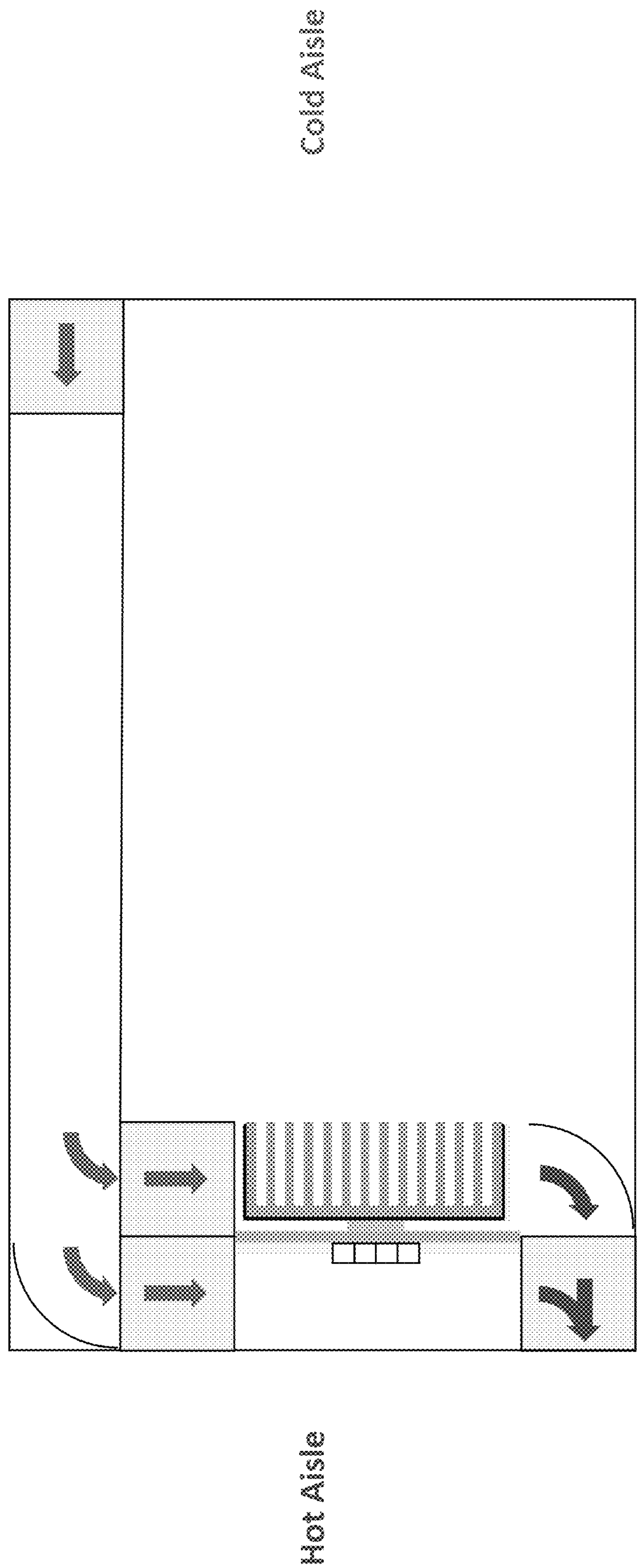

FIG. 118 is a diagram of an example of a system 2120 that includes a recirculating reservoir that circulates a coolant to carry heat away from the data processor, which for example can be a switch integrated circuit. In this example, the data is immersed in the coolant, and the inlet fan is used to blow air across the surface of the co-packaged optical modules to a heat dissipating device thermally coupled to the co-packaged optical modules.

Figure 122:
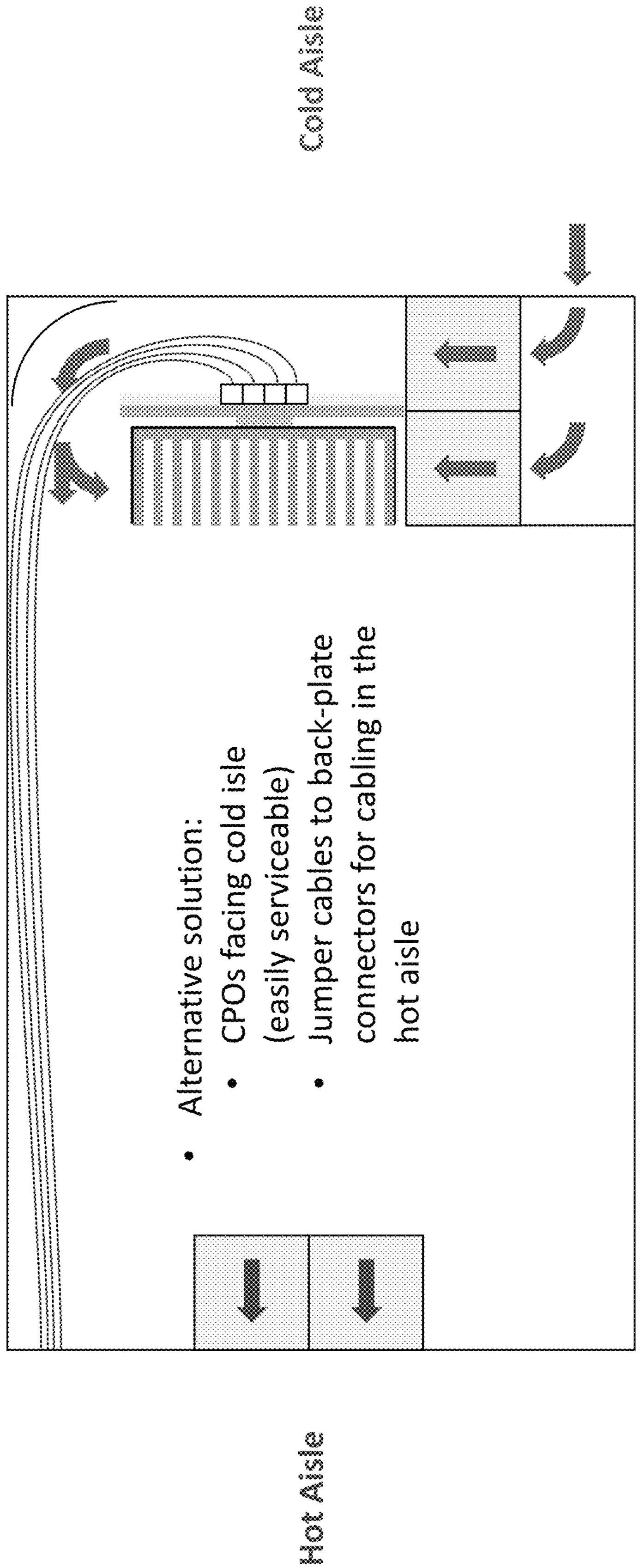

FIGS. 119 to 122 are examples that provide heat dissipating solutions for co-packaged optical modules, taking into consideration the locations of "hot aisles" in data centers. In case it is desirable that fiber cabling be done on the back side of a rack (where hot air is blown out, hence "hot aisle"), one can either use a duct inside the box to transfer cold air to the co-packaged optical modules that are now mounted on the back side (FIG. 121) or one can use fiber jumper cables to connect the co-packaged optical modules that are still facing the front aisle (towards the cold aisle) to connect to a "back-panel" facing the hot aisle (FIG. 122).

Figure 123:
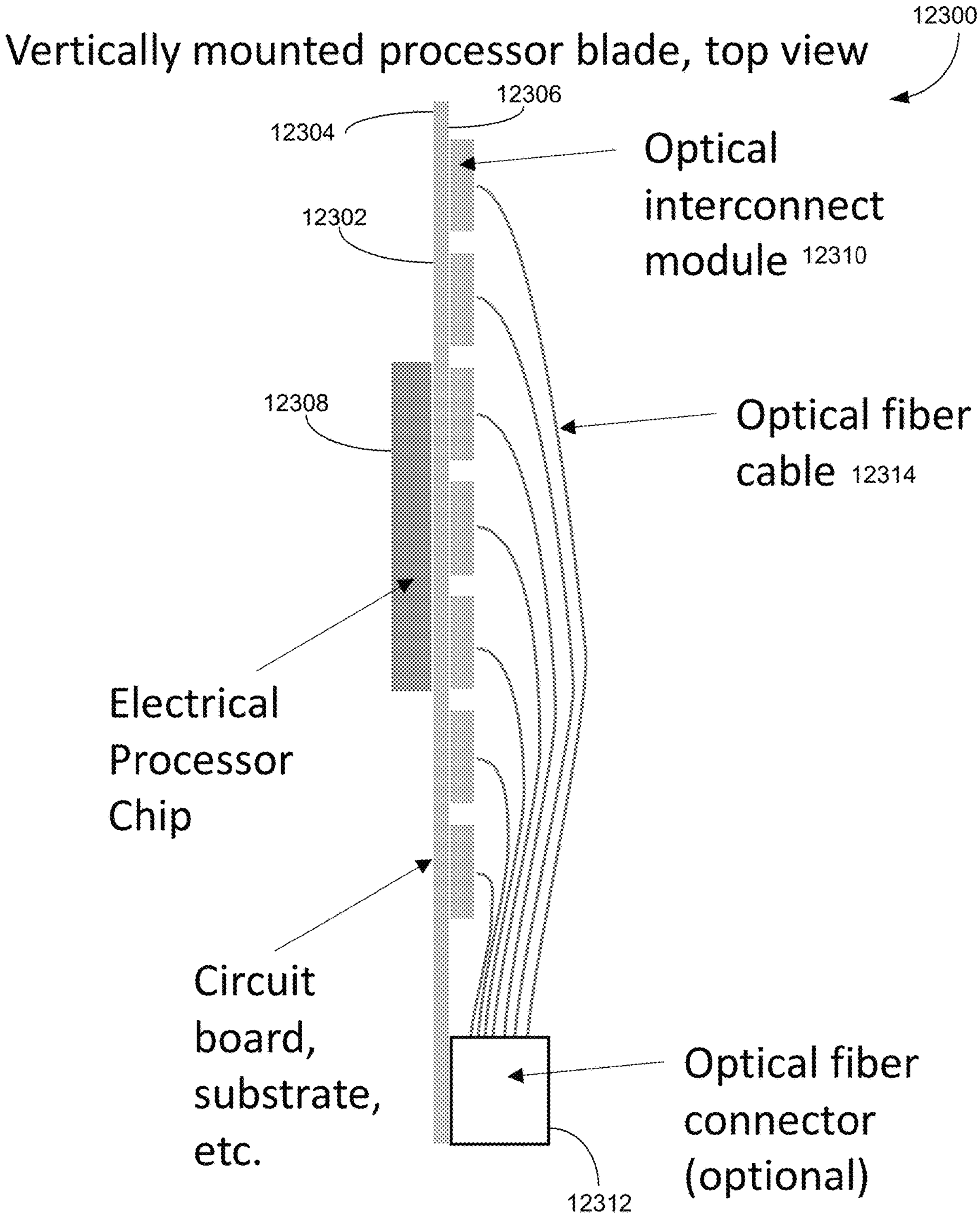
FIG. 123 is a diagram of an example of a vertically mounted processor blade.

Referring to FIG. 123, in some implementations, a vertically mounted processor blade 12300 can include a substrate 12302 having a first side 12304 and a second side 12306. The substrate 12302 can be, e.g., a printed circuit board. An electronic processor 12308 is mounted on the first side 12304 of the substrate 12302, in which the electronic processor 12308 is configured to process or store data. For example, the electronic processor 12308 can be a network switch, a central processor unit, a graphics processor unit, a tensor processing unit, a neural network processor, an artificial intelligence accelerator, a digital signal processor, a microcontroller, or an application specific integrated circuit (ASIC). For example, the electronic processor 12308 can be a memory device or a storage device. In this context, processing of data includes writing data to, or reading data from, the memory or storage device, and optionally performing error correction. The memory device can be, e.g., random access memory (RAM), which can include, e.g., dynamic RAM (DRAM) or static RAM (SRAM). The storage device can include, e.g., solid state memory or drive, which can include, e.g., one or more non-volatile memory (NVM) Express® (NVMe) SSD (solid state drive) modules, or Intel® Optane™ persistent memory. The example of FIG. 123 shows one electronic processor 12308, through there can also be multiple electronic processors 12308 mounted on the substrate 12302.

The vertically mounted processor blade 12300 includes one or more optical interconnect modules or co-packaged optical modules 12310 mounted on the second side 12306 of the substrate 12302. For example, the optical interconnect module 12310 includes an optical port configured to receive optical signals from an external optical fiber cable, and a photonic integrated circuit configured to generate electrical signals based on the received optical signals, and transmit the electrical signals to the electronic processor 12308. The photonic integrated circuit can also be configured to generate optical signals based on electrical signals received from the electronic processor 12308, and transmit the optical signals to the external optical fiber cable. The optical interconnect module or co-packaged optical module 12310 can be similar to, e.g., the integrated optical communication device 262 of FIG. 6; 282 of FIGS. 7-9; 462, 466, 448, 472 of FIG. 17; 612 of FIG. 23; 684 of FIG. 26; 704 of FIG. 27; 724 of FIG. 28; the co-packaged optical module 1074 of FIGS. 68A, 69A, 70, 71A; 1132 of FIG. 73A; 1160 of FIG. 74A; 1074 of FIGS. 75A, 75B, 77A, 77B, 104, 107, 109, 116; 1312 of FIGS. 80A, 82A, 84A; or 1564, 1582 of FIG. 87A. In the example of FIG. 123, the optical interconnect module or co-packaged optical module 12310 does not necessarily have to include serializers/deserializers (SerDes), e.g., 216, 217 of FIGS. 2 to 8 and 10 to 12. The optical interconnect module or co-packaged optical module 12310 can include the photonic integrated circuit 12314 without any serializers/deserializers. For example, the serializers/deserializers can be mounted on the substrate separate from the optical interconnect module or co-packaged optical module 12310.

For example, the substrate 12302 can include electrical connectors that extend from the first side 12304 to the second side 12306 of the substrate 12302, in which the electrical connectors pass through the substrate 12302 in a thickness direction. For example, the electrical connectors can include vias of the substrate 12302. The optical interconnect module 12310 is electrically coupled to the electronic processor 12308 by the electrical connectors.

For example, the vertically mounted processor blade 12300 can include an optional optical fiber connector 12312 for connection to an optical fiber cable bundle. The optical fiber connector 12312 can be optically coupled to the optical interconnector modules 12310 through optical fiber cables 12314. The optical fiber cables 12314 can be connected to the optical interconnect modules 12310 through a fixed connector (in which the optical fiber cable 12314 is securely fixed to the optical interconnect module 12310) or a removable connector in which the optical fiber cable 12314 can be easily detached from the optical interconnect module 12310, such as with the use of an optical connector part 266 as shown in FIG. 6. The removable connector can include a structure similar to the mechanical connector structure 900 of FIGS. 46, 47 and 51A to 57.

For example, the substrate 12302 can be positioned near from front panel of the housing of the server that includes the vertically mounted processor blade 12300, or away from the front panel and located anywhere inside the housing. For example, the substrate 12302 can be parallel to the front panel of the housing, perpendicular to the front panel, or oriented in any angle relative to the front panel. For example, the substrate 12302 can be oriented vertically to facilitate the flow of hot air and improve dissipation of heat generated by the electronic processor 12308 and/or the optical interconnect modules 12310.

For example, the optical interconnect module or co-packaged optical module 12310 can receive optical signals through vertical or edge coupling. FIG. 123 shows an example in which the optical fiber cables are vertically coupled to the optical interconnect modules or co-packaged optical modules 12310. It is also possible to connect the optical fiber cables to the edges of the optical interconnect modules or co-packaged optical modules 12310. For example, optical fibers in the optical fiber cable can be attached in-plane to the photonic integrated circuit using, e.g., V-groove fiber attachments, tapered or un-tapered fiber edge coupling, etc., followed by a mechanism to direct the light interfacing to the photonic integrated circuit to a direction that is substantially perpendicular to the photonic integrated circuit, such as one or more substantially 90-degree turning mirrors, one or more substantially 90-degree bent optical fibers, etc.

For example, the optical interconnect modules 12310 can receive optical power from an optical power supply, such as 1322 of FIG. 80A, 1558 of FIG. 87A. For example, the optical interconnect modules 12310 can include one or more of optical coupling interfaces 414, demultiplexers 419, splitters 415, multiplexers 418, receivers 421, or modulators 417 of FIG. 20.

Figure 124:
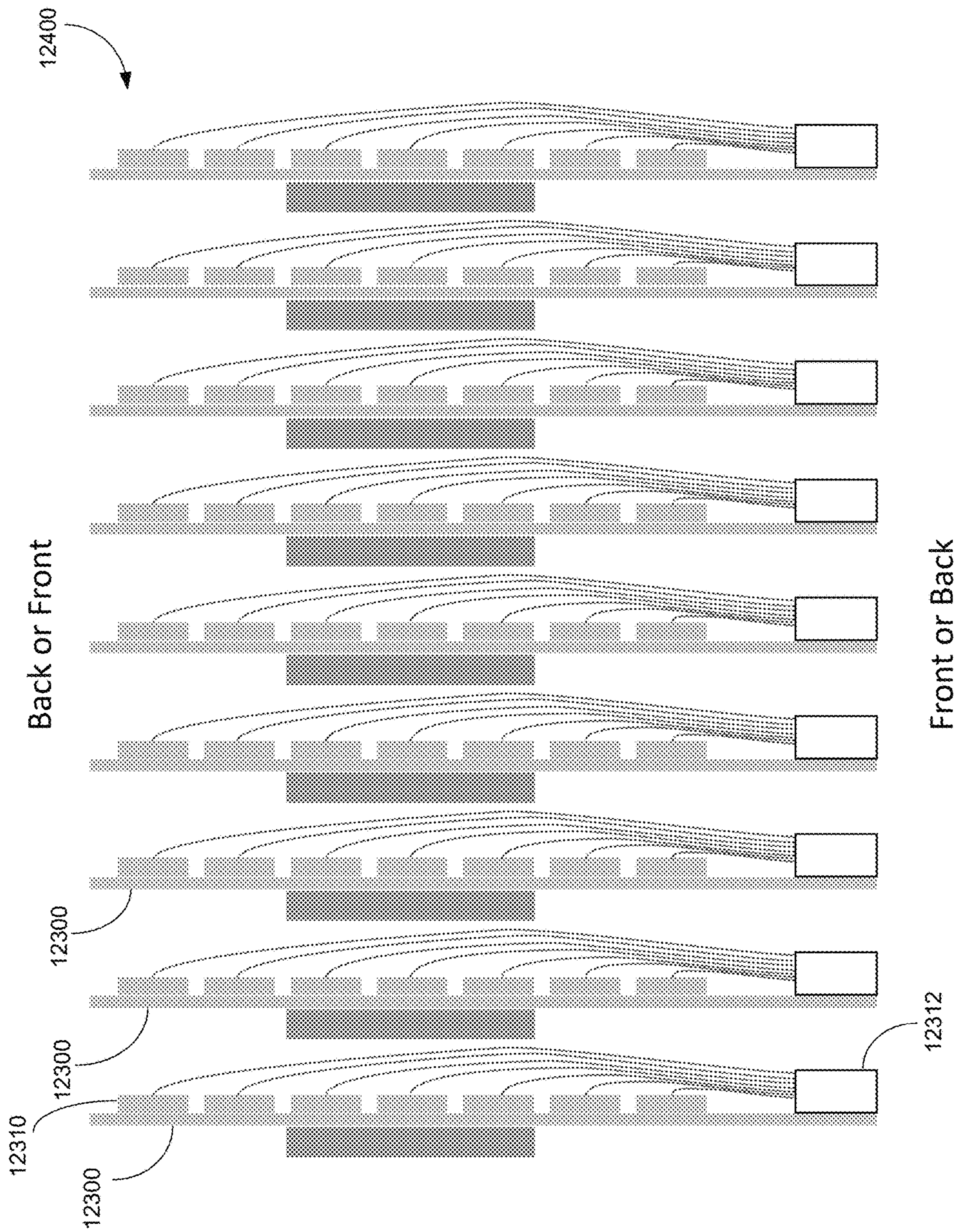
FIG. 124 is a top view of an example of a rack system that includes several vertically mounted processor blades.

FIG. 124 is a top view of an example of a rack system 12400 that includes several vertically mounted processor blades 12300. The vertically mounted processor blades 12300 can be positioned such that the optical fiber connectors 12312 are near the front of the rack system 12400 (which allows external optical fiber cables to be optically coupled to the front of the rack system 12400), or near the back of the rack system 12400 (which allows external optical fiber cables to be optically coupled to the back of the rack system 12400). Several rack systems 12400 can be stacked vertically similar to the example shown in FIG. 76, in which the server rack 1214 includes several servers 1212 stacked vertically, or the example shown in FIG. 87A, in which several servers 1552 are stacked vertically in a rack 1554. For example, the optical interconnect modules 12310 can receive optical power from an optical power supply, such as 1558 of FIG. 87A.

In some implementations, the vertically mounted processor blades 12300 can include blade pairs, in which each blade pair includes a switch blade and a processor blade. The electronic processor of the switch blade includes a switch, and the electronic processor of the processor blade is configured to process data provided by the switch. For example, the electronic processor of the processor blade is configured to send processed data to the switch, which switches the processed data with other data, e.g., data from other processor blades.

In the examples shown in FIGS. 123 and 124, the optical interconnect module or co-packaged optical module 12310 is mounted on the second side of the substrate 12302. In some implementations, the optical interconnect module 12310 or the optical fiber cable 12314 extends through or partially through an opening in the substrate 12302, similar to the example shown in FIGS. 35A to 35C. The photonic integrated circuit in the optical interconnect module 12310 is electrically coupled to the electronic processor 12308 or to another electronic circuit, such as a serializers/deserializers module positioned at or near the first side of the substrate 12302. The optical interconnect module 12310 and the optical fiber cable 12314 define a signal path that allows a signal from the optical fiber cable 12314 to be transmitted from the second side of the substrate 12302 through the opening to the electronic processor 12308. The signal is converted from an optical signal to an electric signal by the photonic integrated circuit, which defines part of the signal path. This allows the optical fiber cables to be positioned on the second side of the substrate 12302.

In the example of FIG. 104, the printed circuit board 1230 is positioned a short distance from the front panel 1224 to improve air flow between the printed circuit board 1230 and the front panel 1224 to help dissipate heat generated by the co-packaged optical modules 1074. The following describes a mechanism that allows the user to conveniently connect the co-packaged optical module to an optical fiber cable using a pluggable module that has a rigid structure that spans the distance between the co-packaged optical modules and the front panel.

Figure 125A:
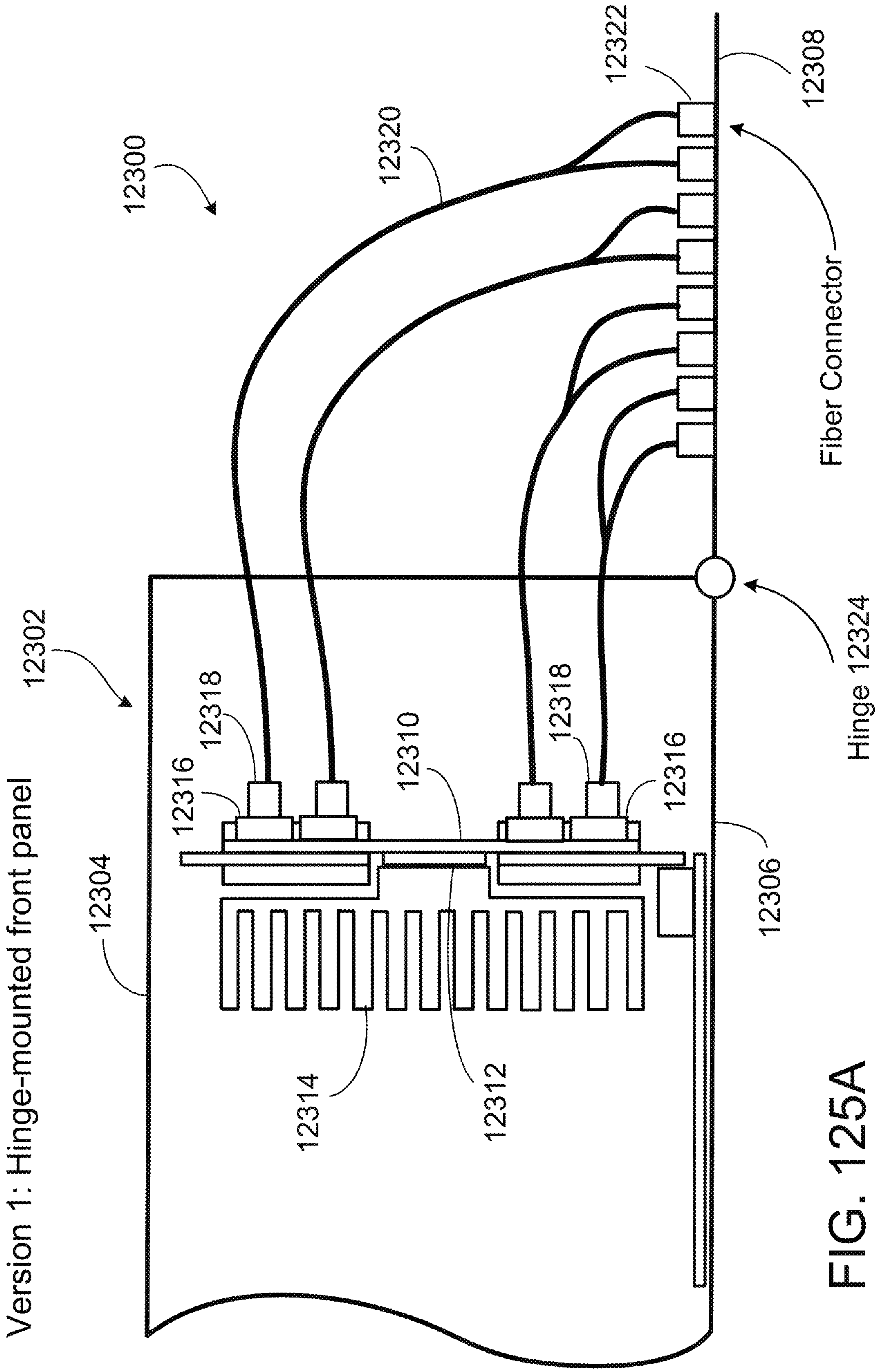
FIG. 125A is a side view of an example of a rackmount server that has a hinged front panel.

Referring to FIG. 125A, in some implementations, a rackmount server 12300 can have a hinge-mounted front panel, similar to the example shown in FIG. 77A. The rackmount server 12300 includes a housing 12302 having a top panel 12304, a bottom panel 12306, and a front panel 12308 that is coupled to the bottom panel 12306 using a hinge 12324. A vertically mounted substrate 12310 is positioned substantially perpendicular to the bottom panel 12306 and recessed from the front panel 12308. The substrate 12310 includes a first side facing the front direction relative to the housing 12302 and a second side facing the rear direction relative to the housing 12302. At least one electronic processor or data processing chip 12312 is electrically coupled to the second side of the vertical substrate 12310, and a heat dissipating device or heat sink 12314 is thermally coupled to the at least one data processing chip 12312. Co-packaged optical modules 12316 (or optical interconnect modules) are attached to the first side of the vertical substrate 12310. The substrate 12310 provides high-speed connections between the co-packaged optical modules 12316 and the data processing chip 12312. The co-packaged optical module 12316 is optically connected to a first fiber connector part 12318, which is optically connected through a fiber pigtail 12320 to one or more second fiber connector parts 12322 mounted on the front panel 12308.

In the example of FIG. 125A, the front panel 12308 is rotatably connected to the bottom panel by the hinge 12324. In other examples, the front panel can be rotatably connected to the top panel or the side panel so as to flap upwards or to flap sideways when opened.

For example, the electronic processor 12312 can be a network switch, a central processor unit, a graphics processor unit, a tensor processing unit, a neural network processor, an artificial intelligence accelerator, a digital signal processor, a microcontroller, or an application specific integrated circuit (ASIC). For example, the electronic processor 12312 can be a memory device or a storage device. In this context, processing of data includes writing data to, or reading data from, the memory or storage device, and optionally performing error correction. The memory device can be, e.g., random access memory (RAM), which can include, e.g., dynamic RAM (DRAM) or static RAM (SRAM). The storage device can include, e.g., solid state memory or drive, which can include, e.g., one or more non-volatile memory (NVM) Express® (NVMe) SSD (solid state drive) modules, or Intel® Optane™ persistent memory.

The example of FIG. 125A shows one electronic processor 12312, through there can also be multiple electronic processors 12312 mounted on the substrate 12310. In some examples, the substrate 12310 can also be replaced by a circuit board.

The co-packaged optical module (or optical interconnect module) 12316 can be similar to, e.g., the integrated optical communication device 262 of FIG. 6; 282 of FIGS. 7-9; 462, 466, 448, 472 of FIG. 17; 612 of FIG. 23; 684 of FIG. 26; 704 of FIG. 27; 724 of FIG. 28; the co-packaged optical module 1074 of FIGS. 68A, 69A, 70, 71A; 1132 of FIG. 73A; 1160 of FIG. 74A; 1074 of FIGS. 75A, 75B, 77A, 77B, 104, 107, 109, 116; 1312 of FIGS. 80A, 82A, 84A; or 1564, 1582 of FIG. 87A. In the example of FIG. 125A, the optical interconnect module or co-packaged optical module 12316 does not necessarily have to include serializers/deserializers (SerDes), e.g., 216, 217 of FIGS. 2 to 8 and 10 to 12. The optical interconnect module or co-packaged optical module 12316 can include the photonic integrated circuit without any serializers/deserializers. For example, the serializers/deserializers can be mounted on the circuit board separate from the optical interconnect module or co-packaged optical module 12316.

FIG. 159 is a side view of an example of a rackmount server 15900 that has a hinge-mounted front panel. The rackmount server 15900 includes a housing 15902 having a top panel 15904, a bottom panel 15906, and an upper swivel front panel 15908 that is coupled to a lower fixed front panel 15930 using a hinge 15910. In some examples, the hinge can be attached to the side panel so that the front panel is opened horizontally. A horizontally mounted host printed circuit board 15912 is attached to the bottom panel 15906. A vertically mounted printed circuit board 15914, which can be, e.g., a daughter-card, is positioned substantially vertically and perpendicular to the bottom panel 15906 and recessed from the front panel 15908. A package substrate 15916 is attached to the front side of the vertical printed circuit board 15914. At least one electronic processor or data processing chip 15918 is electrically coupled to the rear side of the package substrate 15916, and a heat dissipating device or heat sink 15920 is thermally coupled to the at least one data processing chip 15918. Co-packaged optical modules 15922 (or optical interconnect modules) are removably attached to the front side of the package substrate 15916. The package substrate 15916 provides high-speed connections between the co-packaged optical modules 15922 and the data processing chip 15918. The co-packaged optical module 15922 is optically connected to a first fiber connector part 15924, which is optically connected through a fiber pigtail 15926 to one or more second fiber connector parts 15928 attached to the back side of the front panel 15908. The second fiber connector parts 15928 can be optically connected to optical fiber cables that pass through openings in the hinged front panel 15908.

For example, the fiber connector 15928 can be connected to the backside of the front panel 15908 during replacement of the CPO module 15922. The CPO module 15922 can be unplugged from the connector (e.g., an LGA socket) on the package substrate 15916, and be disconnected from the first fiber connector part 15924.

For example, one or more rows of pluggable external laser sources (ELS) 15932 can be in standard pluggable form factor accessible from the lower fixed part 15930 of the front panel with rear blind-mate connectors. Optical fibers 15934 transmit the power supply light from the laser sources 15932 to the CPO modules 15922. The external laser sources 15932 are electrically connected to a conventionally (horizontal) oriented system printed circuit board or the vertically oriented daughterboard. In this example, the row(s) of pluggable external laser sources 15932 is/are positioned below the datapath optical connection. The pluggable external laser sources 15932 do not need to connect to the CPO substrate because there are no high-speed signals that require proximity.

In some implementations, as shown in FIG. 160, external laser sources can be located behind the hinged front panel (not user accessible without opening the door) and can then be front-mating similar to typical optical pluggables. FIG. 160 is a top view of an example of a rackmount server 16000 that is similar to the rackmount server 15900 of FIG. 159 except that one or more rows of external laser sources 16002 are placed inside the housing 15902. Optical fibers 15934 transmit the power supply light from the laser sources 16002 to the CPO modules 15922.

FIG. 161 is a diagram of an example of the optical cable 15926 that optically couples the CPO modules 15922 to the optical fiber cables at the front panel 15908. The optical cable 15926 includes a first multi-fiber push on (MPO) connector 16100, a laser supply MPO connector 16102, four datapath MPO connectors 16104, and a jumper cable 16106 that includes optical fibers that optically connect the MPO connectors. In this example, the optical cable 15926 supports a total bandwidth of 1.6 Tb/s, including 16 full-duplex 400G DR4+ signals (100G per fiber) plus 4 ELS connections.

The first MPO connector 16100 is optically coupled to the CPO module 15922 and includes, e.g., 36 fiber ports (e.g., 3 rows of fiber ports, each row having 12 fiber ports, similar to the fiber ports shown in FIGS. 80D, 80E, 82D, 82E, 89 to 93), which includes 4 power supply fiber ports and 32 data fiber ports. The laser supply MPO connector 16102 is optically coupled to the external laser source, such as 15932 (FIG. 159) or 16002 (FIG. 160). The datapath MPO connectors 16104 are optically coupled to external optical fiber cables. For example, each external optical fiber cable can support a 400GBASE-DR4 link, so the four datapath MPO connectors 16104 can support 16 full-duplex 400G DR4+ signals (100G per fiber). The jumper cable 16106 fans the MPO connector 16100 out to datapath MPOs 16104 on the front panel 15908 (e.g., 4×400G DR4+ using 4×1×12 MPOs or 2×800G DR8+ using 2×2×12 MPOs) and the laser supply MPO 16102. For example, the optical cable 15926 can be DR-16+(e.g., 1.6 Tb/s at 100G per fiber, gray optics, −2 km reach). This architecture also supports FR-n (WDM).

In this example, the CPO module 15922 is configured to support 4*400 Gb/s=1.6 Tbis data rate. The jumper cable 16106 includes four (4) power supply optical fibers 15934 that optically connect four (4) power supply fiber ports of the laser supply MPO connector 16102 to the corresponding power supply fiber ports of the first MPO connector 16100. The jumper cable 16106 includes four (4) sets of eight (8) data optical fibers. The eight (8) data optical fibers 16106 optically connect eight (8) transmit or receive fiber ports of each datapath MPO connector 16104 to the corresponding transmit or receive fiber ports of the first MPO connector 16100. For example, the power supply optical fibers 15934 can be polarization maintaining optical fibers. The fan-out cable 16106 can handle multiple functions including merging the external laser source and data paths, splitting of external light source between multiple CPO modules 15922, and handling polarization. Regarding the force requirement on the CPO module's connector, the optical connector leverages an MPO type connection and can have a similar or smaller force as compared to a standard MPO connector.

Figure 125B:
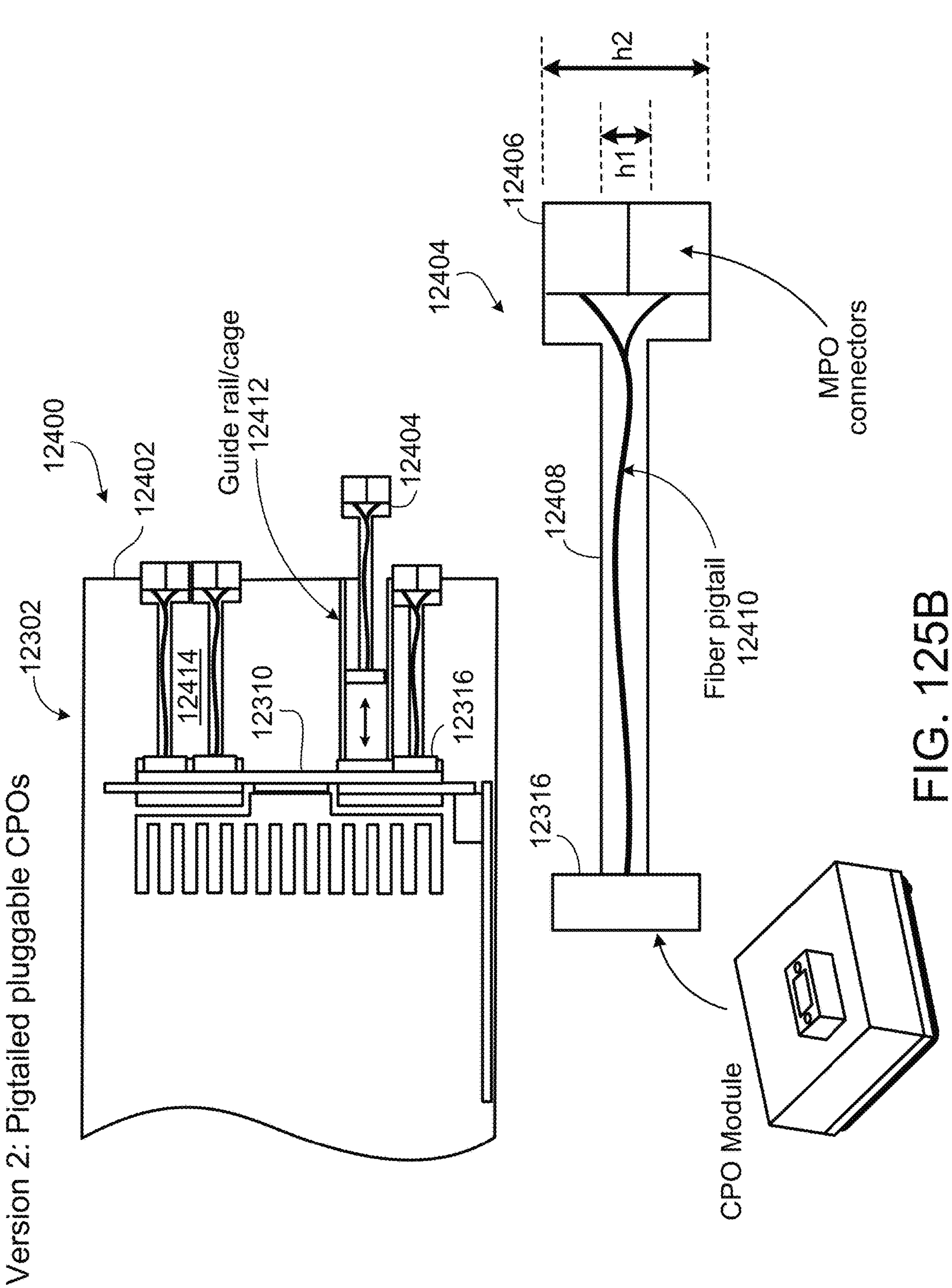
FIG. 125B is a diagram of an example of a rackmount server that has pluggable modules.

Referring to FIG. 125B, in some implementations, a rackmount server 12400 has a front panel 12402 (which can be, e.g., fixed) and a vertically mounted substrate 12310 recessed from the front panel 12402. The front panel 12402 has openings that allow pluggable modules 12404 to be inserted. Each pluggable module 12404 includes a co-packaged optical module 12316, one or more multi-fiber push on (MPO) connectors 12406, a fiber guide 12408 that mechanically connects the co-packaged optical module 12316 to the one or more multi-fiber push on connectors 12406, and a fiber pigtail 12410 that optically connects the co-packaged optical module 12316 to the one or more multi-fiber push on connectors 12406. For example, the length of the fiber guide 12408 is designed such that when the pluggable module 12404 is inserted into the opening of the front panel 12402 and the co-packaged optical module 12316 is electrically coupled to the vertically mounted substrate 12310, the one or more multi-fiber push on connectors 12406 are near the front panel, e.g., flush with, or slightly protrude from, the front panel 12402 so that the user can conveniently attach external fiber optic cables. For example, the front face of the connectors 12406 can be within an inch, or half an inch, or one-fourth of an inch, of the front surface of the front panel 12402.

For example, the housing 12302 can include guide rails or guide cage 12412 that help guide the pluggable modules 12404 so that the electrical connectors of the co-packaged optical modules 12316 are aligned with the electrical connectors on the printed circuit board.

In some implementations, the rackmount server 12400 has inlet fans mounted near the front panel 12402 and blow air in a direction substantially parallel to the front panel 12402, similar to the examples shown in FIGS. 96 to 98, 100, 104, 105, 107 to 116. The height h1 of the fiber guide 12408 (measured along a direction perpendicular to the bottom panel) can be designed to be smaller than the height h2 of the multi-fiber push on connectors 12406 so that there is space 12414 between adjacent fiber guides 12408 (in the vertical direction) to allow air to flow between the fiber guides 12408. The fiber guide 12408 can he a hollow tube with inner dimensions sufficiently large to accommodate the fiber pigtail 12410. The fiber guide 12408 can be made of metal or other thermally conductive material to help dissipate heat generated by the co-packaged optical module 12316. The fiber guide 12408 can have arbitrary shapes, e.g., to optimize thermal properties. For example, the fiber guide 12408 can have side openings, or a web structure, to allow air to flow pass the fiber guide 12408. The fiber guide 12408 is designed to be sufficiently rigid to enable the pluggable module 12404 to be inserted and removed from the rackmount server 12400 multiple times (e.g., several hundred times, several thousand times) under typical usage without deformation.

Figure 126A:
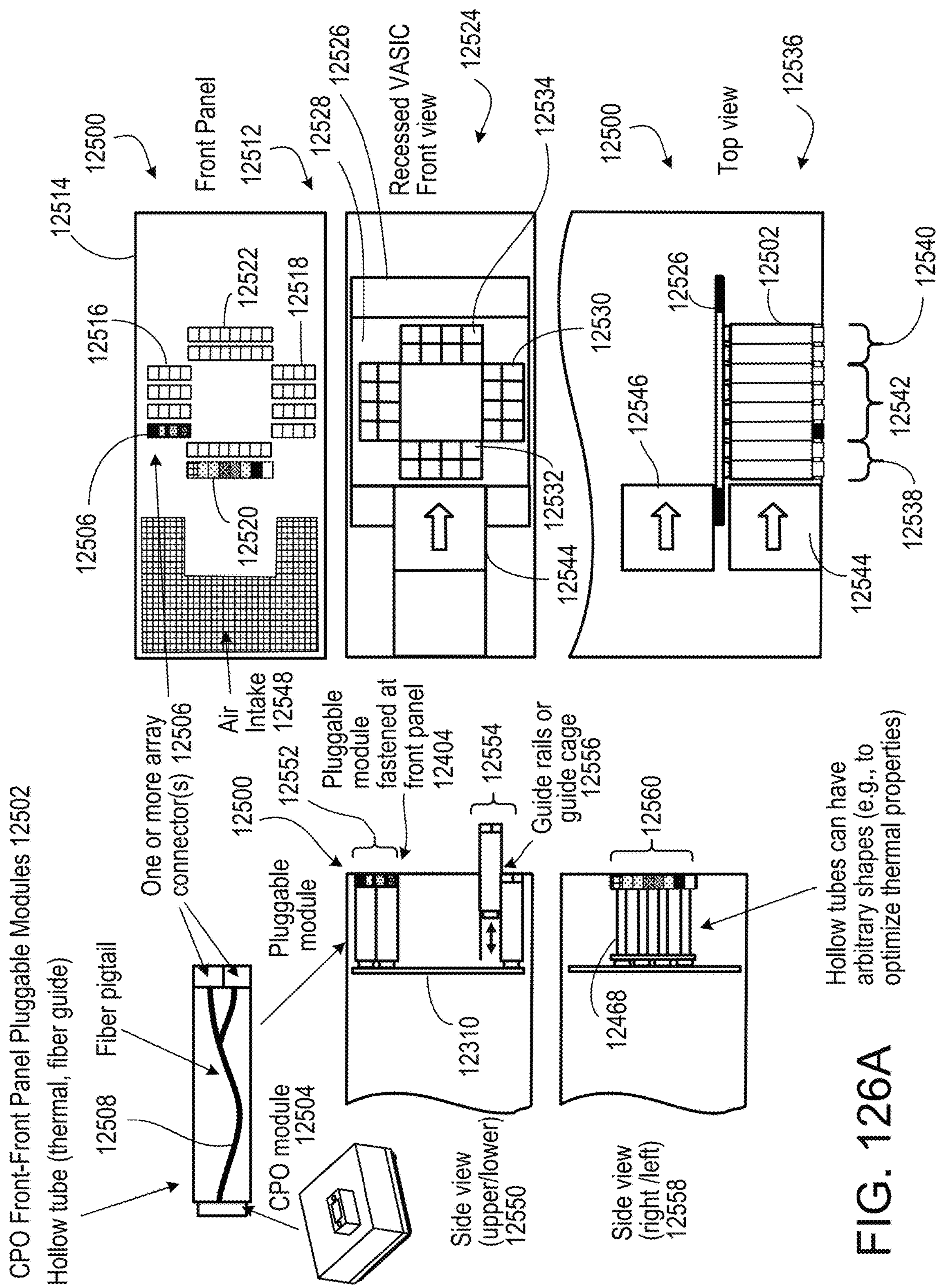
FIGS. 126A to 127 are diagrams of examples of rackmount servers that have pluggable modules.

FIG. 126A includes various views of an example of a rackmount server 12500 that includes CPO front-panel pluggable modules 12502. Each pluggable module 12502 includes a co-packaged optical module 12504 that is optically coupled to one or more array connectors, such as multi-fiber push on connectors 12506, through a fiber pigtail 12508. In this example, each co-packaged optical module 12504 is optically coupled to 2 array connectors 12506. The pluggable module 12502 includes a rigid fiber guide 12510 that approximately spans the distance between the front panel and the vertically mounted printed circuit board.

A front view 12512 (at the upper right of FIG. 126A) shows an example of a front panel 12514 with an upper group of array connectors 12516, a lower group of array connectors 12518, a left group of array connectors 12520, and a right group of array connectors 12522. Each rectangle in the front view 12512 represents an array connector 12506. In this example, each group of array connectors 12516, 12518, 12520, 12522 includes 16 array connectors 12506.

A front view 12524 (at the middle right of FIG. 126A) shows an example of a recessed vertically mounted printed circuit board 12526 on which an application specific integrated circuit (ASIC) or data processing chip 12312 is mounted on the rear side and not shown in the front view 12524. The printed circuit board 12526 has an upper group of electrical contacts 12528, a lower group of electrical contacts 12530, a left group of electrical contacts 12532, and a right group of electrical contacts 12534. Each rectangle in the front view 12524 represents an array of electrical contacts associated with one co-packaged optical module 12504. In this example, each group of electrical contacts 12528, 12530, 12532, 12534 includes 8 arrays of electrical contacts that are configured to be electrically coupled to the electrical contacts of 8 co-packaged optical modules 12504. In this example, each co-packaged optical module 12504 is optically coupled to two array connectors 12506, so the number of rectangles shown in the front view 12512 is twice the number of squares shown in the front view 12524. The front panel 12514 includes openings that allow insertion of the pluggable modules 12502. In this example, each opening has a size that can accommodate two array connectors 12506.

A top view 12536 (at the lower right of FIG. 126A) of the front portion of the rackmount server 12500 shows a top view of the pluggable modules 12506. In the top view 12536, the two left-most pluggable modules 12538 include co-packaged optical modules 12504 that are electrically coupled to the electrical contacts in the left group of electrical contacts 12532 shown in the front view 12524, and include array connectors 12506 in the left group of array connectors 12520 shown in the front view 12512. In the top view 12536, the two right-most pluggable modules 12540 include co-packaged optical modules 12504 that are electrically coupled to the electrical contacts in the right group of electrical contacts 12534 shown in the front view 12524, and include array connectors 12506 in the right group of array connectors 12522 shown in the front view 12512. In the top view 12536, the four middle pluggable modules 12542 include co-packaged optical modules 12504 that are electrically coupled to the electrical contacts in the upper group of electrical contacts 12528 shown in the front view 12524, and include array connectors 12506 in the upper group of array connectors 12516 shown in the front view 12512.

The front view 12524 (at the middle right of FIG. 126A) shows a first inlet fan 12544 that blows air from left to right across the space between the front panel 12514 and the printed circuit board 12526. The top view 12536 (at the lower right of FIG. 126A) shows the first inlet fan 12544 and a second inlet fan 12546. The first inlet fan 12544 is mounted at the front side of the printed circuit board 12526 and blows air across the pluggable modules 12502 to help dissipate the heat generated by the co-packaged optical modules 12504. The second inlet fan 12546 is mounted at the rear side of the printed circuit board 12526 and blows air across the data processing chip 12312 and the heat dissipating device 12314.

As shown in the front view 12512 (at the upper right of the FIG. 126A), the front panel 12514 includes an opening 12548 that provides incoming air for the front inlet fans 12544, 12546. A protective mesh or grid can be provided at the opening 12548.

A left side view 12550 (at the middle left of FIG. 126A) of the front portion of the rackmount server 12500 shows pluggable modules 12552 that correspond to the upper group of array connectors 12516 in the front view 12512 and the upper group of electrical contacts 12528 in the front view 12524. The left side view 12550 also shows pluggable modules 12554 that correspond to the lower group of array connectors 12518 in the front view 12512 and the lower group of electrical contacts 12530 in the front view 12524. As shown in the left side view 12550, guide rails or guide cage 12556 can be provided to help guide the pluggable modules 12502 so that the electrical connectors of the co-packaged optical modules 12504 are aligned with the electrical contacts on the printed circuit board 12526. The pluggable modules 12502 can be fastened at the front panel 12514, e.g., using clip mechanisms.

A left side view 12558 of the front portion of the rackmount server 12500 shows pluggable modules 12560 that correspond to the left group of array connectors 12520 in the front view 12512 and the left group of electrical contacts 12532 in the front view 12524.

In this example, the fiber guides 12510 for the pluggable modules 12502 that correspond to the left and right groups of array connectors 12520, 12522, and the left and right groups of electrical contacts 12532, 12534 are designed to have smaller heights so that there are gaps between adjacent fiber guides 12510 in the vertical direction to allow air to flow through.

In some implementations, each co-packaged optical module can receive optical signals from a large number of fiber cores, and each co-packaged optical module can be optically coupled to external fiber optic cables through three or more array connectors that occupy an overall area at the front panel that is larger than the overall area occupied by the co-packaged optical module on the printed circuit board.

Figure 126B:
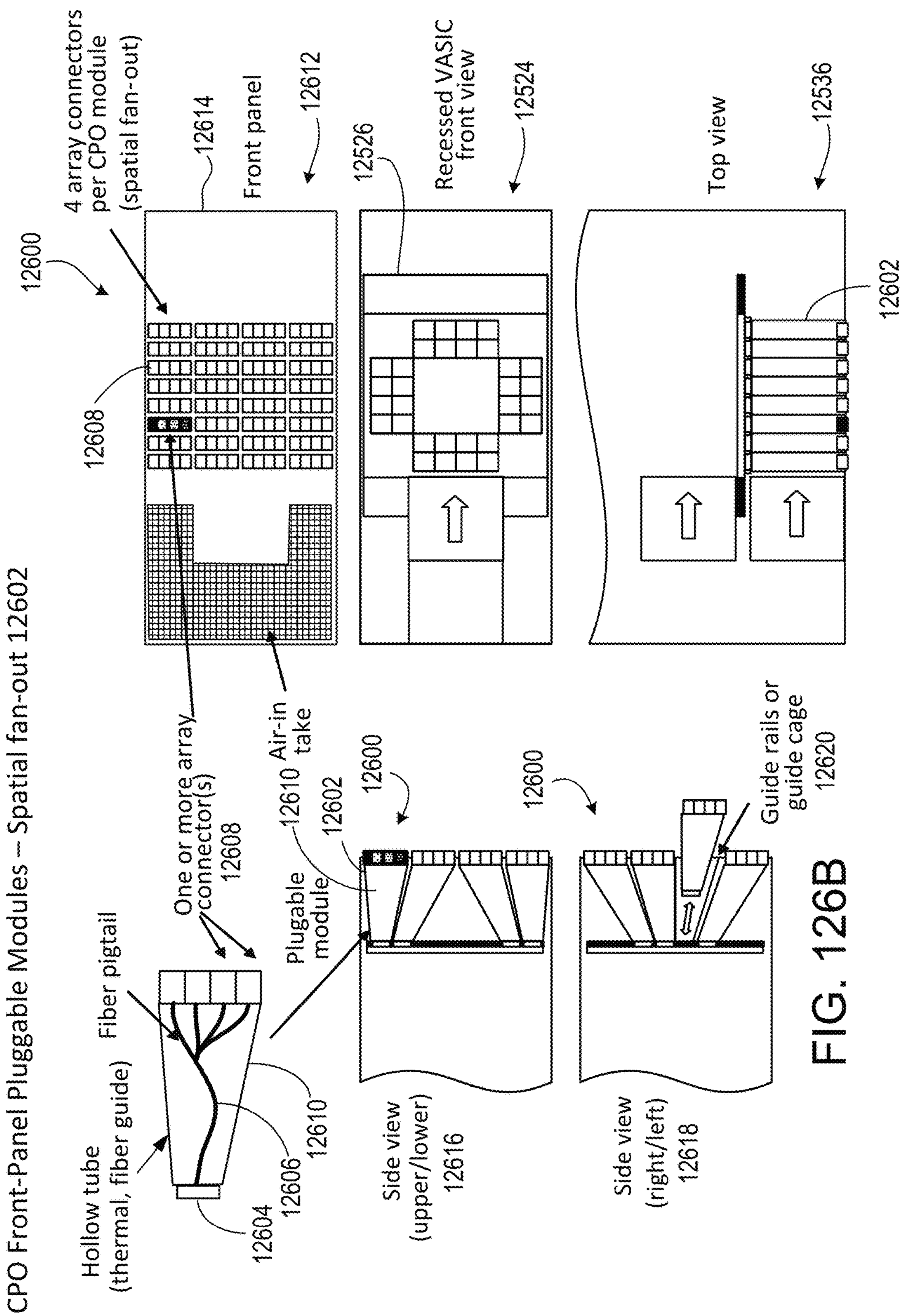

Referring to FIG. 126B, in some implementations, a rackmount server 12600 is designed to use pluggable modules 12602 having a spatial fan-out design. Each pluggable module 12602 includes a co-packaged optical module 12604 that is optically coupled, through a fiber pigtail 12606, to one or more array connectors 12608 that have an overall area larger than the area of the co-packaged optical module 12604. The area is measured along the plane parallel to the front panel. In this example, each co-packaged optical module 12604 is optically coupled to 4 array connectors 12608. The pluggable module 12602 includes a tapered fiber guide 12610 that is narrower near the co-packaged optical module 12604 and wider near the array connectors 12608.

A front view 12612 (at the upper right of FIG. 126B) shows an example of a front panel 12614 that can accommodate an array of 128 array connectors 12608 arranged in 16 rows and 8 columns. The front view 12524 (at the middle right of FIG. 126B) of the recessed printed circuit board 12526 and the top view (at the lower right of FIG. 126B) of the front portion of the rackmount server 12600 are similar to corresponding views in FIG. 126A.

A left side view 12616 (at the middle left of FIG. 126B) shows an example of pluggable modules 12602 that have co-packaged optical modules that are connected to the upper and lower groups of electrical contacts on the printed circuit board 12526. A left side view 12618 (at the lower left of FIG. 126B) shows an example of pluggable modules 12602 that have co-packaged optical modules that are connected to the left group of electrical contacts on the printed circuit board 12526. As shown in the left side view 12618, guide rails or guide cage 12620 can be provided to help guide the pluggable modules 12602 so that the electrical contacts of the co-packaged optical modules 12604 are aligned with corresponding electrical contacts on the printed circuit board 12526.

For example, the rackmount server 12400, 12500, 12600 can be provided to customers with or without the pluggable modules. The customer can insert as many pluggable modules as needed.

Figure 127:
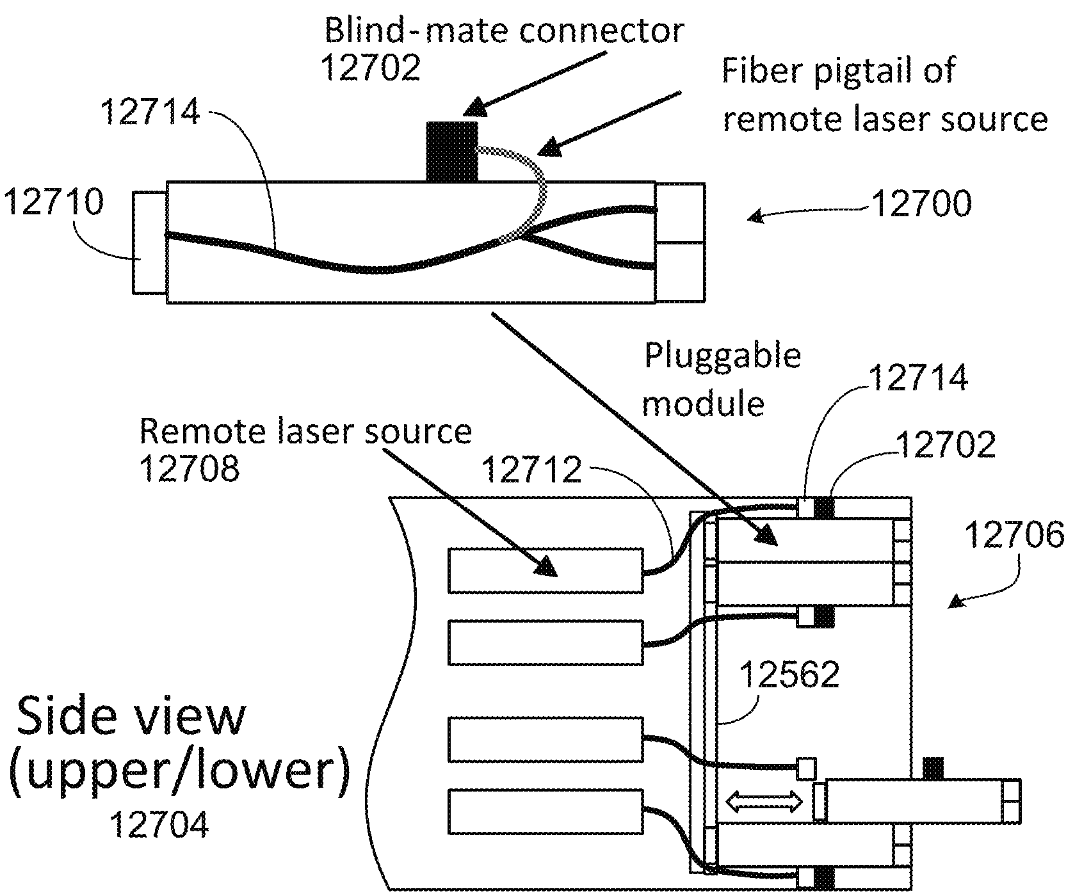
Figure 127:
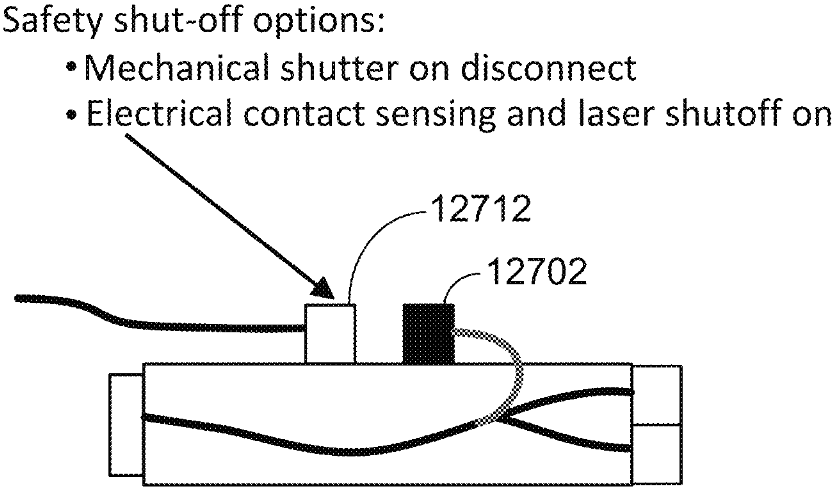

Referring to FIG. 127, in some implementations, a CPO front panel pluggable module 12700 can include a blind mate connector 12702 that is designed receive optical power supply light. A portion of the fiber pigtail 12714 is optically coupled to the blind mate connector 12702. FIG. 127 includes a side view 12704 of a rackmount server 12706 that includes laser sources 12708 that provide optical power supply light to the co-packaged optical modules 12710 in the pluggable modules 12700. The laser sources 12708 are optically coupled, through optical fibers 12712, to optical connectors 12714 that are configured to mate with the blind-mate connectors 12702 on the pluggable modules 12700. When the pluggable module 12700 is inserted into the rackmount server 12706, the electrical contacts of the co-packaged optical module 12710 contacts the corresponding electrical contacts on the printed circuit board 12526, and the blind-mate connector 12702 mates with the optical connector 12714. This allows the co-packaged optical module 12710 to receive optical signals from external fiber optic cables and the optical power supply light through the fiber pigtail 12714.

In some implementations, to prevent the light from the laser source 12708 from harming operators of the rackmount server 12706, a safety shut-off mechanism is provided. For example, a mechanical shutter can be provided on disconnection of the blind-mate connector 12702 from the optical connector 12712. As another example, electrical contact sensing can be used, and the laser can be shut off upon detecting disconnection of the blind-mate connector 12702 from the optical connector 12712.

Figure 128:
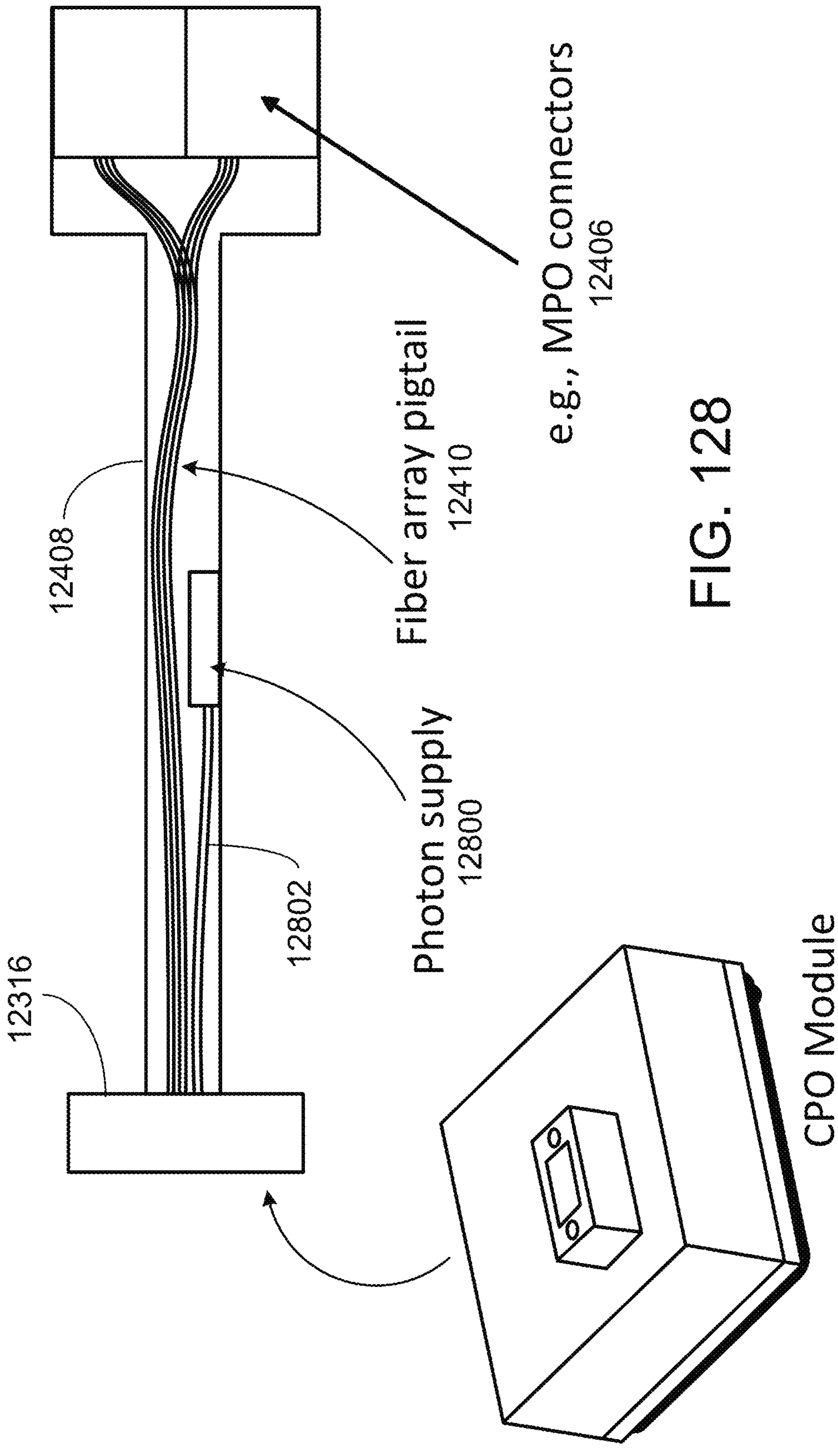
FIG. 128 is a diagram of an example of a fiber guide that includes one or more photon supplies.

Referring to FIG. 128, in some implementations, one or more photon supplies 12800 can be provided in the fiber guide 12408 to provide power supply light to the co-packaged optical module 12316 through one or more power supply optical fibers 12802. The one or more photon supplies 12800 can be selected to have a wavelength (or wavelengths) and power level (or power levels) suitable for the co-packaged optical module 12316. Each photon supply 12800 can include, e.g., one or more diode lasers having the same or different wavelengths.

Electrical connections (not shown in the figure) can be used to provide electrical power to the one or more photon supplies 12800. In some implementations, the electrical connections are configured such that when the co-packaged optical module 12316 is removed from the substrate 12310, the electrical power to the one or more photon supplies 12800 is turned off. This prevents light from the one or more photon supplies 12800 from harming operators. Additional signals lines (not shown in the figure) can provide control signals to the photon supply 12800. In some embodiments, electrical connections to the photon supplies 12800 are made to the system through the CPO module 12316. In some embodiments, electrical connections to the photon supplies 12800 use parts of the fiber guide 12408, which in some embodiments is made from electrically conductive materials. In some embodiments, the fiber guide 12408 is made of multiple parts, some of which are made from electrically conductive materials and some of which are made from electrically insulating materials. In some embodiments, two electrically conductive parts are mechanically connected but electrically separated by an electrical insulating part.

For example, the photon supply 12800 is thermally coupled to the fiber guide 12408, and the fiber guide 12408 can help dissipate heat from the photon supply 12800.

In some examples, the CPO module 12316 is coupled to spring-loaded elements or compression interposers mounted on the substrate 12310. The force required to press the CPO module 12316 into the spring-loaded elements or the compression interposers can be large. The following describes mechanisms to facilitate pressing the CPO module 12361 into the spring-loaded elements or the compression interposers.

Figure 129:
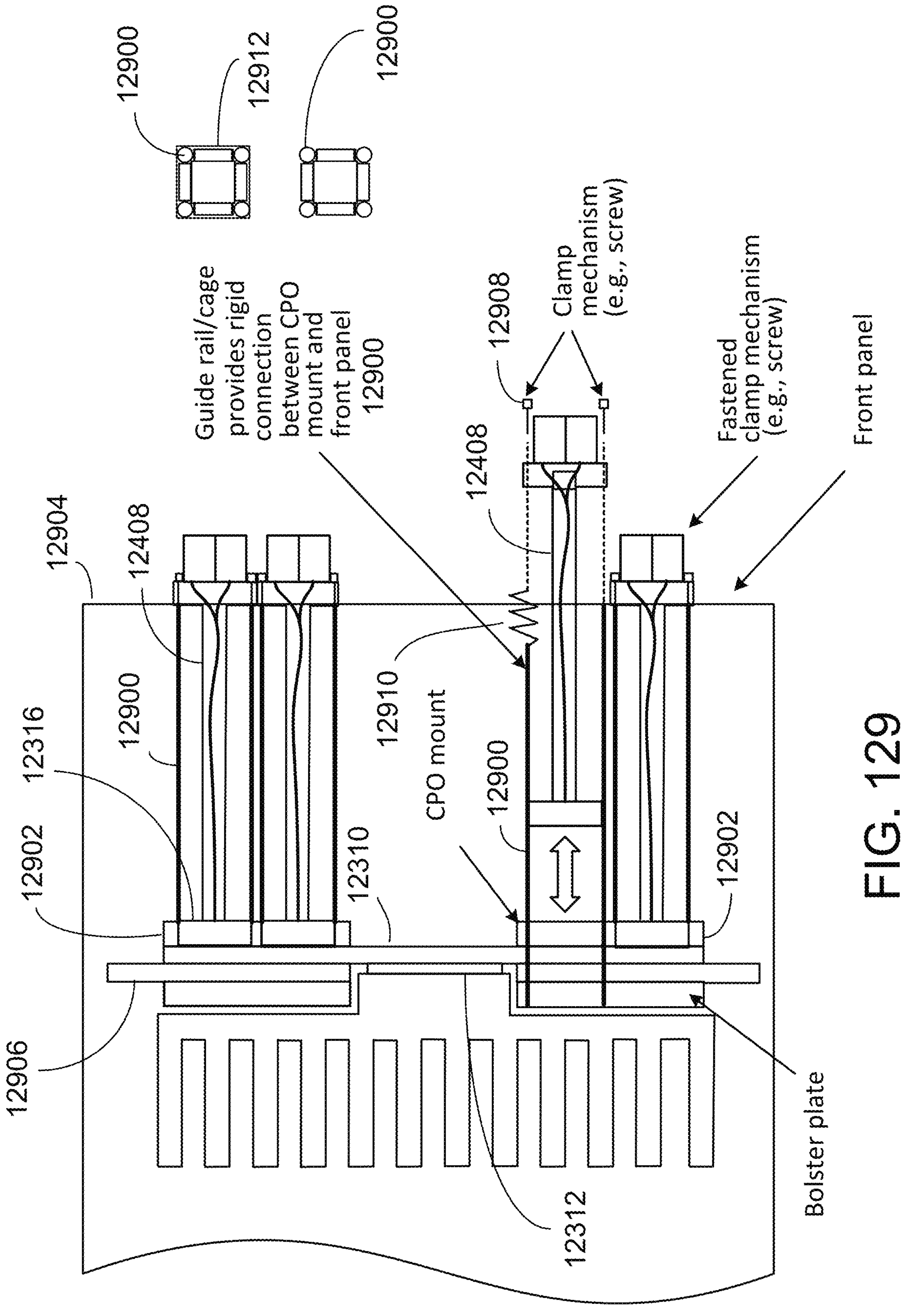
FIG. 129 is a diagram of an example of a rackmount server that includes guide rails/cage to assist the insertion of fiber guides.

Referring to FIG. 129, in some implementations, a rackmount server includes a substrate 12310 that is attached to a printed circuit board 12906, which has an opening to allow the data processing chip 12312 to protrude or partially protrude through the opening and be attached to the substrate 12310. The printed circuit board 12906 can have many functions, such as providing support for a large number of electrical power connections for the data processing chip 12312. The CPO module 12316 can be mounted on the substrate 12310 through a CPO mount or a front lattice 12902. A bolster plate 12914 is attached to the rear side of the printed circuit board 12906. Both the substrate 12310 and the printed circuit board 12906 are sandwiched between the CPO mount or front lattice 12902 and the bolster plate 12914 to provide mechanical strength so that CPO modules 12316 can exert the required pressure onto the substrate 12310. Guide rails/cage 12900 extend from the front panel 12904 or the front portion of the fiber guide 12408 to the bolster plate 12914 and provide rigid connections between the CPO mount 12902 and the front panel 12904 or the front portion of the fiber guide 12408.

Clamp mechanisms 12908, such as screws, are used to fasten the guide rails/cage 12900 to the front portion of the fiber guide 12408. After the CPO module 12316 is initially pressed into the spring-loaded elements or the compression interposers, the screws 12908 are tightened, which pulls the guide rails/cage 12900 forward, thereby pulling the bolster plate 12914 forward and provide a counteracting force that pushes the spring-loaded elements or the compression interposers in the direction of the CPO module 12316. Springs 12910 can be provided between the guide rails 12900 and the front portion of the fiber guide 12408 to provide some tolerance in the positioning of the front portion of the fiber guide 12408 relative to the guide rails 12900.

The right side of FIG. 129 shows front views of the guide rails/cage 12900. For example, the guide rails 12900 can include multiple rods (e.g., four rods) that are arranged in a configuration based on the shape of the front portion of the fiber guide 12408. If the front portion of the fiber guide 12408 has a square shape, the four rods of the guide rails 12900 can be positioned near the four corners of the front portion of the squared-shaped fiber guide 12408. In some examples, a guide cage 12912 can be provided to enclose the guide rails 12900. The guide rails 12900 can also be used without the guide cage 12912.

As described above, in some examples, the CPO module 12316 (FIG. 0.123) is coupled to spring-loaded elements or compression interposers mounted on the substrate 12310, and the force required to press the CPO module 12316 into the spring-loaded elements or the compression interposers can be large. The following describes a press plate insert to lock (PPIL) technique that makes it easier to attach and detach the CPO modules.

Figure 130:
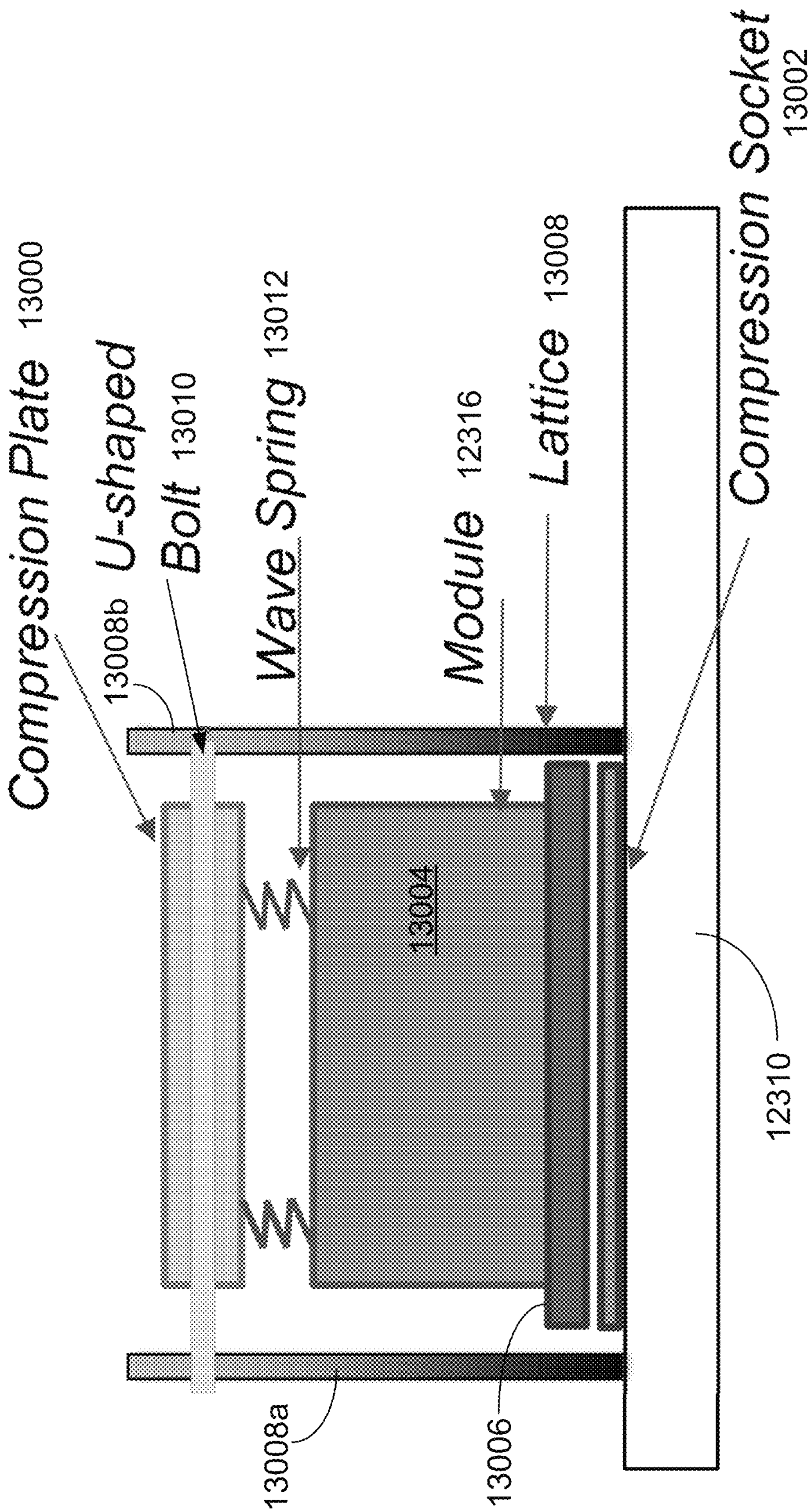
FIG. 130 is a diagram of an example of a CPO module with a compression plate.
Figure 131:
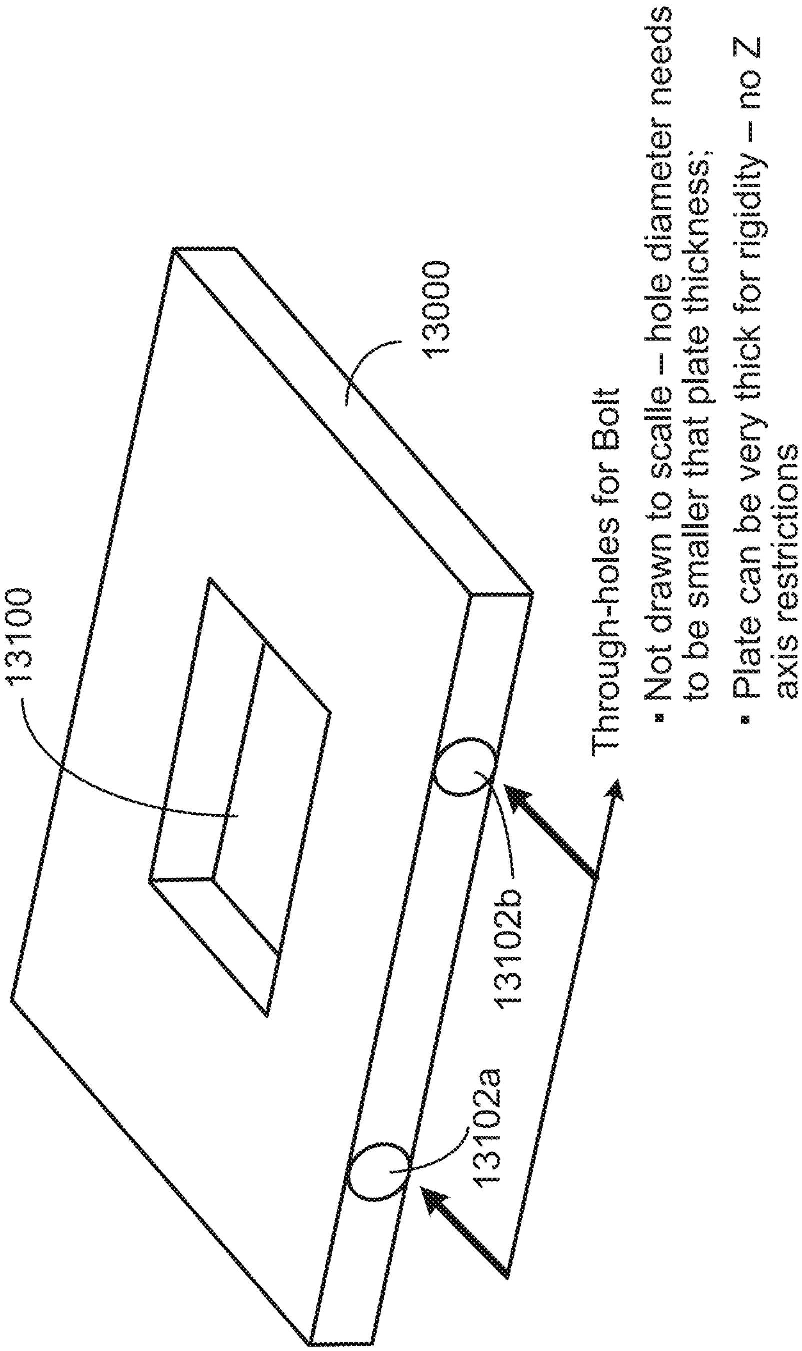
FIG. 131 is a diagram of an example of a compression plate.
Figure 132:
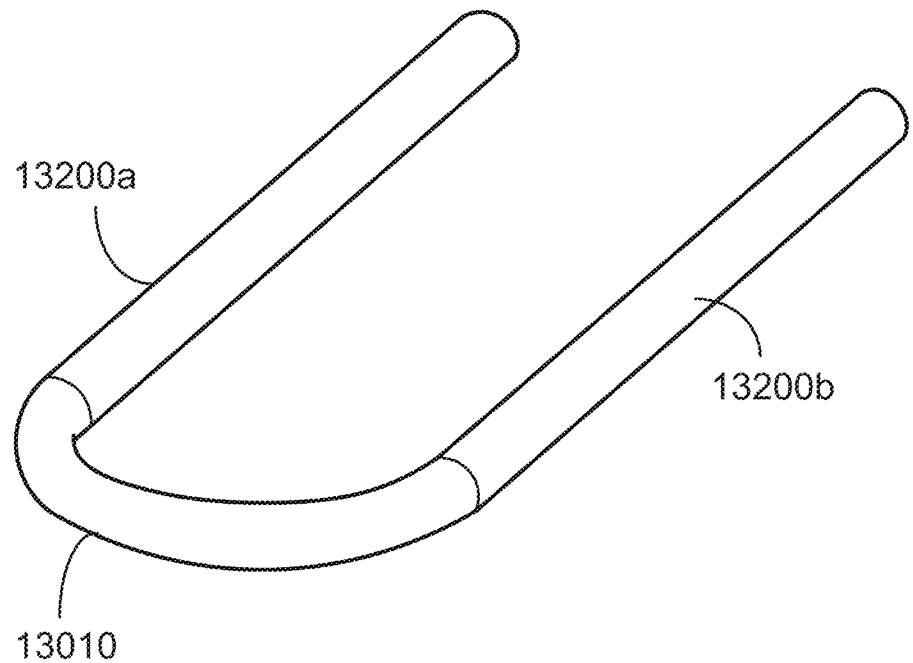
FIG. 132 is a diagram of an example of a U-shaped bolt.
Figure 134:
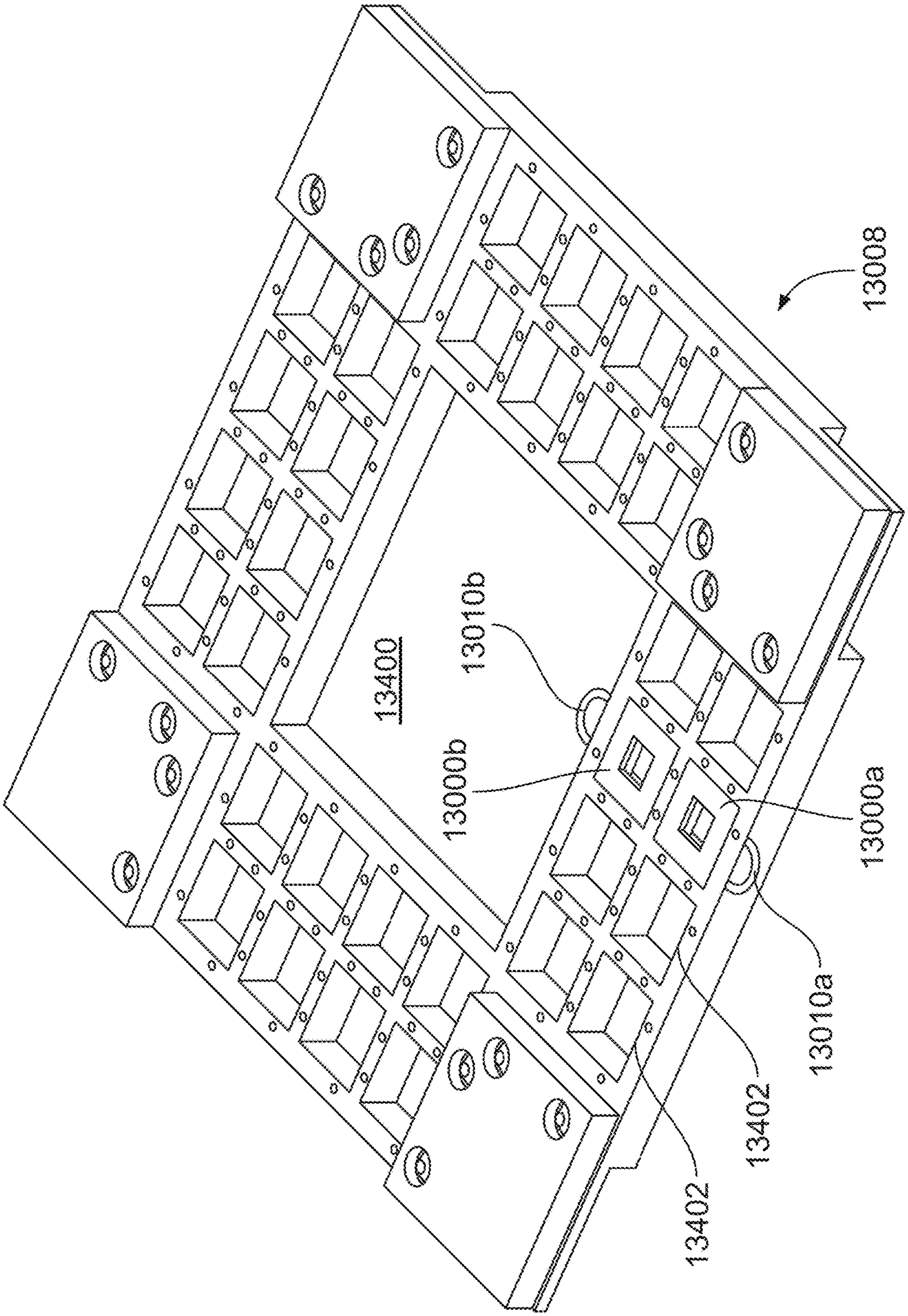

Referring to FIG. 130, in some implementations, a compression plate 13000 is used to apply a force to press the CPO module 12316 against a compression socket 13002, and a U-shaped bolt 13010 is used to fasten the compression plate 13000 to a front lattice structure 13008. An example of the compression plate 13000 is shown in FIG. 131, an example of the U-shaped bolt is shown in FIG. 132, and an example of the front lattice structure 13008 is shown in FIGS. 134 and 135. For example, the compression socket 13002 is mounted on a substrate 12310, and the compression socket 13002 includes compression interposers. The CPO module 12316 includes a photonic integrated circuit 13004 that is mounted on a substrate 13006. For example, the photonic integrated circuit 13004 can be similar to the photonic integrated circuit 214 (FIG. 2 to 5), 450, or 464 (FIG. 17), and the substrate 13006 can be similar to the substrate 211 (FIG. 2 to 5) or 454 (FIG. 17). The bottom side of the substrate 13006 includes electrical contacts that are electrically coupled to electrical contacts in the compression socket 13002.

Figure 135B:
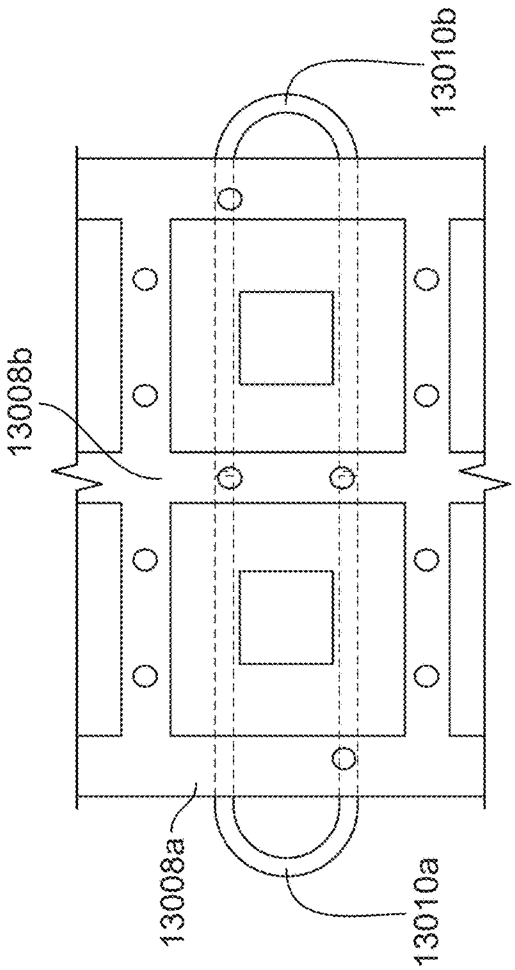

The front lattice structure 13008 is attached to the substrate 12310, and the U-shaped bolt 13010 is inserted into holes in the sidewalls of the front lattice structure 13008 and holes in the compression plate 13000 to secure the compression plate 13000 in place relative to the front lattice structure 13008. In this example, the front lattice structure 13008 includes a first sidewall 13008*a* and a second sidewall 13008*b*. The first sidewall 13008*a* includes two through-holes. As shown in the example of FIG. 135B, the second sidewall 13008*b* includes two partial-through-holes that do not entirely pass through the second sidewall 13008*b*. This allows another CPO module to be inserted in the space to the right of the second sidewall 13008*b*, and another U-shaped bolt 13010*b* to secure the other CPO module to the sidewalls of the front lattice structure 13008. In this example, the U-shaped bolt 13010*a* is inserted from the left of the first sidewall 13008*a*, through the two through-holes in the first sidewall 13008*a*, through the two through-holes in the compression plate 13000, and into the two partial-through-holes in the second sidewall 13008*b* of the front lattice structure 13008.

Figure 135C:
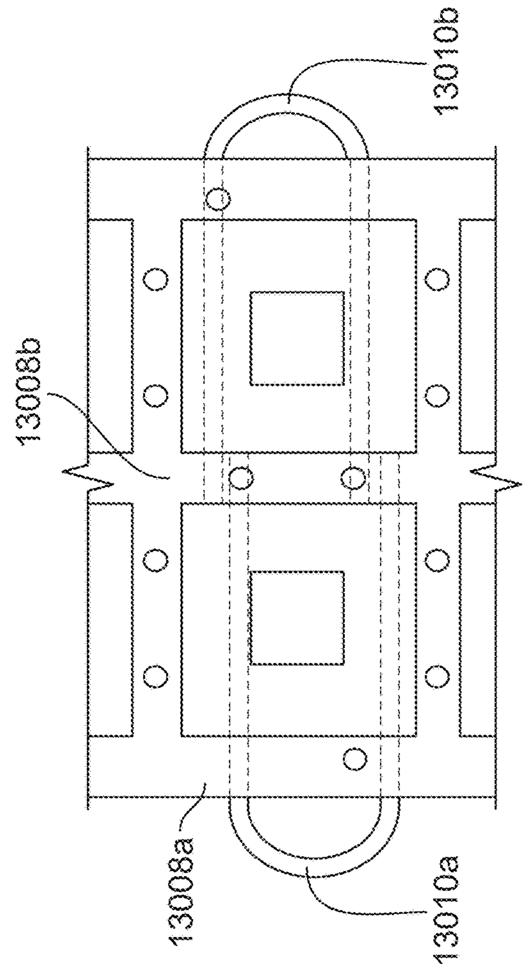

Alternatively, as shown in the example of FIG. 135C, the second sidewall 13008*b* can include full through-holes and the U-shaped bolt 13010*a* can completely pass through the second sidewall 13008*b*. A second CPO module can be inserted in the space to the right of the second sidewall 13008*b* using another U-shaped bolt 13010*b* to secure the second CPO module to the sidewalls of the front lattice structure 13008. In this example, the through-holes in the second sidewall 13008*b* for securing the second CPO module can be laterally offset from the through-holes in the second sidewall 13008*b* securing the first CPO module.

Figure 133:
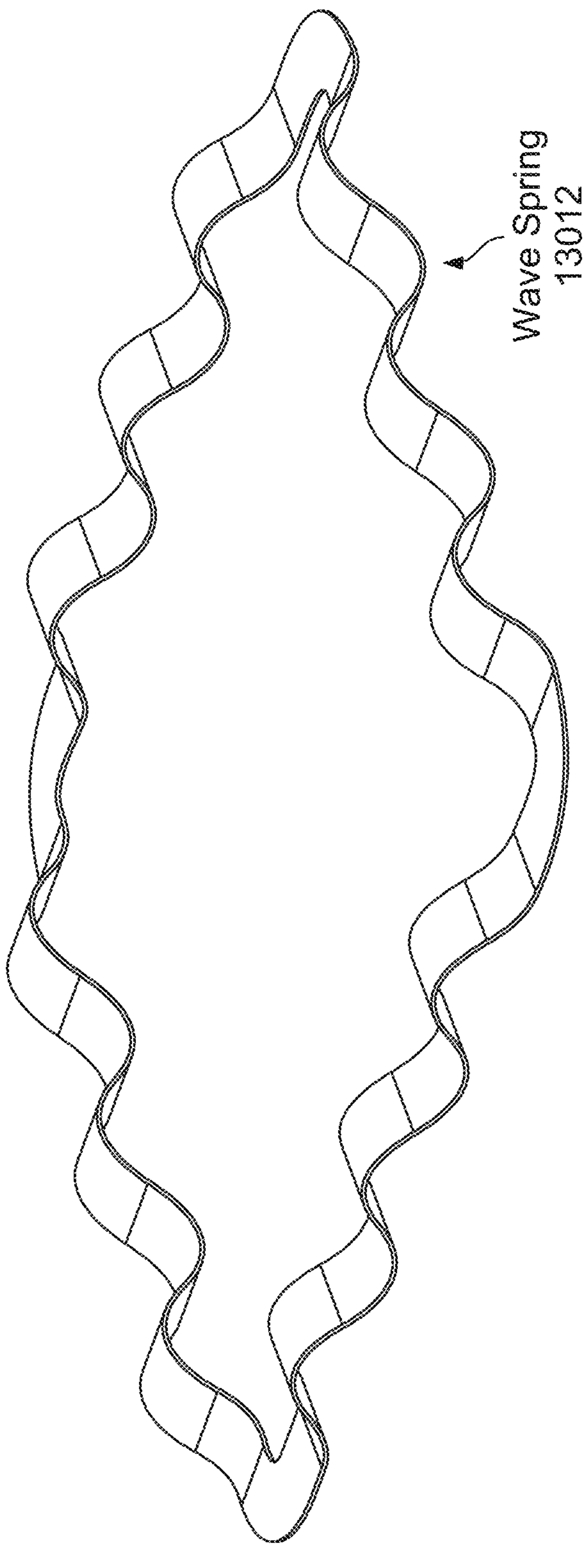

In some implementations, a wave spring 13012 is positioned between the compression plate 13000 and the CPO module 12316 to distribute the compression load to the CPO module 12316. A groove can be cut on the bottom side of the compression plate 13000 to prevent the wave spring 13012 from sliding around on the top surface of the outer shell of the photonic integrated circuit 13004 during assembly. An example of the wave spring 13012 is shown in FIG. 133. The wave spring 13012 can also provide tolerance in the positioning and dimensions of the CPO module 12316.

FIG. 131 is a diagram of an example of the compression plate 13000. The compression plate 13000 can be made of a stiff material, e.g., steel, titanium, copper, or brass. The compression plate 13000 defines an opening 13100 to allow an optical fiber cable to pass through and be connected to the CPO module 12316. The compression plate 13000 defines two through-holes 13102*a* and 13102*b* (collectively referenced as 13102) that allow two arms of the U-shaped bolt 13010 to pass through. In this figure, the through-holes 13102 are not drawn to scale. The hole diameter is configured to be smaller than the plate thickness. The compression plate 13000 can be made relatively thick (e.g., 1 mm to 5 mm) to enhance rigidity.

FIG. 132 is a diagram of an example of the U-shaped bolt 13010. The U-shaped bolt 13010 can be made of, e.g., stainless steel, titanium, copper, or brass, and includes two arms 13200*a* and 13200*b* (collectively referenced as 13200) that can be inserted into the through-holes and partial-through-holes in the sidewalls 13008*a*, 13008*b* of the front lattice structure 13008, and the through-holes 13102*a* and 13102*b* in the compression plate 13000 to lock the compression plate 13000 in place. The U-shaped bolt 13010 can have a one-piece design, e.g., made by bending an elongated thin rod to the required shape.

FIG. 133 is a diagram of an example of the wave spring 13012. The wave spring 13012 can also have other configurations.

FIG. 134 is a perspective view of an example of the front lattice structure 13008. FIG. 135 is a top view of a portion of the front lattice structure 13008. In this example, the front lattice structure 13008 defines a larger opening 13400 near the center region, and several smaller openings 13402 around the larger opening 13400. When the front lattice structure 13008 is attached to the substrate 12310 as shown in FIG. 129, the position of the center opening 13400 corresponds to the position of the data processing chip 12312 on the other side (e.g., rear side) of the substrate 12310. One or more components can be mounted on the front side of the substrate 12310 to support the data processor chip 12312 on the rear side of the substrate 12310. For example, the one or more components can include one or more capacitors, one or more filters, and/or one or more power converters. The one or more components have certain thicknesses and protrude through or partially through the opening 13400.

Each of the openings 13402 allows a CPO module 12316 to pass through and be coupled to a corresponding compression socket 13002. In the example shown in FIG. 134, the front lattice structure 13008 defines 32 openings 13402 that allow the insertion of 32 CPO modules 12316. The dimensions of this configuration support a half width 2U rack with 12 mm square optical module footprint. The openings 13402 are spaced apart at distances to support XSR channel compliance.

Figure 135A:
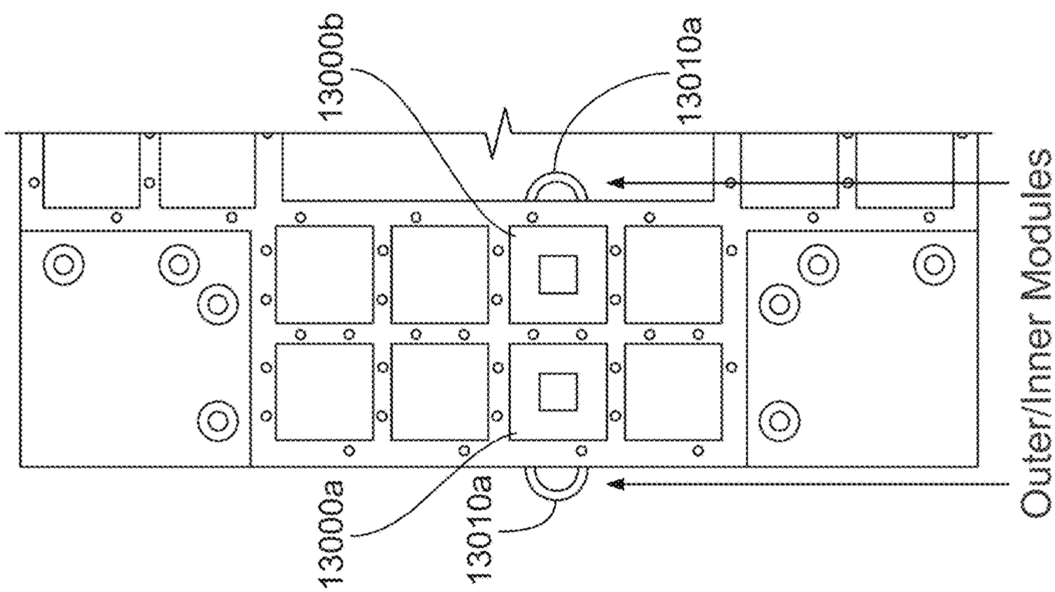

FIGS. 134, 135A, and 135B show an example in which an outer CPO module is locked in place using a compression plate 13000*a* and a U-shaped bolt 13010*a*, and an inner CPO module is locked in place using a compression plate 13000*b* and a U-shaped bolt 13010*b* without a lateral offset between the bolts (e.g., 13010*a*, 13010*b*) and hence requiring partial-through-holes in the portion of the lattice between the CPO modules. FIG. 135C shows an example in which a lateral offset is provided between the bolts and allowing the bolts to pass through complete through-holes in the portion of the lattice between the CPO modules. The term "outer CPO module" refers to a CPO module positioned closer to the outer edges of the front lattice structure 13008, and the term "inner CPO module" refers to a CPO module positioned closer to the inner edges of the front lattice structure 13008.

In some implementations, instead using a bolt (or clip) having arms that pass through holes in the sidewalls of the front lattice structure 13008 and holes in the compression plate 13000, a clamp or screws (e.g., spring-loaded screws) can be used to fasten or lock the compression plate 13000 in place relative to the front lattice structure 13008.

Figure 136:
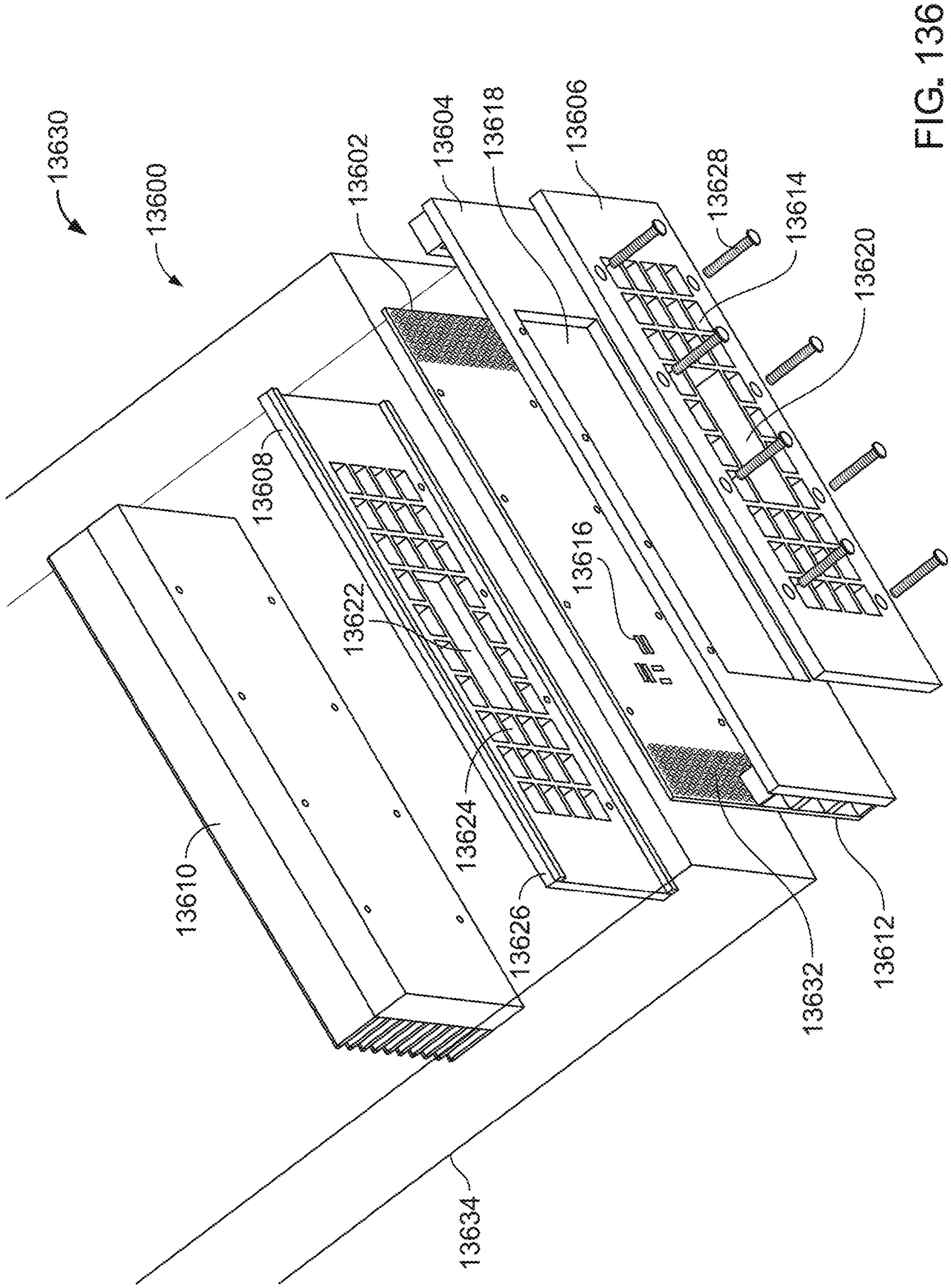

FIG. 136 is an exploded front perspective view of an example of an assembly 13600 in a rackmount system 13630. In some implementations, the assembly 13600 includes the data processing chip 12312 mounted on a substrate 13602, a printed circuit board 13604, a front lattice structure 13606, a rear lattice structure 13608, and a heat dissipating device 13610. The printed circuit board 13604 is positioned between the substrate 13602 and the front lattice structure 13606. The rear lattice structure 13608 is positioned between the substrate 13602 and the heat dissipating device 13610. The assembly 13600 can be placed in a housing 13634 of the rackmount system 13630. The housing 13634 has a front panel, and the substrate 13602 has a main surface (e.g., the front surface) that is at an angle in a range from 0 to 45° relative to the plane of the front panel. In some examples, the main surface of the substrate 13602 is substantially parallel to (e.g., in a range from 0 to 5°) relative to the plane of the front panel.

As discussed in more detail below in connection with FIG. 151, in an alternative embodiment, the printed circuit board 13604 can be positioned between the substrate 13602 and the rear lattice structure 13626.

For example, the printed circuit board 13604 is used to facilitate the provision of electrical power, control signals, and/or data signals to the data processing chip 12312. The substrate 13602 can be, e.g., a ceramic substrate that is more expensive than a printed circuit board of comparable size, and it may be difficult to cost effectively manufacture the ceramic substrate sufficiently large to accommodate all the necessary connectors. The outer dimensions of the substrate 13602 can be smaller than the outer dimensions of the printed circuit board 13604. Connectors 13612 can be mounted on the printed circuit board 13604 for receiving electrical power, control signals, and/or data signals. The connectors 13612 can have a size sufficiently large that can be conveniently handled by an operator. For example, the connectors 13612 can be Molex connectors or other types of connectors. The front surface of the substrate 13602 has electrical contacts 13632 that are electrically coupled to electrical contacts on the rear surface of the printed circuit board 13604. The electrical contacts allow the electrical power, control signals, and/or data signals to be transmitted from the printed circuit board 13604 to the data processing chip 12312 through the substrate 13602. In some examples, the connectors 13612 are configured to mate with external connectors in a direction parallel to the plane of the printed circuit board 13604. In some examples, the connectors 13612 are configured to mate with external connectors in a direction perpendicular to the plane of the printed circuit board 13604, and the signal lines extend in a rearward direction. This can reduce the spaces to the left and to the right of the printed circuit board 13604 that are need to accommodate the signal wires. The connectors 13612 and the signal lines connected to the connectors 13612 can also be used to transmit signals from the data processing chip 12312 to other parts of the system.

This construction enables the delivery of power and other signals external to the system, maintaining the ASIC and module attachment directly to the package substrate. The delivery of power and other signals can be achieved through, e.g., land grid arrays, ball grid arrays, pin grid arrays, or sockets on the front side of the package substrate 13602 that connect to the printed circuit board 13604. The printed circuit board 13604 can include any of the usual printed circuit board components, including the connectors 13612. The printed circuit board connectors 13612 enable power and signal delivery through the connectors 13612, which are then transferred to the package substrate 13602. The package substrate 13602 is preferably attached to the printed circuit board 13604 during assembly and then placed in the rear lattice structure assembly.

The front lattice structure 13606 defines several openings 13614 that allow CPO modules 12316 to pass through and be coupled to electrical contacts or sockets 13616 mounted on the front side of the substrate 13602. The printed circuit board 13604 defines an opening 13618 to allow the CPO modules 12316 to pass through. The front lattice structure 13606 has an overhang 13700 (FIG. 137) that extends through the opening 13618 and is attached to the front side of the substrate 13602. The front lattice structure 13606 can be made of, e.g., steel or copper. The figure shows that the printed circuit board 13604 defines a single large central opening 13618, similar to a "picture frame." In other examples, it is also possible to divide the opening 13618 into two or more smaller openings.

Electrical components can be mounted on the front side of the substrate 13602 in a first region occupying approximately the same footprint as the data processing chip 12312, which is on the rear side of the substrate 13600. The electrical components support the data processing chip 12312 and can include, e.g., one or more capacitors, one or more filters, and/or one or more power converters. The front lattice structure 13606 defines a larger opening 13620 in the central region that occupies a slightly larger footprint than the first region. The electrical components mounted on the front surface of the substrate 13602 protrude through or partially through the opening 13618 in the printed circuit board 13604, and protrude through or partially through the opening 13620 in the front lattice structure 13606.

In some implementations, the front lattice structure 13606 can have a configuration similar to that of the front lattice structure 13008 of FIG. 134, and the CPO modules 12316 can be pressed by compression plates 13000 against corresponding sockets 13002. U-shaped bolts 13010 can be used to secure the compression plates 13000 to the sidewalls of the front lattice structure 13606.

The rear lattice structure 13608 defines a central opening 13622 that is slightly larger than the data processing chip 12312. The data processing chip 12312 protrudes through or partially through the opening 13622 and is thermally coupled to the heat dissipating device 13610. The rear lattice structure 13608 defines several openings 13624 that generally correspond to the openings 13614 in the front lattice structure 13606. Electronic components 13702 (FIG. 137) can be mounted on the rear side of the substrate 13602 to support the CPO modules 12316 that are coupled to the front side of the substrate 13612. The electronic components 13702 can protrude through or partially through the openings 13624 in the rear lattice structure 13608. The electronic components 13702 can include, e.g., capacitors for power integrity, microcontrollers, and/or separately regulated power supplies that can isolate the optical module power domains.

In some implementations, screws 13628 are used to fasten the front lattice structure 13606, the printed circuit board 13604, the substrate 13602, the rear lattice structure 13608, and the heat dissipating device 13610 together. The rear lattice structure 13608 has lips 13626 that function as a backstop to prevent crushing of the interface (e.g., land grid arrays, pin grid arrays, ball grid arrays, sockets, or other electrical connectors) between the substrate 13602 and the printed circuit board 13604 when force is applied to fasten the front lattice structure 13606, the printed circuit board 13604, the substrate 13602, the rear lattice structure 13608, and the heat dissipating device 13610 together. In this example, the lips 13626 are formed near the upper and lower edges on the front side of the rear lattice structure 13608. It is also possible to form the lips 13626 near the right and left edges on the front side of the rear lattice structure 13608, or at other locations on the front side of the rear lattice structure 13608.

Figure 137:
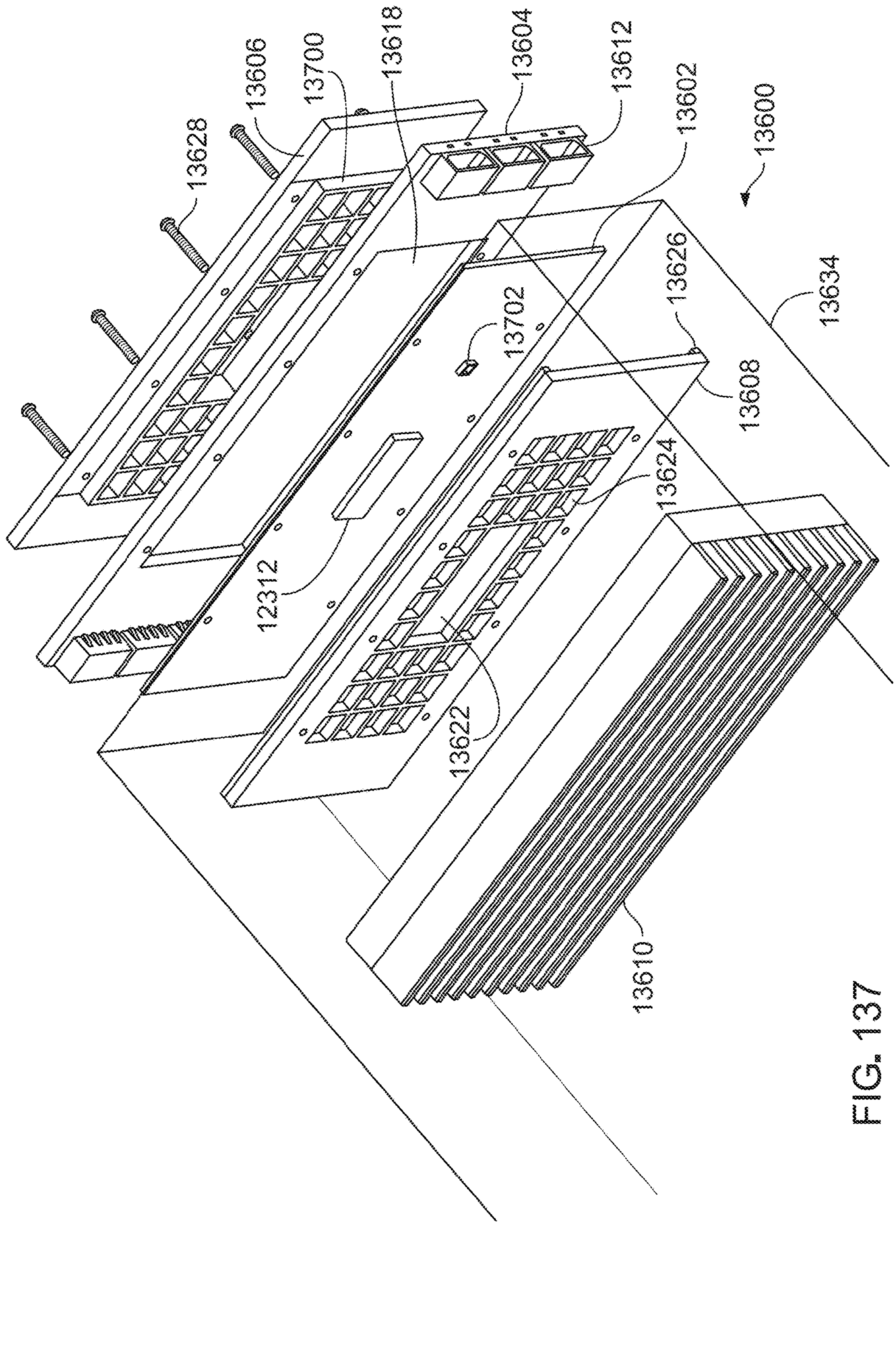

FIG. 137 is an exploded rear perspective view of an example of the assembly 13600. The front lattice structure 13606 has an overhang 13700 that extends through the opening 13618 in the printed circuit board 13604 and is attached to the front side of the substrate 13602. The data processing chip 12312 mounted on the rear side of the substrate 13602 extends through or partially through the opening 13622 in the rear lattice structure 13608 and is thermally coupled to the heat dissipating device 13610. For example, a thermally conductive gel or pad can be positioned between the data processing chip 12312 and the heat dissipating device 13610. The electronic components 13702 mounted on the rear side of the substrate 13602 extends through or partially through the openings 13624 in the rear lattice structure 13608. The upper lip 13626 extends over the upper edge of the substrate 13602 and contacts the rear side of the printed circuit board 13604, and the lower lip 13626 extends under the lower edge of the substrate 13602 and contacts the rear side of the printed circuit board 13604.

In this example, the connectors 13612 include male Molex connectors configured to receive female Molex connectors along a direction parallel to the plane of the printed circuit board 13604. It is also possible to configure the connectors 13612 to receive connectors along a direction perpendicular to the plane of the printed circuit board 13604 so that the signal lines extend in a rearward direction.

Figure 138:
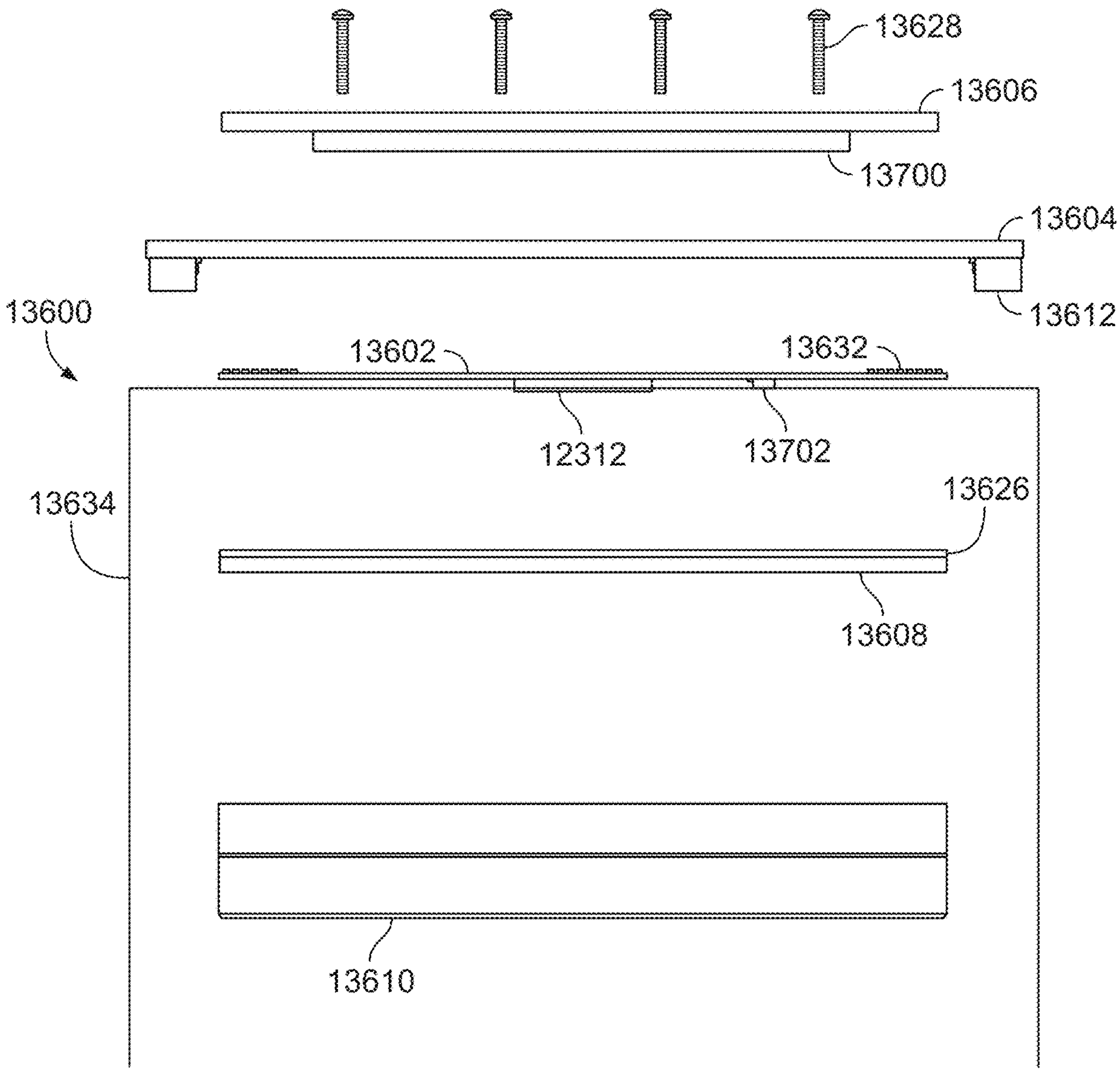

FIG. 138 is an exploded top view of an example of the assembly 13600. In this example, the width of the overhang 13700 of the front lattice structure 13606 is selected to be slightly smaller than that of the opening 13618 of the printed circuit board 13604. The width of the printed circuit board 13604 can be almost as wide as the inner width of the housing 13634. The connectors 13612 are positioned near the left and right edges of the printed circuit board 13604 at locations to provide sufficient space to accommodate the signal lines that are connected to the connectors 13612. The width of the substrate 13602 and the width of the rear lattice structure 13608 are selected so that they fit in the space between the connectors 13612 near the left edge of the printed circuit board 13604 and the connectors 13612 near the right edge of the printed circuit board 13604.

Figure 139:
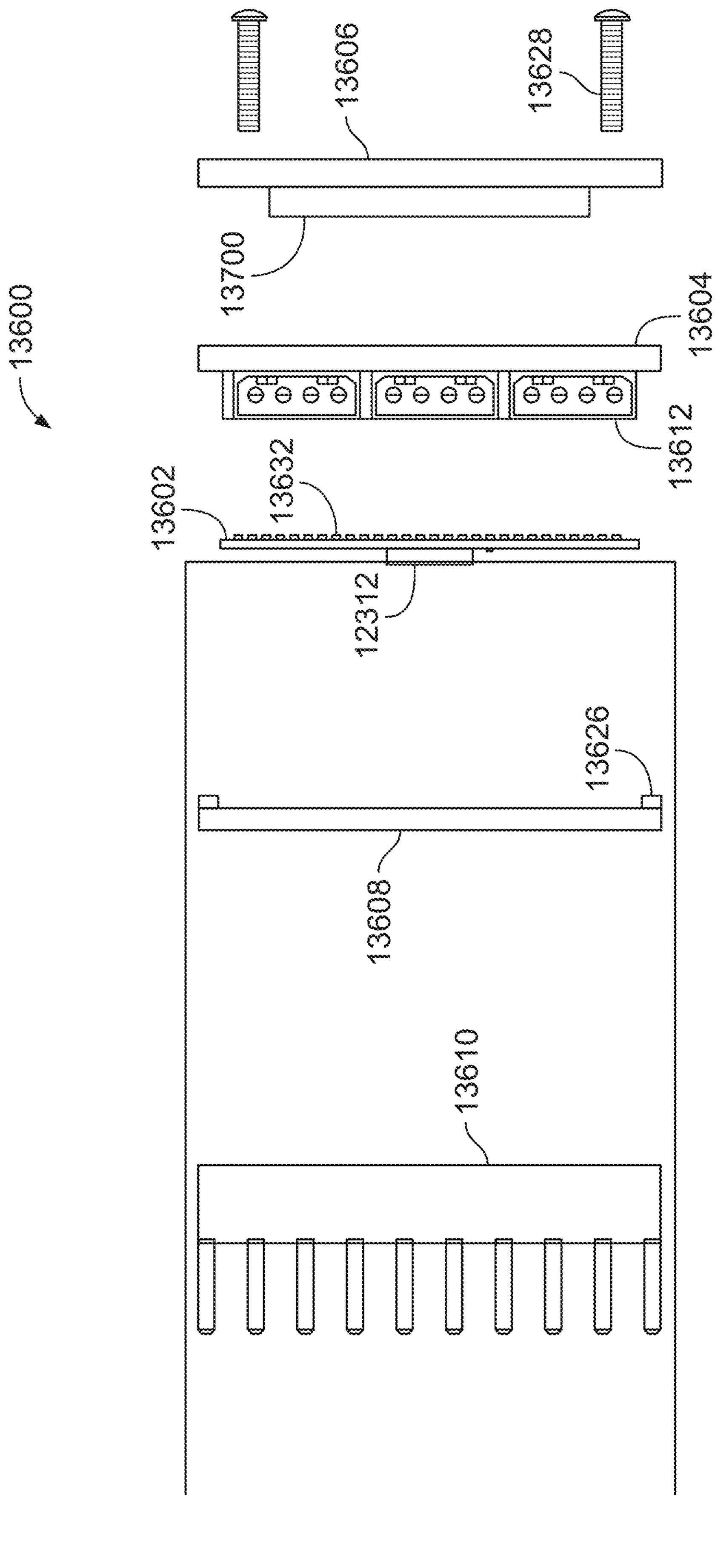

FIG. 139 is an exploded side view of an example of the assembly 13600. In this example, the height of the overhang 13700 of the front lattice structure 13606 is selected to be slightly smaller than that of the opening 13618 of the printed circuit board 13604. The height of the printed circuit board 13604 can be almost as tall as the inner height of the housing 13634. The height of the substrate 13602 is selected so that the substrate 13602 fits in the space between the upper lip 13626 and the lower lip 13626.

Figure 140:
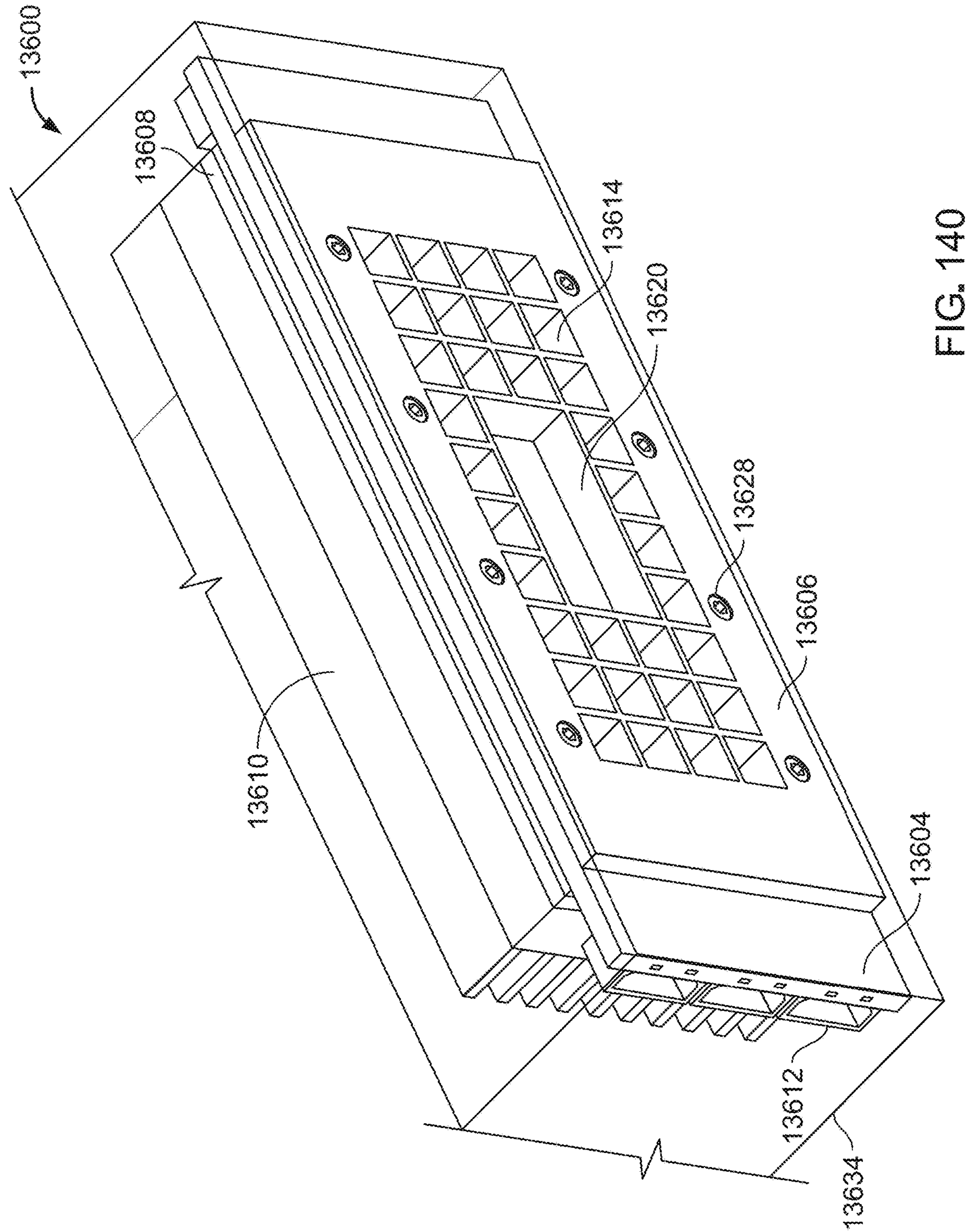

FIG. 140 is a front perspective view of an example of the assembly 13600 that has been fastened together. The overhang 13700 of the front lattice structure 13606 contacts the front surface of the substrate 13604, and the electronic components that support the data processing chip 12312 extend through or partially through the opening 13618 in the printed circuit board 13604 and the opening 13620 in the front lattice structure 13606. The sidewalls of the front lattice structure 13606 function as guides for aligning the CPO modules 12316 to the sockets 13616 on the front surface of the substrate 13602. The large printed circuit board 13604 has more surface area to mount connectors 13612 for providing electrical power, control signals, and/or data signals to the data processing chip 12312. The assembly 13600 is vertically mounted, e.g., the substrate 13602 is substantially vertical with respect to the top or bottom panel of the housing 13634 and substantially parallel to the front panel. The assembly 13600 is positioned near the front panel, e.g., not more than 12 inches from the front panel. The front panel can be opened to allow an operator to easily access the CPO modules 12316, e.g., to insert or remove the CPO modules 12316 into or from the sockets 13616.

Figure 141:
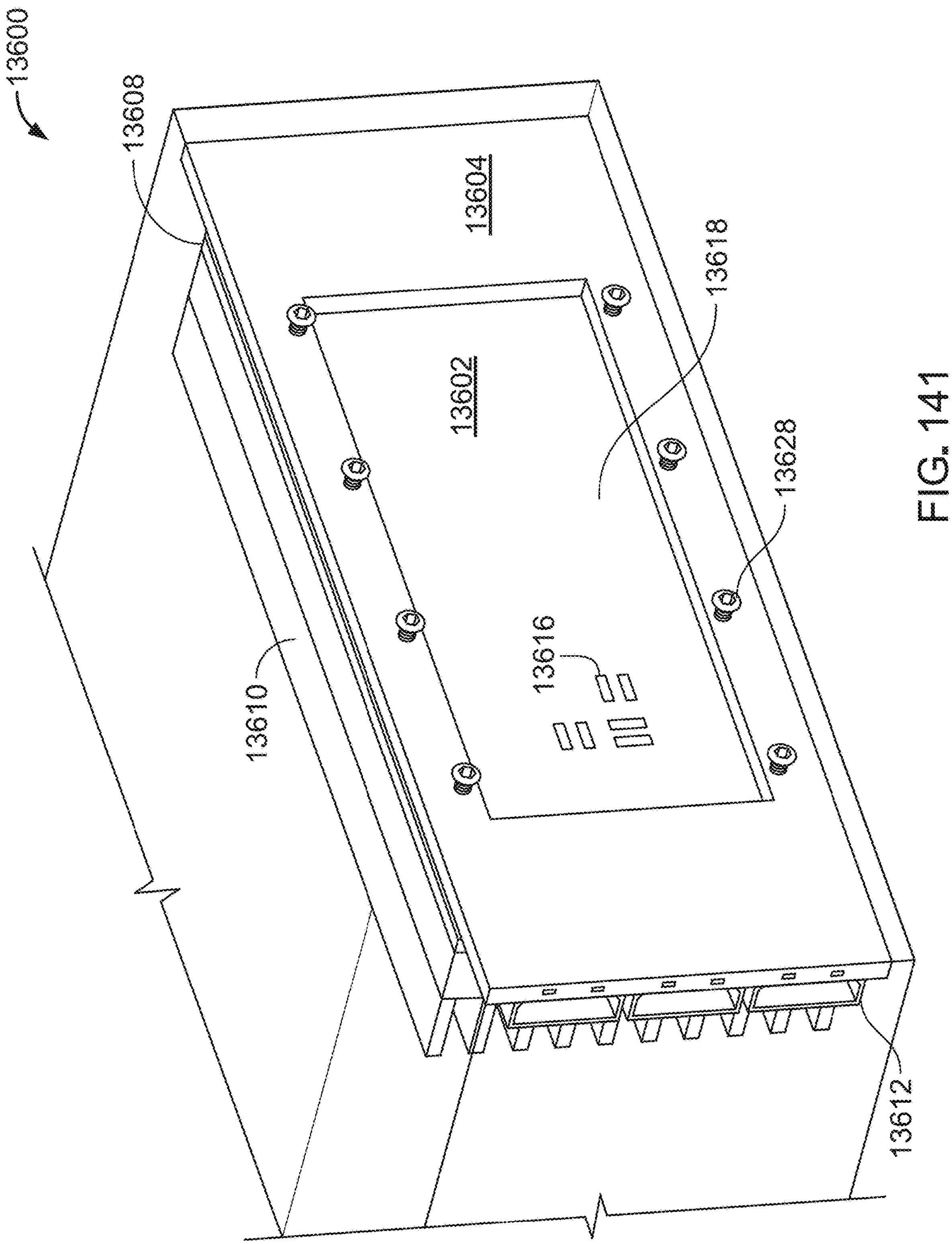

FIG. 141 is a front perspective view of an example of the assembled assembly 13600 without the front lattice structure 13606. The printed circuit board 13604 is shaped similar to a "picture frame" and the opening 13618 is configured to allow the CPO modules 12316 to be coupled to the sockets 13616, and to provide space to accommodate the various electronic components mounted on the front side of the substrate 13602 that support the data processing chip 12312 on the rear side of the substrate 13602.

Figure 142:
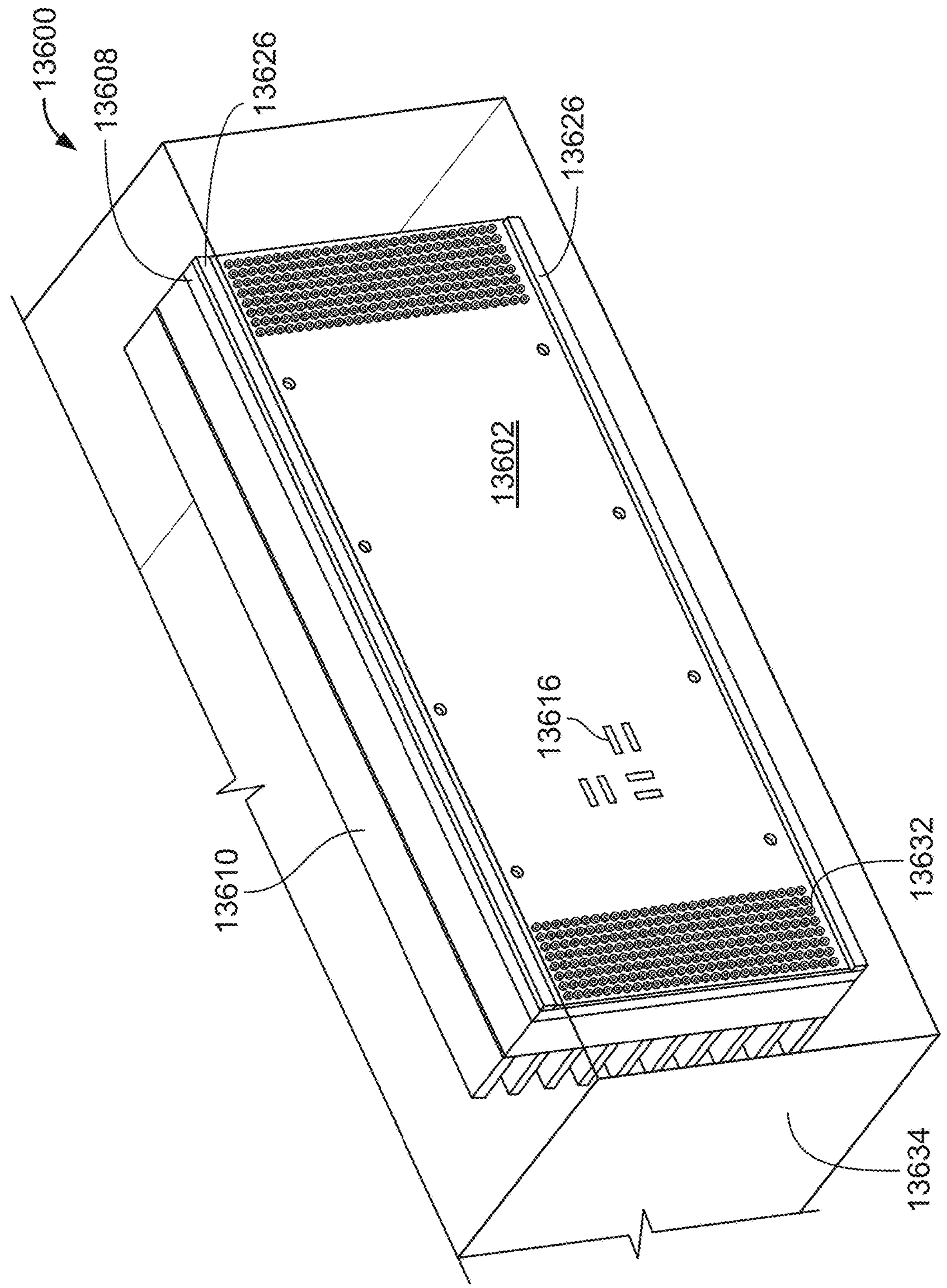

FIG. 142 is a front perspective view of an example of the assembled assembly 13600 without the printed circuit board 13604 and the front lattice structure 13606. Electrical contacts or sockets 13616 (each socket can include a plurality of electrical contacts) are provided on the front side of the substrate 13602, in which the electrical contacts or sockets 13616 are configured to be coupled to the CPO modules 12316. In this example, arrays of electrical contacts 13632 are provided at the left and right regions of the substrate 13602. For example, power converters can be mounted on the printed circuit board 13604 to receive electric power that has a higher voltage (e.g., 12V or 24V) and a lower current, and output electric power that has a lower voltage (e.g., 1.5V) and a higher current. In some implementations, the data processing chip 12312 can require more than 100 A of peak current during certain periods of time. By providing a large number of electrical contacts 13632, the overall resistance to the higher current can be made smaller.

Figure 143:
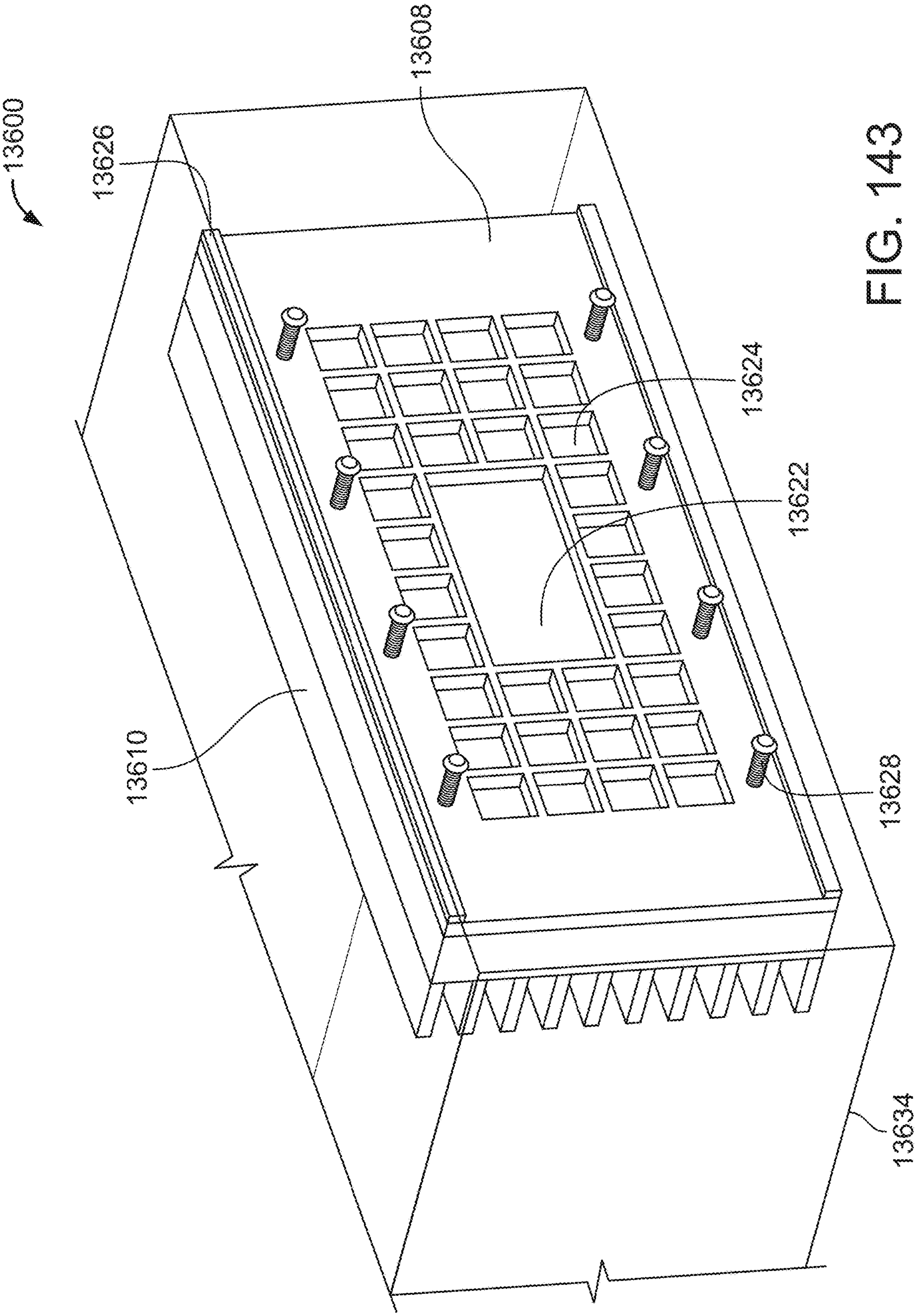

FIG. 143 is a front perspective view of an example of the assembled rear lattice structure 13608 and the heat dissipating device 13610. The rear lattice structure 13608 defines an opening 13622 to provide space for the data processing chip 12312 mounted on the rear side of the substrate 13602. The rear lattice structure 13608 defines openings 13624 to provide space for the components 13702 mounted on the rear side of the substrate 13602, in which the components support the CPO modules 12316 coupled to the electrical contacts 13616 on the front side of the substrate 13602. The upper and lower lips 13626 prevent crushing of the interface (e.g., land grid arrays, pin grid arrays, ball grid arrays, sockets, or other electrical connectors) between the substrate 13602 and the printed circuit board 13604 when force is applied to fasten the front lattice structure 13606, the printed circuit board 13604, the substrate 13602, the rear lattice structure 13608, and the heat dissipating device 13610 together.

Figure 144:
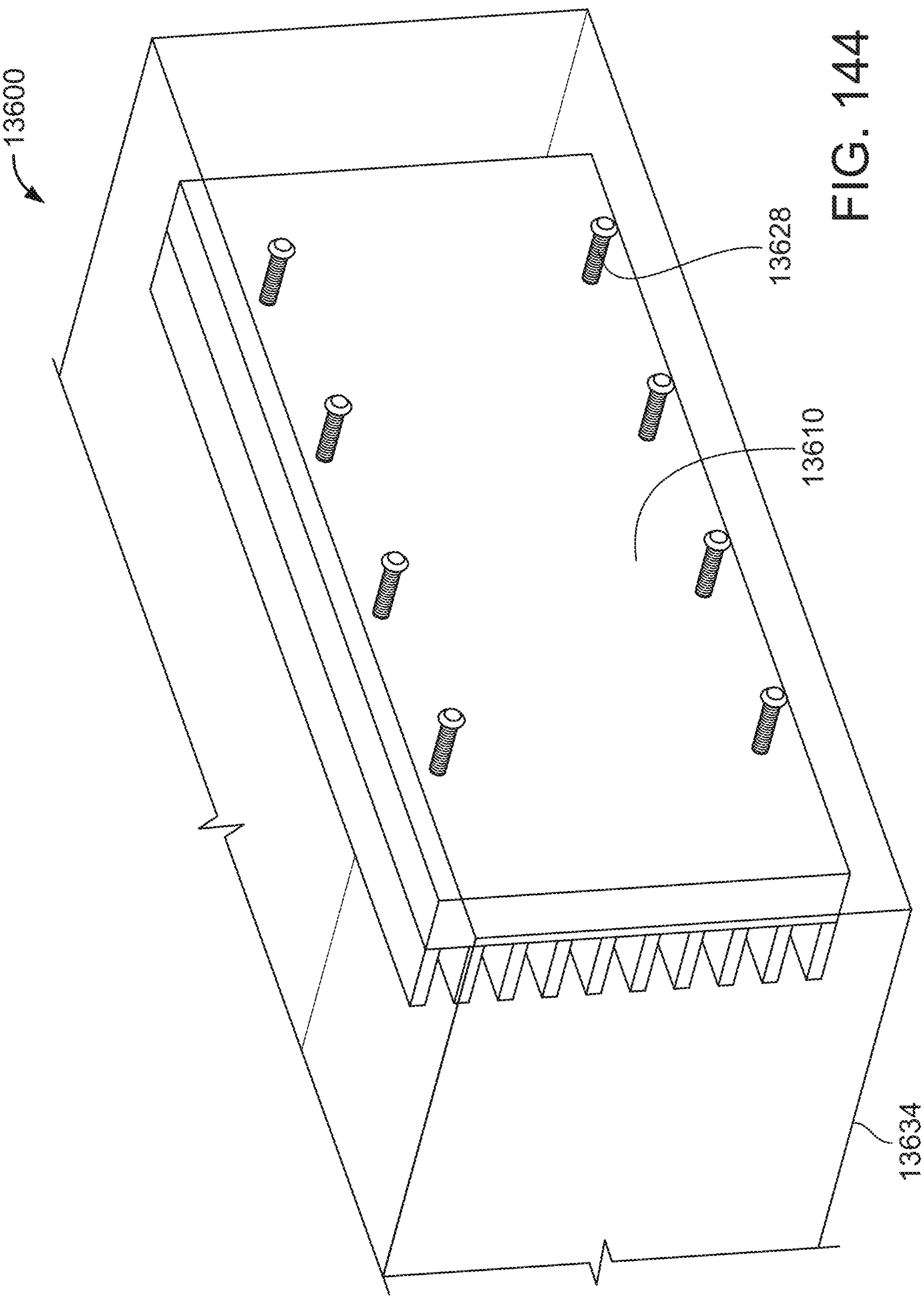

FIG. 144 is a front perspective view of an example of the heat dissipating device 13610 and the screws 13628. The heat dissipating device 13610 can include fins that extend in the horizontal direction. For example, an inlet fan (e.g., 12546 of FIG. 125) blows air in the horizontal direction across the fins to help carry away the heat generated by the data processing chip 12312.

Figure 145:
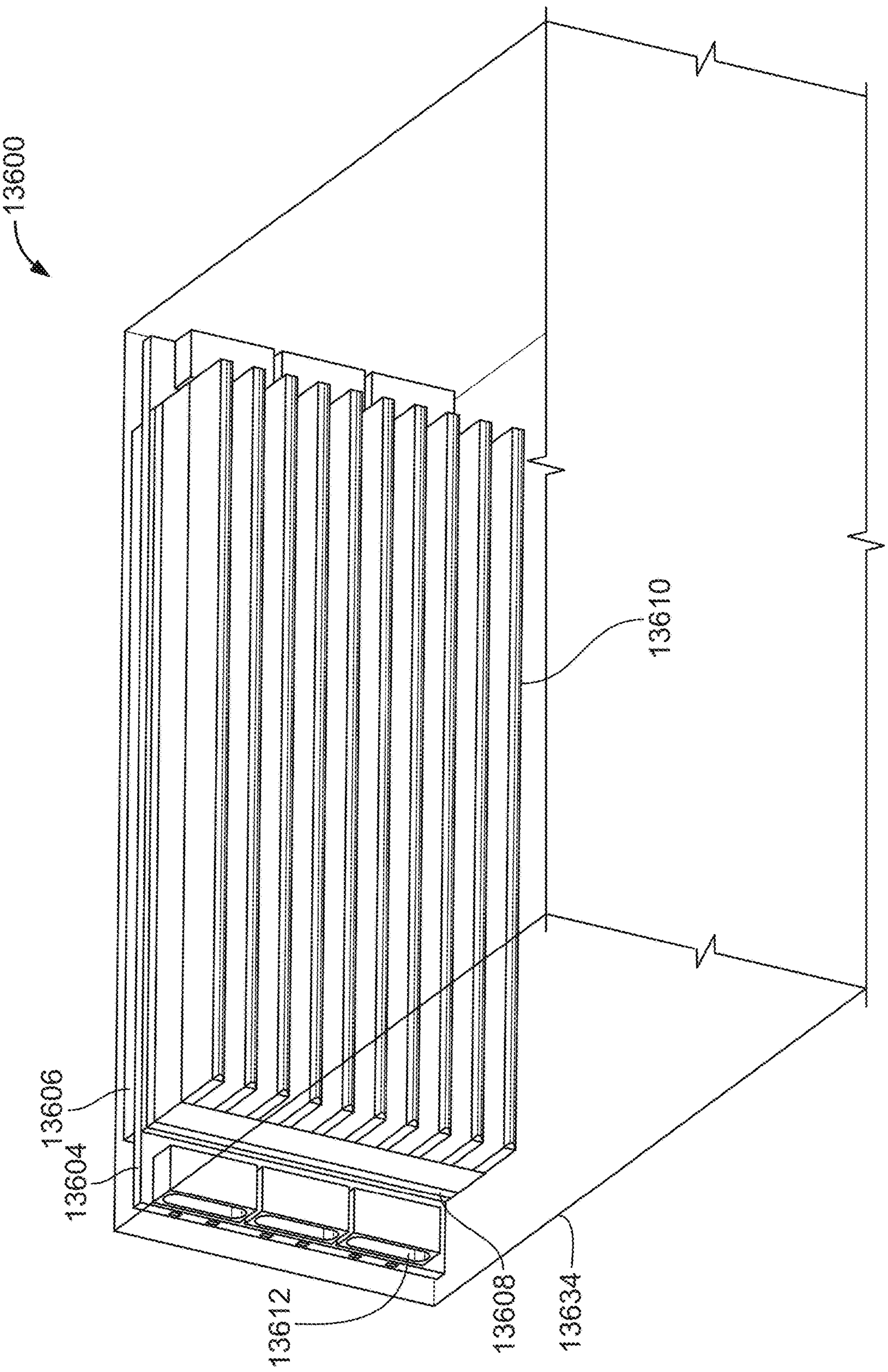

FIG. 145 is a rear perspective view of an example of the assembly 13600 in which the front lattice structure 13606, the printed circuit board 13604, the substrate 13602, the rear lattice structure 13608, and the heat dissipating device 13610 have been fastened together. The heat dissipating device 13610 as shown in the figure includes horizontal fins, but can also have other configurations, such as having pins or posts, such as those shown in FIG. 68C. The heating dissipating device 13610 can include a vapor chamber thermally coupled to the heat sink fins or pins.

FIG. 146 is a rear perspective view of an example of the assembly 13600 without the rear lattice structure 13608. The data processing chip 12312 protrudes through or partially through the opening 13622 in the rear lattice structure 13608. The components 13702 protrude through or partially through the openings 13624 in the rear lattice structure 13608.

FIG. 147 is a rear perspective view of an example of the front lattice structure 13606, the printed circuit board 13604, and the substrate 13602 that have been fastened together. FIG. 148 is a rear perspective view of an example of the front lattice structure 13606 and the printed circuit board 13604 that have been fastened together. The overhang 13700 of the front lattice structure 13606 extends into the opening 13618 in the printed circuit board 13604. FIG. 149 is a rear perspective view of an example of the front lattice structure 13606.

Referring to FIG. 150, in some implementations, a data processing chip 15000 is mounted on a substrate (e.g., a ceramic substrate) 15002, which is electrically coupled to a first side of a printed circuit board 15004. A CPO module 15006 is mounted on a substrate (e.g., a ceramic substrate) 15008, which is electrically coupled to a second side of the printed circuit board 15004. The configuration shown in FIG. 150 can be used in any of the systems or assemblies described above that includes a data processing chip communicating with one or more CPO modules.

FIG. 151 shows, in the right portion of the figure, a top view of an example of an assembly 15100, suitable for use in a rackmount system, that includes a vertical printed circuit board 13604 (e.g., a daughter card) that is positioned between a package substrate 13602 (also referred to as a CPO substrate) and a rear lattice structure 13626. The package substrate 13602 is positioned between the printed circuit board 13604 and a front lattice structure 13606. In this example, each CPO module 12316 is removably attached to a high-speed LGA socket 15104 that is mounted on the front side of the package substrate 13602. The data processing chip 13612 (which in this example is a switch ASIC) is mounted on the rear side of the package substrate 13602. The high-speed LGA socket 15104 is electrically coupled to high-speed LGA pads 15106 on the front surface of the package substrate 13602. High speed traces 15102 within the package substrate 13602 provides high speed signal connections between the CPO modules 12316 and the data processing chip 13612.

In this example, the printed circuit board 13604 defines an opening that allows the data processing chip 13612 to pass through to be thermally coupled to a heat dissipating device 13610. The printed circuit board 13604 is a "picture frame" with a cut-out for the switch ASIC 13612. The package substrate 13602 has power and low-speed contact pads 15108 on the rear side for attaching to the vertical printed circuit board 13604 (the "picture frame" daughter card) for receiving electrical power and low-speed control signals from the printed circuit board 13604. The power and low-speed contact pads 15108 are relatively large (e.g., about 1 mm), as compared to the high-speed LGA pads 15106. The power and low-speed contact pads 15108 is positioned between the CPO substrate 13602 and the printed circuit board 13604, and do not impact the mounting of the heat sink 13610 to the data processing chip 13612.

In some implementations, the printed circuit board 13604 defines an opening that is that is large enough to accommodate the data processor (e.g., switch ASIC) 13612 and additional components that are mounted on the rear side of the substrate 13602, in which the additional components support the CPO modules 12316. The additional components can include, e.g., one or more capacitors, filters, power converters, or voltage regulators. In some examples, instead of having one large opening, the printed circuit board 13604 can define multiple openings that are positioned to allow the data processor 13612 and the additional components to protrude through or partially through.

FIG. 151 shows, in the left portion of the figure, a perspective rear view of the package substrate 13602, the CPO module 12316, and compression plates 15110. As shown in this diagram, in some implementations, there can be a large number (e.g., several hundred or thousand) of power and low-speed contact pads 15108 to allow routing of a large amount of power to the data processing chip 13612 and the CPO modules 12316. In this example, each compression plate 15110 has an integrated heat sink 15112 for dissipating the heat generated by the CPO module 12316.

Referring to FIG. 152, in some implementations, the CPO modules 12316 can easily be removed from the package substrate 13602 for replacement or repair. For example, a fiber connector is attached to the CPO module 12316, which is attached to the LGA socket 15104, which is removably attached to the package substrate 13602. The compression plate 15110 presses down on the CPO module 12316 and is secured relative to the front and rear lattice structures 13606, 13626 using the U-shaped bolts 13010 and spring-loaded screws 15200. The compression plate 15110 can have a latch for latching the fiber connector 12318. If a CPO module 12316 malfunctions, the technician and remove the screws 15200, remove the U-shaped bolts 13010, and detach the CPO module 12316 from the LGA socket 15104, or detach the LGA socket from the package substrate 13602.

FIG. 153 is a diagram showing an example of a process 15300 for assembling the assembly 15100. The front lattice structure 13606 is attached 15302 to the CPO substrate 13602, and the CPO substrate 13602 is attached 15304 to the printed circuit board 13604. The heat sink 13610 is thermally coupled to the data processing chip 13612. This diagram shows the front side of the CPO substrate 13602, the data processing chip 13612 is mounted on the other side of the CPO substrate 13602 and not shown in the figure. The diagram 15306 shows the assembly 15100 ready for insertion of the CPO modules 12316. The diagram 15308 shows CPO modules 12316 with compression plates 15110 inserted into the front lattice structure 13606, and before attachment of the optical fibers.

FIG. 154 is a diagram showing an example of a CPO module 12316 having a lid 15400 to protect the CPO module 12316. Also shown is a compression plate 15110 with an integrated heat sink 15112. In this example, screws 15402 are used to secure the compression plate 15110 to the front lattice structure 13606 and/or the package substrate 13602 and/or the vertical printed circuit board 13604 and/or the rear lattice structure 13626.

FIG. 155A is a rear perspective view of an example of the LGA socket 15104, the optical module 12316, and the compression plate 15110. FIG. 155B is a front perspective view of an example of the LGA socket 15104, the optical module 12316, and the compression plate 15110. In FIGS. 155A and 155B, the LGA socket 15104 has been inserted into the front lattice structure 13606, ready for insertion or attachment of the optical module 12316 and the compression plate 15110.

FIG. 156 is a front view (assuming the printed circuit board 13604 is vertically mounted in a rackmount server) of an example of an array of compression plates 15110 mounted on the front lattice structure 13606. The front lattice structure 13606 includes an opening 13400 for placing components that support the data processor chip 12312 on the rear side of the substrate 12310. For example, the one or more components can include one or more decoupling capacitors, one or more filters, and/or one or more voltage regulators, if needed. The one or more components have certain thicknesses and protrude through or partially through the opening 13400.

FIG. 157 is a front perspective view of an example of the assembly 15100. Several CPO modules 12316 with lids 15400 are mounted on the front side of the package substrate 13602. The CPO modules 12316 are pressed against the package substrate 13602 by compression plates 15110 having integrated heat sinks 15112.

FIG. 158 is a top view of an example of the assembly 15100. The switch ASIC 13612 is mounted on the rear side of the package substrate 13602. Several CPO modules 12316 with lids 15400 are mounted on the front side of the package substrate 13602. The CPO modules 12316 are pressed against the package substrate 13602 by compression plates 15110 having integrated heat sinks 15112.

FIGS. 156 to 158 show compression plates 15110 on top of (or in front of) the optical modules 12316 showing the fiber connector receptacles. Under the compression plates is a baseplate (which is referred to as the lattice or honeycomb structure) that is mounted with screws through the system printed circuit board 13602 to the rear lattice 13626 or ASIC heatsink 13610 on the backside. In addition, or alternatively, a clip-based or bolt-based design similar to the design shown in FIGS. 130 to 135C can be used to secure the compression plates 15110 to the front lattice structure 13606.

In the examples shown in FIGS. 2, 4, 6, 7, 12, 17, 20, 22 to 31, 35A to 37, 43, 68A, 69A, 70, 71A, 72, 73A, 74A, 75A, 75C, 77A to 78, 99, 100, 104, 108, 110, 112, 113, 115, 117, 118 to 125B, 129, 136 to 153, and 158 to 160, one or more data processing modules are mounted on a substrate or circuit board that is positioned near the front panel (or any panel that is accessible to the user), and the communication interfaces such as co-packaged optical modules support the one or more data processing modules. Each data processing module can be, e.g., a network switch, a central processor unit, a graphics processor unit, a tensor processing unit, a neural network processor, an artificial intelligence accelerator, a digital signal processor, a microcontroller, a storage device, or an application specific integrated circuit (ASIC). Each data processing module can include an electronic processor and/or a photonic processor. The data processing modules can be mounted on the substrate or circuit board using various types of contacts, such as ball grid arrays or sockets. The data processing modules can also be mounted on smaller substrates or circuit boards that are in turn mounted on larger substrates or circuit boards. The following describes an example in which the communication interface(s) support memory modules mounted in smaller circuit boards that are electrically coupled to a larger circuit board positioned near the front panel.

Figure 162:
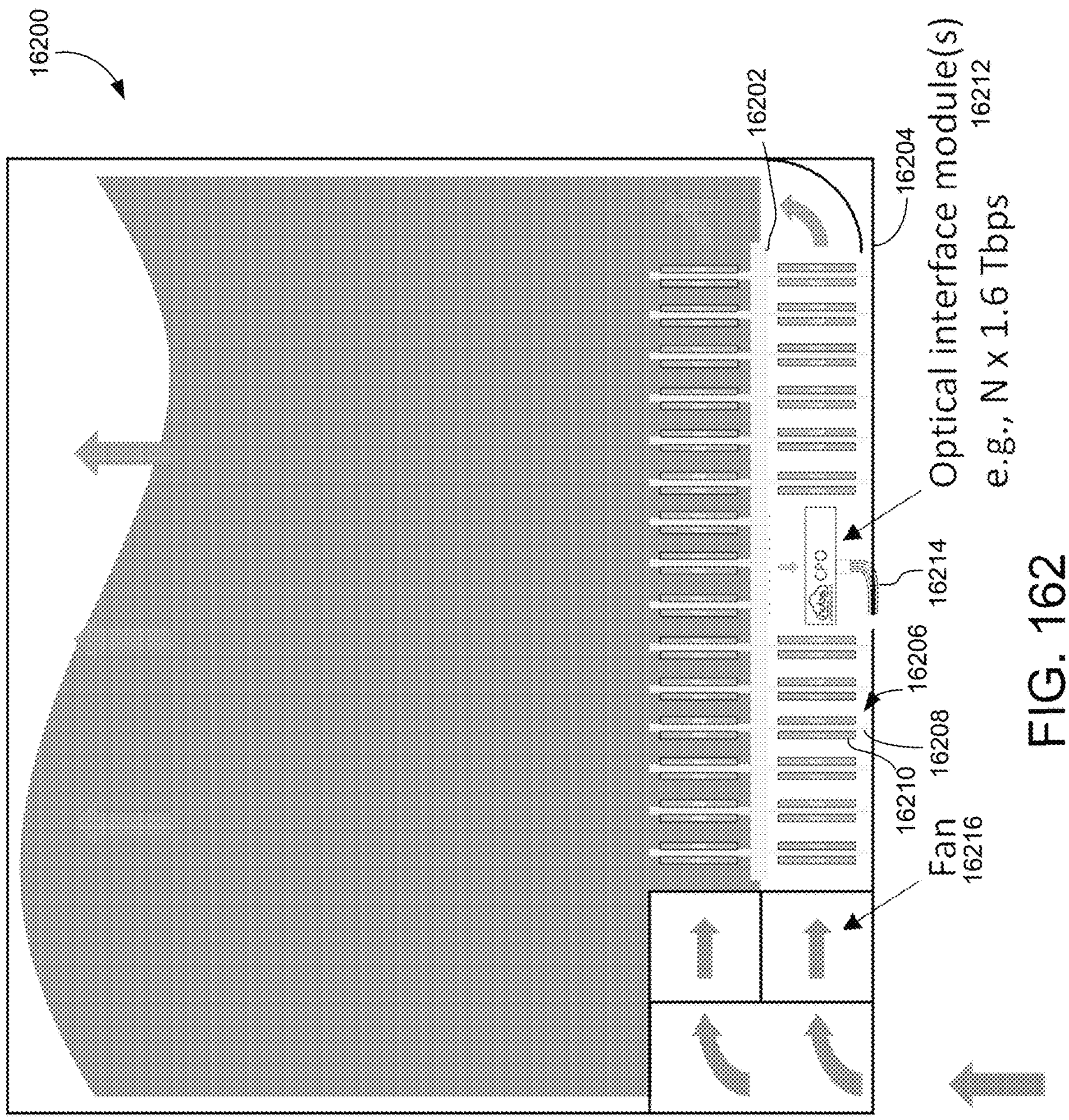

FIG. 162 shows a top view of an example of a system 16200 that includes a vertically oriented circuit board 16202 (also referred to as a carrier card) that is substantially parallel to the front panel 16204. Several memory modules 16206 are electrically coupled to the circuit board 16202, e.g., using sockets, such as DIMM (dual in line memory module) sockets. Each memory module 16206 includes a circuit board 16208 and one or more memory integrated circuits 16210, which can be mounted on one side or both sides of the circuit board 16208. One or more optical interface modules 16212 (e.g., co-packaged optical modules) are electrically coupled to the circuit board 16202 and function as the interface between the memory modules 16206 and one or more communication optical fiber cables 16214. For example, each optical interface module 16214 can support up to 1.6 Tbps bandwidth. When N optical interface modules 16214 are used (N being a positive integer), the total bandwidth can be up to N×1.6 Tbps. One or more fans 16216 can be mounted near the front panel 16204 to assist in removing heat generated by the various components (e.g., the optical interface modules 16212 and the memory modules 16206) coupled to the circuit board 16202. The technologies for implementing the optical interface modules 16212 and configuring the fans 16216 and airflows for optimizing heat removal have been described above and not repeated here.

Figure 163:
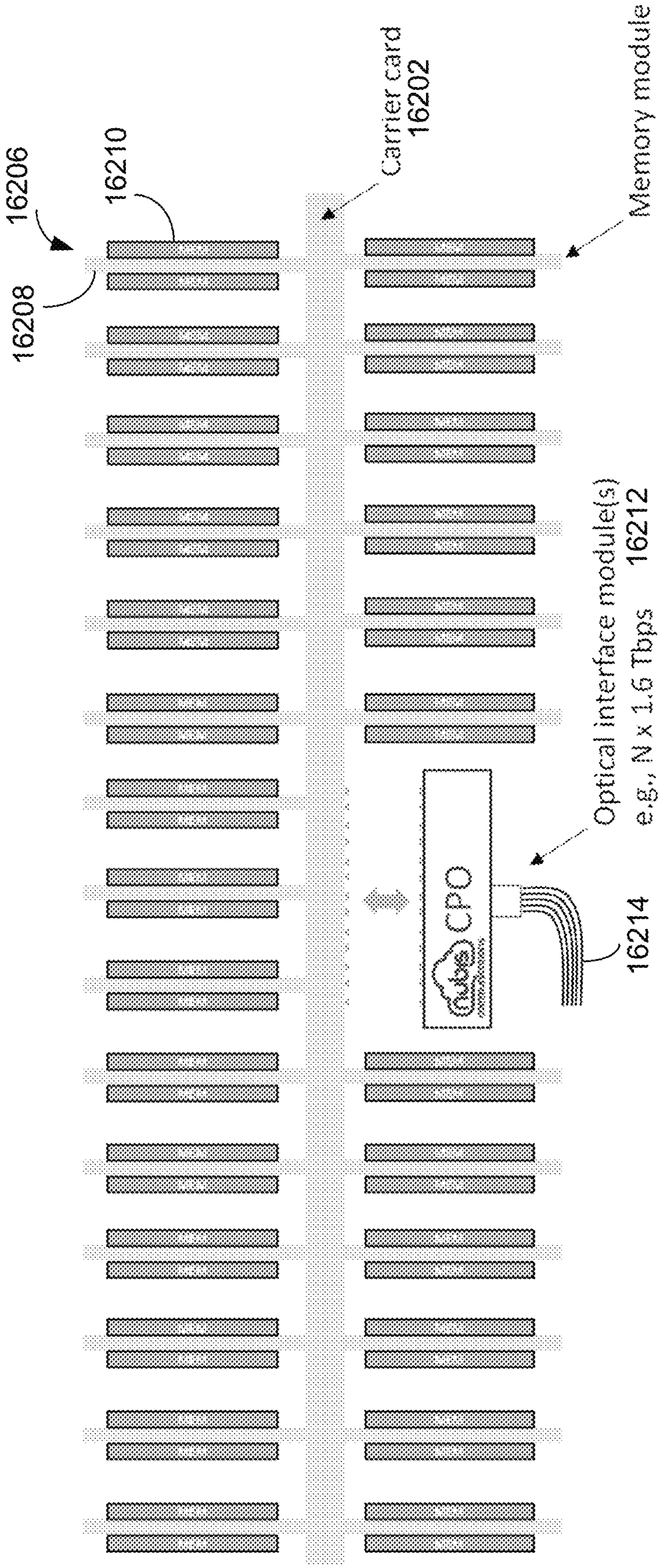

FIG. 163 is an enlarged diagram of the carrier card 16202, the optical interface module(s) 16212, and the memory modules 16206. In this example, the memory modules 16206 are mounted on both the front side and the rear side of the carrier card 16202. It is also possible mount the memory modules 16206 to just the front side, or just the rear side, of the carrier card 16202. In some examples, heat sinks are thermally attached to the memory chips 16210.

In some implementations, the memory modules 16206 on the carrier card 16202 can be used as, e.g., computer memory, disaggregated memory, or a memory pool. For example, the system 16200 can provide a large memory bank or memory pool that is accessible by more than one central processing unit. A data processing system can be implemented as a spatially co-located solution, e.g., 4 sets of the memory modules 16206 supporting 4 processors sitting in a common box or housing. A data processing system can also be implemented as a spatially separated solution, e.g., a rack full of processors, connected by optical fiber cables to another rack full of DIMMs (or other memory). In this example, the rack full of memory modules can includes multiple systems 16200. For example, the system 16200 is useful for implementing memory disaggregation to decouple physical memory allocated to virtual servers (e.g., virtual machines or containers or executors) at their initialization time from the runtime management of the memory. The decoupling allows a server under high memory usage to use the idle memory either from other servers hosted on the same physical node (node level memory disaggregation) or from remote nodes in the same cluster (cluster level memory disaggregation).

Figure 164:
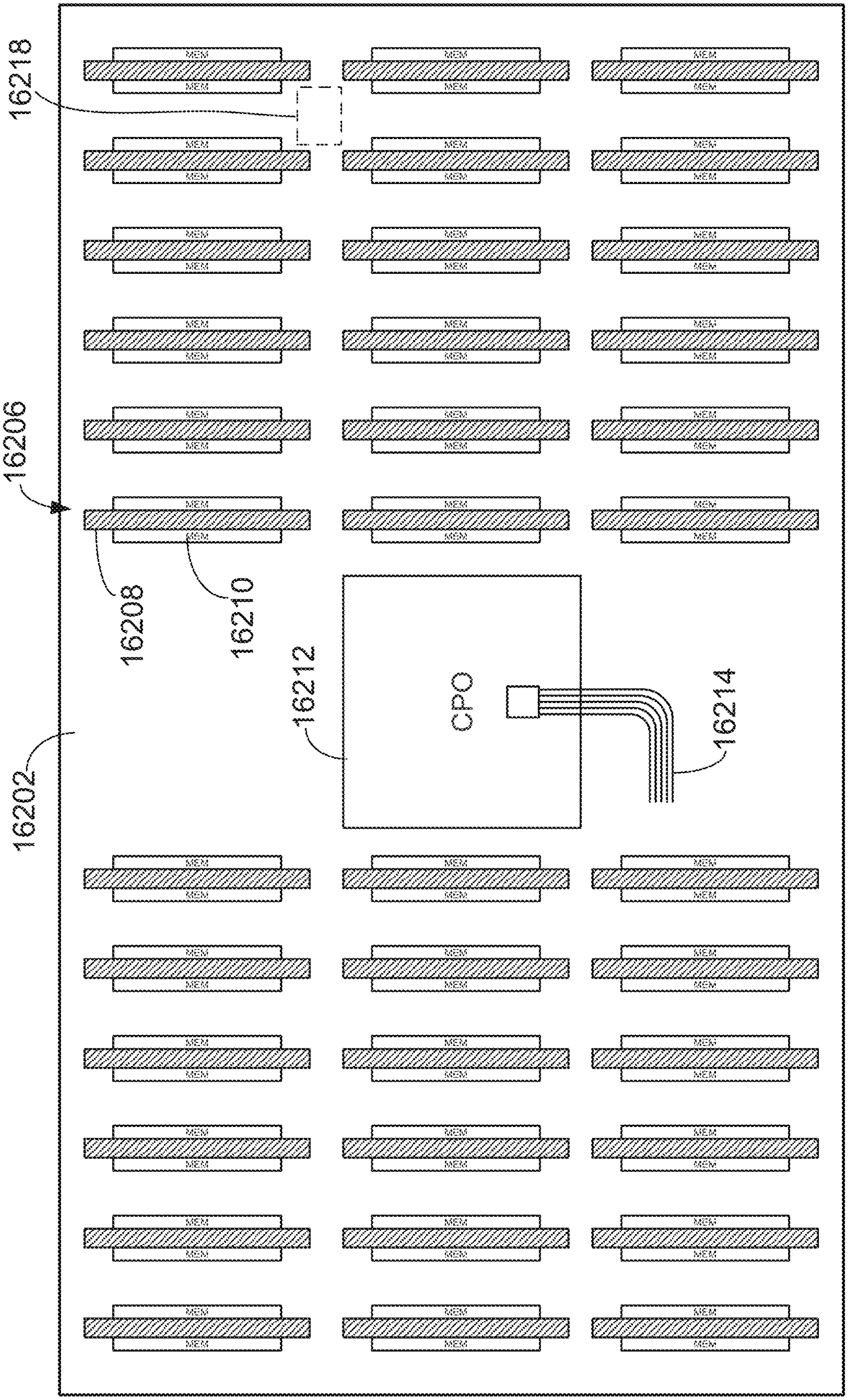

FIG. 164 is a front view of an example of the carrier card 16202, the optical interface module(s) 16212, and the memory modules 16206. In this example, three rows of memory modules 16206 are attached to the circuit board 16202. The number of memory modules 16206 can vary depending on application. The orientation of the memory modules 16206 can also be modified depending on how the system is configured. For example, instead of orienting the memory modules 16206 to extend in the vertical direction as shown in FIG. 164, the memory modules 16206 can also be oriented to extend in the horizontal direction, or at an angle between 0° to 90° relative to the horizontal direction, in order to optimize air flow and heat dissipation.

Figure 165:
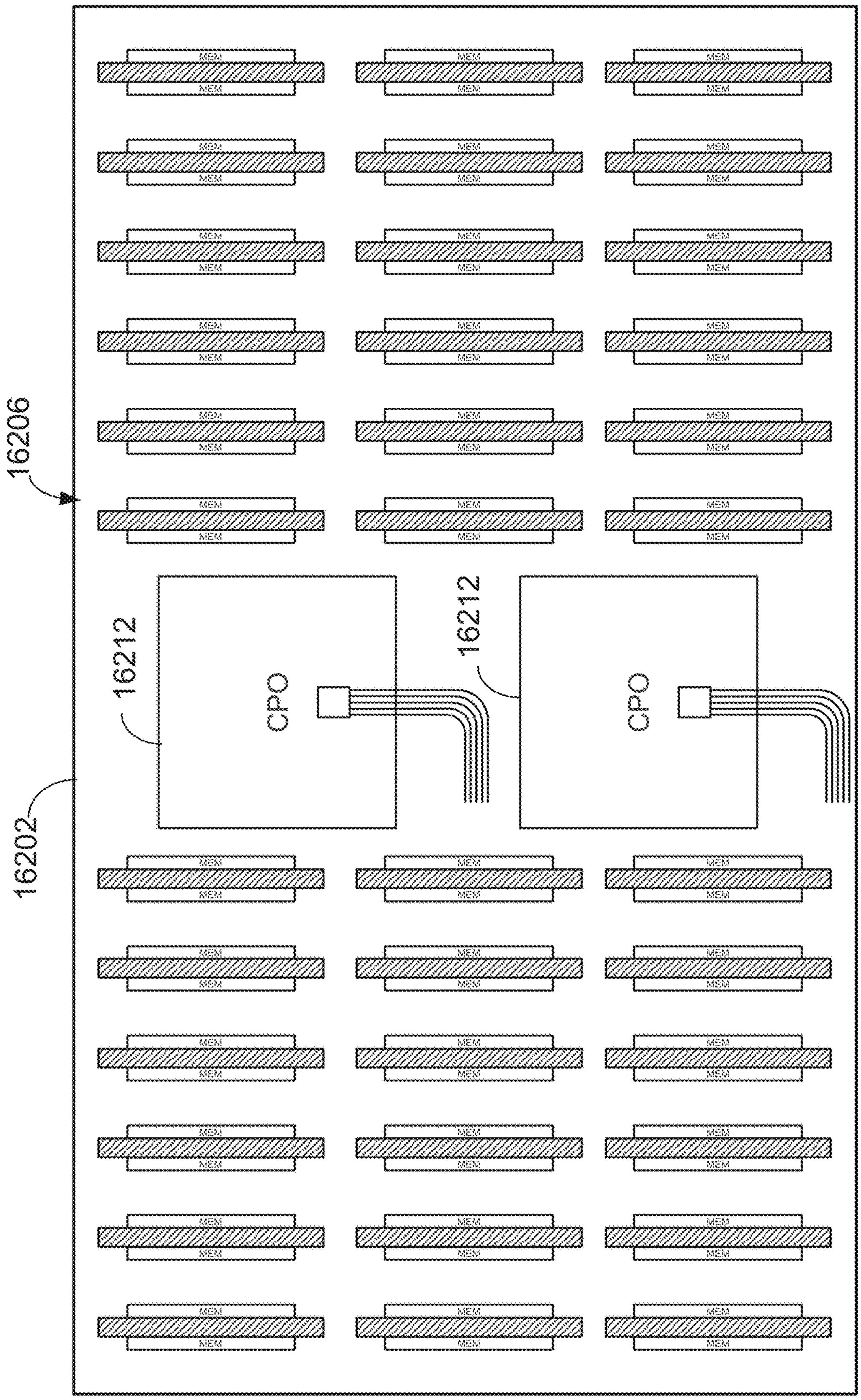

FIG. 165 is a front view of an example of the carrier card 16202 with two optical interface modules 16212, and memory modules 16206. FIGS. 164 and 165, as well as many other figures, are not drawn to scale. The optical interface modules 16212 can be much smaller than what is shown in the figure, and many more optical interface modules 16212 can be attached to the circuit board 16202. For example, the optical interface module 16212 can be positioned in the space 16218 (shown in dashed lines) between the four memory modules 16206. In some examples, the memory modules 16206 can interface directly with the optical interface module 16212.

Figure 166:
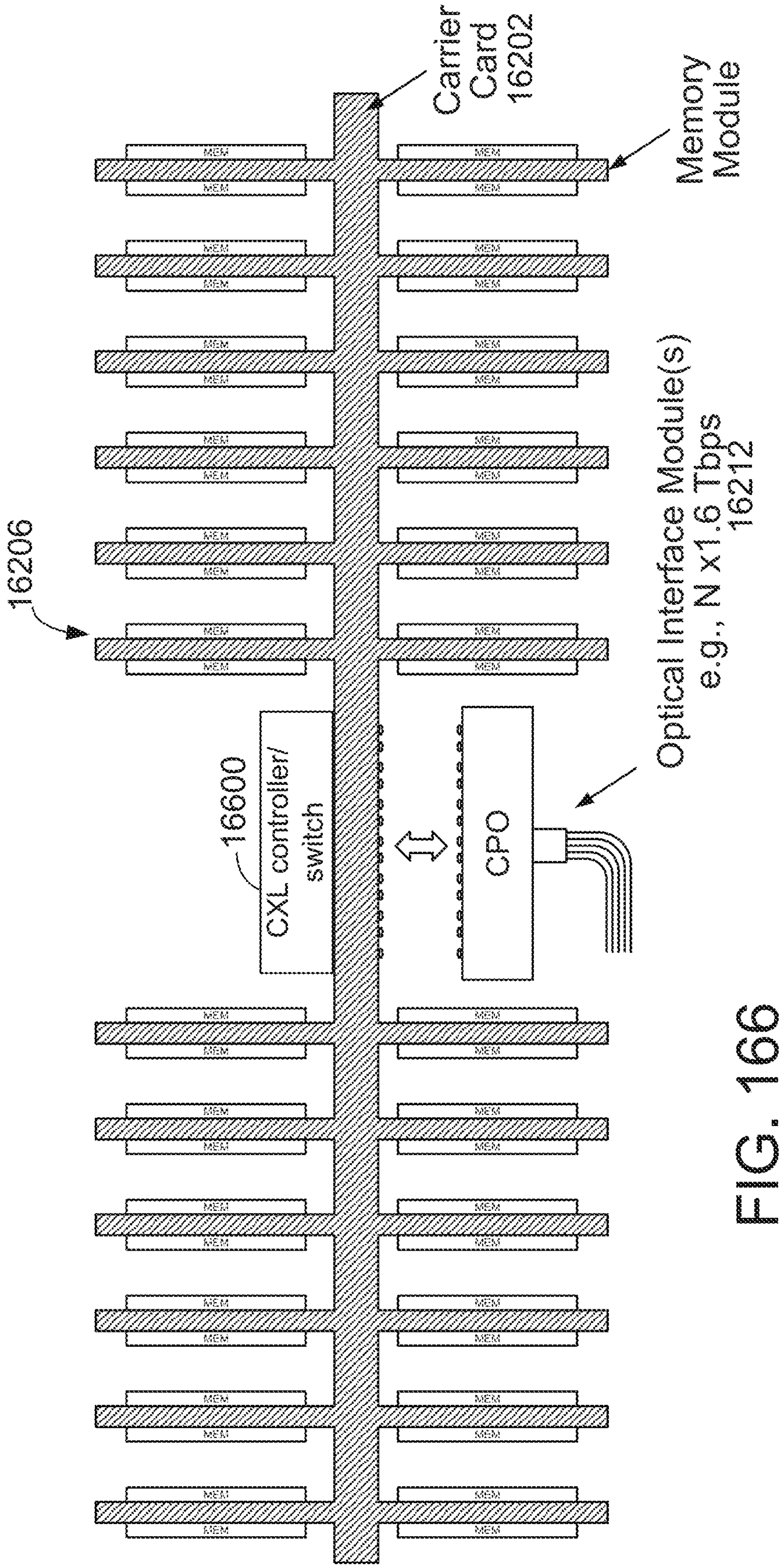

Referring to FIG. 166, in some implementations, one or more memory controllers or switches 16600 (e.g. Compute Express Link (CXL) controller(s)) is/are electrically coupled to the carrier card 16202 and configured to aggregate the traffic from the memory modules 16206. For example, the memory controller(s) or switch(es) 16600 can be implemented as an integrated circuit mounted on the rear side of the carrier card 16202, opposite to the optical interface module(s) 16212. Electrical traces are provided on or in the circuit board 16202 to connect the memory modules 16206 to the CXL controller/switch(es) 16600, and the CXL controller/switch(es) 16600 then aggregate the traffic from the memory modules 16206 and interface them to the CPO module 16212.

The carrier card 16202 and the memory modules 16206 can be any of a variety of sizes depending on the available space in the housing. The capacity of the memory modules 16206 can vary depending on application. As memory technology improves in the future, it is expected that the capacity of the memory modules 16206 will increase in the future. For example, the carrier card 16202 can have dimensions of 20 cm×20 cm, each memory module 16206 can have dimensions of 10 cm×2 cm, and each memory module can have a capacity of 64 GB. A spacing of 6 mm can be provided between memory modules 16206. The memory modules 16206 can occupy both sides of the carrier card 16202. In this example, the carrier card 16202 has a height of 20 cm and can support 2 rows of memory modules 16206, with each memory module 16206 extending 10 cm in the vertical direction. With a carrier card width of 20 cm and a 6 mm spacing between memory modules 16206, there can be about 32 memory modules per row, and about 64 memory modules per side of the carrier card 16202. When the memory modules are mounted on both sides of the carrier card 16202, there can be up to a total of about 128 memory modules 16206 per carrier card. With up to 64 GB capacity for each memory module 16206, the carrier card 16202 can support up to about 8 TB memory in a space approximately the size of 1,600 $cm^3$.

In some implementations, in the examples shown in FIGS. 136 to 149 and 151 to 153, the printed circuit board 13604 and the front grid structure 13606 and/or the rear grid structure 13608 can be modified to accommodate memory modules 16206 that are attached to the printed circuit board 13604. For example, a portion of the surface area of the printed circuit board 13604 can support the memory modules 16206, and another portion of the surface area of the printed circuit board 13604 can overlap the front/rear grid structure. In some examples, the front/rear grid structure has openings that allow the memory modules 16206 on the printed circuit board 13604 to protrude through the openings.

In the examples shown in FIGS. 6 and 23, an optical fiber cable is optically coupled to the top side of the photonic integrated circuit, and the bottom side of the photonic integrated circuit is mounted on a substrate. One or more electronic integrate circuits, such as a serializer/deserialize module, is/are mounted on or partially on the photonic integrated circuit adjacent to or near the optical fiber cable or the optical connector that connects to the optical fiber cable. In the examples shown in FIGS. 7 and 32, the photonic integrated circuit and the electronic integrated circuit(s) are mounted on opposite sides of the substrate, in which the electronic integrated circuit(s) is/are mounted adjacent to or near the optical fiber cable or the optical connector that connects to the optical fiber cable. In the examples shown in FIGS. 35A to 37, an optical fiber cable is optically coupled to the bottom side of the photonic integrated circuit, and the electronic integrated circuit is coupled to the top side of the photonic integrated circuit. These examples illustrate how one or more electronic integrated circuits can be vertically stacked on a photonic integrated circuit (either directly or indirectly through a substrate) in a way that accommodates the optical path from the optical fiber cable to the photonic integrated circuit. The following describes such packaging for the co-packaged optical module in which ASICs are placed adjacent to, near, or around the vertical fiber connector.

Figure 167:
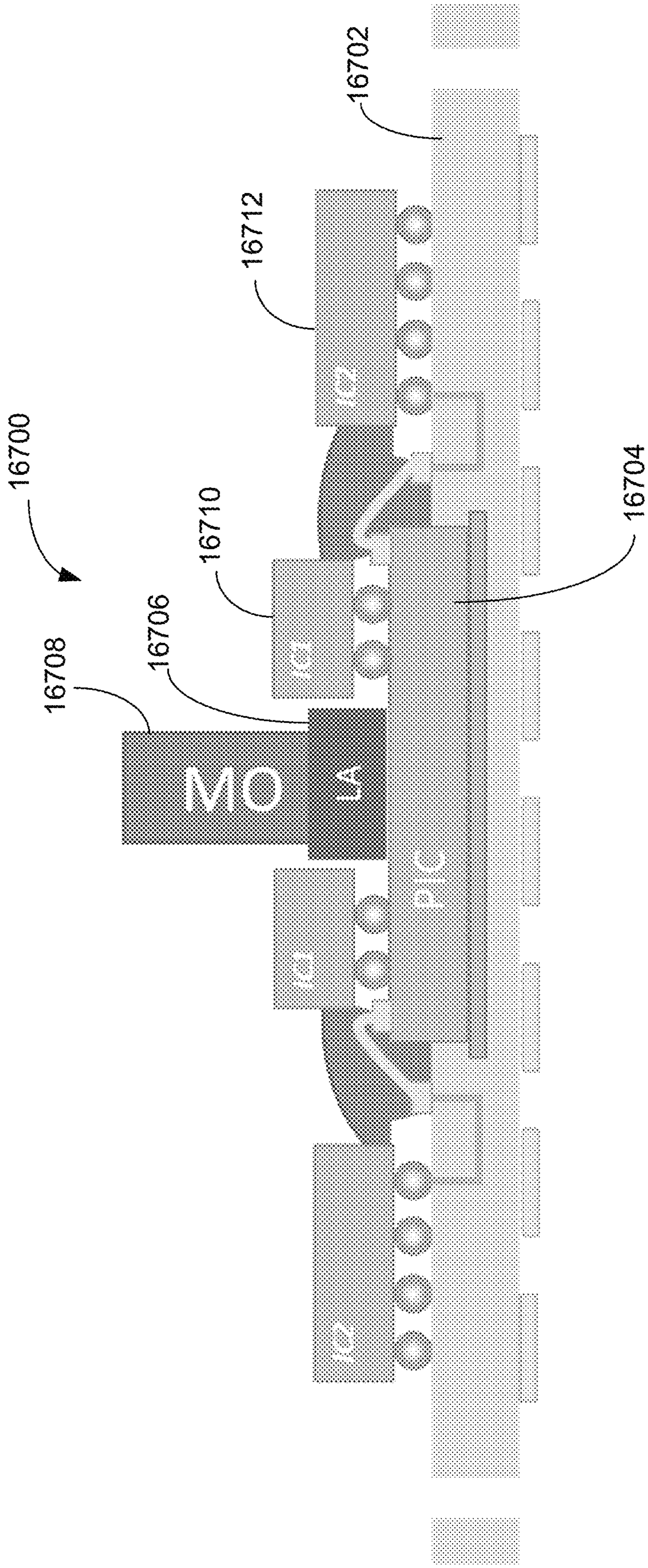

Referring to FIG. 167, a co-packaged optical module 16700 includes a substrate 16702 and a photonic integrated circuit 16704 mounted on the substrate 16702. A lens array 16706 and a micro optics connector 16708 optically couples the photonic integrated circuit 16704 to an optical fiber cable. The lens array 16706 and the micro optics connector 16708 will be referred to as the optical connector. A first set of one or more integrated circuits 16710 are mounted on the top side of the photonic integrated circuit 16704 using, e.g., copper pillars, or solder bumps. The first set of one or more integrated circuits 16710 is positioned adjacent to or near the optical connector. For example, two or more integrated circuits 16710 can be positioned on two or more sides of the optical connector, surrounding or partially surrounding the optical connector. A second set of integrated circuits 16712 is mounted on the substrate 16702 and electrically coupled to the photonic integrated circuit 16704.

For example, each integrated circuit 16710 (mounted on the photonic integrated circuit 16704) can include an electrical drive amplifier or a transimpedance amplifier. Each integrated circuits 16712 (mounted on the substrate) can include a SerDes or a DSP chip or a combination of SerDes/DSP chips.

Figure 168:
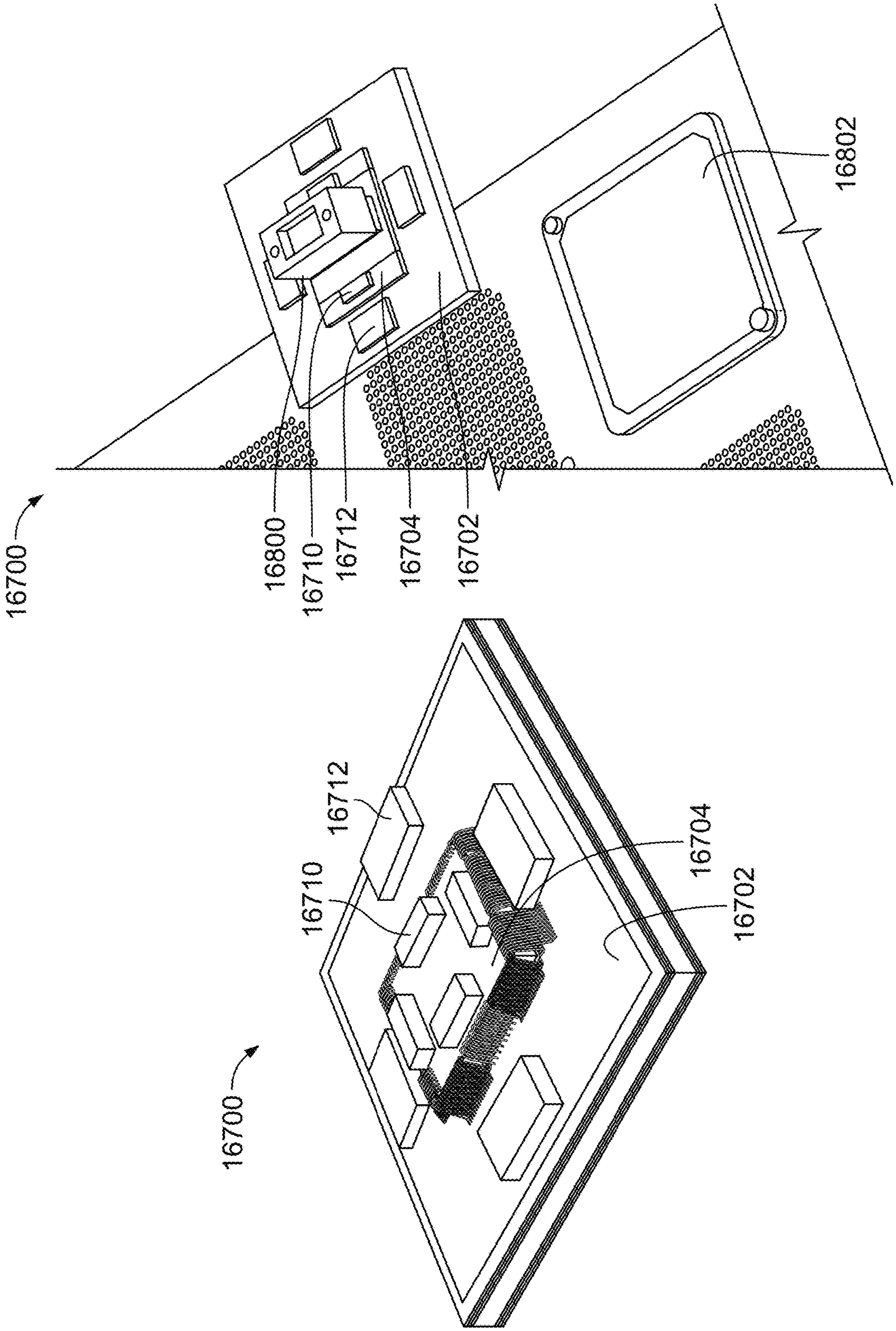

FIG. 168 shows perspective views of an example of the co-packaged optical module 16700. The diagram on the left of the figure shows the substrate 16702, the photonic integrated circuit 16704, the first set of electrical integrated circuits 16710 mounted on the photonic integrate circuit 16704, and a second set of electrical integrated circuits 16712 mounted on the substrate 16702. The diagram on the right of the figure shows the same components as those shown in the left diagram, with the addition of a smart connector 16800 that connects to an optical fiber cable, and a socket 16802 that electrically couples to the electrical contacts on the bottom side of the substrate 16702.

Figure 169A:
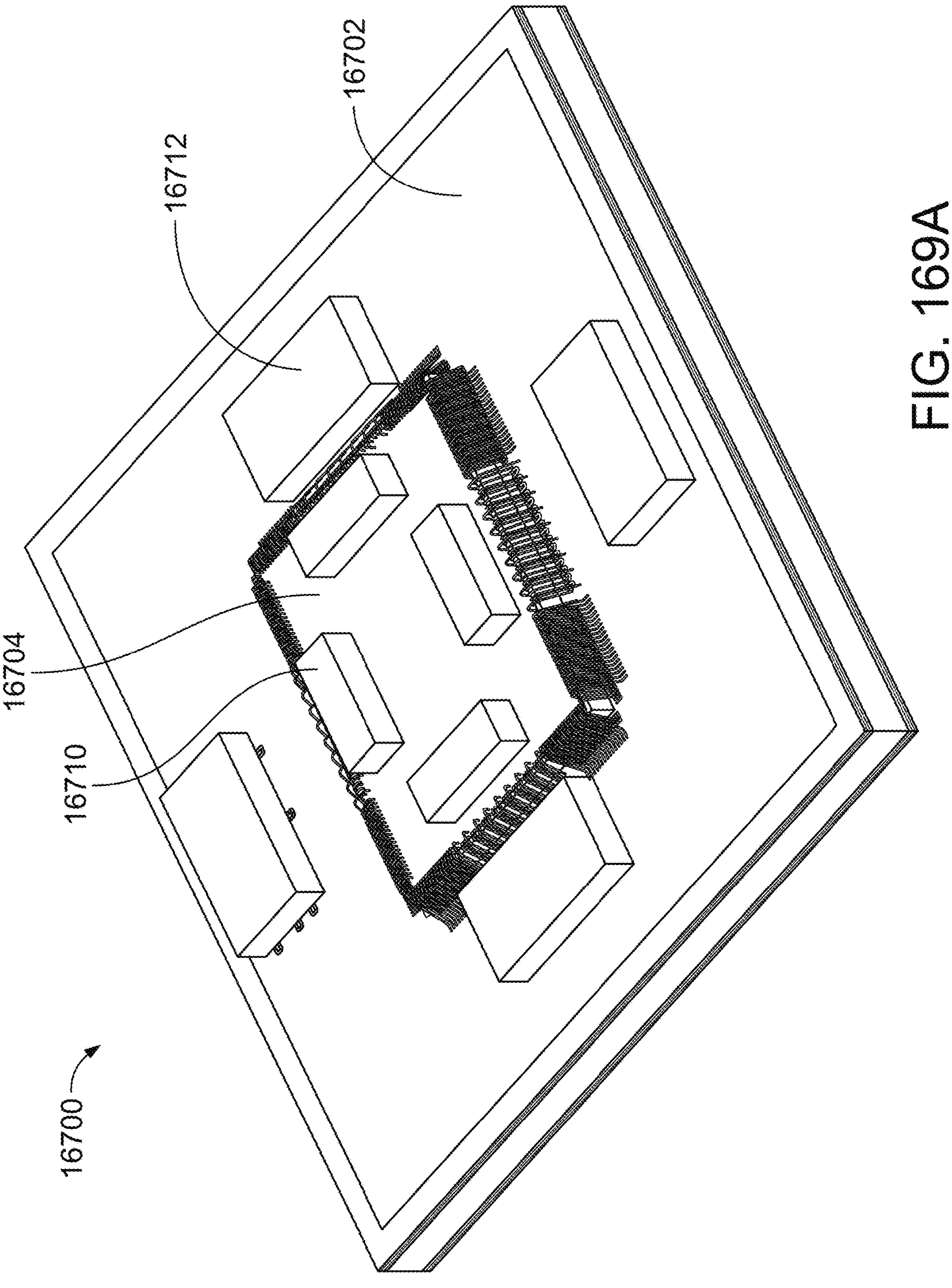
Figure 169B:
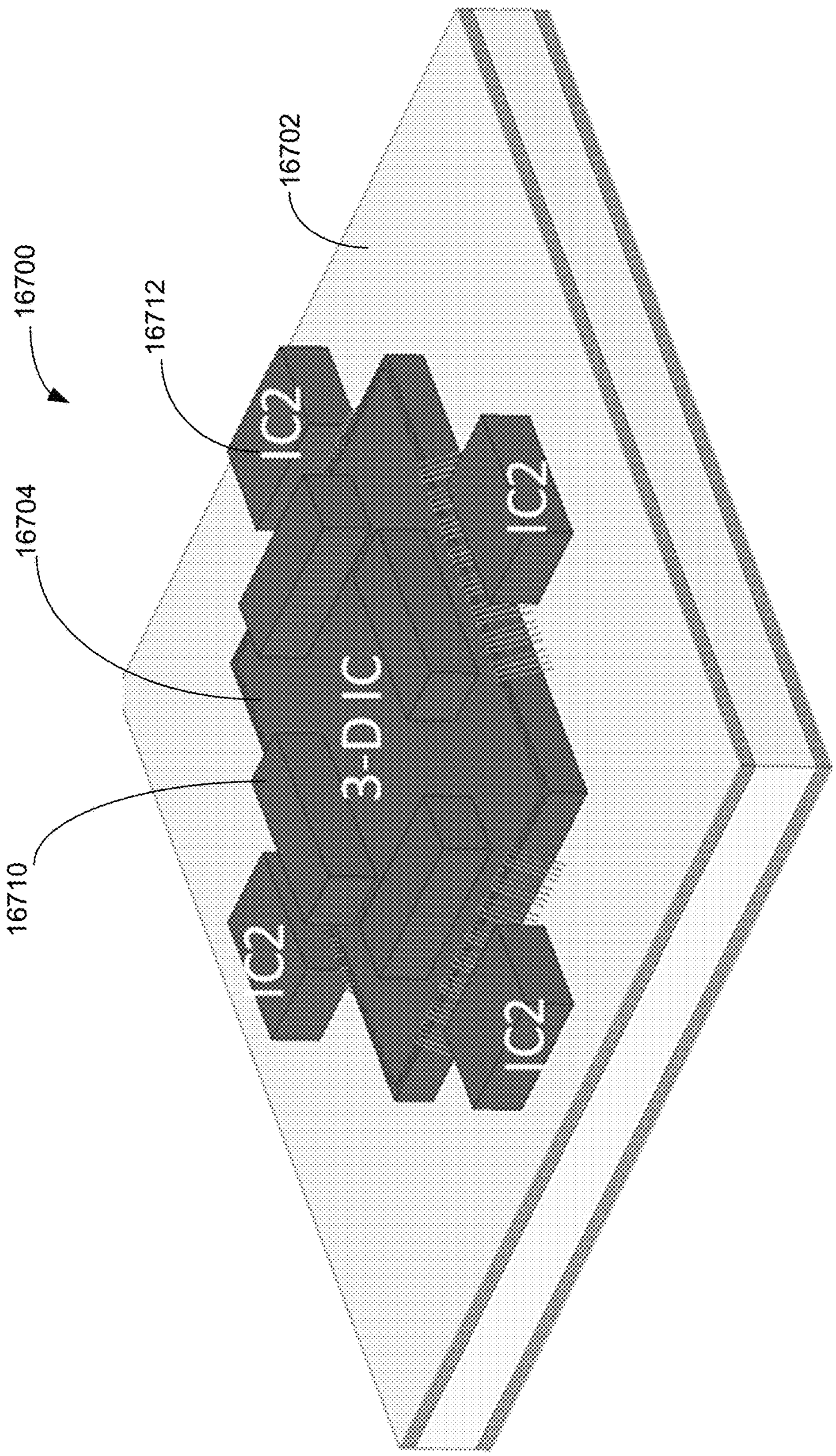
Figure 170:
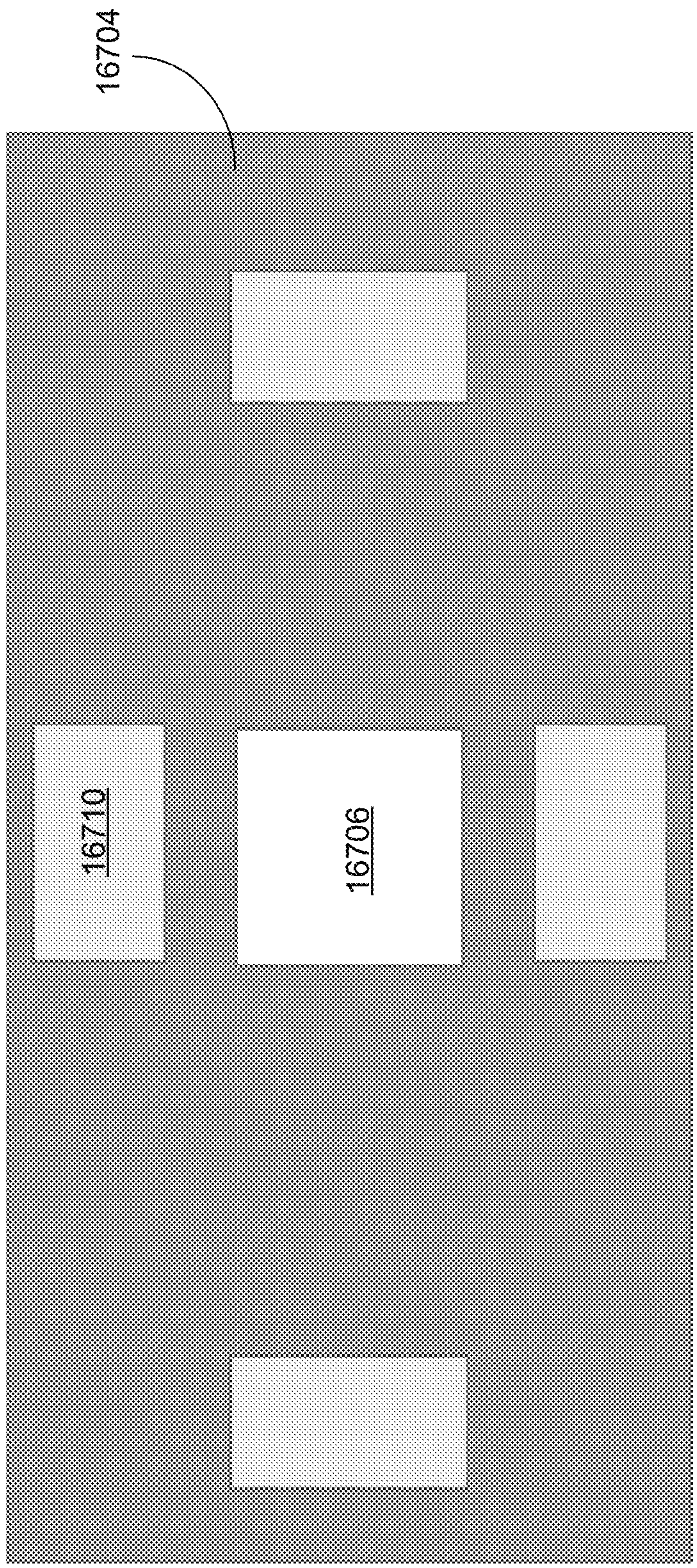

FIGS. 169A and 169B shows additional examples of perspective views of the co-packaged optical module 16700. FIG. 170 shows a top view of an example of the placement of the electrical integrated circuits 16710 on the photonic integrated circuit 16704. In this example, the lens array 16706 is positioned near the center of the photonic integrated circuit 16704, and the electrical integrated circuits 16710 are placed at the north, south, east, and west positions relative to the lens array 16706. By placing the electrical integrated circuits 16710 on top of the photonic integrated circuit 16704 and surrounding the lens array 16706 (or any other type of optical connector), the co-packaged optical module 16700 can be made more compact. Furthermore, the conductive traces between the electrical integrated circuits 16710 and active components in the photonic integrated circuit 16704 can be made shorter, resulting in better performance, e.g., higher data rate, higher signal-to-noise ratio, and lower power required to transmit the signals, as compared to a configuration in which the electrical signals have to travel longer distances.

Figures 171A, 171B, 171C, 171D:
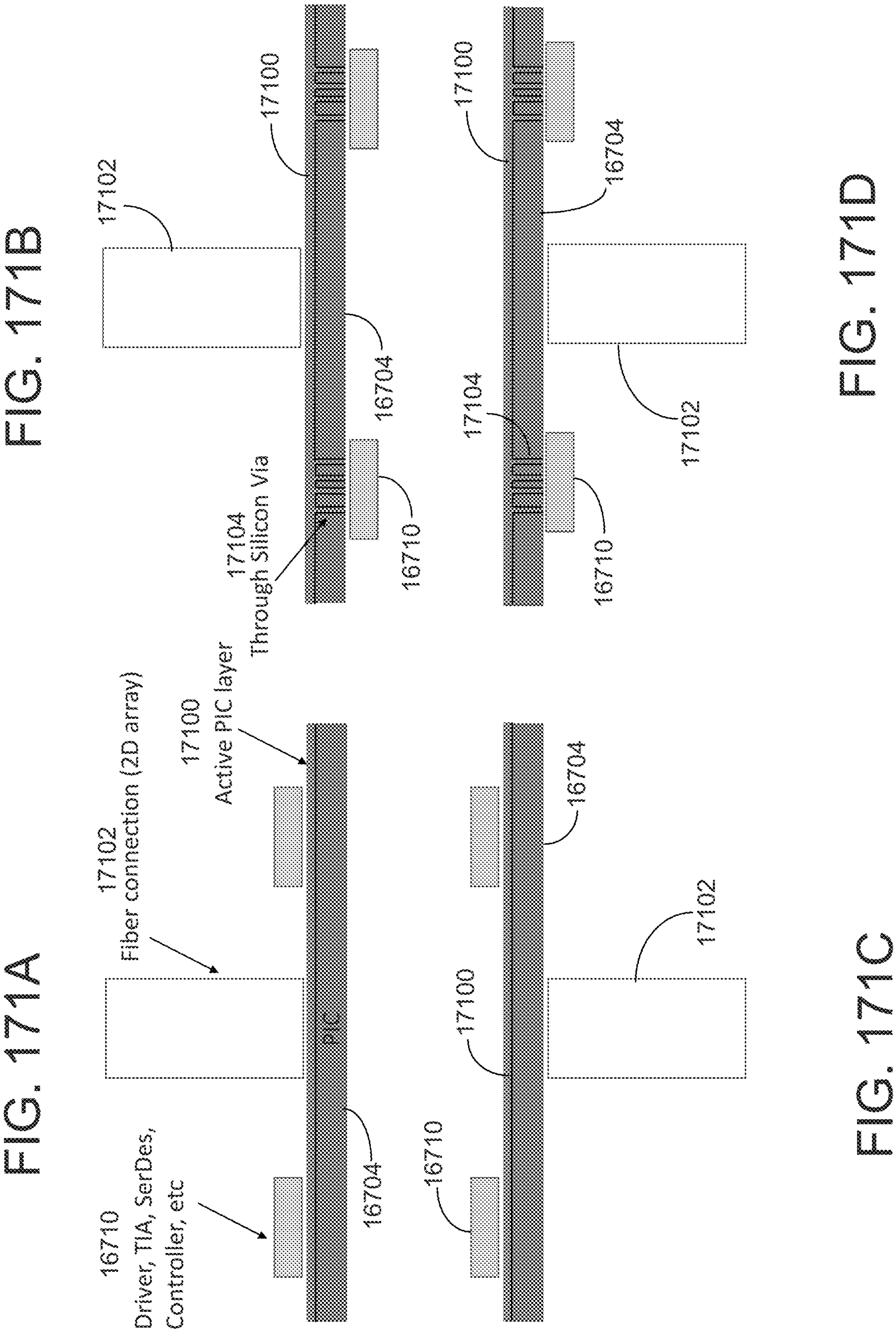

There are several ways to package the electrical integrated circuits and the photonic integrated circuit in order to achieve a compact, small-size, and energy efficient co-packaged optical module. FIG. 171A shows an example in which a photonic integrated circuit 16704 has an active layer 17100 that is positioned near the top surface of the photonic integrated circuit 16704. The fiber connection 17102 (which can include, e.g., a 2D array of focusing lenses) is coupled to the fiber connection 17102 from the top side. For example, grating couplers in the active PIC layer 17100 can be positioned under the fiber connection 17102 to couple the optical signals from the fiber connection 17102 into optical waveguides on the active PIC layer 17100, and from the optical waveguides out to the fiber connection 17102. The electrical integrated circuits 16710 are mounted on the top side of the photonic integrated circuit 16704 and are coupled to the active PIC layer 17100 through contact pads and optionally short conductive traces. For example, the active PIC layer 17100 can include photodetectors that convert the optical signals received from the fiber connection 17102 to electrical current signals that are transmitted to the drivers and transimpedance amplifiers in the electrical integrated circuits 16710. Similarly, the electrical integrated circuits 16710 can send electrical signals to the electro-optic modulators in the active PIC layer 17100 that convert the electrical signals to optical signals that are output through the fiber connection 17102.

FIG. 171B shows an example in which the electrical integrated circuits 16710 are coupled to the bottom surface of the photonic integrated circuit 16704 and electrically coupled to the active PIC layer 17100 using through silicon vias 17104. The through silicon vias 17104 provide signal conduction paths in the thickness direction through the silicon die or substrate of the photonic integrated circuit 16704. The drivers and transimpedance amplifiers in the electrical integrated circuits 16710 can be positioned directly under the photonic integrated circuit active components, such as the photodiodes and the electro-optic modulators, so that the shortest electrical signal paths can be used between the photonic integrated circuit 16704 and the electrical integrated circuits 16710.

FIG. 171C shows an example in which the fiber connection 17102 is coupled to the photonic integrated circuit 16704 through the bottom side (in a configuration referred to as "backside illumination"), such that the optical signals from the fiber connection 17102 pass through the silicon die or substrate before being received by the photodetectors in the active PIC layer 17100. Likewise, the modulators in the active PIC layer 17100 transmit modulated optical signals through the silicon die or substrate to the fiber connection 17102. The portion of the active PIC layer 17100 directly above the fiber connection 17102 can include grating couplers. The photodetectors and modulators are positioned at a distance from the grating couplers. The electrical integrated circuits 16710 are positioned directly above or near the photodetectors and the modulators, so the locations of the electrical integrated circuits 16710 relative to the active PIC layer 17100 in the example of FIG. 171C will be similar to those in the example of FIG. 171A.

FIG. 171D shows an example in which backside illumination is used, and the electrical integrated circuits 16710 are coupled to the bottom side of the photonic integrated circuit 16704. The electrical integrated circuits 16710 are electrically coupled to the active components (e.g., photodetectors and electro-optic modulators) in the active PIC layer 17100 using through silicon vias 17104, similar to the example in FIG. 171B.

In some implementations, an integrated circuit is configured to surround or partially surround the vertical fiber connector. For example, the integrated circuit can have an L-shape that surrounds two sides of the vertical fiber connector (e.g., two of north, east, south, and west sides). For example, the integrated circuit can have a U-shape that surrounds three sides of the vertical fiber connector (e.g., three of north, east, south, and west sides). For example, the integrated circuit can have an opening in the center region to allow the vertical fiber connector to pass through, in which the integrated circuit completely surrounds the vertical fiber connector. The dimensions of the opening in the integrated circuit are selected to allow the optical fiber connector to pass through to enable an optical fiber to be optically coupled to the photonic integrated circuit. For example, the integrated circuit with an opening in the center region can have a circular or polygonal shape at the outer perimeter. A feature of the integrated circuit mounted on the same surface as the vertical fiber connector is that it takes advantage of the space available on the surface of the photonic integrated circuit that is not occupied by the vertical fiber connector so that the electrical integrated circuit can be placed near or adjacent to the active components (e.g., photodetectors and/or modulators) of the photonic integrated circuit.

In some implementations, an integrated circuit defining an opening can be manufactured by the following process:

Step 1: Use semiconductor lithography to form an integrated circuit on a semiconductor die (or wafer or substrate), in which a first interior region of the semiconductor die does not have integrated circuit component intended to be used for the final integrated circuit (but can have components intended to be used for other products).

Step 2: Use a laser (or any other suitable cutting tool) to cut an opening in the first interior region of the semiconductor die.

Step 3: Place the semiconductor die on a lower mold resin that defines an opening in an interior region. A lead frame or electrical connectors are attached to the lower mold resin.

Step 4: Wire bond electrical contacts on the semiconductor die to the lead frame or electrical connectors attached to the lower mold resin.

Step 5: Attach an upper mold resin to the lower mold resin, and enclose the semiconductor die between the lower and upper mold resins. The upper mold resin defines an opening in an interior region that corresponds to the opening in the lower mold resin. In some examples, the footprint of the semiconductor die is within the footprint of the lower/upper mold resins so that the semiconductor die is completely enclosed inside the lower and upper mold resins. In some examples, the lower and/or upper mold resin can have additional openings, and the opening(s) in the lower and/or upper mold resins can be configured to expose one or more portions of the semiconductor die.

An integrated circuit having an L-shape or a U-shape can be manufactured using a similar process. For example, in step 1, circuitry is formed in an L-shaped or U-shaped footprint. In step 2, the laser or cutting tool cuts the die according to the L-shape or U-shape footprint. In steps 3 and 5, a lower mold resin and an upper mold resin having the desired L-shape or U-shape are used.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

For example, the techniques described above for improving the operations of systems that include rackmount servers (see FIGS. 76, 85 to 87B) can also be applied to systems that include blade servers.

Some embodiments can be implemented as circuit-based processes, including possible implementation on a single integrated circuit.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure can be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term compatible means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled or referred to as "processors" and/or "controllers," can be provided through the use of dedicated hardware as well as hardware capable of executing software in association with appropriate software. When provided by a processor, the functions can be provided by a single dedicated processor, by a single shared processor, or by a plurality of individual processors, some of which can be shared. Moreover, explicit use of the term "processor" or "controller" should not be construed to refer exclusively to hardware capable of executing software, and can implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, can also be included. Similarly, any switches shown in the figures are conceptual only. Their function can be carried out through the operation of program logic, through dedicated logic, through the interaction of program control and dedicated logic, or even manually, the particular technique being selectable by the implementer as more specifically understood from the context.

As used in this application, the term "circuitry" can refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software does not need to be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure.

Although the present invention is defined in the attached claims, it should be understood that the present invention can also be defined in accordance with the following sets of embodiments:

First set of embodiments:

Embodiment 1: An apparatus comprising:

an optical interconnect module comprising:

- an optical input port configured to receive a plurality of channels of first optical signals;
- a photonic integrated circuit configured to generate a plurality of first serial electrical signals based on the received optical signals, in which each first serial electrical signal is generated based on one of the channels of first optical signals;
- a first serializers/deserializers module comprising multiple serializer units and deserializer units, in which the first serializers/deserializers module is configured to generate a plurality of sets of first parallel electrical signals based on the plurality of first serial electrical signals, and condition the electrical signals, in which each set of first parallel electrical signals is generated based on a corresponding first serial electrical signal; and a second serializers/deserializers module comprising multiple serializer units and deserializer units, in which the second serializers/deserializers module is configured to generate a plurality of second serial electrical signals based on the plurality of sets of first parallel electrical signals, in which each second serial electrical signal is generated based on a corresponding set of first parallel electrical signals.

Embodiment 2: The apparatus of embodiment 1, comprising:

- a third serializers/deserializers module comprising multiple serializer units and deserializer units, in which the third serializers/deserializers module is configured to generate a plurality of sets of second parallel electrical signals based on the plurality of second serial electrical signals, in which each set of second parallel electrical signals is generated based on a corresponding second serial electrical signal; and
- at least one of a network switch, a central processor unit, a graphics processor unit, a tensor processing unit, a neural network processor, an artificial intelligence accelerator, a digital signal processor, a microcontroller, or an application specific integrated circuit (ASIC) that is configured to process the plurality of sets of second parallel electrical signals.

Embodiment 3: The apparatus of embodiment 1 in which the first serializers/deserializers module is configured to perform signal conditioning on the electrical signals, the signal conditioning comprising at least one of (i) clock and data recovery, or (ii) signal equalization.

Embodiment 4: The apparatus of embodiment 1 in which the photonic integrated circuit comprises at least one of waveguides, photodetectors, vertical grating couplers, or fiber edge couplers.

Embodiment 5: The apparatus of embodiment 1 in which each of the first serializers/deserializers module and the second serializers/deserializers module comprises at least one of (i) a multiplexer, (ii) a demultiplexer, (iii) a serial data port, (iv) a parallel data bus, (v) an equalizer, (vi) a clock recovery unit, or (vii) a data recovery unit.

Embodiment 6: The apparatus of embodiment 1, comprising a bus processing module configured to process signals transmitted between the first serializers/deserializers module and the second serializers/deserializers module, in which the bus processing module performs at least one of switching of data, re-shuffling data, or coding of data.

Embodiment 7: The apparatus of embodiment 6, in which the first serializers/deserializers module comprises a first serializer/deserializer unit and a second serializer/deserializer unit that are configured to serially interface with N electrical signals at a first serial interface;

- the second serializers/deserializers module comprises a third serializer/deserializer unit that is configured to serially interface with M electrical signals at a second serial interface, M and N are positive integers, and N is different from M; and
- the bus processing module is configured to route signals among the first, second, and third serializer/deserializer units to enable the N serial electrical signals at the first serial interface to be mapped to the M serial electrical signals at the second serial interface.

Embodiment 8: The apparatus of embodiment 7 in which the first serializer/deserializer unit and the second serializer/deserializer unit are configured to serially interface with N lanes of P Gbps electrical signals, and

- the third serializer/deserializer unit is configured to serially interface with N/Q lanes of P*Q Gbps electrical signals, and P and Q are positive numbers.

Embodiment 9: The apparatus of embodiment 6, in which the first serializers/deserializers module comprises a first serializer/deserializer unit and a second serializer/deserializer unit that are configured to serially interface with N lanes of $T \times N/(N-k)$ Gbps electrical signals at a first serial interface, N and k are positive integers, and T is a real value;

- the second serializers/deserializers module comprises a third serializer/deserializer unit that is configured to serially interface with N lanes of T Gbps electrical signals at a second serial interface; and
- the bus processing module is configured to route signals among the first, second, and third serializer/deserializer units to enable N-k out of the N lanes serially interfacing the first and second serializer/deserializer units to be mapped to the N lanes of T Gbps electrical signals at the second serial interface.

Embodiment 10: The apparatus of embodiment 6, in which the first serializers/deserializers module comprises a first serializer/deserializer unit and a second serializer/deserializer unit that are configured to serially interface with N lanes of T×N/(N−k) Gbps electrical signals at a first serial interface, N and k are positive integers, and T is a real value;

the second serializers/deserializers module comprises a third serializer/deserializer unit that is configured to serially interface with N/M lanes of M×TGbps electrical signals at a second serial interface, M is different from N; and the bus processing module is configured to route signals among the first, second, and third serializer/deserializer units to enable N-k out of the N lanes serially interfacing the first and second serializer/deserializer units to be mapped to the N/M lanes of M×T Gbps electrical signals at the second serial interface.

Embodiment 11: The apparatus of embodiment 1 in which the photonic integrated circuit configured to generate N serial electrical signals, and the second serializers/deserializers module is configured to generate M serial electrical signals based on the plurality of sets of first parallel electrical signals, M and N are positive integers, and M is different from N.

Embodiment 12: The apparatus of embodiment 11 in which the photonic integrated circuit is configured to generate N lanes of P Gbps serial electrical signals, the second serializers/deserializers module is configured to generate N/Q lanes of P*Q Gbps serial electrical signals, and P and Q are positive numbers.

Embodiment 13: The apparatus of embodiment 1 in which the first serial electrical signals are modulated according to a first modulation format, and the second serial electrical signals are modulated according to a second modulation format that is different from the first modulation format.

Embodiment 14: The apparatus of embodiment 1, further comprising an optical output port;

the second serializers/deserializers module is configured to receive a plurality of third serial electrical signals, and generate a plurality of sets of third parallel electrical signals based on the plurality of third serial electrical signals, in which each set of third parallel electrical signals is generated based on a corresponding third serial electrical signal;

the first serializers/deserializers module is configured to generate a plurality of fourth serial electrical signals based on the plurality of sets of third parallel signals, in which each fourth serial electrical signal is generated based on a corresponding set of fourth parallel electrical signals;

the photonic integrated circuit is configured to generate a plurality of channels of second optical signals based on the plurality of fourth serial electrical signals; and the optical output port is configured to output the plurality of channels of second optical signals.

Embodiment 15: The apparatus of embodiment 14, comprising:

at least one of a network switch, a central processor unit, a graphics processor unit, a tensor processing unit, a neural network processor, an artificial intelligence accelerator, a digital signal processor, a microcontroller, or an application specific integrated circuit (ASIC) that is configured to generate a plurality of sets of fourth parallel electrical signals; and a third serializers/deserializers module comprising multiple serializer units and deserializer units, in which the third serializers/deserializers module is configured to generate the third serial electrical signals based on the sets of fourth parallel electrical signals.

Embodiment 16: The apparatus of embodiment 15 in which the third serializers/deserializers module is configured to generate M serial electrical signals based on the sets of fourth parallel electrical signals, the first serializers/deserializers module is configured to generate N serial electrical signals based on the sets of third parallel signals, M and N are positive integers, and N is different from M.

Embodiment 17: The apparatus of embodiment 16 in which the third serializers/deserializers module is configured to generate N/Q lanes of P*Q Gbps serial electrical signals, the first serializers/deserializers module is configured to generate N lanes of P Gbps serial electrical signals, and P and Q are positive numbers.

Embodiment 18: The apparatus of embodiment 14 in which the third serial electrical signals are modulated according to a first modulation format, and the fourth serial electrical signals are modulated according to a second modulation format that is different from the first modulation format.

Embodiment 19: The apparatus of embodiment 14 in which the second serializers/deserializers module is configured to perform signal conditioning on the electrical signals, the signal conditioning comprising at least one of (i) clock and data recovery, or (ii) signal equalization.

Embodiment 20: The apparatus of embodiment 14 in which the photonic integrated circuit comprises at least one of waveguides, vertical grating couplers, fiber edge couplers, modulators, optical power splitters, or optical polarization splitters.

Embodiment 21: The apparatus of embodiment 14 in which the first serializers/deserializers module comprises an interpolator or an electrical phase adjustment element that aligns serial electrical output signals with respective optical pulse trains that power respective optical modulators for modulating output optical signals based on the serial electric output signals.

Embodiment 22: The apparatus of embodiment 14, comprising a bus processing module configured to process signals transmitted between the first serializers/deserializers module and the second serializers/deserializers module, in which the bus processing module performs at least one of switching of data, re-shuffling data, or coding of data.

Embodiment 23: The apparatus of embodiment 1 in which the optical interconnect module comprises a first circuit board or a first substrate, wherein the photonic integrated circuit, the first serializers/deserializers module, and the second serializers/deserializers module are mounted on the first circuit board or the first substrate.

Embodiment 24: The apparatus of embodiment 23 in which the optical interconnect module comprises first electrical terminals arranged on the first circuit board or the first substrate, and the first electrical terminals are configured to mate with second electrical terminals arranged on a second circuit board or a second substrate.

Embodiment 25: The apparatus of embodiment 24 in which the first electrical terminals are removably coupled to the second electrical terminals of the second circuit board or the second substrate.

Embodiment 26: The apparatus of embodiment 25 in which at least one of the first electrical terminals or the second electrical terminals comprise at least one of spring loaded connectors, compression interposers, or land-grid arrays.

Embodiment 27: The apparatus of embodiment 24 in which the first electrical terminals are arranged on a second side of the first circuit board or the first substrate, the photonic integrated circuit is also mounted on the second side of the first circuit board or the first substrate, and at least a portion of the photonic integrated circuit is positioned between the first circuit board (or the first substrate) and the second circuit board (or the second substrate) when the first electrical terminals of the first circuit board mate (or the first substrate) with the second electrical terminals of the second circuit board (or the second substrate).

Embodiment 28: The apparatus of embodiment 24 in which the second serializers/deserializers module is electrically coupled to the first circuit board or the first substrate through third electrical terminals that have a first minimum spacing between the terminals, the first electrical terminals arranged on the first circuit board or the first substrate have a second minimum spacing between terminals, and the second minimum spacing is larger than the first minimum spacing.

Embodiment 29: The apparatus of embodiment 28 in which the second minimum spacing is at least twice the first minimum spacing.

Embodiment 30: The apparatus of embodiment 28 in which the first minimum spacing is less than or equal to 200 μm.

Embodiment 31: The apparatus of embodiment 28 in which the first minimum spacing is less than or equal to 100 μm.

Embodiment 32: The apparatus of embodiment 28 in which the first minimum spacing is less than or equal to 50 μm.

Embodiment 33: The apparatus of embodiment 1 in which the optical input port comprises a first optical connector configured to mate with a second optical connector coupled to an optical fiber cable that provides a plurality of optical paths.

Embodiment 34: The apparatus of embodiment 33 in which each optical path is provided by a core of an optical fiber in the optical fiber cable.

Embodiment 35: The apparatus of embodiment 33 in which the first optical connector is configured to couple optical signals propagating along at least two optical paths to the photonic integrated circuit.

Embodiment 36: The apparatus of embodiment 35 in which the photonic integrated circuit is configured to process the at least two channels of optical signals and generate at least two first serial electrical signals.

Embodiment 37: The apparatus of embodiment 36 in which the first serializers/deserializers module is configured to convert the at least two first serial electrical signals into at least two sets of parallel electrical signals, and each set of parallel electrical signals comprises at least two parallel electrical signals.

Embodiment 38: The apparatus of embodiment 37 in which each set of parallel electrical signals comprises at least four parallel electrical signals.

Embodiment 39: The apparatus of embodiment 38 in which each set of parallel electrical signals comprises at least eight parallel electrical signals.

Embodiment 40: The apparatus of embodiment 33 in which the first optical connector is configured to couple optical signals propagating along at least four optical paths to the photonic integrated circuit.

Embodiment 41: The apparatus of embodiment 33 in which the first optical connector is configured to couple optical signals propagating along at least eight optical paths to the photonic integrated circuit.

Embodiment 42: The apparatus of embodiment 33 in which the optical fiber cable comprises at least 10 cores of optical fibers, and the first optical connector is configured to couple at least 10 channels of optical signals to the photonic integrated circuit.

Embodiment 43: The apparatus of embodiment 42 in which the photonic integrated circuit is configured to process the at least 10 channels of optical signals and generate at least 10 first serial electrical signals.

Embodiment 44: The apparatus of embodiment 43 in which the first serializers/deserializers module is configured to convert the at least 10 first serial electrical signals into at least 10 sets of parallel electrical signals, and each set of parallel electrical signals comprises at least two parallel electrical signals.

Embodiment 45: The apparatus of embodiment 44 in which each set of parallel electrical signals comprises at least four parallel electrical signals.

Embodiment 46: The apparatus of embodiment 45 in which each set of parallel electrical signals comprises at least eight parallel electrical signals.

Embodiment 47: The apparatus of embodiment 46 in which each set of parallel electrical signals comprises at least 32 parallel electrical signals.

Embodiment 48: The apparatus of embodiment 47 in which each set of parallel electrical signals comprises at least 64 parallel electrical signals.

Embodiment 49: The apparatus of embodiment 33 in which the optical fiber cable comprises at least 100 cores of optical fibers, and the first optical connector is configured to couple at least 100 channels of optical signals to the photonic integrated circuit.

Embodiment 50: The apparatus of embodiment 49 in which the photonic integrated circuit is configured to process the at least 100 channels of optical signals and generate at least 100 first serial electrical signals.

Embodiment 51: The apparatus of embodiment 50 in which the first serializers/deserializers module is configured to convert the at least 100 first serial electrical signals into at least 100 sets of parallel electrical signals, and each set of parallel electrical signals comprises at least two parallel electrical signals.

Embodiment 52: The apparatus of embodiment 51 in which each set of parallel electrical signals comprises at least four parallel electrical signals.

Embodiment 53: The apparatus of embodiment 52 in which each set of parallel electrical signals comprises at least eight parallel electrical signals.

Embodiment 54: The apparatus of embodiment 53 in which each set of parallel electrical signals comprises at least 32 parallel electrical signals.

Embodiment 55: The apparatus of embodiment 54 in which each set of parallel electrical signals comprises at least 64 parallel electrical signals.

Embodiment 56: The apparatus of embodiment 49 in which the optical fiber cable comprises at least 500 cores of optical fibers, and the first optical connector is configured to couple at least 500 channels of optical signals to the photonic integrated circuit.

Embodiment 57: The apparatus of embodiment 56 in which the first serializers/deserializers module is configured to convert the at least 500 first serial electrical signals into at least 500 sets of parallel electrical signals, and each set of parallel electrical signals comprises at least two parallel electrical signals.

Embodiment 58: The apparatus of embodiment 56 in which the optical fiber cable comprises at least 1000 cores of optical fibers, and the first optical connector is configured to couple at least 1000 channels of optical signals to the photonic integrated circuit.

Embodiment 59: The apparatus of embodiment 58 in which the first serializers/deserializers module is configured to convert the at least 1000 first serial electrical signals into at least 1000 sets of parallel electrical signals, and each set of parallel electrical signals comprises at least two parallel electrical signals.

Embodiment 60: The apparatus of embodiment 1 in which the optical interconnect module comprises a first circuit board or a first substrate that has a first side and a second side, the second serializers/deserializers module has a first side and a second side, the optical interconnect module comprises first electrical terminals arranged on the first side of the first circuit board or the first substrate, the optical interconnect module comprises second electrical terminals arranged on the second side of the second serializers/deserializers module, the second electrical terminals are electrically coupled to the first electrical terminals, and the optical interconnect module comprises third electrical terminals arranged on the second side of the first circuit board or the first substrate, the third electrical terminals are configured to be electrically coupled to fourth electrical terminals that are arranged on a second circuit board or a second substrate.

Embodiment 61: The apparatus of embodiment 60 in which the photonic integrated circuit has a first side and a second side, the photonic integrated circuit comprises fifth electrical terminals arranged on the first side of the photonic integrated circuit, and the fifth electrical terminals are electrically coupled to sixth electrical terminals of the first serializers/deserializers module.

Embodiment 62: The apparatus of embodiment 61 in which the fifth electrical terminals arranged on the first side of the photonic integrated circuit are directly soldered to the sixth electrical terminals of the first serializers/deserializers module.

Embodiment 63: The apparatus of embodiment 61 in which the first serializers/deserializers module and the photonic integrated circuit are mounted on opposite sides of the first circuit board or the first substrate, and the fifth electrical terminals arranged on the first side of the photonic integrated circuit are electrically coupled to the sixth electrical terminals of the first serializers/deserializers module through electrical connectors that pass through the first circuit board or the first substrate.

Embodiment 64: The apparatus of embodiment 61 in which the optical input port comprises a first optical connector configured to mate with a second optical connector that is coupled to an optical fiber cable that comprises a plurality of optical fibers, and the first optical connector is optically coupled to the second side of the photonic integrated circuit.

Embodiment 65: The apparatus of embodiment 64 in which the second side of the first circuit board or the first substrate includes an opening, and at least one of the first optical connector, the second optical connector, or the optical cable passes the opening of the second side of the first circuit board or the first substrate.

Embodiment 66: The apparatus of embodiment 65, comprising:

the second circuit board or the second substrate, a second integrated circuit configured to convert the plurality of channels of second serial electrical signals to a plurality of sets of second parallel electrical signals, in which each channel of second serial electrical signal is converted to a set of second parallel electrical signals, the second integrated circuit comprises a deserializers module or a third serializers/deserializers module, and a third integrated circuit configured to process the sets of second parallel electrical signals, wherein the third integrated circuit is mounted on the second circuit board or the second substrate, and the second integrated circuit is mounted on the second circuit board or the second substrate or embedded in the third integrated circuit.

Embodiment 67: The apparatus of embodiment 66 in which the third integrated circuit comprises at least one of a network switch, a central processor unit, a graphics processor unit, a tensor processing unit, a neural network processor, an artificial intelligence accelerator, a digital signal processor, a microcontroller, or an application specific integrated circuit (ASIC).

Embodiment 68: The apparatus of embodiment 66 in which the second circuit board or the second substrate defines an opening, and at least one of the first optical connector, the second optical connector, or the optical cable passes the opening in the second circuit board or the second substrate.

Embodiment 69: The apparatus of embodiment 1, comprising:

a second circuit board or a second substrate;

a second integrated circuit configured to convert the plurality of channels of second serial electrical signals to a plurality of sets of second parallel signals, in which each channel of second serial electrical signal is converted to a set of second parallel electrical signals, the second integrated circuit comprises a deserializers module or a third serializers/deserializers module, and a third integrated circuit configured to process the plurality of sets of second parallel electrical signals, wherein the third integrated circuit is mounted on the second circuit board or the second substrate, and the second integrated circuit is mounted on the second circuit board or the second substrate or embedded in the third integrated circuit.

Embodiment 70: The apparatus of embodiment 69 in which the third integrated circuit comprises at least one of a network switch, a central processor unit, a graphics processor unit, a tensor processing unit, a neural network processor, an artificial intelligence accelerator, a digital signal processor, a microcontroller, or an application specific integrated circuit (ASIC).

Embodiment 71: The apparatus of embodiment 1 in which the optical interconnect module comprises a first circuit board or a first substrate that has a first side and a second side, the first serializers/deserializers module is mounted on the first side of the first circuit board or the first substrate, and the photonic integrated circuit is mounted in a recess at the first side of the first circuit board or the first substrate.

Embodiment 72: The apparatus of embodiment 1 in which the optical input port comprises a first optical connector configured to mate with a second optical connector that is coupled to an optical fiber cable that comprises a plurality of optical fibers, the photonic integrated circuit has a first side and a second side, the first serializers/deserializers module is electrically coupled to the first side of the photonic integrated circuit, and the first optical connector is optically coupled to the first side of the photonic integrated circuit.

Embodiment 73: The apparatus of embodiment 1 in which the optical interconnect module comprises a first circuit board or a first substrate that has a first side and a second side, the first serializers/deserializers module has first electrical terminals that are electrically coupled to second electrical terminals arranged on the first side of the first circuit board or the first substrate, the photonic integrated circuit has a first side and a second side, the photonic integrated circuit has third electrical terminals arranged on the first side, and the third electrical terminals are electrically coupled to fourth electrical terminals arranged on the second side of the first circuit board or the first substrate, the second electrical terminals are electrically coupled to the fourth electrical terminals by electrical connectors that pass through the first circuit board or the first substrate, the optical input port comprises a first optical connector configured to mate with a second optical connector that is coupled to an optical fiber cable that comprises a plurality of optical fibers, and the first optical connector is optically coupled to the first side of the photonic integrated circuit.

Embodiment 74: The apparatus of embodiment 1 in which the optical input port comprises a first optical connector configured to mate with a second optical connector that is coupled to an optical fiber cable that comprises a plurality of optical fibers, the photonic integrated circuit has a first side and a second side, the first serializers/deserializers module is electrically coupled to the first side of the photonic integrated circuit, and the first optical connector is optically coupled to the second side of the photonic integrated circuit.

Embodiment 75: The apparatus of embodiment 1 in which the optical interconnect module comprises a first circuit board or a first substrate that has a first side and a second side, wherein the photonic integrated has a first side and a second side, the photonic integrated circuit includes first electrical terminals arranged on the second side, the first electrical terminals are electrically coupled to second electrical terminals arranged on the first side of the first circuit board or the first substrate, the first serializers/deserializers module is mounted on the first side of the first circuit board or the first substrate, and the optical input port is optically coupled to the second side of the photonic integrated circuit.

Embodiment 76: The apparatus of embodiment 75 comprising third electrical terminals that are arranged on the second side of the first circuit board or the first substrate, in which the third electrical terminals are configured to be mated with fourth electrical terminals arranged on a second circuit board or a second substrate.

Embodiment 77: The apparatus of embodiment 76 in which the third electrical terminals are removably coupled to the fourth electrical terminals, and the third electrical terminals are connected to the fourth electrical terminals without using solder.

Embodiment 78: The apparatus of embodiment 1 in which the optical interconnect module comprises a first circuit board or a first substrate, the photonic integrated circuit has a first footprint on the first circuit board or the first substrate, the first serializers/deserializers module has a second footprint on the first circuit board or the first substrate, and the second footprint overlaps the first footprint.

Embodiment 79: The apparatus of embodiment 78 in which the first footprint is completely within the second footprint.

Embodiment 80: The apparatus of embodiment 78 in which a portion of the first footprint does not overlap the second footprint.

Embodiment 81: The apparatus of embodiment 1 in which the first optical signals provided to the photonic integrated circuit have a total bit rate of at least 1 Tbps.

Embodiment 82: The apparatus of embodiment 1 in which the first optical signals provided to the photonic integrated circuit have a total bit rate of at least 10 Tbps.

Embodiment 83: The apparatus of embodiment 1 in which the photonic integrated circuit comprises a photo detector, the optical interconnect module comprises at least one of a driver or a transimpedance amplifier, the driver is configured to drive an optical modulator, and the transimpedance amplifier is configured to amplify a signal output from the photo detector.

Embodiment 84: The apparatus of embodiment 1 in which the optical interconnect module comprises a first circuit board or a first substrate;

the photonic integrated circuit, the first serializers/deserializers module, and the second serializers/deserializers module are mounted on the first circuit board or the first substrate;

the photonic integrated circuit has a top surface, a bottom surface, a first side surface extending from a first edge of the top surface to a first edge of the bottom surface, and a second side surface extending from a second edge of the top surface to a second edge of the bottom surface;

a first portion of the first serializers/deserializers module is disposed on the first circuit board or the first substrate closer to the first side surface of the photonic integrated circuit than the second side surface of the photonic integrated circuit; and a second portion of the first serializer/deserializers module is disposed on the first circuit board or the first substrate closer to the second side surface of the photonic integrated circuit than the first side surface of the photonic integrated circuit.

Embodiment 85: The apparatus of embodiment 84 in which the photonic integrated circuit comprises first electrical terminals arranged on the bottom side, the first electrical terminals are electrically coupled to second electrical terminals arranged on the first circuit board or the first substrate, the first circuit board or the first substrate defines an opening, the optical input port passes the opening in the first circuit board or the first substrate and is optical coupled to the bottom side of the photonic integrated circuit.

Embodiment 86: The apparatus of embodiment 84 in which a first subset of the second serializer/deserializers is disposed on the first circuit board or the first substrate in a vicinity of the first portion of the first serializers/deserializers module, and a second portion of the second serializers/deserializers module is disposed on the first circuit board or the first substrate in a vicinity of the second portion of the first serializers/deserializers module.

Embodiment 87: The apparatus of embodiment 86 in which the first portion of the first serializers/deserializers module is disposed between the photonic integrated circuit and the first portion of the second serializers/deserializers module, and the second portion of the first serializers/deserializers module is disposed between the photonic integrated circuit and the second portion of the second serializers/deserializers module.

Embodiment 88: The apparatus of embodiment 86 in which the first circuit board or the first substrate comprises a top surface and a bottom surface, the second serializers/deserializers module is mounted on the top surface of the first circuit board or the first substrate, the optical interconnect module comprises first electrical terminals arranged on the top surface of the first circuit board or the first substrate and second electrical terminals arranged on the bottom surface of the first circuit board or the first substrate, the first electrical terminals have a first spacing between the terminals, the second electrical terminals have a second spacing between the terminals, the first spacing is smaller than the second spacing, the first electrical terminals are configured to electrically couple to third electrical terminals arranged on the second serializers/deserializers module, and the second electrical terminals are configured to electrically couple to fourth electrical terminals arranged on a second circuit board or a second substrate.

Embodiment 89: The apparatus of embodiment 88 in which the second electrical terminals are removably coupled to the fourth electrical terminals, and at least one of the second electrical terminals or the fourth electrical terminals comprise at least one of spring loaded connectors, compression interposers, or land-grid arrays.

Embodiment 90: The apparatus of embodiment 1 in which the optical interconnect module comprises a first circuit board or a first substrate and a plurality of driver/transimpedance amplifiers;

the photonic integrated circuit, the first serializers/deserializers module, the second serializers/deserializers module, the first driver/transimpedance amplifier, and the second driver/transimpedance amplifier are mounted on the first circuit board or the first substrate;

the photonic integrated circuit has a top surface, a bottom surface, a first side surface extending from a first edge of the top surface to a first edge of the bottom surface, and a second side surface extending from a second edge of the top surface to a second edge of the bottom surface;

a first subset of the driver/transimpedance amplifiers are disposed on the first circuit board or the first substrate closer to the first side surface of the photonic integrated circuit than the second side surface of the photonic integrated circuit; and a second subset of the driver/transimpedance amplifiers are disposed on the first circuit board or the first substrate closer to the second side surface of the photonic integrated circuit than the first side surface of the photonic integrated circuit.

Embodiment 91: The apparatus of embodiment 90 in which the photonic integrated circuit comprises first electrical terminals arranged on the bottom side, the first electrical terminals are electrically coupled to second electrical terminals arranged on the first circuit board or the first substrate, the first circuit board or the first substrate defines an opening, and the optical input port passes the opening in the first circuit board or the first substrate and is optical coupled to the bottom side of the photonic integrated circuit.

Embodiment 92: The apparatus of embodiment 90 in which a first subset of the first serializer/deserializers are disposed on the first circuit board or the first substrate in a vicinity of the first subset of the driver/transimpedance amplifiers, the first subset of the driver/transimpedance amplifiers are configured to amplify a first set of electrical signals from the photonic integrated circuit and drive a first set of optical modulators, a second subset of the first serializer/deserializers are disposed on the first circuit board or the first substrate in a vicinity of the second subset of the driver/transimpedance amplifiers, and the second subset of the driver/transimpedance amplifiers are configured to amplify a second set of electrical signals from the photonic integrated circuit and drive a second set of optical modulators.

Embodiment 93: The apparatus of embodiment 92 in which the first subset of the driver/transimpedance amplifiers are disposed between the photonic integrated circuit and the first subset of the first serializer/deserializers, and the second subset of the driver/transimpedance amplifiers are disposed between the photonic integrated circuit and the second subset of the first serializer/deserializers.

Embodiment 94: The apparatus of embodiment 92 in which a first subset of the second serializer/deserializers are disposed on the first circuit board or the first substrate in a vicinity of the first subset of the first serializer/deserializers, and a second subset of the second serializer/deserializers are disposed on the first circuit board or the first substrate in a vicinity of the second subset of the first serializer/deserializers.

Embodiment 95: The apparatus of embodiment 1 in which the second serializers/deserializers module is configured to receive a plurality of third serial electrical signals, and generate a plurality of sets of second parallel electrical signals, wherein the first serializers/deserializers module is configured to generate a plurality of fourth serial electrical signals based on the plurality of sets of second parallel electrical signals, and wherein the photonic integrated circuit is configured to generate second optical signals based on the plurality of fourth serial electrical signals.

Embodiment 96: The apparatus of embodiment 95 in which the photonic integrated circuit comprises at least one of waveguides, vertical grating couplers, fiber edge couplers, modulators, optical power splitters, or optical polarization splitters.

Embodiment 97: The apparatus of embodiment 95 in which the first serializers/deserializers module comprises an interpolator or an electrical phase adjustment element that aligns multiple serial output signals that are transmitted to the photonic integrated circuit.

Embodiment 98: An apparatus comprising:

an optical interconnect module comprising:

an optical input port configured to receive an optical signal;

a photonic integrated circuit configured to generate a first serial electrical signal based on the received optical signal;

a first serializer/deserializer configured to generate a set of first parallel electrical signals based on the first serial electrical signals, and condition the electrical signals; and a second serializer/deserializer configured to generate a second serial electrical signal based on the set of first parallel electrical signals.

Embodiment 99: An apparatus comprising:

an optical interconnect module comprising:

an optical input port configured to receive a plurality of channels of optical signals;

a photonic integrated circuit configured to process the optical signals and generate a plurality of first serial electrical signals, in which each first serial electrical signal is generated based on one of the channels of optical signals;

a first deserializer configured to convert the plurality of first serial electrical signals to a plurality of sets of first parallel electrical signals, and condition the electrical signals, in which each first serial electrical signal to converted to a corresponding set of first parallel electrical signals; and a first serializer configured to convert the plurality of sets of first parallel electrical signals to a plurality of second serial electrical signals, in which each set of first parallel electrical signals is converted to a corresponding second serial electrical signal.

Embodiment 100: The apparatus of embodiment 99, comprising:

a second deserializer configured to generate a plurality of sets of second parallel electrical signals based on the plurality of second serial electrical signals, in which each set of second parallel electrical signals is generated based on a corresponding second serial electrical signal; and at least one of a network switch, a central processor unit, a graphics processor unit, a tensor processing unit, a neural network processor, an artificial intelligence accelerator, a digital signal processor, a microcontroller, or an application specific integrated circuit (ASIC) that is configured to process the plurality of sets of second parallel electrical signals.

Embodiment 101: The apparatus of embodiment 99 in which the first deserializer is configured to perform signal conditioning on the electrical signals, the signal conditioning comprising at least one of (i) clock and data recovery, or (ii) signal equalization.

Embodiment 102: The apparatus of embodiment 99 in which the photonic integrated circuit comprises at least one of waveguides, photodetectors, vertical grating couplers, or fiber edge couplers.

Embodiment 103: The apparatus of embodiment 99 in which each of the first deserializer and the first serializer comprises at least one of (i) a multiplexer, (ii) a demultiplexer, (iii) a serial data port, (iv) a parallel data bus, (v) an equalizer, (vi) a clock recovery unit, or (vii) a data recovery unit.

Embodiment 104: The apparatus of embodiment 99, comprising a bus processing module configured to process signals transmitted from the first deserializer to the first serializer, in which the bus processing module performs at least one of switching of data, re-shuffling data, or coding of data.

Embodiment 105: The apparatus of embodiment 99 in which the photonic integrated circuit configured to generate N serial electrical signals, and the first serializer is configured to generate M serial electrical signals based on the plurality of sets of first parallel electrical signals, M and N are positive integers, and M is different from N.

Embodiment 106: The apparatus of embodiment 105 in which the photonic integrated circuit is configured to generate N lanes of P Gbps serial electrical signals, the second serializers/deserializers module is configured to generate N/Q lanes of P*Q Gbps serial electrical signals, and P and Q are positive numbers.

Embodiment 107: The apparatus of embodiment 99 in which the first serial electrical signals are modulated according to a first modulation protocol, and the second serial electrical signals are modulated according to a second modulation protocol that is different from the first modulation protocol.

Embodiment 108: The apparatus of embodiment 99 in which the optical interconnect module comprises a first circuit board or a first substrate, wherein the photonic integrated circuit, the first deserializer, and the first serializer are mounted on the first circuit board or the first substrate.

Embodiment 109: The apparatus of embodiment 108 in which the optical interconnect module comprises first electrical terminals arranged on the first circuit board or the first substrate, and the first electrical terminals are configured to mate with second electrical terminals arranged on a second circuit board or a second substrate.

Embodiment 110: The apparatus of embodiment 109 in which the first electrical terminals are removably coupled to the second electrical terminals of the second circuit board or the second substrate.

Embodiment 111: The apparatus of embodiment 109 in which at least one of the first electrical terminals or the second electrical terminals comprise at least one of spring loaded connectors, compression interposers, or land-grid arrays.

Embodiment 112: The apparatus of embodiment 109 in which the first electrical terminals are arranged on a second side of the first circuit board or the first substrate, the photonic integrated circuit is also mounted on the second side of the first circuit board or the first substrate, and at least a portion of the photonic integrated circuit is positioned between the first circuit board or the first substrate and the second circuit board or the second substrate when the first electrical terminals of the first circuit board or the first substrate mate with the second electrical terminals of the second circuit board or the second substrate.

Embodiment 113: The apparatus of embodiment 109 in which the first serializer is electrically coupled to the first circuit board or the first substrate through third electrical terminals that have a first minimum spacing between the terminals, the first electrical terminals arranged on the first circuit board or the first substrate have a second minimum spacing between terminals, and the second minimum spacing is larger than the first minimum spacing.

Embodiment 114: The apparatus of embodiment 113 in which the second minimum spacing is at least twice the first minimum spacing.

Embodiment 115: The apparatus of embodiment 113 in which the first minimum spacing is less than or equal to 200 μm.

Embodiment 116: The apparatus of embodiment 113 in which the first minimum spacing is less than or equal to 100 μm.

Embodiment 117: The apparatus of embodiment 113 in which the first minimum spacing is less than or equal to 50 μm.

Embodiment 118: The apparatus of embodiment 99 in which the optical input port comprises a first optical connector configured to mate with a second optical connector coupled to an optical fiber cable that provides a plurality of optical paths.

Embodiment 119: The apparatus of embodiment 118 in which each optical path is provided by a core of an optical fiber in the optical fiber cable.

Embodiment 120: The apparatus of embodiment 118 in which the first optical connector is configured to couple optical signals propagating along at least two optical paths to the photonic integrated circuit.

Embodiment 121: The apparatus of embodiment 120 in which the photonic integrated circuit is configured to process the at least two channels of optical signals and generate at least two first serial electrical signals.

Embodiment 122: The apparatus of embodiment 121 in which the first serializers/deserializers module is configured to convert the at least two first serial electrical signals into at least two sets of parallel electrical signals, and each set of parallel electrical signals comprises at least two parallel electrical signals.

Embodiment 123: The apparatus of embodiment 122 in which each set of parallel electrical signals comprises at least four parallel electrical signals.

Embodiment 124: The apparatus of embodiment 123 in which each set of parallel electrical signals comprises at least eight parallel electrical signals.

Embodiment 125: The apparatus of embodiment 124 in which each set of parallel electrical signals comprises at least 32 parallel electrical signals.

Embodiment 126: The apparatus of embodiment 125 in which each set of parallel electrical signals comprises at least 64 parallel electrical signals.

Embodiment 127: The apparatus of embodiment 118 in which the first optical connector is configured to couple optical signals propagating along at least four optical paths to the photonic integrated circuit.

Embodiment 128: The apparatus of embodiment 118 in which the first optical connector is configured to couple optical signals propagating along at least eight optical paths to the photonic integrated circuit.

Embodiment 129: The apparatus of embodiment 118 in which the optical fiber cable comprises at least 10 cores of optical fibers, and the first optical connector is configured to couple at least 10 channels of optical signals to the photonic integrated circuit.

Embodiment 130: The apparatus of embodiment 129 in which the photonic integrated circuit is configured to process the at least 10 channels of optical signals and generate at least 10 first serial electrical signals.

Embodiment 131: The apparatus of embodiment 130 in which the first serializers/deserializers module is configured to convert the at least 10 first serial electrical signals into at least 10 sets of parallel electrical signals, and each set of parallel electrical signals comprises at least two parallel electrical signals.

Embodiment 132: The apparatus of embodiment 131 in which each set of parallel electrical signals comprises at least four parallel electrical signals.

Embodiment 133: The apparatus of embodiment 132 in which each set of parallel electrical signals comprises at least eight parallel electrical signals.

Embodiment 134: The apparatus of embodiment 118 in which the optical fiber cable comprises at least 100 cores of optical fibers, and the first optical connector is configured to couple at least 100 channels of optical signals to the photonic integrated circuit.

Embodiment 135: The apparatus of embodiment 134 in which the photonic integrated circuit is configured to process the at least 100 channels of optical signals and generate at least 100 first serial electrical signals.

Embodiment 136: The apparatus of embodiment 135 in which the first deserializer is configured to convert the at least 100 first serial electrical signals into at least 100 sets of parallel electrical signals, and each set of parallel electrical signals comprises at least two parallel electrical signals.

Embodiment 137: The apparatus of embodiment 136 in which each set of parallel electrical signals comprises at least four parallel electrical signals.

Embodiment 138: The apparatus of embodiment 137 in which each set of parallel electrical signals comprises at least eight parallel electrical signals.

Embodiment 139: The apparatus of embodiment 138 in which each set of parallel electrical signals comprises at least 32 parallel electrical signals.

Embodiment 140: The apparatus of embodiment 139 in which each set of parallel electrical signals comprises at least 64 parallel electrical signals.

Embodiment 141: The apparatus of embodiment 134 in which the optical fiber cable comprises at least 500 optical fibers, and the first optical connector is configured to couple at least 500 channels of optical signals to the photonic integrated circuit.

Embodiment 142: The apparatus of embodiment 141 in which the first deserializer is configured to convert the at least 500 first serial electrical signals into at least 500 sets of parallel electrical signals, and each set of parallel electrical signals comprises at least two parallel electrical signals.

Embodiment 143: The apparatus of embodiment 141 in which the optical fiber cable comprises at least 1000 optical fibers, and the first optical connector is configured to couple at least 1000 channels of optical signals to the photonic integrated circuit.

Embodiment 144: The apparatus of embodiment 143 in which the first deserializer is configured to convert the at least 1000 first serial electrical signals into at least 1000 sets of parallel electrical signals, and each set of parallel electrical signals comprises at least two parallel electrical signals.

Embodiment 145: The apparatus of embodiment 99 in which the optical interconnect module comprises a first circuit board or a first substrate that has a first side and a second side, the first serializer has a first side and a second side, the optical interconnect module comprises first electrical terminals arranged on the first side of the first circuit board or the first substrate, the optical interconnect module comprises second electrical terminals arranged on the second side of the first serializer, the second electrical terminals are electrically coupled to the first electrical terminals, and the optical interconnect module comprises third electrical terminals arranged on the second side of the first circuit board or the first substrate, the third electrical terminals are configured to be electrically coupled to fourth electrical terminals that are arranged on a second circuit board or a second substrate.

Embodiment 146: The apparatus of embodiment 145 in which the photonic integrated circuit has a first side and a second side, the photonic integrated circuit comprises fifth electrical terminals arranged on the first side of the photonic integrated circuit, and the fifth electrical terminals are electrically coupled to sixth electrical terminals of the first deserializer.

Embodiment 147: The apparatus of embodiment 146 in which the fifth electrical terminals arranged on the first side of the photonic integrated circuit are directly soldered to the sixth electrical terminals of the first deserializer.

Embodiment 148: The apparatus of embodiment 146 in which the first deserializer and the photonic integrated circuit are mounted on opposite sides of the first circuit board or the first substrate, and the fifth electrical terminals arranged on the first side of the photonic integrated circuit are electrically coupled to the sixth electrical terminals of the first deserializer through electrical connectors that pass through the first circuit board or the first substrate.

Embodiment 149: The apparatus of embodiment 146 in which the optical input port comprises a first optical connector configured to mate with a second optical connector that is coupled to an optical fiber cable that comprises a plurality of optical fibers, and the first optical connector is optically coupled to the second side of the photonic integrated circuit.

Embodiment 150: The apparatus of embodiment 149 in which the second side of the first circuit board or the first substrate includes an opening, and at least one of the first optical connector, the second optical connector, or the optical cable passes the opening of the second side of the first circuit board or the first substrate.

Embodiment 151: The apparatus of embodiment 150, comprising:

- the second circuit board or the second substrate,
- a second deserializer configured to convert the plurality of channels of second serial electrical signals to a plurality of sets of second parallel electrical signals, in which each channel of second serial electrical signal is converted to a set of second parallel electrical signals, and
- a third integrated circuit configured to process the sets of second parallel electrical signals,
- wherein the third integrated circuit is mounted on the second circuit board or the second substrate, and the second deserializer is mounted on the second circuit board or the second substrate or embedded in the third integrated circuit.

Embodiment 152: The apparatus of embodiment 151 in which the third integrated circuit comprises at least one of a network switch, a central processor unit, a graphics processor unit, a tensor processing unit, a neural network processor, an artificial intelligence accelerator, a digital signal processor, a microcontroller, or an application specific integrated circuit (ASIC).

Embodiment 153: The apparatus of embodiment 151 in which the second circuit board or the second substrate defines an opening, and at least one of the first optical connector, the second optical connector, or the optical cable passes the opening in the second circuit board or the second substrate.

Embodiment 154: The apparatus of embodiment 99, comprising:

- a second circuit board or a second substrate;
- a second deserializer configured to convert the plurality of channels of second serial electrical signals to a plurality of sets of second parallel signals, in which each channel of second serial electrical signal is converted to a set of second parallel electrical signals, and
- a third integrated circuit configured to process the plurality of sets of second parallel electrical signals,
- wherein the third integrated circuit is mounted on the second circuit board or the second substrate, and the second deserializer is mounted on the second circuit board or the second substrate or embedded in the third integrated circuit.

Embodiment 155: The apparatus of embodiment 154 in which the third integrated circuit comprises at least one of a network switch, a central processor unit, a graphics processor unit, a tensor processing unit, a neural network processor, an artificial intelligence accelerator, a digital signal processor, a microcontroller, or an application specific integrated circuit (ASIC).

Embodiment 156: The apparatus of embodiment 99 in which the optical interconnect module comprises a first circuit board or a first substrate that has a first side and a second side, the first deserializer is mounted on the first side of the first circuit board or the first substrate, and the photonic integrated circuit is mounted in a recess at the first side of the first circuit board or the first substrate.

Embodiment 157: The apparatus of embodiment 99 in which the optical input port comprises a first optical connector configured to mate with a second optical connector that is coupled to an optical fiber cable that comprises a plurality of optical fibers,

- the photonic integrated circuit has a first side and a second side,
- the first deserializer is electrically coupled to the first side of the photonic integrated circuit, and
- the first optical connector is optically coupled to the first side of the photonic integrated circuit.

Embodiment 158: The apparatus of embodiment 99 in which the optical interconnect module comprises a first circuit board or a first substrate that has a first side and a second side,

- the first deserializer has first electrical terminals that are electrically coupled to second electrical terminals arranged on the first side of the first circuit board or the first substrate,
- the photonic integrated circuit has a first side and a second side, the photonic integrated circuit has third electrical terminals arranged on the first side, and the third electrical terminals are electrically coupled to fourth electrical terminals arranged on the second side of the first circuit board or the first substrate,
- the second electrical terminals are electrically coupled to the fourth electrical terminals by electrical connectors that pass through the first circuit board or the first substrate,
- the optical input port comprises a first optical connector configured to mate with a second optical connector that is coupled to an optical fiber cable that comprises a plurality of optical fibers, and
- the first optical connector is optically coupled to the first side of the photonic integrated circuit.

Embodiment 159: The apparatus of embodiment 99 in which the optical input port comprises a first optical connector configured to mate with a second optical connector that is coupled to an optical fiber cable that comprises a plurality of optical fibers,

- the photonic integrated circuit has a first side and a second side,
- the first deserializer is electrically coupled to the first side of the photonic integrated circuit, and the first optical connector is optically coupled to the second side of the photonic integrated circuit.

Embodiment 160: The apparatus of embodiment 99 in which the optical interconnect module comprises a first circuit board or a first substrate that has a first side and a second side,

- wherein the photonic integrated has a first side and a second side, the photonic integrated circuit includes first electrical terminals arranged on the second side, the first electrical terminals are electrically coupled to second electrical terminals arranged on the first side of the first circuit board or the first substrate, the first deserializer is mounted on the first side of the first circuit board or the first substrate, and the optical input port is optically coupled to the second side of the photonic integrated circuit.

Embodiment 161: The apparatus of embodiment 160, comprising third electrical terminals that are arranged on the second side of the first circuit board or the first substrate, in which the third electrical terminals are configured to be mated with fourth electrical terminals arranged on a second circuit board or a second substrate.

Embodiment 162: The apparatus of embodiment 161 in which the third electrical terminals are removably coupled to the fourth electrical terminals, and the third electrical terminals are connected to the fourth electrical terminals without using solder.

Embodiment 163: The apparatus of embodiment 99 in which the optical interconnect module comprises a first circuit board or a first substrate, the photonic integrated circuit has a first footprint on the first circuit board or the first substrate, the first deserializer has a second footprint on the first circuit board or the first substrate, and the second footprint overlaps the first footprint.

Embodiment 164: The apparatus of embodiment 163 in which the first footprint is completely within the second footprint.

Embodiment 165: The apparatus of embodiment 163 in which a portion of the first footprint does not overlap the second footprint.

Embodiment 166: The apparatus of embodiment 99 in which the first optical signals provided to the photonic integrated circuit have a total bit rate of at least 1 Tbps.

Embodiment 167: The apparatus of embodiment 99 in which the first optical signals provided to the photonic integrated circuit have a total bit rate of at least 10 Tbps.

Embodiment 168: The apparatus of embodiment 99 in which the photonic integrated circuit comprises a photo detector, the optical interconnect module comprises a transimpedance amplifier, and the transimpedance amplifier is configured to amplify a signal output from the photo detector.

Embodiment 169: The apparatus of embodiment 99 in which the optical interconnect module comprises a first circuit board or a first substrate;

the photonic integrated circuit, the first deserializer, and the first serializer are mounted on the first circuit board or the first substrate;

the photonic integrated circuit has a top surface, a bottom surface, a first side surface extending from a first edge of the top surface to a first edge of the bottom surface, and a second side surface extending from a second edge of the top surface to a second edge of the bottom surface;

a first portion of the first deserializer is disposed on the first circuit board or the first substrate closer to the first side surface of the photonic integrated circuit than the second side surface of the photonic integrated circuit; and a second portion of the first deserializer is disposed on the first circuit board or the first substrate closer to the second side surface of the photonic integrated circuit than the first side surface of the photonic integrated circuit.

Embodiment 170: The apparatus of embodiment 169 in which the photonic integrated circuit comprises first electrical terminals arranged on the bottom side, the first electrical terminals are electrically coupled to second electrical terminals arranged on the first circuit board or the first substrate, the first circuit board or the first substrate defines an opening, the optical input port passes the opening in the first circuit board or the first substrate and is optical coupled to the bottom side of the photonic integrated circuit.

Embodiment 171: The apparatus of embodiment 169 in which a first portion of the first serializer is disposed on the first circuit board or the first substrate in a vicinity of the first portion of the first deserializer, and a second portion of the first serializer is disposed on the first circuit board or the first substrate in a vicinity of the second portion of the first deserializer.

Embodiment 172: The apparatus of embodiment 171 in which the first portion of the first deserializer is disposed between the photonic integrated circuit and the first portion of the first serializer, and the second portion of the first deserializer is disposed between the photonic integrated circuit and the second portion of the first serializer.

Embodiment 173: The apparatus of embodiment 171 in which the first circuit board or the first substrate comprises a top surface and a bottom surface, the first serializer is mounted on the top surface of the first circuit board or the first substrate, the optical interconnect module comprises first electrical terminals arranged on the top surface of the first circuit board or the first substrate and second electrical terminals arranged on the bottom surface of the first circuit board or the first substrate, the first electrical terminals have a first spacing between the terminals, the second electrical terminals have a second spacing between the terminals, the first spacing is smaller than the second spacing, the first electrical terminals are configured to electrically couple to third electrical terminals arranged on the first serializer, and the second electrical terminals are configured to electrically couple to fourth electrical terminals arranged on a second circuit board or a second substrate.

Embodiment 174: The apparatus of embodiment 173 in which the second electrical terminals are removably coupled to the fourth electrical terminals, and at least one of the second electrical terminals or the fourth electrical terminals comprise at least one of spring loaded connectors, compression interposers, or land-grid arrays.

Embodiment 175: The apparatus of embodiment 99 in which the optical interconnect module comprises a first circuit board or a first substrate and a plurality of transimpedance amplifiers;

the photonic integrated circuit, the first deserializer, the first serializer, and the transimpedance amplifiers are mounted on the first circuit board or the first substrate;

the photonic integrated circuit has a top surface, a bottom surface, a first side surface extending from a first edge of the top surface to a first edge of the bottom surface, and a second side surface extending from a second edge of the top surface to a second edge of the bottom surface;

a first subset of the transimpedance amplifiers are disposed on the first circuit board or the first substrate closer to the first side surface of the photonic integrated circuit than the second side surface of the photonic integrated circuit; and a second subset of the transimpedance amplifiers are disposed on the first circuit board or the first substrate closer to the second side surface of the photonic integrated circuit than the first side surface of the photonic integrated circuit.

Embodiment 176: The apparatus of embodiment 175 in which the photonic integrated circuit comprises first electrical terminals arranged on the bottom side, the first electrical terminals are electrically coupled to second electrical terminals arranged on the first circuit board or the first substrate, the first circuit board or the first substrate defines an opening, and the optical input port passes the opening in the first circuit board or the first substrate and is optical coupled to the bottom side of the photonic integrated circuit.

Embodiment 177: The apparatus of embodiment 175 in which a first portion of the first deserializer is disposed on the first circuit board or the first substrate in a vicinity of the first subset of the transimpedance amplifiers,
- the first subset of the transimpedance amplifiers are configured to amplify a first set of electrical signals from the photonic integrated circuit,
- a second portion of the first deserializer is disposed on the first circuit board or the first substrate in a vicinity of the second subset of the transimpedance amplifiers, and
- the second subset of the transimpedance amplifiers are configured to amplify a second set of electrical signals from the photonic integrated circuit.

Embodiment 178: The apparatus of embodiment 177 in which the first subset of the transimpedance amplifiers are disposed between the photonic integrated circuit and the first portion of the first deserializer, and the second subset of the transimpedance amplifiers are disposed between the photonic integrated circuit and the second portion of the first deserializer.

Embodiment 179: The apparatus of embodiment 177 in which a first portion of the first serializer disposed on the first circuit board or the first substrate in a vicinity of the first portion of the first deserializer, and a second portion of the first serializer is disposed on the first circuit board or the first substrate in a vicinity of the second portion of the first deserializer.

Embodiment 180: The apparatus of embodiment 99 in which the first serializer is configured to receive a plurality of third serial electrical signals, and generate a plurality of sets of second parallel electrical signals,
- wherein the first deserializer is configured to generate a plurality of fourth serial electrical signals based on the plurality of sets of second parallel electrical signals, and
- wherein the photonic integrated circuit is configured to generate second optical signals based on the plurality of fourth serial electrical signals.

Embodiment 181: An apparatus comprising:
- an optical interconnect module comprising:
  - an optical input port configured to receive an optical signal;
  - a photonic integrated circuit configured to generate a first serial electrical signal based on the received optical signal;
  - a first deserializer configured to generate a set of first parallel electrical signals based on the first serial electrical signals, and condition the electrical signals; and
  - a first serializer configured to generate a second serial electrical signal based on the set of first parallel electrical signals.

Embodiment 182: The apparatus of embodiment 181, comprising:
- a second deserializer configured to generate a set of second parallel electrical signals based on the second serial electrical signal; and
- at least one of a network switch, a central processor unit, a graphics processor unit, a tensor processing unit, a neural network processor, an artificial intelligence accelerator, a digital signal processor, a microcontroller, or an application specific integrated circuit (ASIC) that is configured to process the set of second parallel electrical signals.

Embodiment 183: The apparatus of embodiment 181 in which the first deserializer is configured to perform signal conditioning on the electrical signals, the signal conditioning comprising at least one of (i) clock and data recovery, or (ii) signal equalization.

Embodiment 184: The apparatus of embodiment 181 in which the photonic integrated circuit comprises at least one of waveguides, photodetectors, vertical grating couplers, or fiber edge couplers.

Embodiment 185: The apparatus of embodiment 181 in which each of the first deserializer and the first serializer comprises at least one of (i) a multiplexer, (ii) a demultiplexer, (iii) a serial data port, (iv) a parallel data bus, (v) an equalizer, (vi) a clock recovery unit, or (vii) a data recovery unit.

Embodiment 186: The apparatus of embodiment 181, comprising a bus processing module configured to process signals transmitted from the first deserializer to the first serializer, in which the bus processing module performs at least one of switching of data, re-shuffling data, or coding of data.

Embodiment 187: An apparatus comprising:
- an optical interconnect module comprising:
  - a first deserializer configured to receive a plurality of first serial electrical signals, and generate a plurality of sets of first parallel electrical signals based on the plurality of first serial electrical signals, in which each set of first parallel electrical signal is generated based on a corresponding first serial electrical signal;
  - a first serializer configured to generate a plurality of second serial electrical signals based on the plurality of sets of first parallel signals, in which each second serial electrical signal is generated based on a corresponding set of first parallel electrical signals;
  - a photonic integrated circuit configured to generate a plurality of channels of optical signals based on the plurality of second serial electrical signals; and
  - an optical output port configured to output the plurality of channels of optical signals.

Embodiment 188: The apparatus of embodiment 187, further comprising:
- at least one of a network switch, a central processor unit, a graphics processor unit, a tensor processing unit, a neural network processor, an artificial intelligence accelerator, a digital signal processor, a microcontroller, or an application specific integrated circuit (ASIC) that is configured to generate a plurality of sets of second parallel electrical signals; and
- a second serializer configured to generate the first serial electrical signals based on the sets of second parallel electrical signals.

Embodiment 189: An apparatus comprising:
- an optical interconnect module comprising:
  - a first circuit board or a first substrate having a length, a width, and a thickness, in which the length is at least twice the thickness, and the width is at least twice the thickness, the first circuit board or the first substrate has a first surface defined by the length and the width;

an optical input port configured to receive a plurality of channels of optical signals;

a photonic integrated circuit mounted on the first circuit board or the first substrate and configured to generate a plurality of first serial electrical signals based on the received optical signals; and an array of first electrical terminals arranged on the first surface of the first circuit board or the first substrate, in which the array of first electrical terminals comprises at least two electrical terminals distributed along the length direction and at least two electrical terminals distributed along the width direction, the first electrical terminals are configured to output the first serial electrical signals.

Embodiment 190: The apparatus of embodiment 189 in which the first electrical terminals extend along directions substantially perpendicular to the first surface of the first circuit board or the first substrate.

Embodiment 191: The apparatus of embodiment 189 in which the first electrical terminals comprise at least one of spring loaded connectors, compression interposers, or land-grid arrays.

Embodiment 192: The apparatus of embodiment 189, comprising:

a second circuit board or a second substrate;

a deserializer or a serializer/deserializer configured to generate a plurality of sets of parallel electrical signals based on the first serial electrical signals, in which each set of parallel electrical signals is generated based on a corresponding first serial electrical signal; and a second integrated circuit mounted on the second circuit board or the second substrate and configured to process the plurality of sets of parallel electrical signals.

Embodiment 193: The apparatus of embodiment 192 in which the second integrated circuit comprises at least one of a network switch, a central processor unit, a graphics processor unit, a tensor processing unit, a neural network processor, an artificial intelligence accelerator, a digital signal processor, a microcontroller, or an application specific integrated circuit (ASIC).

Embodiment 194: The apparatus of embodiment 192 in which the deserializer or the serializer/deserializer is embedded in the second integrated circuit.

Embodiment 195: The apparatus of embodiment 189 in which the photonic integrated circuit is mounted on the first surface of the first circuit board or the first substrate.

Embodiment 196: The apparatus of embodiment 189 in which the first circuit board or the first substrate has a second surface defined by the length and the width, the second surface is spaced apart from the first surface by the thickness;

the photonic integrated circuit is mounted on the second surface of the first circuit board or the first substrate;

the photonic integrated circuit comprise second electrical terminals that are electrically coupled to the first electrical terminals through electrical connectors that pass through the first circuit board or the first substrate in the thickness direction.

Embodiment 197: The apparatus of embodiment 189 in which the optical interconnect module comprises at least one of a driver or a transimpedance amplifier, the driver is configured to drive an optical modulator, and the transimpedance amplifier is configured to amplify a signal output from a photo detector;

the first circuit board or the first substrate has a second surface defined by the length and the width, the second surface is spaced apart from the first surface by the thickness;

the photonic integrated circuit and the at least one of the driver or the transimpedance amplifier are mounted on the second surface of the first circuit board or the first substrate;

the at least one of the driver or transimpedance amplifier has second electrical terminals that are electrically coupled to the first electrical terminals through electrical connectors that pass through the first circuit board or the first substrate in the thickness direction.

Embodiment 198: The apparatus of embodiment 189 in which the photonic integrated circuit has a length, a width, and a thickness, the length is at least twice the thickness, and the width is at least twice the thickness;

the photonic integrated circuit has a first surface defined by the length and the width;

the photonic integrated circuit comprises second electrical terminals arranged on the first surface, the second electrical terminals are electrical coupled to the first electrical terminals on the first circuit board or the first substrate; and the optical input port is optical coupled to the first surface of the photonic integrated circuit.

Embodiment 199: The apparatus of embodiment 189 in which the photonic integrated circuit has a length, a width, and a thickness, the length is at least twice the thickness, and the width is at least twice the thickness;

the photonic integrated circuit has a first surface defined by the length and the width, the photonic integrated circuit has a second surface defined by the length and the width, the second surface is spaced apart from the first surface by the thickness;

the photonic integrated circuit comprises second electrical terminals arranged on the first surface, the second electrical terminals are electrical coupled to the first electrical terminals on the first circuit board or the first substrate;

the optical input port is optical coupled to the second surface of the photonic integrated circuit.

Embodiment 200: The apparatus of embodiment 189 in which the optical interconnect module comprises at least one of a driver or a transimpedance amplifier, the driver is configured to drive an optical modulator, and the transimpedance amplifier is configured to amplify an electrical signal from a photo detector;

the photonic integrated circuit and at least one of the driver or the transimpedance amplifier are mounted on the first surface of the first circuit board or the first substrate; and the at least one of the driver or transimpedance amplifier has second electrical terminals that are electrically coupled to the first electrical terminals.

Embodiment 201: The apparatus of embodiment 189 in which the optical input port comprises a first optical connector configured to mate with a second optical connector coupled to an optical fiber cable that comprises a plurality of optical fibers.

Embodiment 202: The apparatus of embodiment 201 in which the photonic integrated circuit comprises vertical-coupling elements configured to couple light from the optical input port to the photonic integrated circuit.

Embodiment 203: The apparatus of embodiment 202 in which the first optical connector comprises one or more lenses configured to project light onto the vertical coupling elements.

Embodiment 204: The apparatus of embodiment 202 in which the first optical connector and the second optical connector comprise one or more optical components configured to couple M spatial paths of the optical fibers and an array of N vertical-coupling elements of the photonic integrated circuit, N is a positive integer, M is a positive integer, and N is equal to or different from M.

Embodiment 205: The apparatus of embodiment 204 in which the one or more optical components of the first and second optical connectors are configured to implement at least one of (i) magnifying or de-magnifying by a first factor a minimum core-to-core spacing of the optical fibers at a fiber end face plane to match a minimum spacing between the vertical-coupling elements at a coupling plane;

(ii) magnifying or de-magnifying by a second factor a maximum core-to-core spacing of optical fibers at a fiber end face plane to match a maximum spacing between the vertical-coupling elements at a coupling plane;

(iii) magnifying or de-magnifying by a third factor an effective core diameter of optical fibers at a fiber end face plane to match an effective size of the vertical coupling elements at a coupling plane;

(iv) magnifying or de-magnifying by a fourth factor an effective core diameter of optical fibers at a fiber end face plane to achieve a different effective beam diameter at a connector mating plane than at the fiber end face plane; or (v) changing an effective cross-sectional geometrical layout of the plurality of spatial paths at least one of a fiber end face plane, a connector mating plane, or a coupling plane.

Embodiment 206: A system comprising:

a housing comprising a bottom surface;

a first circuit board or a first substrate comprising a first surface at an angle relative to the bottom surface of the housing, in which the angle is in a range from 30° to 150°;

at least one data processor mounted on the first circuit board or the first substrate; and at least one optical interconnect module mounted on the first surface of the first circuit board or the first substrate, in which each optical interconnect module comprises a first optical connector configured to connect to an external optical link, each optical interconnect module comprises a photonic integrated circuit configured to generate a first serial electrical signal based on an optical signal received from the first optical connector;

wherein the at least one data processor is configured to process data carried in the first serial electrical signal.

Embodiment 207: The system of embodiment 206 in which at least one of the at least one optical interconnect module is removably coupled to the first circuit board or the first substrate.

Embodiment 208: The system of embodiment 206 in which at least one of the at least one optical interconnect module is removably coupled to the first circuit board or the first substrate.

Embodiment 209: The system of embodiment 206 in which the first optical connector is removably coupled to the external optical link.

Embodiment 210: The system of embodiment 206 in which the first optical connector is fixedly coupled to the external optical link.

Embodiment 211: The system of embodiment 206 in which one or more optical fibers are directly attached to the photonic integrated circuit.

Embodiment 212: The system of embodiment 206 in which one or more optical fibers are removably attached to the at least one optical interconnect module.

Embodiment 213: The system of embodiment 206 in which the at least one data processor comprises at least a network switch, a central processor unit, a graphics processor unit, a tensor processing unit, a neural network processor, an artificial intelligence accelerator, a digital signal processor, a microcontroller, or an application specific integrated circuit (ASIC).

Embodiment 214: The system of embodiment 206 in which the housing comprises a front panel having a front surface;

the first circuit board or the first substrate has a length, a width, and a thickness, wherein the length is at least twice the thickness, and the width is at least twice the thickness, the first circuit board or the first substrate has a first surface defined by the length and the width; and the first circuit board or the first substrate is oriented such that the first surface is substantially parallel to the front surface of the front panel.

Embodiment 215: The system of embodiment 214 in which the at least one data processor is also mounted on the first surface of the first circuit board or the first substrate.

Embodiment 216: The system of embodiment 215, comprising one or more optical paths that pass a first opening of the first circuit board or the first substrate and a second opening of the front panel, in which the one or more optical paths enable one or more optical signals from the external optical link to be coupled through the first optical connector to the photonic integrated circuit.

Embodiment 217: The system of embodiment 214 in which the at least one data processor is mounted on a second surface of the first circuit board or the first substrate, the second surface is opposite to the first surface.

Embodiment 218: The system of embodiment 217, comprising one or more optical paths that pass an opening of the front panel, in which the optical path enables one or more optical signals from the external optical link to be coupled through the first optical connector to the photonic integrated circuit.

Embodiment 219: The system of embodiment 217 in which at least one of the at least one optical interconnect module passes an opening of the front panel.

Embodiment 220: The system of embodiment 206 in which the first circuit board or the first substrate is configured as a front panel or a portion of a front panel of the housing.

Embodiment 221: The system of embodiment 206, comprising a rackmount module, in which the rackmount module comprises the housing, the first circuit board or the first substrate, the at least one data processor, and the at least one optical interconnect module, wherein the first circuit board or the first substrate is configured as a front panel or a portion of the front panel of the rackmount module or is oriented substantially parallel to a front panel of the rackmount module.

Embodiment 222: The system of embodiment 206 in which the optical interconnect module comprises:

a first serializer/deserializer configured to generate a set of first parallel electrical signals based on the first serial electrical signal, and condition the electrical signals; and a second serializer/deserializer configured to generate a second serial electrical signal based on the set of first parallel electrical signals;

wherein the at least one data processor is configured to process data carried in the second serial electrical signal.

Embodiment 223: The system of embodiment 222, comprising a third serializer/deserializer configured to generate a set of second parallel electrical signal based on the second serial electrical signal;

wherein the at least one data processor is configured to process data carried in the set of second parallel electrical signal.

Embodiment 224: The system of embodiment 223 in which the third serializer/deserializer is embedded in the at least one data processor.

Embodiment 225: The system of embodiment 206, comprising a first serializer/deserializer configured to generate a set of first parallel electrical signals based on the first serial electrical signal;

wherein the at least one data processor is configured to process data carried in the set of first parallel electrical signal.

Embodiment 226: The system of embodiment 225 in which the first serializer/deserializer is embedded in the at least one data processor.

Embodiment 227: The system of embodiment 206 in which the first circuit board or the first substrate has a first surface and a second surface, the second surface of the first circuit board or the first substrate faces a front side of the housing;

the at least one data processor and the at least one optical interconnect module are mounted on the first surface of the first circuit board or the first substrate;

the first circuit board or the first substrate defines an opening, the optical signal is transmitted through an optical path that passes through the opening of the first circuit board or the first substrate to the photonic integrated circuit.

Embodiment 228: The system of embodiment 227 in which the first circuit board or the first substrate functions as a front panel or a portion of a front panel of the housing.

Embodiment 229: The system of embodiment 227 in which the housing comprises a front panel, and the first circuit board or the first substrate is substantially parallel to the front panel.

Embodiment 230: The system of embodiment 229 in which the first circuit board or the first substrate is spaced apart from the front panel, and a distance between the first circuit board or the first substrate and the front panel is in a range from 0.1 to 2 inches.

Embodiment 231: The system of embodiment 206 in which the first circuit board or the first substrate has a first surface and a second surface, the second surface of the first circuit board or the first substrate faces a front side of the housing;

the at least one data processor is mounted on the first surface of the first circuit board or the first substrate; and the at least one optical interconnect module is mounted on the second surface of the first circuit board or the first substrate, the at least one optical interconnect module is electrically coupled to the at least one data process through electrical connections that pass through the first circuit board or the first substrate in a thickness direction of the first circuit board or the first substrate.

Embodiment 232: The system of embodiment 231 in which the first circuit board or the first substrate functions as a front panel or a portion of a front panel of the housing.

Embodiment 233: The system of embodiment 231 in which the housing comprises a front panel, and the first circuit board or the first substrate is substantially parallel to the front panel.

Embodiment 234: The system of embodiment 233 in which the first circuit board or the first substrate is spaced apart from the front panel, and a distance between the first circuit board or the first substrate and the front panel is in a range from 0.1 to 2 inches.

Embodiment 235: The system of embodiment 206, comprising a second circuit board or a second substrate comprising a second surface oriented substantially parallel to the bottom surface of the housing, and a plurality of electronic components mounted on the second surface of the second circuit board or the second substrate, wherein the first circuit board or the first substrate is electrically coupled to the second circuit board or the second substrate.

Embodiment 236: The system of embodiment 206 in which the first optical connector is configured to releasably connect with a second optical connector that is coupled to a bundle of optical fibers.

Embodiment 237: The system of embodiment 236 in which the first optical connector is configured to provide at least 2 optical paths to enable optical signals from the bundle of optical fibers to be coupled to the at least one data processor.

Embodiment 238: The system of embodiment 236 in which the first optical connector is configured to provide at least 4 optical paths to enable optical signals from the bundle of optical fibers to be coupled to the at least one data processor.

Embodiment 239: The system of embodiment 236 in which the first optical connector is configured to provide at least 8 optical paths to enable optical signals from the bundle of optical fibers to be coupled to the at least one data processor.

Embodiment 240: The system of embodiment 236 in which the first optical connector is configured to provide at least 16 optical paths to enable optical signals from the bundle of optical fibers to be coupled to the at least one data processor.

Embodiment 241: The system of embodiment 236 in which the first optical connector is configured to provide at least 32 optical paths to enable optical signals from the bundle of optical fibers to be coupled to the at least one data processor.

Embodiment 242: The system of embodiment 236 in which the first optical connector is configured to provide at least 64 optical paths to enable optical signals from the bundle of optical fibers to be coupled to the at least one data processor.

Embodiment 243: The system of embodiment 236 in which the plurality of optical fibers comprise at least 100 cores of optical fibers.

Embodiment 244: The system of embodiment 236 in which the plurality of optical fibers comprise at least 500 cores of optical fibers.

Embodiment 245: The system of embodiment 236 in which the plurality of optical fibers comprise at least 1000 cores of optical fibers.

Embodiment 246: A system comprising:

a housing comprising a front panel, in which the front panel comprises a first circuit board or a first substrate;

at least one data processor mounted on the first circuit board or the first substrate; and at least one optical/electrical communication interface mounted on the first circuit board or the first substrate.

Embodiment 247: The system of embodiment 246 in which each optical/electrical communication interface comprises:

a first optical connector configured to connect to an external optical link, and a photonic integrated circuit configured to generate an electrical signal based on an optical signal received from the first optical connector.

Embodiment 248: The system of embodiment 247 in which at least one of the at least one data processor and at least one of the at least one photonic integrated circuit are mounted on a same side of the first circuit board or the first substrate.

Embodiment 249: The system of embodiment 247 in which at least one of the at least one data processor is mounted on a first side of the first circuit board or the first substrate, at least one of the at least one photonic integrated circuit is mounted on a second side of the first circuit board or the first substrate, and the second side is opposite the first side.

Embodiment 250: A system comprising:

a plurality of rack mount systems, each rack mount system comprising:

a housing comprising a front panel, in which the front panel comprises a first circuit board or a first substrate;

at least one data processor mounted on the first circuit board or the first substrate; and at least one optical/electrical communication interface mounted on the first circuit board or the first substrate.

Embodiment 251: The system of embodiment 250 in which the at least one optical/electrical communication interface is configured to receive one or more optical signals from an external optical link, and generate one or more electrical signals based on the one or more optical signals; and the at least one data processor is configured to process the one or more electrical signals provided by the at least one optical/electrical communication interface.

Embodiment 252: A system comprising:

a housing comprising a front panel;

a first circuit board or a first substrate oriented at a first angle relative to the front panel, in which the first angle is in a range from −30° to 30°;

at least one data processor mounted on the first circuit board or the first substrate; and at least one optical/electrical communication interface mounted on the first circuit board or the first substrate.

Embodiment 253: The system of embodiment 252 in which the first angle is in a range from −5° to 5°.

Embodiment 254: The system of embodiment 252 in which the first circuit board or the first substrate is spaced apart from the front panel at a distance in a range from 0.1 to 2 inches.

Embodiment 255: The system of embodiment 252 in which each optical/electrical communication interface comprises:

a first optical connector configured to connect to an external optical link, and a photonic integrated circuit configured to generate an electrical signal based on an optical signal received from the first optical connector.

Embodiment 256: The system of embodiment 255 in which at least one of the at least one data processor and at least one of the at least one photonic integrated circuit are mounted on a same side of the first circuit board or the first substrate.

Embodiment 257: The system of embodiment 255 in which at least one of the at least one data processor is mounted on a first side of the first circuit board or the first substrate, at least one of the at least one photonic integrated circuit is mounted on a second side of the first circuit board or the first substrate, and the second side is opposite the first side.

Embodiment 258: A system comprising:

a plurality of rack mount systems, each rack mount system comprising:

a housing comprising a front panel;

a first circuit board or a first substrate oriented at a first angle relative to the front panel, in which the first angle is in a range from −30° to 30°;

at least one data processor mounted on the first circuit board or the first substrate; and at least one optical/electrical communication interface mounted on the first circuit board or the first substrate.

Embodiment 259: The system of embodiment 258 in which the at least one optical/electrical communication interface is configured to receive one or more optical signals from an external optical link, and generate one or more electrical signals based on the one or more optical signals; and the at least one data processor is configured to process the one or more electrical signals provided by the at least one optical/electrical communication interface.

Embodiment 260: A system comprising:

a first optical interconnect module comprising:

a first optical input/output port configured to at least one of (i) receive a plurality of channels of first optical signals from a first plurality of optical fibers, or (ii) transmit a plurality of channels of second optical signals to the first plurality of optical fibers;

a first photonic integrated circuit configured to at least one of (i) generate a plurality of first serial electrical signals based on the first optical signals, or (ii) generate the second optical signals based on a plurality of second serial electrical signals;

a plurality of first serializer/deserializers configured to at least one of (i) generate a plurality of sets of third parallel electrical signals based on the plurality of first serial electrical signals, and condition the electrical signals, in which each set of third parallel electrical signals is generated based on a corresponding first serial electrical signal, or (ii) generate the plurality of second serial electrical signals based on a plurality of sets of fourth parallel electrical signals, in which each second serial electrical signal is generated based on a corresponding set of fourth parallel electrical signals; and a plurality of second serializer/deserializers configured to at least one of (i) generate a plurality of fifth serial electrical signals based on the plurality of sets of third parallel electrical signals, in which each fifth serial electrical signal is generated based on a corresponding set of third parallel electrical signals, or (ii) generate the plurality of sets of fourth parallel electrical signals based on a plurality of sixth serial electrical signals, in which each set of fourth parallel electrical signal is generated based on a corresponding sixth serial signal;

a plurality of third serializer/deserializers configured to at least one of (i) generate a plurality of sets of seventh parallel electrical signals based on the plurality of fifth serial electrical signals, and condition the electrical signals, in which each set of seventh parallel electrical signals is generated based on a corresponding fifth serial electrical signal, or (ii) generate the plurality of sixth serial electrical signals based on a plurality of sets of eighth parallel electrical signals, in which each sixth serial electrical signal is generated based on a corresponding set of eighth parallel electrical signals; and a data processor configured to at least one of (i) process the plurality of sets of seventh parallel electrical signals, or (ii) output the plurality of sets of eighth parallel electrical signals.

Embodiment 261: The system of embodiment 260 in which the data processor comprises a network switch configured to switch signals transmitted in a first subset of the optical fibers to a second subset of the optical fibers.

Embodiment 262: The system of embodiment 260 in which the plurality of optical fibers comprise at least 100 optical fibers.

Embodiment 263: The system of embodiment 260 in which the plurality of optical fibers comprise at least 500 optical fibers.

Embodiment 264: The system of embodiment 260 in which the plurality of optical fibers comprise at least 1000 optical fibers.

Embodiment 265: The system of embodiment 260 in which the plurality of optical fibers are bundled in an optical cable having a cross section, for at least a portion of the cross section the optical cable has at least 4 optical fibers per square millimeter.

Embodiment 266: The system of embodiment 260 in which the plurality of optical fibers are bundled in an optical cable having a cross section, for at least a portion of the cross section the optical cable has at least 8 optical fibers per square millimeter.

Embodiment 267: The system of embodiment 260 in which the plurality of optical fibers are bundled in an optical cable having a cross section, for at least a portion of the cross section the optical cable has at least 16 optical fibers per square millimeter.

Embodiment 268: The system of embodiment 260, comprising a first circuit board (or a first substrate) and a second circuit board (or a second substrate);

wherein the first photonic integrated circuit, the first serializer/deserializers, and the second serializer/deserializers are mounted on the first circuit board or the first substrate, the third serializer/deserializers and the data processor are mounted on the second circuit board or the second substrate, and the first circuit board or the first substrate is electrically coupled to the second circuit board or the second substrate.

Embodiment 269: The system of embodiment 260 in which the plurality of third serializer/deserializers are embedded in the data processor.

Embodiment 270: The system of embodiment 260 in which the data processor comprises at least one of a network switch, a central processor unit, a graphics processor unit, a tensor processing unit, a neural network processor, an artificial intelligence accelerator, a digital signal processor, a microcontroller, or an application specific integrated circuit (ASIC).

Embodiment 271: The system of embodiment 260, comprising a second optical interconnect module comprising:

a second optical input/output port configured to at least one of (i) receive a plurality of channels of third optical signals from a second plurality of optical fibers, or (ii) transmit a plurality of channels of fourth optical signals to the second plurality of optical fibers;

a second photonic integrated circuit configured to at least one of (i) generate a plurality of ninth serial electrical signals based on the third optical signals, or (ii) generate the fourth optical signals based on a plurality of tenth serial electrical signals;

a plurality of fourth serializer/deserializers configured to at least one of (i) generate a plurality of sets of eleventh parallel electrical signals based on the plurality of ninth serial electrical signals, and condition the electrical signals, in which each set of eleventh parallel electrical signals is generated based on a corresponding ninth serial electrical signal, or (ii) generate the plurality of tenth serial electrical signals based on a plurality of sets of twelfth parallel electrical signals, in which each tenth serial electrical signal is generated based on a corresponding set of twelfth parallel electrical signals; and a plurality of fifth serializer/deserializers configured to at least one of (i) generate a plurality of thirteenth serial electrical signals based on the plurality of sets of eleventh parallel electrical signals, in which each thirteenth serial electrical signal is generated based on a corresponding set of eleventh parallel electrical signals, or (ii) generate the plurality of sets of twelfth parallel electrical signals based on a plurality of fourteenth serial electrical signals, in which each set of twelfth parallel electrical signal is generated based on a corresponding fourteenth serial signal; and a plurality of sixth serializer/deserializers configured to at least one of (i) generate a plurality of sets of fifteenth parallel electrical signals based on the plurality of thirteenth serial electrical signals, and condition the electrical signals, in which each set of fifteenth parallel electrical signals is generated based on a corresponding thirteenth serial electrical signal, or (ii) generate the plurality of fourteenth serial electrical signals based on a plurality of sets of sixteenth parallel electrical signals, in which each fourteenth serial electrical signal is generated based on a corresponding set of sixteenth parallel electrical signals;

wherein the data processor is configured to at least one of (i) process the plurality of sets of fifteenth parallel electrical signals, or (ii) output the plurality of sets of sixteenth parallel electrical signals.

Embodiment 272: An apparatus comprising:

a substrate comprising:

a first main surface and a second main surface;

a first array of electrical contacts arranged on the first main surface and having a first minimum spacing between the contacts;

a second array of electrical contacts arranged on the second main surface and having a second minimum spacing between the contacts, in which the first minimum spacing is larger than the second minimum spacing; and electrical connections between the first array of electrical contacts and the second array of electrical contacts;

a photonic integrated circuit having a first main surface and a second main surface;

a first optical connector part configured to couple light to the first main surface of the photonic integrated circuit;

an electronic integrated circuit having a first main surface that has a first portion and a second portion, in which the first portion of the first main surface is electrically coupled to the second main surface of the photonic integrated circuit, and the second portion of the first main surface is electrically coupled to the second array of electrical contacts arranged on the second main surface of the substrate.

Embodiment 273: The system of embodiment 272 in which the substrate is configured to be removably connectable to a printed circuit board.

Embodiment 274: The system of embodiment 272, further comprising a second optical connector part that is configured to couple light from an array of optical fibers to the first optical connector part.

Embodiment 275: The system of embodiment 272 in which the electronic integrated circuit comprises a first serializers/deserializers and a second serializers/deserializers;

the first serializers/deserializers has a serial communication portion that is electrically coupled to the photonic integrated circuit, the second serializers/deserializers has a serial communication portion that is electrically coupled to electrical terminals arranged on the substrate; and the first serializers/deserializers has a parallel communication portion, the second serializers/deserializers has a parallel communication portion, and the parallel communication portion of the first serializers/deserializers is electrically coupled to the parallel communication portion of the second serializers/deserializers.

Embodiment 276: The system of embodiment 272, further comprising a third serializers/deserializers that has a serial communication portion that is electrically coupled to the serial communication portion of the second serializers/deserializers.

Embodiment 277: The system of embodiment 272 in which the photonic integrated circuit is configured to receive and process optical signals provided from an external signal source, in which the optical signals are carried by at least one of continuous wave light or pulsed light.

Embodiment 278: The system of embodiment 272, further comprising a connector module configured to removably attach the substrate to a printed circuit board.

Embodiment 279: An apparatus comprising:

a printed circuit board having a first main surface and a second main surface;

a substrate comprising:

a first main surface and a second main surface;

a first array of electrical contacts arranged on the first main surface and having a first minimum spacing between the contacts;

a second array of electrical contacts arranged on the second main surface and having a second minimum spacing between the contacts, in which the first minimum spacing is larger than the second minimum spacing; and electrical connections between the first array of electrical contacts and the second array of electrical contacts;

wherein the first main surface of the substrate is configured to be removably connectable to the second main surface of the printed circuit board;

a photonic integrated circuit having a second main surface;

a first optical connector part that is optically coupled to the second main surface of the photonic integrated circuit; and an electronic integrated circuit that is electrically coupled to the second main surface of the photonic integrated circuit and the second array of electrical contacts arranged on the second main surface of the substrate.

Embodiment 280: The apparatus of embodiment 279, further comprising a second optical connector part that is optically coupled to an array of optical fibers and configured to couple light from the optical fibers to the first optical connector part.

Embodiment 281: The apparatus of embodiment 279 in which the electronic integrated circuit comprises a first serializers/deserializers and a second serializers/deserializers;

the first serializers/deserializers has a serial communication portion that is electrically coupled to the photonic integrated circuit, the second serializers/deserializers has a serial communication portion that is electrically coupled to electrical terminals arranged on the substrate; and the first serializers/deserializers has a parallel communication portion, the second serializers/deserializers has a parallel communication portion, and the parallel communication portion of the first serializers/deserializers is electrically coupled to the parallel communication portion of the second serializers/deserializers.

Embodiment 282: The apparatus of embodiment 281, further comprising a third serializers/deserializers that has a serial communication portion that is electrically coupled to the serial communication portion of the second serializers/deserializers.

Embodiment 283: The apparatus of embodiment 282, further comprising a digital application specific integrated circuit mounted on the printed circuit board, in which the third serializers/deserializers are embedded in the application specific integrated circuit, and the serial communication portion of the third serializers/deserializers is electrically coupled to the serial communication portion of the second serializers/deserializers through electrical connections on or in the printed circuit board.

Embodiment 284: The apparatus of embodiment 279 in which the photonic integrated circuit is configured to receive and process optical signals provided from an external signal source, in which the optical signals are carried by at least one of continuous wave light or pulsed light.

Embodiment 285: The apparatus of embodiment 279, further comprising a connector module configured to removably attach the substrate to a printed circuit board.

Embodiment 286: An apparatus comprising:

a plurality of serializer units;

a plurality of deserializer units; and a bus processing unit electrically coupled to the serializer units and deserializer units;

wherein the bus processing unit is configured to enable switching of the signals at the serializer units and deserializer units.

Embodiment 287: An apparatus comprising:
- a first array of serializers/deserializers configured to convert one or more first serial signals to one or more sets of parallel signals;
- a second array of serializers/deserializers configured to convert one or more sets of parallel signals to one or more second serial signals; and
- a bus processing unit electrically coupled to the first array of serializers/deserializers and the second array of serializers/deserializers, in which the bus processing unit is configured to processing the one or more sets of parallel signals, and send one or more sets of processed parallel signals to the second array of serializers/deserializers.

Embodiment 288: An apparatus comprising:
- a printed circuit board having a first main surface and a second main surface;
- a substrate comprising:
  - a first main surface and a second main surface;
  - a first array of electrical contacts arranged on the first main surface and having a first minimum spacing between the contacts;
  - a second array of electrical contacts arranged on the second main surface and having a second minimum spacing between the contacts, in which the first minimum spacing is larger than the second minimum spacing;
  - a third array of electrical contacts arranged on the first main surface;
  - first electrical connections between the first array of electrical contacts and a first subset of the second array of electrical contacts; and
  - second electrical connections between the third array of electrical contacts and a second subset of the second array of electrical contacts;
  - wherein the first main surface of the substrate is configured to be removably connectable to the second main surface of the printed circuit board;
- an electronic integrated circuit that is electrically coupled to the second array of electrical contacts arranged on the second main surface of the substrate;
- a photonic integrated circuit having a second main surface and electrical contacts arranged on the second main surface that are electrically coupled to the third array of electrical contacts arranged on the first main surface of the substrate;
- a first optical connector part that is optically coupled to the photonic integrated circuit.

Embodiment 289: The apparatus of embodiment 288 in which the first optical connector part is optically coupled to the second main surface of the photonic integrated circuit.

Embodiment 290: The apparatus of embodiment 289, further comprising a second optical connector part that is optically coupled to an array of optical fibers and configured to couple light from the optical fibers to the first optical connector part.

Embodiment 291: The apparatus of embodiment 288 in which the first optical connector part is optically coupled to the first main surface of the photonic integrated circuit.

Embodiment 292: The apparatus of embodiment 288 in which the electronic integrated circuit comprises a first serializers/deserializers and a second serializers/deserializers;
- the first serializers/deserializers comprises a serial communication portion that is electrically coupled to the photonic integrated circuit, the second serializers/deserializers comprises a serial communication portion that is electrically coupled to electrical terminals arranged on the substrate; and
- the first serializers/deserializers comprises a parallel communication portion, the second serializers/deserializers comprises a parallel communication portion, and the parallel communication portion of the first serializers/deserializers is electrically coupled to the parallel communication portion of the second serializers/deserializers.

Embodiment 293: The apparatus of embodiment 292, further comprising a third serializers/deserializers that comprises a serial communication portion that is electrically coupled to the serial communication portion of the second serializers/deserializers.

Embodiment 294: The apparatus of embodiment 288, further comprising a digital application specific integrated circuit mounted on the printed circuit board, in which the third serializers/deserializers are embedded in the application specific integrated circuit, and the serial communication portion of the third serializers/deserializers is electrically coupled to the serial communication portion of the second serializers/deserializers through electrical connections on or in the printed circuit board.

Embodiment 295: The apparatus of embodiment 288 in which the photonic integrated circuit is configured to receive and process optical signals provided from an external signal source, in which the optical signals are carried by at least one of continuous wave light or pulsed light.

Embodiment 296: The apparatus of embodiment 288, further comprising a connector module configured to removably attach the substrate to a printed circuit board.

Embodiment 297: The apparatus of embodiment 288, further comprising control circuitry configured to control the photonic integrated circuit.

Embodiment 298: A datacenter network switching system that comprises the apparatus or system of any of embodiments 1 to 297, 352*a* to 358a, 352b to 393.

Embodiment 299: A supercomputer that comprises the apparatus or system of any of embodiments 1 to 297, 352*a* to 358a, 352b to 393.

Embodiment 300: An autonomous vehicle that comprises the apparatus or system of any of embodiments 1 to 297, 352a to 358a, 352b to 393.

Embodiment 301: The autonomous vehicle of embodiment 300 in which the vehicle comprises at least one of a car, a truck, a train, a boat, a ship, a submarine, a helicopter, a drone, an airplane, a space rover, or a space ship.

Embodiment 302: A robot that comprises the apparatus or system of any of embodiments 1 to 297, 352a to 358a, 352b to 393.

Embodiment 303: The robot of embodiment 302 in which the robot comprises at least one of an industrial robot, a helper robot, a medical surgery robot, a merchandise delivery robot, a teaching robot, a cleaning robot, a cooking robot, a construction robot, or an entertainment robot.

Embodiment 304: A method comprising:
- receiving a plurality of channels of first optical signals from a plurality of optical fibers;
- generating a plurality of first serial electrical signals based on the received optical signals, in which each first serial electrical signal is generated based on one of the channels of first optical signals;
- generating a plurality of sets of first parallel electrical signals based on the plurality of first serial electrical signals, and conditioning the electrical signals, in which each set of first parallel electrical signals is generated based on a corresponding first serial electrical signal; and generating a plurality of second serial electrical signals based on the plurality of sets of first parallel electrical signals, in which each second serial electrical signal is generated based on a corresponding set of first parallel electrical signals.

Embodiment 305: The method of embodiment 304, comprising:

generating a plurality of sets of second parallel electrical signals based on the plurality of second serial electrical signals, in which each set of second parallel electrical signals is generated based on a corresponding second serial electrical signal; and processing the plurality of sets of second parallel electrical signals, in which the processing comprises at least one of switching data packets, processing graphics data, processing image data, processing video data, processing audio data, performing mathematical computations, performing tensor calculations, performing matrix calculations, performing simulations, performing neural network processing, processing data based on artificial intelligence algorithms, processing digital signals, or processing control signals.

Embodiment 306: The method of embodiment 304, comprising performing signal conditioning on the electrical signals, the signal conditioning comprising at least one of (i) clock and data recovery, or (ii) signal equalization.

Embodiment 307: The method of embodiment 304, comprising processing the first parallel electrical signals prior to generating the second serial electrical signals, the processing comprising at least one of switching of data, re-shuffling data, or coding of data.

Embodiment 308: The method of embodiment 307, in which the first serial electrical signals comprise N lanes of $T\times N/(N-k)$ Gbps electrical signals, N and k are positive integers, and T is a real value;

the second serial electrical signals comprise N lanes of T Gbps electrical signals; and the method comprises mapping N-k out of the N lanes of $T\times N/(N-k)$ Gbps electrical signals in the first serial signals to the N lanes of T Gbps electrical signals in the second serial signals.

Embodiment 309: The method of embodiment 307, in which the first serial signals comprise N lanes of $T\times N/(N-k)$ Gbps electrical signals, N and k are positive integers, and T is a real value;

the second serial signals comprise N/M lanes of $M\times T$ Gbps electrical signals, M is different from N; and the method comprises mapping N-k out of the N lanes of $T\times N/(N-k)$ Gbps electrical signals in the first serial signals to the N/M lanes of $M\times T$ Gbps electrical signals in the second serial signals.

Embodiment 310: The method of embodiment 304 in which generating the plurality of first serial electrical signals comprises generating N serial electrical signals, and generating the plurality of second serial electrical signals comprises generating M serial electrical signals based on the plurality of sets of first parallel electrical signals, M and N are positive integers, and M is different from N.

Embodiment 311: The method of embodiment 310 in which generating the plurality of first serial electrical signals comprises generating N lanes of P Gbps serial electrical signals, and generating the plurality of second serial electrical signals comprises generating N/Q lanes of P*Q Gbps serial electrical signals, and P and Q are positive numbers.

Embodiment 312: The method of embodiment 304 in which the first serial electrical signals are modulated according to a first modulation protocol, and the second serial electrical signals are modulated according to a second modulation protocol that is different from the first modulation protocol.

Embodiment 313: The method of embodiment 304, further comprising:

receiving a plurality of third serial electrical signals;

generating a plurality of sets of third parallel electrical signals based on the plurality of third serial electrical signals, in which each set of third parallel electrical signal is generated based on a corresponding third serial electrical signal;

generating a plurality of fourth serial electrical signals based on the plurality of sets of third parallel signals, in which each fourth serial electrical signal is generated based on a corresponding set of fourth parallel electrical signal;

generating a plurality of channels of second optical signals based on the plurality of fourth serial electrical signals; and outputting the plurality of channels of second optical signals.

Embodiment 314: The method of embodiment 313, comprising:

at least one of a network switch, a central processor unit, a graphics processor unit, a tensor processing unit, a neural network processor, an artificial intelligence accelerator, a digital signal processor, a microcontroller, or an application specific integrated circuit (ASIC), generating a plurality of sets of fourth parallel electrical signals; and generating the third serial electrical signals based on the sets of fourth parallel electrical signals.

Embodiment 315: The method of embodiment 314 in which generating the third serial electrical signals comprises generating M serial electrical signals based on the sets of fourth parallel electrical signals; and generating a plurality of fourth serial electrical signals comprises generating N serial electrical signals based on the sets of third parallel signals, M and N are positive integers, and N is different from M.

Embodiment 316: The method of embodiment 315 in which generating the third serial electrical signals comprises generating N/Q lanes of P*Q Gbps serial electrical signals; and generating a plurality of fourth serial electrical signals comprises generating N lanes of P Gbps serial electrical signals, and P and Q are positive numbers.

Embodiment 317: The method of embodiment 313 in which the third serial electrical signals are modulated according to a first modulation protocol, and the fourth serial electrical signals are modulated according to a second modulation protocol that is different from the first modulation protocol.

Embodiment 318: The method of embodiment 313, comprising performing signal conditioning on the electrical signals, the signal conditioning comprising at least one of (i) clock and data recovery, or (ii) signal equalization.

Embodiment 319: The method of embodiment 313, comprising aligning multiple serial signals.

Embodiment 320: The method of embodiment 313, comprising after generating the sets of third parallel electrical signals and prior to generating the fourth serial electrical signals, processing the electrical signals, in which the processing comprises performing at least one of switching of data, re-shuffling data, or coding of data.

Embodiment 321: The method of embodiment 304 in which receiving a plurality of channels of first optical signals comprises receiving at least 2 channels of optical signals.

Embodiment 322: The method of embodiment 321 in which generating a plurality of first serial electrical signals comprises processing the at least 2 channels of optical signals and generating at least 2 first serial electrical signals.

Embodiment 323: The method of embodiment 322 in which generating a plurality of sets of first parallel electrical signals comprises converting the at least 2 first serial electrical signals into at least 2 sets of parallel electrical signals, and each set of parallel electrical signals comprises at least two parallel electrical signals.

Embodiment 324: The method of embodiment 323 in which each set of parallel electrical signals comprises at least four parallel electrical signals.

Embodiment 325: The method of embodiment 324 in which each set of parallel electrical signals comprises at least eight parallel electrical signals.

Embodiment 326: The method of embodiment 325 in which each set of parallel electrical signals comprises at least 32 parallel electrical signals.

Embodiment 327: The method of embodiment 326 in which each set of parallel electrical signals comprises at least 64 parallel electrical signals.

Embodiment 328: The method of embodiment 304 in which receiving a plurality of channels of first optical signals comprises receiving at least 4 channels of optical signals.

Embodiment 329: The method of embodiment 304 in which receiving a plurality of channels of first optical signals comprises receiving at least 8 channels of optical signals.

Embodiment 330: The method of embodiment 304 in which receiving a plurality of channels of first optical signals comprises receiving at least 16 channels of optical signals.

Embodiment 331: The method of embodiment 304 in which receiving a plurality of channels of first optical signals comprises receiving at least 32 channels of optical signals.

Embodiment 332: The method of embodiment 304 in which receiving a plurality of channels of first optical signals comprises receiving at least 64 channels of optical signals.

Embodiment 333: The method of embodiment 304 in which receiving a plurality of channels of first optical signals comprises receiving at least 100 channels of optical signals.

Embodiment 334: The method of embodiment 333 in which generating a plurality of first serial electrical signals comprises processing the at least 100 channels of optical signals and generating at least 100 first serial electrical signals.

Embodiment 335: The method of embodiment 334 in which generating a plurality of sets of first parallel electrical signals comprises converting the at least 100 first serial electrical signals into at least 100 sets of parallel electrical signals, and each set of parallel electrical signals comprises at least two parallel electrical signals.

Embodiment 336: The method of embodiment 335 in which each set of parallel electrical signals comprises at least four parallel electrical signals.

Embodiment 337: The method of embodiment 336 in which each set of parallel electrical signals comprises at least eight parallel electrical signals.

Embodiment 338: The method of embodiment 337 in which each set of parallel electrical signals comprises at least 32 parallel electrical signals.

Embodiment 339: The method of embodiment 338 in which each set of parallel electrical signals comprises at least 64 parallel electrical signals.

Embodiment 340: The method of embodiment 333 in which generating a plurality of first serial electrical signals comprises processing at least 500 channels of optical signals and generating at least 500 first serial electrical signals.

Embodiment 341: The method of embodiment 340 in which generating a plurality of sets of first parallel electrical signals comprises converting the at least 500 first serial electrical signals into at least 500 sets of parallel electrical signals, and each set of parallel electrical signals comprises at least two parallel electrical signals.

Embodiment 342: The method of embodiment 340 in which generating a plurality of first serial electrical signals comprises processing at least 1000 channels of optical signals and generating at least 1000 first serial electrical signals.

Embodiment 343: The method of embodiment 342 in which generating a plurality of sets of first parallel electrical signals comprises converting the at least 1000 first serial electrical signals into at least 1000 sets of parallel electrical signals, and each set of parallel electrical signals comprises at least two parallel electrical signals.

Embodiment 344: The method of embodiment 304 in which the first optical signals have a total bit rate of at least 1 Tbps.

Embodiment 345: The method of embodiment 304 in which the first optical signals have a total bit rate of at least 10 Tbps.

Embodiment 346: The method of embodiment 304, comprising receiving a plurality of third serial electrical signals; and generating a plurality of sets of second parallel electrical signals, generating a plurality of fourth serial electrical signals based on the plurality of sets of second parallel electrical signals, and generating second optical signals based on the plurality of fourth serial electrical signals.

Embodiment 347: The method of embodiment 346, comprising aligning multiple serial output signals.

Embodiment 348: A method comprising:

operating an autonomous vehicle, comprising performing the method of any of embodiments 304 to 347.

Embodiment 349: The method of embodiment 348 in which the vehicle comprises at least one of a car, a truck, a train, a boat, a ship, a submarine, a helicopter, a drone, an airplane, a space rover, or a space ship.

Embodiment 350: A method comprising:

operating a robot, comprising performing the method of any of embodiments 304 to 347.

Embodiment 351: The method of embodiment 350 in which the robot comprises at least one of an industrial robot, a helper robot, a medical surgery robot, a merchandise delivery robot, a teaching robot, a cleaning robot, a cooking robot, a construction robot, or an entertainment robot.

Embodiment 352a: The apparatus of embodiment 1, wherein the optical interconnect module is located on a first side of a printed circuit board.

Embodiment 353a: The apparatus of embodiment 352a, wherein another optical interconnect module is located on a second side of the printed circuit board Embodiment 354a: The apparatus of embodiment 352a, wherein the printed circuit board is located approximate to a front panel of an enclosure.

Embodiment 355a: The apparatus of embodiment 352a, wherein the printed circuit board is located approximate to a rear panel of an enclosure.

Embodiment 356a: The apparatus of embodiment 352a, wherein the printed circuit board includes an electrical connector.

Embodiment 357a: The apparatus of embodiment 356a, wherein the electrical connector connects to another electrical connector of another printed circuit board.

Embodiment 358a: The apparatus of embodiment 356a, wherein the electrical connector connects to another electrical connector of a line card.

Embodiment 352b: An apparatus comprising:

at least one of a circuit board or a substrate; and a first structure attached to the at least one of a circuit board or a substrate, in which the first structure is configured to enable an optical module with connector to be removably coupled to the first structure, and the optical module with connector is configured to enable an optical fiber connector to be removably coupled to the optical module with connector.

Embodiment 353b: The apparatus of embodiment 352b in which the circuit board or the substrate comprises first electrical contacts, the first structure comprises walls that define a first opening, the walls also define one or more retaining mechanisms such that when the optical module with connector is inserted into the first opening, the one or more retaining mechanisms on the walls of the first structure engage one or more latch mechanisms on the optical module with connector to secure the optical module with connector to the first structure, and second electrical contacts on the optical module with connector are electrically coupled to the first electrical contacts on the circuit board or the substrate.

Embodiment 354b: The apparatus of embodiment 353b, comprising at least one optical module with connector, in which the optical module with connector comprises an optical module and a mechanical connector structure, the mechanical connector structure is configured to removably couple the optical module to the circuit board or the substrate to enable electrical signals output from the optical module to be transmitted to the first electrical contacts of the circuit board or the substrate.

Embodiment 355b: The apparatus of embodiment 354b in which the mechanical connector structure is configured to receive the optical fiber connector to enable light signals from the optical fiber connector to be transmitted to the optical module.

Embodiment 356b: The apparatus of embodiment 355b, comprising the optical fiber connector, in which the optical fiber connector is optically coupled to a fiber cable comprising a plurality of optical fibers, and the optical fiber connector is configured to transmit optical signals carried in the optical fibers to the optical module.

Embodiment 356c: The apparatus of any of the embodiments 352b to 356b in which the circuit board or the substrate comprises an array of first electrical contacts comprising at least four rows and four columns of electrical contacts, the optical module comprises an array of second electrical contacts comprising at least four rows and four columns of electrical contacts, and the first structure is configured to enable the array of second electrical contacts of the optical module to be electrically coupled to the array of first electrical contacts of the circuit board or the substrate when the optical module with connector is coupled to the first structure.

Embodiment 357b: The apparatus of any of the embodiments 352b to 356c in which the first structure comprises a grid structure that defines multiple openings, and each opening is configured to receive a corresponding optical module with connector.

Embodiment 358b: The apparatus of embodiment 357b in which the grid structure is configured such that when the optical module with connectors are inserted into the openings of the grid structure, the optical module with connectors are oriented such that each optical module with connector is rotated 90 degrees relative to at least one adjacent optical module with connector, and the rotational axis is perpendicular to the circuit board or the substrate.

Embodiment 359: The apparatus of any of embodiments 352b to 358b in which the first structure is configured to enable the optical module with connectors to be mounted on the first structure in a 90-degree rotate checkerboard fashion.

Embodiment 360: The apparatus of any of embodiment 352b to 359 in which the first structure is configured to function as a heat spreader.

Embodiment 361a: The apparatus of any of embodiments 352b to 360 in which each of the at least one of the circuit board or substrate comprises a first side and a second side, the first structure is attached to the first side of the circuit board or the substrate, an application specific integrated circuit is mounted on the second side of the circuit board or the substrate, the first structure has an opening, in which the opening is located opposite the application specific integrated circuit relative to the circuit board or the substrate, discrete circuit components are mounted on the first side of the circuit board or the substrate, and the discrete circuit components extend from the circuit board or the substrate into the opening in the structure.

Embodiment 361b: The apparatus of embodiment 361a, comprising the circuit board and the substrate, in which the first structure is attached to the first side of the circuit board, an application specific integrated circuit is mounted on the second side of the substrate, the first structure has an opening, the opening is located opposite the application specific integrated circuit relative to the substrate, discrete circuit components are mounted on the first side of the substrate, and the discrete circuit components extend from the substrate into the opening in the structure.

Embodiment 362: The apparatus of embodiment 361a or 361b in which the discrete circuit components comprise at least one of one or more voltage regulators, one or more filters, or one or more capacitors.

Embodiment 363: The apparatus of any of embodiments 352b to 362 in which the circuit board or the substrate comprises a first side and a second side, the first structure is attached to the first side of the circuit board or the substrate, a second structure is attached to the second side of the circuit board or the substrate, and the first structure is mechanically and thermally attached to the second structure.

Embodiment 364: The apparatus of embodiment 363 in which the first structure is attached to the second structure by screws that pass through the printed circuit board or the substrate.

Embodiment 365: The apparatus of embodiment 363 or 364 in which the first structure is attached to the second structure by thermal vias.

Embodiment 366: The apparatus of any of embodiments 363 to 365, comprising a heat sink attached to at least one of the first structure or the second structure.

Embodiment 367: The apparatus of any of embodiments 352b to 366, comprising a snap-in mechanism that is configured to secure the optical module with connector when the optical module with connector is inserted into the first structure.

Embodiment 368: The apparatus of embodiment 367 in which the snap-in mechanism is configured to enable the optical module with connector to be pulled away from the first structure when a force above a threshold is applied to the optical module with connector.

Embodiment 369: The apparatus of embodiment 367 or 368 in which the snap-in mechanism comprises one or more grooves formed on walls of the first structure, the optical module with connector comprises one or more elastic wings, each elastic wing comprises a tongue that is configured to engage a corresponding groove when the optical module with connector is inserted into the first structure.

Embodiment 370: The apparatus of any of embodiments 367 to 369 in which the snap-in mechanism comprises a lever-based latch mechanism, the latch mechanism is movable between a first position and a second position, the latch mechanism engages a support structure on the first structure when in the first position and disengages from the support structure when in the second position, the optical module with connector is secured to the first structure when the latch mechanism is in the first position and released from the first structure when the latch mechanism is in the second position.

Embodiment 371: The apparatus of embodiment 370 in which a lever is provided as part of the optical module with connector, the lever is movable between a first position and a second position, the lever is configured such that moving the lever to the first position causes the latch mechanism to move to the first position, and moving the lever to the second position causes the latch mechanism to move to the second position.

Embodiment 372: The apparatus of embodiment 370 or 371 in which a lever is provided as part of a tool used to insert or remove the optical module with connector into or from the first structure.

Embodiment 373: The apparatus of any of embodiments 352b to 372 in which the optical module with connector comprises a co-packaged optical module.

Embodiment 374: The apparatus of any of embodiments 352b to 373, comprising the optical module with connector, in which the optical module with connector comprises a snap-in mechanism configured such that the optical fiber connector locks in place the snap-in mechanism when the optical fiber connector is coupled to the optical module with connector.

Embodiment 375: The apparatus of embodiment 374 in which the optical module with connector comprises a mechanical connector structure, the optical fiber connector snaps into a part of the mechanical connector structure to hold the optical fiber connector in place when the optical fiber connector is coupled to the optical module with connector.

Embodiment 376: The apparatus of embodiment 374 or 375, comprising the optical fiber connector, in which the optical fiber connector and the optical module with connector comprise a ball-detent mechanism configured to hold the optical fiber connector in place when the optical fiber connector is coupled to the optical module with connector.

Embodiment 377: An apparatus comprising:

an optical module with connector configured to be removably coupled to a first structure that is attached to a circuit board or a substrate, in which the optical module comprises a photonic integrated circuit, the optical module with connector is configured to hold the photonic integrated circuit in place when the optical module with connector is coupled to the first structure and to enable electronic signals from the photonic integrated circuit to be transmitted to the circuit board or the substrate;

wherein the optical module with connector is configured to enable an optical fiber connector to be removably coupled to the optical module with connector, in which the optical module with connector is configured to enable optical signals from the optical fiber connector to be transmitted to the photonic integrated circuit.

Embodiment 378: The apparatus of embodiment 377 in which the optical module with connector comprises the photonic integrated circuit of any of embodiments 1 to 297.

Embodiment 379: The apparatus of embodiment 378 in which the optical module with connector comprises at least one of the serializers/deserializers module, the serializer unit, or the deserializer unit of any of embodiments 1 to 297.

Embodiment 380a: The apparatus of embodiment 379, comprising at least one of a network switch, a central processor unit, a graphics processor unit, a tensor processing unit, a neural network processor, an artificial intelligence accelerator, a digital signal processor, a microcontroller, or an application specific integrated circuit (ASIC) that is configured to process signals provided by the at least one of the serializers/deserializers module, the serializer unit, or the deserializer unit.

Embodiment 380b: The apparatus of embodiment 379, comprising at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is coupled to the circuit board or the substrate and configured to process electrical signal received from or transmitted to the photonic integrated circuit.

Embodiment 381: The apparatus of any of embodiments 379 to 380b, comprising the bus processing module of any of embodiments 6 to 287.

Embodiment 382: The apparatus of any of embodiments 377 to 381, comprising the first structure and at least one of the circuit board or the substrate, in which the circuit board or the substrate is attached to a first side of the first structure, and the optical module with connector is configured to be removable coupled to the first structure from the second side of the first structure, and the second side of the first structure is opposite to the first side of the first structure.

Embodiment 383a: The apparatus of embodiment 382, comprising two or more optical module with connectors that are removably coupled to the first structure in a 90-degree rotate checkerboard fashion.

Embodiment 383b: The apparatus of embodiment 382 or 383a, comprising the circuit board and the substrate, in which the circuit board is attached to a first side of the first structure, the substrate is attached to the circuit board, and the optical module with connector is configured to hold the photonic integrated circuit in place when the optical module with connector is coupled to the first structure and to enable electronic signals from the photonic integrated circuit to be transmitted to the substrate.

Embodiment 384: The apparatus of any of embodiments 377 to 383 in which the first structure comprises a grid structure that enables two or more optical module with connectors to be removably coupled to the first structure in an array defined by the grid structure.

Embodiment 385: A system comprising:

a housing; and the apparatus of any of embodiments 352b to 384, in which the optical module with connector is configured to be removably coupled to, partially through, or through a front panel of the housing.

Embodiment 386: The system of embodiment 385 in which the first structure is part of the front panel of the housing.

Embodiment 387: The system of embodiment 385 or 386 in which the circuit board is part of the front panel of the housing.

Embodiment 388: The system of embodiment 385 in which the first structure is positioned near and spaced apart from the front panel of the housing.

Embodiment 389: The system of embodiment 388 in which the first structure has an overall structure that extends along a plane that is substantially parallel to the front panel of the housing.

Embodiment 390: The system of embodiment 388 or 389 in which the circuit board is substantially parallel to the front panel of the housing.

Embodiment 391: The system of any of embodiments 385 to 390 in which the optical module with connector is configured to enable the second optical connector of any of embodiments 33 to 59, 64 to 68, 72 to 74, 118 to 144, 149 to 153, 157 to 159, 201 to 205, 236 to 245, 274, 280, or 290 to be removably coupled to the optical module with connector.

Embodiment 392: The system of any of embodiments 206 to 278, comprising a first structure coupled to the circuit board or a substrate, the first structure configured to enable an optical module comprising the photonic integrated circuit to be removably coupled to the first structure, the first structure is configured such that when the optical module is coupled to the first structure, the photonic integrated circuit is held in place to enable electrical signals from the photonic integrated circuit to be transmitted to the circuit board or the substrate.

Embodiment 393: The system of embodiment 392 in which the first structure is configured such that when the optical module is coupled to the first structure, the photonic integrated circuit is held in place to enable electrical signals from the photonic integrated circuit to be transmitted to at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) mounted on the circuit board or the substrate.

Embodiment 394: A method comprising:

removably coupling an optical fiber connector to an optical module with connector;

removably coupling the optical module with connector to a first structure attached to at least one of a circuit board or a substrate; and electrically coupling the optical module with connector to the circuit board or the substrate.

Embodiment 395: The method of embodiment 394, comprising:

inserting the optical module with connector through a first opening defined by walls of the first structure;

using one or more retaining mechanisms on the walls of the first structure to engage one or more latch mechanisms on the optical module with connector to secure the optical module with connector to the first structure; and electrically coupling first electrical contacts on the circuit board or the substrate to second electrical contacts on the optical module with connector.

Embodiment 396: The method of embodiment 394 or 395, comprising:

transmitting optical signals from the optical fiber connector to the optical module with connector;

at the optical module with connector, generating electrical signals based on the optical signals; and transmitting the electrical signals from the optical module with connector to the circuit board or the substrate.

Embodiment 397: The method of any of embodiments 394 to 396 in which the circuit board or the substrate comprises an array of first electrical contacts comprising at least four rows and four columns of electrical contacts, the optical module with connector comprises an array of second electrical contacts comprising at least four rows and four columns of electrical contacts, and electrically coupling the optical module with connector to the circuit board or the substrate comprises electrically coupling the array of second electrical contacts of the optical module with connector to the array of first electrical contacts of the circuit board or the substrate.

Embodiment 398: The method of any of embodiments 394 to 397 in which the first structure comprises a grid structure that defines multiple first openings, and the method comprises:

removably coupling a plurality of optical modules with connectors to the grid structure, including inserting each optical module with connector through a corresponding first opening defined by the walls of the grid structure;

for each of the plurality of optical modules with connectors, using one or more retaining mechanisms on the walls of the grid structure to engage one or more latch mechanisms on the optical module with connector to secure the optical module with connector to the grid structure; and for each of the plurality of optical modules with connectors, electrically coupling second electrical contacts on the optical module with connector to corresponding first electrical contacts on the circuit board or the substrate.

Embodiment 399: The method of embodiment 398, comprising orienting the optical modules with connectors such that each optical module with connector is rotated 90 degrees relative to at least one adjacent optical module with connector, and the rotational axis is perpendicular to the circuit board or the substrate.

Embodiment 400: The method of any of embodiments 394 to 399, comprising removably coupling a plurality of optical modules with connectors to the first structure; and orienting the optical modules with connectors coupled to the first structure in a 90-degree rotate checkerboard fashion.

Embodiment 401: The method of any of embodiments 394 to 400 in which removably coupling the optical module with connector to the first structure comprises securing, using a snap-in mechanism, the optical module with connector to the first structure.

Embodiment 402: The method of embodiment 401, comprising applying a force above a threshold to the optical module with connector to disengage the snap-in mechanism, and pulling the optical module with connector away from the first structure.

Embodiment 403: The method of embodiment 401 or 402 in which the snap-in mechanism comprises one or more grooves formed on walls of the first structure, the optical module with connector comprises one or more elastic wings, and each elastic wing comprises a tongue;

wherein the method comprises engaging the tongue of the elastic wing with a corresponding groove formed on walls of the first structure when inserting the optical module with connector into an opening defined by the walls of the first structure.

Embodiment 404: The method of embodiment 403 in which the snap-in mechanism comprises a lever-based latch mechanism, the latch mechanism is movable between a first position and a second position, the latch mechanism engages a support structure on the first structure when in the first position and disengages from the support structure when in the second position, wherein the method comprises placing the latch mechanism in the first position to secure the optical module with connector to the first structure; and placing the latch mechanism in the second position to release the optical module with connector from the first structure.

Embodiment 405: The method of embodiment 404 in which a lever is provided as part of the optical module with connector, wherein the method comprises:

moving the lever to a first position to cause the latch mechanism to move to the first position, and moving the lever to a second position causes the latch mechanism to move to the second position.

Embodiment 406: The method of any of embodiments 394 to 405 in which the optical module with connector comprises a co-packaged optical module.

Embodiment 407: A method comprising:

attaching a first structure to a first side of a circuit board or a substrate;

mounting an application specific integrated circuit on a second side of the circuit board or the substrate, in which the first structure has an opening located opposite the application specific integrated circuit relative to the circuit board or the substrate; and mounting discrete circuit components on the first side of the circuit board or the substrate, in which the discrete circuit components extend from the circuit board or the substrate into the opening in the structure.

Embodiment 408: The method of embodiment 407, comprising:

attaching the first structure to the first side of the circuit board;

mounting the application specific integrated circuit on the second side of the substrate; and mounting discrete circuit components on the first side of the substrate, in which the discrete circuit components extend from the substrate into the opening in the structure.

Embodiment 409: The method of embodiment 407 or 408 in which the discrete circuit components comprise at least one of one or more voltage regulators, one or more filters, or one or more capacitors.

Embodiment 410: The method of any of embodiments 407 to 409, comprising attaching a second structure to a second side of the circuit board or the substrate, and mechanically and thermally coupling the first structure to the second structure.

Embodiment 411: The method of embodiment 410, comprising attaching the first structure to the second structure using screws that pass through the circuit board or the substrate.

Embodiment 412: The method of embodiment 410 or 411, comprising attaching the first structure to the second structure using thermal vias.

Embodiment 413: The method of any of embodiments 410 to 412, comprising attaching a heat sink to at least one of the first structure or the second structure.

Embodiment 414: An apparatus comprising:

at least one of a circuit board or a substrate;

a data processor unit mounted on a first side of the circuit board or the substrate; and a first structure attached to a second side of the circuit board or the substrate, in which the second side of the circuit board or the substrate comprises a two-dimensional arrangement of second electrical contacts, the first structure is configured to enable an optical module with a two-dimensional arrangement of first electrical contacts to be removably coupled to the first structure and enable the optical module to be electrically coupled to the circuit board or the substrate through the two-dimensional arrangement of first electrical contacts and the two-dimensional arrangement of second electrical contacts.

Embodiment 415: The apparatus of embodiment 414 wherein the optical module comprises a connector configured to enable an optical fiber connector to be removably coupled to the optical module.

Embodiment 416: The apparatus of embodiment 414 or 415 wherein the data processor unit comprises at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is configured to process electrical signals received from or transmitted to the optical module.

Embodiment 417: The apparatus of any of embodiments 414 to 416 in which the data processor unit comprises at least one of (i) a bare die processor that is mounted on the first side of the circuit board or the substrate, or (ii) a packaged processor that includes a package substrate that is mounted on the first side of the circuit board or the substrate.

Embodiment 418: The apparatus of any of embodiments 414 to 417 in which the first structure comprises walls that define a first opening, the walls also define one or more retaining mechanisms such that when the optical module is inserted into the first opening, the one or more retaining mechanisms on the walls of the first structure engage one or more latch mechanisms on the optical module to secure the optical module to the first structure, and the first electrical contacts on the optical module are electrically coupled to the second electrical contacts on the circuit board or the substrate.

Embodiment 419: The apparatus of embodiment 418, comprising at least one optical module, in which the optical module comprises a mechanical connector structure configured to removably couple the optical module to the circuit board or the substrate to enable electrical signals to be transmitted between the optical module and the second electrical contacts of the circuit board or the substrate.

Embodiment 420: The apparatus of embodiment 419 in which the optical module comprises a connector configured to enable an optical fiber connector to be removably coupled to the optical module, and the mechanical connector structure is configured to receive the optical fiber connector to enable light signals from the optical fiber connector to be transmitted to the optical module.

Embodiment 421: The apparatus of embodiment 420, comprising the optical fiber connector, in which the optical fiber connector is optically coupled to a fiber cable comprising a plurality of optical fibers, and the optical fiber connector is configured to transmit optical signals carried in the optical fibers to the optical module.

Embodiment 422: The apparatus of embodiment 421 wherein the optical module comprises a photonic integrated circuit comprising a two-dimensional array of optical coupling elements, and the optical fiber connector is configured to couple a two-dimensional array of optical fibers to the two-dimensional array of optical coupling elements on the photonic integrated circuit.

Embodiment 423: The apparatus of embodiment 422 wherein the two-dimension array of optical fibers comprise at least a 3×12 array of optical fibers.

Embodiment 424: The apparatus of any of embodiments 414 to 423 in which the arrangement of second electrical contacts of the circuit board or the substrate comprises at least four rows and four columns of second electrical contacts, the arrangement of first electrical contacts of the optical module comprises at least four rows and four columns of first electrical contacts, and the first structure is configured to enable the at least four rows and four columns of first electrical contacts of the optical module to be electrically coupled to the at least four rows and four columns of second electrical contacts of the circuit board or the substrate when the optical module is coupled to the first structure.

Embodiment 425: The apparatus of any of embodiments 414 to 424 in which the first structure comprises a grid structure that defines multiple openings, and each opening is configured to receive a corresponding optical module.

Embodiment 426: The apparatus of embodiment 425 in which the grid structure is configured such that when the optical modules are inserted into the openings of the grid structure, the optical modules are oriented such that each optical module is rotated 90 degrees relative to at least one adjacent optical module, and the rotational axis is perpendicular to the circuit board or the substrate.

Embodiment 427: The apparatus of any of embodiments 414 to 426 in which the first structure is configured to enable the optical modules to be mounted on the first structure in a 90-degree rotate checkerboard fashion.

Embodiment 428: The apparatus of any of embodiments 414 to 427 in which the first structure is configured to function as a heat spreader.

Embodiment 429: The apparatus of any of embodiments 414 to 428 in which the first structure has an opening located opposite the data processor unit relative to the circuit board or the substrate, discrete circuit components are mounted on the second side of the circuit board or the substrate, and the discrete circuit components extend from the circuit board or the substrate into the opening in the first structure.

Embodiment 430: The apparatus of embodiment 429, comprising the circuit board and the substrate, in which the first structure is attached to the second side of the circuit board, the data processor unit is mounted on the first side of the substrate, the opening in the first structure is located opposite the data processor unit relative to the substrate, discrete circuit components are mounted on the second side of the substrate, and the discrete circuit components extend from the substrate into the opening in the structure.

Embodiment 431: The apparatus of embodiment 429 or 430 in which the discrete circuit components comprise at least one of one or more voltage regulators, one or more filters, or one or more capacitors.

Embodiment 432: The apparatus of any of embodiments 414 to 431 in which a second structure is attached to a first side of the circuit board or the substrate, and the first structure is mechanically and thermally attached to the second structure.

Embodiment 433: The apparatus of embodiment 432 in which the first structure is attached to the second structure by screws that pass through the printed circuit board or the substrate.

Embodiment 434: The apparatus of embodiment 432 or 433 in which the first structure is attached to the second structure by thermal vias.

Embodiment 435: The apparatus of any of embodiments 432 to 434, comprising a heat sink attached to at least one of the first structure or the second structure.

Embodiment 436: The apparatus of any of embodiments 414 to 435, comprising a snap-in mechanism that is configured to secure the optical module when the optical module is inserted into the first structure.

Embodiment 437: The apparatus of embodiment 436 in which the snap-in mechanism is configured to enable the optical module to be pulled away from the first structure when a force above a threshold is applied to the optical module.

Embodiment 438: The apparatus of embodiment 436 or 437 in which the snap-in mechanism comprises one or more grooves formed on walls of the first structure, the optical module comprises one or more elastic wings, and each elastic wing comprises a tongue that is configured to engage a corresponding groove when the optical module is inserted into the first structure.

Embodiment 439: The apparatus of any of embodiments 436 to 438 in which the snap-in mechanism comprises a lever-based latch mechanism, the latch mechanism is movable between a first position and a second position, the latch mechanism engages a support structure on the first structure when in the first position and disengages from the support structure when in the second position, the optical module is secured to the first structure when the latch mechanism is in the first position and released from the first structure when the latch mechanism is in the second position.

Embodiment 440: The apparatus of any of embodiments 436 to 439 in which a lever is provided as part of the optical module, the lever is movable between a first position and a second position, the lever is configured such that moving the lever to the first position causes the latch mechanism to move to the first position, and moving the lever to the second position causes the latch mechanism to move to the second position.

Embodiment 441: The apparatus of any of embodiments 436 to 440 in which a lever is provided as part of a tool used to insert or remove the optical module into or from the first structure.

Embodiment 442: The apparatus of any of embodiments 414 to 441 in which the optical module comprises a co-packaged optical module.

Embodiment 443: The apparatus of embodiment 373 or 442 in which the co-packaged optical module comprises:

a photonic integrated circuit configured to perform at least one of converting first optical signals to first electrical signals or converting second electrical signals to second optical signals;

the two-dimensional arrangement of first electrical contacts, wherein the two-dimensional arrangement of first electrical contacts are configured to at least one of (i) enable the first electrical signals to be transmitted from the photonic integrated circuit to the circuit board or the substrate, or (ii) enable the second electrical signals to be transmitted from the circuit board or the substrate to the photonic integrated circuit; and an optical fiber connector part configured to be optically coupled to an array of optical fibers, wherein the optical fiber connector part is configured to at least one of (i) receive the first optical signals from the array of optical fibers and transmit the first optical signals to the photonic integrated circuit, or (ii) receive the second optical signals from the photonic integrated circuit and transmit the second optical signals to the array of optical fibers.

Embodiment 444: The apparatus of any of embodiments 373, 442, and 443 in which the co-packaged optical module comprises at least one of:

micro-optics assembly facilitating fiber-to-photonic integrated circuit coupling, one or more driver amplifiers, one or more trans-impedance amplifiers, one or more SerDes integrated circuits, one or more digital signal processors, one or more lasers or light emitting diodes, or one or more microcontrollers.

Embodiment 445: The apparatus of any of embodiments 414 to 444, comprising the optical module, in which the optical module comprises a snap-in mechanism configured such that the optical fiber connector locks in place the snap-in mechanism when the optical fiber connector is coupled to the optical module.

Embodiment 446: The apparatus of embodiment 445 in which the optical module comprises a mechanical connector structure, the optical fiber connector snaps into a part of the mechanical connector structure to hold the optical fiber connector in place when the optical fiber connector is coupled to the optical module.

Embodiment 447: The apparatus of embodiment 445 or 446, comprising the optical fiber connector, in which the optical fiber connector and the optical module comprise a ball-detent mechanism configured to hold the optical fiber connector in place when the optical fiber connector is coupled to the optical module.

Embodiment 448: An apparatus comprising:

an optical module configured to be removably coupled to a first structure that is attached to a circuit board or a substrate, in which the optical module comprises a two-dimensional arrangement of at least 16 electrical contacts distributed in a two-dimensional surface area of the optical module, the optical module comprises a photonic integrated circuit, the optical module is configured to hold the photonic integrated circuit in place when the optical module is coupled to the first structure and to enable electronic signals from the photonic integrated circuit to be transmitted to the circuit board or the substrate through the two-dimensional arrangement of at least 16 electrical contacts;

wherein the optical module comprises a connector part that is configured to enable an optical fiber connector to be removably coupled to the optical module, in which the optical module is configured to enable optical signals from the optical fiber connector to be transmitted to the photonic integrated circuit.

Embodiment 449: The apparatus of embodiment 448 wherein the optical fiber connector is configured to couple a two-dimensional array of optical fibers to a two-dimensional array of optical coupling elements on the photonic integrated circuit.

Embodiment 450: The apparatus of embodiment 449 wherein the two-dimension array of optical fibers comprise at least a 3×12 array of optical fibers.

Embodiment 451: The apparatus of any of embodiments 448 to 450, comprising at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is coupled to the circuit board or the substrate and configured to process electrical signals received from or transmitted to the photonic integrated circuit.

Embodiment 452: The apparatus of any of embodiments 448 to 451, comprising the first structure and at least one of the circuit board or the substrate, in which the circuit board or the substrate is attached to a first side of the first structure, and the optical module is configured to be removably coupled to the first structure from the second side of the first structure, and the second side of the first structure is opposite to the first side of the first structure.

Embodiment 453: The apparatus of embodiment 452, comprising two or more optical modules that are removably coupled to the first structure in a 90-degree rotate checkerboard fashion.

Embodiment 454: The apparatus of embodiment 452 or 453, comprising the circuit board and the substrate, in which the circuit board is attached to the first side of the first structure, the substrate is attached to the circuit board, and the optical module is configured to hold the photonic integrated circuit in place when the optical module is coupled to the first structure and to enable electronic signals from the photonic integrated circuit to be transmitted to the substrate.

Embodiment 455: The apparatus of any of embodiments 448 to 454 in which the first structure comprises a grid structure that enables two or more optical modules to be removably coupled to the first structure in an array defined by the grid structure.

Embodiment 456: A system comprising:

a housing; and the apparatus of any of embodiments 414 to 455, in which the optical module is configured to be removably coupled to, partially through, or through a front panel of the housing.

Embodiment 457: The system of embodiment 456 in which the first structure is part of the front panel of the housing.

Embodiment 458: The system of embodiment 456 or 457 in which the circuit board is part of the front panel of the housing.

Embodiment 459: The system of embodiment 456 in which the first structure is positioned near and spaced apart from the front panel of the housing.

Embodiment 460: The system of embodiment 459 in which the first structure has an overall structure that extends along a plane that is substantially parallel to the front panel of the housing.

Embodiment 461: The system of embodiment 459 or 460 in which the circuit board is substantially parallel to the front panel of the housing.

Embodiment 462: A method comprising:

providing at least one of a circuit board or a substrate, in which a data processor unit is mounted on a first side of the circuit board or the substrate, a first structure is attached to a second side of the circuit board or the substrate, and the second side of the circuit board or the substrate comprises a two-dimensional arrangement of second electrical contacts;

removably coupling an optical module to the first structure, in which the optical module comprises a two-dimensional arrangement of first electrical contacts; and electrically coupling the optical module to the second side of the circuit board or the substrate through the two-dimensional arrangement of first electrical contacts and the two-dimensional arrangement of second electrical contacts.

Embodiment 463: The method of embodiment 462, comprising removably coupling an optical fiber connector to the optical module.

Embodiment 464: The method of embodiment 462 or 463, comprising:

inserting the optical module through a first opening defined by walls of the first structure;

using one or more retaining mechanisms on the walls of the first structure to engage one or more latch mechanisms on the optical module to secure the optical module to the first structure; and electrically coupling the second electrical contacts on the circuit board or the substrate to the first electrical contacts on the optical module.

Embodiment 465: The method of any of embodiments 462 to 464, comprising:

transmitting optical signals from an optical fiber connector to the optical module;

at the optical module, generating electrical signals based on the optical signals; and transmitting the electrical signals from the optical module to the circuit board or the substrate.

Embodiment 466: The method of embodiment 465 wherein the optical module comprises a photonic integrated circuit comprising a two-dimensional array of optical coupling elements, and the method, comprises using the optical fiber connector to couple a two-dimensional array of optical fibers to the two-dimensional array of optical coupling elements on the photonic integrated circuit.

Embodiment 467: The method of embodiment 466 wherein the two-dimension array of optical fibers comprise at least a 3×12 array of optical fibers.

Embodiment 468: The method of any of embodiments 462 to 467 in which the arrangement of second electrical contacts on the circuit board or the substrate comprises an array of at least four rows and four columns of electrical contacts, the arrangement of first electrical contacts of the optical module comprises an array of at least four rows and four columns of electrical contacts, and electrically coupling the optical module to the second side of the circuit board or the substrate comprises electrically coupling the array of at least four rows and four columns of electrical contacts of the optical module to the array of at least four rows and four columns of electrical contacts of the circuit board or the substrate.

Embodiment 469: The method of any of embodiments 462 to 468 in which the first structure comprises a grid structure that defines multiple first openings, and the method comprises:

removably coupling a plurality of optical modules to the grid structure, including inserting each optical module through a corresponding first opening defined by the walls of the grid structure;

for each of the plurality of optical modules, using one or more retaining mechanisms on the walls of the grid structure to engage one or more latch mechanisms on the optical module to secure the optical module to the grid structure; and for each of the plurality of optical modules, electrically coupling the first electrical contacts on the optical module to corresponding second electrical contacts on the circuit board or the substrate.

Embodiment 470: The method of embodiment 469, comprising orienting the optical modules such that each optical module is rotated 90 degrees relative to at least one adjacent optical module, and the rotational axis is perpendicular to the circuit board or the substrate.

Embodiment 471: The method of any of embodiments 462 to 468, comprising removably coupling a plurality of optical modules to the first structure; and orienting the optical modules coupled to the first structure in a 90-degree rotate checkerboard fashion.

Embodiment 472: The method of any of embodiments 462 to 471 in which removably coupling the optical module to the first structure comprises securing, using a snap-in mechanism, the optical module to the first structure.

Embodiment 473: The method of embodiment 472, comprising applying a force above a threshold to the optical module to disengage the snap-in mechanism, and pulling the optical module away from the first structure.

Embodiment 474: The method of embodiment 472 or 473 in which the snap-in mechanism comprises one or more grooves formed on walls of the first structure, the optical module comprises one or more elastic wings, and each elastic wing comprises a tongue;

wherein the method comprises engaging the tongue of the elastic wing with a corresponding groove formed on walls of the first structure when inserting the optical module into an opening defined by the walls of the first structure.

Embodiment 475: The method of embodiment 474 in which the snap-in mechanism comprises a lever-based latch mechanism, the latch mechanism is movable between a first position and a second position, the latch mechanism engages a support structure on the first structure when in the first position and disengages from the support structure when in the second position, wherein the method comprises placing the latch mechanism in the first position to secure the optical module to the first structure; and placing the latch mechanism in the second position to release the optical module from the first structure.

Embodiment 476: The method of embodiment 475 in which a lever is provided as part of the optical module, wherein the method comprises:

moving the lever to a first position to cause the latch mechanism to move to the first position, and moving the lever to a second position causes the latch mechanism to move to the second position.

Embodiment 477: The method of any of embodiments 462 to 476 in which the optical module comprises a co-packaged optical module.

Embodiment 478: The method of embodiment 406 or 477 in which the co-packaged optical module comprises:

a photonic integrated circuit configured to perform at least one of converting first optical signals to first electrical signals or converting second electrical signals to second optical signals;

the two-dimensional arrangement of first electrical contacts, wherein the two-dimensional arrangement of first electrical contacts are configured to at least one of (i) enable the first electrical signals to be transmitted from the photonic integrated circuit to the circuit board or the substrate, or (ii) enable the second electrical signals to be transmitted from the circuit board or the substrate to the photonic integrated circuit; and an optical fiber connector part configured to be optically coupled to an array of optical fibers, wherein the optical fiber connector part is configured to at least one of (i) receive the first optical signals from the array of optical fibers and transmit the first optical signals to the photonic integrated circuit, or (ii) receive the second optical signals from the photonic integrated circuit and transmit the second optical signals to the array of optical fibers.

Embodiment 479: The method of any of embodiments 406, 477, and 478 in which the co-packaged optical module comprises at least one of:

micro-optics assembly facilitating fiber-to-photonic integrated circuit coupling, one or more driver amplifiers, one or more trans-impedance amplifiers, one or more SerDes integrated circuits, one or more digital signal processors, one or more lasers or light emitting diodes, or one or more microcontrollers.

Embodiment 480: A method comprising:

attaching a first structure to a first side of a circuit board or a substrate, the circuit board or the substrate comprises a plurality of sets of two-dimensional arrangements of electrical contacts on the first side;

mounting an application specific integrated circuit on a second side of the circuit board or the substrate, in which the first structure has a first opening located opposite the application specific integrated circuit relative to the circuit board or the substrate, the first structure defines second openings that are configured to receive optical modules, each second opening corresponding to a set of two-dimensional arrangement of electrical contacts in the plurality of sets of two-dimensional arrangements of electrical contacts, the first structure is configured to enable each optical module to be electrically coupled to the circuit board or the substrate through the corresponding set of two-dimensional arrangement of electrical contacts when the optical module is inserted through the corresponding second opening defined by the first structure; and mounting discrete circuit components on the first side of the circuit board or the substrate, in which the discrete circuit components extend from the circuit board or the substrate into the first opening in the first structure.

Embodiment 481: The method of embodiment 480, comprising:

attaching the first structure to the first side of the circuit board;

mounting the application specific integrated circuit on the second side of the substrate; and mounting discrete circuit components on the first side of the substrate, in which the discrete circuit components extend from the substrate into the opening in the structure.

Embodiment 482: The method of embodiment 480 or 481 in which the discrete circuit components comprise at least one of one or more voltage regulators, one or more filters, or one or more capacitors.

Embodiment 483: The method of any of embodiments 480 to 482, comprising attaching a second structure to a second side of the circuit board or the substrate, and mechanically and thermally coupling the first structure to the second structure.

Embodiment 484: The method of embodiment 483, comprising attaching the first structure to the second structure using screws that pass through the circuit board or the substrate.

Embodiment 485: The method of embodiment 483, comprising attaching the first structure to the second structure using thermal vias.

Embodiment 486: The method of any of embodiments 483 to 485, comprising attaching a heat sink to at least one of the first structure or the second structure.

The following is a second set of embodiments. The embodiment numbers below refer to those in the second set of embodiments.

Embodiment 1: An apparatus comprising:

a first substrate having a first side and a second side;

a first electronic processor mounted on the first side of the first substrate, wherein the first electronic processor is configured to process data; and a first optical interconnect module mounted on the second side of the first substrate, in which the first optical interconnect module comprises:

an optical port configured to receive optical signals, and a photonic integrated circuit configured to generate electrical signals based on the received optical signals, and transmit the electrical signals to the first electronic processor.

Embodiment 2: The apparatus of embodiment 1 in which the first electronic processor comprises at least a network switch, a central processor unit, a graphics processor unit, a tensor processing unit, a neural network processor, an artificial intelligence accelerator, a digital signal processor, a microcontroller, an application specific integrated circuit (ASIC), or a data storage device.

Embodiment 3: The apparatus of embodiment 1 or 2 wherein the first optical interconnect module comprises:

a first serializers/deserializers module comprising multiple serializer units and deserializer units, a second serializers/deserializers module comprising multiple serializer units and deserializer units, wherein the first photonic integrated circuit is configured to generate first serial electrical signals based on the received optical signals, wherein the first serializers/deserializers module is configured to generate first parallel electrical signals based on the first serial electrical signals, and condition the electrical signals;

wherein the second serializers/deserializers module is configured to generate second serial electrical signals based on the first parallel electrical signals, and the second serial electrical signals are transmitted toward the first electronic processor.

Embodiment 4: The apparatus of embodiment 3, comprising a third serializers/deserializers module comprising multiple serializer units and deserializer units, in which the third serializers/deserializers module is configured to generate second parallel electrical signals based on the second serial electrical signals, and transmit the second serial electrical signals to the first electronic processor.

Embodiment 5: The apparatus of any of embodiments 1 to 4 in which the first substrate comprises electrical connectors that extend from the first side of the first substrate to the second side of the first substrate, the electrical connectors pass through the first substrate from the first side to the second side in a thickness direction, wherein the first optical interconnect module is electrically coupled to the first electronic processor by the electrical connectors.

Embodiment 6: The apparatus of embodiment 5 in which the electrical connectors comprise vias of the first substrate.

Embodiment 7: The apparatus of any of embodiments 1 to 6 in which the first substrate comprises a first printed circuit board.

Embodiment 8: The apparatus of any of embodiments 1 to 7, comprising a first structure attached to the second side of the first substrate and configured to enable the first optical interconnect module to be removably coupled to the first structure.

Embodiment 9: The apparatus of embodiment 8 in which the first substrate comprises a second surface on the second side of the first substrate, and the second surface comprises second electrical contacts that are electrically coupled to the first electronic processor, wherein the first optical interconnect module comprises electrical contacts that are electrically coupled to the second electrical contacts on the second surface of the first substrate when the first optical interconnect module is coupled to the first structure.

Embodiment 10: The apparatus of embodiment 9 wherein the first structure is configured to enable an optical fiber connector to be removably coupled to the first optical interconnect module.

Embodiment 11: The apparatus of any of embodiments 1 to 10, comprising:

a second substrate having a first side and a second side;

a second electronic processor mounted on the first side of the second substrate, wherein the second electronic processor is configured to process data; and a second optical interconnect module mounted on the second side of the second substrate, in which the second optical interconnect module comprises:

an optical port configured to receive optical signals, and a photonic integrated circuit configured to generate electrical signals based on the received optical signals, and transmit the electrical signals to the second electronic processor; and an optical power supply comprising at least one laser, in which the optical power supply is configured to provide a first light source to the photonic integrated circuit of the first optical interconnect module through a first optical link and to provide a second light source to the photonic integrated circuit of the second optical interconnect module through a second optical link.

Embodiment 12: The apparatus of embodiment 11, in which the first substrate and the second substrate are disposed in a first housing, and the optical power supply is disposed in a second housing that is external to the first housing.

Embodiment 13: The apparatus of any of embodiments 1 to 10, comprising:

a second substrate having a first side and a second side;

a second electronic processor mounted on the first side of the second substrate, wherein the second electronic processor is configured to process data; and a second optical interconnect module mounted on the second side of the second substrate, in which the second optical interconnect module comprises:

an optical port configured to receive optical signals, and a photonic integrated circuit configured to generate electrical signals based on the received optical signals, and transmit the electrical signals to the second electronic processor;

a support structure to support the first and second substrates, in which the second substrate is oriented parallel to the first substrate.

Embodiment 14: A system comprising:

a plurality of data processing modules, in which each data processing module comprises a substrate having a first side and a second side, an electronic processor mounted on the first side of the substrate, and an optical interconnect module mounted on the second side of the substrate, the optical interconnect module comprises an optical port configured to receive optical signals, and a photonic integrated circuit configured to generate electrical signals based on the received optical signals and transmit the electrical signals to the electronic processor.

Embodiment 15: The system of embodiment 14, comprising a structure to support the plurality of data processing modules in a way such that the substrates of the data processing modules are oriented parallel to one another.

Embodiment 16: The system of embodiment 15 in which the structure supports the data processing modules in a way such that the substrates are oriented vertically to enhance dissipation of heat from at least one of the data processing module or the optical interconnect module of each data processing module.

Embodiment 17: The system of any of embodiments 14 to 16, comprising an optical power supply comprising at least one laser, in which the optical power supply is configured to provide a plurality of light sources to the plurality of data processing modules, at least one light source is provided to the photonic integrated circuit of each data processing module through an optical link.

Embodiment 18: The system of any of embodiments 14 to 17 in which the electronic processor of each data processing module comprises at least a network switch, a central processor unit, a graphics processor unit, a tensor processing unit, a neural network processor, an artificial intelligence accelerator, a digital signal processor, a microcontroller, an application specific integrated circuit (ASIC), or a data storage device.

Embodiment 19: The system of any of embodiments 14 to 18 in which the plurality of data processing modules comprise a blade pair that comprises a switch blade and a processor blade, the electronic processor of the switch blade comprises a switch, and the electronic processor of the processor blade is configured to process data provided by the switch.

Embodiment 20: A system comprising:

a plurality of racks of data processing modules, in which multiple racks are stacked vertically, and each rack comprises a plurality of data processing modules;

wherein each data processing module comprises a substrate having a first side and a second side, an electronic processor mounted on the first side of the substrate, and an optical interconnect module mounted on the second side of the substrate, the optical interconnect module comprises an optical port configured to receive optical signals, and a photonic integrated circuit configured to generate electrical signals based on the received optical signals and transmit the electrical signals to the electronic processor.

Embodiment 21: The system of embodiment 20, comprising a structure to support the plurality of data processing modules in a way such that the substrates of the data processing modules are oriented parallel to one another.

Embodiment 22: The system of embodiment 21 in which the structure supports the data processing modules in a way such that the substrates are oriented vertically to enhance dissipation of heat from at least one of the data processing module or the optical interconnect module of each data processing module.

Embodiment 23: The system of any of embodiments 20 to 22, comprising an optical power supply comprising at least one laser, in which the optical power supply is configured to provide a plurality of light sources to the plurality of data processing modules, at least one light source is provided to the photonic integrated circuit of each data processing module through an optical link.

Embodiment 24: The system of any of embodiments 20 to 23 in which the electronic processor of each data processing module comprises at least a network switch, a central processor unit, a graphics processor unit, a tensor processing unit, a neural network processor, an artificial intelligence accelerator, a digital signal processor, a microcontroller, an application specific integrated circuit (ASIC), or a data storage device.

Embodiment 25: The system of any of embodiments 20 to 24 in which the plurality of data processing modules comprise a blade pair that comprises a switch blade and a processor blade, the electronic processor of the switch blade comprises a switch, and the electronic processor of the processor blade is configured to process data provided by the switch.

Embodiment 26: A method comprising:

operating a plurality of data processing modules, in which each data processing module comprises a substrate having a first side and a second side, an electronic processor mounted on the first side of the substrate, and an optical interconnect module mounted on the second side of the substrate, the optical interconnect module comprises an optical port and a photonic integrated circuit; and for each data processing module, receiving optical signals at the optical port;

using the photonic integrated circuit to generate electrical signals based on the optical signals received at the optical port; and transmitting the electrical signals from the photonic integrated circuit to the electronic processor through electrical connectors that extend from the first side of the substrate to the second side of the substrate.

Embodiment 27: An apparatus comprising:

a first substrate having a first side and a second side;

a first electronic processor mounted on the first side of the first substrate, wherein the first electronic processor is configured to process data; and a first optical interconnect module comprising:

an optical port configured to receive optical signals from a first optical fiber cable, and a photonic integrated circuit configured to generate electrical signals based on the received optical signals, and transmit the electrical signals to the first electronic processor;

wherein at least one of the first optical interconnect module or the first optical fiber cable extends through or partially through an opening in the first substrate to enable at least a portion of the first optical fiber cable to be positioned on or near the second side of the first substrate.

Embodiment 28: The apparatus of embodiment 27 in which the first optical interconnect module and the first optical fiber cable define a signal path that extends from the second side of the substrate through the opening to the first electronic processor.

Embodiment 29: The apparatus of embodiment 27 or 28 in which the first electronic processor comprises at least a network switch, a central processor unit, a graphics processor unit, a tensor processing unit, a neural network processor, an artificial intelligence accelerator, a digital signal processor, a microcontroller, an application specific integrated circuit (ASIC), or a data storage device.

Embodiment 30: The apparatus of any of embodiments 27 to 29 wherein the first optical interconnect module comprises:

a first serializers/deserializers module comprising multiple serializer units and deserializer units, a second serializers/deserializers module comprising multiple serializer units and deserializer units, wherein the first photonic integrated circuit is configured to generate first serial electrical signals based on the received optical signals, wherein the first serializers/deserializers module is configured to generate first parallel electrical signals based on the first serial electrical signals, and condition the electrical signals;

wherein the second serializers/deserializers module is configured to generate second serial electrical signals based on the first parallel electrical signals, and the second serial electrical signals are transmitted toward the first electronic processor.

Embodiment 31: The apparatus of embodiment 30, comprising a third serializers/deserializers module comprising multiple serializer units and deserializer units, in which the third serializers/deserializers module is configured to generate second parallel electrical signals based on the second serial electrical signals, and transmit the second serial electrical signals to the first electronic processor.

Embodiment 32: The apparatus of any of embodiments 27 to 31 in which the first substrate comprises a first printed circuit board.

Embodiment 33: The apparatus of any of embodiments 27 to 32, comprising:

a second substrate having a first side and a second side;

a second electronic processor mounted on the first side of the second substrate, wherein the second electronic processor is configured to process data; and a second optical interconnect module comprising:

an optical port configured to receive optical signals from a second optical fiber cable, and a photonic integrated circuit configured to generate electrical signals based on the received optical signals, and transmit the electrical signals to the second electronic processor;

wherein at least one of the second optical interconnect module or the second optical fiber cable extends through or partially through an opening in the second substrate to enable at least a portion of the second optical fiber cable to be positioned on or near the second side of the second substrate.

Embodiment 34: The apparatus of embodiment 33, comprising an optical power supply comprising at least one laser, in which the optical power supply is configured to provide a first light source to the photonic integrated circuit of the first optical interconnect module through a first optical link and provide a second light source to the photonic integrated circuit of the second optical interconnect module through a second optical link.

Embodiment 35: The apparatus of embodiment 34, in which the first substrate and the second substrate are disposed in a first housing, and the optical power supply is disposed in a second housing that is external to the first housing.

Embodiment 36: The apparatus any of embodiments 33 to 35, comprising a support structure to support the first and second substrates, in which the second substrate is oriented parallel to the first substrate.

Embodiment 37: A system comprising:

a plurality of data processing modules, in which each data processing module comprises a substrate having a first side and a second side, an electronic processor mounted on the first side of the substrate, and an optical interconnect module comprising an optical port configured to receive optical signals from an optical fiber cable, and a photonic integrated circuit configured to generate electrical signals based on the received optical signals and transmit the electrical signals to the electronic processor, wherein for each data processing module, at least one of the optical interconnect module or the optical fiber cable extends through or partially through an opening in the substrate to enable at least a portion of the optical fiber cable to be positioned on or near the second side of the substrate.

Embodiment 38: The system of embodiment 37, comprising a structure to support the plurality of data processing modules in a way such that the substrates of the data processing modules are oriented parallel to one another.

Embodiment 39: The system of embodiment 38 in which the structure supports the data processing modules in a way such that the substrates are oriented vertically to enhance dissipation of heat from at least one of the data processing module or the optical interconnect module of each data processing module.

Embodiment 40: The system of any of embodiments 37 to 39 in which for each data processing module, the optical interconnect module and the optical fiber cable define a signal path that extends from the second side of the substrate through the opening to the electronic processor.

Embodiment 41: The system of any of embodiments 37 to 40, comprising an optical power supply comprising at least one laser, in which the optical power supply is configured to provide a plurality of light sources to the plurality of data processing modules, at least one light source is provided to the photonic integrated circuit of each data processing module through an optical link.

Embodiment 42: The system of any of embodiments 37 to 41 in which the electronic processor of each data processing module comprises at least a network switch, a central processor unit, a graphics processor unit, a tensor processing unit, a neural network processor, an artificial intelligence accelerator, a digital signal processor, a microcontroller, an application specific integrated circuit (ASIC), or a data storage device.

Embodiment 43: The system of any of embodiments 37 to 42 in which the plurality of data processing modules comprise a blade pair that comprises a switch blade and a processor blade, the electronic processor of the switch blade comprises a switch, and the electronic processor of the processor blade is configured to process data provided by the switch.

Embodiment 44: A system comprising:

a plurality of racks of data processing modules, in which multiple racks are stacked vertically, and each rack comprises a plurality of data processing modules;

wherein each data processing module comprises a substrate having a first side and a second side, an electronic processor mounted on the first side of the substrate, and an optical interconnect module comprising an optical port configured to receive optical signals from an optical fiber cable, and a photonic integrated circuit configured to generate electrical signals based on the received optical signals and transmit the electrical signals to the electronic processor;

wherein for each data processing module, at least one of the optical interconnect module or the optical fiber cable extends through or partially through an opening in the substrate to enable at least a portion of the optical fiber cable to be positioned on or near the second side of the substrate.

Embodiment 45: The system of embodiment 44, comprising a structure to support the plurality of data processing modules in a way such that the substrates of the data processing modules are oriented parallel to one another.

Embodiment 46: The system of embodiment 45 in which the structure supports the data processing modules in a way such that the substrates are oriented vertically to enhance dissipation of heat from at least one of the data processing module or the optical interconnect module of each data processing module.

Embodiment 47: The system of any of embodiments 44 to 46, comprising an optical power supply comprising at least one laser, in which the optical power supply is configured to provide a plurality of light sources to the plurality of data processing modules, at least one light source is provided to the photonic integrated circuit of each data processing module through an optical link.

Embodiment 48: The system of any of embodiments 44 to 47 in which the electronic processor of each data processing module comprises at least a network switch, a central processor unit, a graphics processor unit, a tensor processing unit, a neural network processor, an artificial intelligence accelerator, a digital signal processor, a microcontroller, an application specific integrated circuit (ASIC), or a data storage device.

Embodiment 49: The system of any of embodiments 44 to 48 in which the plurality of data processing modules comprise a blade pair that comprises a switch blade and a processor blade, the electronic processor of the switch blade comprises a switch, and the electronic processor of the processor blade is configured to process data provided by the switch.

Embodiment 50: A method comprising:

operating a plurality of data processing modules, in which each data processing module comprises a substrate having a first side and a second side, an electronic processor mounted on the first side of the substrate, and an optical interconnect module comprising an optical port and a photonic integrated circuit, the optical port is optically coupled to an optical fiber cable; and for each data processing module, defining a signal path using the optical fiber cable and the optical interconnect module, in which the signal path extends from the second side of the substrate through an opening in the substrate to the electronic processor;

using the photonic integrated circuit to generate electrical signals based on the optical signals received at the optical port; and transmitting the electrical signals from the photonic integrated circuit to the electronic processor.

The following is a third set of embodiments. The embodiment numbers below refer to those in the third set of embodiments.

Embodiment 1: A system comprising:

a housing comprising a bottom panel and a front panel, wherein the front panel is at an angle relative to the bottom panel in which the angle is in a range from 30 to 150°;

a first circuit board positioned inside the housing, in which the first circuit board has a length, a width, and a thickness, wherein the length is at least twice the thickness, the width is at least twice the thickness, and the first circuit board has a first surface defined by the length and the width, wherein the first surface of the first circuit board is at a first angle relative to the bottom panel in which the first angle is in a range from 30° to 150°, wherein the first surface of the first circuit board is substantially parallel to the front panel or at a second angle relative to the front panel when the front panel is closed in which the second angle is less than 60°;

a first data processing module electrically coupled to the first circuit board; and a first optical interconnect module electrically coupled to the first circuit board, in which the optical interconnect module is configured to receive first optical signals from a first optical link, convert the first optical signals to first electrical signals, and transmit the first electrical signals to the first data processing module.

Embodiment 2: The system of embodiment 1, comprising a second circuit board that has a length, a width, and a thickness, in which the length is at least twice the thickness, the width is at least twice the thickness, and the second circuit board has a first surface defined by the length and the width, wherein the first surface of the second circuit board is substantially parallel to the bottom panel or at an angle relative to the bottom panel in which the angle is less than 20°, and the second circuit board is electrically coupled to the first circuit board.

Embodiment 3: The system of embodiment 2 in which the second circuit board comprises a motherboard, the first circuit board comprises a daughter card, and the motherboard is configured to provide electrical power to the daughter card.

Embodiment 4: The system of embodiment 1 in which the front panel is spaced apart from the rear panel at a mean distance of at least 12 inches, and the first circuit board is spaced apart from the front panel at a mean distance of less than 4 inches.

Embodiment 5: The system of embodiment 1 in which the first data processing module comprises at least a network switch, a central processor unit, a graphics processor unit, a tensor processing unit, a neural network processor, an artificial intelligence accelerator, a digital signal processor, a microcontroller, an application specific integrated circuit (ASIC), or a data storage device.

Embodiment 6: The system of embodiment 5 in which the first data processing module is capable of processing data from the first optical interconnect module at a rate of at least 25 gigabits per second.

Embodiment 7: The system of embodiment 5 in which the first data processing module is capable of processing data from one or more optical interconnect modules at a rate of at least 1 gigabits per second.

Embodiment 8: The system of embodiment 5 in which the first data processing module is capable of processing data from one or more optical interconnect modules at a rate of at least 10 gigabits per second.

Embodiment 9: The system of embodiment 5 in which the first data processing module is capable of processing data from one or more optical interconnect modules at a rate of at least 100 gigabits per second.

Embodiment 10: The system of embodiment 5 in which the first data processing module is capable of processing data from one or more optical interconnect modules at a rate of at least 1 terabits per second.

Embodiment 11: The system of embodiment 5 in which the first data processing module is capable of processing data from one or more optical interconnect modules at a rate of at least 10 terabits per second.

Embodiment 12: The system of embodiment 5 in which the first data processing module comprises an integrated circuit or a system on a chip (SoC) that includes at least one thousand transistors.

Embodiment 13: The system of embodiment 5 in which the first data processing module comprises an integrated circuit or a system on a chip (SoC) that includes at least ten thousand transistors.

Embodiment 14: The system of embodiment 5 in which the first data processing module comprises an integrated circuit or a system on a chip (SoC) that includes at least one hundred thousand transistors.

Embodiment 15: The system of embodiment 5 in which the first data processing module comprises an integrated circuit or a system on a chip (SoC) that includes at least one million transistors.

Embodiment 16: The system of embodiment 5 in which the first data processing module comprises an integrated circuit or a system on a chip (SoC) that includes at least ten million transistors.

Embodiment 17: The system of embodiment 5 in which the first data processing module comprises an integrated circuit or a system on a chip (SoC) that includes at least one hundred million transistors.

Embodiment 18: The system of embodiment 5 in which the first data processing module comprises an integrated circuit or a system on a chip (SoC) that includes at least one billion transistors.

Embodiment 19: The system of embodiment 5 in which the first data processing module comprises an integrated circuit or a system on a chip (SoC) that includes at least ten billion transistors.

Embodiment 20: The system of embodiment 5 in which the first data processing module comprises circuitry that is capable of operating at a frequency of 1 MHz or more.

Embodiment 21: The system of embodiment 5 in which the first data processing module comprises circuitry that is capable of operating at a frequency of 10 MHz or more.

Embodiment 22: The system of embodiment 5 in which the first data processing module comprises circuitry that is capable of operating at a frequency of 100 MHz or more.

Embodiment 23: The system of embodiment 5 in which the first data processing module comprises circuitry that is capable of operating at a frequency of 1 GHz or more.

Embodiment 24: The system of embodiment 5 in which the first data processing module comprises circuitry that is capable of operating at a frequency of 3 GHz or more.

Embodiment 25: The system of embodiment 1 in which the system comprises a rackmount server, the housing comprises an enclosure for the rackmount server, and the rackmount server has an n rack unit form factor, and n is an integer in a range from 1 to 8.

Embodiment 26: The system of embodiment 1 in which the first data processing module is mounted on a substrate, and the substrate is electrically coupled to the first circuit board.

Embodiment 27: The system of embodiment 1 in which the first optical interconnect module is releasably coupled to the first circuit board.

Embodiment 28: The system of embodiment 27 in which a socket is mounted on the first circuit board, and the first optical interconnect module is releasably coupled to the socket.

Embodiment 29: The system of embodiment 1 in which the first optical interconnect module comprises a photonic integrated circuit mounted on a substrate, and the substrate is electrically coupled to the first circuit board.

Embodiment 30: The system of embodiment 1 in which the first optical interconnect module comprise a connector part that enables one or more optical fibers to be releasably connected to the first optical interconnect module.

Embodiment 31: The system of embodiment 1 in which the optical interconnect module is mounted on the first surface of the first circuit board, and the first surface faces the rear panel and away from the front panel.

Embodiment 32: The system of embodiment 31 in which the first circuit board defines a first opening, the front panel defines a second opening, the system comprises an optical path that passes through the first and second openings and enables the first optical signals from the first optical link to be transmitted to the first optical interconnect module.

Embodiment 33: The system of embodiment 1 in which the first electrical signals comprise first serial electrical signals, and the system comprises:

- a first serializer/deserializer configured to generate a set of first parallel electrical signals based on the first serial electrical signals, and condition the first parallel electrical signals; and
- a second serializer/deserializer configured to generate a second serial electrical signal based on the set of first parallel electrical signals;
- wherein the first data processing module is configured to process data carried in the second serial electrical signal.

Embodiment 34: The system of embodiment 33, comprising a third serializer/deserializer configured to generate a set of second parallel electrical signals based on the second serial electrical signal;

- wherein the first data processing module is configured to process data carried by the set of second parallel electrical signals.

Embodiment 35: The system of embodiment 34 in which the third serializer/deserializer is embedded in the first data processing module.

Embodiment 36: The system of embodiment 1 in which the first optical interconnect module comprises a photonic integrated circuit and a first optical connector optically coupled to the photonic integrated circuit, the first optical connector is configured to releasably connect with a second optical connector that is coupled to a bundle of at least 100 optical fibers, and the first optical connector is configured to provide at least 100 optical paths to enable optical signals from the bundle of optical fibers to be coupled to the photonic integrated circuit.

Embodiment 37: The system of any of embodiments 1 to 36 in which the first optical interconnect module comprises at least one grating coupler, at least one optical waveguide coupled to the grating coupler, and at least one photodetector coupled to the at least one optical waveguide.

Embodiment 38: The system of any of embodiments 1 to 36 in which the first optical interconnect module comprises an array of grating couplers, a plurality of optical waveguides coupled to the array of grating couplers, and a plurality of photodetectors coupled to the plurality of optical waveguides.

Embodiment 39: The system of embodiment 38 in which the first optical interconnect module comprises a photonic integrated circuit and an optical fiber connector coupled to the photonic integrated circuit,

- wherein the photonic integrated circuit comprises the array of grating couplers, the plurality of optical waveguides, and the plurality of photodetectors,
- wherein the optical fiber connector comprises an array of lenses configured to focus light to or from the grating couplers.

Embodiment 40: A system comprising:

- a housing comprising a front panel, in which the front panel comprises a first circuit board;
- at least one data processing module electrically coupled to the first circuit board; and
- at least one optical/electrical communication interface electrically coupled to the first circuit board.

Embodiment 41: A system comprising:

- a housing comprising a front panel;
- a first circuit board oriented at a first angle relative to the front panel, in which the first angle is in a range from −60° to 60°;
- at least one data processor electrically coupled to the first circuit board; and
- at least one optical/electrical communication interface electrically coupled to the first circuit board.

Embodiment 42: A system comprising:

- a plurality of rack mount systems, each rack mount system comprising:
  - a housing comprising a front panel, in which the front panel comprises a first circuit board;
  - at least one data processor electrically coupled to the first circuit board; and
  - at least one optical/electrical communication interface electrically coupled to the first circuit board.

Embodiment 43: A system comprising:

- a plurality of rack mount systems, each rack mount system comprising:
  - a housing comprising a front panel;
  - a first circuit board oriented at a first angle relative to the front panel, in which the first angle is in a range from −60° to 60°;
  - at least one data processor electrically coupled to the first circuit board; and
  - at least one optical/electrical communication interface electrically coupled to the first circuit board.

Embodiment 44: An apparatus comprising:

- a first substrate having a first side and a second side;
- a first electronic processing module mounted on the first side of the first substrate, wherein the first electronic processing module is configured to process data; and
- a first optical interconnect module mounted on the second side of the first substrate, in which the first optical interconnect module comprises:
  - an optical port configured to receive optical signals, and a photonic integrated circuit configured to generate electrical signals based on the received optical signals, and transmit the electrical signals to the first electronic processor.

Embodiment 45: A system comprising:

a housing comprising a bottom panel and a front panel;

a first circuit board or a first substrate positioned in the housing, in which the first circuit board or the first substrate is oriented at an angle relative to the bottom panel in which the angle is in a range from 30° to 150°;

wherein the front panel of the housing is configured to be movable between a closed position and an open position, when the front panel is at the closed position the first circuit board or the first substrate is positioned behind the front panel and substantially parallel to the front panel or at an angle relative to the front panel in which the angle is less than 60°;

a first lattice structure attached to the first circuit board or the first substrate, in which the first lattice structure defines a first plurality of openings;

wherein a plurality of sets of electrical contacts are provided on a surface of the first circuit board or the first substrate, and each of the first plurality of openings of the first lattice structure correspond to one of the sets of electrical contacts and enables an optical interconnect module to pass through the opening and electrically couple to the set of electrical contacts.

Embodiment 46: A system comprising:

a housing comprising a bottom panel and a front panel, the front panel comprising a plurality of optical connector parts, each optical connector part is configured to be optically coupled to an external optical fiber cable and an internal optical fiber cable;

a first circuit board or a first substrate positioned in the housing, in which the first circuit board or the first substrate is oriented at an angle relative to the bottom panel in which the angle is in a range from 30° to 150°;

wherein the first circuit board or the first substrate is substantially parallel to the front panel or at an angle relative to the front panel in which the angle is less than 60°;

a plurality of optical interconnect modules electrically coupled to the first circuit board; and a plurality of internal optical fiber cables, in which each internal optical fiber cable is optically coupled to one of the optical interconnect modules and a corresponding optical connector part on the front panel.

Embodiment 47: The system of embodiment 46 wherein the front panel of the housing is configured to be movable between a closed position and an open position, when the front panel is at the closed position the first circuit board or the first substrate is positioned behind the front panel and substantially parallel to the front panel or at an angle relative to the front panel in which the angle is less than 60°.

Embodiment 48: A rackmount system configured to be placed on a rack during operation, the rackmount system comprising:

a housing comprising a front panel, in which the housing defines a front opening when the front panel is opened;

a first circuit board or a first substrate positioned in the housing;

a data processing module electrically coupled to the first circuit board or the first substrate, in which the data processing module has a throughput of at least 100 gigabits per second; and a plurality of optical interface modules electrically coupled to a first surface of the first circuit board or the first substrate, in which at least one of the plurality of optical interface modules are configured to receive first optical signals, convert the first optical signals to first electrical signals, and transmit the first electrical signals to the data processing module, and at least one of the plurality of optical interface modules are configured to receive second electrical signals from the data processing module, convert the second electrical signals to second optical signals, and output the second optical signals;

wherein the first surface of the first circuit board or the first substrate is oriented to face towards the front opening to allow the optical interface modules to be accessed after the front panel is opened without removing the rackmount system from the rack, in which accessing the optical interface module includes at least one of attaching the optical interface module to the first circuit board or the first substrate, or removing the optical interface module from the first circuit board or the first substrate.

Embodiment 49: A method comprising:

electrically coupling a first optical interconnect module to a first surface of a first circuit board of a system, in which the first circuit board is oriented substantially parallel to a front panel of a housing of the system or at an angle relative to the front panel when the front panel is closed in which the angle is less than 60°, and the first surface faces the front panel when the front panel is closed;

transmitting first optical signals from an optical fiber cable to the first optical interconnect module;

converting, using the first optical interconnect module, the first optical signals to first electrical signals;

transmitting the first electrical signals to a data processing module electrically coupled to the first circuit board; and processing, using the data processing module, the first electrical signals.

Embodiment 50: A method comprising:

opening a front panel of a housing of a system to expose a first surface of a first circuit board of the system and a first optical interconnect module that is electrically coupled to the first surface of the first circuit board, in which the first circuit board is oriented substantially parallel to the front panel or at an angle relative to the front panel when the front panel is closed in which the angle is less than 60°, and the first surface faces the front panel when the front panel is closed;

disconnecting the first optical interconnect module from the first surface of the first circuit board;

disconnecting the first optical interconnect module from an optical fiber cable that is optically coupled to the first optical interconnect module;

optically coupling a second optical interconnect module to the optical fiber cable;

electrically coupling the second optical interconnect module to the first surface of the first circuit board; and closing the front panel.

Embodiment 51: An apparatus comprising:

a co-packaged optical module comprising:

a photonic integrated circuit;

an optical connector coupled to a first surface of the photonic integrated circuit; and a first set of at least two electrical integrated circuits that are coupled to the first surface of the photonic integrated circuit.

Embodiment 52: The apparatus of embodiment 51 in which the first set of at least two electrical integrated circuits comprise two electrical integrated circuits that are positioned on opposite sides of the optical connector along a plane parallel to the first surface of the photonic integrated circuit.

Embodiment 53: The apparatus of embodiment 51 in which the first set of at least one electrical integrated circuit comprises four electrical integrated circuits that surround three sides of the optical connector along a plane parallel to the first surface of the photonic integrated circuit.

Embodiment 54: The apparatus of any of embodiments 51 to 53 in which the co-packaged optical module comprises:

a substrate, in which the photonic integrated circuit is mounted on the substrate, and a second set of at least one electrical integrated circuit mounted on the substrate and electrically coupled to the photonic integrated circuit through one or more signal conductors and/or traces.

Embodiment 55: The apparatus of embodiment 54 in which the photonic integrated circuit comprises at least one of a photodetector or an optical modulator, and the first set of at least one integrated circuit comprises at least one of a transimpedance amplifier configured to amplify a current generated by the photodetector or a driver configured to drive the optical modulator.

Embodiment 56: The apparatus of any of embodiments 51 to 55 in which the second set of at least one electrical integrated circuit comprises a serializers/deserializers module.

Embodiment 57: The apparatus of any of embodiments 51 to 56 in which the photonic integrated circuit comprises a silicon substrate and an active layer at a second surface that is opposite to the first surface relative to the photonic integrated circuit, wherein the active layer comprises grating couplers, and at least one of photodetectors or optical modulators, wherein the optical connector is optically coupled to the grating couplers using backside illumination; and wherein the first set of at least one electrical integrated circuits is coupled to the at least one of photodetectors or optical modulators using through silicon vias.

Embodiment 58: An apparatus comprising:

a co-packaged optical module comprising:

a photonic integrated circuit;

an optical connector coupled to a first surface of the photonic integrated circuit; and a first set of at least one electrical integrated circuit that is coupled to a second surface of the photonic integrated circuit, in which the second surface is opposite to the first surface relative to the photonic integrated circuit.

Embodiment 59: The apparatus of embodiment 58 in which the photonic integrated circuit comprises an active layer at the first surface, the active layer comprises grating couplers, and at least one of photodetectors or optical modulators, wherein the optical connector has a footprint that overlaps a footprint of the grating couplers;

wherein the at least one of photodetectors or optical modulators are spaced apart from the grating couplers, and wherein the first set of at least one electrical integrated circuits is coupled to the at least one of photodetectors or optical modulators using through silicon vias.

Embodiment 60: The apparatus of embodiment 58 or 59 in which the photonic integrated circuit comprises a silicon substrate and an active layer at the second surface, wherein the active layer comprises grating couplers, and at least one of photodetectors or optical modulators, wherein the optical connector is optically coupled to the grating couplers using backside illumination; and wherein the at least one of photodetectors or optical modulators are spaced apart from the grating couplers, and the first set of at least one electrical integrated circuits is electrically coupled to the at least one of photodetectors or optical modulators.

Embodiment 61: The apparatus of any of embodiments 58 to 60 in which the photonic integrated circuit comprises at least one of a photodetector or an optical modulator, and the first set of at least one integrated circuit comprises at least one of a transimpedance amplifier configured to amplify a current generated by the photodetector or a driver configured to drive the optical modulator.

Embodiment 62: The apparatus of any of embodiments 58 to 61 in which the co-packaged optical module comprises:

a substrate, in which the photonic integrated circuit is mounted on the substrate, and a second set of at least one electrical integrated circuit mounted on the substrate and electrically coupled to the photonic integrated circuit through one or more signal conductors and/or traces.

Embodiment 63: The apparatus of embodiment 62 in which the second set of at least one electrical integrated circuit comprises a serializers/deserializers module.

What is claimed is:

1. An apparatus comprising:

at least one of a circuit board or a substrate;

a data processor unit mounted on a first side of the circuit board or the substrate; and a first structure attached to a second side of the circuit board or the substrate, in which the second side of the circuit board or the substrate comprises a two-dimensional arrangement of second electrical contacts, the first structure is configured to be mechanically coupled to an optical module that has a two-dimensional arrangement of first electrical contacts;

wherein the first structure comprises walls that define a first opening, the walls also define one or more retaining mechanisms such that when the optical module is inserted into the first opening, the one or more retaining mechanisms on the walls of the first structure engage one or more latch mechanisms on the optical module to secure the optical module to the first structure, and the first electrical contacts on the optical module are electrically coupled to the second electrical contacts on the circuit board or the substrate.

2. The apparatus of claim 1 wherein the optical module comprises a connector configured to be coupled to an optical fiber connector.

3. The apparatus of claim 2 wherein the connector is configured to be coupled to the optical fiber connector when the optical module is electrically coupled to the circuit board or the substrate, wherein the connector is configured to release the optical fiber connector when the optical module is removed from the circuit board or the substrate.

4. The apparatus of claim 1 wherein the data processor unit comprises at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is configured to process electrical signals received from or transmitted to the optical module.

5. The apparatus of claim 1 in which the data processor unit comprises at least one of (i) a bare die processor that is mounted on the first side of the circuit board or the substrate, or (ii) a packaged processor that includes a package substrate that is mounted on the first side of the circuit board or the substrate.

6. The apparatus of claim 1, comprising at least one optical module, in which the optical module comprises a mechanical connector structure configured to couple the optical module to the first structure to enable electrical signals to be transmitted between the optical module and the second electrical contacts of the circuit board or the substrate;

wherein the mechanical connector structure comprises the one or more latch mechanisms that engage the one or more retaining mechanisms on the walls of the first structure to secure the optical module to the first structure, and wherein the one or more latch mechanisms and the one or more retaining mechanisms are configured to allow the optical module to be removed from the first structure by disengaging the one or more latch mechanisms from the one or more retaining mechanisms.

7. The apparatus of claim 6 in which the mechanical connector structure comprises a connector configured to receive the optical fiber connector to enable light signals from the optical fiber connector to be transmitted to the optical module.

8. The apparatus of claim 7, comprising the optical fiber connector, in which the optical fiber connector is optically coupled to a fiber cable comprising a plurality of optical fibers, and the optical fiber connector is configured to transmit optical signals carried in the optical fibers to the optical module.

9. The apparatus of claim 8 wherein the optical module comprises a photonic integrated circuit comprising a two-dimensional array of optical coupling elements, and the optical fiber connector is configured to couple a two-dimensional array of optical fibers to the two-dimensional array of optical coupling elements on the photonic integrated circuit.

10. The apparatus of claim 9 wherein the two-dimensional array of optical fibers comprises at least a 3×12 array of optical fibers.

11. The apparatus of claim 6 wherein the mechanical connector structure comprises at least one of a snap-on mechanism or a screw-on mechanism.

12. The apparatus of claim 6, wherein the at least one optical module comprises at least one pluggable module.

13. The apparatus of claim 1 in which the arrangement of second electrical contacts of the circuit board or the substrate comprises at least four rows and four columns of second electrical contacts, the arrangement of first electrical contacts of the optical module comprises at least four rows and four columns of first electrical contacts, and the first structure is configured to enable the at least four rows and four columns of first electrical contacts of the optical module to be electrically coupled to the at least four rows and four columns of second electrical contacts of the circuit board or the substrate when the optical module is coupled to the first structure.

14. The apparatus of claim 1 in which the first structure comprises a grid structure that defines multiple openings, and each opening is configured to receive a corresponding optical module.

15. The apparatus of claim 1 in which the first structure is configured to function as a heat spreader.

16. The apparatus of claim 1 in which the first structure has an opening located opposite the data processor unit relative to the circuit board or the substrate, discrete circuit components are mounted on the second side of the circuit board or the substrate, and the discrete circuit components extend from the circuit board or the substrate into the opening in the first structure.

17. The apparatus of claim 16, comprising the circuit board and the substrate, in which the first structure is attached to the second side of the circuit board, the data processor unit is mounted on the first side of the substrate, the opening in the first structure is located opposite the data processor unit relative to the substrate, discrete circuit components are mounted on the second side of the substrate, and the discrete circuit components extend from the substrate into the opening in the structure.

18. The apparatus of claim 16 in which the discrete circuit components comprise at least one of one or more voltage regulators, one or more filters, or one or more capacitors.

19. The apparatus of claim 1 in which a second structure is attached to a first side of the circuit board or the substrate, and the first structure is mechanically attached to the second structure.

20. The apparatus of claim 19 in which the first structure is attached to the second structure by screws that pass through the printed circuit board or the substrate.

21. The apparatus of claim 19 in which the first structure is attached to the second structure by thermal vias.

22. The apparatus of claim 19, comprising a heat sink attached to at least one of the first structure or the second structure.

23. The apparatus of claim 1, comprising a snap-in mechanism that is configured to secure the optical module when the optical module is inserted into the first structure.

24. The apparatus of claim 23 in which the snap-in mechanism is configured to enable the optical module to be pulled away from the first structure when a force above a threshold is applied to the optical module.

25. The apparatus of claim 23 in which the snap-in mechanism comprises one or more grooves formed on walls of the first structure, the optical module comprises one or more elastic wings, and each elastic wing comprises a tongue that is configured to engage a corresponding groove when the optical module is inserted into the first structure.

26. The apparatus of claim 23 in which the snap-in mechanism comprises a lever-based latch mechanism, the latch mechanism is movable between a first position and a second position, the latch mechanism engages a support structure on the first structure when in the first position and disengages from the support structure when in the second position, the optical module is secured to the first structure when the latch mechanism is in the first position and released from the first structure when the latch mechanism is in the second position.

27. The apparatus of claim 26 in which a lever is provided as part of the optical module, the lever is movable between a first position and a second position, the lever is configured such that moving the lever to the first position causes the latch mechanism to move to the first position, and moving the lever to the second position causes the latch mechanism to move to the second position.

28. The apparatus of claim 26 in which a lever is provided as part of a tool used to insert or remove the optical module into or from the first structure.

29. The apparatus of claim 1 in which the optical module comprises one or more optical components co-packaged with one or more electrical components.

30. The apparatus of claim 29 in which the co-packaged optical module comprises:

a photonic integrated circuit configured to perform at least one of converting first optical signals to first electrical signals or converting second electrical signals to second optical signals;

the two-dimensional arrangement of first electrical contacts, wherein the two-dimensional arrangement of first electrical contacts are configured to at least one of (i) enable the first electrical signals to be transmitted from the photonic integrated circuit to the circuit board or the substrate, or (ii) enable the second electrical signals to be transmitted from the circuit board or the substrate to the photonic integrated circuit; and an optical fiber connector part configured to be optically coupled to an array of optical fibers, wherein the optical fiber connector part is configured to at least one of (i) receive the first optical signals from the array of optical fibers and transmit the first optical signals to the photonic integrated circuit, or (ii) receive the second optical signals from the photonic integrated circuit and transmit the second optical signals to the array of optical fibers.

31. The apparatus of claim 30 in which the co-packaged optical module comprises at least one of:

micro-optics assembly facilitating fiber-to-photonic integrated circuit coupling, one or more driver amplifiers, one or more trans-impedance amplifiers, one or more SerDes integrated circuits, one or more digital signal processors, one or more lasers or light emitting diodes, or one or more microcontrollers.

32. The apparatus of claim 1, comprising the optical module, in which the optical module comprises a snap-in mechanism configured such that the optical fiber connector locks in place the snap-in mechanism when the optical fiber connector is coupled to the optical module.

33. The apparatus of claim 32 in which the optical module comprises a mechanical connector structure, the optical fiber connector snaps into a part of the mechanical connector structure to hold the optical fiber connector in place when the optical fiber connector is coupled to the optical module.

34. The apparatus of claim 32, comprising the optical fiber connector, in which the optical fiber connector and the optical module comprise a ball-detent mechanism configured to hold the optical fiber connector in place when the optical fiber connector is coupled to the optical module.

35. A system comprising:

a housing;

the apparatus of claim 1; and the optical module;

wherein the optical module (i) is coupled to, (ii) extends partially through, or (iii) extends through a front panel of the housing.

36. The system of claim 35 in which the first structure is part of the front panel of the housing.

37. The system of claim 36 in which the circuit board is part of the front panel of the housing.

38. The system of claim 35 in which the first structure is positioned near and spaced apart from the front panel of the housing.

39. The system of claim 38 in which the first structure has an overall structure that extends along a plane that is substantially parallel to the front panel of the housing.

40. The system of claim 38 in which the circuit board is substantially parallel to the front panel of the housing.

41. The apparatus of claim 1 wherein the walls define at least one groove that is configured to engage at least one tongue of the optical module when the optical module is inserted into the first opening.

42. The apparatus of claim 1 wherein the first structure comprises a support structure that is configured to engage a latch mechanism of the optical module when the optical module is electrically coupled to the circuit board or the substrate.

43. The apparatus of claim 1, wherein the first structure comprises a second set of walls that define a second opening, the second set of walls also define one or more retaining mechanisms such that when a second optical module is inserted into the second opening, the one or more retaining mechanisms on the second set of walls of the first structure engage one or more latch mechanisms on the second optical module to secure the second optical module to the first structure, and first electrical contacts on the second optical module are electrically coupled to third electrical contacts on the circuit board or the substrate;

wherein the data processor unit has a left edge and a right edge when viewed from a front-to-rear direction of the apparatus;

wherein the second electrical contacts are positioned to the left of the left edge of the data processor, and the third electrical contacts are positioned to the right of the right edge of the data processor.

44. The apparatus of claim 1, wherein the walls of the first structure are configured to guide the optical module to travel along a direction substantially perpendicular to a main surface of the circuit board or substrate when the optical module is plugged into the first structure to cause the one or more latch mechanisms on the optical module to engage the one or more retaining mechanisms on the first structure.

45. An apparatus comprising:

an optical module configured to be coupled to a first structure that is attached to a circuit board or a substrate, wherein the optical module comprises a two-dimensional arrangement of at least 16 electrical contacts distributed in a two-dimensional surface area of the optical module, the optical module comprises a photonic integrated circuit, the optical module is configured to hold the photonic integrated circuit in place when the optical module is coupled to the first structure and to enable electronic signals from the photonic integrated circuit to be transmitted to the circuit board or the substrate through the two-dimensional arrangement of at least 16 electrical contacts;

wherein the optical module comprises a mechanical connector structure configured to couple the optical module to the first structure, wherein the mechanical connector structure comprises one or more latch mechanisms that engage the one or more retaining mechanisms on the first structure to secure the optical module to the first structure, wherein the mechanical connector structure is designed to enable the one or more latch mechanisms to disengage the one or more retaining mechanisms to allow the optical module to be removed from the first structure;

wherein the optical module comprises a connector part configured to receive an optical fiber connector wherein the optical module is configured to enable optical signals from the optical fiber connector to be transmitted to the photonic integrated circuit.

46. The apparatus of claim 45, comprising the optical fiber connector; wherein the optical fiber connector couples a two-dimensional array of optical fibers to a two-dimensional array of optical coupling elements on the photonic integrated circuit.

47. The apparatus of claim 46 wherein the two-dimension array of optical fibers comprise at least a 3×12 array of optical fibers.

48. The apparatus of claim 45, comprising at least one of a network switch, a central processor unit, a graphics processor unit, a tensor processing unit, a neural network processor, an artificial intelligence accelerator, a digital signal processor, a microcontroller, a storage device, or an application specific integrated circuit (ASIC) that is coupled to the circuit board or the substrate and configured to process electrical signals received from or transmitted to the photonic integrated circuit.

49. The apparatus of claim 45, comprising the first structure and at least one of the circuit board or the substrate, wherein the circuit board or the substrate is attached to a first side of the first structure, and the optical module is coupled to the first structure from the second side of the first structure, and the second side of the first structure is opposite to the first side of the first structure.

50. The apparatus of claim 49, comprising the circuit board and the substrate, in which the circuit board is attached to the first side of the first structure, the substrate is attached to the circuit board, and the optical module is configured to hold the photonic integrated circuit in place when the optical module is coupled to the first structure and to enable electronic signals from the photonic integrated circuit to be transmitted to the substrate.

51. The apparatus of claim 49, wherein the walls of the first structure are configured to guide the optical module to travel along a direction substantially perpendicular to a main surface of the circuit board or substrate when the optical module is plugged into the first structure to cause the one or more latch mechanisms on the optical module to engage the one or more retaining mechanisms on the first structure.

52. The apparatus of claim 45, comprising the first structure and two or more optical modules, wherein the first structure comprises a grid structure that enables the two or more optical modules to be removably coupled to the first structure in an array defined by the grid structure.

53. The apparatus of claim 45 wherein the connector part is removably coupled to the optical fiber connector using at least one of a snap-on mechanism or a screw-on mechanism.

54. The apparatus of claim 45 wherein the one or more latch mechanisms are configured to operate in a first state in which the one or more latch mechanisms engage the one or more retaining mechanisms on the first structure to secure the optical module to the first structure;

wherein the one or more latch mechanisms are configured to operate in a second state in which the one or more latch mechanisms disengage from the one or more retaining mechanisms on the first structure to release the optical module from the first structure.

55. The apparatus of claim 45, wherein the optical module comprises a pluggable module.

56. A method comprising:

providing at least one of a circuit board or a substrate, in which a data processor unit is mounted on a first side of the circuit board or the substrate, a first structure is attached to a second side of the circuit board or the substrate, and the second side of the circuit board or the substrate comprises a two-dimensional arrangement of second electrical contacts;

mechanically coupling an optical module to the first structure, in which the optical module comprises a two-dimensional arrangement of first electrical contacts; and electrically coupling the optical module to the second side of the circuit board or the substrate through the two-dimensional arrangement of first electrical contacts and the two-dimensional arrangement of second electrical contacts.

57. The method of claim 56, comprising coupling an optical fiber connector to the optical module.

58. The method of claim 57, comprising using a connector part of the optical module to receive the optical fiber connector.

59. The method of claim 58, comprising adjusting the connector part to release the optical fiber connector, allowing the optical fiber connector to be removed from the optical module.

60. The method of claim 56, comprising:

inserting the optical module through a first opening defined by walls of the first structure;

using one or more retaining mechanisms on the walls of the first structure to engage one or more latch mechanisms on the optical module to secure the optical module to the first structure; and electrically coupling the second electrical contacts on the circuit board or the substrate to the first electrical contacts on the optical module.

61. The method of claim 60, comprising bending a portion of the one or more latch mechanisms to disengage the one or more latch mechanisms from the one or more retaining mechanisms to allow the optical module to be removed from the first structure.

62. The method of claim 56, comprising:

transmitting optical signals from an optical fiber connector to the optical module;

at the optical module, generating electrical signals based on the optical signals; and transmitting the electrical signals from the optical module to the circuit board or the substrate.

63. The method of claim 62 wherein the optical module comprises a photonic integrated circuit comprising a two-dimensional array of optical coupling elements, and the method comprises using the optical fiber connector to couple a two-dimensional array of optical fibers to the two-dimensional array of optical coupling elements on the photonic integrated circuit.

64. The method of claim 63 wherein the two-dimension array of optical fibers comprise at least a 3×12 array of optical fibers.

65. The method of claim 56 in which the arrangement of second electrical contacts on the circuit board or the substrate comprises an array of at least four rows and four columns of electrical contacts, the arrangement of first electrical contacts of the optical module comprises an array of at least four rows and four columns of electrical contacts, and electrically coupling the optical module to the second side of the circuit board or the substrate comprises electrically coupling the array of at least four rows and four columns of electrical contacts of the optical module to the array of at least four rows and four columns of electrical contacts of the circuit board or the substrate.

66. The method of claim 56 in which the first structure comprises a grid structure that defines multiple first openings, and the method comprises:

coupling a plurality of optical modules to the grid structure, including inserting each optical module through a corresponding first opening defined by the walls of the grid structure;

for each of the plurality of optical modules, using one or more retaining mechanisms on the walls of the grid structure to engage one or more latch mechanisms on the optical module to secure the optical module to the grid structure; and for each of the plurality of optical modules, electrically coupling the first electrical contacts on the optical module to corresponding second electrical contacts on the circuit board or the substrate.

67. The method of claim 56 in which coupling the optical module to the first structure comprises securing, using a snap-in mechanism, the optical module to the first structure.

68. The method of claim 67, comprising applying a force above a threshold to the optical module to disengage the snap-in mechanism, and pulling the optical module away from the first structure.

69. The method of claim 67 in which the snap-in mechanism comprises one or more grooves formed on walls of the first structure, the optical module comprises one or more elastic wings, and each elastic wing comprises a tongue;

wherein the method comprises engaging the tongue of the elastic wing with a corresponding groove formed on walls of the first structure when inserting the optical module into an opening defined by the walls of the first structure.

70. The method of claim 69 in which the snap-in mechanism comprises a lever-based latch mechanism, the latch mechanism is movable between a first position and a second position, the latch mechanism engages a support structure on the first structure when in the first position and disengages from the support structure when in the second position, wherein the method comprises placing the latch mechanism in the first position to secure the optical module to the first structure, and placing the latch mechanism in the second position to release the optical module from the first structure.

71. The method of claim 70 in which a lever is provided as part of the optical module, wherein the method comprises:

moving the lever to a first position to cause the latch mechanism to move to the first position, and moving the lever to a second position causes the latch mechanism to move to the second position.

72. The method of claim 56 in which the optical module comprises a co-packaged optical module.

73. The method of claim 72 in which the co-packaged optical module comprises:

a photonic integrated circuit configured to perform at least one of converting first optical signals to first electrical signals or converting second electrical signals to second optical signals;

the two-dimensional arrangement of first electrical contacts, wherein the two-dimensional arrangement of first electrical contacts are configured to at least one of (i) enable the first electrical signals to be transmitted from the photonic integrated circuit to the circuit board or the substrate, or (ii) enable the second electrical signals to be transmitted from the circuit board or the substrate to the photonic integrated circuit; and an optical fiber connector part configured to be optically coupled to an array of optical fibers, wherein the optical fiber connector part is configured to at least one of (i) receive the first optical signals from the array of optical fibers and transmit the first optical signals to the photonic integrated circuit, or (ii) receive the second optical signals from the photonic integrated circuit and transmit the second optical signals to the array of optical fibers.

74. The method of claim 73 in which the co-packaged optical module comprises at least one of:

micro-optics assembly facilitating fiber-to-photonic integrated circuit coupling, one or more driver amplifiers, one or more trans-impedance amplifiers, one or more SerDes integrated circuits, one or more digital signal processors, one or more lasers or light emitting diodes, or one or more microcontrollers.

75. The method of claim 56, wherein the mechanically coupling an optical module to the first structure comprises mechanically coupling a pluggable module to the first structure, and the pluggable module comprises a two-dimensional arrangement of first electrical contacts.

76. The method of claim 56, wherein the first structure comprises a second set of walls that define a second opening, the second set of walls also defines one or more retaining mechanisms;

wherein the method comprises:

inserting a second optical module into the second opening, causing the one or more retaining mechanisms on the second set of walls of the first structure to engage one or more latch mechanisms on the second optical module to secure the second optical module to the first structure, and electrically coupling first electrical contacts on the second optical module to third electrical contacts on the circuit board or the substrate;

wherein the data processor unit has a left edge and a right edge when viewed from a front-to-rear direction of the apparatus; and wherein the second electrical contacts are positioned to the left of the left edge of the data processor, and the third electrical contacts are positioned to the right of the right edge of the data processor.

77. The method of claim 56, comprising plugging the optical module into the first structure to cause the one or more latch mechanisms on the optical module to engage the one or more retaining mechanisms on the first structure, and using the walls of the first structure to guide the optical module to travel along a direction substantially perpendicular to a main surface of the circuit board or substrate when plugging the optical module into the first structure.

78. A method comprising:

attaching a first structure to a first side of a substrate, the substrate comprising a plurality of sets of two-dimensional arrangements of electrical contacts on the first side;

mounting an application specific integrated circuit on a second side of the substrate, in which the first structure has a first opening located opposite the application specific integrated circuit relative to the substrate, the first structure defines second openings that are configured to receive optical modules, each second opening corresponding to a set of two-dimensional arrangement of electrical contacts in the plurality of sets of two-dimensional arrangements of electrical contacts, the first structure is configured to enable each optical module to be electrically coupled to the substrate through the corresponding set of two-dimensional arrangement of electrical contacts when the optical module is inserted through the corresponding second opening defined by the first structure; and mounting discrete circuit components on the first side of the substrate, in which the discrete circuit components extend from the substrate into the first opening in the first structure.

79. The method of claim 78, comprising:

attaching the first structure to the first side of the substrate;

mounting the application specific integrated circuit on the second side of the substrate; and mounting discrete circuit components on the first side of the substrate, in which the discrete circuit components extend from the substrate into the opening in the structure.

80. The method of claim 78 in which the discrete circuit components comprise at least one of one or more voltage regulators, one or more filters, or one or more capacitors.

81. The method of claim 78, comprising attaching a second structure to a second side of the substrate, and mechanically and thermally coupling the first structure to the second structure.

82. The method of claim 81, comprising attaching the first structure to the second structure using screws that pass through the substrate.

83. The method of claim 81, comprising attaching the first structure to the second structure using thermal vias.

84. The method of claim 81, comprising attaching a heat sink to at least one of the first structure or the second structure.

85. The method of claim 78, wherein the second openings comprise a first second opening and a second opening;

wherein the application specific integrated circuit has a left edge and a right edge when viewed from the first side of the substrate towards the second side of the substrate;

wherein a first set of electrical contacts corresponds to the first second opening, a second set of electrical contacts corresponds to the second opening, and wherein the first set of electrical contacts is positioned to the left of the left edge of the application specific integrated circuit, and the second set of electrical contacts positioned to the righZt of the right edge of the application specific integrated circuit.

86. A method comprising:

attaching a first structure to a first side of a circuit board, the circuit board comprising a plurality of sets of two-dimensional arrangements of electrical contacts on the first side;

mounting an application specific integrated circuit on a second side of the circuit board, in which the first structure has a first opening located opposite the application specific integrated circuit relative to the circuit board, the first structure defines second openings that are configured to receive optical modules, each second opening corresponding to a set of two-dimensional arrangement of electrical contacts in the plurality of sets of two-dimensional arrangements of electrical contacts, the first structure is configured to enable each optical module to be electrically coupled to the circuit board through the corresponding set of two-dimensional arrangement of electrical contacts when the optical module is inserted through the corresponding second opening defined by the first structure; and mounting discrete circuit components on the first side of the circuit board, in which the discrete circuit components extend from the circuit board into the first opening in the first structure.

87. The method of claim 86, comprising:

attaching the first structure to the first side of the circuit board;

mounting the application specific integrated circuit on the second side of the circuit board; and mounting discrete circuit components on the first side of the circuit board, in which the discrete circuit components extend from the circuit board into the opening in the structure.

88. The method of claim 86 in which the discrete circuit components comprise at least one of one or more voltage regulators, one or more filters, or one or more capacitors.

89. The method of claim 86, comprising attaching a second structure to a second side of the circuit board, and mechanically and thermally coupling the first structure to the second structure.

90. The method of claim 89, comprising attaching the first structure to the second structure using screws that pass through the circuit board.

91. The method of claim 89, comprising attaching the first structure to the second structure using thermal vias.

92. The method of claim 89, comprising attaching a heat sink to at least one of the first structure or the second structure.

* * * * *